US011637249B2

(12) United States Patent
Hatakeyama et al.

(10) Patent No.: US 11,637,249 B2
(45) Date of Patent: Apr. 25, 2023

(54) ORGANIC ELECTROLUMINESCENT ELEMENT

(71) Applicants: KWANSEI GAKUIN EDUCATIONAL FOUNDATION, Hyogo (JP); JNC CORPORATION, Tokyo (JP)

(72) Inventors: Takuji Hatakeyama, Hyogo (JP); Katsuya Masuda, Chiba (JP); Motoki Yanai, Chiba (JP)

(73) Assignees: KWANSEI GAKUIN EDUCATIONAL FOUNDATION, Hyogo (JP); SK MATERIALS JNC CO., LTD., Gyeonggi-do (KR)

( * ) Notice: Subject to any disclaimer, the term of this patent is extended or adjusted under 35 U.S.C. 154(b) by 624 days.

(21) Appl. No.: 16/636,432

(22) PCT Filed: Jun. 12, 2018

(86) PCT No.: PCT/JP2018/022294
§ 371 (c)(1),
(2) Date: Feb. 4, 2020

(87) PCT Pub. No.: WO2019/035268
PCT Pub. Date: Feb. 21, 2019

(65) Prior Publication Data

US 2020/0176680 A1 Jun. 4, 2020

(30) Foreign Application Priority Data

Aug. 17, 2017 (JP) ............................ JP2017-157318

(51) Int. Cl.

| | |
|---|---|
| ***H01L 51/00*** | (2006.01) |
| ***C07F 5/02*** | (2006.01) |
| ***C09K 11/06*** | (2006.01) |
| ***H01L 51/50*** | (2006.01) |

(52) U.S. Cl.
CPC ............ *H01L 51/008* (2013.01); *C07F 5/027* (2013.01); *C09K 11/06* (2013.01); *H01L 51/0052* (2013.01); *H01L 51/0061* (2013.01); *H01L 51/0069* (2013.01); *C09K 2211/1018* (2013.01); *H01L 51/5012* (2013.01); *H01L 51/5072* (2013.01); *H01L 51/5092* (2013.01)

(58) Field of Classification Search
CPC ............... H01L 51/008; H01L 51/0052; H01L 51/0061; H01L 51/0069; H01L 51/5012; H01L 51/5072; H01L 51/5092; H01L 27/32; C07F 5/027; C09K 11/06; C09K 2211/1018; C09K 2211/1022; C09K 2211/104; G09F 9/30; H05B 33/12
See application file for complete search history.

(56) References Cited

U.S. PATENT DOCUMENTS

| | | | |
|---|---|---|---|
| 2004/0131881 | A1 | 7/2004 | Zheng et al. |
| 2005/0202279 | A1 | 9/2005 | Zheng et al. |
| 2007/0106103 | A1 | 5/2007 | Ikeda et al. |
| 2012/0319052 | A1 | 12/2012 | Brocke et al. |
| 2014/0058099 | A1 | 2/2014 | Wakamiya et al. |
| 2015/0236274 | A1 | 8/2015 | Hatakeyama et al. |
| 2017/0155062 | A1 | 6/2017 | Brocke et al. |
| 2018/0040821 | A1 | 2/2018 | Hatakeyama et al. |
| 2018/0094000 | A1 | 4/2018 | Hatakeyama et al. |
| 2018/0301629 | A1 | 10/2018 | Hatakeyama et al. |
| 2019/0027694 | A1 | 1/2019 | Hatakeyama et al. |

FOREIGN PATENT DOCUMENTS

| | | |
|---|---|---|
| EP | 3 109 253 | 12/2016 |
| EP | 3 345 911 | 7/2018 |
| JP | 2001-172232 | 6/2001 |
| JP | 2005-170911 | 6/2005 |
| WO | 2004/061047 | 7/2004 |
| WO | 2011/107186 | 9/2011 |
| WO | 2012/118164 | 9/2012 |
| WO | 2015/102118 | 7/2015 |
| WO | 2016/143624 | 9/2016 |
| WO | 2016/152418 | 9/2016 |
| WO | 2016/152544 | 9/2016 |
| WO | 2017/126443 | 7/2017 |

OTHER PUBLICATIONS

Tu C, Liang W. NB-Type Electronic Asymmetric Compounds as Potential Blue-Color TADF Emitters: Steric Hindrance, Substitution Effect, and Electronic Characteristics. ACS omega. Jul. 3, 2017;2(7):3098-109. (Year: 2017).*

Hirai et al., Chem. Rev., (2019), vol. 119, pp. 8291-8331. (Year: 2019).*

International Search Report (ISR) dated Sep. 11, 2018 in International (PCT) Application No. PCT/JP2018/022294.

Decision to Grant a Patent dated Jun. 17, 2022 in corresponding Japanese Patent Application No. 2019-536430, with English language translation.

* cited by examiner

*Primary Examiner* — Dawn L Garrett

(74) *Attorney, Agent, or Firm* — Wenderoth, Lind & Ponack, L.L.P.

(57) ABSTRACT

Provided is an organic electroluminescent element including a light emitting layer containing, as a dopant, at least two compounds selected from a compound group consisting of a polycyclic aromatic compound represented by the following general formula (1) and a multimer thereof:

(1)

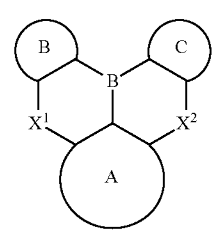

wherein the symbols are defined in the specification.

26 Claims, 1 Drawing Sheet

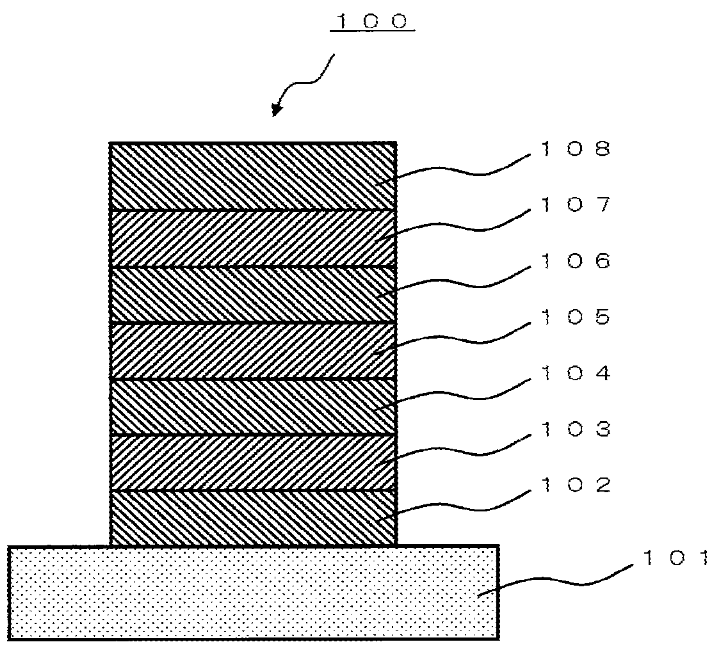
100
108
107
106
105
104
103
102
101

ORGANIC ELECTROLUMINESCENT ELEMENT

TECHNICAL FIELD

The present invention relates to an organic electroluminescent element having a light emitting layer containing two or more specific compounds as a dopant material, and a display apparatus and a lighting apparatus using the organic electroluminescent element.

BACKGROUND ART

Conventionally, a display apparatus employing a luminescent element that is electroluminescent can be subjected to reduction of power consumption and thickness reduction, and therefore various studies have been conducted thereon. Furthermore, an organic electroluminescent element (hereinafter, referred to as an organic EL element) formed from an organic material has been studied actively because weight reduction or size expansion can be easily achieved. Particularly, active studies have been hitherto conducted on development of an organic material having luminescence characteristics for blue light which is one of the primary colors of light, or the like, and a combination of a plurality of materials having optimum luminescence characteristics, irrespective of whether the organic material is a high molecular weight compound or a low molecular weight compound.

An organic EL element has a structure having a pair of electrodes composed of a positive electrode and a negative electrode, and a single layer or a plurality of layers which are disposed between the pair of electrodes and contain an organic compound. The layer containing an organic compound includes a light emitting layer, a charge transport/injection layer for transporting or injecting charges such as holes or electrons, and the like, and various organic materials suitable for these layers have been developed.

Regarding the materials for light emitting layers, for example, benzofluorene-based compounds and the like have been developed (WO 2004/061047 A). Furthermore, regarding hole transporting materials, for example, triphenylamine-based compounds and the like have been developed (JP 2001-172232 A). Regarding electron transport materials, for example, anthracene-based compounds and the like have been developed (JP 2005-A).

Furthermore, in recent years, materials obtained by improving a triphenylamine derivative have also been reported (WO 2012/118164 A). These materials are characterized in that flatness thereof has been increased by connecting aromatic rings that constitute triphenylamine with reference to N,N'-diphenyl-N,N'-bis(3-methylphenyl)-1,1'-biphenyl-4,4'-diamine (TPD) which has been already put to practical use. In this literature, for example, evaluation of the charge transporting characteristics of a NO-linked system compound (compound 1 of page 63) has been made. However, there is no description on a method for manufacturing materials other than the NO-linked system compound. When elements to be connected are different, the overall electron state of the compound is different. Therefore, the characteristics obtainable from materials other than the NO-linked system compound are not known. Examples of such a compound are also found elsewhere (WO 2011/107186 A). For example, since a compound having a conjugated structure involving high energy of triplet exciton (T1) can emit phosphorescent light having a shorter wavelength, the compound is useful as a material for blue light emitting layer.

CITATION LIST

Patent Literature

Patent Literature 1: WO 2004/061047 A
Patent Literature 2: JP 2001-172232 A
Patent Literature 3: JP 2005-170911 A
Patent Literature 4: WO 2012/118164 A
Patent Literature 5: WO 2011/107186 A

SUMMARY OF INVENTION

Technical Problem

As described above, various materials have been developed as a material used in an organic EL element. However, a material that can achieve an organic EL element having characteristics such as higher quantum efficiency and long lifetime, particularly a material that is excellent as a light emitting layer material is desired.

Solution to Problem

The present inventors made intensive studies in order to solve the above problem. As a result, the present inventors have found that by inclusion of a combination of two or more compounds in which a plurality of aromatic rings is linked to each other with a boron atom, a nitrogen atom, an oxygen atom, or the like in a light emitting layer, it is possible to obtain an organic EL element having a higher carrier balance in the light emitting layer and having excellent quantum efficiency and lifetime, and have completed the present invention.

[1]

An organic electroluminescent element comprising: a pair of electrodes composed of a positive electrode and a negative electrode; and a light emitting layer disposed between the pair of electrodes, wherein the light emitting layer includes, as a dopant, at least two polycyclic aromatic compounds and/or multimers selected from a compound group consisting of a polycyclic aromatic compound represented by the following general formula (1) and a multimer of a polycyclic aromatic compound having a plurality of structures each represented by the following general formula (1).

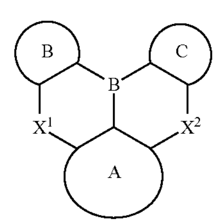

(1)

(In the above formula (1), ring A, ring B, and ring C each independently represent an aryl ring or a heteroaryl ring, and at least one hydrogen atom in these rings may be substituted, $X^1$ and $X^2$ each independently represent >O, >N—R, >S, >Se, or >C(—Ra)$_2$, R of the >N—R represents an optionally substituted aryl, an optionally substituted heteroaryl or an optionally substituted alkyl, R of the >N—R may be bonded to the ring A, ring B, and/or ring C with a linking group or a single bond, and Ra of the >C(—Ra)$_2$ represents a linear or branched alkyl starting from a methylene group, represented by "—CH$_2$—C$_{n-1}$H$_{2(n-1)+1}$ (n is 1 or more)", and at least one hydrogen atom in a compound or a structure represented by formula (1) may be substituted by a deuterium atom.)

[2]

The organic electroluminescent element according to the above [1], wherein the polycyclic aromatic compound and a multimer thereof are selected from polycyclic aromatic compounds represented by any one of the following general formulas (1A) to (1E) and multimers of polycyclic aromatic compounds each having a plurality of structures each represented by any one of the following general formulas (1A) to (1E).

(1A)

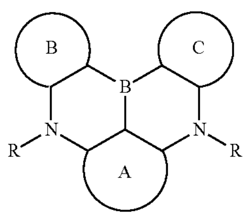

(1B)

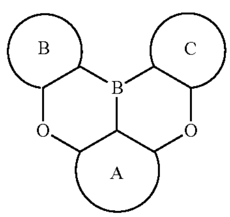

(1C)

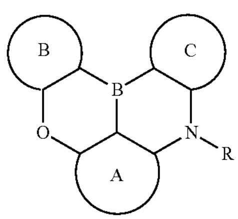

(1D)

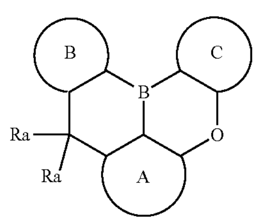

(1E)

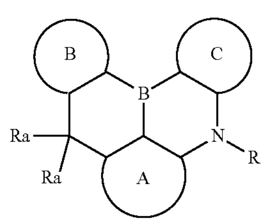

(In the above formulas (1A) to (1E), ring A, ring B, and ring C each independently represent an aryl ring or a heteroaryl ring, and at least one hydrogen atom in these rings may be substituted, R of >N—R independently represents an optionally substituted aryl, an optionally substituted heteroaryl or an optionally substituted alkyl, and the R may be bonded to the ring A, ring B, and/or ring C with a linking group or a single bond, Ra of >C(—Ra)$_2$ represents a linear or branched alkyl starting from a methylene group, represented by "—CH$_2$—C$_{n-1}$H$_{2(n-1)+1}$ (n is 1 or more)", and at least one hydrogen atom in a compound or a structure represented by any one of formulas (1A) to (1E) may be substituted by a deuterium atom.)

[3]

The organic electroluminescent element according to the above [2], wherein the ring A, ring B, and ring C each independently represent an aryl ring or a heteroaryl ring, and at least one hydrogen atom in these rings may be substituted by a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino, a substituted or unsubstituted alkyl, a substituted or unsubstituted alkoxy, a trialkylsilyl, a substituted or unsubstituted aryloxy, cyano, or a halogen atom, R of the >N—R represents an aryl optionally substituted by an alkyl or a heteroaryl or an alkyl optionally substituted by an alkyl, the R may be bonded to the ring A, ring B, and/or ring C with —O—, —S—, —C(—R)$_2$—, or a single bond, and R of the —C(—R)$_2$— represents a hydrogen atom or an alkyl, Ra of the >C(—Ra)$_2$ represents a linear or branched alkyl starting from a methylene group, represented by "—CH$_2$—C$_{n-1}$H$_{2(n-1)+1}$ (n is 1 to 6)", at least one hydrogen atom in a compound or a structure represented by any one of formulas (1A) to (1E) may be substituted by a deuterium atom, and in a case of a multimer, the multimer is a dimer or a trimer having two or three structures each represented by formulas (1A) to (1E).

[4]

The organic electroluminescent element according to the above [2] or [3], wherein the polycyclic aromatic compound represented by the above general formula (1A) or a multimer thereof is a polycyclic aromatic compound represented by the following general formula (1A') or a multimer thereof.

(1A')

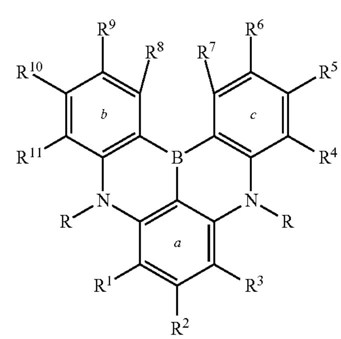

(In the above formula (1A'),

R$^1$ to R$^{11}$ each independently represent a hydrogen atom, an aryl, a heteroaryl, a diarylamino, a diheteroarylamino, an arylheteroarylamino, an alkyl, an alkoxy, an aryloxy, cyano, or a halogen atom, at least one hydrogen atom in these may be substituted by an aryl, a heteroaryl, or an alkyl, adjacent groups of $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, an aryloxy, cyano, or a halogen atom, and at least one hydrogen atom in these may be substituted by an aryl, a heteroaryl, or an alkyl, R of >N—R independently represents an aryl having 6 to 12 carbon atoms, a heteroaryl having 2 to 15 carbon atoms, or an alkyl having 1 to 6 carbon atoms, the R may be bonded to the ring a, ring b, and/or ring c with —O—, —S—, —C(—R)$_2$—, or a single bond, and R of the —C(—R)$_2$— represents an alkyl having 1 to 6 carbon atoms, and at least one hydrogen atom in a compound represented by formula (1A') or a multimer thereof may be substituted by a deuterium atom.)

[5]

The organic electroluminescent element according to the above [4], wherein in the above formula (1A'), $R^1$ to $R^{11}$ each independently represent a hydrogen atom, an aryl having 6 to 30 carbon atoms, or a heteroaryl or diarylamino having 2 to 30 carbon atoms (the aryl is an aryl having 6 to 12 carbon atoms), adjacent groups of $R^1$ to $R^{11}$ may be bonded to each other to form an aryl ring having 9 to 16 carbon atoms or a heteroaryl ring having 6 to 15 carbon atoms together with ring a, ring b, or ring c, and at least one hydrogen atom in the ring thus formed may be substituted by an aryl having 6 to 10 carbon atoms, R of >N—R independently represents an aryl having 6 to 10 carbon atoms, and at least one hydrogen atom in a compound represented by formula (1A') or a multimer thereof may be substituted by a deuterium atom.

[6]

The organic electroluminescent element according to the above [4], wherein the compound represented by the above formula (1A') is represented by any one of the following structural formulas.

(1A-2619)

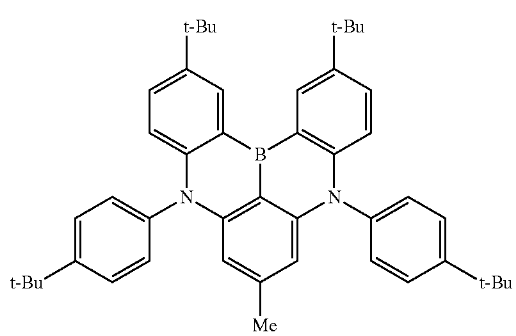

-continued (1A-2621)

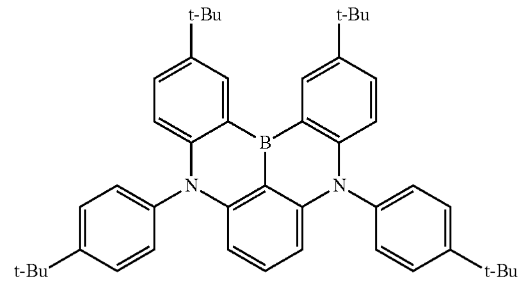

(1A-2687)

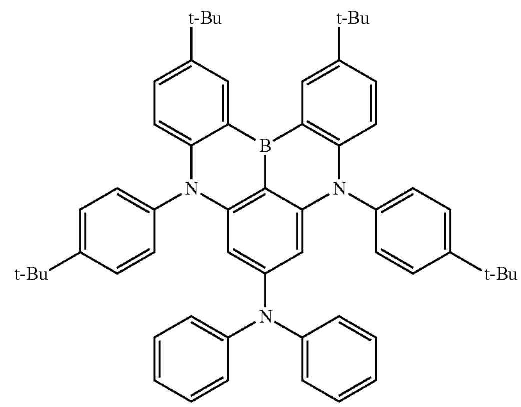

(1A-2688)

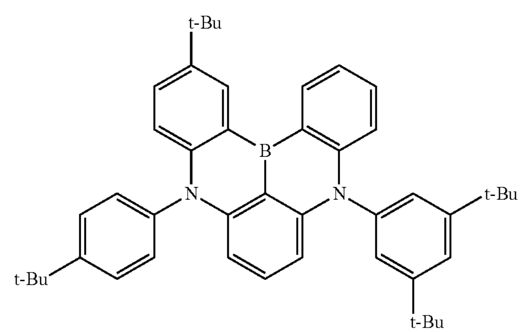

(1A-2689)

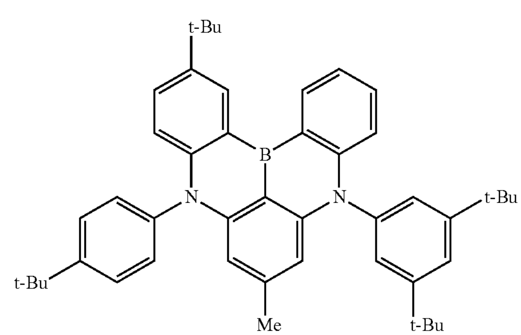

-continued (1A-2679)

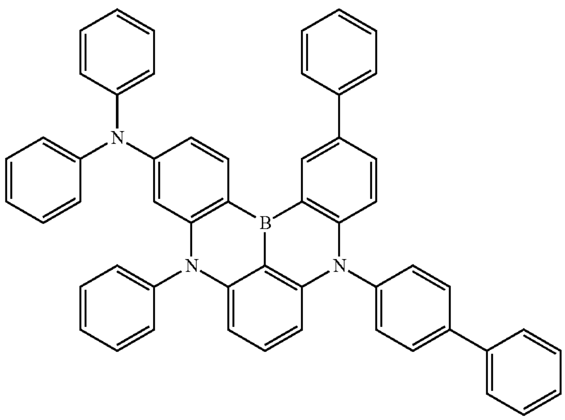

(1A-1152)

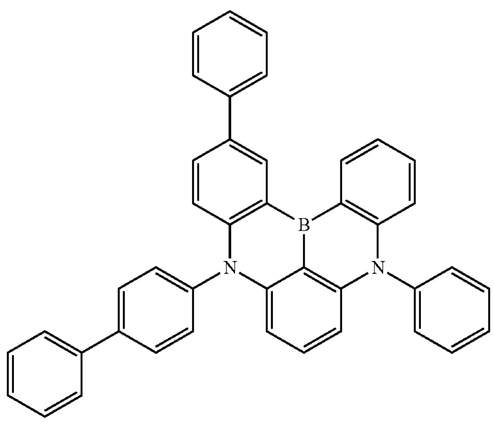

(1A-2680)

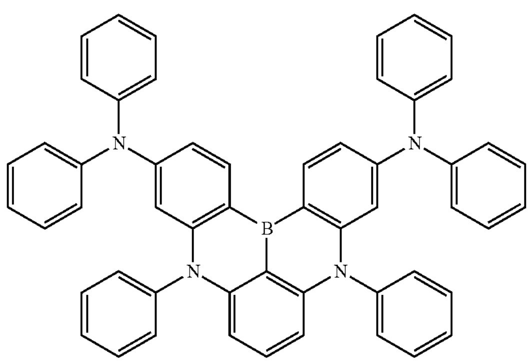

(1A-2676)

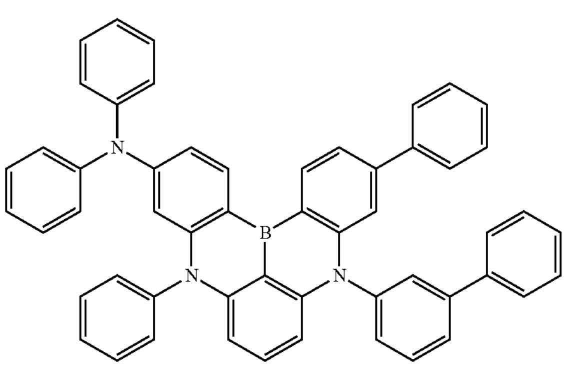

[7]

The organic electroluminescent element according to the above [2] or [3], wherein the polycyclic aromatic compound represented by the above general formula (1B) or a multimer thereof is a polycyclic aromatic compound represented by the following general formula (1B') or (1B'') or a multimer thereof.

(1B')

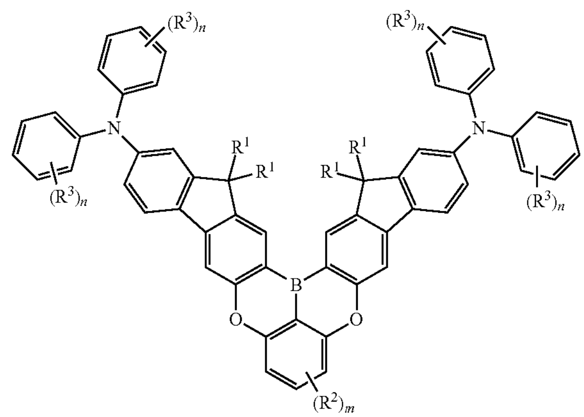

(1B'')

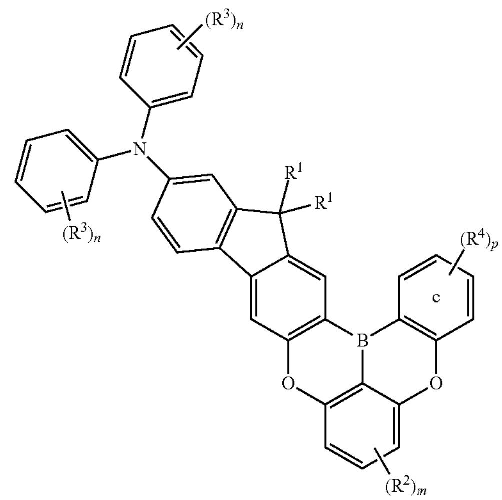

(In the above formula (1B') or (1B''), $R^1$ to $R^4$ each independently represent a hydrogen atom, an aryl, a heteroaryl, an alkyl, an alkoxy, a trialkylsilyl, an aryloxy, cyano, or a halogen atom, and at least one hydrogen atom in these may be substituted by an aryl, a heteroaryl, an alkyl, cyano, or a halogen atom, in a case where there is a plurality of $R^4$'s, adjacent $R^4$'s may be bonded to each other to form an aryl ring or a heteroaryl ring together with ring c, at least one hydrogen atom in the ring thus formed may be substituted by an aryl, a heteroaryl, an alkyl, an alkoxy, a trialkylsilyl, an aryloxy, cyano, or a halogen atom, and at least one hydrogen atom in these may be substituted by an aryl, a heteroaryl, an alkyl, cyano, or a halogen atom, and m represents an integer of 0 to 3, n's each independently represent an integer of 0 to 5, and p represents an integer of 0 to 4.)

[8]

The organic electroluminescent element according to the above [7], wherein in the above formula (1B') or (1B''), $R^1$'s each independently represent a hydrogen atom, an aryl having 6 to 30 carbon atoms, or an alkyl having 1 to 24 carbon atoms, $R^2$ to $R^4$ each independently represent a hydrogen atom, an aryl having 6 to 30 carbon atoms, a heteroaryl having 2 to 30 carbon atoms, an alkyl having 1 to 24 carbon atoms, an alkoxy having 1 to 24 carbon atoms, a trialkylsilyl having an alkyl having 1 to 4 carbon atoms, or an aryloxy having 6 to 30 carbon atoms, and at least one hydrogen atom in these may be substituted by an aryl having 6 to 16 carbon atoms, a heteroaryl having 2 to 25 carbon atoms, or an alkyl having 1 to 18 carbon atoms, and m represents an integer of 0 to 3, n's each independently represent an integer of 0 to 5, and p represents an integer of 0 to 2.

[9]

The organic electroluminescent element according to the above [7], wherein the compound represented by the above formula (1B') is represented by the following structural formula.

(1B-1)

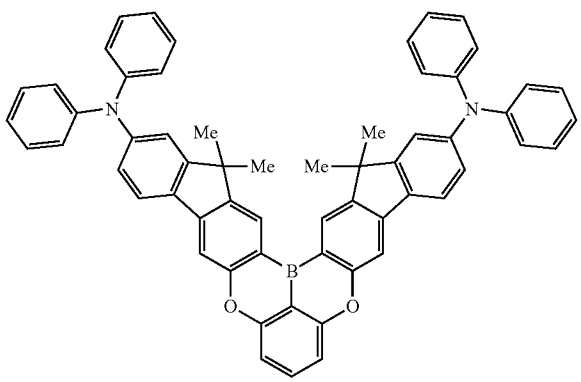

[10]

The organic electroluminescent element according to the above [2] or [3], wherein the polycyclic aromatic compound represented by the above general formula (1B) or a multimer thereof is a polycyclic aromatic compound represented by the following general formula ($1B^{3\prime}$) or ($1B^{4\prime}$), or a multimer thereof.

General formula ($1B^{3\prime}$)

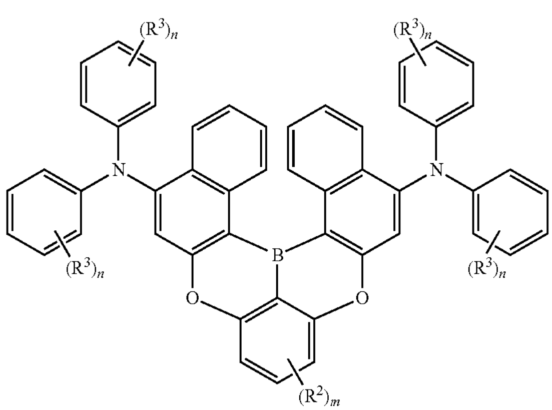

-continued

General formula ($1B^{4\prime}$)

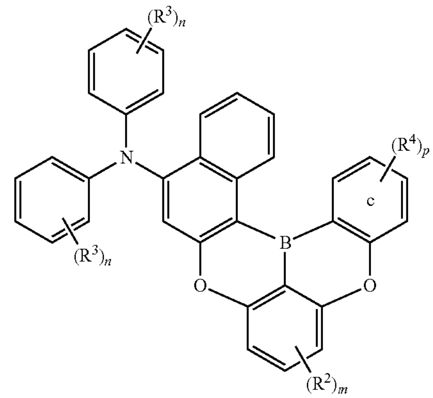

(In the above formula ($1B^{3\prime}$) or ($1B^{4\prime}$), $R^2$ to $R^4$ each independently represent a hydrogen atom, an aryl, a heteroaryl, an alkyl, an alkoxy, a trialkylsilyl, an aryloxy, cyano, or a halogen atom, and at least one hydrogen atom in these may be substituted by an aryl, a heteroaryl, an alkyl, cyano, or a halogen atom, in a case where there is a plurality of $R^4$'s, adjacent $R^4$'s may be bonded to each other to form an aryl ring or a heteroaryl ring together with ring c, at least one hydrogen atom in the ring thus formed may be substituted by an aryl, a heteroaryl, an alkyl, an alkoxy, a trialkylsilyl, an aryloxy, cyano, or a halogen atom, and at least one hydrogen atom in these may be substituted by an aryl, a heteroaryl, an alkyl, cyano, or a halogen atom, and m represents an integer of 0 to 3, n's each independently represent an integer of 0 to 5, and p represents an integer of 0 to 4.)

[11]

The organic electroluminescent element according to the above [10], wherein in the above formula ($1B^{3\prime}$) or ($1B^{4\prime}$), $R^2$ to $R^4$ each independently represent a hydrogen atom, an aryl having 6 to 30 carbon atoms, a heteroaryl having 2 to 30 carbon atoms, an alkyl having 1 to 24 carbon atoms, an alkoxy having 1 to 24 carbon atoms, a trialkylsilyl having an alkyl having 1 to 4 carbon atoms, or an aryloxy having 6 to 30 carbon atoms, and at least one hydrogen atom in these may be substituted by an aryl having 6 to 16 carbon atoms, a heteroaryl having 2 to 25 carbon atoms, or an alkyl having 1 to 18 carbon atoms, and m represents an integer of 0 to 3, n's each independently represent an integer of 0 to 5, and p represents an integer of 0 to 2.

[12]

The organic electroluminescent element according to the above [10], wherein the compound represented by the above formula ($1B^{3\prime}$) is represented by the following structural formula.

(1B-101)

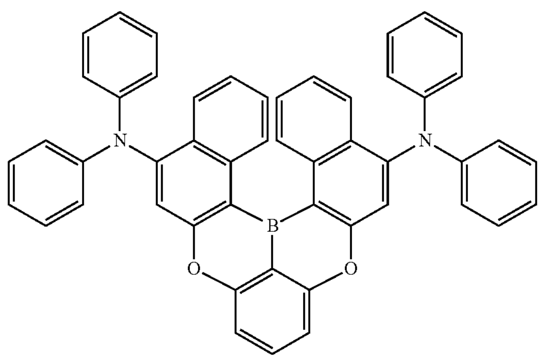

[13]

The organic electroluminescent element according to the above [2] or [3], wherein the polycyclic aromatic compound represented by the above general formula (1C) or a multimer thereof is a polycyclic aromatic compound represented by the following general formula (1C') or (1C") or a multimer thereof.

(1C')

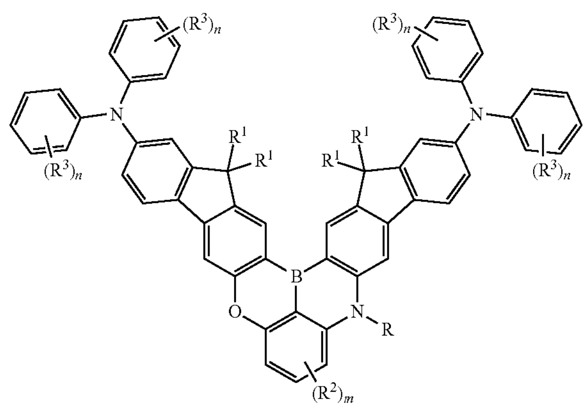

(1C")

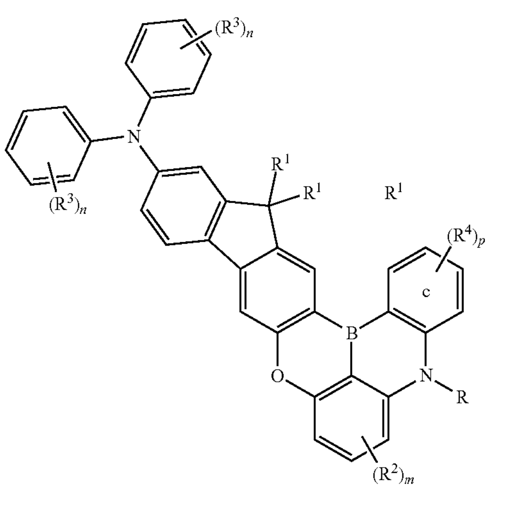

(In the above formula (1C') or (1C"), $R^1$ to $R^4$ each independently represent a hydrogen atom, an aryl, a heteroaryl, an alkyl, an alkoxy, a trialkylsilyl, an aryloxy, cyano, or a halogen atom, and at least one hydrogen atom in these may be substituted by an aryl, a heteroaryl, an alkyl, cyano, or a halogen atom, in a case where there is a plurality of $R^4$'s, adjacent $R^4$'s may be bonded to each other to form an aryl ring or a heteroaryl ring together with ring c, at least one hydrogen atom in the ring thus formed may be substituted by an aryl, a heteroaryl, an alkyl, an alkoxy, a trialkylsilyl, an aryloxy, cyano, or a halogen atom, and at least one hydrogen atom in these may be substituted by an aryl, a heteroaryl, an alkyl, cyano, or a halogen atom, m represents an integer of 0 to 3, n's each independently represent an integer of 0 to 6, and p represents an integer of 0 to 4, and R of >N—R represents an aryl having 6 to 12 carbon atoms, a heteroaryl having 2 to 15 carbon atoms, or an alkyl having 1 to 6 carbon atoms.)

[14]

The organic electroluminescent element according to the above [13], wherein in the above formula (1C') or (1C"), $R^1$'s each independently represent a hydrogen atom, an aryl having 6 to 30 carbon atoms, or an alkyl having 1 to 24 carbon atoms, $R^2$ to $R^4$ each independently represent a hydrogen atom, an aryl having 6 to 30 carbon atoms, a heteroaryl having 2 to 30 carbon atoms, an alkyl having 1 to 24 carbon atoms, an alkoxy having 1 to 24 carbon atoms, a trialkylsilyl having an alkyl having 1 to 4 carbon atoms, or an aryloxy having 6 to 30 carbon atoms, and at least one hydrogen atom in these may be substituted by an aryl having 6 to 16 carbon atoms, a heteroaryl having 2 to 25 carbon atoms, or an alkyl having 1 to 18 carbon atoms, m represents an integer of 0 to 3, n's each independently represent an integer of 0 to 6, and p represents an integer of 0 to 2, and R of N—R represents an aryl having 6 to 10 carbon atoms, a heteroaryl having 2 to 10 carbon atoms, or an alkyl having 1 to 4 carbon atoms.

[15]

The organic electroluminescent element according to the above [13], wherein the compound represented by the above formula (1C") is represented by any one of the following structural formulas.

(1C-2)

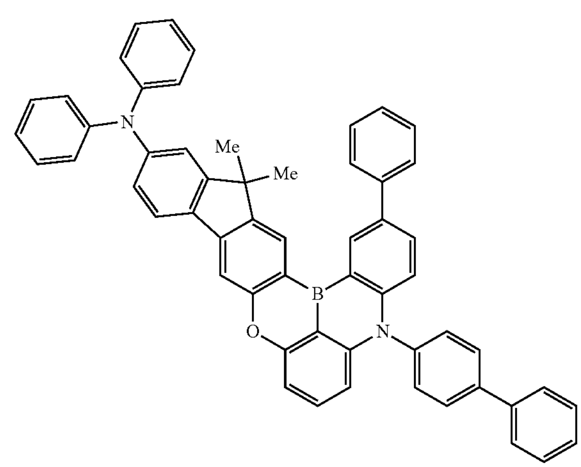

-continued (1C-10)

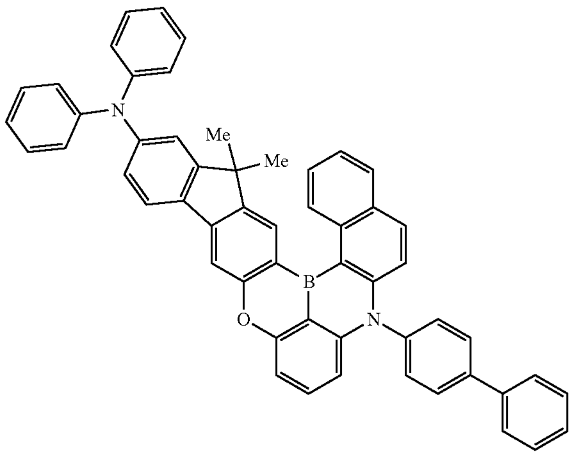

[16]

The organic electroluminescent element according to the above [2] or [3], wherein the polycyclic aromatic compound represented by the above general formula (1D) or a multimer thereof is a polycyclic aromatic compound represented by the following general formula (1D') or a multimer thereof.

(1D')

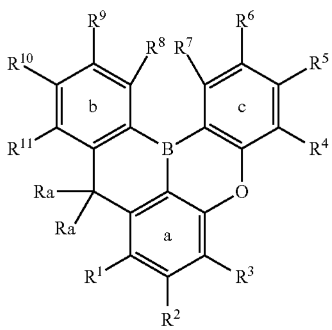

(In the above formula (1D'), $R^1$ to $R^{11}$ each independently represent a hydrogen atom, an aryl, a heteroaryl, a diarylamino, a diheteroarylamino, an arylheteroarylamino, an alkyl, an alkoxy, an aryloxy, cyano, or a halogen atom, at least one hydrogen atom in these may be substituted by an aryl, a heteroaryl, an alkyl, cyano, or a halogen atom, adjacent groups of $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, an aryloxy, cyano, or a halogen atom, and at least one hydrogen atom in these may be substituted by an aryl, a heteroaryl, an alkyl, cyano, or a halogen atom, Ra represents a linear or branched alkyl starting from a methylene group, represented by "$—CH_2—C_{n-1}H_{2(n-1)+1}$ (n is 1 to 6)", and in a case of a multimer of a polycyclic aromatic compound, the multimer is a dimer or a trimer having two or three structures each represented by formula (1D').

[17]

The organic electroluminescent element according to the above [16], wherein in the above formula (1D'), $R^1$ to $R^{11}$ each independently represent a hydrogen atom, an aryl having 6 to 30 carbon atoms, a heteroaryl or diarylamino having 2 to 30 carbon atoms (the aryl is an aryl having 6 to 12 carbon atoms), an alkyl having 1 to 24 carbon atoms, cyano, or a halogen atom, adjacent groups of $R^1$ to $R^{11}$ may be bonded to each other to form an aryl ring having 9 to 16 carbon atoms or a heteroaryl ring having 6 to 15 carbon atoms together with ring a, ring b, or ring c, and at least one hydrogen atom in the ring thus formed may be substituted by an aryl having 6 to 30 carbon atoms, a heteroaryl or diarylamino having 2 to 30 carbon atoms (the aryl is an aryl having 6 to 12 carbon atoms), an alkyl having 1 to 24 carbon atoms, cyano, or a halogen atom, and Ra represents a linear alkyl starting from a methylene group, represented by "$—CH_2—C_{n-1}H_{2(n-1)+1}$ (n is 1 to 4)".

[18]

The organic electroluminescent element according to the above [2] or [3], wherein the polycyclic aromatic compound represented by the above general formula (1E) or a multimer thereof is a polycyclic aromatic compound represented by the following general formula (1E') or a multimer thereof.

(1E')

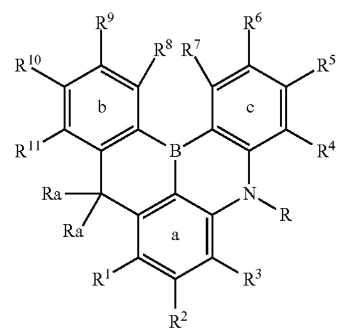

(In the above formula (1E'), $R^1$ to $R^{11}$ each independently represent a hydrogen atom, an aryl, a heteroaryl, a diarylamino, a diheteroarylamino, an arylheteroarylamino, an alkyl, an alkoxy, an aryloxy, cyano, or a halogen atom, at least one hydrogen atom in these may be substituted by an aryl, a heteroaryl, an alkyl, cyano, or a halogen atom, adjacent groups of $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, an aryloxy, cyano, or a halogen atom, and at least one hydrogen atom in these may be substituted by an aryl, a heteroaryl, an alkyl, cyano, or a halogen atom, R of >N—R represents an aryl, a heteroaryl, or an alkyl, at least one hydrogen atom in the R may be substituted by an aryl, a heteroaryl, a diarylamino, a diheteroarylamino, an arylheteroarylamino, an alkyl, an alkoxy, an aryloxy, cyano, or a halogen atom, and at least one hydrogen atom in these may be substituted by an aryl, a heteroaryl, an alkyl, cyano, or a halogen atom, Ra represents a linear or branched alkyl starting from a methylene group, represented by "$—CH_2—C_{n-1}H_{2(n-1)+1}$ (n is 1 to 6)", and in a case of a multimer of a polycyclic aromatic compound, the multimer is a dimer or a trimer having two or three structures represented each by formula (1E').)

[19]

The organic electroluminescent element according to the above [18], wherein in the above formula (1E'), $R^1$ to $R^{11}$ each independently represent a hydrogen atom, an aryl having 6 to 30 carbon atoms, a heteroaryl or diarylamino having 2 to 30 carbon atoms (the aryl is an aryl having 6 to 12 carbon atoms), an alkyl having 1 to 24 carbon atoms, cyano, or a halogen atom, adjacent groups of $R^1$ to $R^{11}$ may be bonded to each other to form an aryl ring having 9 to 16 carbon atoms or a heteroaryl ring having 6 to 15 carbon atoms together with ring a, ring b, or ring c, and at least one hydrogen atom in the ring thus formed may be substituted by an aryl having 6 to 30 carbon atoms, a heteroaryl or diarylamino having 2 to 30 carbon atoms (the aryl is an aryl having 6 to 12 carbon atoms), an alkyl having 1 to 24 carbon atoms, cyano, or a halogen atom, R of >N—R represents an aryl having 6 to 30 carbon atoms, a heteroaryl having 2 to 30 carbon atoms, or an alkyl having 1 to 24 carbon atoms, and at least one hydrogen atom in these may be substituted by cyano or a halogen atom, and Ra represents a linear alkyl starting from a methylene group, represented by "$—CH_2—C_{n-1}H_{2(n-1)+1}$ (n is 1 to 4)".

[20]

The organic electroluminescent element according to the above [18], wherein the compound represented by the above formula (1E') is represented by the following structural formula.

(1E-1)

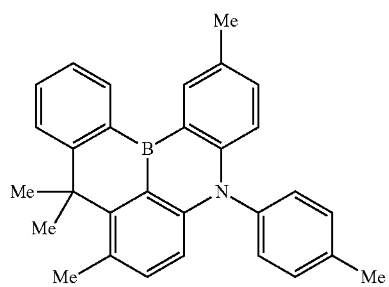

[21]

The organic electroluminescent element according to any one of the above [1] to [20], wherein the light emitting layer includes at least the two polycyclic aromatic compounds and/or multimers in an amount of 0.1 to 30% by weight.

The organic electroluminescent element according to any one of the above [1] to [21], wherein the light emitting layer includes at least one selected from an anthracene derivative, a fluorene derivative, and a dibenzochrysene derivative.

[23]

The organic electroluminescent element according to any one of the above [1] to [22], further comprising an electron transport layer and/or an electron injection layer disposed between the negative electrode and the light emitting layer, wherein at least one of the electron transport layer and the electron injection layer includes at least one selected from the group consisting of a borane derivative, a pyridine derivative, a fluoranthene derivative, a BO-based derivative, an anthracene derivative, a benzofluorene derivative, a phosphine oxide derivative, a pyrimidine derivative, a carbazole derivative, a triazine derivative, a benzimidazole derivative, a phenanthroline derivative, and a quinolinol-based metal complex.

[24]

The organic electroluminescent element according to the above [23], wherein the electron transport layer and/or electron injection layer further include/includes at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

[25]

A display apparatus comprising the organic electroluminescent element according to any one of the above [1] to [24].

[26]

A lighting apparatus comprising the organic electroluminescent element according to any one of the above [1] to [24].

Advantageous Effects of Invention

According to a preferable embodiment of the present invention, by preparing a light emitting layer material containing two or more compounds selected from polycyclic aromatic compounds represented by the above general formula (1) and multimers thereof and manufacturing an organic EL element using the light emitting layer material for a light emitting layer, an organic EL element having excellent quantum efficiency and lifetime can be provided.

BRIEF DESCRIPTION OF DRAWINGS

The FIGURE is a schematic cross-sectional view illustrating an organic EL element according to the present embodiment.

DESCRIPTION OF EMBODIMENTS

1. Characteristic Light Emitting Layer in Organic EL Element

The present invention is an organic EL element including a pair of electrodes composed of a positive electrode and a negative electrode, and a light emitting layer disposed between the pair of electrodes, in which the light emitting layer includes, as a dopant, at least two polycyclic aromatic compounds and/or multimers selected from a compound group consisting of a polycyclic aromatic compound represented by the following general formula (1) and a multimer of a polycyclic aromatic compound having a plurality of structures each represented by the following general formula (1). Note that the symbols in formula (1) are defined in the same manner as those described above.

(1)

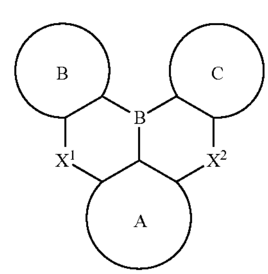

1.1. Polycyclic Aromatic Compound Represented by General Formula (1) and Multimer Thereof A polycyclic aromatic compound represented by general formula (1) and a multimer of a polycyclic aromatic compound having a plurality of structures each represented by general formula (1) basically function as a dopant. The polycyclic aromatic compound and a multimer thereof are preferably a polycyclic aromatic compound represented by the following general formula (1') and a multimer of a polycyclic aromatic compound having a plurality of structures each represented by the following general formula (1').

(1)

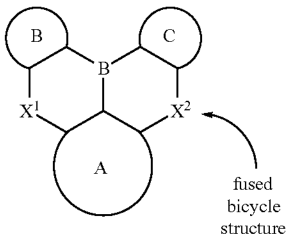

(1')

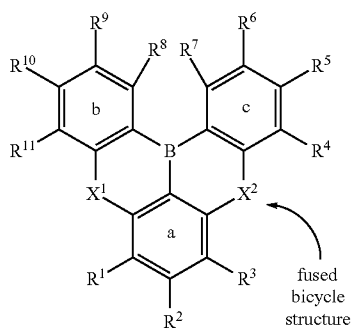

In the above formula (1'), $R^1$ to $R^{11}$ each independently represent a hydrogen atom, an aryl, a heteroaryl, a diarylamino, a diheteroarylamino, an arylheteroarylamino, an alkyl, an alkoxy, a trialkylsilyl, an aryloxy, cyano, or a halogen atom, at least one hydrogen atom in these may be substituted by an aryl, a heteroaryl, or an alkyl, adjacent groups of $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, a trialkylsilyl, an aryloxy, cyano, or a halogen atom, and at least one hydrogen atom in these may be substituted by an aryl, a heteroaryl, or an alkyl, $X^1$ and $X^2$ each independently represent >O, >N—R, >S, >Se, or $>C(—Ra)_2$, R of the >N—R represents an aryl having 6 to 12 carbon atoms, a heteroaryl having 2 to 15 carbon atoms, or an alkyl having 1 to 6 carbon atoms, R of the >N—R may be bonded to the ring a, ring b, and/or ring c with —O—, —S—, $—C(—R)_2—$, or a single bond, R of the $—C(—R)_2—$ represents an alkyl having 1 to 6 carbon atoms, and Ra of the $>C(—Ra)_2$ represents a linear or branched alkyl starting from a methylene group, represented by "$—CH_2—C_{n-1}H_{2(n-1)+1}$ (n is 1 or more)", and at least one hydrogen atom in a compound represented by formula (1') may be substituted by a deuterium atom.

The ring A, ring B, and ring C in general formula (1) each independently represent an aryl ring or a heteroaryl ring, and at least one hydrogen atom in these rings may be substituted by a substituent. The substituent is preferably a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino (amino group having an aryl and a heteroaryl), a substituted or unsubstituted alkyl, a substituted or unsubstituted alkoxy, a trialkylsilyl, a substituted or unsubstituted aryloxy, cyano, or a halogen atom. In a case where these groups have substituents, examples of the substituents include an aryl, a heteroaryl, and an alkyl. The aryl ring or the heteroaryl ring preferably has a 5-membered ring or a 6-membered ring sharing a bond with a fused bicyclic structure (hereinafter, this structure is also referred to as "structure D") constituted by the central element B (boron), $X^1$, and $X^2$ at the center of general formula (1).

Here, the "fused bicyclic structure (structure D)" means a structure in which two saturated hydrocarbon rings including the central element B (boron), $X^1$, and $X^2$ illustrated at the center of general formula (1) are fused. The "6-membered ring sharing a bond with the fused bicyclic structure" means ring a (benzene ring (6-membered ring)) fused to the structure D, for example, as illustrated in the above general formula (1'). The phrase "aryl ring or heteroaryl ring (which is ring A) has this 6-membered ring" means that the ring A is formed only from this 6-membered ring, or the ring A is formed such that other rings and the like are further fused to this 6-membered ring so as to include this 6-membered ring. In other words, the "aryl ring or heteroaryl ring (which is ring A) having a 6-membered ring" as used herein means that the 6-membered ring constituting the entirety or a portion of the ring A is fused to the structure D. A similar description applies to the "ring B (ring b)", "ring C (ring c)", and the "5-membered ring".

The ring A (or ring B or ring C) in general formula (1) corresponds to ring a and its substituents $R^1$ to $R^3$ in general formula (1') (or ring b and its substituents $R^8$ to $R^{11}$, or ring c and its substituents $R^4$ to $R^7$). That is, general formula (1') corresponds to a structure in which "rings A to C having 6-membered rings" have been selected as the rings A to C of general formula (1). For this meaning, the rings of general formula (1') are represented by small letters a to c.

In general formula (1'), adjacent groups among the substituents $R^1$ to $R^{11}$ of the ring a, ring b, and ring c may be bonded to each other to form an aryl ring or a heteroaryl ring together with the ring a, ring b, or ring c, and at least one hydrogen atom in the ring thus formed may be substituted by an aryl, a heteroaryl, a diarylamino, a diheteroarylamino, an arylheteroarylamino, an alkyl, an alkoxy, an aryloxy, cyano, or a halogen atom, while at least one hydrogen atom in these may be substituted by an aryl, a heteroaryl, or an alkyl. Therefore, in a polycyclic aromatic compound represented by general formula (1'), a ring structure constituting the compound changes as represented by the following formulas (1'-1) and (1'-2) according to a mutual bonding form of substituents in the ring a, ring b, and ring c. Ring A', ring B', and ring C' in each formula correspond to the ring A, ring B, and ring C in general formula (1), respectively. Note that the symbols in formulas (1'-1) and (1'-2) are defined in the same manner as those in formula (1').

(1'-1)

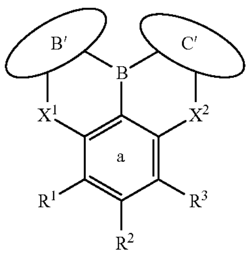

(1'-2)

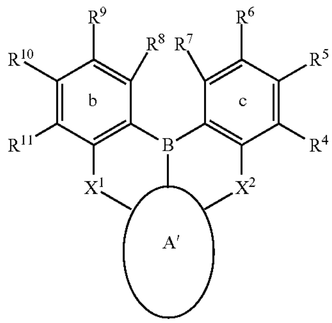

The ring A', ring B', and ring C' in the above formulas (1'-1) and (1'-2) each represent, to be described in connection with general formula (1'), an aryl ring or a heteroaryl ring formed by bonding adjacent groups among the substituents $R^1$ to $R^{11}$ together with the ring a, ring b, and ring c, respectively (may also be referred to as a fused ring obtained by fusing another ring structure to the ring a, ring b, or ring c). Incidentally, although not indicated in the formula, there is also a compound in which all of the ring a, ring b, and ring c have been changed to the ring A', ring B' and ring C' Furthermore, as apparent from the above formulas (1'-1) and (1'-2), for example, $R^8$ of the ring b and $R^7$ of the ring c, $R^{11}$ of the ring b and $R^1$ of the ring a, $R^4$ of the ring c and $R^3$ of the ring a, and the like do not correspond to "adjacent groups", and these groups are not bonded to each other. That is, the term "adjacent groups" means adjacent groups on the same ring.

A compound represented by the above formula (1'-1) or (1'-2) corresponds to, for example, a compound represented by any one of formulas (1A-402) to (1-409) and the like listed as specific compounds described below. That is, for example, the compound represented by formula (1'-1) or (1'-2) is a compound having ring A' (or ring B' or ring C') that is formed by fusing a benzene ring, an indole ring, a pyrrole ring, a benzofuran ring, or a benzothiophene ring to a benzene ring which is ring a (or ring b or ring c), and the fused ring A' (or fused ring B' or fused ring C') that has been formed is a naphthalene ring, a carbazole ring, an indole ring, a dibenzofuran ring, or a dibenzothiophene ring.

$X^1$ and $X^2$ in general formula (1) each independently represent >O, >N—R, >S, >Se, or >C(—Ra)$_2$, while R of the >N—R represents an optionally substituted aryl, an optionally substituted heteroaryl, or an optionally substituted alkyl, and R of the >N—R may be bonded to the ring A, ring B, and/or ring C with a linking group or a single bond. The linking group is preferably —O—, —S— or —C(—R)$_2$—. Note that R of "—C(—R)$_2$—" represents a hydrogen atom or an alkyl. Incidentally, Ra of the >C(—Ra)$_2$ represents a linear or branched alkyl starting from a methylene group, represented by "—$CH_2$—$C_{n-1}H_{2(n-1)+1}$ (n is 1 or more)". This description also applies to $X^1$ and $X^2$ in general formula (1').

Here, the provision that "R of the >N—R is bonded to the ring A, ring B, and/or ring C with a linking group or a single bond" in general formula (1) corresponds to the provision that "R of the >N—R is bonded to the ring a, ring b, and/or ring c with —O—, —S—, —C(—R)$_2$—, or a single bond" in general formula (1').

This provision can be expressed by a compound having a ring structure in which $X^1$ and $X^2$ are incorporated into the fused ring B' and C', respectively, represented by the following formula (1'-3-1). That is, for example, the compound is a compound having ring B' (or ring C') formed by fusing another ring to a benzene ring which is ring b (or ring c) in general formula (1') so as to incorporate $X^1$ (or $X^2$) This compound corresponds to, for example, a compound represented by any one of formulas (1A-451) to (1A-462) or a compound represented by any one of formulas (1A-1401) to (1A-1460), listed as specific examples described below, and the fused ring B' (or fused ring C') that has been formed is, for example, a phenoxazine ring, a phenothiazine ring, or an acridine ring.

The above provision can be expressed by a compound having a ring structure in which $X^1$ and/or $X^2$ are/is incorporated into the fused ring A', represented by the following formula (1'-3-2) or (1'-3-3). That is, for example, the compound is a compound having ring A' formed by fusing another ring to a benzene ring which is ring a in general formula (1') so as to incorporate $X^1$ (and/or $X^2$). This compound corresponds to, for example, a compound represented by any one of formulas (1A-471) to (1A-479) listed as specific examples described below, and the fused ring A' that has been formed is, for example, a phenoxazine ring, a phenothiazine ring, or an acridine ring.

Note that the symbols in formulas (1'-3-1) to (1'-3-3) are defined in the same manner as those in formula (1').

(1'-3-1)

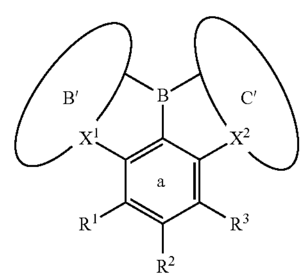

(1'-3-2)

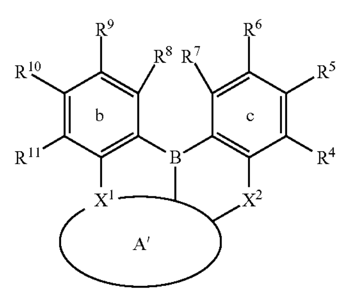

-continued (1'-3-3)

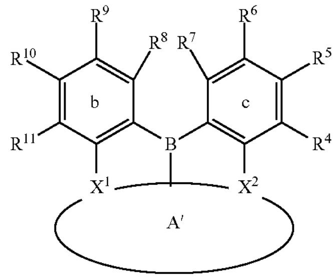

Ra of the >C(—Ra)$_2$ represents a linear or branched alkyl starting from a methylene group (—$CH_2$—), represented by "—$CH_2$—$C_{n-1}H_{2(n-1)+1}$ (n is 1 or more)". The two Ra's have the same structure, and "C (carbon atom)" in the portion of ">C(—Ra)$_2$" as $X^1$ or $X^2$ in general formula (1) does not become an asymmetric carbon atom. n is 1 or more, preferably 1 to 6, more preferably 1 to 4, still more preferably 1 to 3, particularly preferably 1 or 2, and most preferably 1 (methyl group). Specific examples of an alkyl as Ra will be described in detail later, but the alkyl may be linear or branched, and is particularly preferably linear. Since Ra is an alkyl group starting from a methylene group (—$CH_2$—), in a case where Ra is a branched alkyl, Ra is not branched at a carbon atom bonded to "C (carbon atom)" in the portion of ">C(—Ra)$_2$" (that is, a carbon atom at the 1st position), but can be branched at a carbon atom at the 2nd position or later. For example, Ra can be a branched alkyl of "—$CH_2$—C(—$CH_3$)$_3$", but cannot be a branched alkyl of "—CH(—$CH_3$)—$CH_3$". This description for Ra also applies to Ra in general formula (1').

The "aryl ring" as the ring A, ring B, or ring C of general formula (1) is, for example, an aryl ring having 6 to 30 carbon atoms, and the aryl ring is preferably an aryl ring having 6 to 16 carbon atoms, more preferably an aryl ring having 6 to 12 carbon atoms, and particularly preferably an aryl ring having 6 to 10 carbon atoms. Incidentally, this "aryl ring" corresponds to the "aryl ring formed by bonding adjacent groups among $R^1$ to $R^{11}$ together with the ring a, ring b, or ring c" defined by general formula (1'). Ring a (or ring b or ring c) is already constituted by a benzene ring having 6 carbon atoms, and therefore the carbon number of 9 in total of a fused ring obtained by fusing a 5-membered ring to this benzene ring becomes a lower limit of the carbon number.

Specific examples of the "aryl ring" include: a benzene ring which is a monocyclic system; a biphenyl ring which is a bicyclic system; a naphthalene ring which is a fused bicyclic system; a terphenyl ring (m-terphenyl, o-terphenyl, or p-terphenyl) which is a tricyclic system; an acenaphthylene ring, a fluorene ring, a phenalene ring, and a phenanthrene ring which are fused tricyclic systems; a triphenylene ring, a pyrene ring, and a naphthacene ring which are fused tetracyclic systems; and a perylene ring and a pentacene ring which are fused pentacyclic systems.

The "heteroaryl ring" as the ring A, ring B, or ring C of general formula (1) is, for example, a heteroaryl ring having 2 to 30 carbon atoms, and the heteroaryl ring is preferably a heteroaryl ring having 2 to 25 carbon atoms, more preferably a heteroaryl ring having 2 to 20 carbon atoms, still more preferably a heteroaryl ring having 2 to 15 carbon atoms, and particularly preferably a heteroaryl ring having 2 to 10 carbon atoms. In addition, examples of the "heteroaryl ring" include a heterocyclic ring containing 1 to 5 heteroatoms selected from an oxygen atom, a sulfur atom, and a nitrogen atom in addition to a carbon atom as a ring-constituting atom. Incidentally, this "heteroaryl ring" corresponds to the "heteroaryl ring formed by bonding adjacent groups among the $R^1$ to $R^{11}$ together with the ring a, ring b, or ring c" defined by general formula (1'). The ring a (or ring b or ring c) is already constituted by a benzene ring having 6 carbon atoms, and therefore the carbon number of 6 in total of a fused ring obtained by fusing a 5-membered ring to this benzene ring becomes a lower limit of the carbon number.

Specific examples of the "heteroaryl ring" include a pyrrole ring, an oxazole ring, an isoxazole ring, a thiazole ring, an isothiazole ring, an imidazole ring, an oxadiazole ring, a thiadiazole ring, a triazole ring, a tetrazole ring, a pyrazole ring, a pyridine ring, a pyrimidine ring, a pyridazine ring, a pyrazine ring, a triazine ring, an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, an indolizine ring, a furan ring, a benzofuran ring, an isobenzofuran ring, a dibenzofuran ring, a thiophene ring, a benzothiophene ring, a dibenzothiophene ring, a furazane ring, an oxadiazole ring, and a thianthrene ring.

At least one hydrogen atom in the above "aryl ring" or "heteroaryl ring" may be substituted by a substituted or unsubstituted "aryl", a substituted or unsubstituted "heteroaryl", a substituted or unsubstituted "diarylamino", a substituted or unsubstituted "diheteroarylamino", a substituted or unsubstituted "arylheteroarylamino", a substituted or unsubstituted "alkyl", a substituted or unsubstituted "alkoxy", a trialkylsilyl, a substituted or unsubstituted "aryloxy", cyano, or a halogen atom, which is a primary substituent. Examples of the "aryl", the "heteroaryl", the aryl of the "diarylamino", the heteroaryl of the "diheteroarylamino", the aryl and the heteroaryl of the "arylheteroarylamino", and the aryl of the "aryloxy" as these primary substituents include a monovalent group of the "aryl ring" or "heteroaryl ring" described above.

Furthermore, the "alkyl" as the primary substituent may be either linear or branched, and examples thereof include a linear alkyl having 1 to 24 carbon atoms and a branched alkyl having 3 to 24 carbon atoms. An alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 4 carbon atoms (branched alkyl having 3 or 4 carbon atoms) is particularly preferable.

Specific examples of the alkyl include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

Furthermore, the "alkoxy" as a primary substituent may be, for example, a linear alkoxy having 1 to 24 carbon atoms or a branched alkoxy having 3 to 24 carbon atoms. The alkoxy is preferably an alkoxy having 1 to 18 carbon atoms (branched alkoxy having 3 to 18 carbon atoms), more preferably an alkoxy having 1 to 12 carbon atoms (branched alkoxy having 3 to 12 carbon atoms), still more preferably an alkoxy having 1 to 6 carbon atoms (branched alkoxy having 3 to 6 carbon atoms), and particularly preferably an alkoxy having 1 to 4 carbon atoms (branched alkoxy having 3 or 4 carbon atoms).

Specific examples of the alkoxy include methoxy, ethoxy, propoxy, isopropoxy, butoxy, isobutoxy, s-butoxy, t-butoxy, pentyloxy, hexyloxy, heptyloxy, and octyloxy.

Examples of the "trialkylsilyl" as a primary substituent include a compound having a structure in which three hydrogen atoms in a silyl group are each independently substituted by an alkyl, and examples of the alkyl include a group described in the column of "alkyl" as a primary substituent. An alkyl preferable for substitution is an alkyl having 1 to 4 carbon atoms, and specific examples thereof include methyl, ethyl, propyl, i-propyl, butyl, sec-butyl, t-butyl, and cyclobutyl.

Specific examples of the trialkylsily include trimethylsilyl, triethylsilyl, tripropylsilyl, tri-i-propylsilyl, tributylsilyl, tri-sec-butylsilyl, tri-t-butylsilyl, ethyldimethylsilyl, propyldimethylsilyl, i-propyldimethylsilyl, butyldimethylsilyl, sec-butyldimethylsilyl, t-butyldimethylsilyl, methyldiethylsilyl, propyldiethylsilyl, i-propyldiethylsilyl, butyldiethylsilyl, sec-butyldiethylsilyl, t-butyldiethylsilyl, methyldipropylsilyl, ethyldipropylsilyl, butyldipropylsilyl, sec-butyldipropylsilyl, t-butyldipropylsilyl, methyldi-i-propylsilyl, ethyldi-i-propylsilyl, butyldi-i-propylsilyl, sec-butyldi-i-propylsilyl, and t-butyldi-i-propylsilyl.

The "halogen" as a primary substituent is fluorine, chlorine, bromine, or iodine, preferably fluorine, chlorine, or bromine, and more preferably chlorine.

In the substituted or unsubstituted "aryl", substituted or unsubstituted "heteroaryl", substituted or unsubstituted "diarylamino", substituted or unsubstituted "diheteroarylamino", substituted or unsubstituted "arylheteroarylamino", substituted or unsubstituted "alkyl", substituted or unsubstituted "alkoxy", or substituted or unsubstituted "aryloxy", which is a primary substituent, at least one hydrogen atom may be substituted by a secondary substituent, as described to be substituted or unsubstituted. Examples of this secondary substituent include an aryl, a heteroaryl, and an alkyl, and for specific examples thereof, reference can be made to the above description on the monovalent group of the "aryl ring" or "heteroaryl ring" and the "alkyl" as a primary substituent. Furthermore, the aryl or heteroaryl as a secondary substituent also includes an aryl or a heteroaryl in which at least one hydrogen atom is substituted by an aryl such as phenyl (specific examples are described above), or an alkyl such as methyl (specific examples are described above). For example, when the secondary substituent is a carbazolyl group, the heteroaryl as a secondary substituent also includes a carbazolyl group in which at least one hydrogen atom at the 9-position is substituted by an aryl such as phenyl, or an alkyl such as methyl.

Examples of the aryl, the heteroaryl, the aryl of the diarylamino, the heteroaryl of the diheteroarylamino, the aryl and the heteroaryl of the arylheteroarylamino, or the aryl of the aryloxy for $R^1$ to $R^{11}$ of general formula (1') include the monovalent groups of the "aryl ring" or "heteroaryl ring" described in general formula (1). Furthermore, regarding the alkyl or alkoxy for $R^1$ to $R^{11}$, reference can be made to the description on the "alkyl" or "alkoxy" as a primary substituent in the above description of general formula (1). In addition, the same also applies to the aryl, heteroaryl, or alkyl as a substituent on these groups. Furthermore, the same also applies to the heteroaryl, diarylamino, diheteroarylamino, arylheteroarylamino, alkyl, alkoxy, or aryloxy as a substituent on these rings in a case of bonding adjacent groups among $R^1$ to $R^{11}$ to form an aryl ring or a heteroaryl ring together with the ring a, ring b, or ring c, and the aryl, heteroaryl, or alkyl as a further substituent.

R of the >N—R for $X^1$ and $X^2$ of general formula (1) represents an aryl, a heteroaryl, or an alkyl which may be substituted by a secondary substituent described above, and at least one hydrogen atom in the aryl or heteroaryl may be substituted by, for example, an alkyl. Examples of this aryl, heteroaryl or alkyl include the groups described above. Particularly, an aryl having 6 to 10 carbon atoms (for example, a phenyl or a naphthyl), a heteroaryl having 2 to 15 carbon atoms (for example, carbazolyl), and an alkyl having 1 to 4 carbon atoms (for example, methyl or ethyl) are preferable. This description also applies to $X^1$ and $X^2$ in general formula (1').

R of the "—C(—R)$_2$—" as a linking group in general formula (1) represents a hydrogen atom or an alkyl, and examples of this alkyl include the groups described above. Particularly, an alkyl having 1 to 4 carbon atoms (for example, methyl or ethyl) is preferable. This description also applies to "—C(—R)$_2$—" as a linking group in general formula (1').

The multimer of a polycyclic aromatic compound having a plurality of unit structures each represented by general formula (1), preferably the multimer of a polycyclic aromatic compound having a plurality of unit structures each represented by general formula (1') is preferably a dimer to a hexamer, more preferably a dimer or a trimer, and particularly preferably a dimer. The multimer only needs to be in a form having a plurality of the unit structures described above in one compound. For example, the multimer may be in a form in which the plurality of unit structures is bonded with a single bond or a linking group such as an alkylene group having 1 to 3 carbon atoms, a phenylene group, or a naphthylene group. In addition, the multimer may be in a form in which the plurality of unit structures is bonded such that any ring contained in the unit structure (ring A, ring B, or ring C, or ring a, ring b, or ring c) is shared by the plurality of unit structures, or may be in a form in which the unit structures are bonded such that any rings contained in the unit structure (ring A, ring B, or ring C, or ring a, ring b, or ring c) are fused to each other.

Examples of such a multimer include multimer compounds represented by the following formulas (1'-4), (1'-4-1), (1'-4-2), (1'-5-1) to (1'-5-4), and (1'-6). A multimer compound represented by the following formula (1'-4) corresponds to, for example, a compound represented by formula (1A-423) described below. That is, to be described in connection with general formula (1'), the multimer compound includes a plurality of unit structures each represented by general formula (1') in one compound so as to share a benzene ring which is ring a. Furthermore, to be described in connection with general formula (1'), the multimer compound represented by the following formula (1'-4-1) includes two unit structures each represented by general formula (1') in one compound so as to share a benzene ring which is ring a. Furthermore, a multimer compound represented by the following formula (1'-4-2) corresponds to, for example, a compound represented formula (1A-2666), described later. That is, to be described in connection with general formula (1'), the multimer compound includes three unit structures each represented by general formula (1') in one compound so as to share a benzene ring which is ring a.

Furthermore, multimer compounds represented by the following formulas (1'-5-1) to (1'-5-4) each include a plurality of unit structures each represented by general formula (1') in one compound so as to share a benzene ring which is ring b (or ring c). Furthermore, a multimer compound represented by the following formula (1'-6) corresponds to, for example, a compound represented by the following formula (1A-431). That is, to be described in connection with general formula (1'), for example, the multimer compound includes a plurality of unit structures each represented by general formula (1') in one compound such that a benzene ring which is ring b (or ring a or ring c) of a certain unit structure and a benzene ring which is ring b (or ring a or ring c) of a certain unit structure are fused.

Note that the symbols in formulas (1'-4), (1'-4-1), (1'-4-2), (1'-5-1) to (1'-5-4), and (1'-6) are defined in the same manner as those in formula (1').

(1'-4)

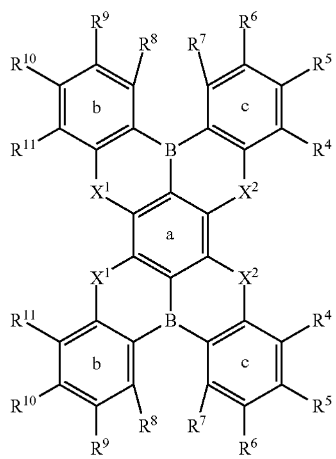

(1'-4-1)

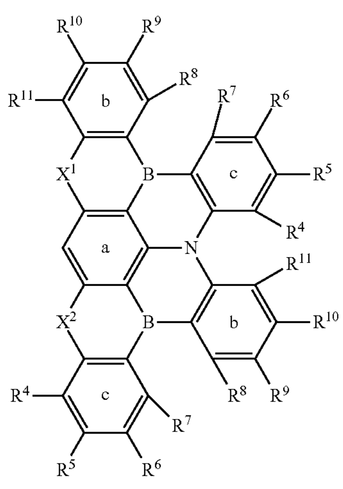

-continued (1'-4-2)

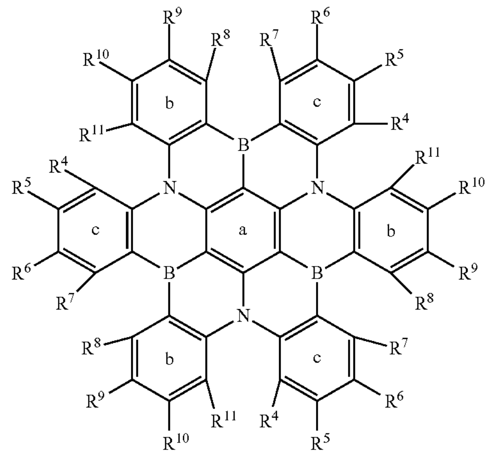

(1'-5-1)

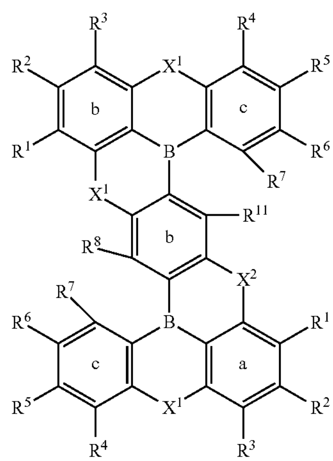

(1'-5-2)

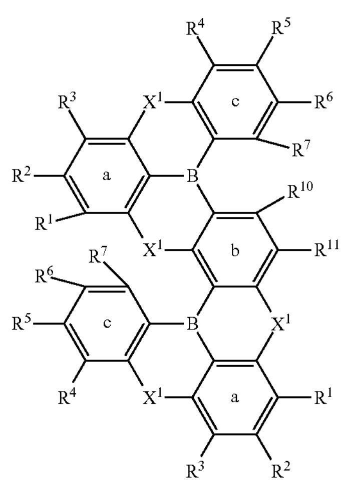

-continued (1'-5-3)

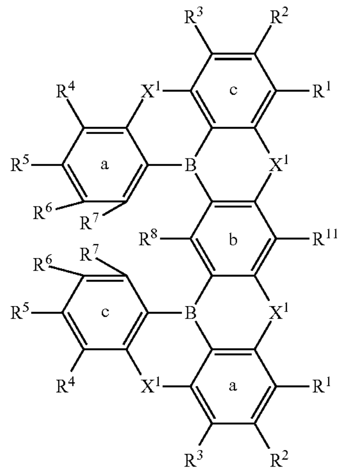

(1'-5-4)

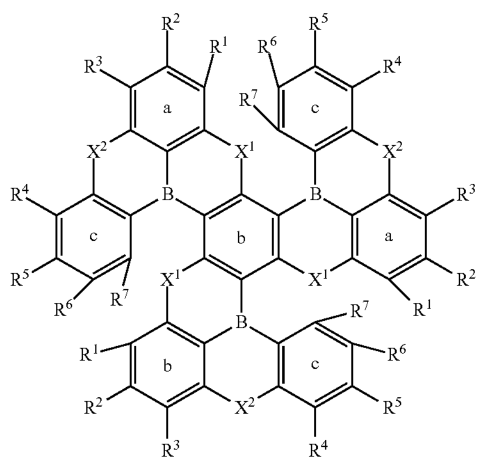

(1'-6)

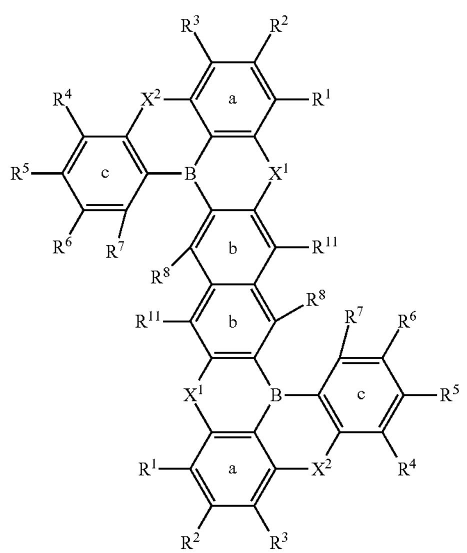

The multimer compound may be a multimer in which a multimer form represented by formula (1'-4), (1'-4-1), or (1'-4-2) and a multimer form represented by any one of formulas (1'-5-1) to (1'-5-4) or (1'-6) are combined, may be a multimer in which a multimer form represented by any one of formulas (1'-5-1) to (1'-5-4) and a multimer form represented by formula (1'-6) are combined, or may be a multimer in which a multimer form represented by formula (1'-4), (1'-4-1), or (1'-4-2), a multimer form represented by any one of formulas (1'-5-1) to (1'-5-4), and a multimer form represented by formula (1'-6) are combined.

Furthermore, all or some of the hydrogen atoms in the chemical structures of the polycyclic aromatic compound represented by general formula (1) or (1') and a multimer thereof may be deuterium atoms.

1-2. Polycyclic Aromatic Compounds Represented by General Formulas (1A) to (1E) and Multimers Thereof Specific examples of the polycyclic aromatic compound used in the present invention and a multimer thereof include a polycyclic aromatic compound represented by any one of the following general formulas (1A) to (1E) and a multimer of a polycyclic aromatic compound having a plurality of structures each represented by any one of the following general formulas (1A) to (1E). The symbols in the following formulas (1A) to (1E) are defined in the same manner as those described above.

(1A)

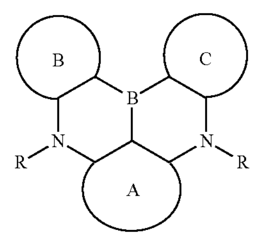

(1B)

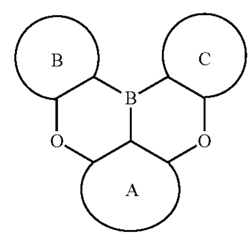

(1C)

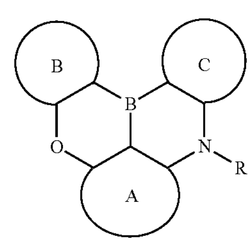

(1D)

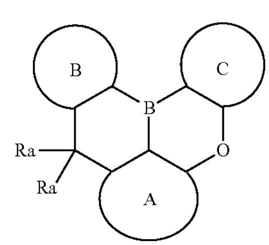

-continued (1E)

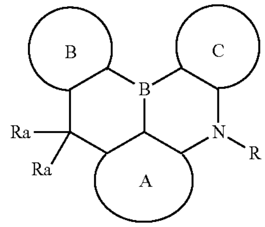

In the present invention, as a dopant in the light emitting layer material, two or more of the polycyclic aromatic compounds and/or multimers thereof are included. Examples of the combination include (combination 1) at least two compounds selected from compounds represented by formula (1A) and multimers thereof, (combination 2) at least two compounds selected from compounds represented by formula (1B) and multimers thereof, (combination 3) at least two compounds selected from compounds represented by formula (1C) and multimers thereof, (combination 4) at least two compounds selected from compounds represented by formula (1D) and multimers thereof, and (combination 5) at least two compounds selected from compounds represented by formula (1E) and multimers thereof.

Furthermore, examples of the combination include (combination 6) at least one compound selected from compounds represented by formula (1A) and multimers thereof and at least one compound selected from compounds represented by formula (1B) and multimers thereof, (combination 7) at least one compound selected from compounds represented by formula (1A) and multimers thereof and at least one compound selected from compounds represented by formula (1C) and multimers thereof, (combination 8) at least one compound selected from compounds represented by formula (1A) and multimers thereof and at least one compound selected from compounds represented by formula (1D) and multimers thereof, and (combination 9) at least one compound selected from compounds represented by formula (1A) and multimers thereof and at least one compound selected from compounds represented by formula (1E) and multimers thereof.

Furthermore, examples of the combination include (combination 10) at least one compound selected from compounds represented by formula (1B) and multimers thereof and at least one compound selected from compounds represented by formula (1C) and multimers thereof, (combination 11) at least one compound selected from compounds represented by formula (1B) and multimers thereof and at least one compound selected from compounds represented by formula (1D) and multimers thereof, and (combination 12) at least one compound selected from compounds represented by formula (1B) and multimers thereof and at least one compound selected from compounds represented by formula (1E) and multimers thereof.

Furthermore, examples of the combination include (combination 13) at least one compound selected from compounds represented by formula (1C) and multimers thereof and at least one compound selected from compounds represented by formula (1D) and multimers thereof, and (combination 14) at least one compound selected from compounds represented by formula (1C) and multimers thereof and at least one compound selected from compounds represented by formula (1E) and multimers thereof.

Furthermore, examples of the combination include (combination 15) at least one compound selected from compounds represented by formula (1D) and multimers thereof and at least one compound selected from compounds represented by formula (1E) and multimers thereof.

The symbols in the above formulas (1A) to (1E) are defined in the same manner as those described above. However, preferably in formulas (1A) to (1E), the ring A, ring B, and ring C each independently represent an aryl ring or a heteroaryl ring, and at least one hydrogen atom in these rings may be substituted by a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino, a substituted or unsubstituted alkyl, a substituted or unsubstituted alkoxy, a trialkylsilyl, a substituted or unsubstituted aryloxy, cyano, or a halogen atom, R of the >N—R independently represents an aryl optionally substituted by an alkyl or a heteroaryl or alkyl optionally substituted by an alkyl, the R may be bonded to the ring A, ring B, and/or ring C with —O—, —S—, —C(—R)$_2$—, or a single bond, and R of the —C(—R)$_2$— represents a hydrogen atom or an alkyl, Ra of >C(—Ra)$_2$ represents a linear or branched alkyl starting from a methylene group, represented by "—CH$_2$—C$_{n-1}$H$_{2(n-1)+1}$ (n is 1 to 6)", at least one hydrogen atom in a compound or a structure represented by any one of formulas (1A) to (1E) may be substituted by a deuterium atom, and in a case of a multimer, the multimer is a dimer or a trimer having two or three structures each represented by any one of formulas (1A) to (1E).

For a polycyclic aromatic compound represented by any one of formulas (1A) to (1E) and a multimer thereof, the above description of the symbols in formula (1) can be cited, but each of the formulas will be described below.

1-2(1). Polycyclic Aromatic Compound Represented by General Formula (1A) and Multimer Thereof A polycyclic aromatic compound represented by general formula (1A) and a multimer of a polycyclic aromatic compound having a plurality of structures each represented by general formula (LA) are as follows, and are preferably a polycyclic aromatic compound represented by the following general formula (1A') and a multimer of a polycyclic aromatic compound having a plurality of structures each represented by the following general formula (1A').

(1A)

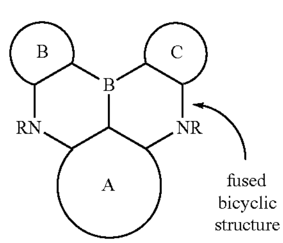

-continued (1A')

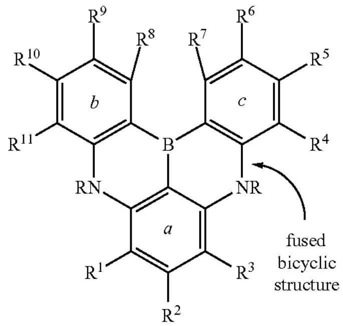

The ring A, ring B, and ring C in general formula (1A) each independently represent an aryl ring or a heteroaryl ring, and at least one hydrogen atom in these rings may be substituted by a substituent. The substituent is preferably a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino (amino group having an aryl and a heteroaryl), a substituted or unsubstituted alkyl, a substituted or unsubstituted alkoxy, a substituted or unsubstituted aryloxy, cyano, or a halogen atom. In a case where these groups have substituents, examples of the substituents include an aryl, a heteroaryl, and an alkyl. The aryl ring or the heteroaryl ring preferably has a 5-membered ring or a 6-membered ring sharing a bond with a fused bicyclic structure constituted by the central element B (boron) and >N—R on the left and right (hereinafter, this structure is also referred to as "structure D") at the center of general formula (1A).

Here, the "fused bicyclic structure (structure D)" means a structure in which two saturated hydrocarbon rings including the central element B (boron) and >N—R on the left and right illustrated at the center of general formula (1A) are fused. The "6-membered ring sharing a bond with the fused bicyclic structure" means ring a (benzene ring (6-membered ring)) fused to the structure D, for example, as illustrated in the above general formula (1A'). The phrase "aryl ring or heteroaryl ring (which is ring A) has this 6-membered ring" means that the ring A is formed only from this 6-membered ring, or the ring A is formed such that other rings and the like are further fused to this 6-membered ring so as to include this 6-membered ring. In other words, the "aryl ring or heteroaryl ring (which is ring A) having a 6-membered ring" as used herein means that the 6-membered ring constituting the entirety or a portion of the ring A is fused to the structure D. A similar description applies to the "ring B (ring b)", "ring C (ring c)", and the "5-membered ring".

The ring A (or ring B or ring C) in general formula (1A) corresponds to ring a and its substituents $R^1$ to $R^3$ in general formula (1A') (or ring b and its substituents $R^8$ to $R^{11}$, or ring c and its substituents $R^4$ to $R^7$). That is, general formula (1A') corresponds to a structure in which "rings A to C having 6-membered rings" have been selected as the rings A to C of general formula (1A). For this meaning, the rings of general formula (1A'2) are represented by small letters a to c.

In general formula (1A'), adjacent groups among the substituents $R^1$ to $R^{11}$ of the ring a, ring b, and ring c may be bonded to each other to form an aryl ring or a heteroaryl ring together with the ring a, ring b, or ring c, and at least one hydrogen atom in the ring thus formed may be substituted by an aryl, a heteroaryl, a diarylamino, a diheteroarylamino, an arylheteroarylamino, an alkyl, an alkoxy, an aryloxy, cyano, or a halogen atom, while at least one hydrogen atom in these may be substituted by an aryl, a heteroaryl, or an alkyl. Therefore, in a polycyclic aromatic compound represented by general formula (1A'), a ring structure constituting the compound changes as represented by the following formulas (1A'-1) and (1A'-2) according to a mutual bonding form of substituents in the ring a, ring b, and ring c. Ring A', ring B', and ring C' in each formula correspond to the ring A, ring B, and ring C in general formula (1A), respectively. Note that the symbols in formulas (1A'-1) and (1A'-2) are defined in the same manner as those in formula (1A).

(1A'-1)

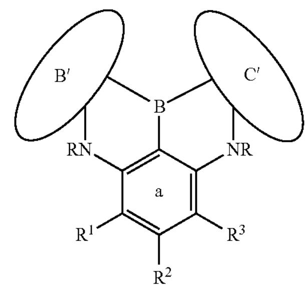

(1A'-2)

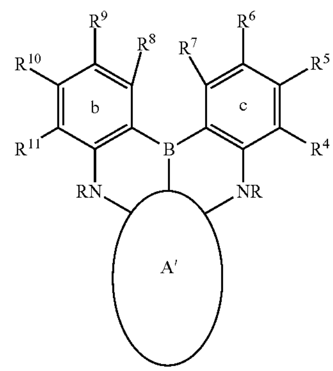

The ring A', ring B', and ring C' in the above formulas (1A'-1) and (1A'-2) each represent, to be described in connection with general formula (1A'), an aryl ring or a heteroaryl ring formed by bonding adjacent groups among the substituents $R^1$ to $R^{11}$ together with the ring a, ring b, and ring c, respectively (may also be referred to as a fused ring obtained by fusing another ring structure to the ring a, ring b, or ring c). Incidentally, although not indicated in the formula, there is also a compound in which all of the ring a, ring b, and ring c have been changed to the ring A', ring B' and ring C'. Furthermore, as apparent from the above formulas (1A'-1) and (1A'-2), for example, $R^8$ of the ring b and $R^7$ of the ring c, $R^{11}$ of the ring b and $R^1$ of the ring a, $R^4$ of the ring c and $R^3$ of the ring a, and the like do not correspond to "adjacent groups", and these groups are not bonded to each other. That is, the term "adjacent groups" means adjacent groups on the same ring.

For example, the compound represented by the above formula (1A'-1) or (1A'-2) is a compound having ring A' (or ring B' or ring C') that is formed by fusing a benzene ring, an indole ring, a pyrrole ring, a benzofuran ring, or a benzothiophene ring to a benzene ring which is ring a (or ring b or ring c), and the fused ring A' (or fused ring B' or fused ring C') that has been formed is a naphthalene ring, a carbazole ring, an indole ring, a dibenzofuran ring, or a dibenzothiophene ring.

R of >N—R in general formula (1A) independently represents an optionally substituted aryl, an optionally substituted heteroaryl, or an optionally substituted alkyl, and R of the >N—R may be bonded to the ring A, ring B, and/or ring C with a linking group or a single bond. The linking group is preferably —O—, —S— or —C(—R)$_2$—. Incidentally, R of the "—C(—R)$_2$—" represents a hydrogen atom or an alkyl. This description also applies to >N—R in general formula (1A').

Here, the provision that "R of >N—R is bonded to the ring A, ring B, and/or ring C with a linking group or a single bond" in general formula (1A) corresponds to the provision that "R of >N—R is bonded to the ring a, ring b, and/or ring c with —O—, —S—, —C(—R)$_2$—, or a single bond" in general formula (1A').

This provision can be expressed by a compound having a ring structure in which N is incorporated into each of the fused ring B' and C', represented by the following formula (1A'-3-1). That is, for example, the compound is a compound having ring B' (or ring C') formed by fusing another ring to a benzene ring which is ring b (or ring c) in general formula (1A') so as to incorporate N. The fused ring B' (or fused ring C') that has been formed is, for example, a phenoxazine ring, a phenothiazine ring, or an acridine ring.

The above provision can be expressed by a compound having a ring structure in which N is incorporated into the fused ring A', represented by the following formula (1A'-3-2) or (1A'-3-3). That is, for example, the compound is a compound having ring A' formed by fusing another ring to a benzene ring which is ring a in general formula (1A') so as to incorporate N. The fused ring A' that has been formed is, for example, a phenoxazine ring, a phenothiazine ring, or an acridine ring. Note that the symbols in formulas (1A'-3-1) to (1A'-3-3) are defined in the same manner as those in formula (1A').

(1A'-3-1)

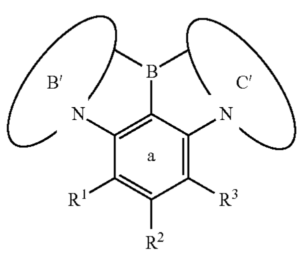

(1A'-3-2)

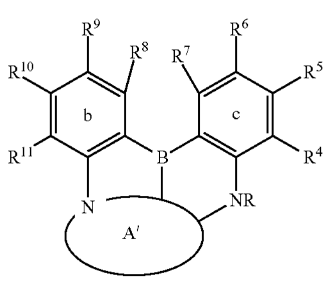

-continued (1A'-3-3)

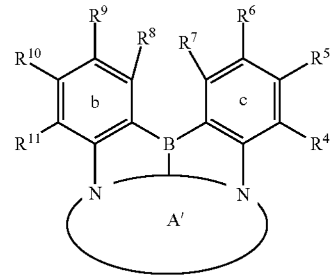

The "aryl ring" as the ring A, ring B, or ring C of general formula (1A) is, for example, an aryl ring having 6 to 30 carbon atoms, and the aryl ring is preferably an aryl ring having 6 to 16 carbon atoms, more preferably an aryl ring having 6 to 12 carbon atoms, and particularly preferably an aryl ring having 6 to 10 carbon atoms. Incidentally, this "aryl ring" corresponds to the "aryl ring formed by bonding adjacent groups among $R^1$ to $R^{11}$ together with the ring a, ring b, or ring c" defined by general formula (1A'). Ring a (or ring b or ring c) is already constituted by a benzene ring having 6 carbon atoms, and therefore the carbon number of 9 in total of a fused ring obtained by fusing a 5-membered ring to this benzene ring becomes a lower limit of the carbon number.

Specific examples of the "aryl ring" include: a benzene ring which is a monocyclic system; a biphenyl ring which is a bicyclic system; a naphthalene ring which is a fused bicyclic system; a terphenyl ring (m-terphenyl, o-terphenyl, or p-terphenyl) which is a tricyclic system; an acenaphthylene ring, a fluorene ring, a phenalene ring, and a phenanthrene ring which are fused tricyclic systems; a triphenylene ring, a pyrene ring, and a naphthacene ring which are fused tetracyclic systems; and a perylene ring and a pentacene ring which are fused pentacyclic systems.

The "heteroaryl ring" as the ring A, ring B, or ring C of general formula (1A) is, for example, a heteroaryl ring having 2 to 30 carbon atoms, and the heteroaryl ring is preferably a heteroaryl ring having 2 to 25 carbon atoms, more preferably a heteroaryl ring having 2 to 20 carbon atoms, still more preferably a heteroaryl ring having 2 to 15 carbon atoms, and particularly preferably a heteroaryl ring having 2 to 10 carbon atoms. In addition, examples of the "heteroaryl ring" include a heterocyclic ring containing 1 to 5 heteroatoms selected from an oxygen atom, a sulfur atom, and a nitrogen atom in addition to a carbon atom as a ring-constituting atom. Incidentally, this "heteroaryl ring" corresponds to the "heteroaryl ring formed by bonding adjacent groups among the $R^1$ to $R^{11}$ together with the ring a, ring b, or ring c" defined by general formula (1A'). The ring a (or ring b or ring c) is already constituted by a benzene ring having 6 carbon atoms, and therefore the carbon number of 6 in total of a fused ring obtained by fusing a 5-membered ring to this benzene ring becomes a lower limit of the carbon number.

Specific examples of the "heteroaryl ring" include a pyrrole ring, an oxazole ring, an isoxazole ring, a thiazole ring, an isothiazole ring, an imidazole ring, an oxadiazole ring, a thiadiazole ring, a triazole ring, a tetrazole ring, a pyrazole ring, a pyridine ring, a pyrimidine ring, a pyridazine ring, a pyrazine ring, a triazine ring, an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, an indolizine ring, a furan ring, a benzofuran ring, an isobenzofuran ring, a dibenzofuran ring, a thiophene ring, a benzothiophene ring, a dibenzothiophene ring, a furazane ring, an oxadiazole ring, and a thianthrene ring.

At least one hydrogen atom in the above "aryl ring" or "heteroaryl ring" may be substituted by a substituted or unsubstituted "aryl", a substituted or unsubstituted "heteroaryl", a substituted or unsubstituted "diarylamino", a substituted or unsubstituted "diheteroarylamino", a substituted or unsubstituted "arylheteroarylamino", a substituted or unsubstituted "alkyl", a substituted or unsubstituted "alkoxy", or a substituted or unsubstituted "aryloxy", which is a primary substituent. Examples of the "aryl", the "heteroaryl", the aryl of the "diarylamino", the heteroaryl of the "diheteroarylamino", the aryl and the heteroaryl of the "arylheteroarylamino", and the aryl of the "aryloxy" as these primary substituents include a monovalent group of the "aryl ring" or "heteroaryl ring" described above.

Furthermore, the "alkyl" as the primary substituent may be either linear or branched, and examples thereof include a linear alkyl having 1 to 24 carbon atoms and a branched alkyl having 3 to 24 carbon atoms. An alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 4 carbon atoms (branched alkyl having 3 or 4 carbon atoms) is particularly preferable.

Specific examples of the alkyl include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

Furthermore, the "alkoxy" as a primary substituent may be, for example, a linear alkoxy having 1 to 24 carbon atoms or a branched alkoxy having 3 to 24 carbon atoms. The alkoxy is preferably an alkoxy having 1 to 18 carbon atoms (branched alkoxy having 3 to 18 carbon atoms), more preferably an alkoxy having 1 to 12 carbon atoms (branched alkoxy having 3 to 12 carbon atoms), still more preferably an alkoxy having 1 to 6 carbon atoms (branched alkoxy having 3 to 6 carbon atoms), and particularly preferably an alkoxy having 1 to 4 carbon atoms (branched alkoxy having 3 or 4 carbon atoms).

Specific examples of the alkoxy include methoxy, ethoxy, propoxy, isopropoxy, butoxy, isobutoxy, s-butoxy, t-butoxy, pentyloxy, hexyloxy, heptyloxy, and octyloxy.

The "halogen" as a primary substituent is fluorine, chlorine, bromine, or iodine, preferably fluorine, chlorine, or bromine, and more preferably chlorine.

In the substituted or unsubstituted "aryl", substituted or unsubstituted "heteroaryl", substituted or unsubstituted "diarylamino", substituted or unsubstituted "diheteroarylamino", substituted or unsubstituted "arylheteroarylamino", substituted or unsubstituted "alkyl", substituted or unsubstituted "alkoxy", or substituted or unsubstituted "aryloxy", which is a primary substituent, at least one hydrogen atom may be substituted by a secondary substituent, as described to be substituted or unsubstituted. Examples of this secondary substituent include an aryl, a heteroaryl, and an alkyl, and for specific examples thereof, reference can be made to the above description on the monovalent group of the "aryl ring" or "heteroaryl ring" and the "alkyl" as a primary substituent. Furthermore, the aryl or heteroaryl as a secondary substituent also includes an aryl or a heteroaryl in which at least one hydrogen atom is substituted by an aryl such as phenyl (specific examples are described above), or an alkyl such as methyl (specific examples are described above). For example, when the secondary substituent is a carbazolyl group, the heteroaryl as a secondary substituent also includes a carbazolyl group in which at least one hydrogen atom at the 9-position is substituted by an aryl such as phenyl, or an alkyl such as methyl.

Examples of the aryl, the heteroaryl, the aryl of the diarylamino, the heteroaryl of the diheteroarylamino, the aryl and the heteroaryl of the arylheteroarylamino, or the aryl of the aryloxy for $R^1$ to $R^{11}$ of general formula (1A') include the monovalent groups of the "aryl ring" or "heteroaryl ring" described in general formula (1A). Furthermore, regarding the alkyl or alkoxy for $R^1$ to $R^{11}$, reference can be made to the description on the "alkyl" or "alkoxy" as a primary substituent in the above description of general formula (1A). In addition, the same also applies to the aryl, heteroaryl, or alkyl as a substituent on these groups. Furthermore, the same also applies to the heteroaryl, diarylamino, diheteroarylamino, arylheteroarylamino, alkyl, alkoxy, or aryloxy as a substituent on these rings in a case of bonding adjacent groups among $R^1$ to $R^{11}$ to form an aryl ring or a heteroaryl ring together with the ring a, ring b, or ring c, and the aryl, heteroaryl, or alkyl as a further substituent.

R of >N—R in general formula (1A) represents an aryl, a heteroaryl, or an alkyl which may be substituted by a secondary substituent described above, and at least one hydrogen atom in the aryl or heteroaryl may be substituted by, for example, an alkyl. Examples of this aryl, heteroaryl, or alkyl include the groups described above. Particularly, an aryl having 6 to 10 carbon atoms (for example, a phenyl or a naphthyl), a heteroaryl having 2 to 15 carbon atoms (for example, carbazolyl), and an alkyl having 1 to 4 carbon atoms (for example, methyl or ethyl) are preferable. This description also applies to R of >N—R in general formula (1A').

R of "—C(—R)$_2$—" as a linking group in general formula (1A) represents a hydrogen atom or an alkyl, and examples of this alkyl include the groups described above. Particularly, an alkyl having 1 to 4 carbon atoms (for example, methyl or ethyl) is preferable. This description also applies to "—C(—R)$_2$—" as a linking group in general formula (1A').

The light emitting layer may include a multimer of a polycyclic aromatic compound having a plurality of unit structures each represented by general formula (1A), preferably a multimer of a polycyclic aromatic compound having a plurality of unit structures each represented by general formula (1A'). The multimer is preferably a dimer to a hexamer, more preferably a dimer or a trimer, and particularly preferably a dimer. The multimer only needs to be in a form having a plurality of the unit structures described above in one compound. For example, the multimer may be in a form in which the plurality of unit structures is bonded with a single bond or a linking group such as an alkylene group having 1 to 3 carbon atoms, a phenylene group, or a naphthylene group. In addition, the multimer may be in a form in which the plurality of unit structures is bonded such that any ring contained in the unit structure (ring A, ring B, or ring C, or ring a, ring b, or ring c) is shared by the plurality of unit structures, or may be in a form in which the unit structures are bonded such that any rings contained in the unit structure (ring A, ring B, or ring C, or ring a, ring b, or ring c) are fused to each other.

Examples of such a multimer include multimer compounds represented by the following formulas (1A'-4), (1A'-4-1), (1A'-4-2) 1A'-5-1) to (1A'-5-4), and (1A'-6). The compound represented by the following formula (1'-4) is a dimer compound. The compound represented by the following formula (1A'-4-1) is a dimer compound. The compound represented by the following formula (1A'-4-2) is a trimer compound. The compound represented by the following formula (1A'-5-1) is a dimer compound. The compound represented by the following formula (1A'-5-2) is a dimer compound. The compound represented by the following formula (1A'-5-3) is a dimer compound. The compound represented by the following formula (1A'-5-4) is a trimer compound. The compound represented by the following formula (1A'-6) is a dimer compound. To be described in connection with general formula (1A'), the multimer compound represented by the following formula (1A'-4) includes a plurality of unit structures each represented by general formula (1A') in one compound so as to share a benzene ring which is ring a. To be described in connection with general formula (1A'), the multimer compound represented by the following formula (1A'-4-1) includes two unit structures each represented by general formula (1A') in one compound so as to share a benzene ring which is ring a. To be described in connection with general formula (1A'), the multimer compound represented by the following formula (1A'-4-2) includes three unit structures each represented by general formula (1A') in one compound so as to share a benzene ring which is ring a. To be described in connection with general formula (1A'), the multimer compounds represented by the following formulas (1A'-5-1) to (1A'-5-4) each include a plurality of unit structures each represented by general formula (1A') in one compound so as to share a benzene ring which is ring b (or ring c). To be described in connection with general formula (1A'), the multimer compound represented by the following formula (1A'-6) includes a plurality of unit structures each represented by general formula (1A') in one compound such that a benzene ring which is ring b (or ring a or ring c) of a certain unit structure and a benzene ring which is ring b (or ring a or ring c) of a certain unit structure are fused. Note that the symbols in formulas (1A'-4), (1A'-4-1), (1A'-4-2), (1A'-5-1) to (1A'-5-4), and (1A'-6) are defined in the same manner as those in formula (1A').

(1A'-4)

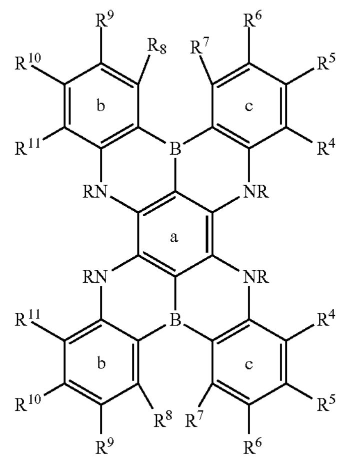

(1A'-4-1)

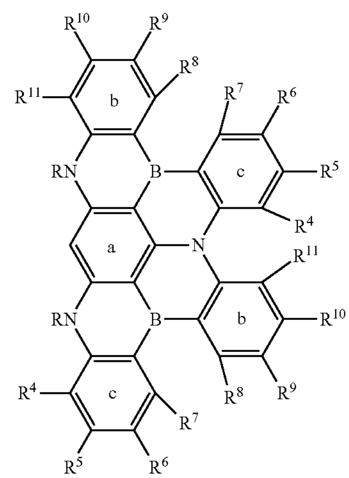

(1A'-4-2)

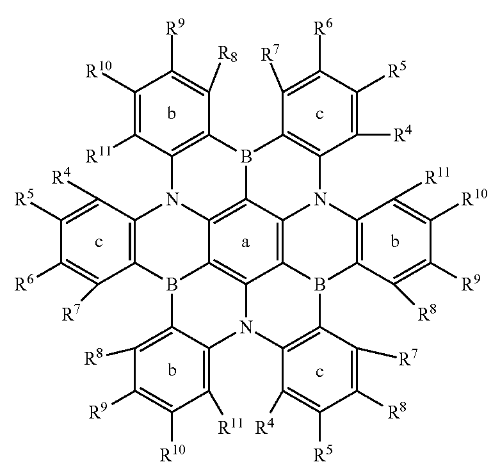

-continued (1A'-5-1)

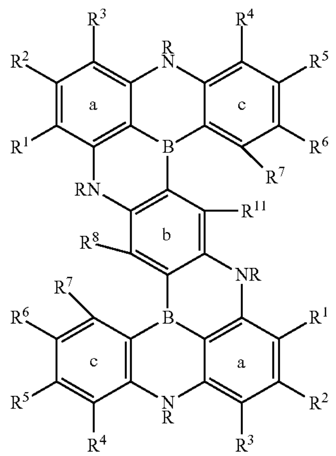

(1A'-5-2)

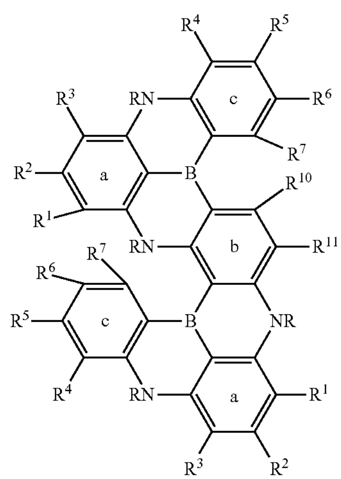

(1A'-5-3)

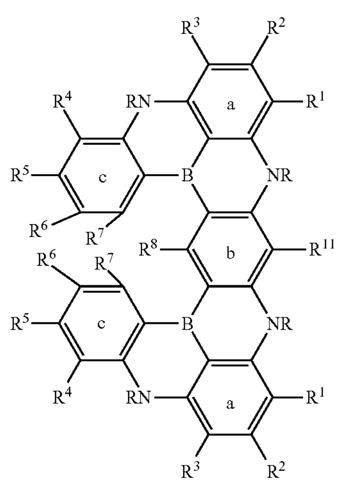

-continued (1A'-5-4)

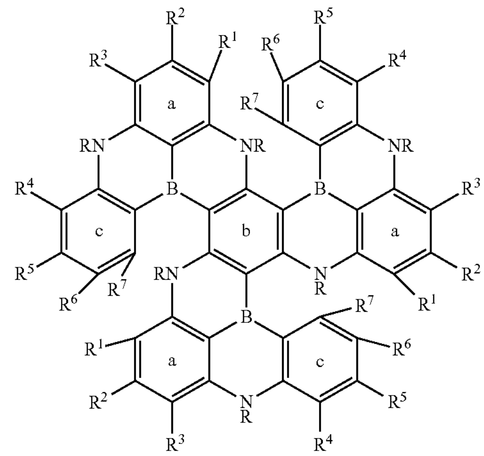

(1A'-6)

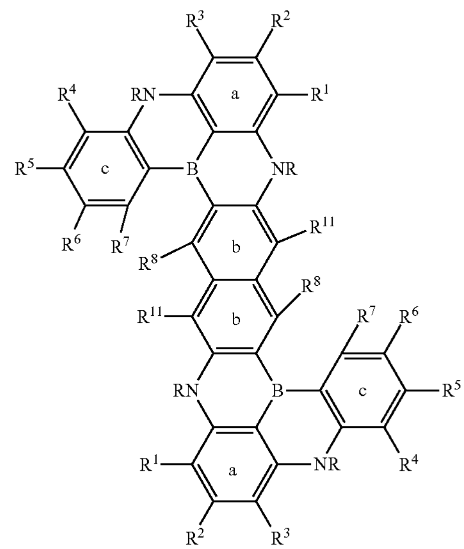

The multimer compound may be a multimer in which a multimer form represented by formula (1A'-4), (1A'-4-1), or (1A'-4-2) and a multimer form represented by any one of formulas (1A'-5-1) to (1A'-5-4) or (1A'-6) are combined, may be a multimer in which a multimer form represented by any one of formulas (1A'-5-1) to (1A'-5-4) and a multimer form represented by formula (1A') are combined, or may be a multimer in which a multimer form represented by formula (1A'), (1A'-4-1), or (1A'-4-2), a multimer form represented by any one of formulas (1A'-5-1) to (1A'-5-4), and a multimer form represented by formula (1A'-6) are combined.

Furthermore, all or some of the hydrogen atoms in the chemical structures of the polycyclic aromatic compound represented by general formula (1A) or (1A') and a multimer thereof may be deuterium atoms.

Furthermore, all or some of the hydrogen atoms in the chemical structures of the polycyclic aromatic compound represented by general formula (1A) or (1A') and a multimer thereof may be cyanos or halogen atoms. For example, in formula (1A), a hydrogen atom in ring A, ring B, ring C (rings A to C are each an aryl ring or a heteroaryl ring), substituents on the rings A to C, and R (=alkyl or aryl) in >N—R can be substituted by cyano or a halogen atom.

Among these, a form in which all or some of the hydrogen atoms in the aryl or heteroaryl are substituted by cyanos or halogen atoms can be cited. The halogen is fluorine, chlorine, bromine, or iodine, preferably fluorine, chlorine, or bromine, and more preferably chlorine.

More specific examples of the polycyclic aromatic compound represented by general formula (1A) and a multimer thereof include compounds represented by the following structural formulas.

(1A-401)

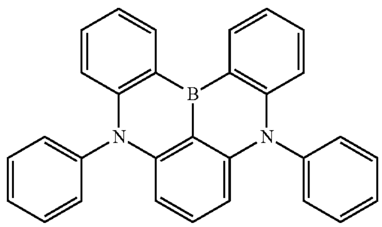

(1A-402)

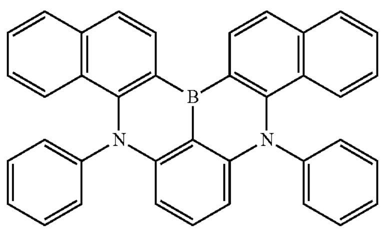

(1A-403)

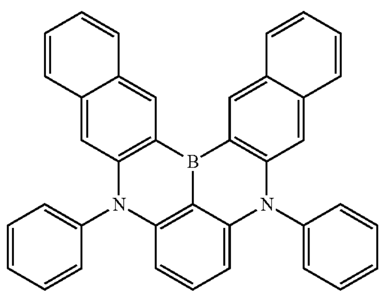

(1A-404)

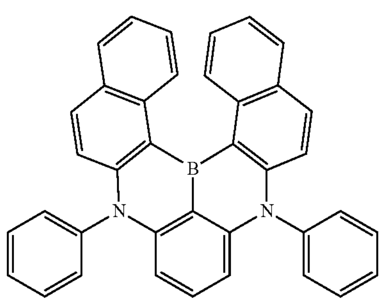

(1A-405)

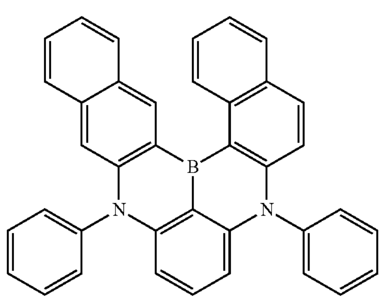

-continued (1A-406)

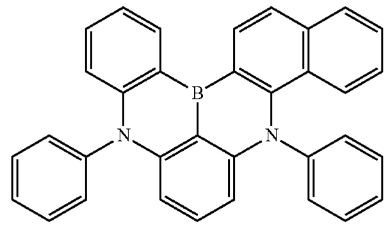

(1A-407)

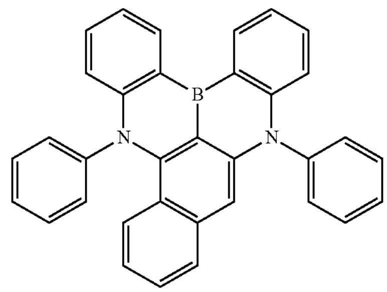

(1A-408)

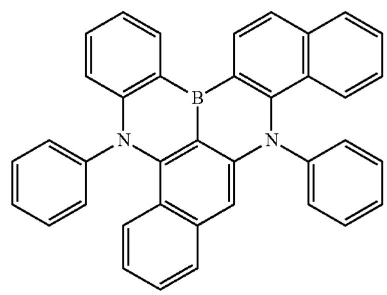

(1A-409)

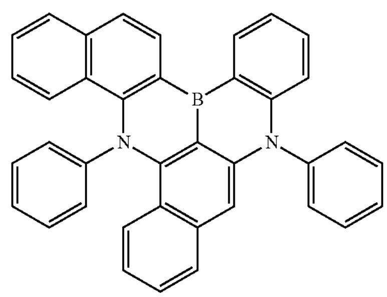

(1A-411)

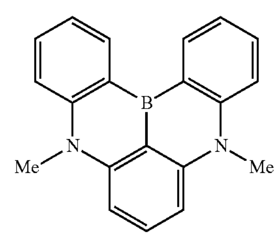

(1A-412)

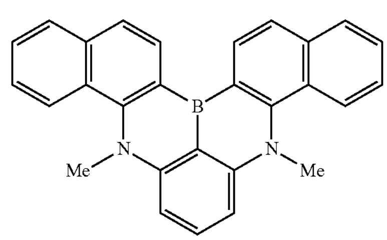

(1A-413)
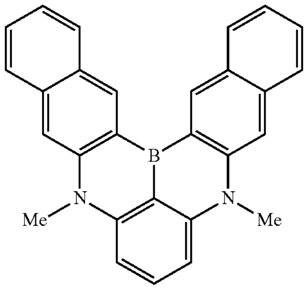
(1A-414)
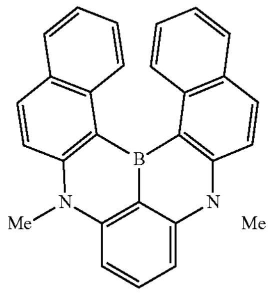
(1A-415)
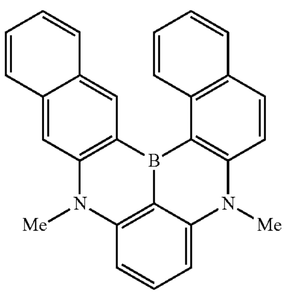
(1A-416)
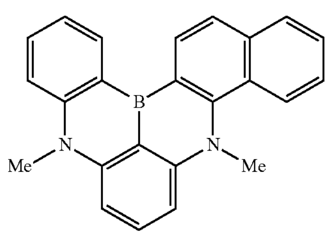
(1A-417)
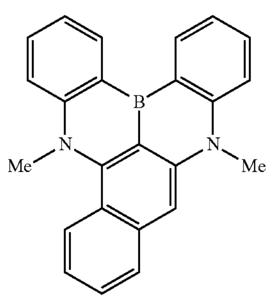
(1A-418)
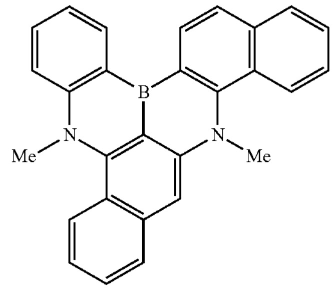
(1A-419)
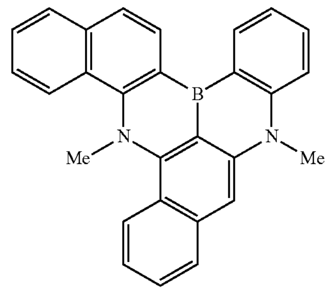
(1A-421)
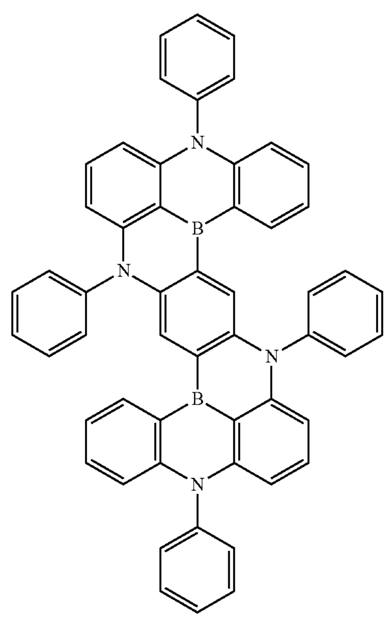

-continued
(1A-422)
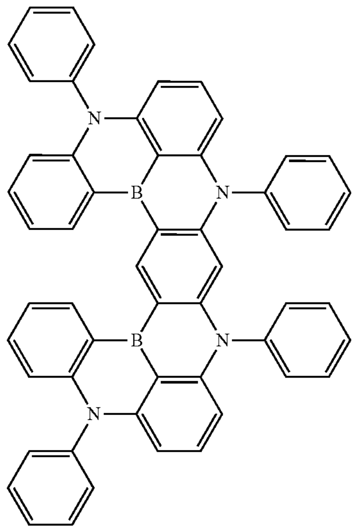
(1A-423)
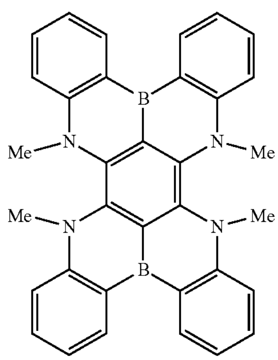
(1A-424)
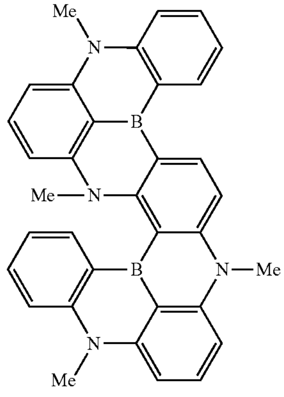
-continued
(1A-425)
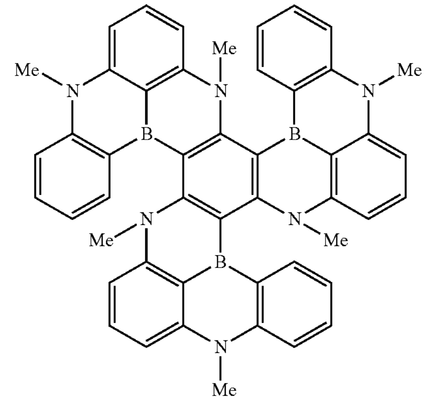
(1A-431)
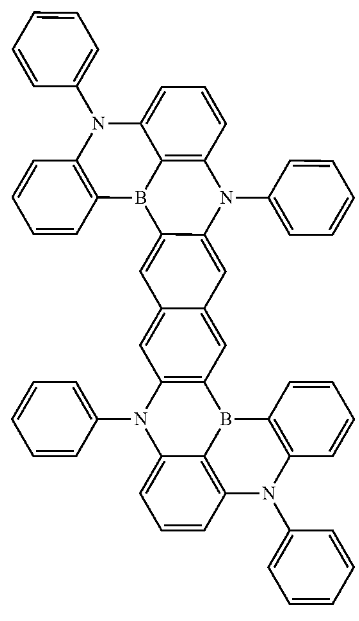
(1A-432)
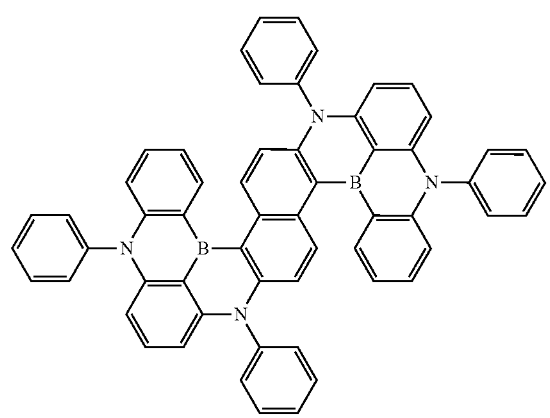

-continued
(1A-433)
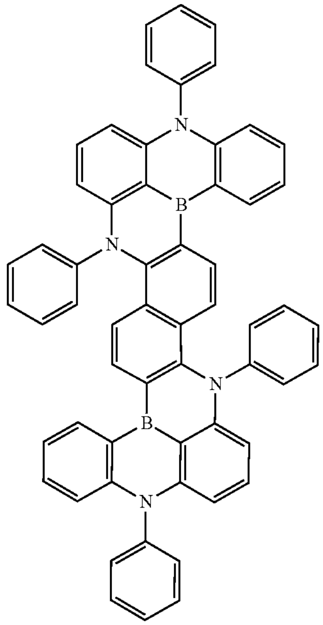
(1A-434)
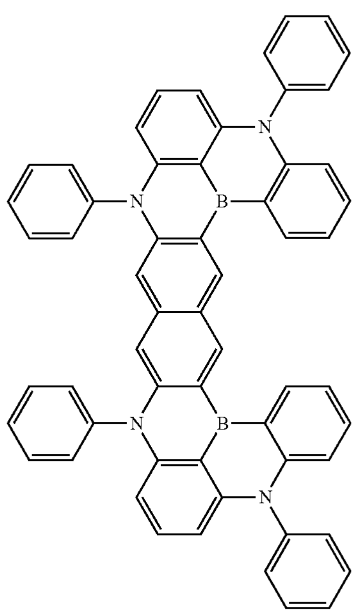
-continued
(1A-435)
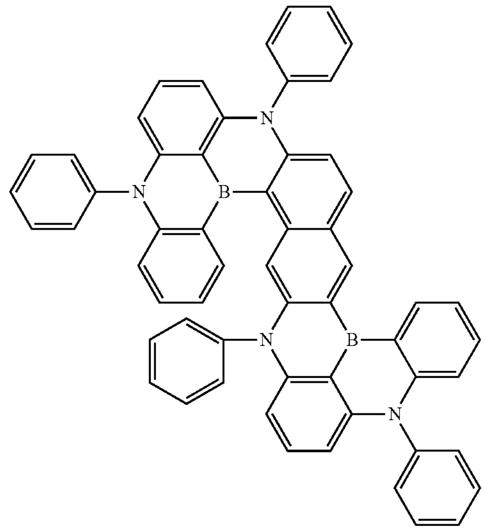
(1A-441)
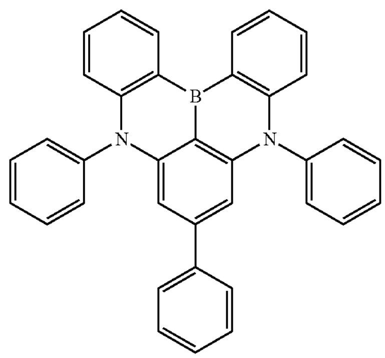
(1A-442)
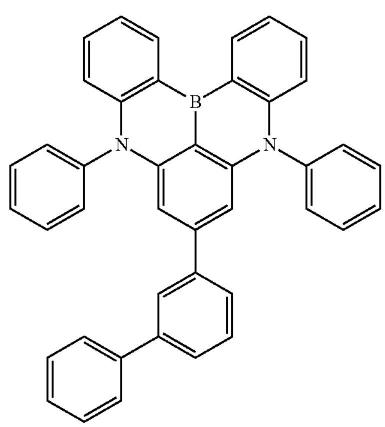

(1A-443)
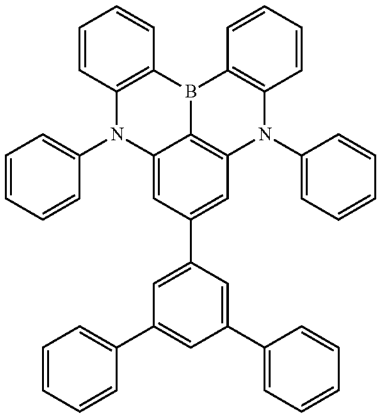
(1A-444)
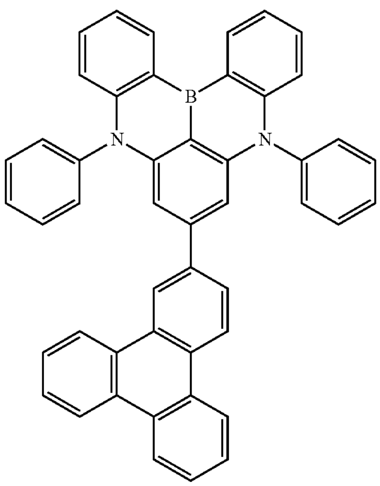
(1A-445)
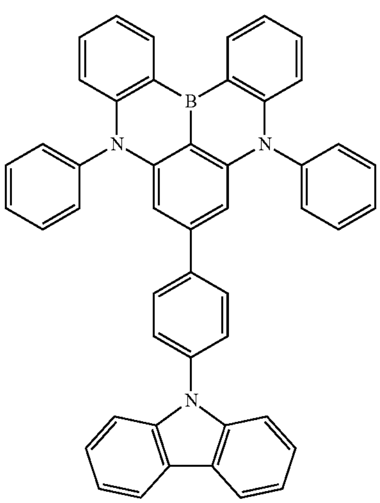
(1A-446)
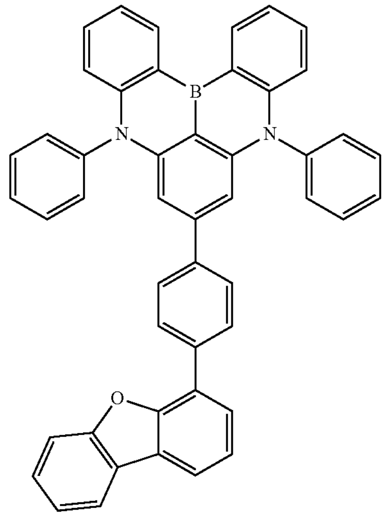
(1A-447)
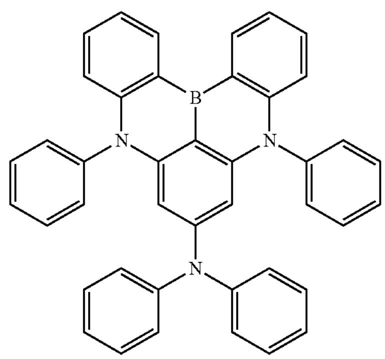
(1A-451)
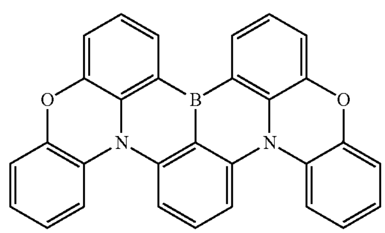
(1A-452)
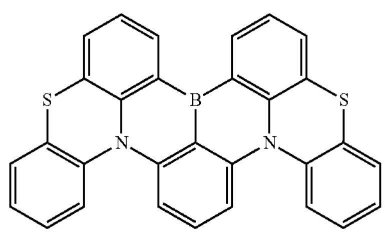
(1A-453)
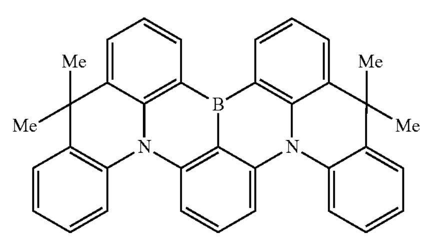

-continued
(1A-454)
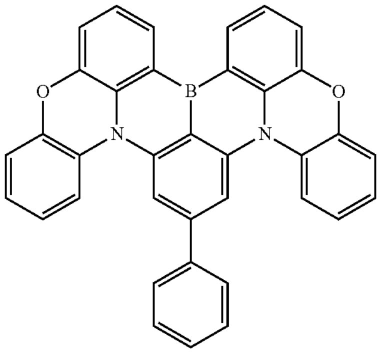
(1A-455)
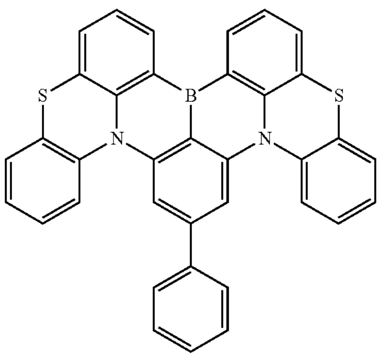
(1A-456)
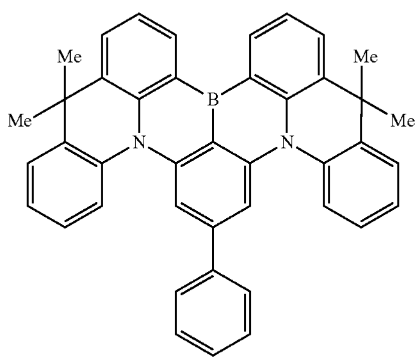
(1-A457)
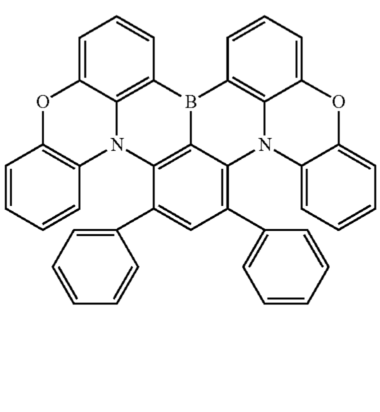
-continued
(1-A458)
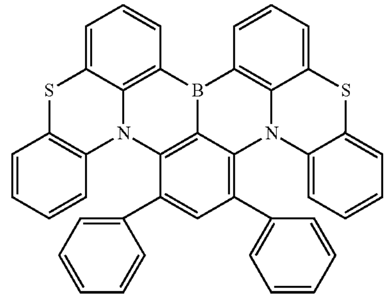
(1-A459)
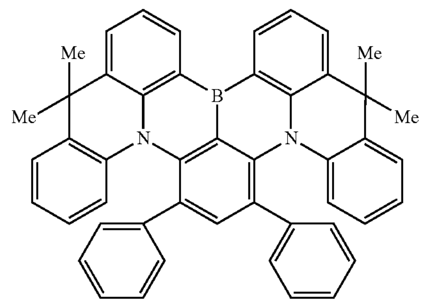
(1A-460)
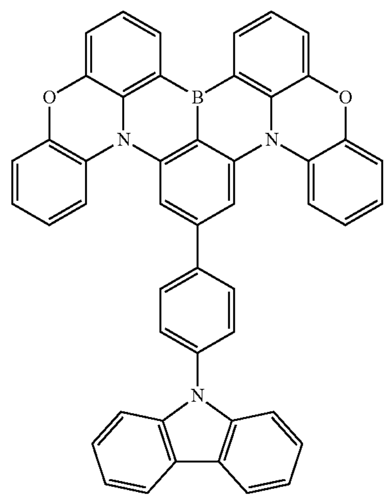
(1A-461)
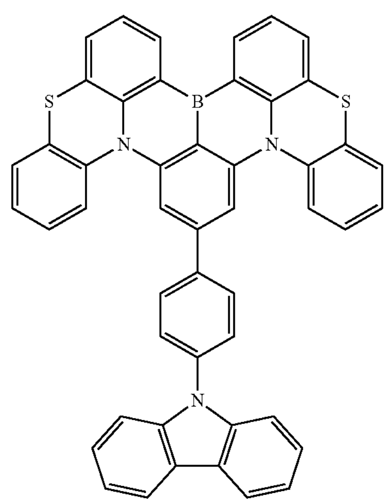

-continued
(1A-462)
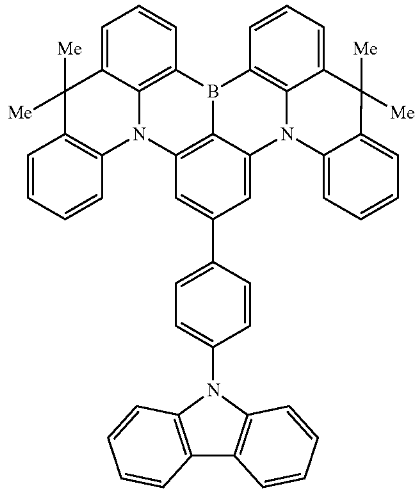
(1A-1401)
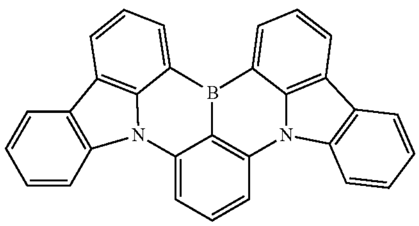
(1A-1402)
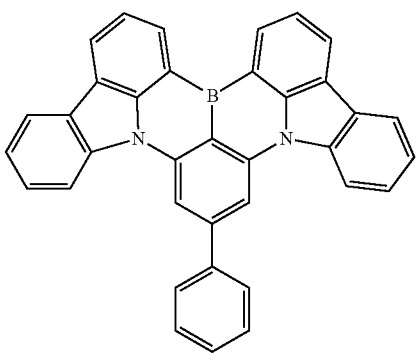
(1A-1403)
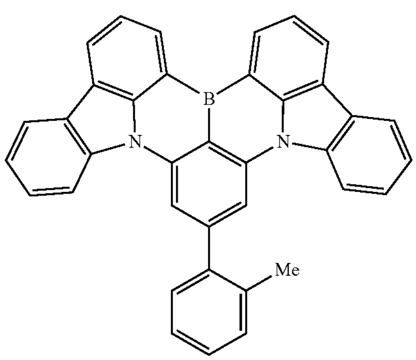
-continued
(1A-1404)
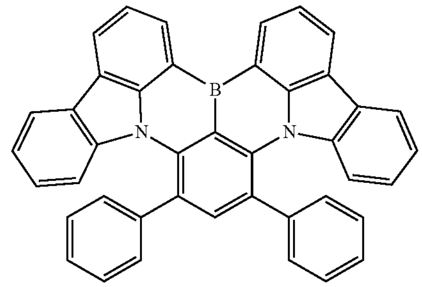
(1A-1405)
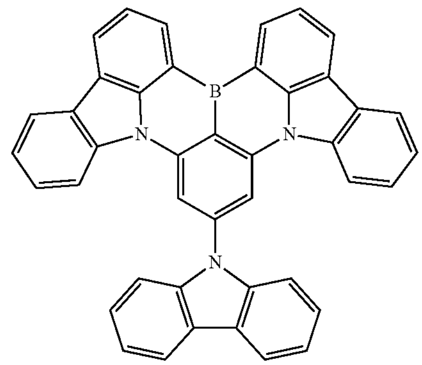
(1A-1406)
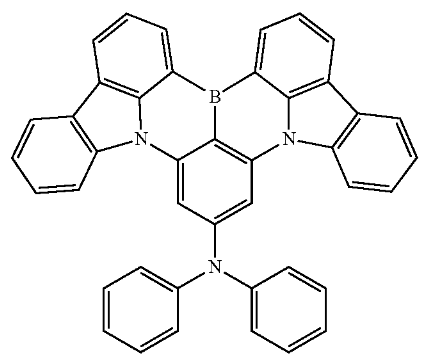
(1A-1407)
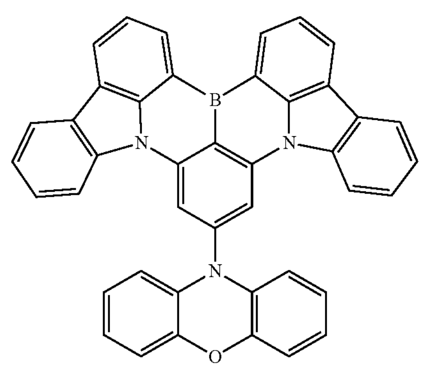

-continued
(1A-1408)
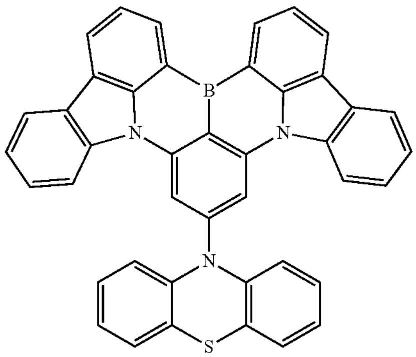
(1A-1409)
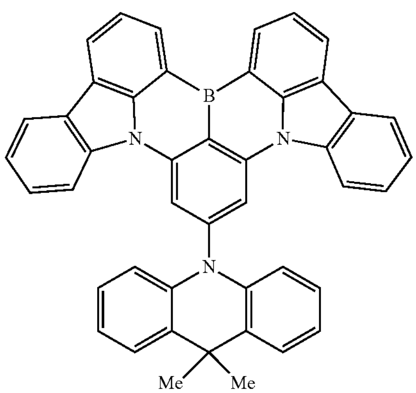
(1A-1410)
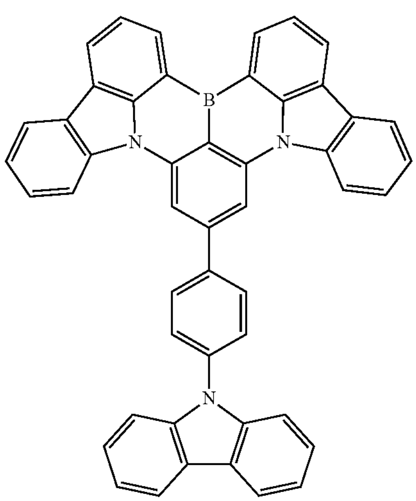
-continued
(1A-1411)
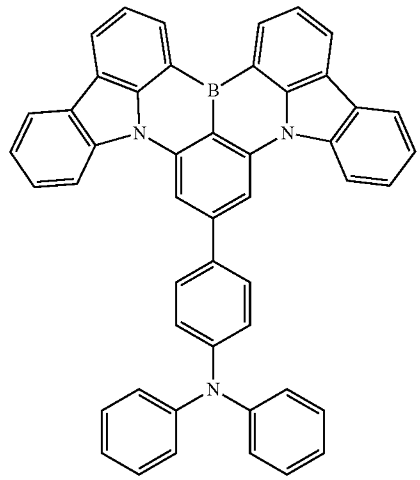
(1A-1412)
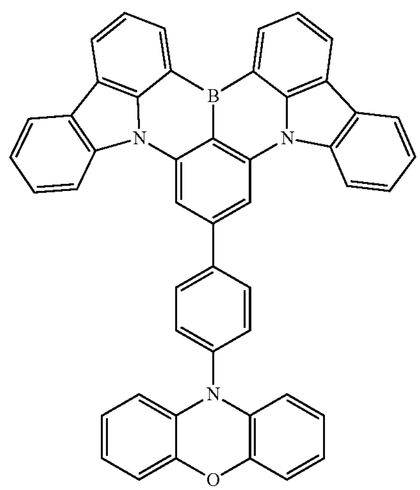
(1A-1413)
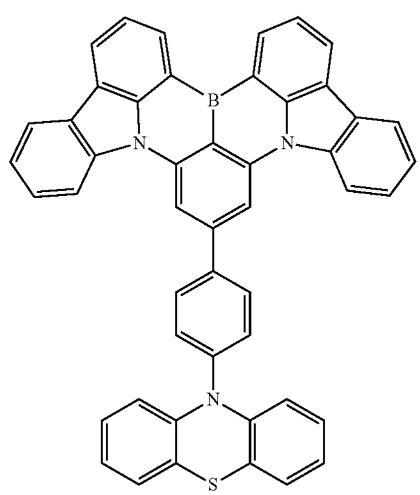

-continued
(1A-1414)
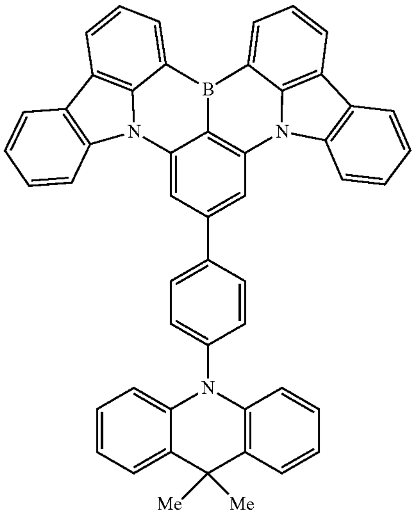
(1A-1421)
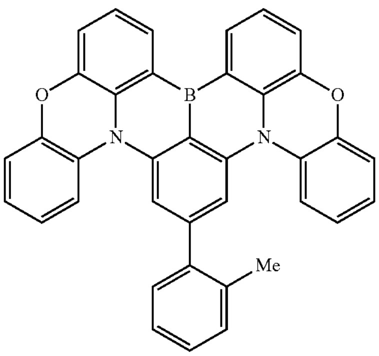
(1A-1422)
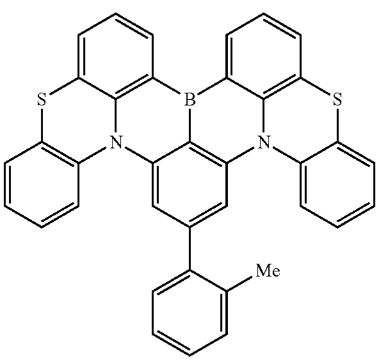
(1A-1423)
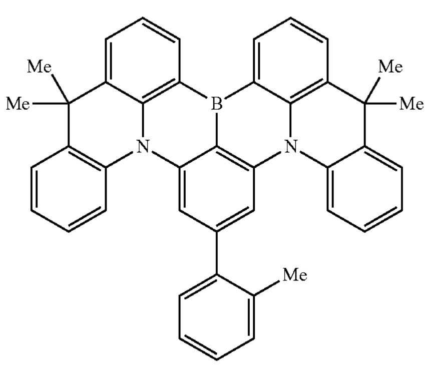
-continued
(1A-1424)
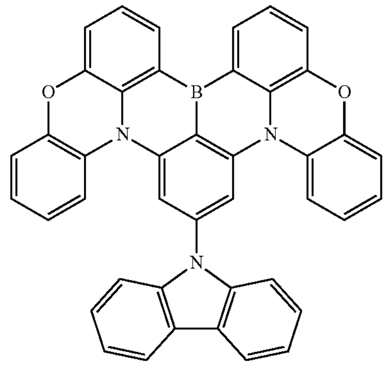
(1A-1425)
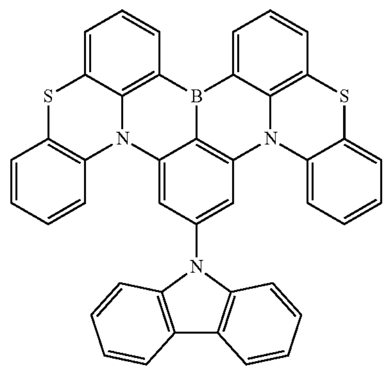
(1A-1426)
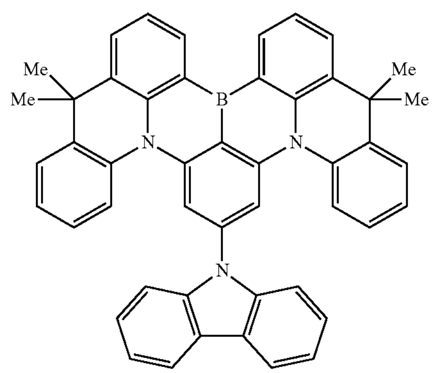
(1A-1427)
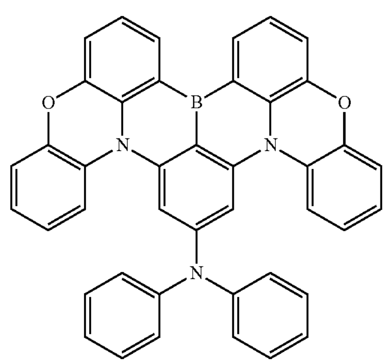

-continued
(1A-1428)
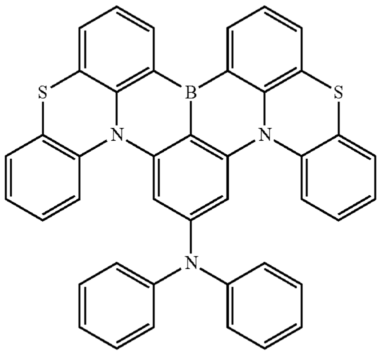
(1A-1429)
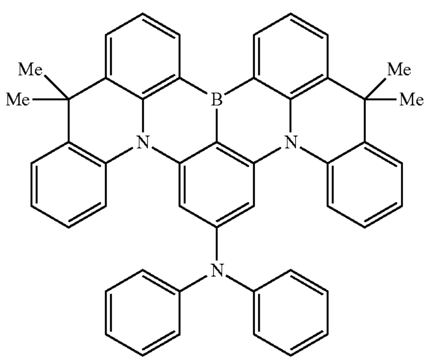
(1A-1430)
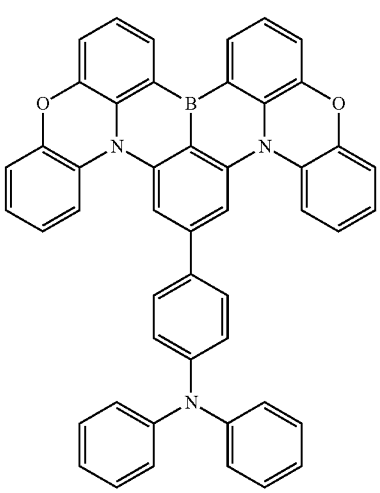
-continued
(1A-1431)
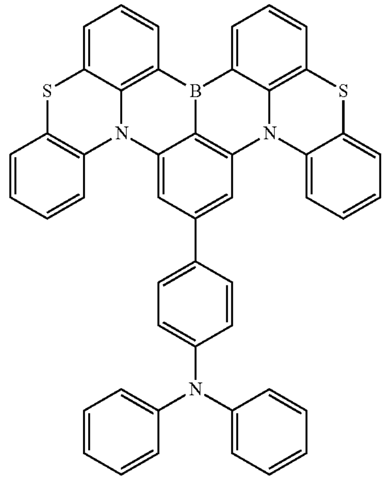
(1A-1432)
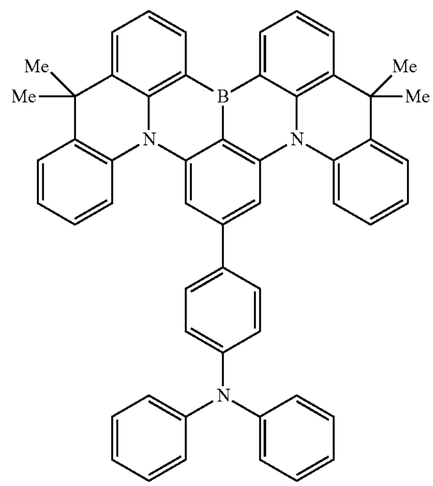
(1A-1433)
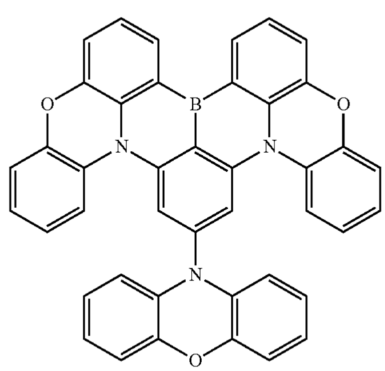

-continued
(1A-1434)
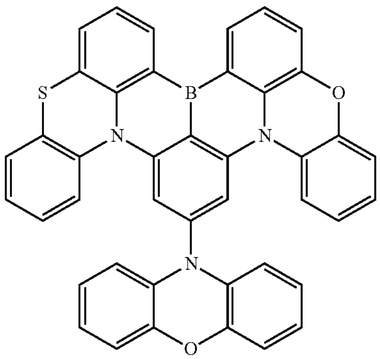
(1A-1435)
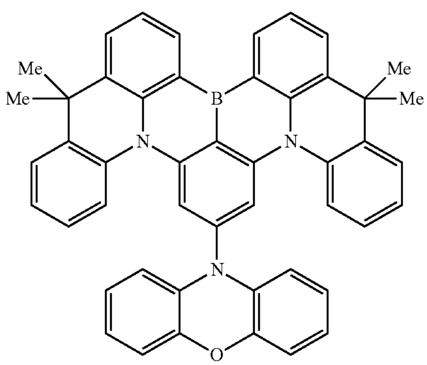
(1A-1436)
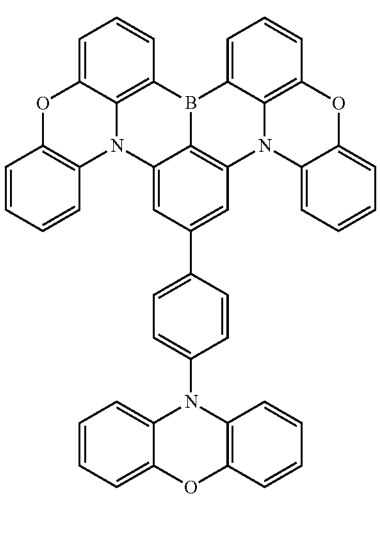
-continued
(1A-1437)
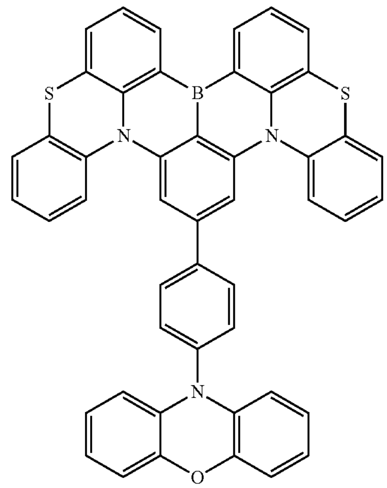
(1A-1438)
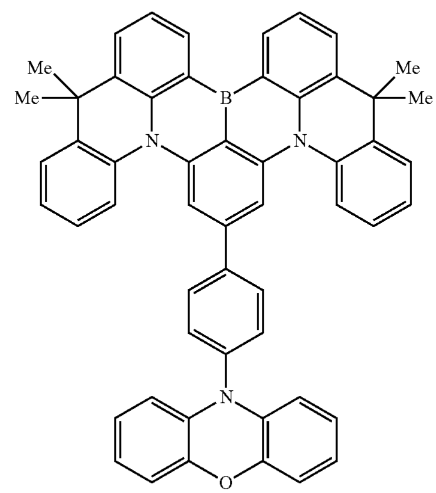
(1A-1439)
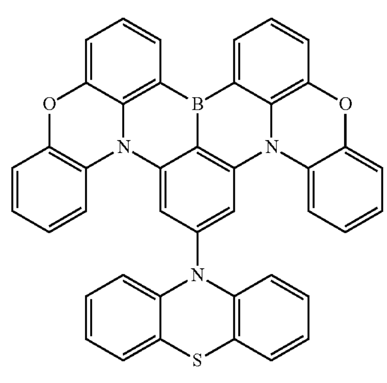

(1A-1450)
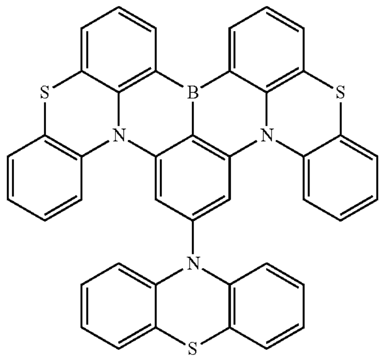
(1A-1451)
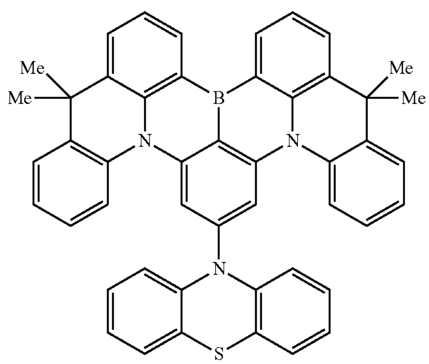
(1A-1452)
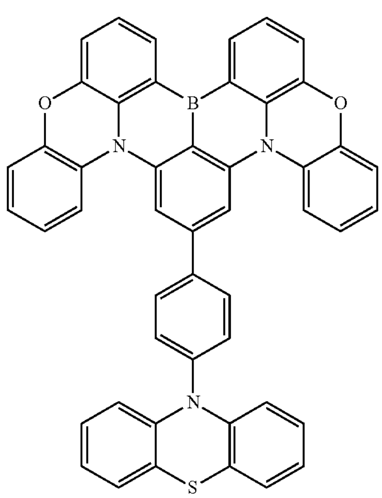
(1A-1453)
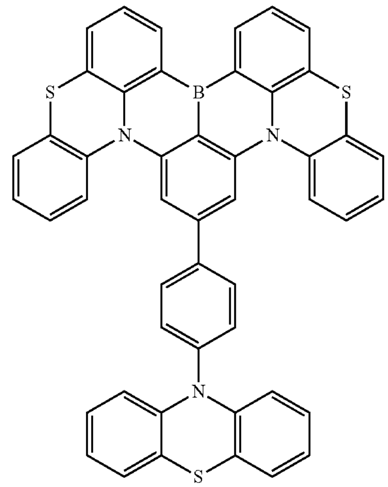
(1A-1454)
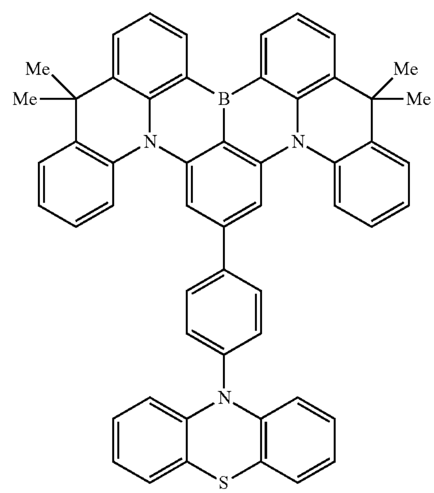
(1A-1455)
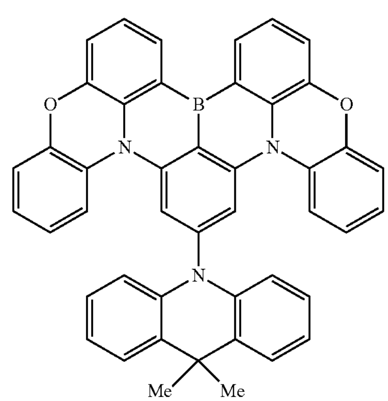

-continued
(1A-1456)
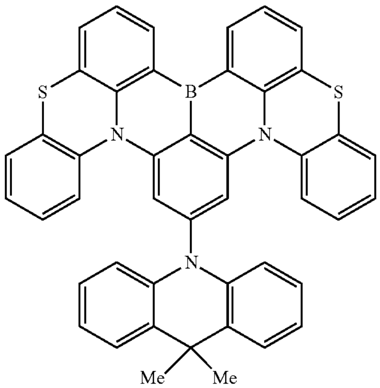
(1A-1457)
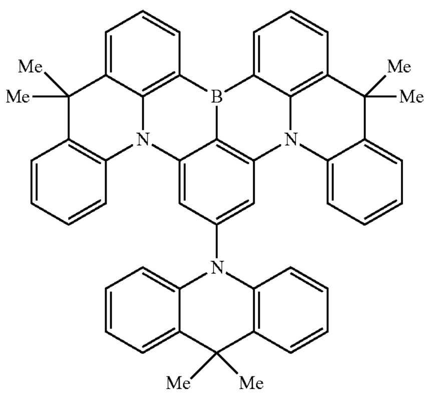
(1A-1458)
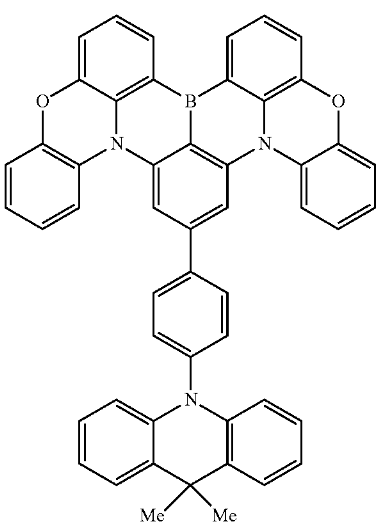
-continued
(1A-1459)
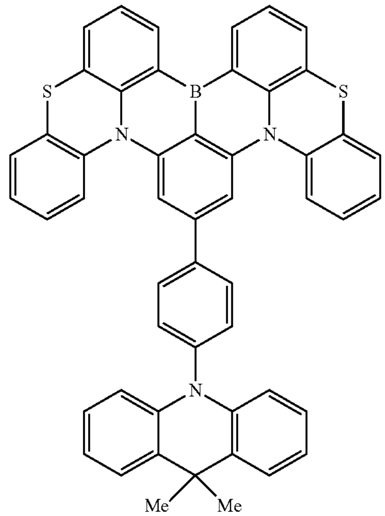
(1A-1460)
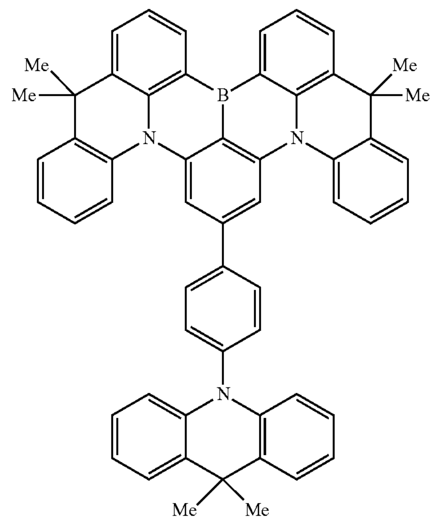
(1A-471)
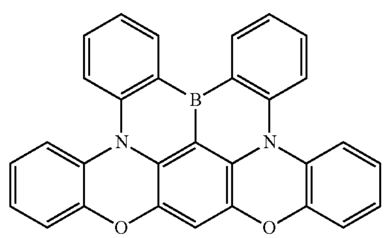
(1A-472)
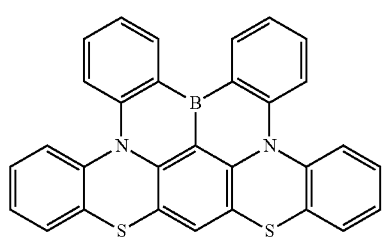

-continued
(1A-473)
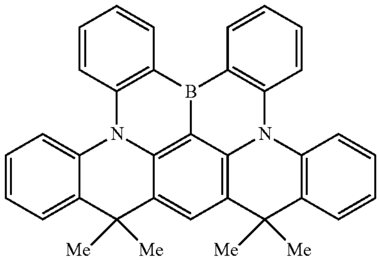
(1A-474)
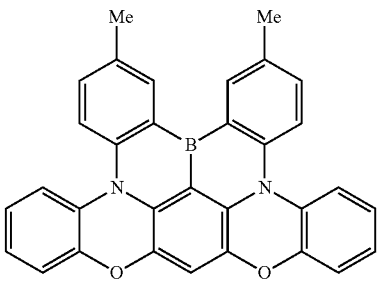
(1A-475)
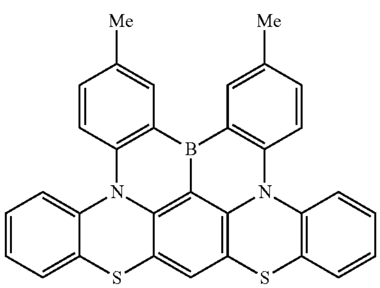
(1A-476)
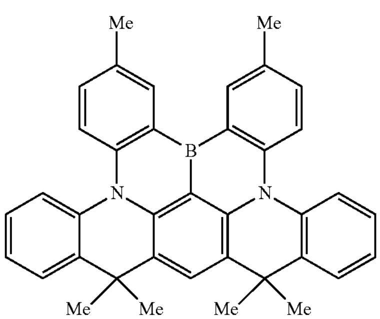
(1A-477)
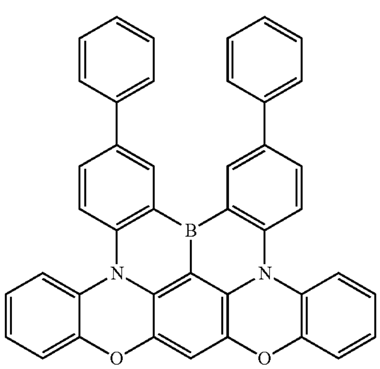
-continued
(1A-478)
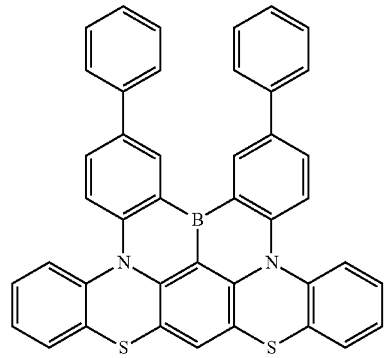
(1A-479)
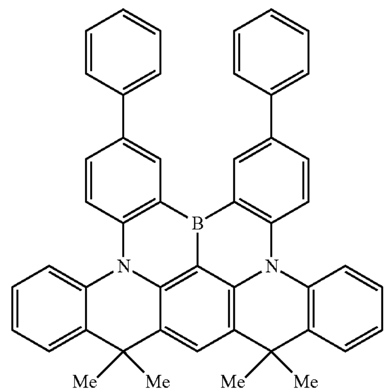
(1A-1151)
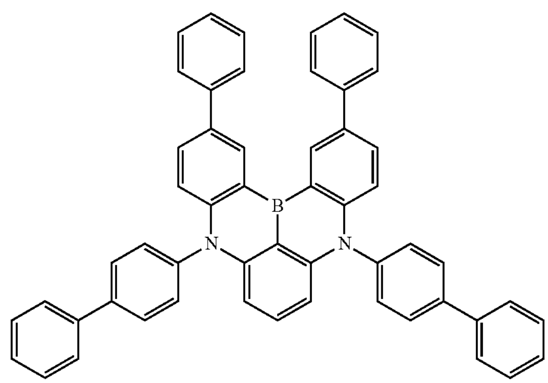
(1A-1152)
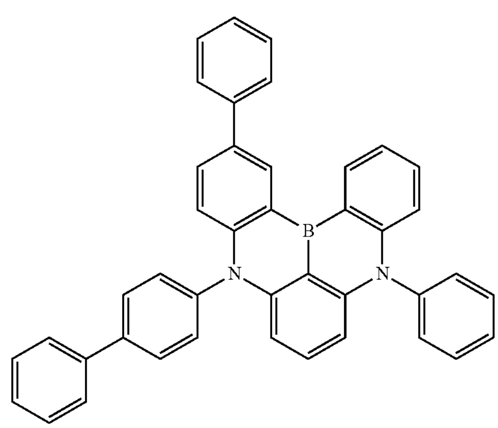

-continued
(1A-1153)
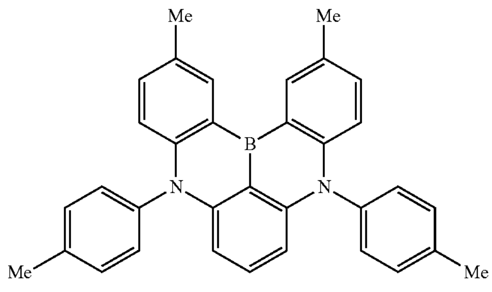
(1A-1154)
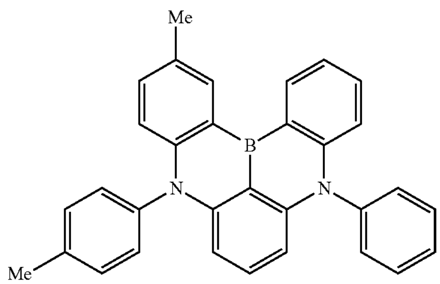
(1A-1155)
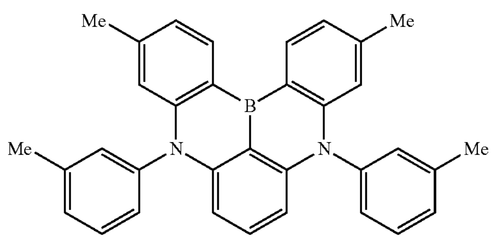
(1A-1156)
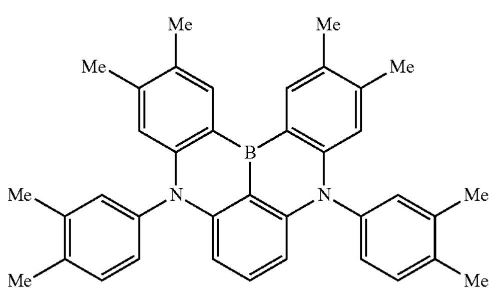
(1A-1157)
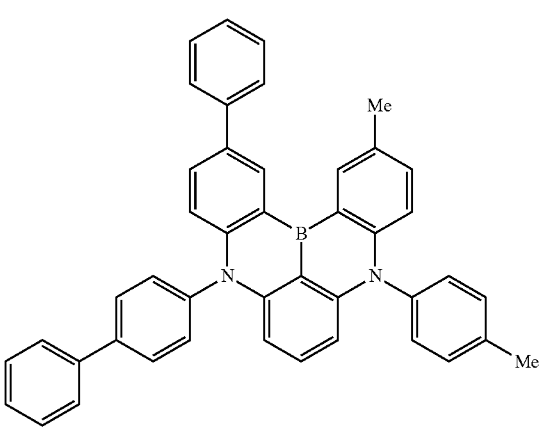
-continued
(1A-1158)
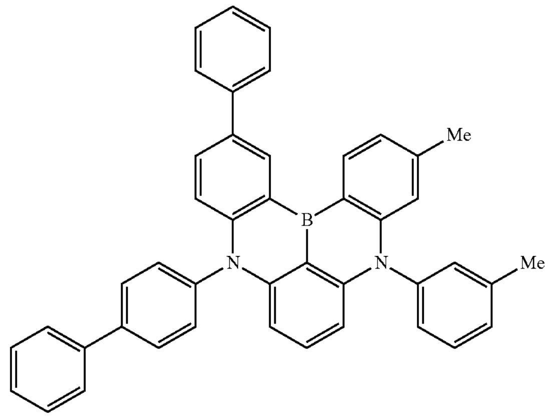
(1A-1159)
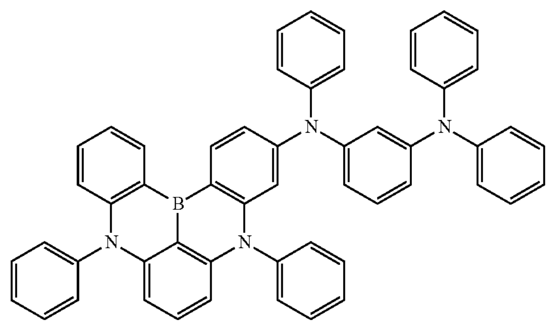
(1A-2619)
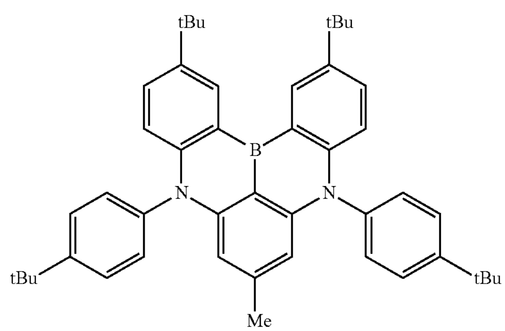
(1A-2620)
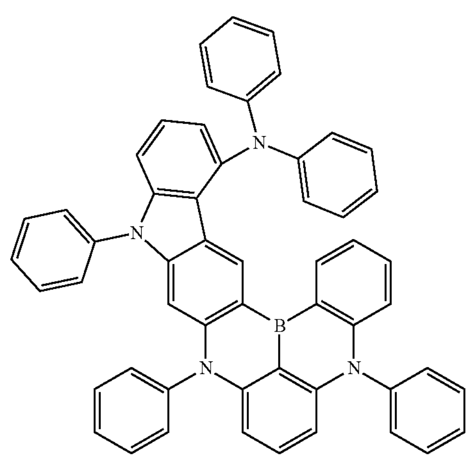

-continued
(1A-2621)
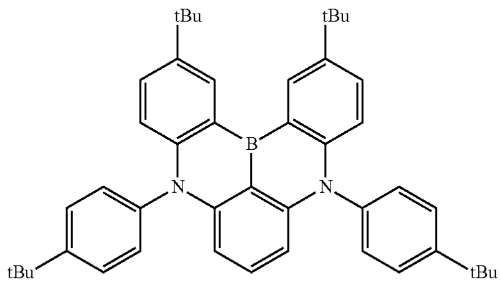
(1A-2622)
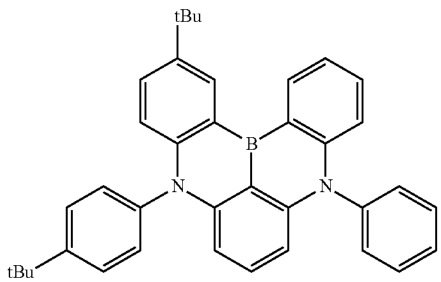
(1A-2623)
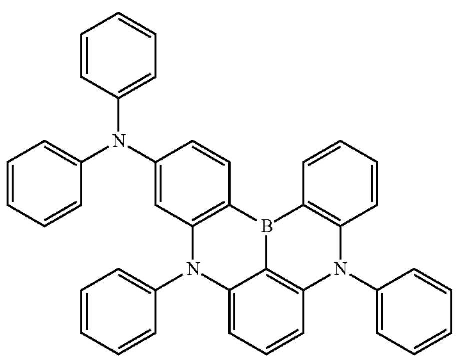
(1A-2624)
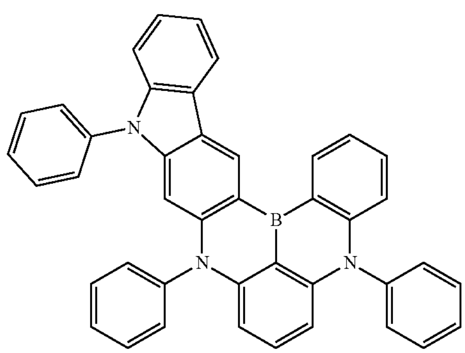
(1A-2625)
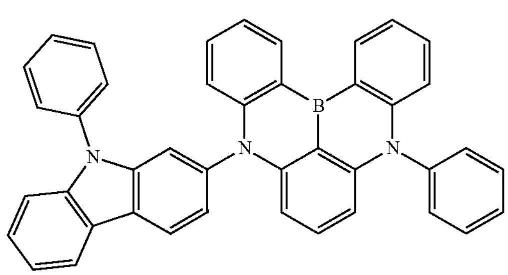
-continued
(1A-2626)
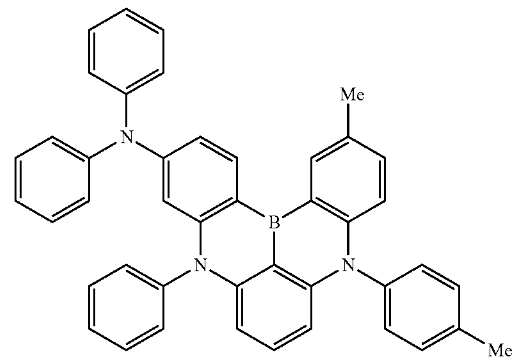
(1A-2627)
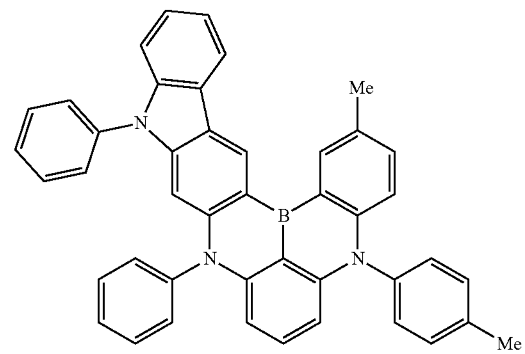
(1A-2628)
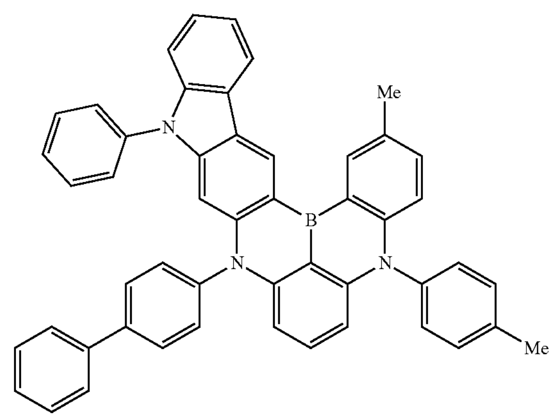
(1A-2629)
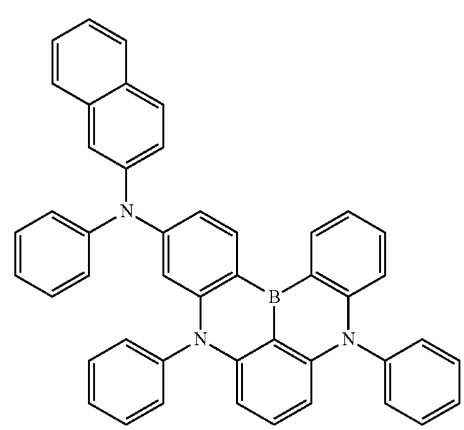

-continued
(1A-2630)
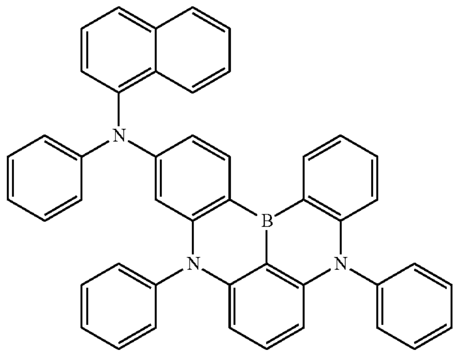
(1A-2631)
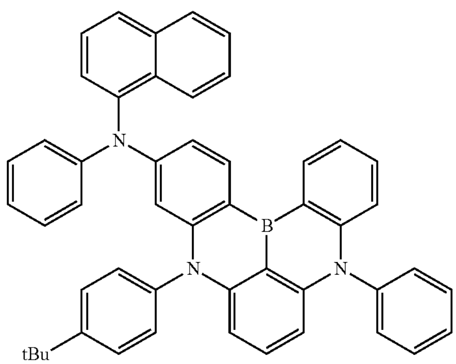
(1A-2632)
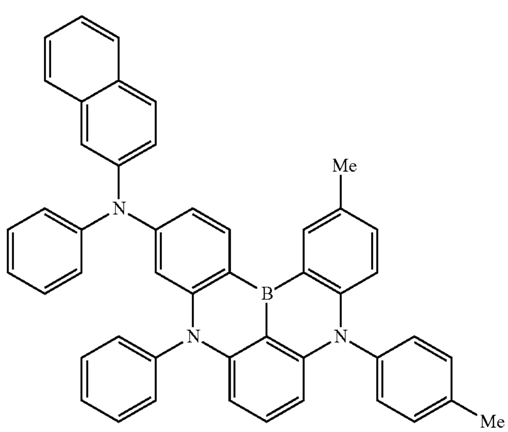
(1A-2633)
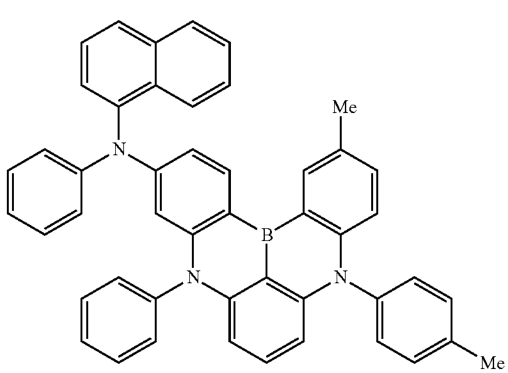
-continued
(1A-2634)
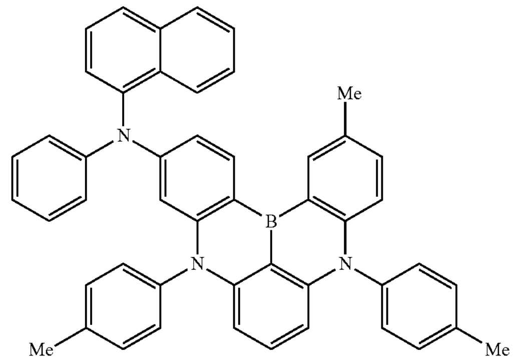
(1A-2635)
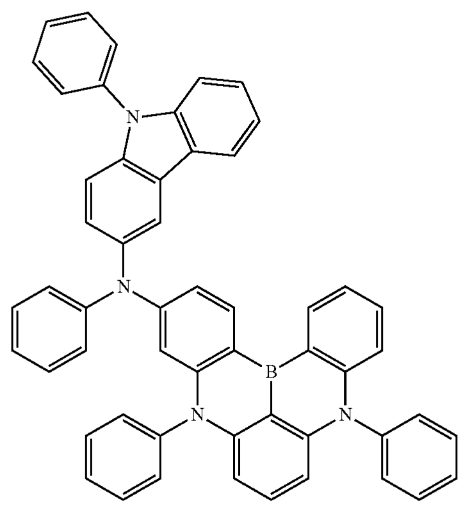
(1A-2636)
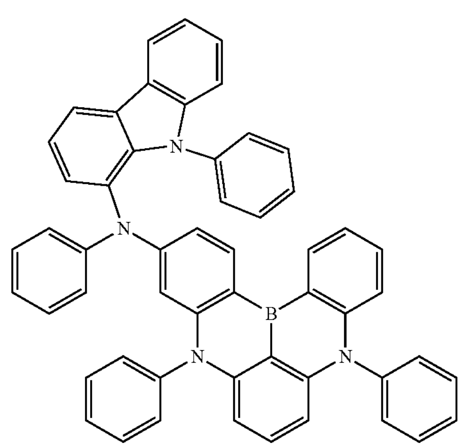

-continued
(1A-2637)
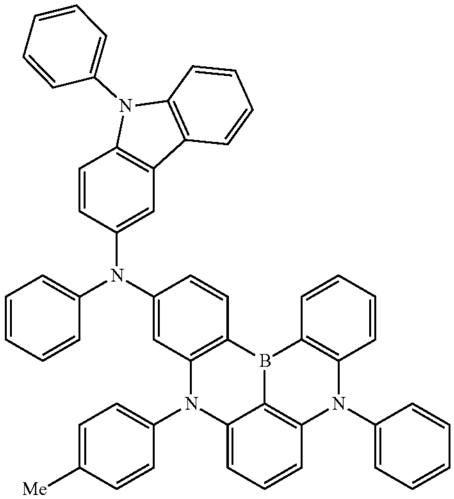
(1A-2638)
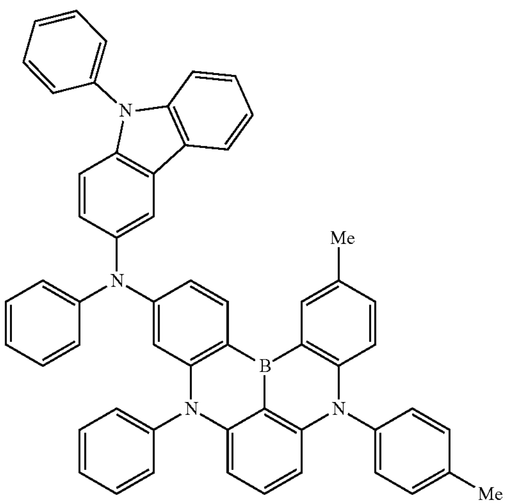
(1A-2639)
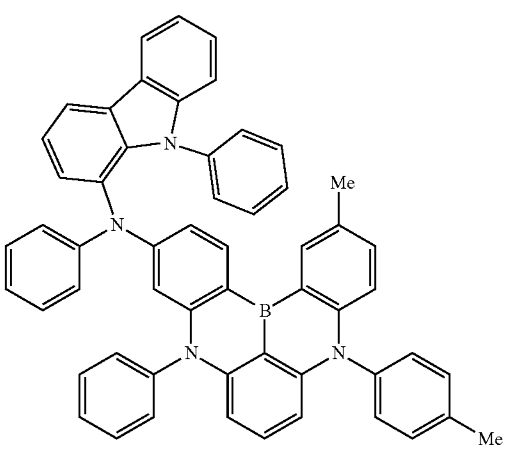
-continued
(1A-2640)
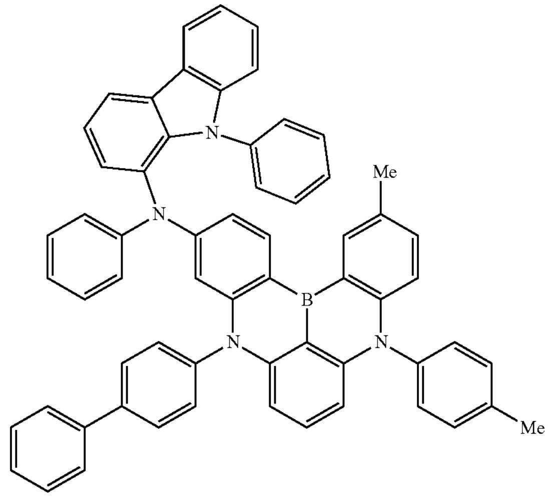
(1A-2641)
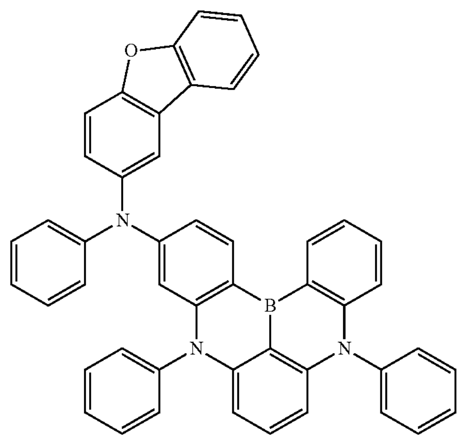
(1A-2642)
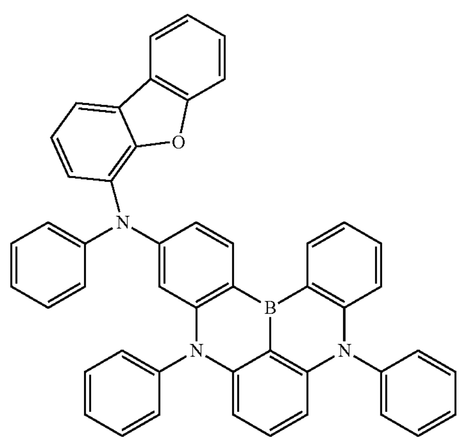

-continued
(1A-2643)
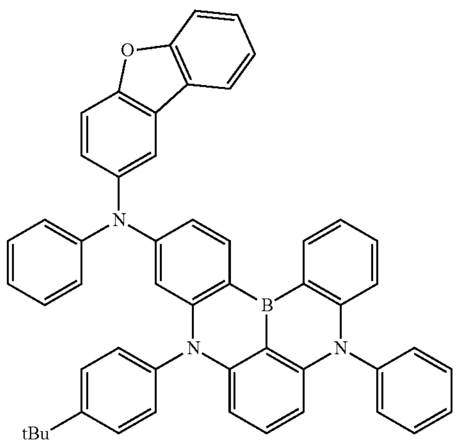
(1A-2644)
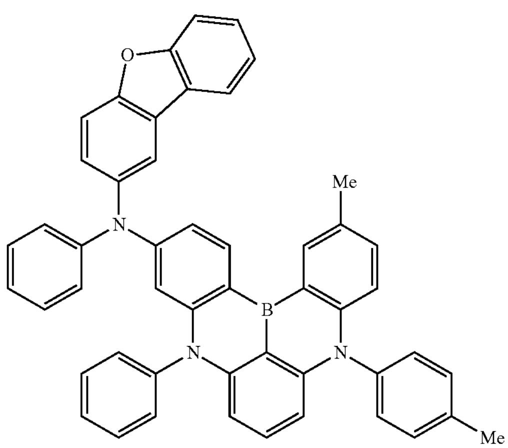
(1A-2645)
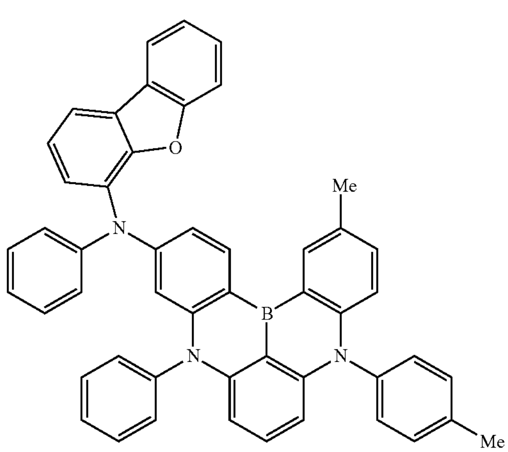
-continued
(1A-2646)
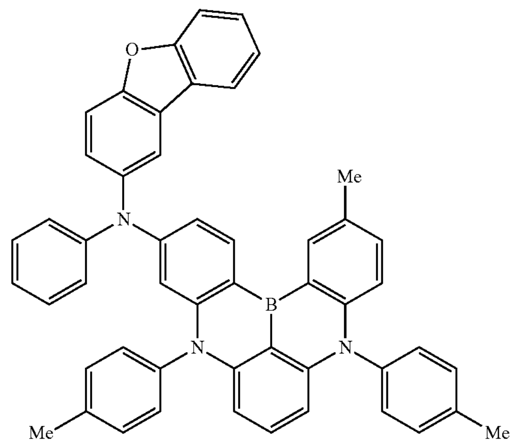
(1A-2647)
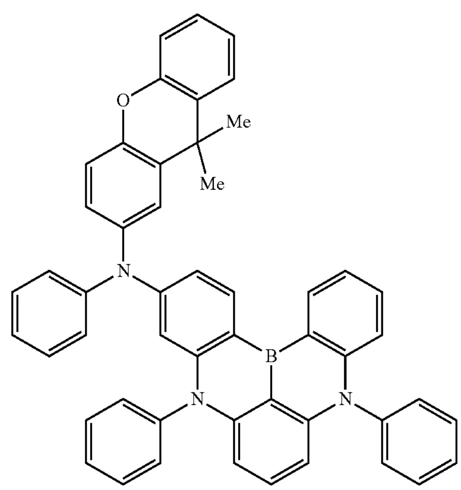
(1A-2648)
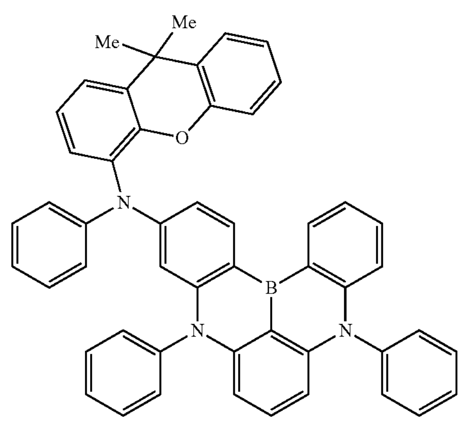

-continued
(1A-2649)
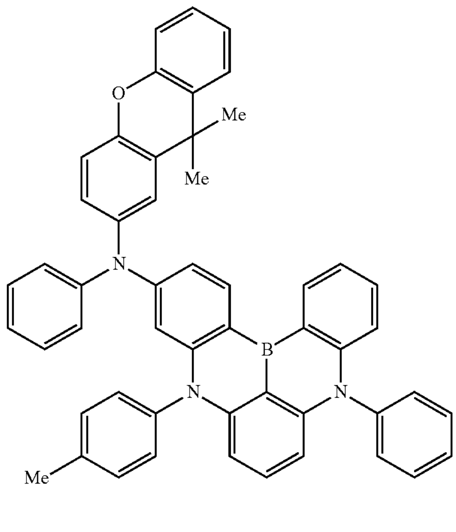
(1A-2650)
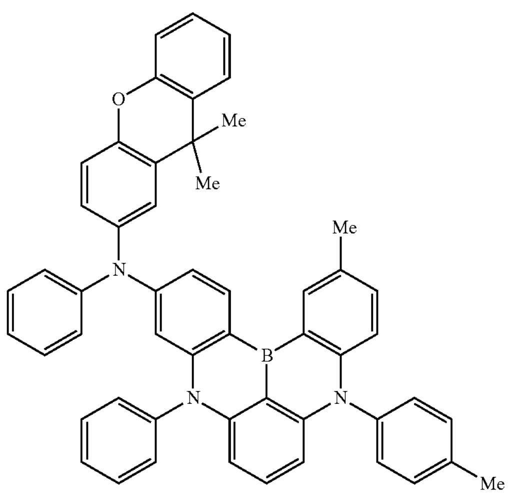
(1A-2651)
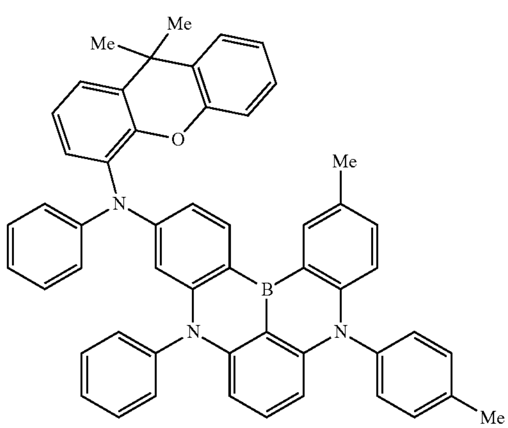
-continued
(1A-2652)
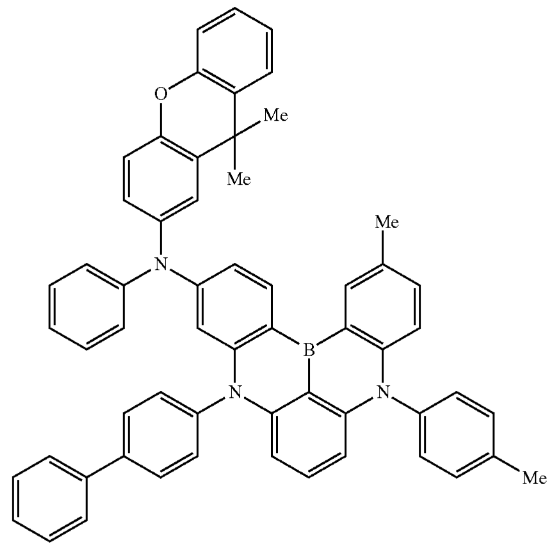
(1A-2653)
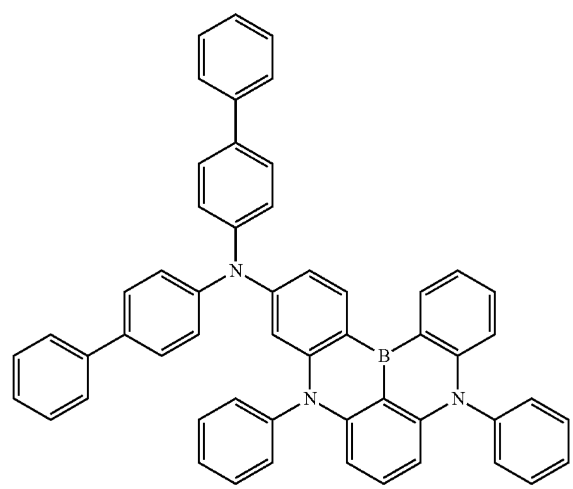
(1A-2654)
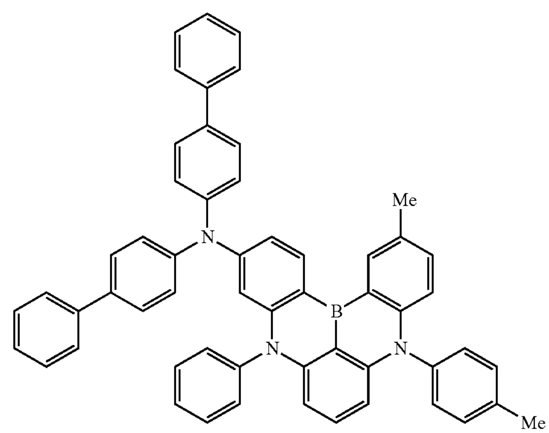

-continued
(1A-2655)
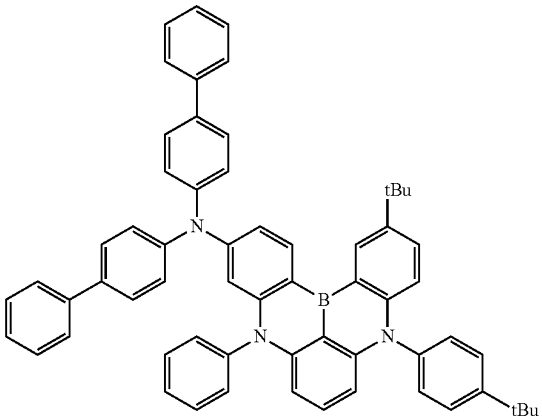
(1A-2656)
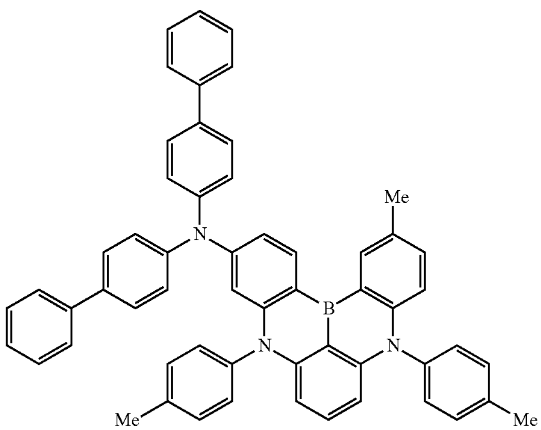
(1A-2657)
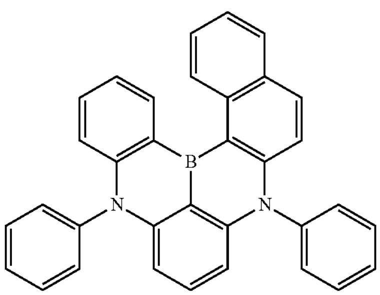
(1A-2658)
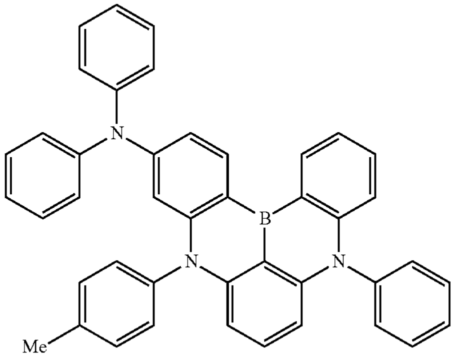
-continued
(1A-2659)
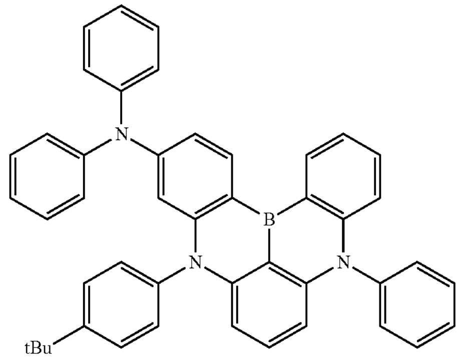
(1A-2660)
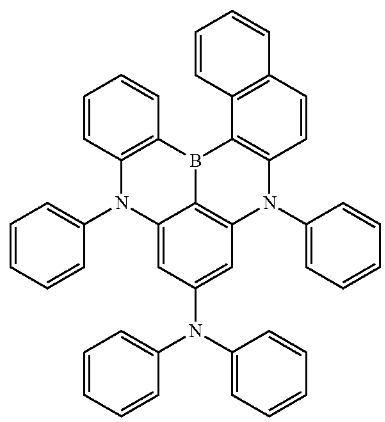
(1A-2661)
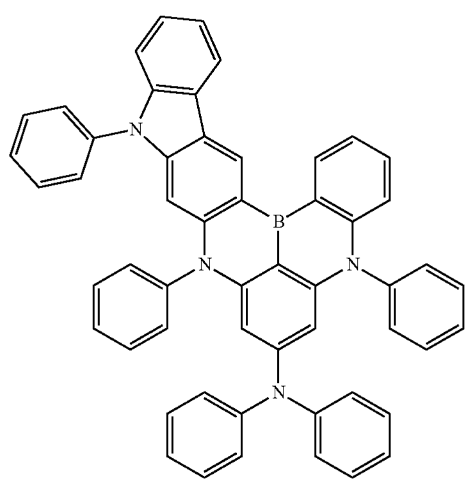

-continued
(1A-2662)
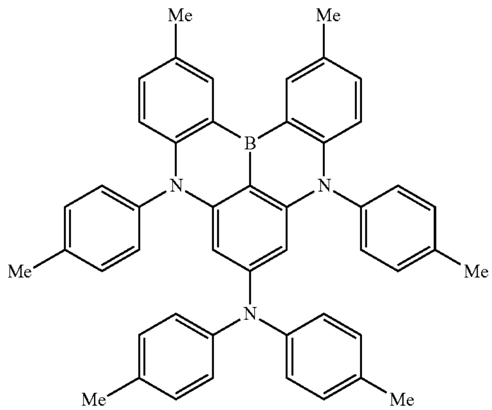
(1A-2663)
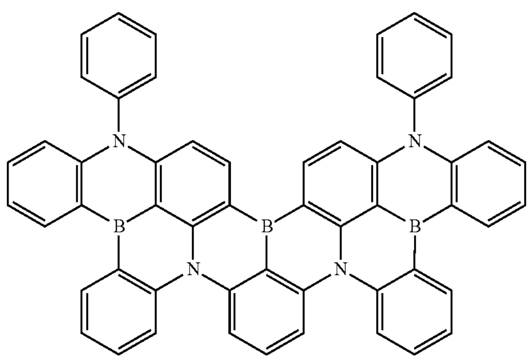
(1A-2664)
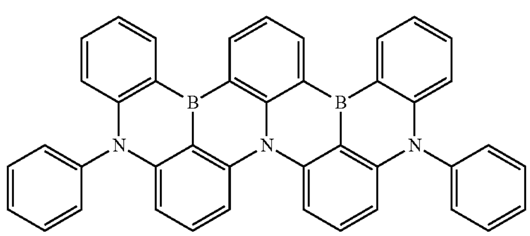
(1A-2665)
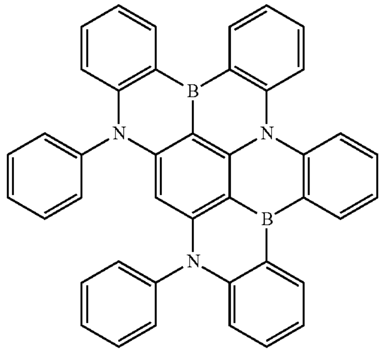
-continued
(1A-2666)
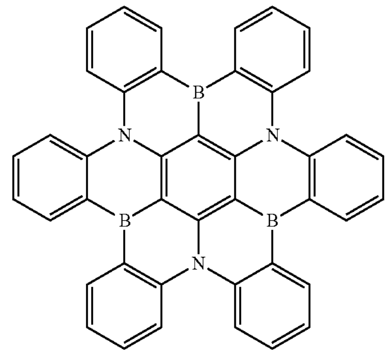
(1A-2667)
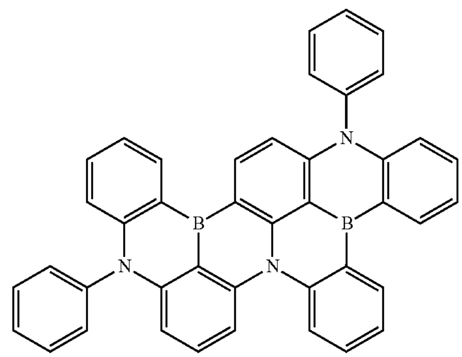
(1A-2668)
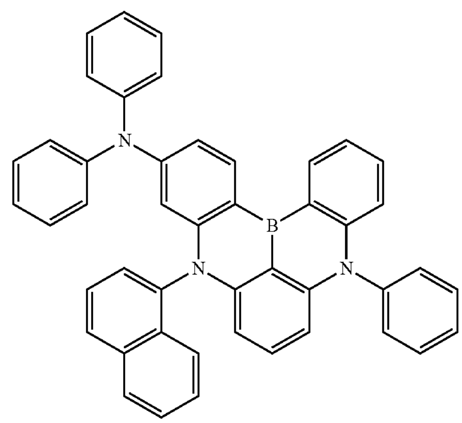
(1A-2669)
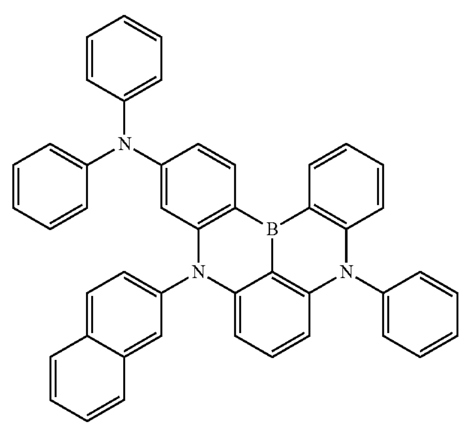

-continued
(1A-2670)
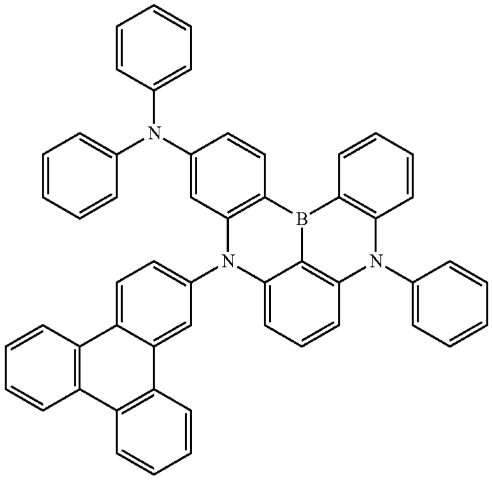
(1A-2671)
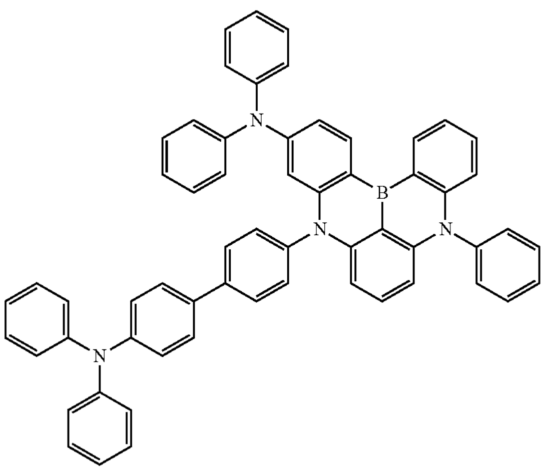
(1A-2672)
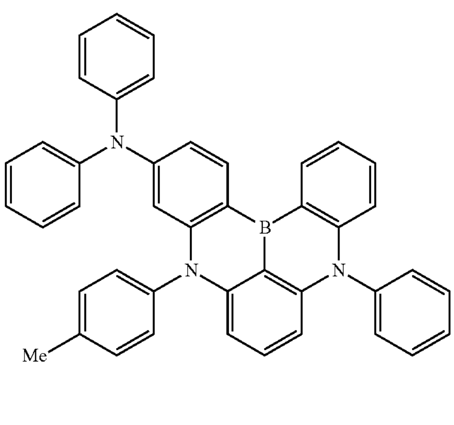
-continued
(1A-2673)
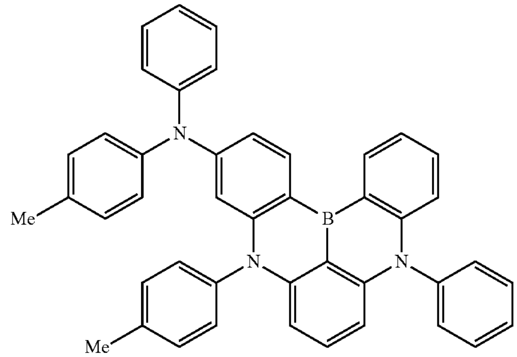
(1A-2674)
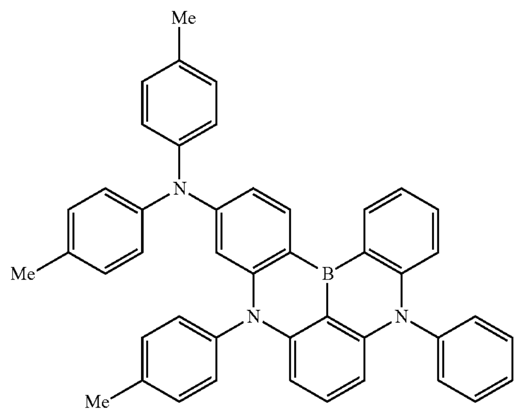
(1A-2675)
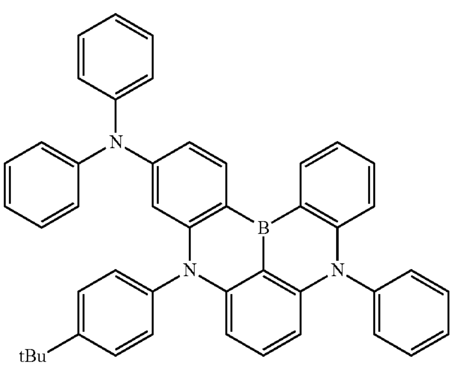
(1A-2676)
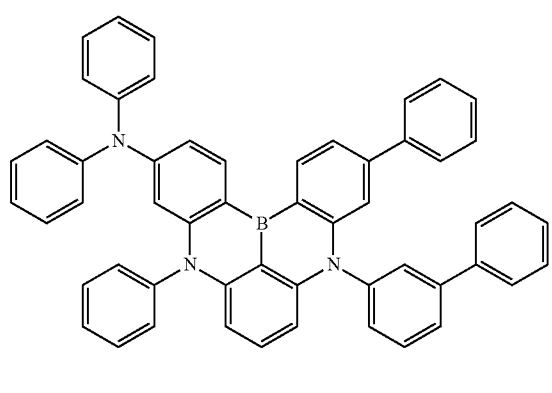

-continued
(1A-2677)
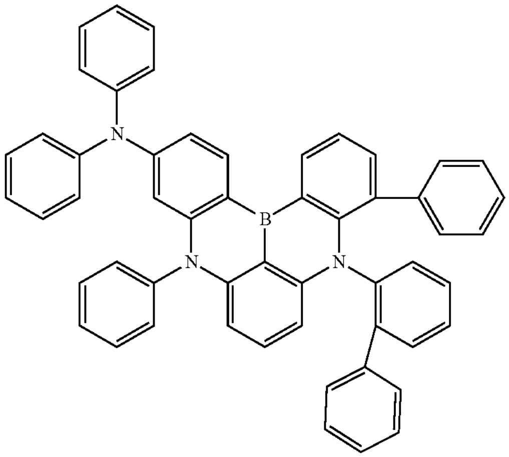
(1A-2678)
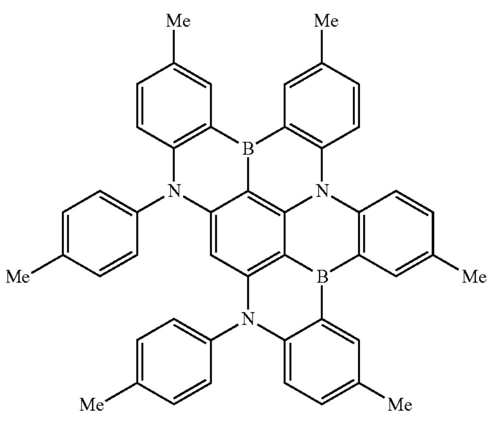
(1A-2679)
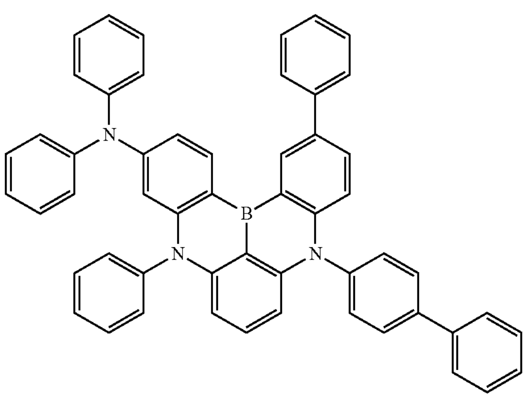
-continued
(1A-2680)
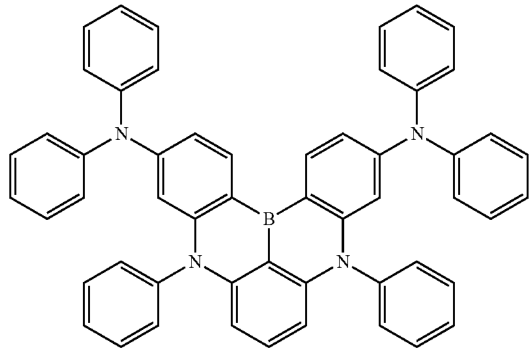
(1A-2681)
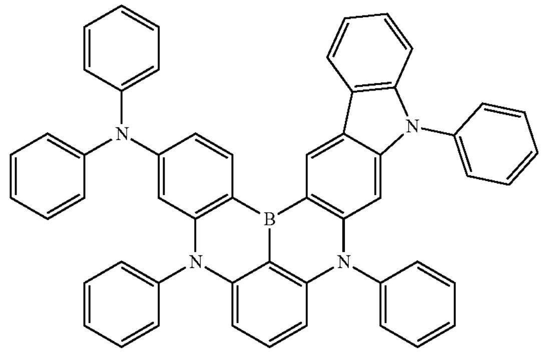
(1A-2682)
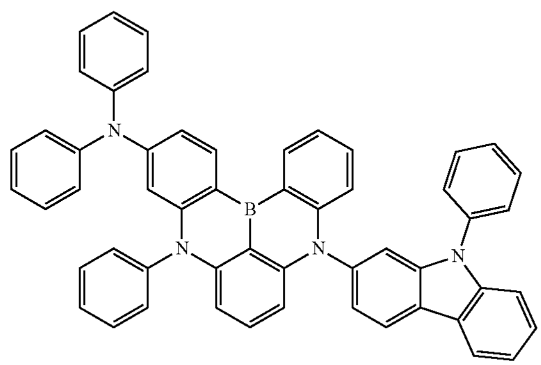
(1A-2683)
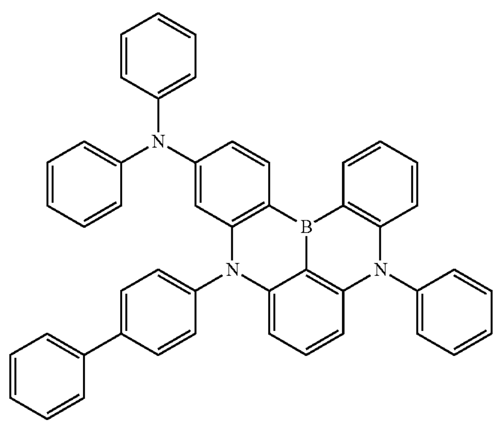

-continued
(1A-2684)
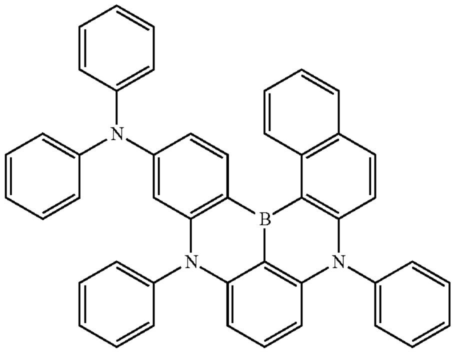
(1A-2685)
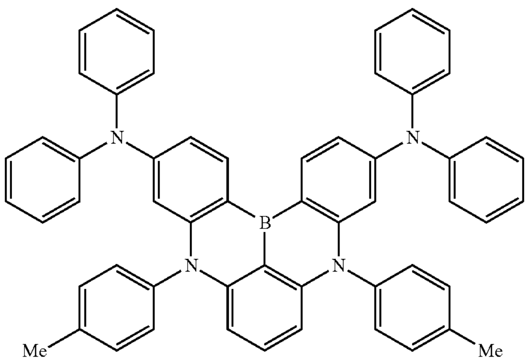
(1A-2686)
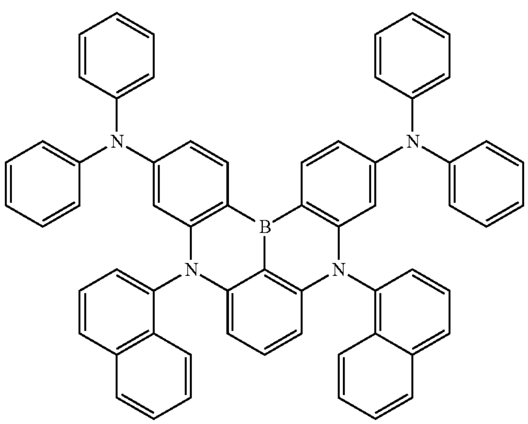
(1A-2687)
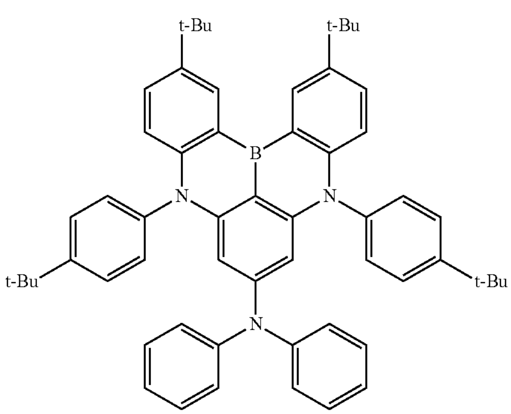
-continued
(1A-2688)
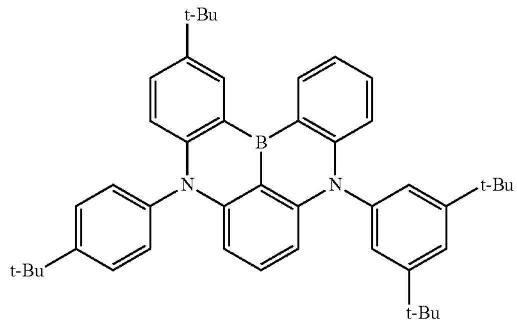
(1A-2689)
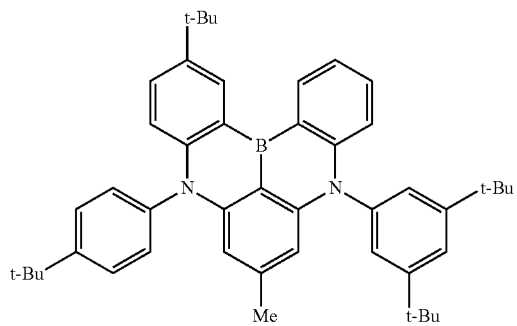
(1A-2691)
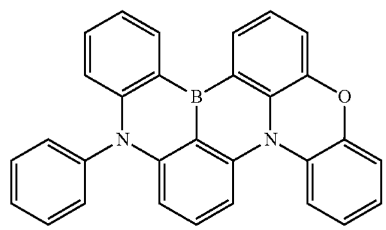
(1A-2692)
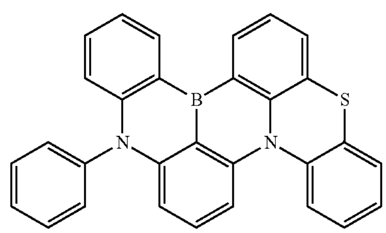
(1A-2693)
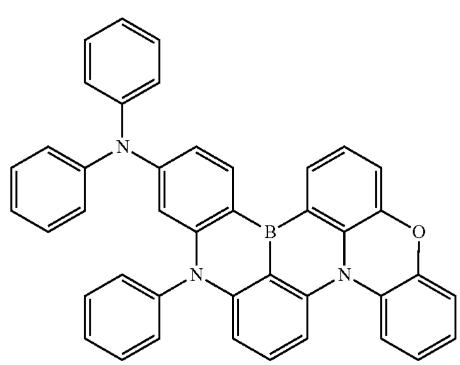

-continued
(1A-2694)
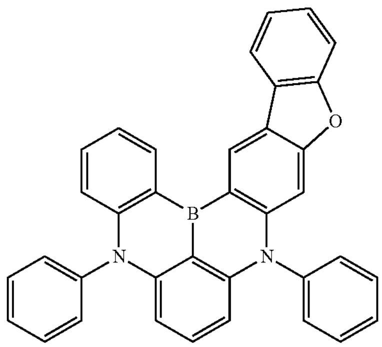
(1A-2695)
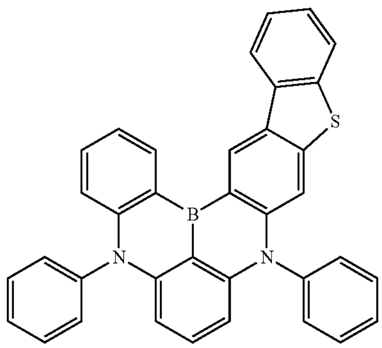
(1A-2696)
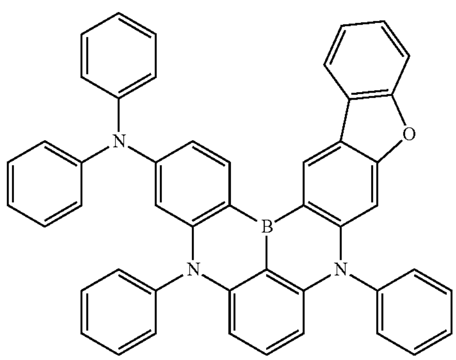
(1A-2697)
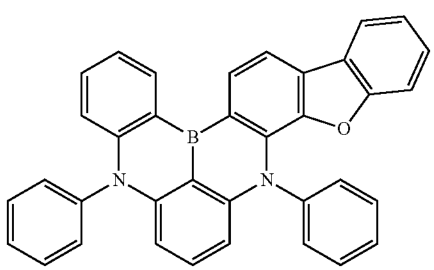
(1A-2698)
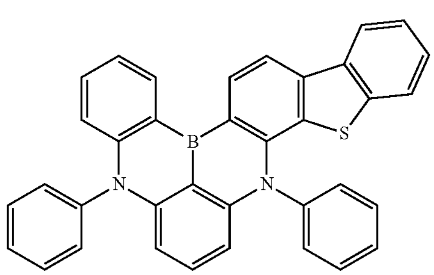
-continued
(1A-2699)
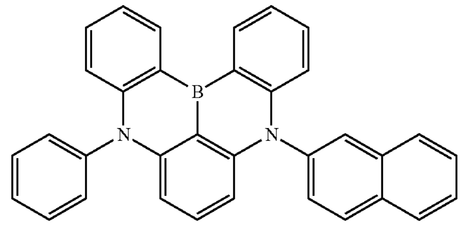
(1A-2700)
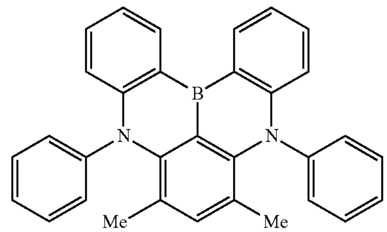
(1A-2701)
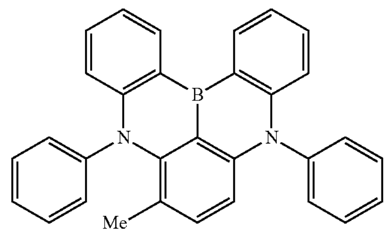
(1A-2702)
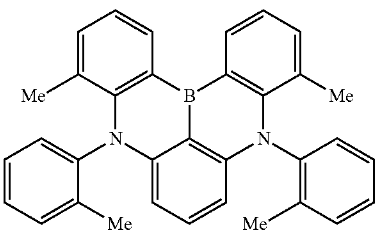
(1A-2703)
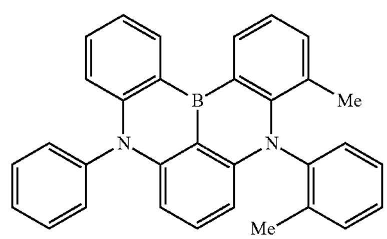
(1A-2704)
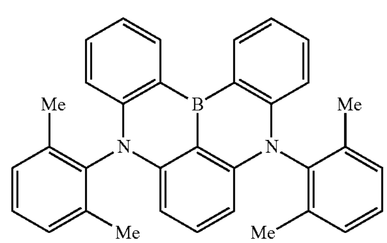

-continued (1A-2705)

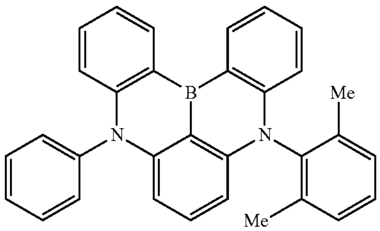

In regard to the polycyclic aromatic compound and a multimer thereof, an increase in the T1 energy (an increase by approximately 0.01 to 0.1 eV) can be expected by introducing a phenyloxy group, a carbazolyl group or a diphenylamino group into the para-position with respect to central element B (boron) in at least one of the ring A, ring B and ring C (ring a, ring b and ring c). Particularly, when a phenyloxy group is introduced into the para-position with respect to B (boron), the HOMO on the benzene rings which are the ring A, ring B and ring C (ring a, ring b and ring c) is more localized to the meta-position with respect to the boron, while the LUMO is localized to the ortho-position and the para-position with respect to the boron. Therefore, particularly, an increase in the T1 energy can be expected.

Specific examples of such a compound include compounds represented by the following formulas (1A-4501) to (1A-4522).

Note that R in the formulas represents an alkyl, and may be either linear or branched. Examples thereof include a linear alkyl having 1 to 24 carbon atoms and a branched alkyl having 3 to 24 carbon atoms. An alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 4 carbon atoms (branched alkyl having 3 to 4 carbon atoms) is particularly preferable. Other examples of R include phenyl.

Furthermore, "PhO—" represents a phenyloxy group, and this phenyl may be substituted by a linear or branched alkyl. For example, the phenyl may be substituted by a linear alkyl having 1 to 24 carbon atoms or a branched alkyl having 3 to 24 carbon atoms, an alkyl having 1 to 18 carbon atoms (a branched alkyl having 3 to 18 carbon atoms), an alkyl having 1 to 12 carbon atoms (a branched alkyl having 3 to 12 carbon atoms), an alkyl having 1 to 6 carbon atoms (a branched alkyl having 3 to 6 carbon atoms), or an alkyl having 1 to 4 carbon atoms (a branched alkyl having 3 or 4 carbon atoms).

(1A-4501)

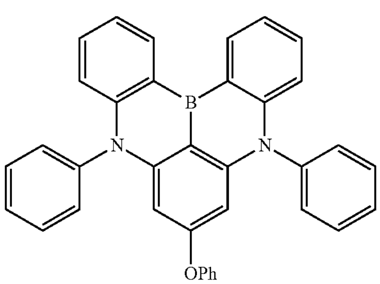

-continued (1A-4502)

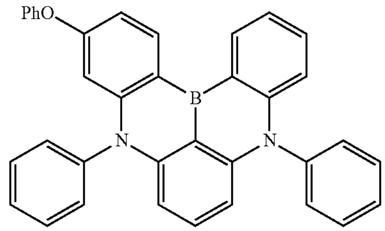

(1A-4503)

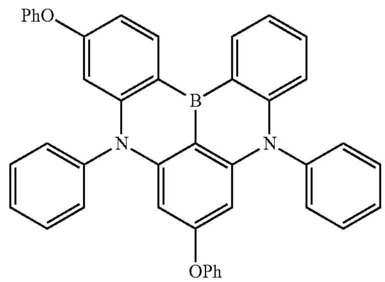

(1A-4504)

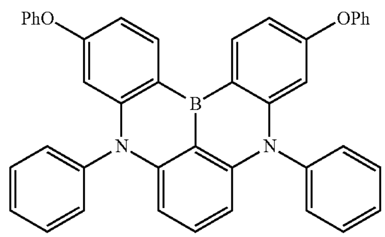

(1A-4505)

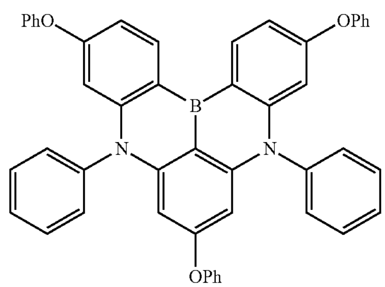

(1A-4506)

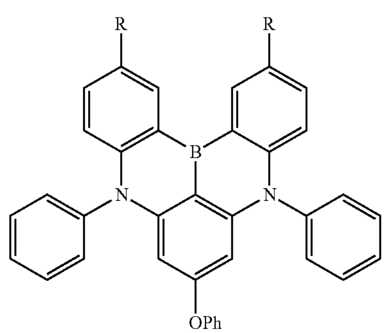

-continued
(1A-4507)
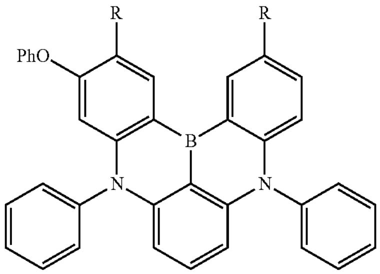
(1A-4508)
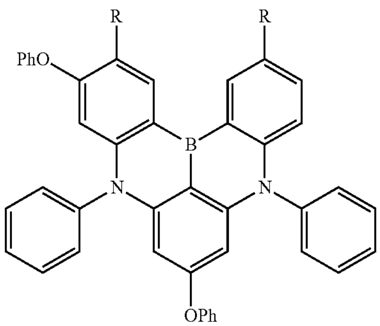
(1A-4509)
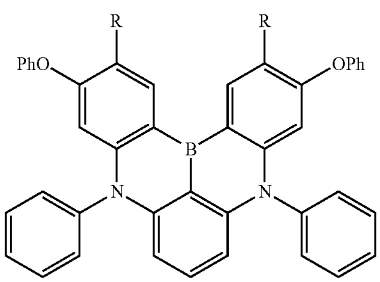
(1A-4510)
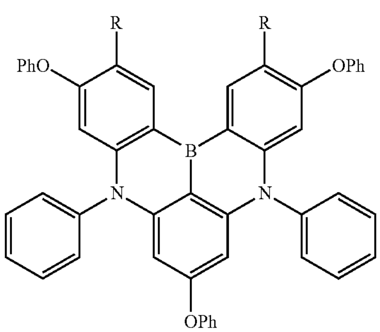
(1A-4511)
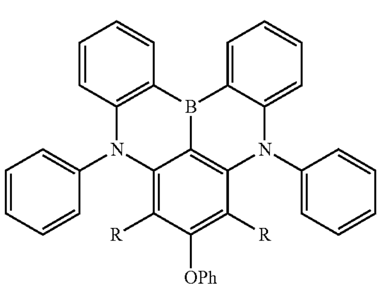
-continued
(1A-4512)
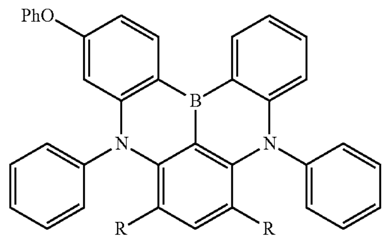
(1A-4513)
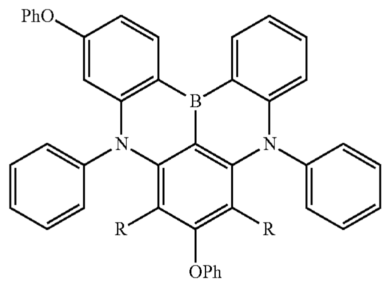
(1A-4514)
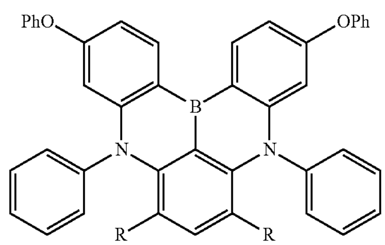
(1A-4515)
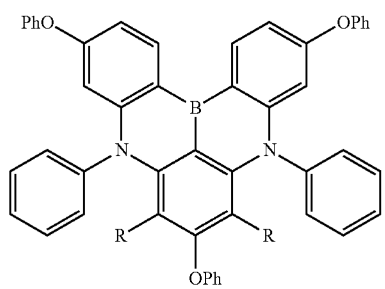
(1A-4516)
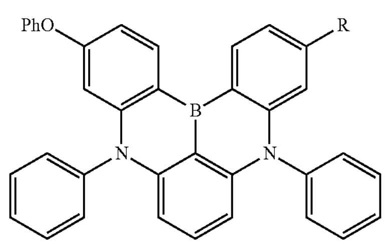
(1A-4517)
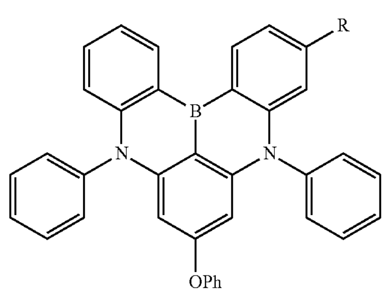

-continued (1A-4518)

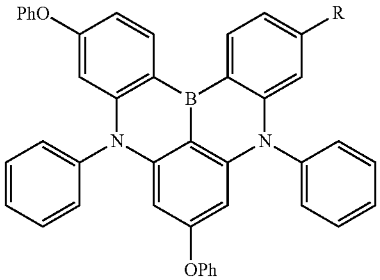

(1A-4519)

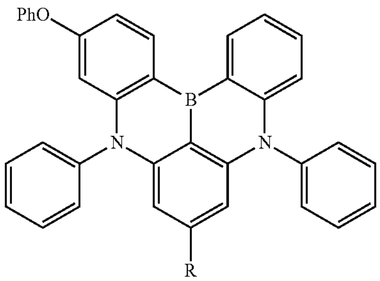

(1A-4520)

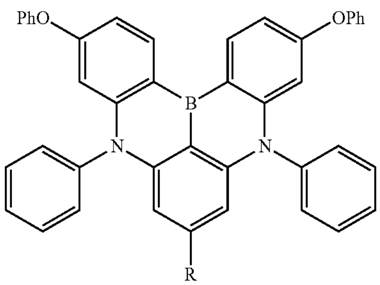

(1A-4521)

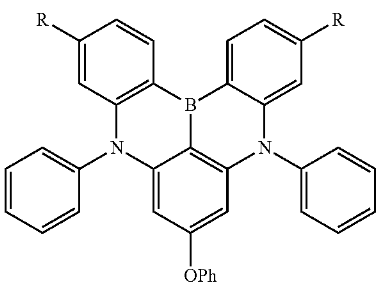

(1A-4522)

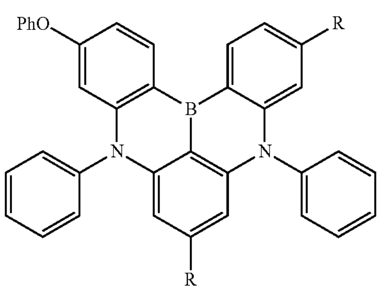

Specific examples of the polycyclic aromatic compound and a multimer thereof include the above compounds in which at least one hydrogen atom in one or more aromatic rings in the compound is substituted by one or more alkyls or aryls. More preferable examples thereof include a compound substituted by 1 or 2 of alkyls each having 1 to 12 carbon atoms and aryls each having 6 to 10 carbon atoms.

Specific examples thereof include the following compounds. R's in the following formulas each independently represent an alkyl having 1 to 12 carbon atoms or an aryl having 6 to 10 carbon atoms, and preferably an alkyl or phenyl having 1 to 4 carbon atoms, and n's each independently represent 0 to 2, and preferably 1.

(1A-401-R)

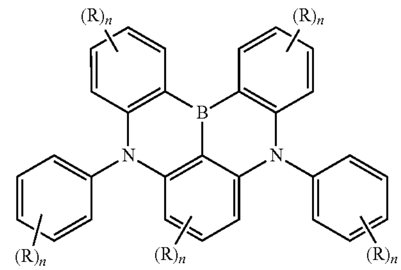

(1A-411-R)

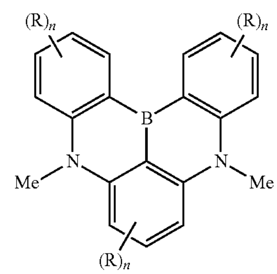

(1A-447-R)

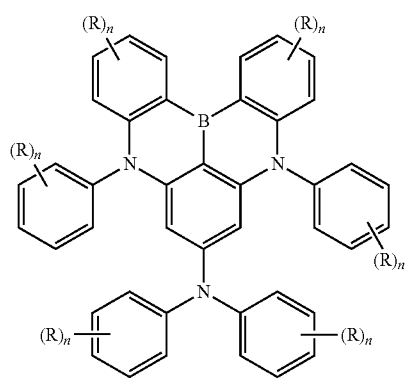

(1A-1152-R)

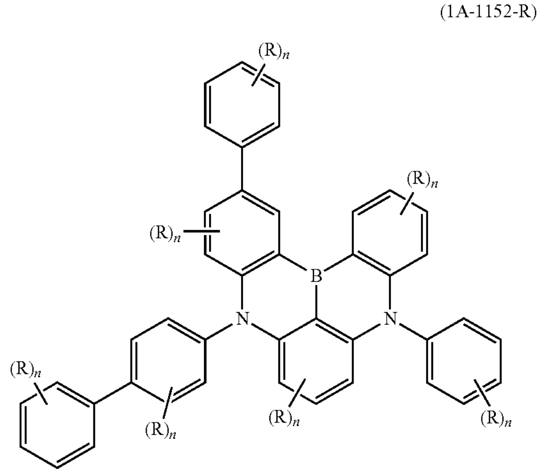

-continued
(1A-2623-R)
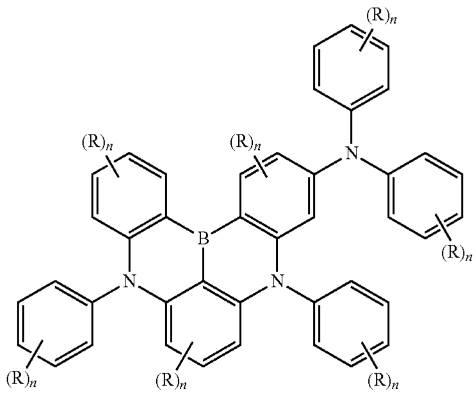
(1A-422-R)
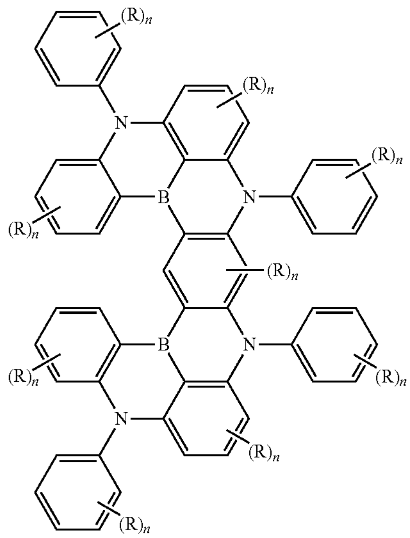
(1A-1159-R)
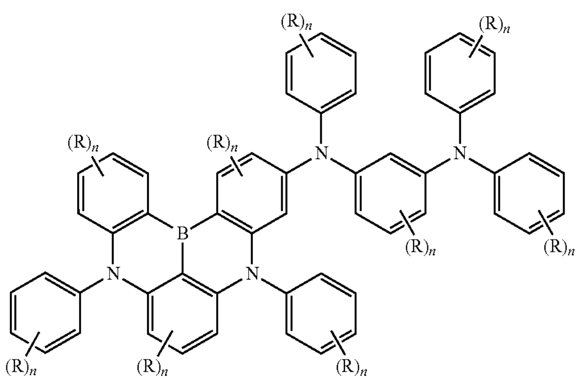
(1A-2657-R)
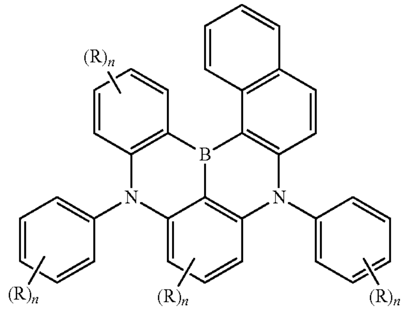
-continued
(1A-2665-R)
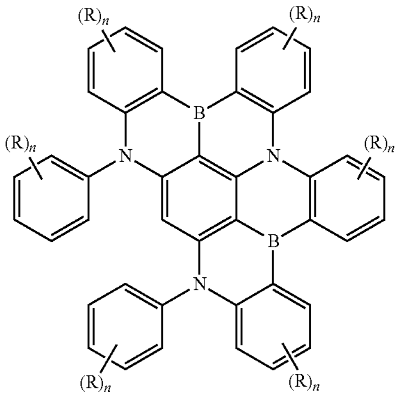
(1A-2676-R)
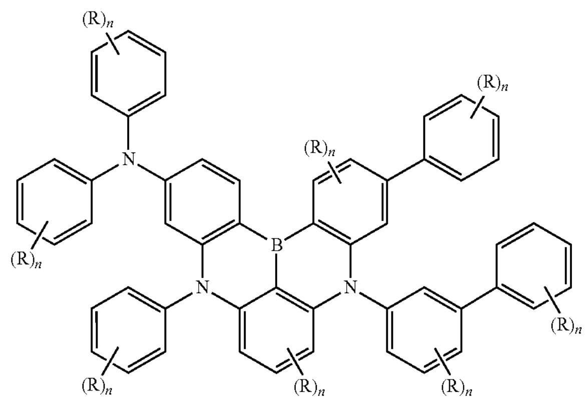
(1A-2679-R)
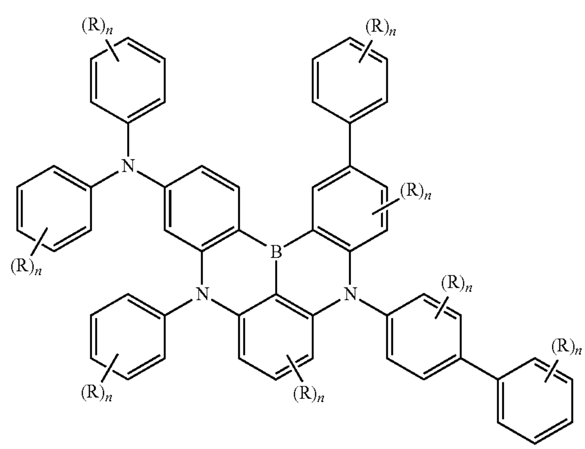

-continued (1A-2680-R)

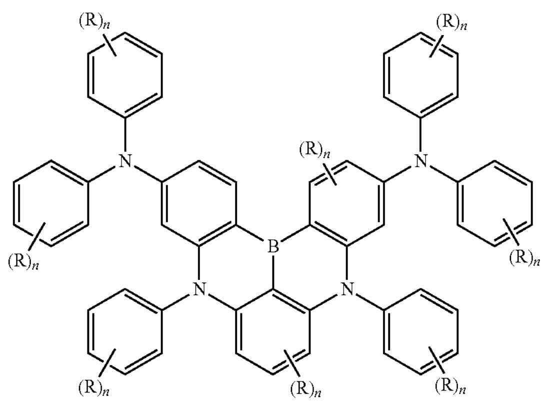

(1A-2681-R)

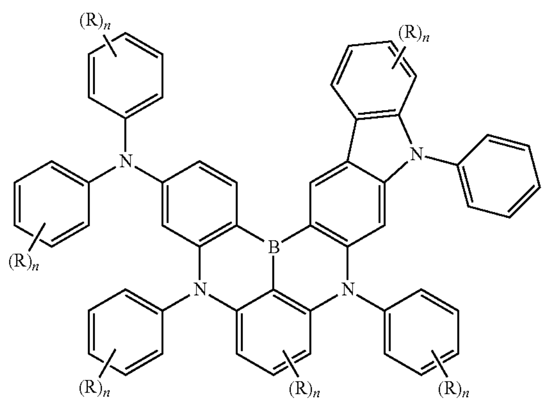

(1A-2682-R)

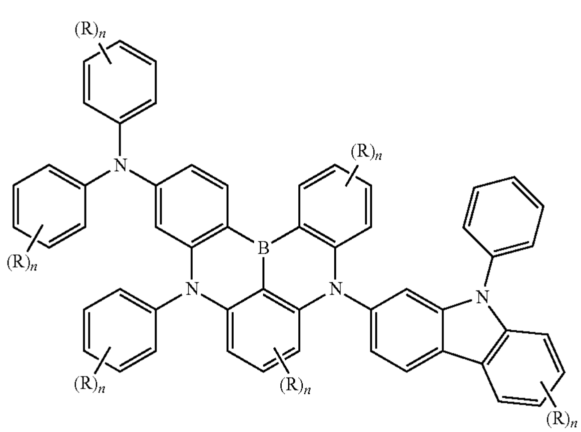

-continued (1A-2683-R)

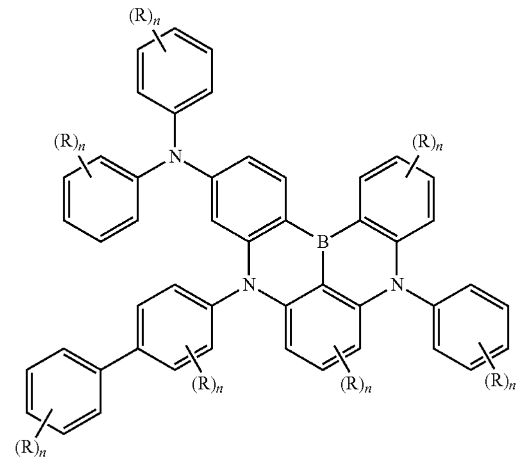

(1A-2691-R)

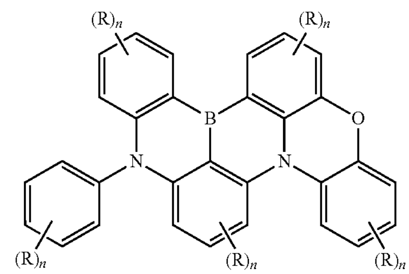

(1A-2699-R)

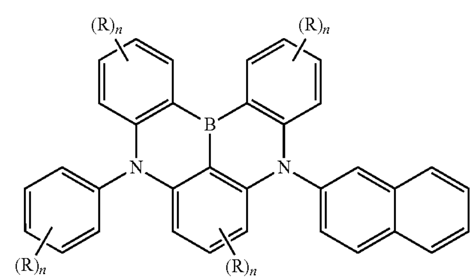

Furthermore, specific examples of the polycyclic aromatic compound and a multimer thereof include a compound in which at least one hydrogen atom in one or more phenyl groups or one phenylene group in the compound is substituted by one or more alkyls each having 1 to 4 carbon atoms, and preferably one or more alkyls each having 1 to 3 carbon atoms (preferably one or more methyl groups). More preferable examples thereof include a compound in which the hydrogen atoms at the ortho-positions of one phenyl group (both of the two sites, preferably any one site) or the hydrogen atoms at the ortho-positions of one phenylene group (all of the four sites at maximum, preferably any one site) are substituted by methyl groups.

By substitution of at least one hydrogen atom at the ortho-position of a phenyl group or a p-phenylene group at a terminal in the compound by a methyl group or the like, adjacent aromatic rings are likely to intersect each other perpendicularly, and conjugation is weakened. As a result, triplet excitation energy ($E_T$) can be increased.

1-2(2). Polycyclic Aromatic Compound Represented by General Formula (1B) or (1C) and Multimer Thereof A polycyclic aromatic compound represented by general formula (1B) and a multimer of a polycyclic aromatic compound having a plurality of structures each represented by general formula (1B) are as follows, and are preferably a polycyclic aromatic compound represented by the following general formula (1B') and a multimer of a polycyclic aromatic compound having a plurality of structures each represented by the following general formula (1B'), or a polycyclic aromatic compound represented by the following general formula (1B") and a multimer of a polycyclic aromatic compound having a plurality of structures each represented by the following general formula (1B"). A polycyclic aromatic compound represented by general formula (1C) and a multimer of a polycyclic aromatic compound having a plurality of structures each represented by general formula (1C) are as follows, and are preferably a polycyclic aromatic compound represented by the following general formula (1C') and a multimer of a polycyclic aromatic compound having a plurality of structures each represented by the following general formula (1C'), or a polycyclic aromatic compound represented by the following general formula (1C") and a multimer of a polycyclic aromatic compound having a plurality of structures each represented by the following general formula (1C").

(1B)

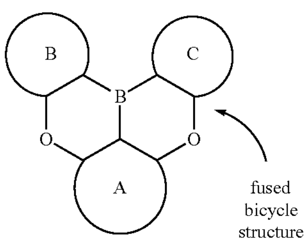

(1C)

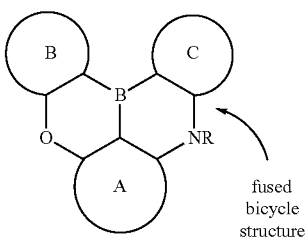

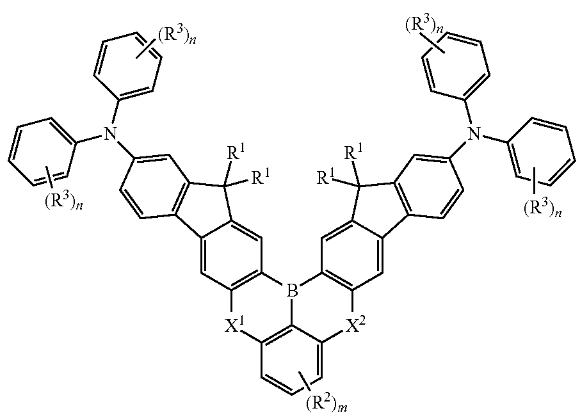

General formula (1B'):
$X^1$ and $X^2$ represent O
General formula (1C'):
$X^1$ represents O and $X^2$ represents >N—R -continued

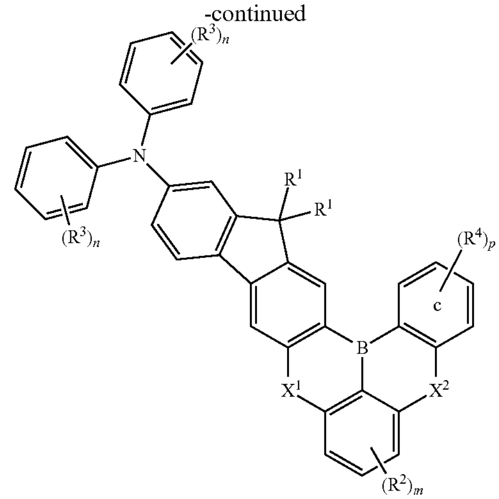

General formula (1B"): $X^1$ and $X^2$ represent O
General formula (1C"):
$X^1$ represents O and $X^2$ represents >N—R Note that the symbols in formulas (1B), (1B'), (1B"), (1C), (1C'), and (1C") are defined in the same manner as those described above. For the definition of "fused bicyclic structure (structure D)", a relationship in chemical structure between formula (1B) as a superordinate concept and formulas (1B') and (1B") as a subordinate concept, a relationship in chemical structure between formula (1C) as a superordinate concept and formulas (1C') and (1C") as a subordinate concept, description of structures represented by these formulas, and description of a multimer having the structures represented by these formulas as unit structures, the above description for formulas (1A) and (1A') can be cited. Hereinafter, formulas (1B'), (1B"), (1C'), and (1C") (hereinafter also referred to as subordinate concept formulas) will be described in more detail.

$R^1$ to $R^4$ in the subordinate concept formula each independently represent a hydrogen atom, an aryl, a heteroaryl, a diarylamino, a diheteroarylamino, an arylheteroarylamino, an alkyl, an alkoxy, a trialkylsilyl, or an aryloxy, and at least one hydrogen atom in these may be substituted by an aryl, a heteroaryl, a diarylamino, or an alkyl.

The aryl and heteroaryl as $R^1$ to $R^4$ in the subordinate concept formula are as follows.

Examples of the aryl include an aryl having 6 to 30 carbon atoms. The aryl is preferably an aryl having 6 to 16 carbon atoms, more preferably an aryl having 6 to 12 carbon atoms, and particularly preferably an aryl having 6 to 10 carbon atoms.

Specific examples of the aryl include: phenyl which is a monocyclic system; biphenylyl which is a bicyclic system; naphthyl which is a fused bicyclic system; terphenylyl (m-terphenylyl, o-terphenylyl, or p-terphenylyl) which is a tricyclic system; acenaphthylenyl, fluorenyl, phenalenyl, and phenanthrenyl which are fused tricyclic systems; triphenylenyl, pyrenyl, and naphthacenyl which are fused tetracyclic systems; and perylenyl and pentacenyl which are fused pentacyclic systems.

Examples of the heteroaryl include a heteroaryl having 2 to 30 carbon atoms. The heteroaryl is preferably a heteroaryl having 2 to 25 carbon atoms, more preferably a heteroaryl having 2 to 20 carbon atoms, still more preferably a heteroaryl having 2 to 15 carbon atoms, and particularly preferably a heteroaryl having 2 to 10 carbon atoms. Furthermore, examples of the heteroaryl include a heterocyclic ring containing 1 to 5 heteroatoms selected from an oxygen atom, a sulfur atom, and a nitrogen atom in addition to a carbon atom as a ring-constituting atom.

Specific examples of the heteroaryl include pyrrolyl, oxazolyl, isoxazolyl, thiazolyl, isothiazolyl, imidazolyl, oxadiazolyl, thiadiazolyl, triazolyl, tetrazolyl, pyrazolyl, pyridyl, pyrimidinyl, pyridazinyl, pyrazinyl, triazinyl, indolyl, isoindolyl, 1H-indazolyl, benzimidazolyl, benzoxazolyl, benzothiazolyl, 1H-benzotriazolyl, quinolyl, isoquinolyl, cinnolyl, quinazolyl, quinoxalinyl, phthalazinyl, naphthyridinyl, purinyl, pteridinyl, carbazolyl, acridinyl, phenoxathiinyl, phenoxazinyl, phenothiazinyl, phenazinyl, indolizinyl, furyl, benzofuranyl, isobenzofuranyl, dibenzofuranyl, thienyl, benzo[b]thienyl, dibenzothienyl, furazanyl, oxadiazolyl, thianthrenyl, naphthobenzofuranyl, and naphthobenzothienyl.

The diarylamino, diheteroarylamino, and arylheteroarylamino as $R^1$ to $R^4$ in the subordinate concept formula are groups in which an amino group is substituted by two aryl groups, two heteroaryl groups, and one aryl group and one heteroaryl group, respectively. For the aryl and heteroaryl here, the above description can be cited.

The alkyl as $R^1$ to $R^4$ in the subordinate concept formula may be either linear or branched, and examples thereof include a linear alkyl having 1 to 24 carbon atoms and a branched alkyl having 3 to 24 carbon atoms. An alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 4 carbon atoms (branched alkyl having 3 or 4 carbon atoms) is particularly preferable.

Specific examples of the alkyl include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

Examples of the alkoxy as $R^1$ to $R^4$ in the subordinate concept formula include a linear alkoxy having 1 to 24 carbon atoms and a branched alkoxy having 3 to 24 carbon atoms. The alkoxy is preferably an alkoxy having 1 to 18 carbon atoms (branched alkoxy having 3 to 18 carbon atoms), more preferably an alkoxy having 1 to 12 carbon atoms (branched alkoxy having 3 to 12 carbon atoms), still more preferably an alkoxy having 1 to 6 carbon atoms (branched alkoxy having 3 to 6 carbon atoms), and particularly preferably an alkoxy having 1 to 4 carbon atoms (branched alkoxy having 3 or 4 carbon atoms).

Specific examples of the alkoxy include methoxy, ethoxy, propoxy, isopropoxy, butoxy, isobutoxy, s-butoxy, t-butoxy, pentyloxy, hexyloxy, heptyloxy, and octyloxy.

Examples of the trialkylsilyl as $R^1$ to $R^4$ in the subordinate concept formula include a compound having a structure in which three hydrogen atoms in a silyl group are each independently substituted by an alkyl, and examples of the alkyl include a group described in the column of the alkyl as $R^1$ to $R^6$. An alkyl preferable for substitution is an alkyl having 1 to 4 carbon atoms, and specific examples thereof include methyl, ethyl, propyl, i-propyl, butyl, sec-butyl, t-butyl, and cyclobutyl.

Specific examples of the trialkylsily include trimethylsilyl, triethylsilyl, tripropylsilyl, tri-i-propylsilyl, tributylsilyl, tri-sec-butylsilyl, tri-t-butylsilyl, ethyldimethylsilyl, propyldimethylsilyl, i-propyldimethylsilyl, butyldimethylsilyl, sec-butyldimethylsilyl, t-butyldimethylsilyl, methyldiethylsilyl, propyldiethylsilyl, i-propyldiethylsilyl, butyldiethylsilyl, sec-butyldiethylsilyl, t-butyldiethylsilyl, methyldipropylsilyl, ethyldipropylsilyl, butyldipropylsilyl, sec-butyldipropylsilyl, t-butyldipropylsilyl, methyldi-i-propylsilyl, ethyldi-i-propylsilyl, butyldi-i-propylsilyl, sec-butyldi-i-propylsilyl, and t-butyldi-i-propylsilyl.

The aryloxy as $R^1$ to $R^4$ in the subordinate concept formula is a group in which a hydrogen atom of a hydroxyl group is substituted by an aryl. For the aryl here, the above description can be cited.

At least one hydrogen atom in $R^1$ to $R^4$ in the subordinate concept formula may be substituted by an aryl, a heteroaryl, a diarylamino, or an alkyl. For these substituents, the above description can be cited.

In a case where there is a plurality of $R^4$'s in general formulas (1B") and (1C"), adjacent $R^4$'s may be bonded to each other to form an aryl ring or a heteroaryl ring together with ring c, at least one hydrogen atom in the ring thus formed may be substituted by an aryl, a heteroaryl, a diarylamino, a diheteroarylamino, an arylheteroarylamino, an alkyl, an alkoxy, a trialkylsilyl, or an aryloxy, and at least one hydrogen atom in these may be substituted by an aryl, a heteroaryl, a diarylamino, or an alkyl.

Here, for the substituent in the formed ring (an aryl, a heteroaryl, a diarylamino, a diheteroarylamino, an arylheteroarylamino, an alkyl, an alkoxy, a trialkylsilyl, or an aryloxy) and a further substituent on the substituent (an aryl, a heteroaryl, a diarylamino, or an alkyl), the above description can be cited.

The case where the substituents $R^4$'s are adjacent means a case where adjacent carbon atoms on the ring c (benzene ring) are substituted by two substituents $R^4$'s. The polycyclic aromatic compound represented by general formula (1B") or (1C") changes its cyclic structure constituting the compound depending on a mutual bonding form of substituents in the ring c (the ring c changes to ring c') as illustrated in the following general formulas (1B"-c') and (1C"-c').

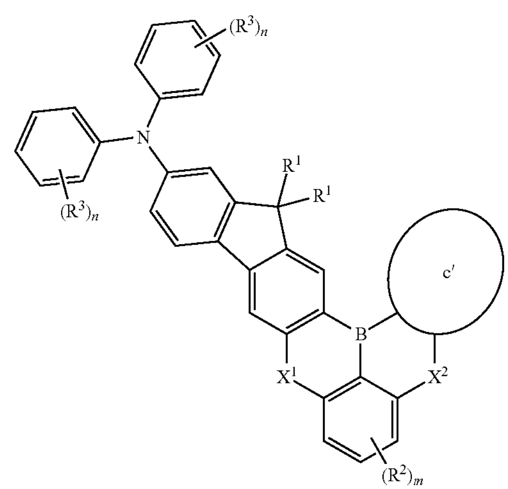

General formula (1B"-c'):
$X^1$ and $X^2$ represent O
General formula (1C"-c'):
$X^1$ represents O and $X^2$ represents >N—R The compound represented by the above general formula (1B"-c') or (1C"-c') is, for example, a compound having ring c' formed by fusing a benzene ring to a benzene ring which is ring c, and the fused ring c' that has been formed is a naphthalene ring. Other examples of the compound represented by the above general formula (1B"-c') or (1C"-c') include a carbazole ring (including a ring in which a hydrogen atom on N is substituted by the alkyl or aryl), an indole ring (including a ring in which a hydrogen atom on N is substituted by the alkyl or aryl), a dibenzofuran ring, and a dibenzothiophene ring, formed by fusing an indole ring, a pyrrole ring, a benzofuran ring, and a benzothiophene ring to a benzene ring which is ring c, respectively.

In formulas (1B'), (1B"), (1C'), and (1C") (subordinate concept formulas), $R^3$ may be bonded to a fluorene ring in the structural formula with —O—, —S—, —C(—R)$_2$—, or a single bond, and R of the —C(—R)$_2$-represents a hydrogen atom or an alkyl having 1 to 6 carbon atoms (particularly an alkyl having 1 to 4 carbon atoms (for example, methyl or ethyl)).

An examples in which $R^3$ is bonded to a fluorene ring in the structural formula is illustrated below. A bonding site in the fluorene ring is indicated by $R^6$.

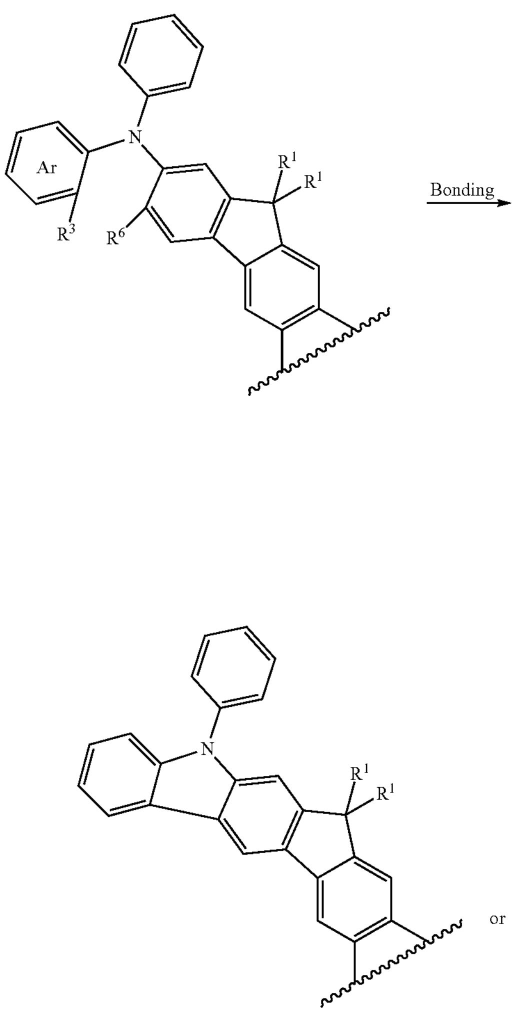

or

-continued

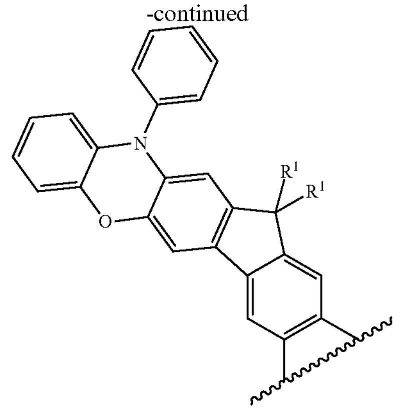

or the like

In the subordinate concept formula, m represents an integer of 0 to 3, n's each independently represent an integer of 0 to 5, and p represents an integer of 0 to 4.

m is preferably an integer of 0 to 2, more preferably 0 or 1, and particularly preferably 0. n's are each independently preferably an integer of 0 to 3, more preferably an integer of 0 to 2, still more preferably 0 or 1, and most preferably 0. p is preferably an integer of 0 to 2, more preferably 0 or 1, and particularly preferably 0.

In formulas (1C') and (1C"), R of >N—R represents an aryl having 6 to 12 carbon atoms, a heteroaryl having 2 to 15 carbon atoms, or an alkyl having 1 to 6 carbon atoms.

For the aryl, heteroaryl, and alkyl as R of the >N—R, the above description can be cited.

In formulas (1C') and (1C"), R of >N—R may be bonded to the ring c with —O—, —S—, —C(—R)$_2$—, or a single bond, and R of the —C(—R)$_2$— represents a hydrogen atom or an alkyl having 1 to 6 carbon atoms (particularly an alkyl having 1 to 4 carbon atoms (for example, methyl or ethyl)).

For the alkyl as R of the —C(—R)$_2$—, the above description can be cited. The provision that "R of >N—R is bonded to the ring c with —O—, —S—, —C(—R)$_2$—, or a single bond" can be expressed by a compound having a ring structure in which N is incorporated into the fused ring c", represented by the following general formula (1C"-c"). That is, the compound is, for example, a compound having the ring c" formed by fusing another ring to a benzene ring which is the ring c in general formula (1C") so as to incorporate N. Examples of the fused ring c" thus formed include a phenoxazine ring, a phenothiazine ring, and an acridine ring.

General formula (1C″-c″)

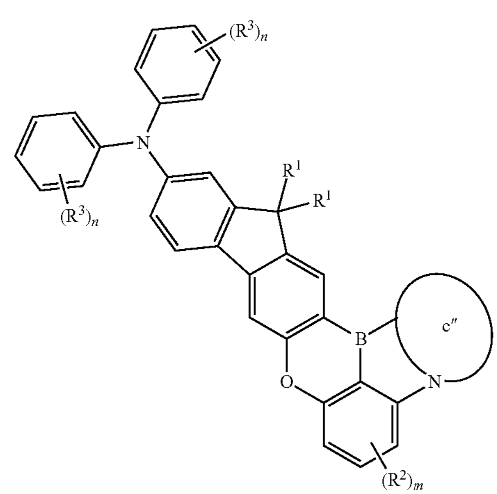

A polycyclic aromatic compound represented by general formula (1B) and a multimer of a polycyclic aromatic compound having a plurality of structures each represented by general formula (1B) are preferably a polycyclic aromatic compound represented by the following general formula ($1B^{3'}$) and a multimer of a polycyclic aromatic compound having a plurality of structures each represented by the following general formula ($1B^{3'}$), or a polycyclic aromatic compound represented by the following general formula ($1B^{4'}$) and a multimer of a polycyclic aromatic compound having a plurality of structures each represented by the following general formula ($1B^{4'}$). A polycyclic aromatic compound represented by general formula (1C) and a multimer of a polycyclic aromatic compound having a plurality of structures each represented by general formula (1C) are preferably a polycyclic aromatic compound represented by the following general formula ($1C^{3'}$) and a multimer of a polycyclic aromatic compound having a plurality of structures each represented by the following general formula ($1C^{3'}$), or a polycyclic aromatic compound represented by the following general formula ($1C^{4'}$) and a multimer of a polycyclic aromatic compound having a plurality of structures each represented by the following general formula ($1C^{4'}$).

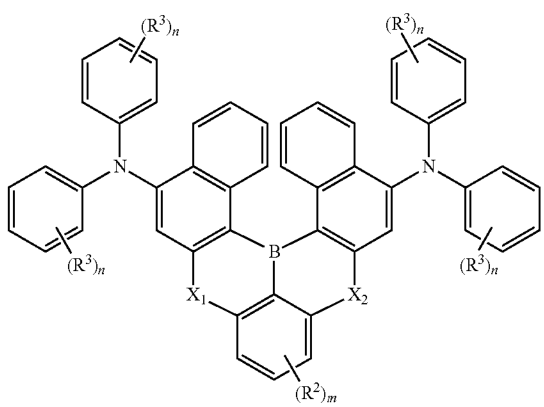

General formula ($1B^{3'}$):
$X^1$ and $X^2$ represent O
General formula ($1C^{3'}$):
$X^1$ represents O and $X^2$ represents > N - R

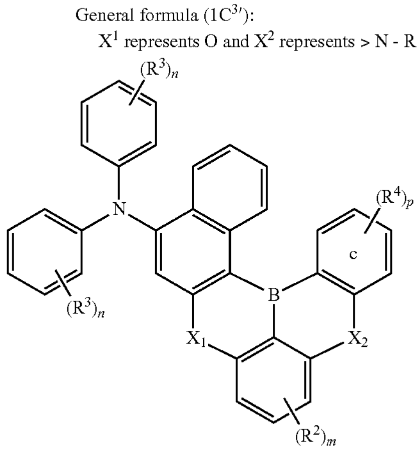

General formula ($1B^{4'}$):
$X^1$ and $X^2$ represent O
General formula ($1C^{4'}$):
$X^1$ represents O and $X^2$ represents > N - R, or $X^1$ represents > N - R and $X^2$ represents O $R^2$ to $R^4$ each independently represent a hydrogen atom, an aryl, a heteroaryl, a diarylamino, a diheteroarylamino, an arylheteroarylamino, an alkyl, an alkoxy, a trialkylsilyl, an aryloxy, or cyano, and at least one hydrogen atom in these may be substituted by an aryl, a heteroaryl, a diarylamino, or an alkyl.

Examples of the aryl include an aryl having 6 to 30 carbon atoms. The aryl is preferably an aryl having 6 to 16 carbon atoms, more preferably an aryl having 6 to 12 carbon atoms, and particularly preferably an aryl having 6 to 10 carbon atoms.

Specific examples of the aryl include: phenyl which is a monocyclic system; biphenylyl which is a bicyclic system; naphthyl which is a fused bicyclic system; terphenylyl (m-terphenylyl, o-terphenylyl, or p-terphenylyl) which is a tricyclic system; acenaphthylenyl, fluorenyl, phenalenyl, and phenanthrenyl which are fused tricyclic systems; triphenylenyl, pyrenyl, and naphthacenyl which are fused tetracyclic systems; and perylenyl and pentacenyl which are fused pentacyclic systems.

Examples of the heteroaryl include a heteroaryl having 2 to 30 carbon atoms. The heteroaryl is preferably a heteroaryl having 2 to 25 carbon atoms, more preferably a heteroaryl having 2 to 20 carbon atoms, still more preferably a heteroaryl having 2 to 15 carbon atoms, and particularly preferably a heteroaryl having 2 to 10 carbon atoms. Furthermore, examples of the heteroaryl include a heterocyclic ring containing 1 to 5 heteroatoms selected from an oxygen atom, a sulfur atom, and a nitrogen atom in addition to a carbon atom as a ring-constituting atom.

Specific examples of the heteroaryl include pyrrolyl, oxazolyl, isoxazolyl, thiazolyl, isothiazolyl, imidazolyl, oxadiazolyl, thiadiazolyl, triazolyl, tetrazolyl, pyrazolyl, pyridyl, pyrimidinyl, pyridazinyl, pyrazinyl, triazinyl, indolyl, isoindolyl, 1H-indazolyl, benzimidazolyl, benzoxazolyl, benzothiazolyl, 1H-benzotriazolyl, quinolyl, isoquinolyl, cinnolyl, quinazolyl, quinoxalinyl, phthalazinyl, naphthyridinyl, purinyl, pteridinyl, carbazolyl, acridinyl, phenoxathiinyl, phenoxazinyl, phenothiazinyl, phenazinyl, indolizinyl, furyl, benzofuranyl, isobenzofuranyl, dibenzofuranyl, thienyl, benzo[b]thienyl, dibenzothienyl, furazanyl, oxadiazolyl, thianthrenyl, naphthobenzofuranyl, and naphthobenzothienyl.

The diarylamino, diheteroarylamino, and arylheteroarylamino as $R^2$ to $R^4$ are groups in which an amino group is substituted by two aryl groups, two heteroaryl groups, and one aryl group and one heteroaryl group, respectively. For the aryl and heteroaryl here, the above description for the $R^2$ to $R^4$ can be cited.

The alkyl as $R^2$ to $R^4$ may be either linear or branched, and examples thereof include a linear alkyl having 1 to 24 carbon atoms and a branched alkyl having 3 to 24 carbon atoms. An alkyl having 1 to 18 carbon atoms (branched alkyl having. 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 4 carbon atoms (branched alkyl having 3 or 4 carbon atoms) is particularly preferable.

Specific examples of the alkyl include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

Examples of the alkoxy as $R^2$ to $R^4$ include a linear alkoxy having 1 to 24 carbon atoms and a branched alkoxy having 3 to 24 carbon atoms. The alkoxy is preferably an alkoxy having 1 to 18 carbon atoms (branched alkoxy having 3 to 18 carbon atoms), more preferably an alkoxy having 1 to 12 carbon atoms (branched alkoxy having 3 to 12 carbon atoms), still more preferably an alkoxy having 1 to 6 carbon atoms (branched alkoxy having 3 to 6 carbon atoms), and particularly preferably an alkoxy having 1 to 4 carbon atoms (branched alkoxy having 3 or 4 carbon atoms).

Specific examples of the alkoxy include methoxy, ethoxy, propoxy, isopropoxy, butoxy, isobutoxy, s-butoxy, t-butoxy, pentyloxy, hexyloxy, heptyloxy, and octyloxy.

Examples of the trialkylsilyl as $R^2$ to $R^4$ include a compound in which three hydrogen atoms in a silyl group are each independently substituted by an alkyl, and examples of the alkyl include those described in the column of the alkyl as $R^2$ to $R^4$. An alkyl preferable for substitution is an alkyl having 1 to 4 carbon atoms, and specific examples thereof include methyl, ethyl, propyl, i-propyl, butyl, sec-butyl, t-butyl, and cyclobutyl.

Specific examples of the trialkylsily include trimethylsilyl, triethylsilyl, tripropylsilyl, tri-i-propylsilyl, tributylsilyl, tri-sec-butylsilyl, tri-t-butylsilyl, ethyldimethylsilyl, propyldimethylsilyl, i-propyldimethylsilyl, butyldimethylsilyl, sec-butyldimethylsilyl, t-butyldimethylsilyl, methyldiethylsilyl, propyldiethylsilyl, i-propyldiethylsilyl, butyldiethylsilyl, sec-butyldiethylsilyl, t-butyldiethylsilyl, methyldipropylsilyl, ethyldipropylsilyl, butyldipropylsilyl, sec-butyldipropylsilyl, t-butyldipropylsilyl, methyldi-i-propylsilyl, ethyldi-i-propylsilyl, butyldi-i-propylsilyl, sec-butyldi-i-propylsilyl, and t-butyldi-i-propylsilyl.

The aryloxy as $R^2$ to $R^4$ is a group in which a hydrogen atom of a hydroxyl group is substituted by an aryl. For the aryl here, the above description for $R^2$ to $R^4$ can be cited.

At least one hydrogen atom in $R^2$ to $R^4$ may be substituted by an aryl, a heteroaryl, a diarylamino, or an alkyl. For these substituents, the above description can be cited.

In a case where there is a plurality of $R^{4\prime}$'s in general formulas ($1B^{4\prime}$) and ($1C^{4\prime}$), adjacent $R^{4\prime}$'s may be bonded to each other to form an aryl ring or a heteroaryl ring together with ring c, at least one hydrogen atom in the ring thus formed may be substituted by an aryl, a heteroaryl, a diarylamino, a diheteroarylamino, an arylheteroarylamino, an alkyl, an alkoxy, a trialkylsilyl, an aryloxy, or cyano, and at least one hydrogen atom in these may be substituted by an aryl, a heteroaryl, a diarylamino, or an alkyl.

Here, for the substituent in the formed ring (an aryl, a heteroaryl, a diarylamino, a diheteroarylamino, an arylheteroarylamino, an alkyl, an alkoxy, a trialkylsilyl, or an aryloxy) and a further substituent on the substituent (an aryl, a heteroaryl, a diarylamino, or an alkyl), the above description can be cited.

The case where the substituents $R^{4\prime}$'s are adjacent means a case where adjacent carbon atoms on the ring c (benzene ring) are substituted by two substituents $R^{4\prime}$'s. The polycyclic aromatic compound represented by general formula ($1B^{4\prime}$) or ($1C^{4\prime}$) changes its cyclic structure constituting the compound depending on a mutual bonding form of substituents in the ring c (the ring c changes to ring c') as illustrated in the following general formulas ($1B^{4\prime}$-c') and ($1C^{4\prime}$-c').

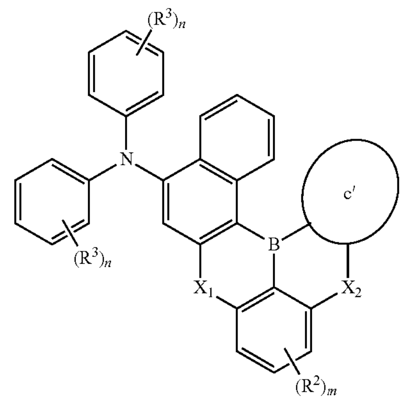

General formula ($1B^{4\prime}$-c'): $X^1$ and $X^2$ represent O

General formula ($1C^{4\prime}$-c'): $X^1$ represents O and $X^2$ represents >N—R, or $X^1$ represents >N—R, and $X^2$ represents O The compounds represented by the above general formulas ($1B^{4\prime}$-c') and ($1C^{4\prime}$-c') correspond to, for example, compounds represented by formulas (1B-321) to (1B-342), (1B-346), (1B-351), (1B-352), (1B-356), and the like, listed as specific compounds below. That is, each of the compounds represented by the above general formulas ($1B^{4\prime}$-c') and ($1C^{4\prime}$-c') is a compound having ring c' formed by fusing a benzene ring or the like to a benzene ring which is ring c, and the fused ring c' that has been formed is a naphthalene ring or the like. Other examples of the compound represented by the above general formula ($1B^{4\prime}$-c') or ($1C^{4\prime}$-c') include a carbazole ring (including a ring in which a hydrogen atom on N is substituted by the alkyl or aryl), an indole ring (including a ring in which a hydrogen atom on N is substituted by the alkyl or aryl), a dibenzofuran ring, and a dibenzothiophene ring, formed by fusing an indole ring, a pyrrole ring, a benzofuran ring, and a benzothiophene ring to a benzene ring which is ring c, respectively.

m represents an integer of 0 to 3, n's each independently represent an integer of 0 to 5, and p represents an integer of 0 to 4.

m is preferably an integer of 0 to 2, more preferably 0 or 1, and particularly preferably 0. n's are each independently preferably an integer of 0 to 3, more preferably an integer of 0 to 2, still more preferably 0 or 1, and most preferably 0. p is preferably an integer of 0 to 2, more preferably 0 or 1, and particularly preferably 0.

$X^1$ and $X^2$ each independently represent O or N—R. R of the >N—R represents an aryl having 6 to 12 carbon atoms, a heteroaryl having 2 to 15 carbon atoms, or an alkyl having 1 to 6 carbon atoms.

For the aryl, heteroaryl, and alkyl as R of the N—R, the above description for $R^2$ to $R^4$ can be cited.

In a case where $X^2$ in general formulas ($1B^{4\prime}$) and ($1C^{4\prime}$) represents the N—R, R may be bonded to the ring c with —O—, —S—, —C(—R)$_2$—, or a single bond, and R of the —C(—R)$_2$— represents a hydrogen atom or an alkyl having 1 to 6 carbon atoms (particularly an alkyl having 1 to 4 carbon atoms (for example, methyl or ethyl)).

For the alkyl as R of the —C(—R)$_2$—, the above description for $R^2$ to $R^4$ can be cited. The provision that "R of N—R is bonded to the ring a with —O—, —S—, —C(—R)$_2$—, or a single bond" can be expressed by a compound having a ring structure in which $X^2$ is incorporated into the fused ring c", represented by the following general formula (1B$^{4\prime}$-c") or (1B$^{4\prime}$-c"). That is, the compound is, for example, a compound having the ring c" formed by fusing another ring to a benzene ring which is the ring c in general formula (1B$^{4\prime}$) or (1C$^{4\prime}$) so as to incorporate $X^2$. Examples of the fused ring c" thus formed include a phenoxazine ring, a phenothiazine ring, and an acridine ring.

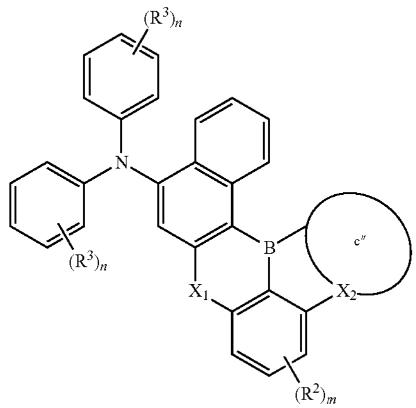

-continued

General formula (1B$^{4\prime}$-c"):
$X^1$ and $X^2$ represent O
General formula (1C$^{4\prime}$-c"):
$X^1$ represents O and $X^2$ represents >N—R,
or $X^1$ represents >N—R and $X^2$ represents O At least one hydrogen atom in a compound represented by general formula (1B) or (1C) may be substituted by cyano, a halogen atom, or a deuterium atom.

The halogen is fluorine, chlorine, bromine, or iodine, preferably fluorine, chlorine, or bromine, and more preferably chlorine.

More specific examples of the polycyclic aromatic compound represented by general formula (1B) or (1C) and a multimer thereof include compounds represented by the following structural formulas.

(1B-1)

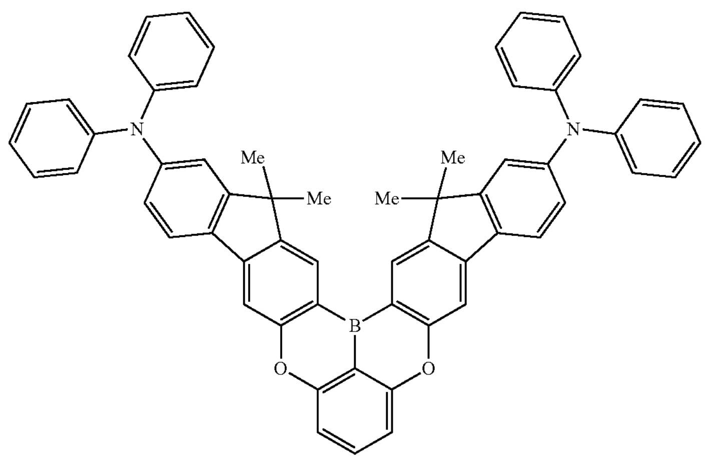

(1B-2)

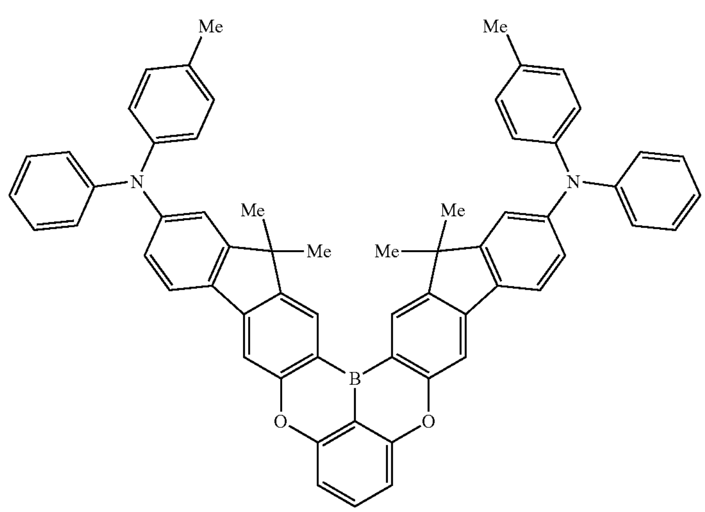

-continued
(1B-3)
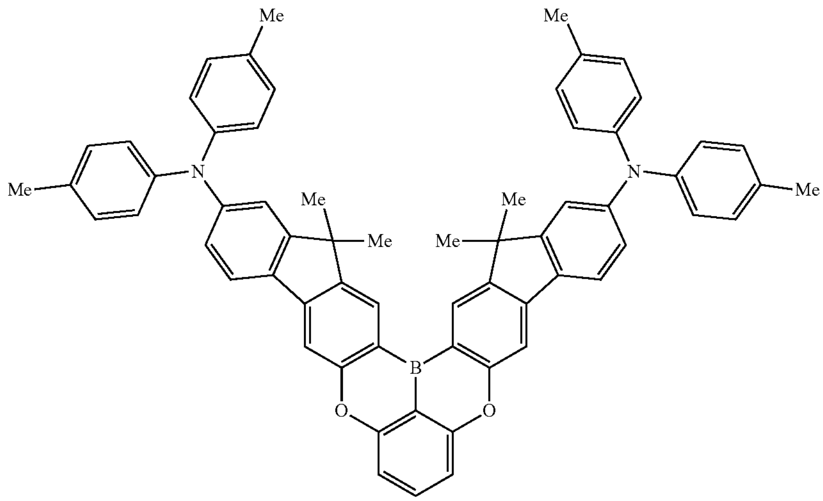
(1B-4)
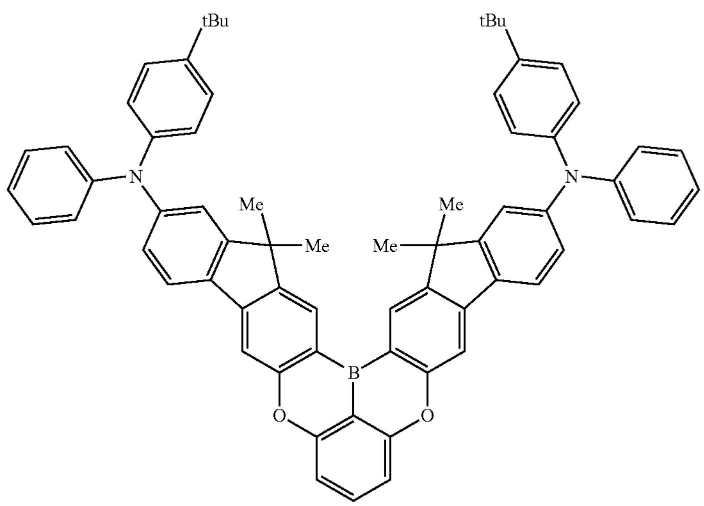 [SMILES: CC1(C)c2cc(N(c3ccccc3)c3ccccc3)ccc2-c2cc3c(cc21)B1c2cc4c(cc2Oc2cccc(c21)O3)-c1ccc(N(c2ccccc2)c2ccccc2)cc1C4(C)C]
(1B-5)
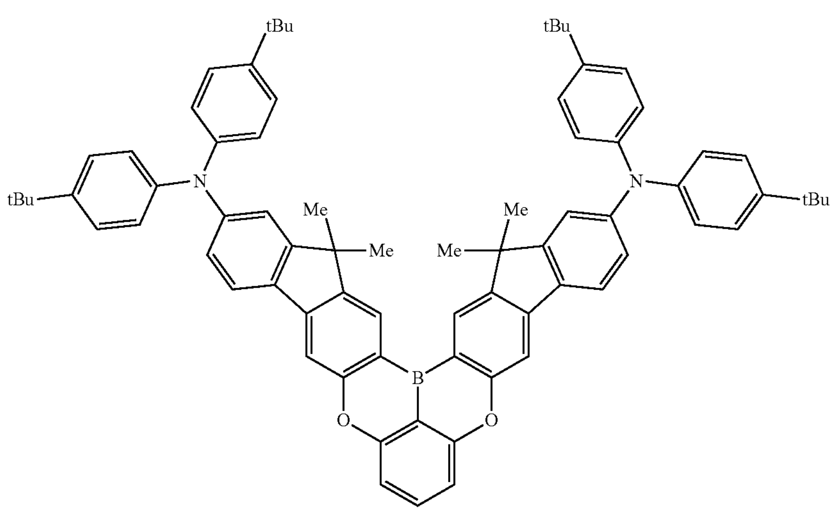

-continued
(1B-6)
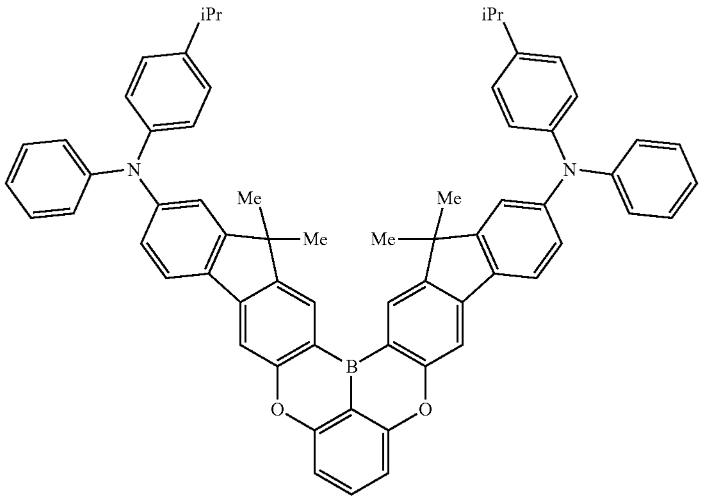
(1B-7)
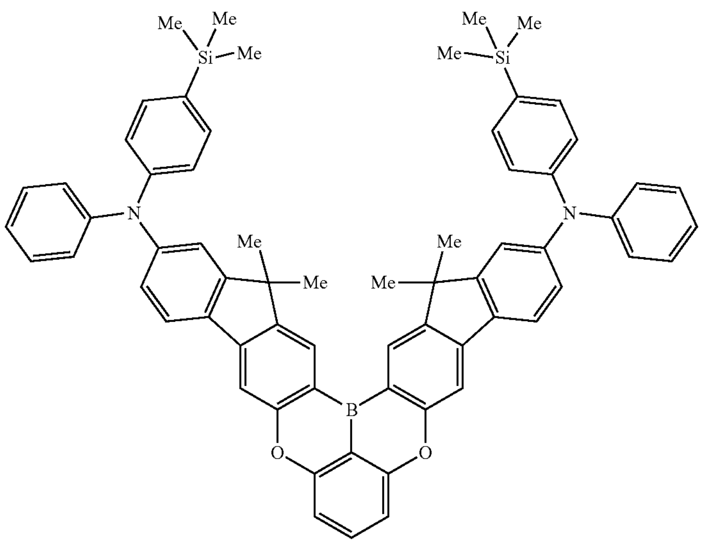
(1B-8)
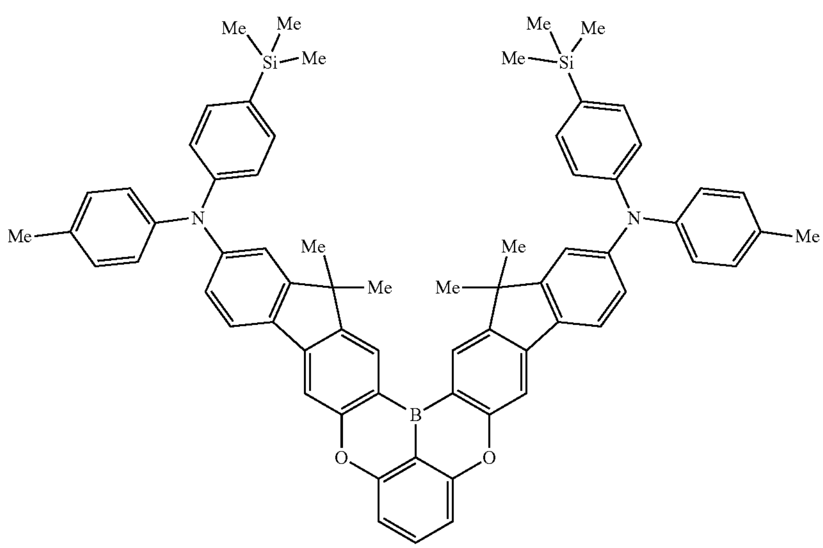

-continued
(1B-9)
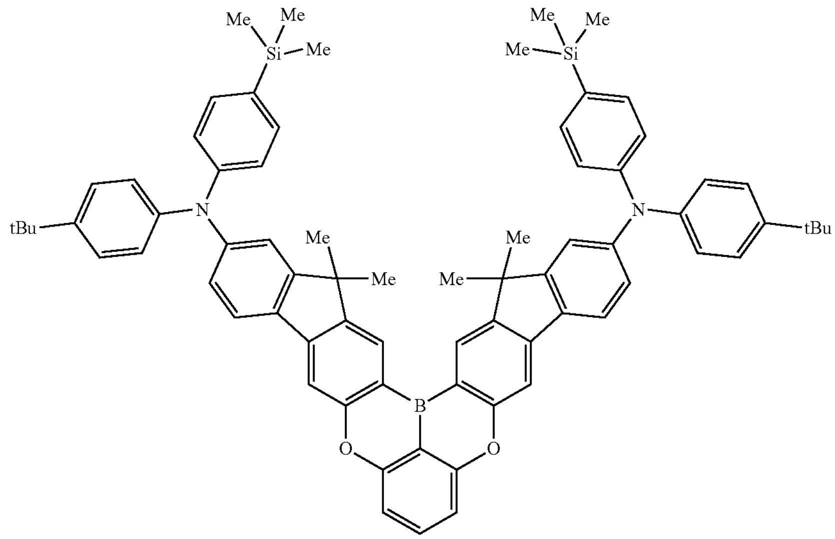
(1B-10)
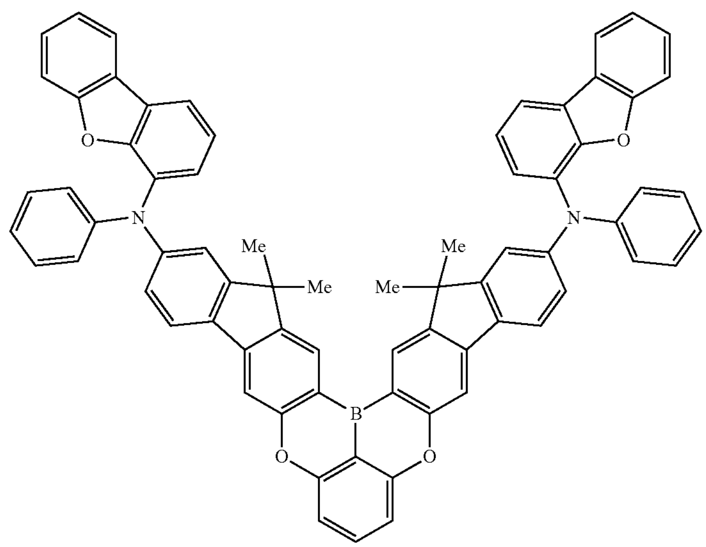
(1B-11)
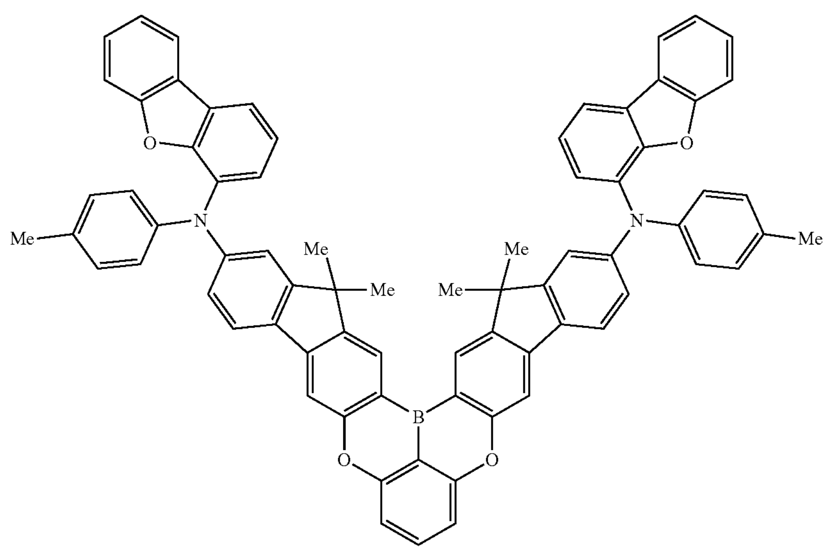

-continued
(1B-12)
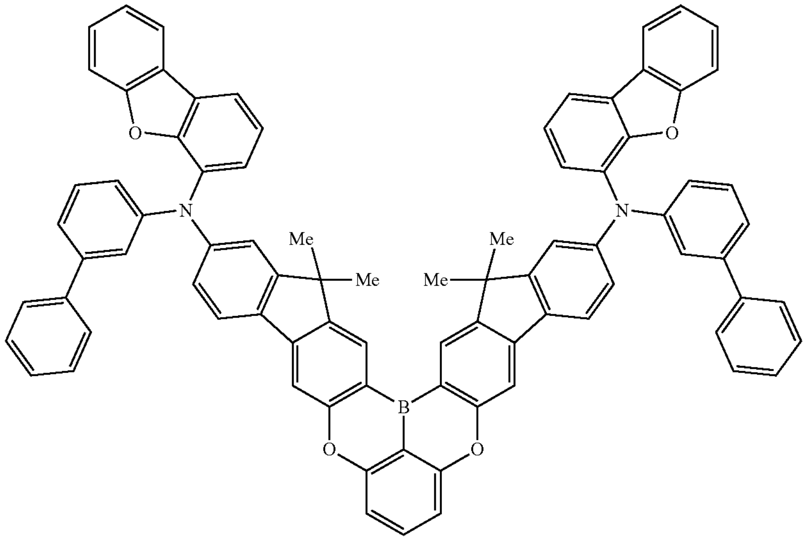
(1B-13)
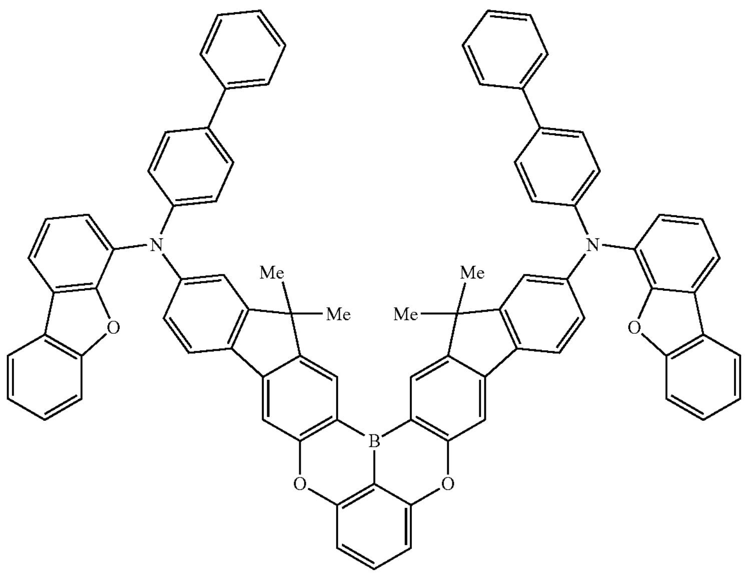
(1B-14)
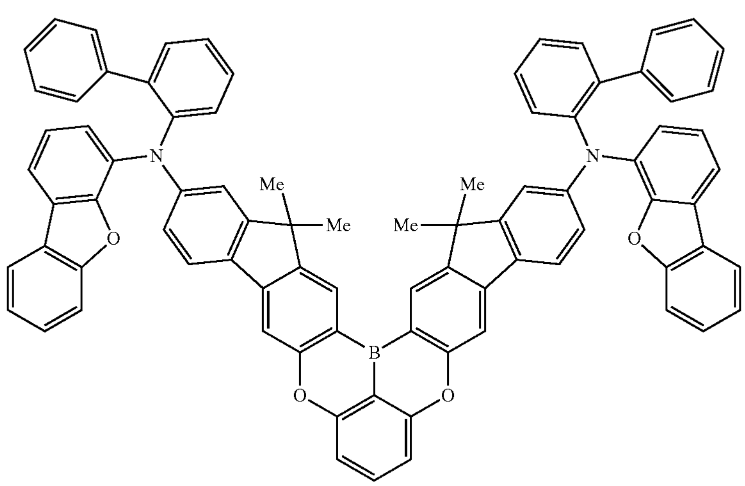

-continued
(1B-15)
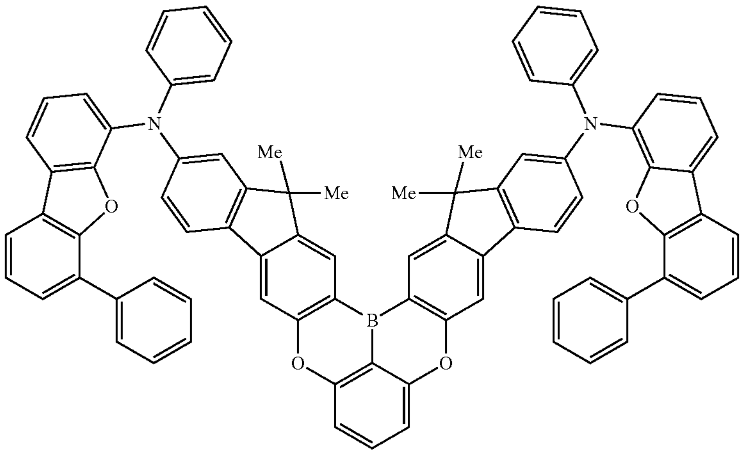
(1B-16)
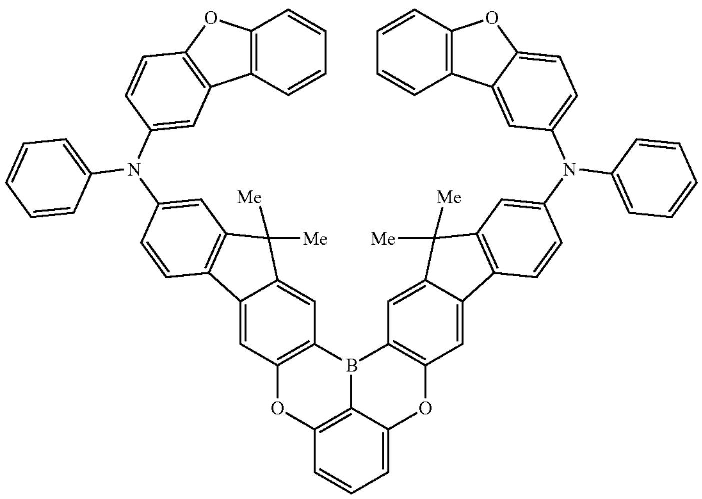
(1B-17)
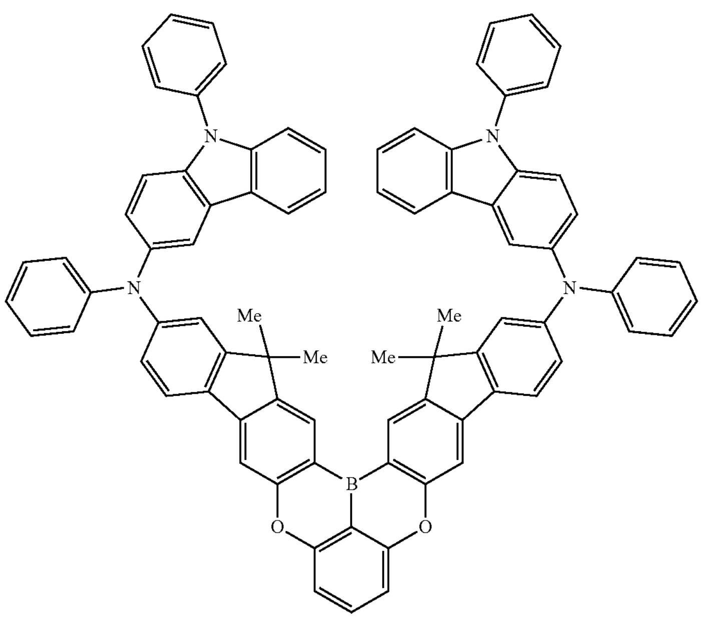

-continued
(1B-18)
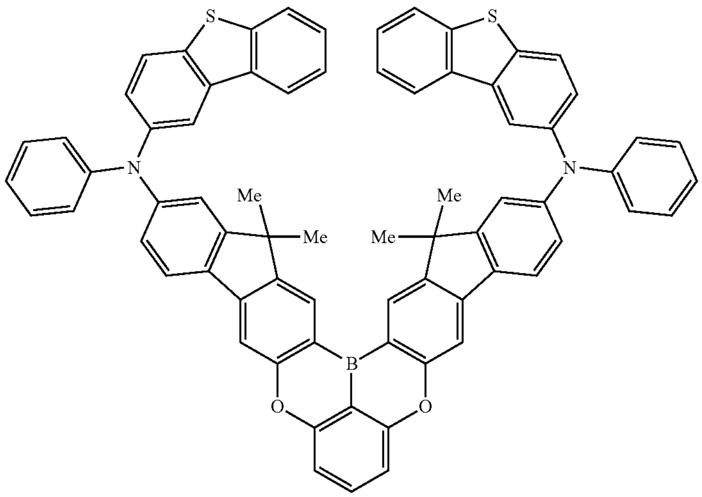
(1B-19)
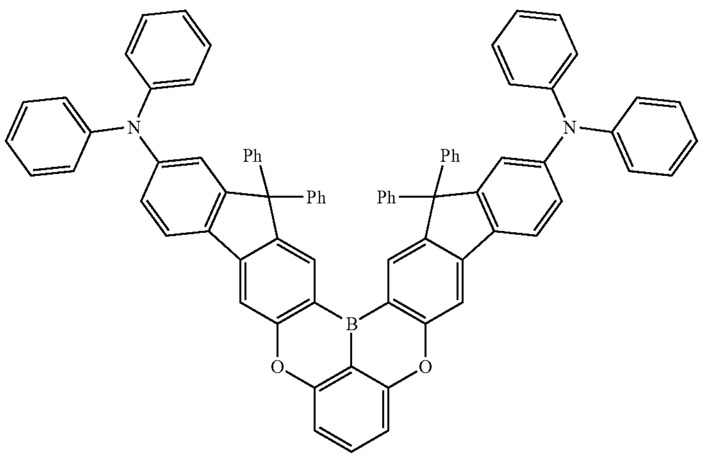
(1B-20)
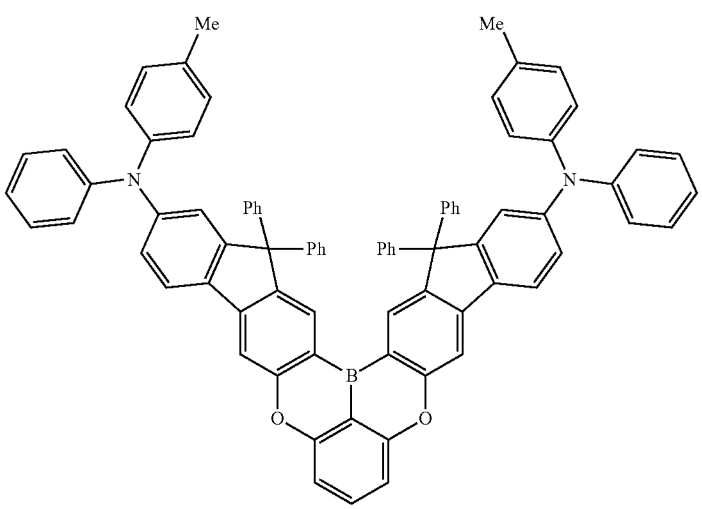

-continued
(1B-21)
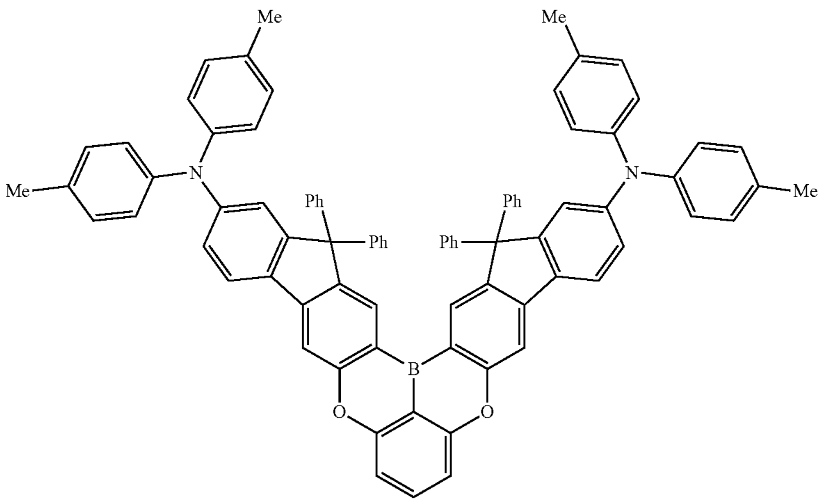
(1B-22)
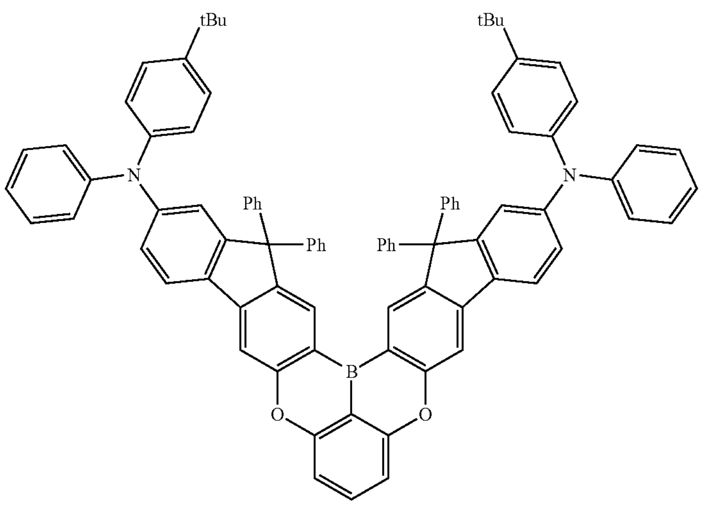
(1B-23)
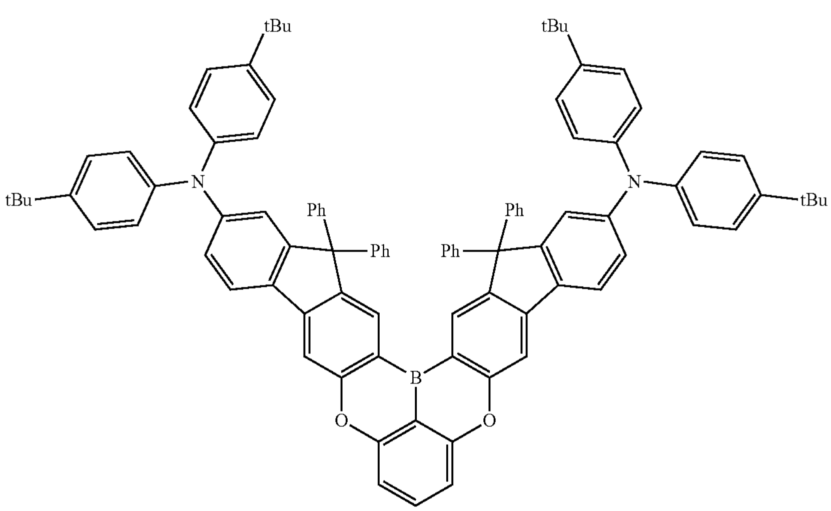

-continued
(1B-24)
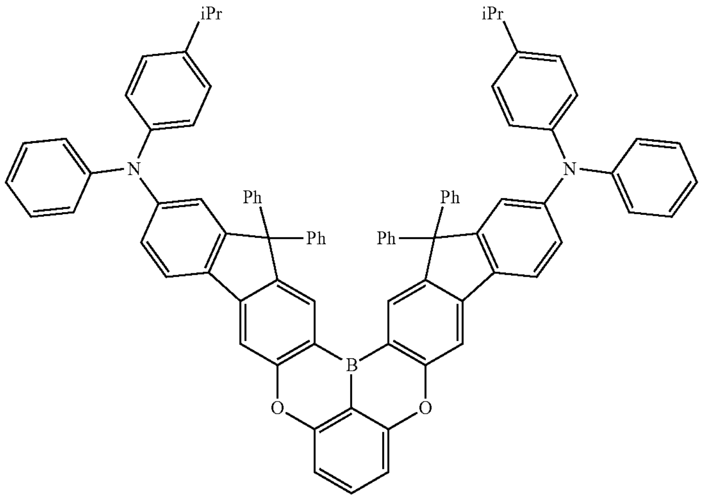
(1B-25)
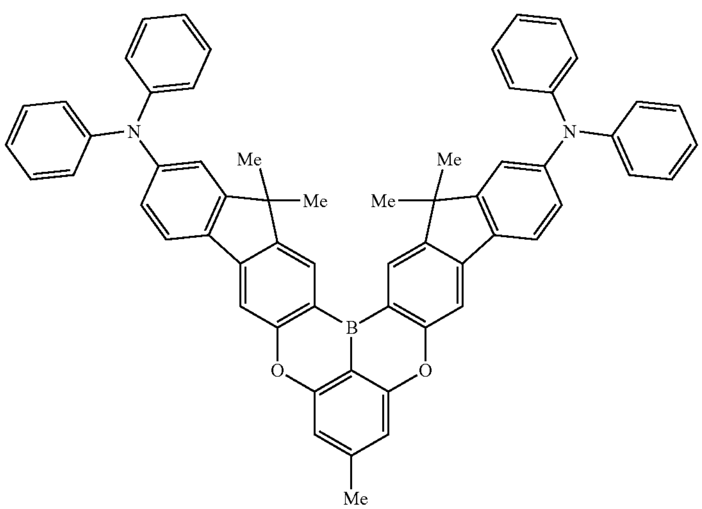
(1B-26)
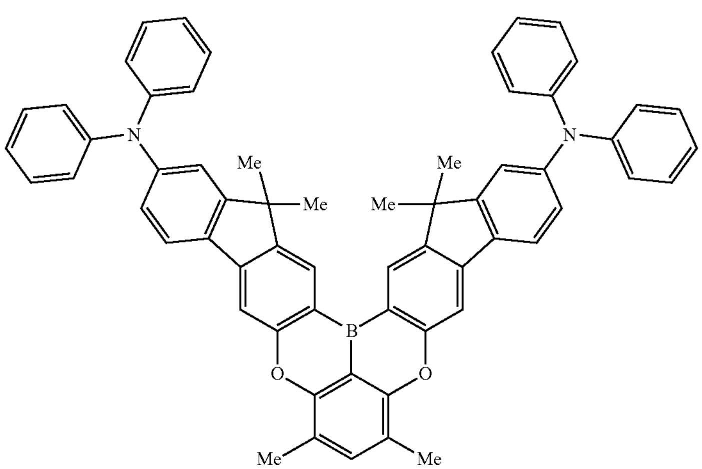

-continued
(1B-27)
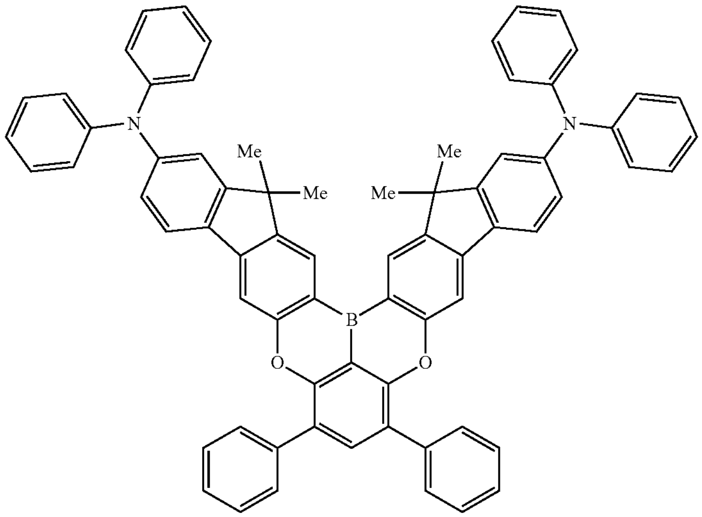
(1B-28)
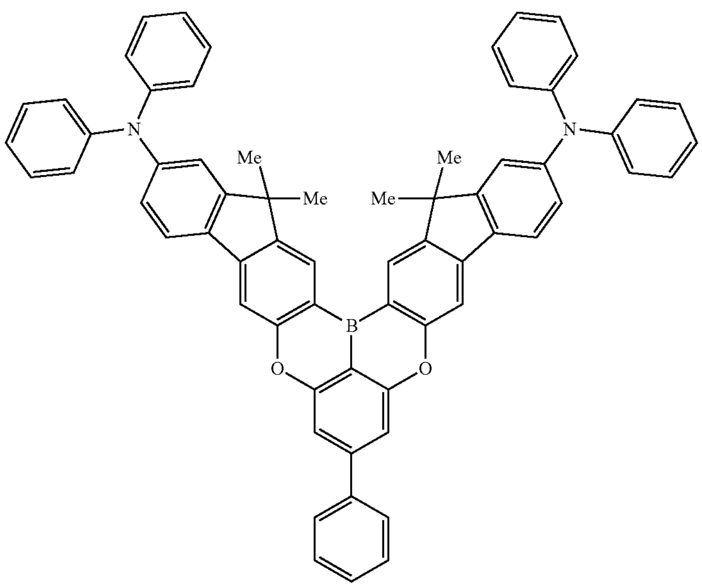
(1B-51)
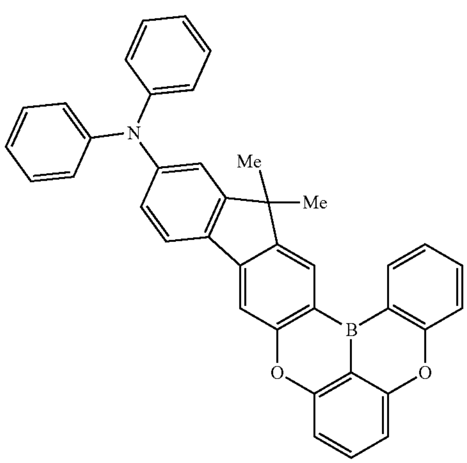

-continued
(1B-52)
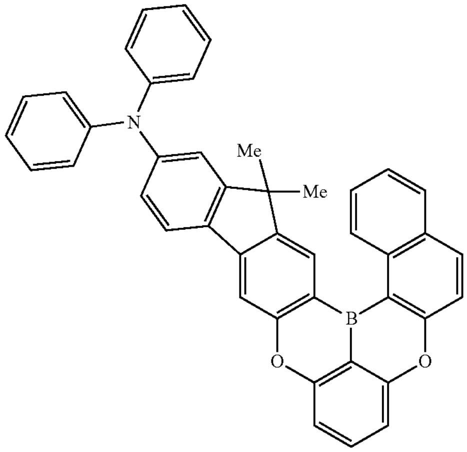
(1B-53)
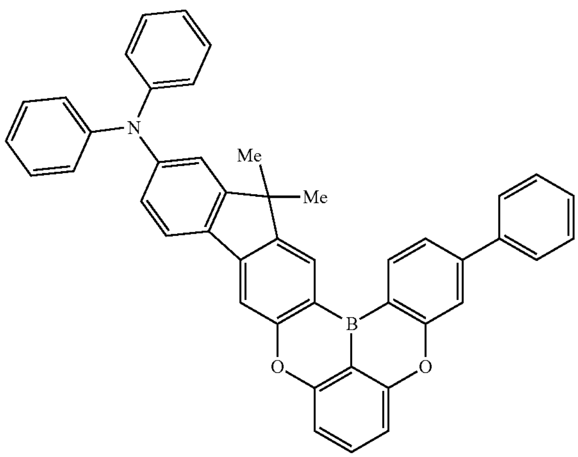
(1B-54)
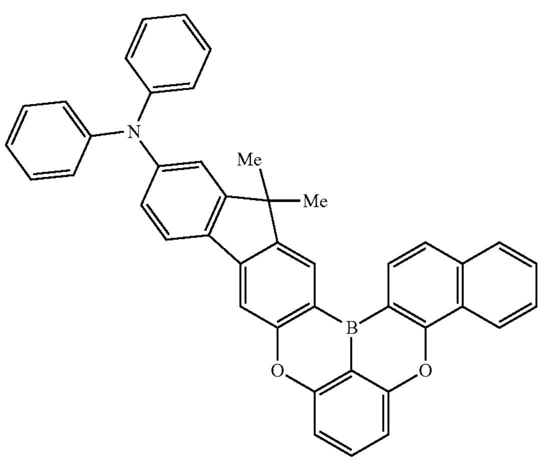

-continued
(1B-55)
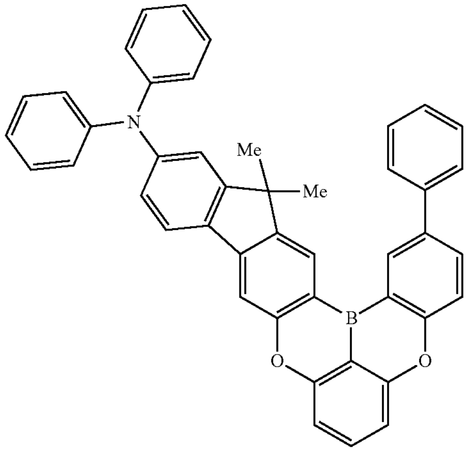
(1B-56)
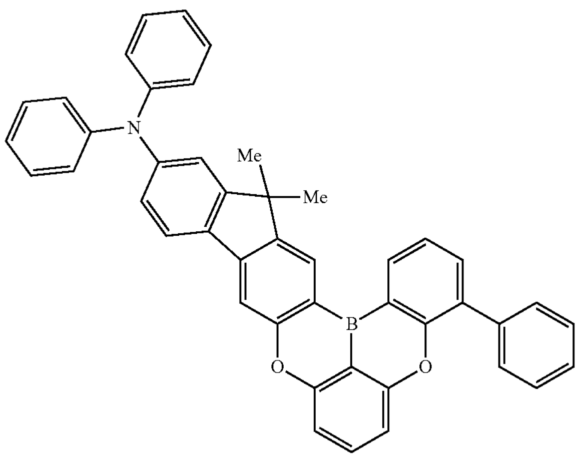
(1B-57)
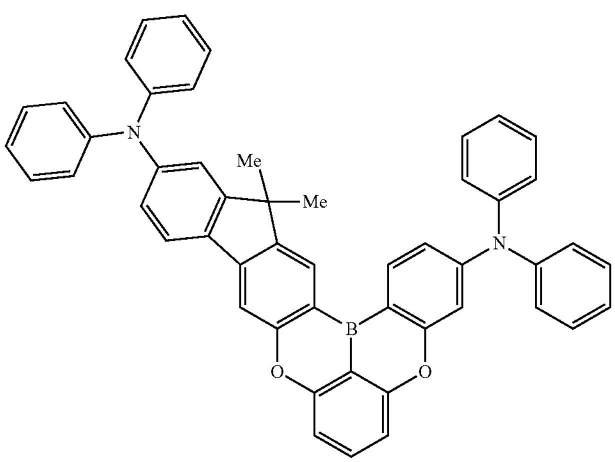

-continued
(1B-58)
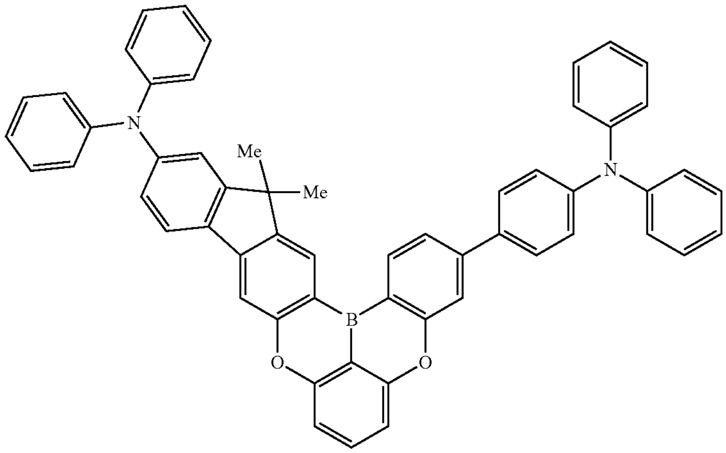
(1B-59)
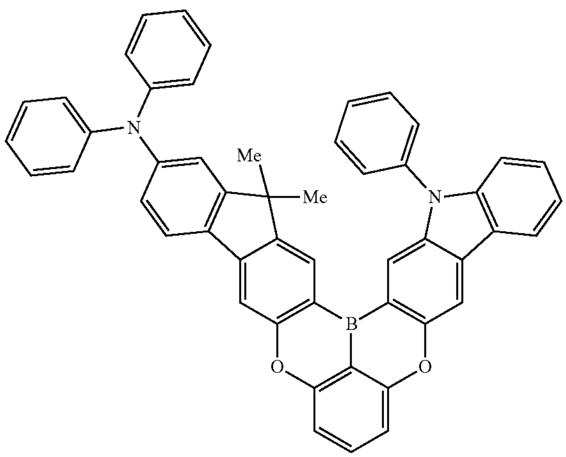
(1B-60)
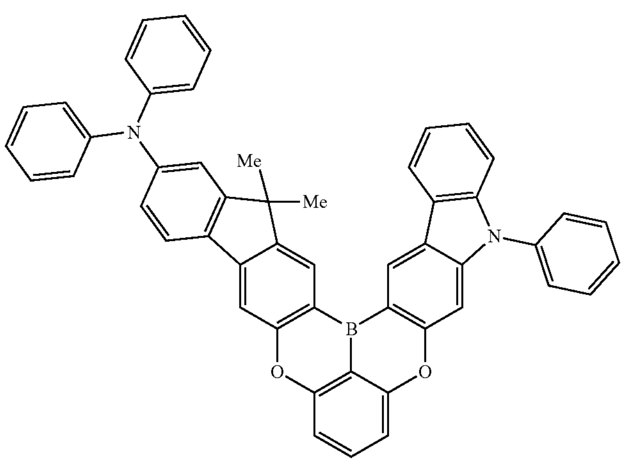

-continued
(1B-61)
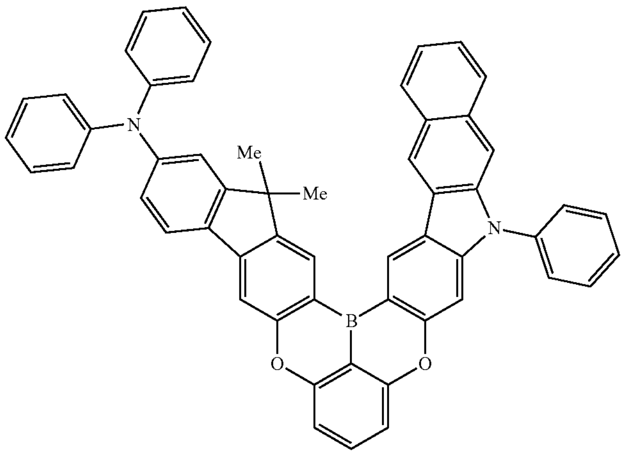
(1B-62)
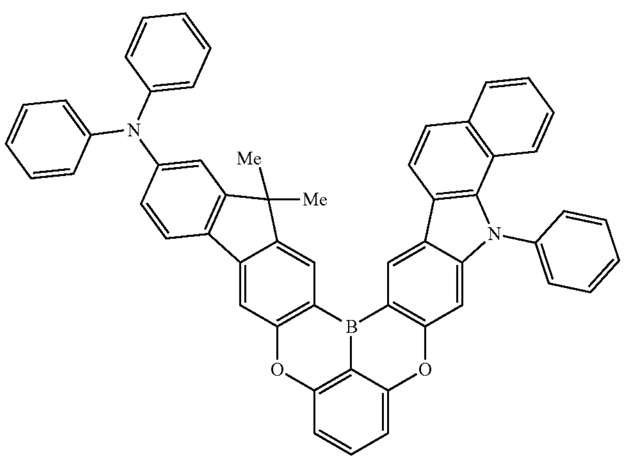
(1B-63)
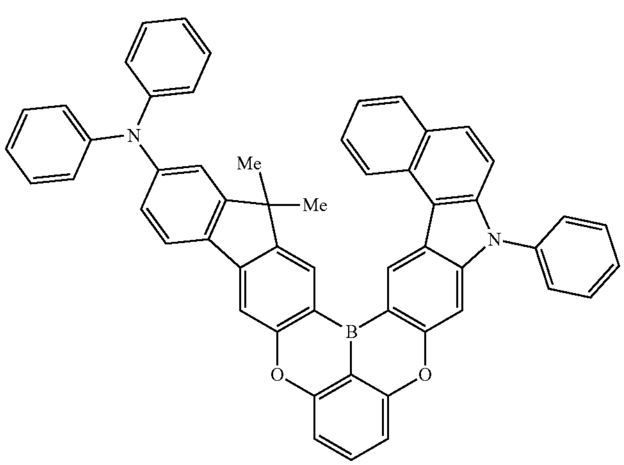

-continued
(1B-64)
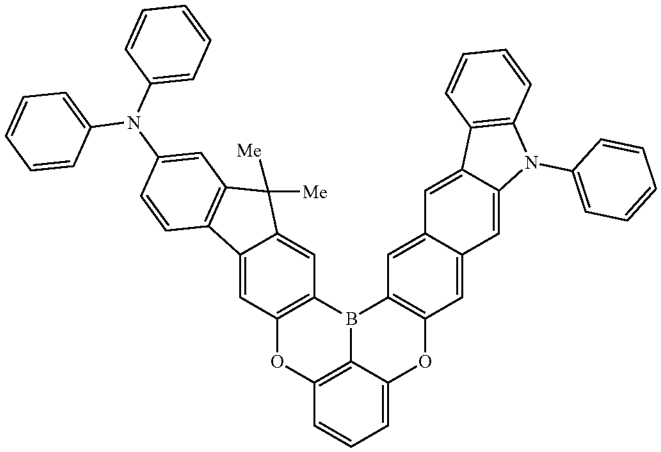
(1B-65)
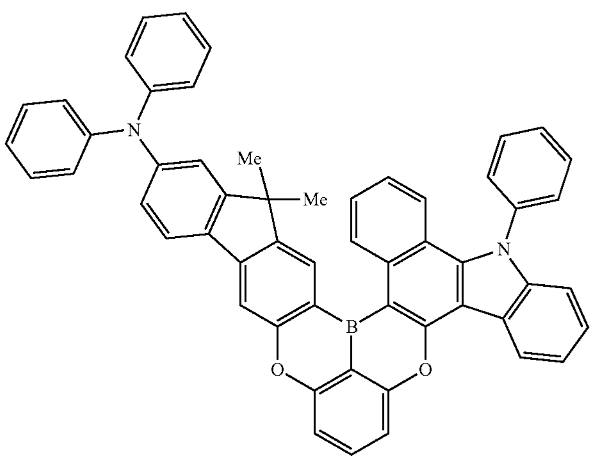
(1B-66)
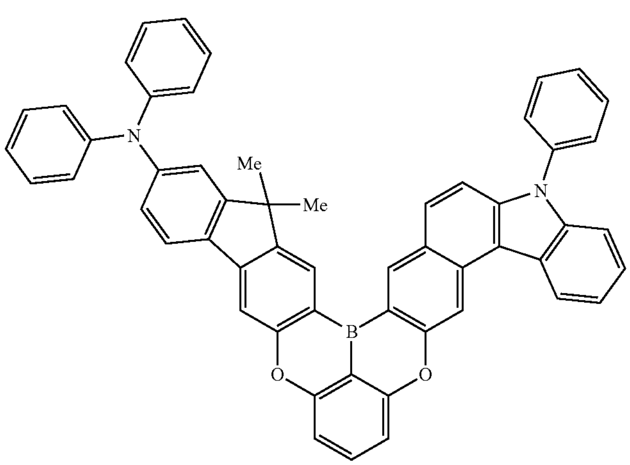

-continued
(1B-101)
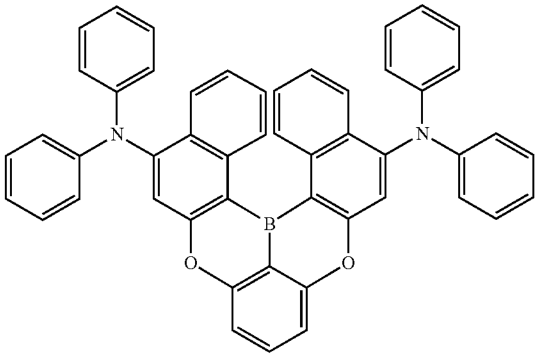
(1B-102)
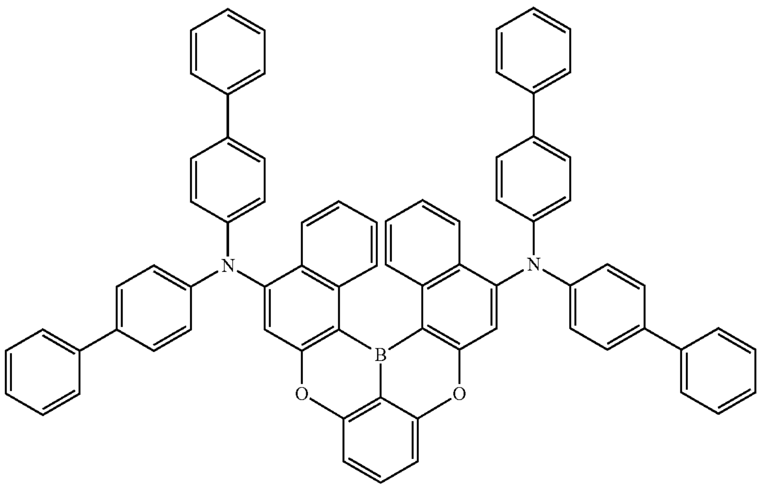
(1B-103)
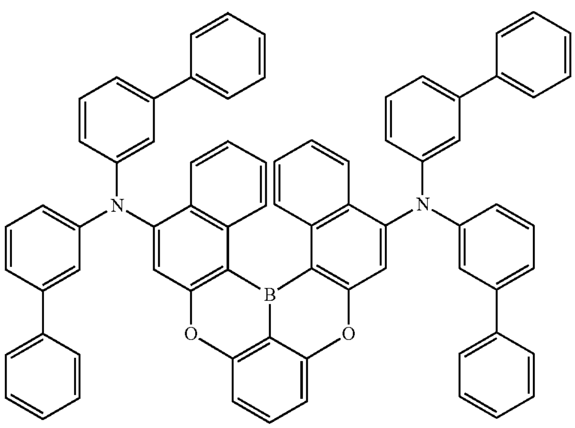
(1B-104)
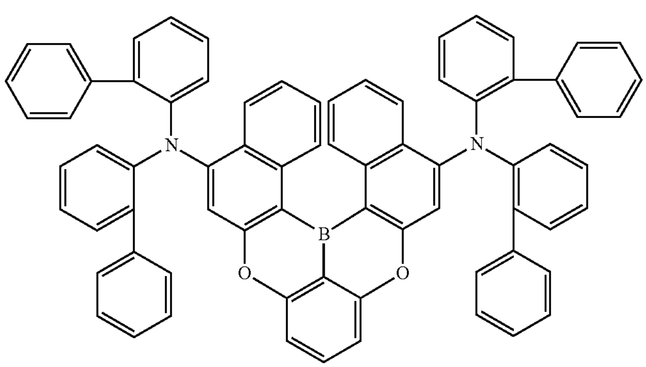

-continued
(1B-105)
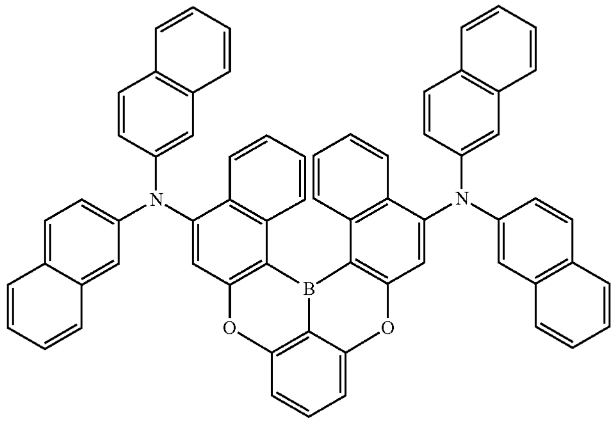
(1B-106)
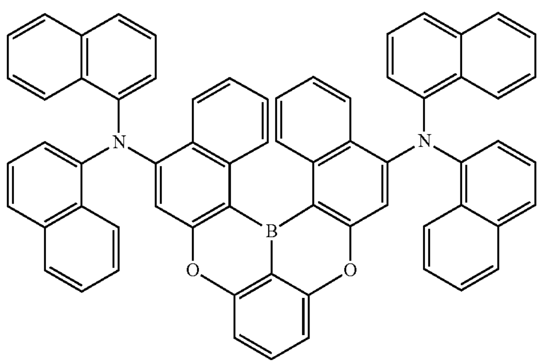
(1B-111)
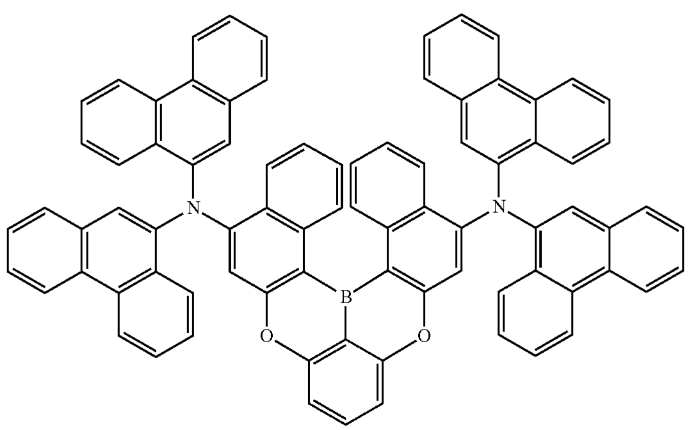

-continued
(1B-112)
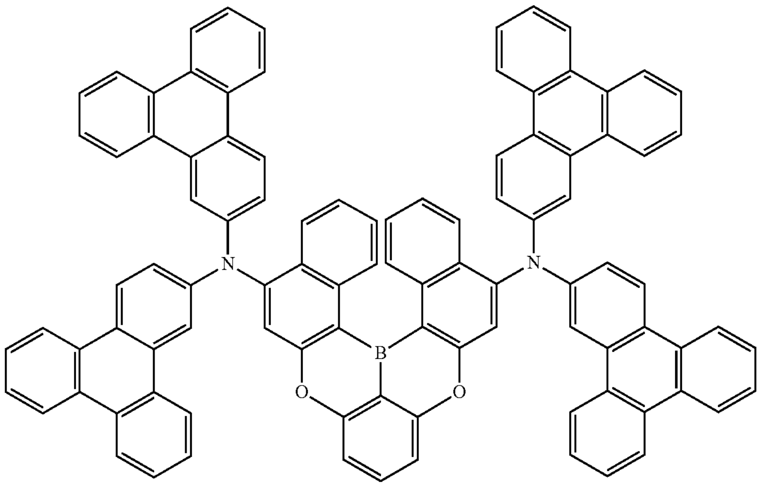
(1B-113)
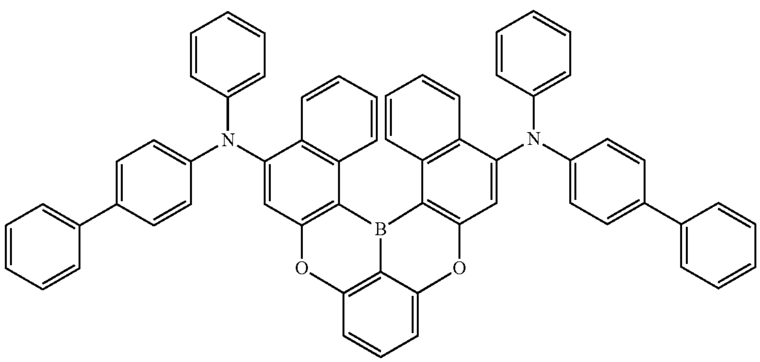
(1B-114)
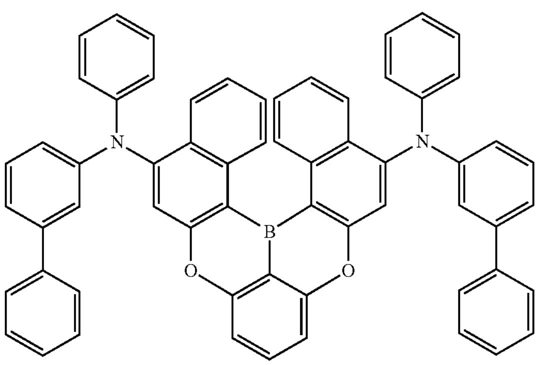
(1B-115)
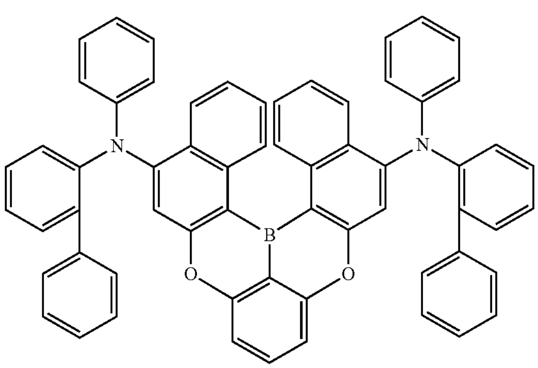

-continued
(1B-116)
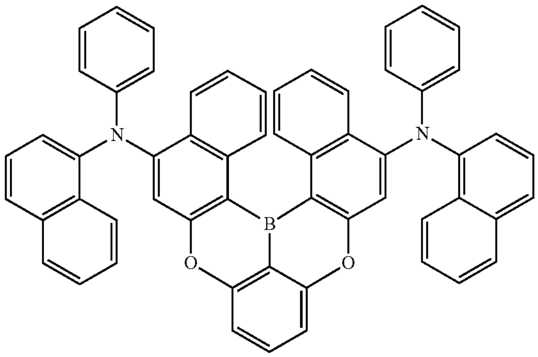
(1B-121)
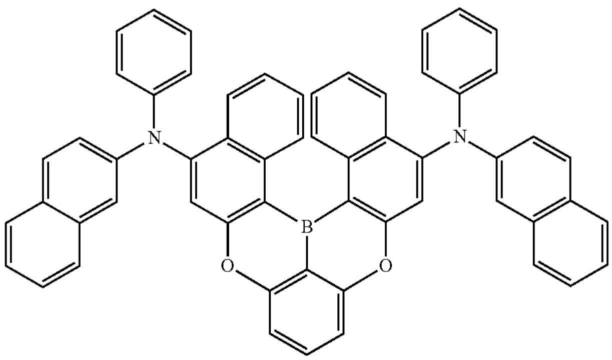
(1B-122)
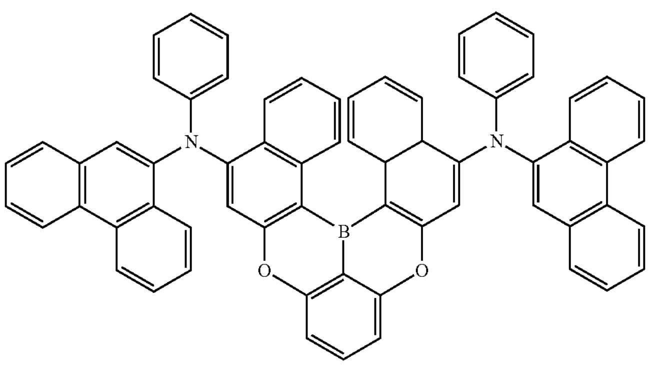
(1B-123)
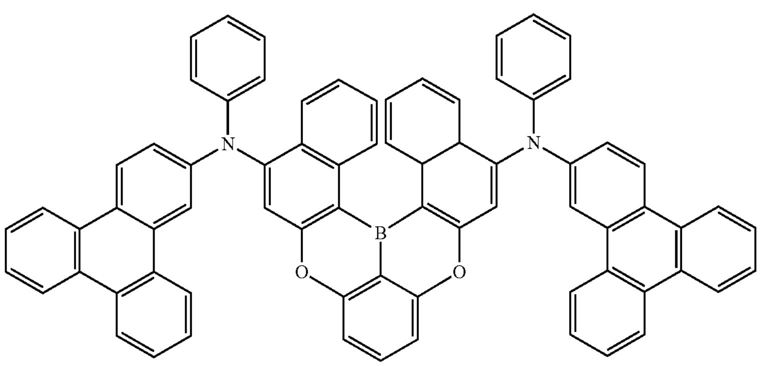

-continued
(1B-124)
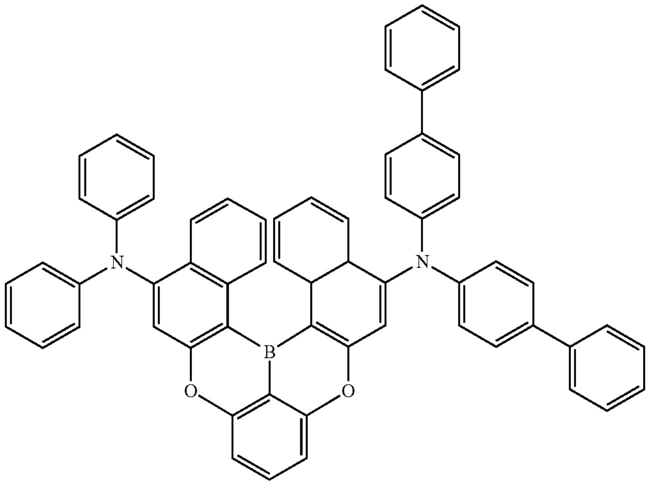
(1B-125)
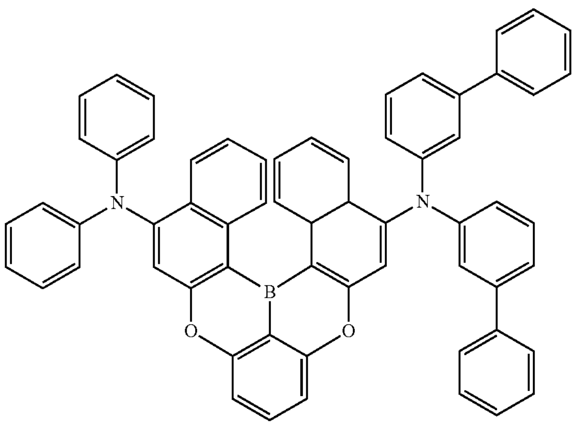
(1B-126)
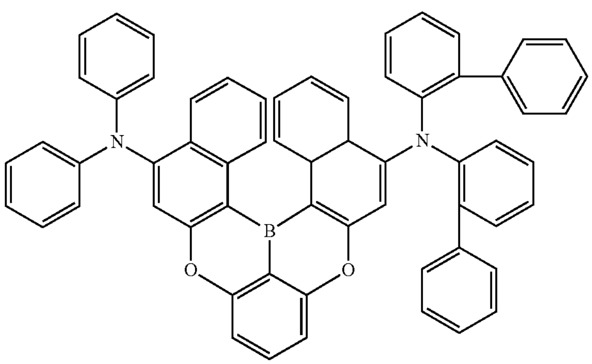
(1B-131)
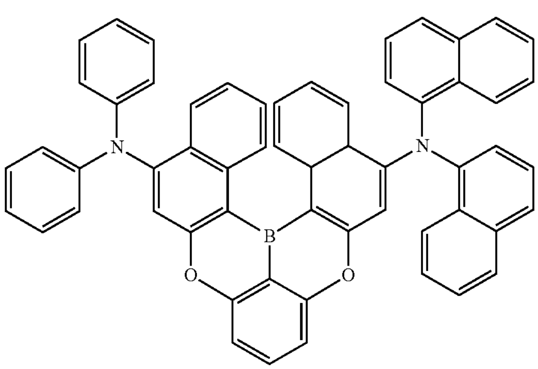

-continued
(1B-132)
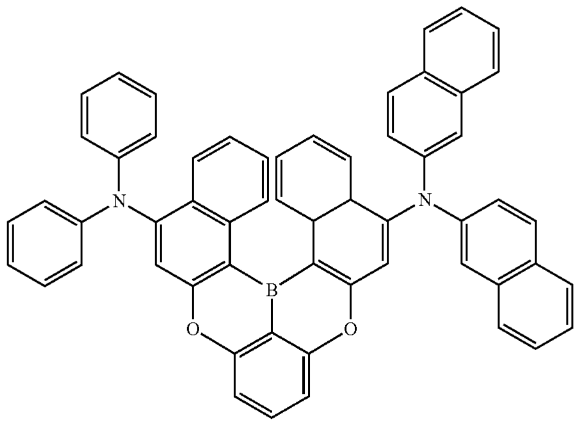
(1B-133)
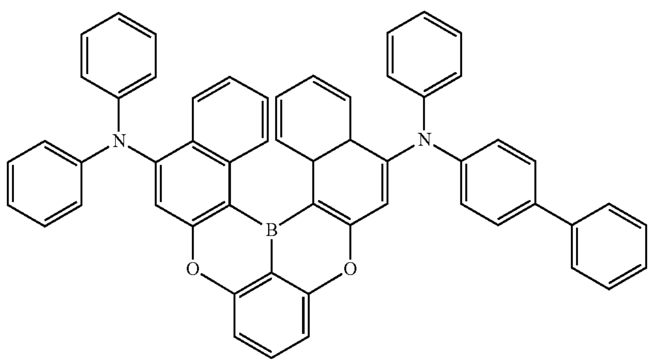
(1B-134)
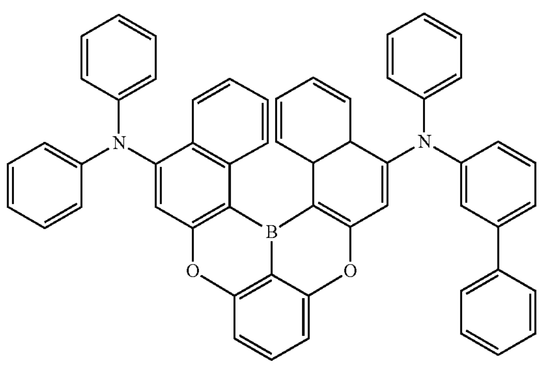
(1B-135)
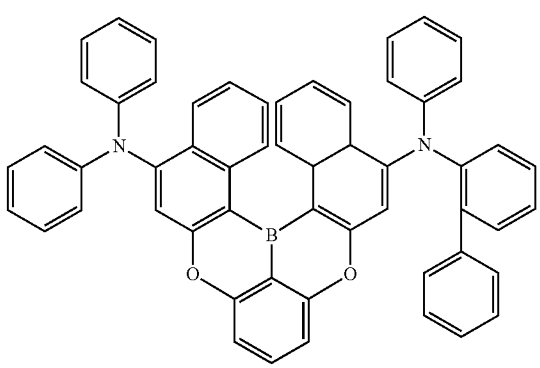

-continued
(1B-136)
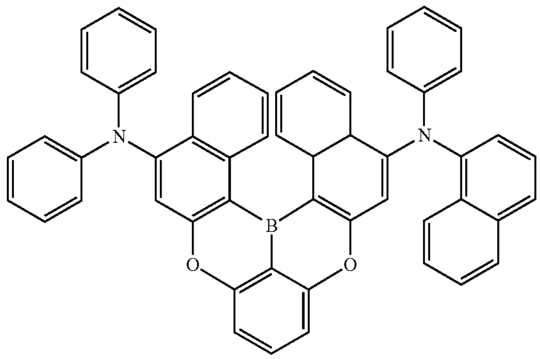
(1B-141)
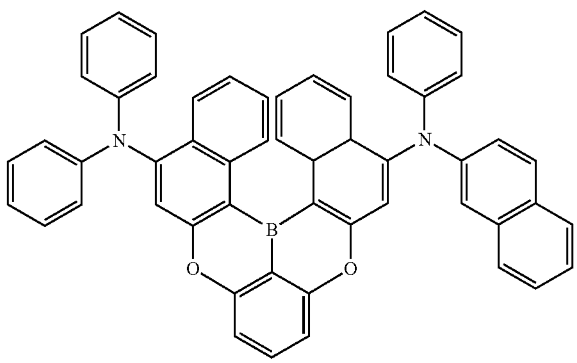
(1B-142)
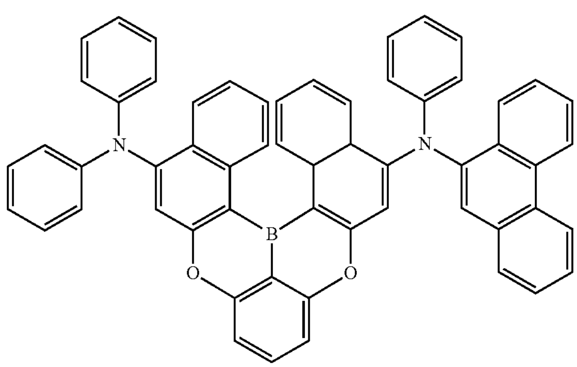
(1B-143)
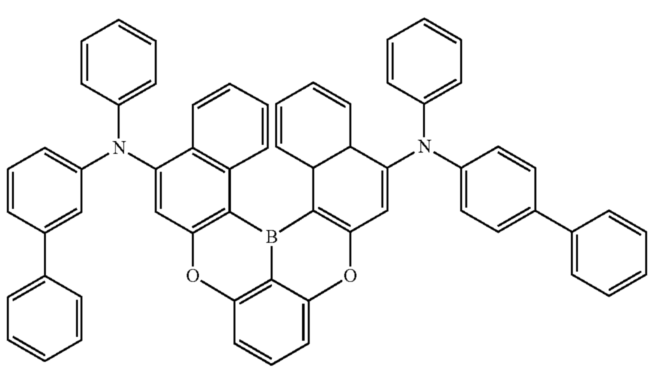

-continued
(1B-144)
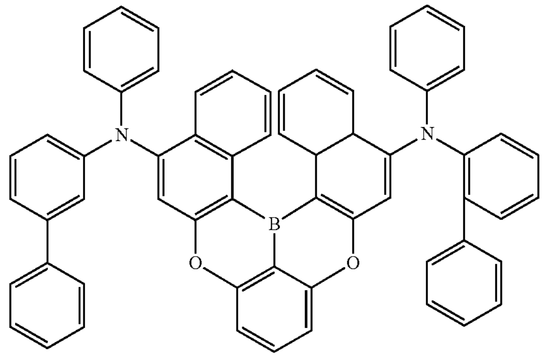
(1B-145)
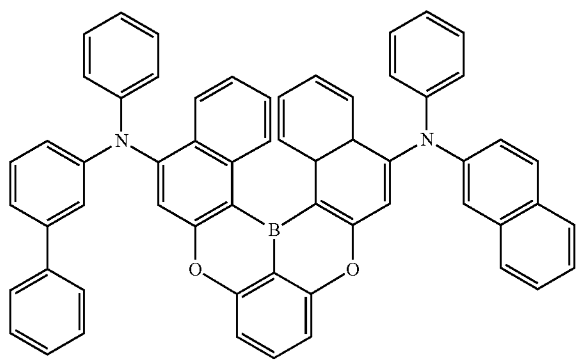
(1B-146)
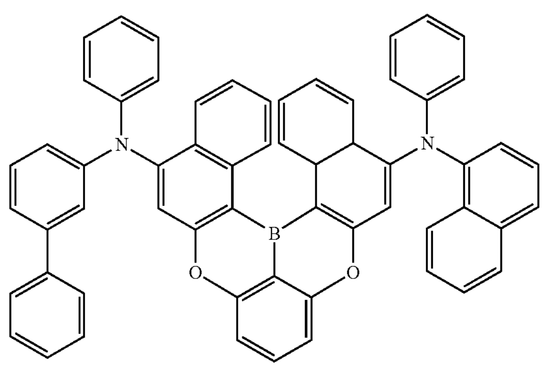
(1B-151)
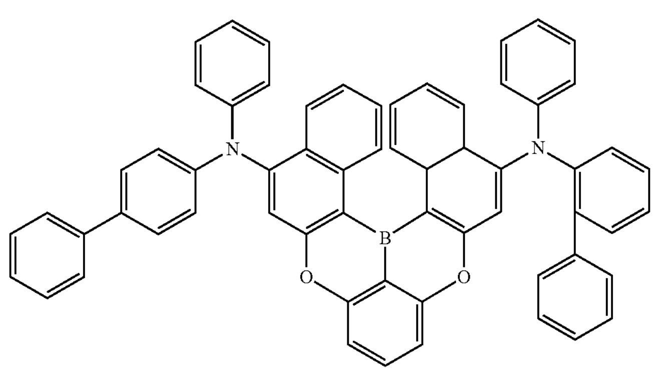

-continued
(1B-152)
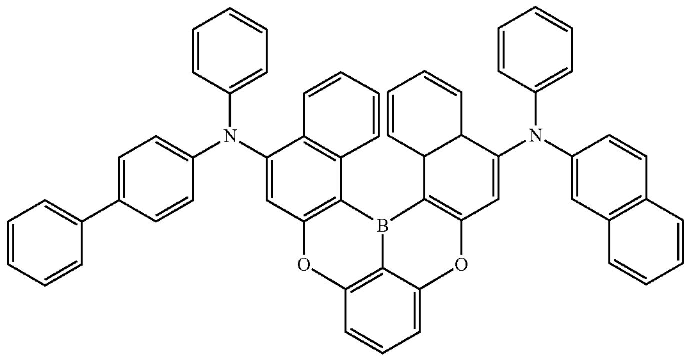
(1B-153)
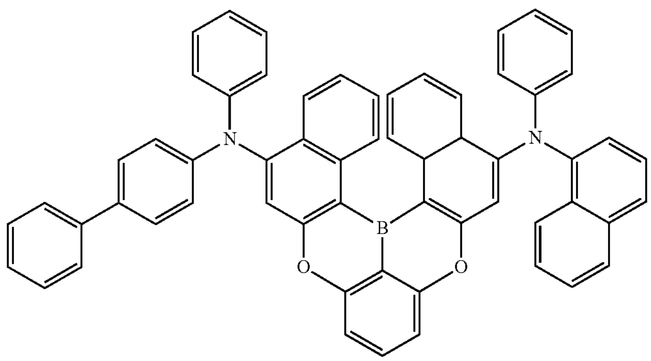
(1B-154)
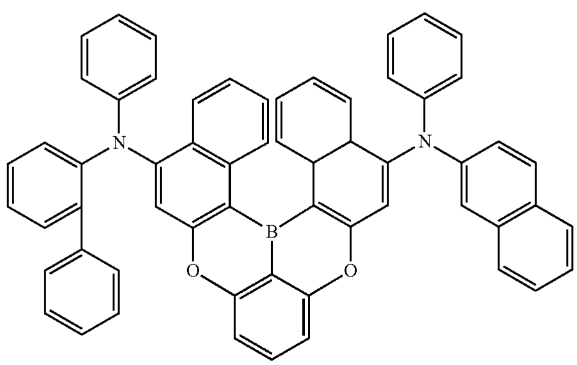
(1B-155)
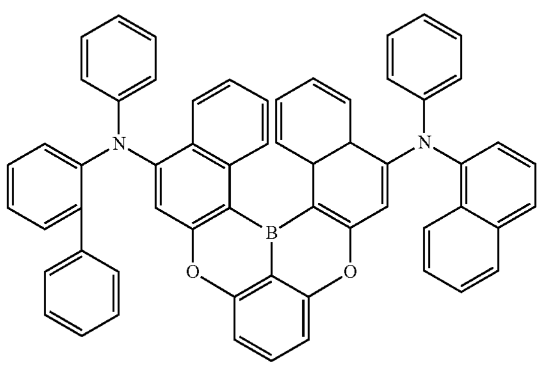

-continued
(1B-156)
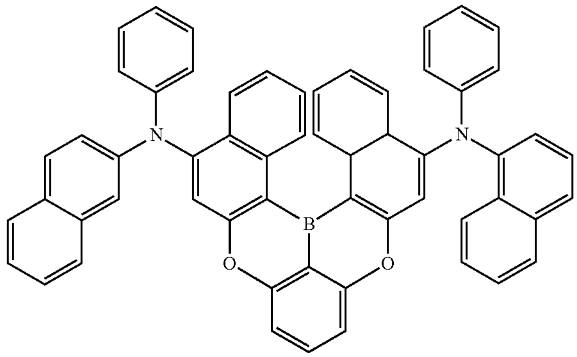
(1B-161)
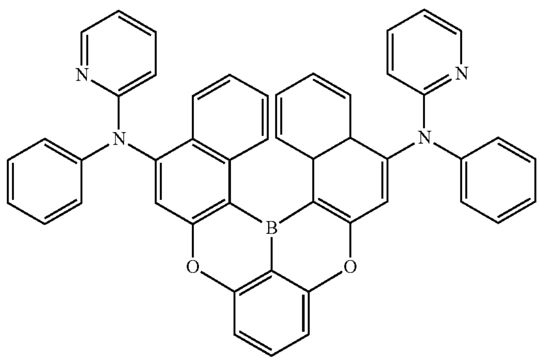
(1B-162)
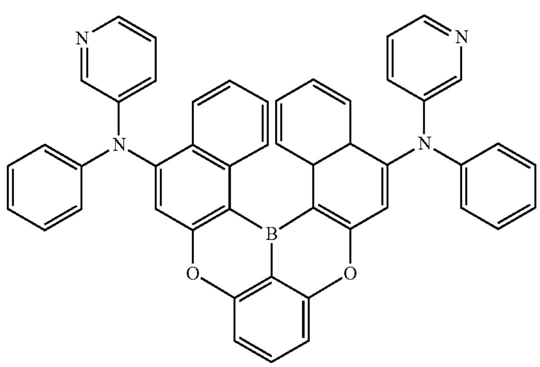
(1B-163)
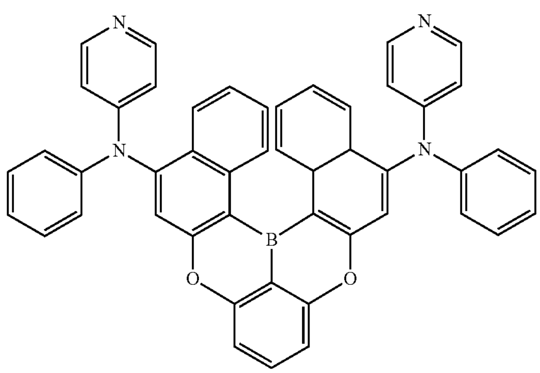

-continued
(1B-164)
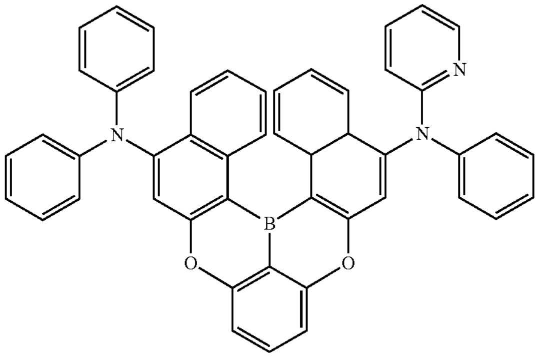
(1B-165)
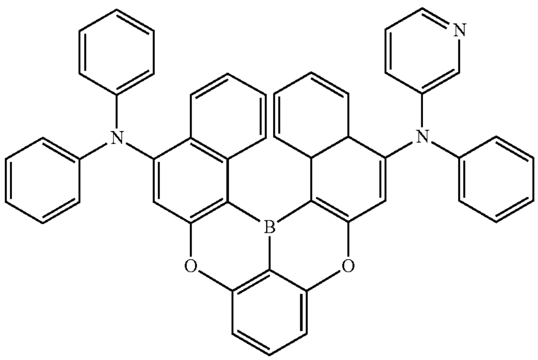
(1B-166)
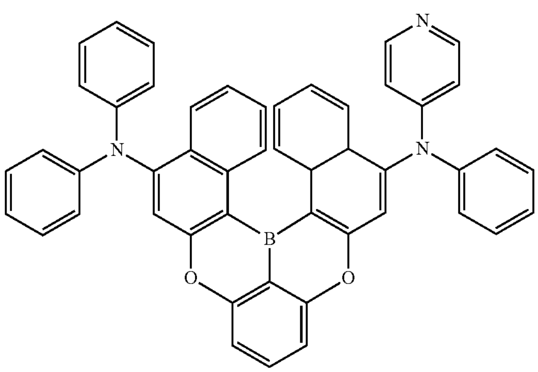
(1B-171)
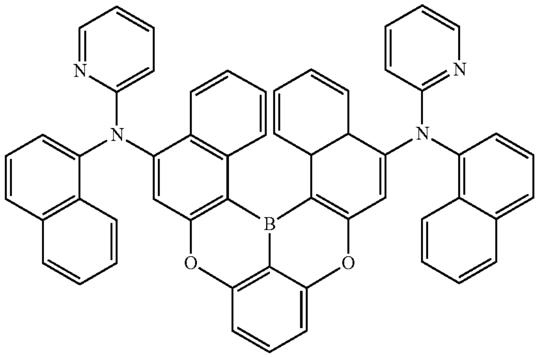

-continued
(1B-172)
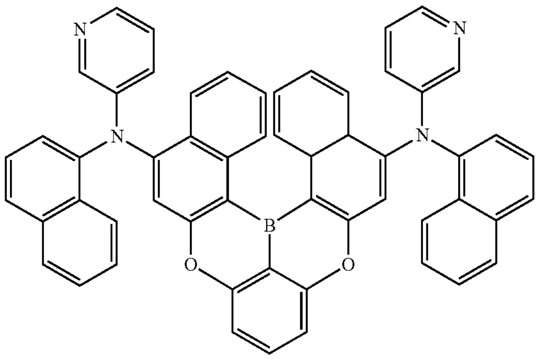
(1B-173)
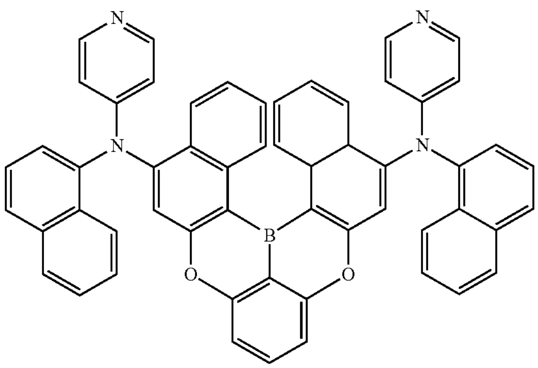
(1B-174)
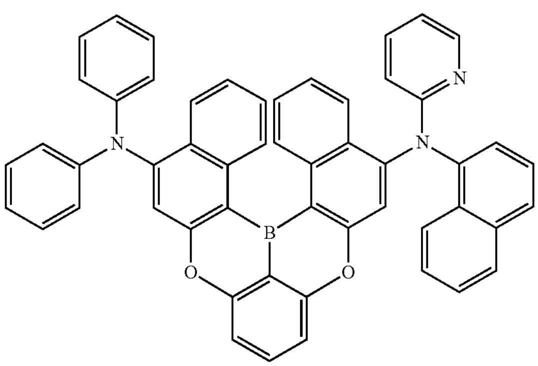
(1B-175)
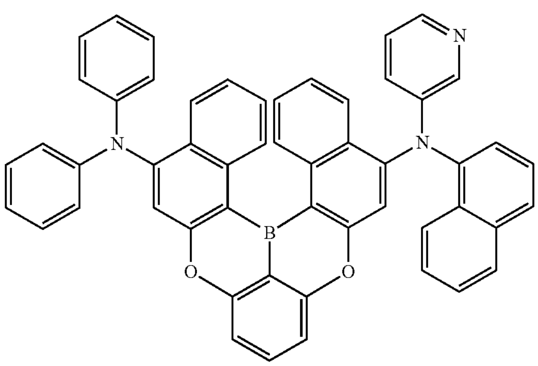

-continued
(1B-176)
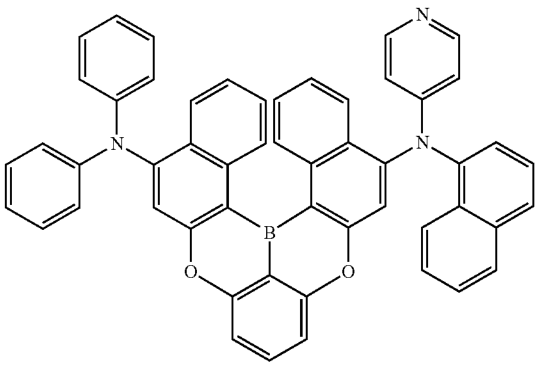
(1B-181)
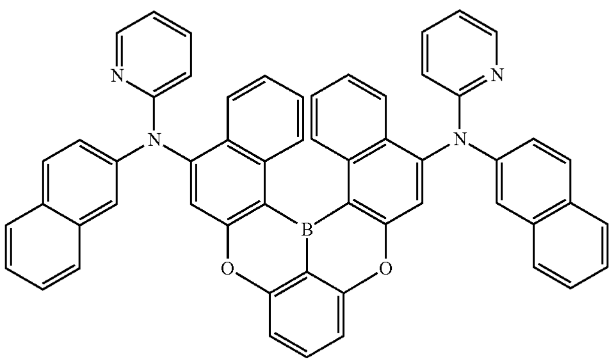
(1B-182)
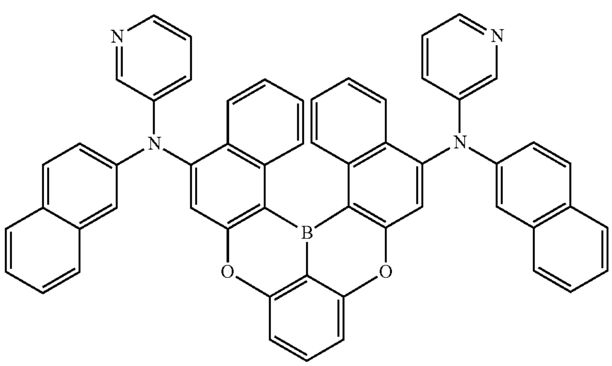
(1B-183)
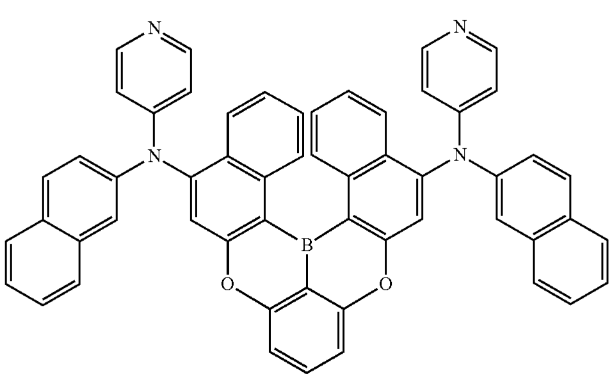

-continued
(1B-184)
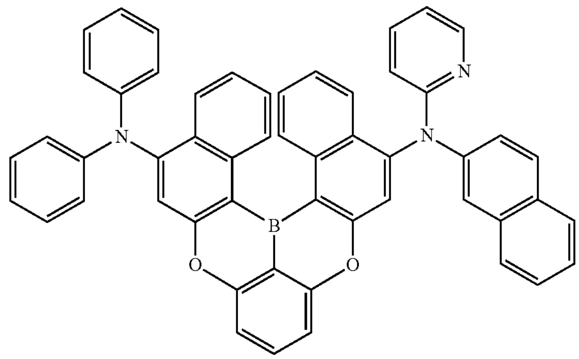
(1B-185)
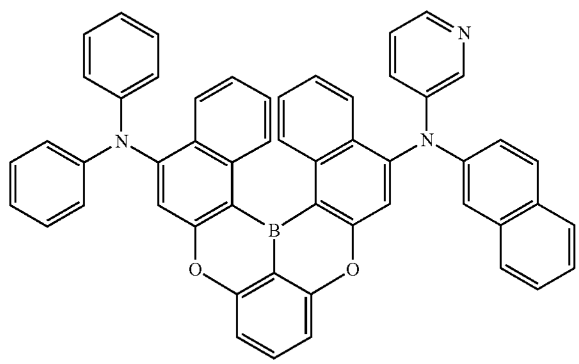
(1B-186)
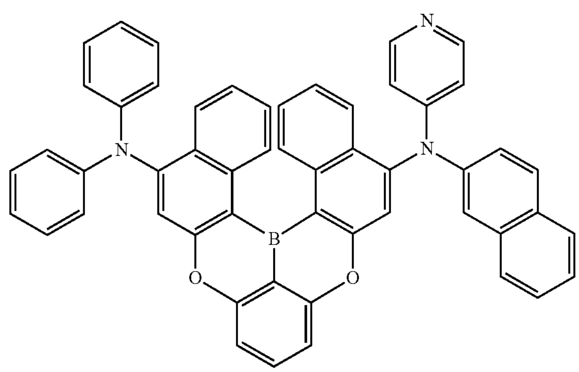
(1B-191)
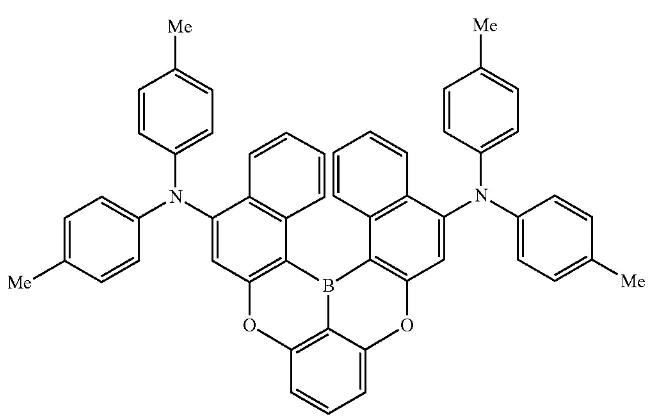

-continued
(1B-192)
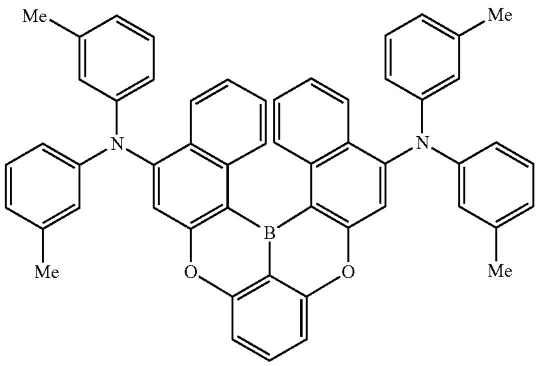
(1B-193)
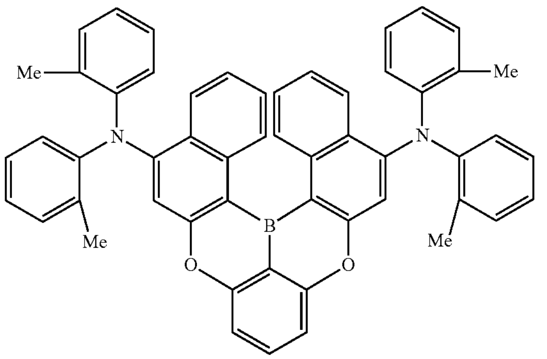
(1B-194)
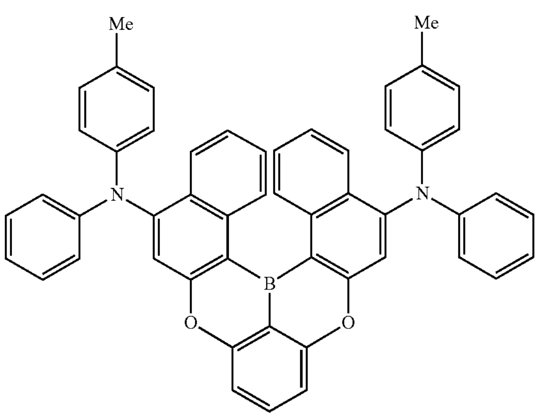
(1B-195)
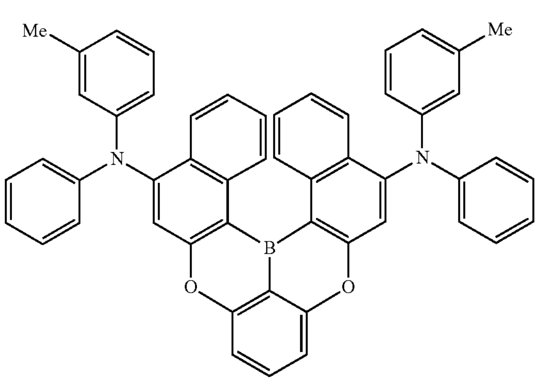

-continued
(1B-196)
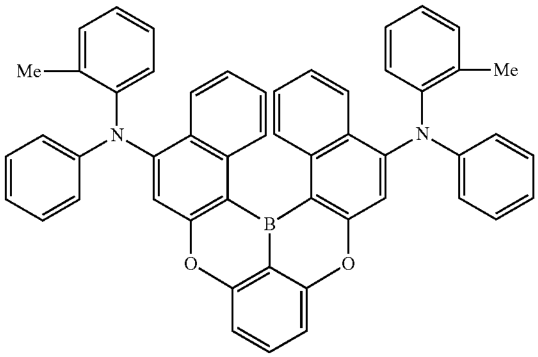
(1B-201)
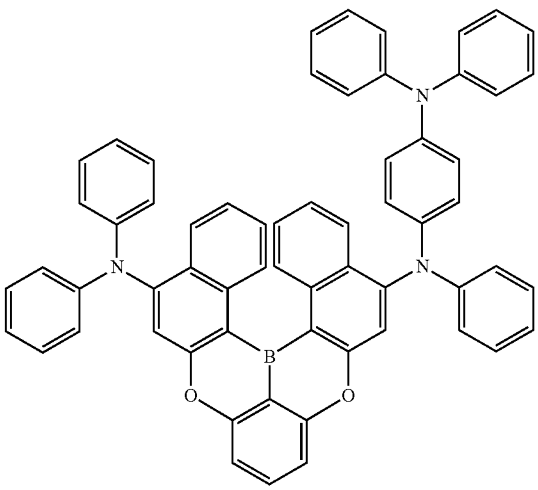
(1B-202)
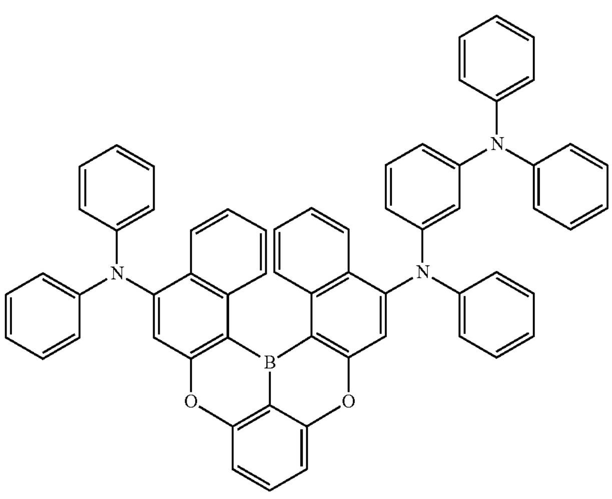

-continued
(1B-203)
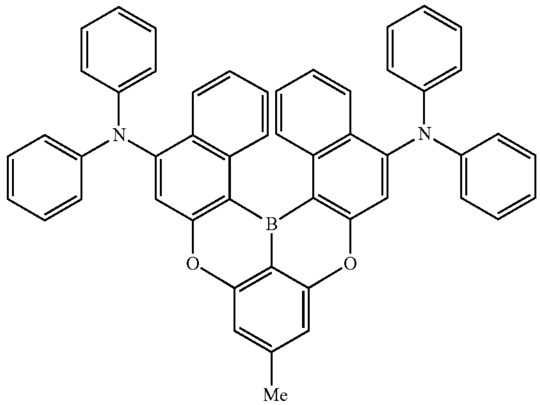
(1B-204)
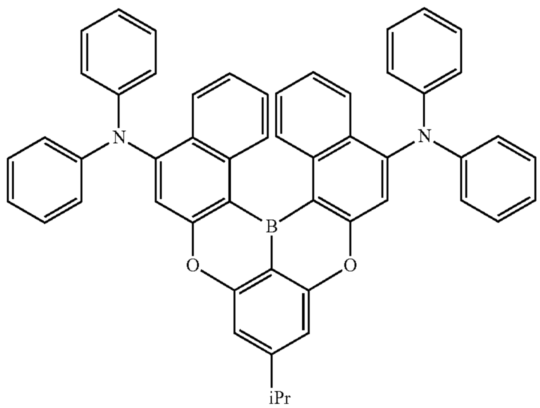
(1B-205)
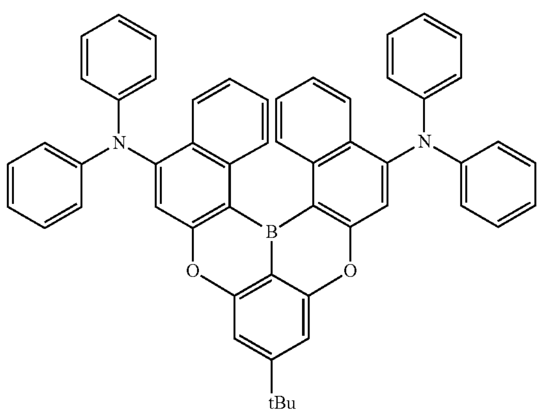
(1B-206)
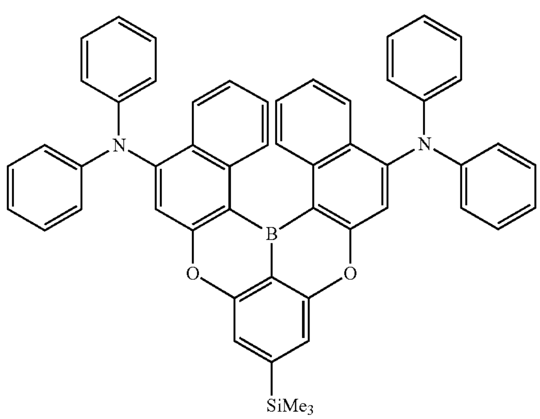

-continued
(1B-211)
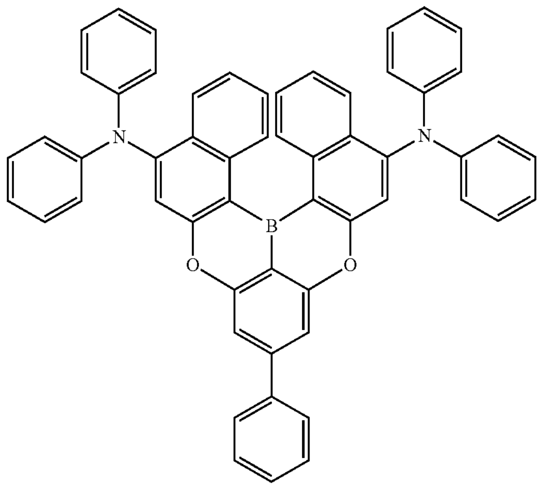
(1B-212)
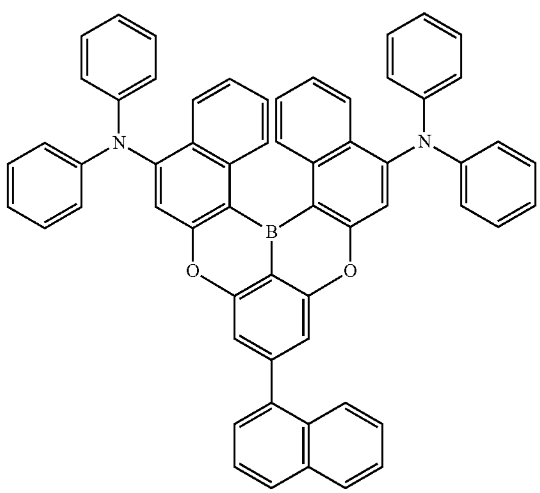
(1B-213)
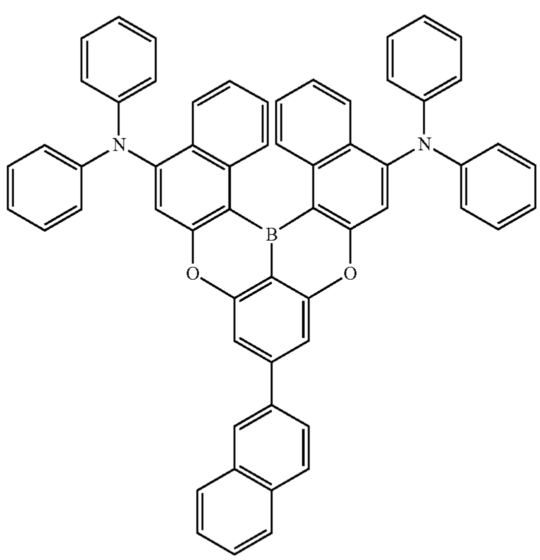

-continued
(1B-214)
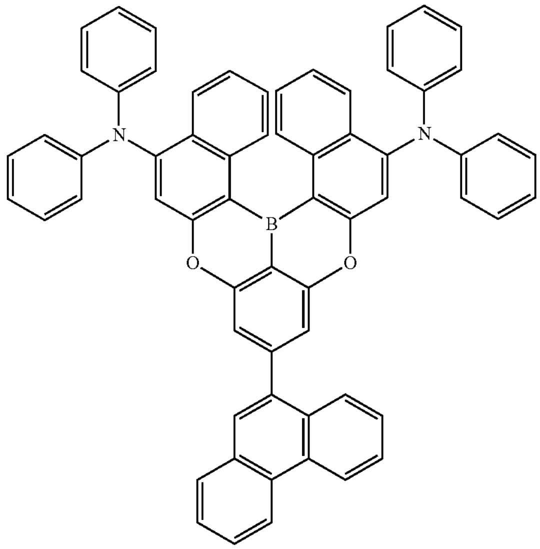
(1B-215)
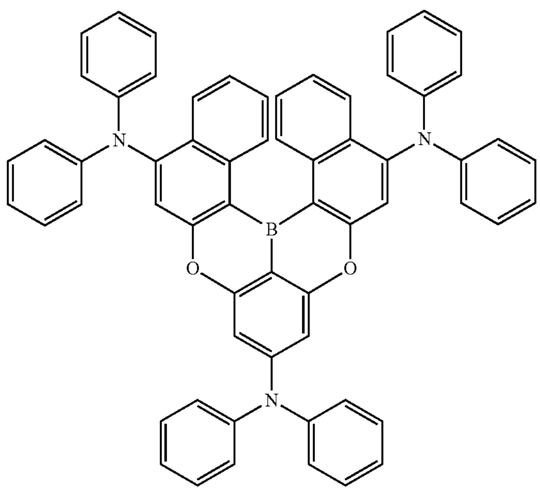
(1B-216)
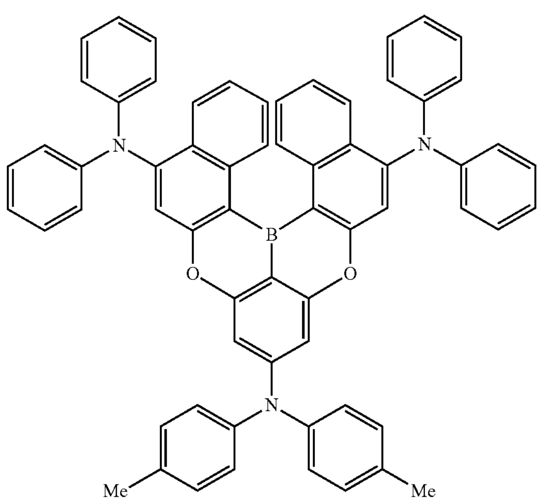

-continued
(1B-221)
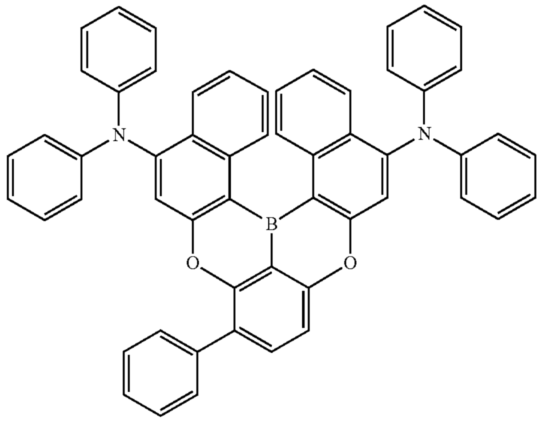
(1B-222)
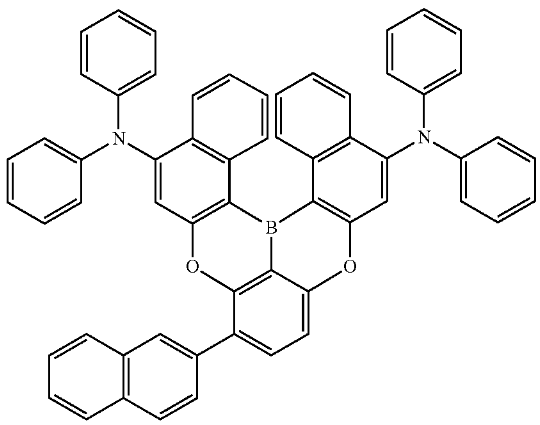
(1B-223)
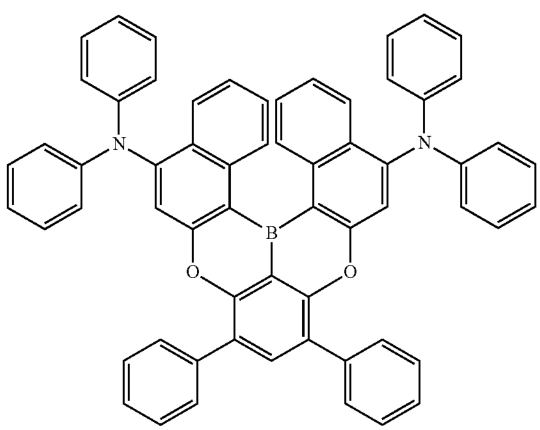
(1B-224)
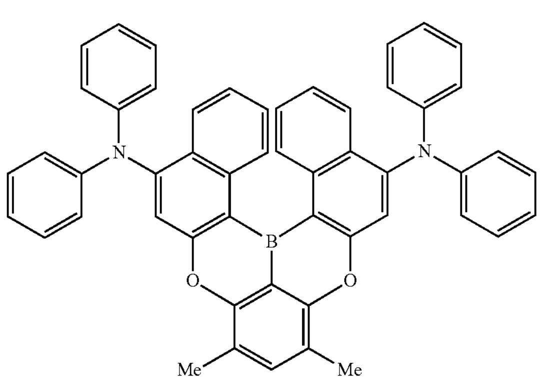

-continued
(1B-225)
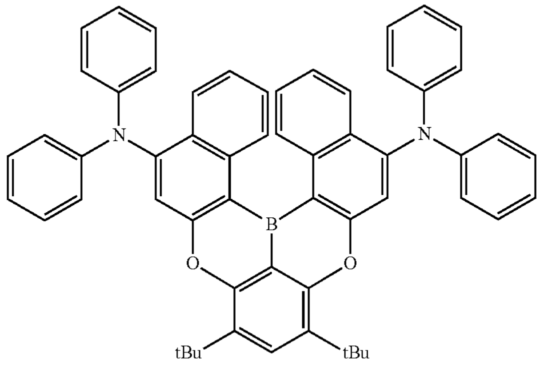
(1B-226)
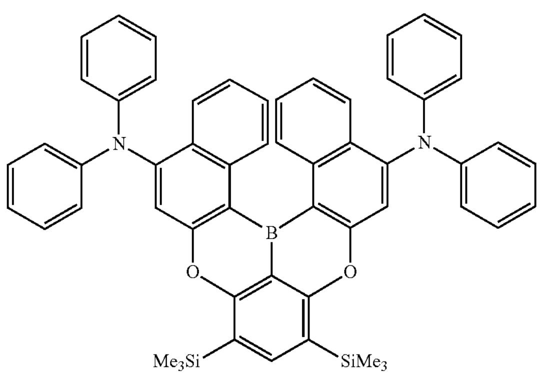
(1B-231)
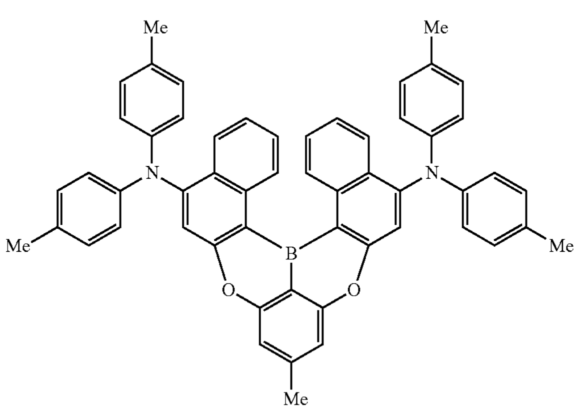
-continued
(1B-232)
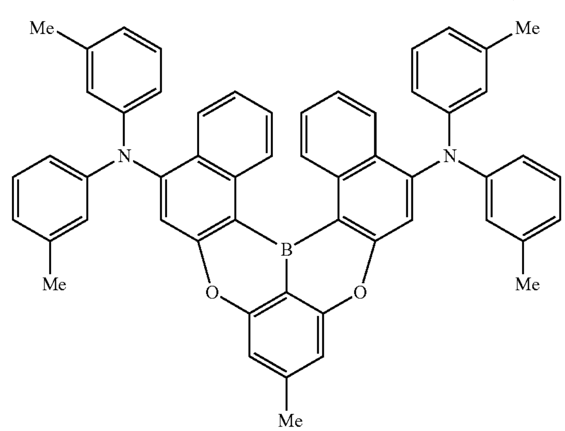

-continued
(1B-233)
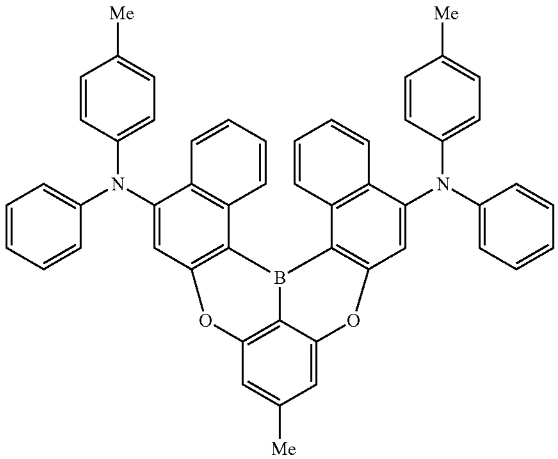
(1B-234)
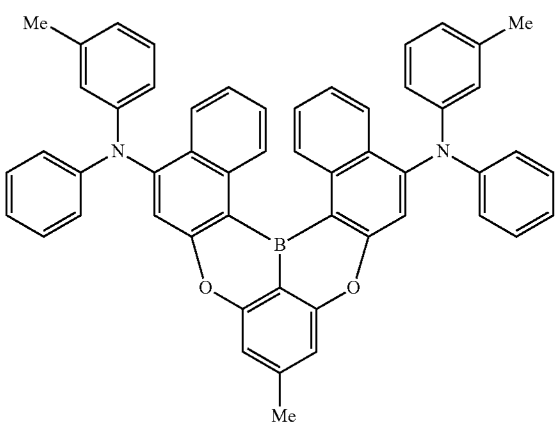
(1B-235)
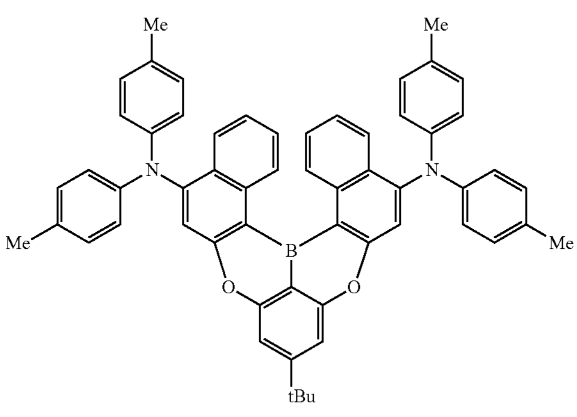
-continued
(1B-236)
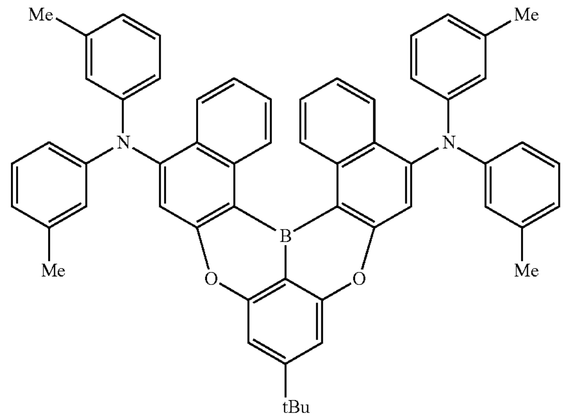
(1B-241)
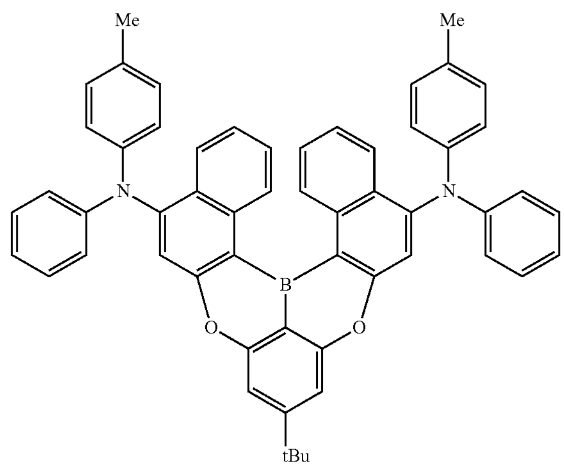
(1B-242)
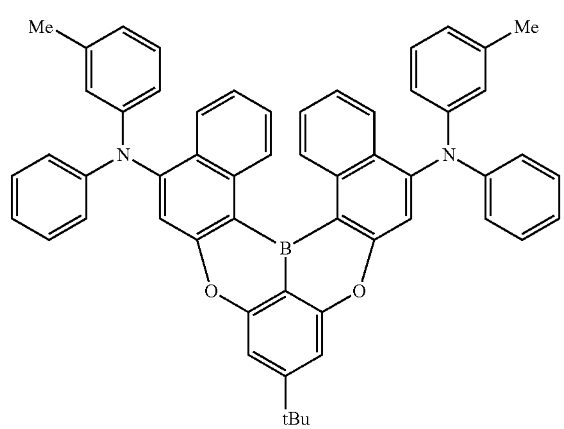

-continued
(1B-243)
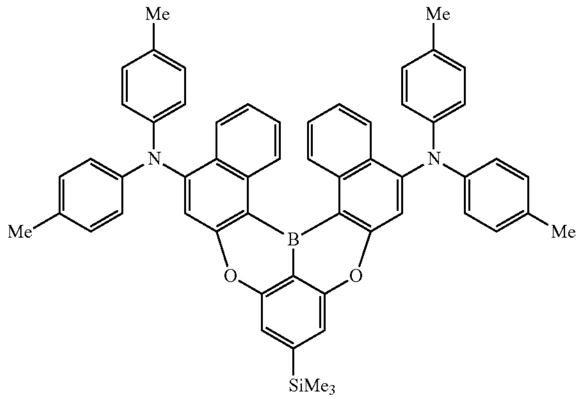
(1B-244)
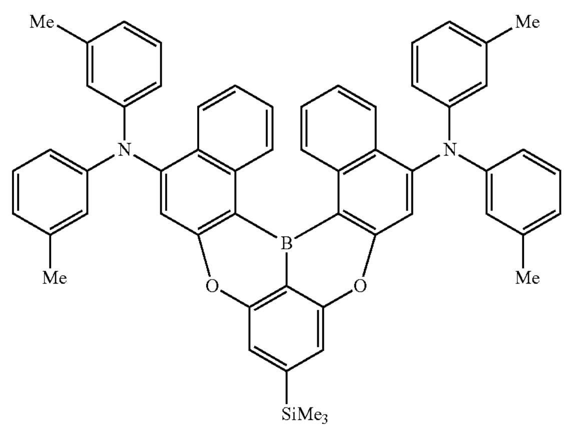
(1B-245)
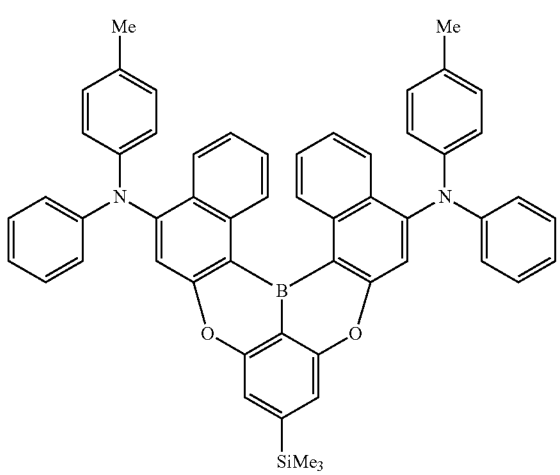
-continued
(1B-246)
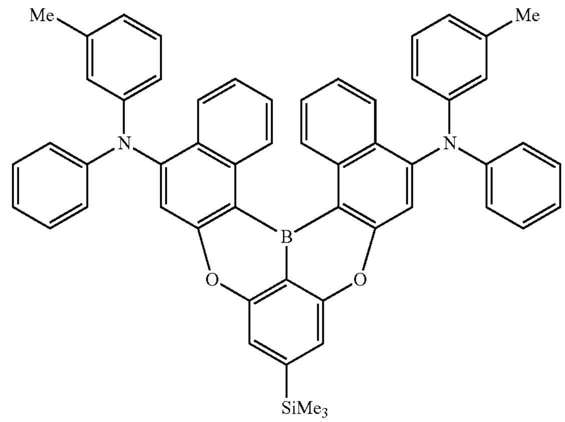
(1B-251)
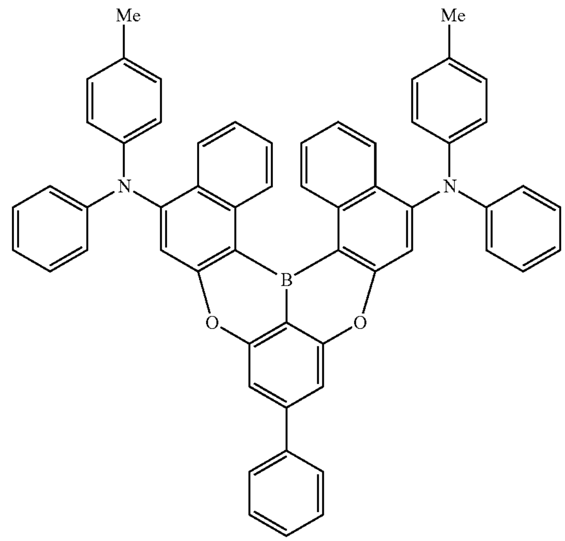
(1B-252)
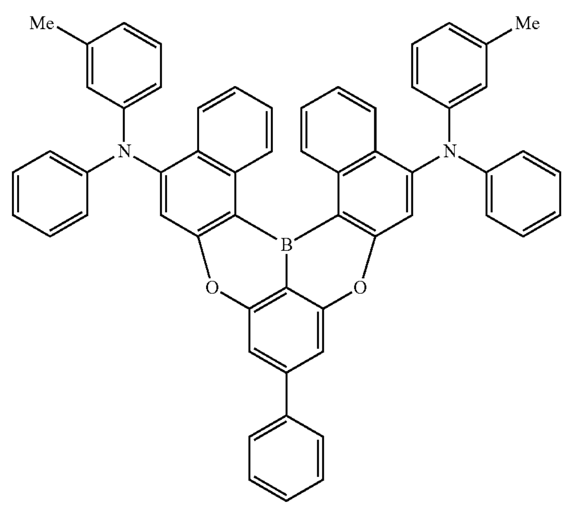

-continued
(1B-253)
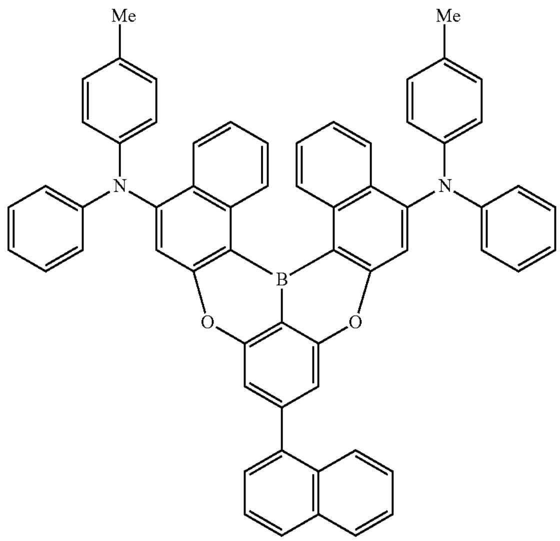
(1B-254)
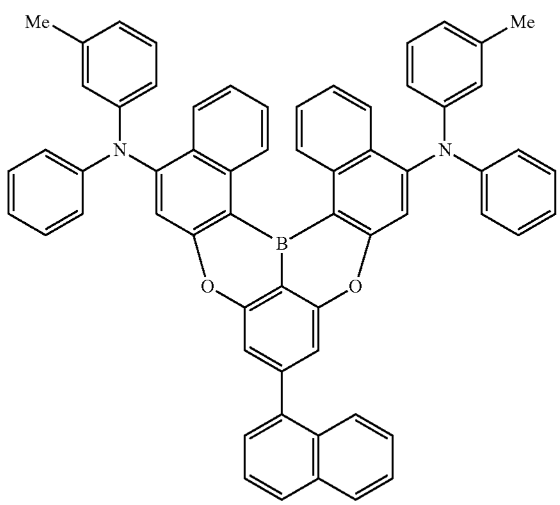
(1B-255)
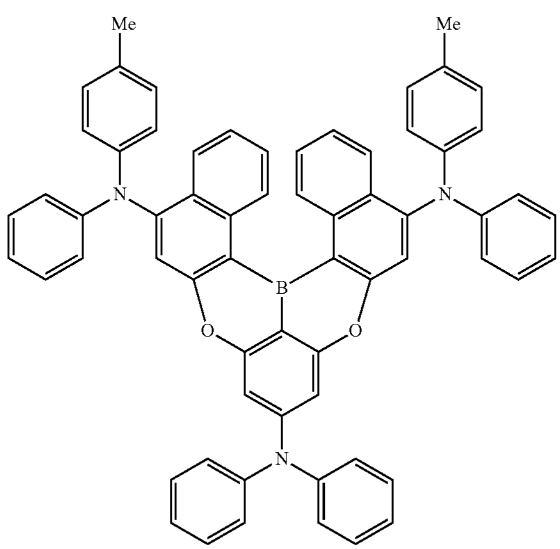
-continued
(1B-256)
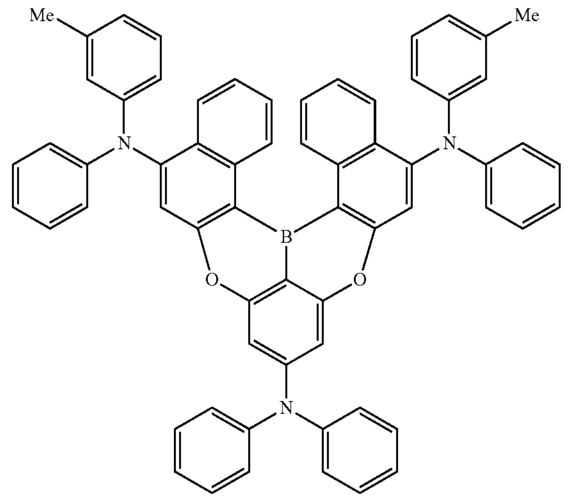
(1B-301)
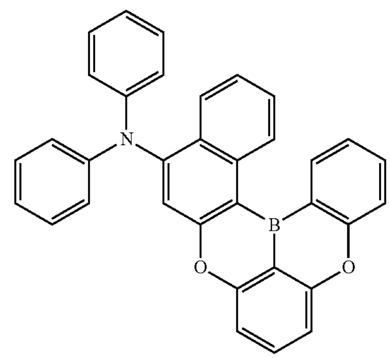
(1B-302)
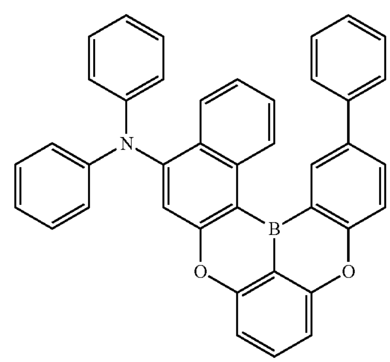
(1B-303)
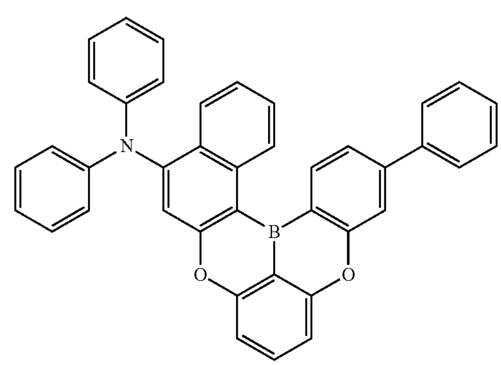

-continued
(1B-304)
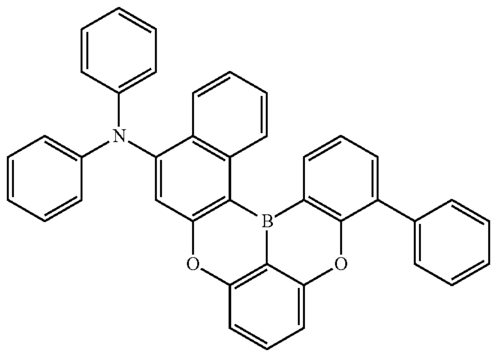
(1B-305)
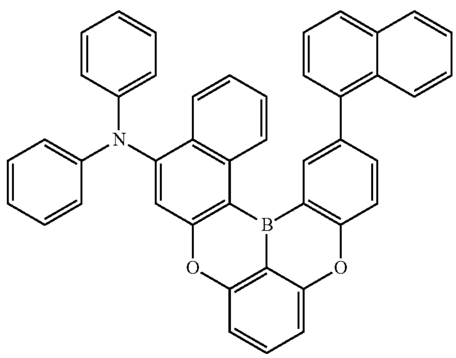
(1B-306)
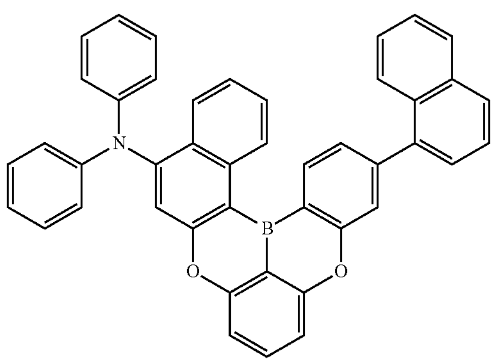
(1B-311)
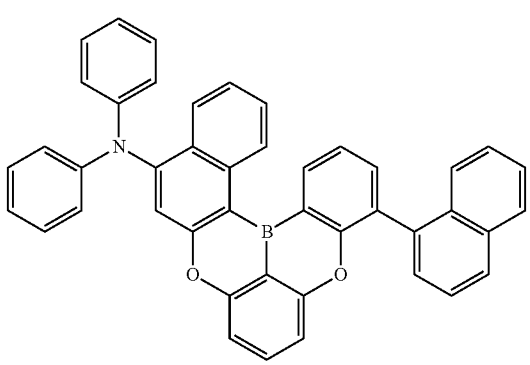
-continued
(1B-312)
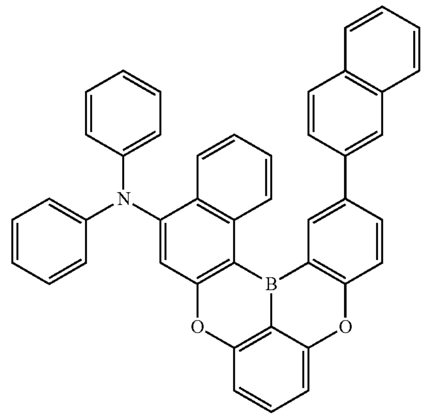
(1B-313)
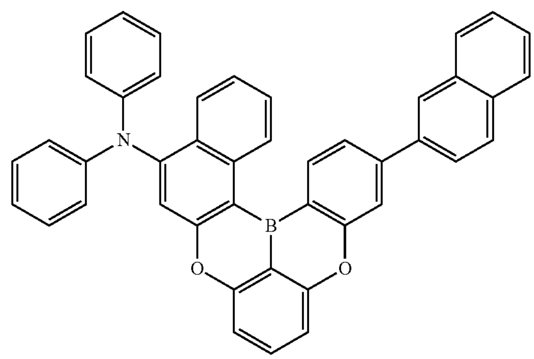
(1B-314)
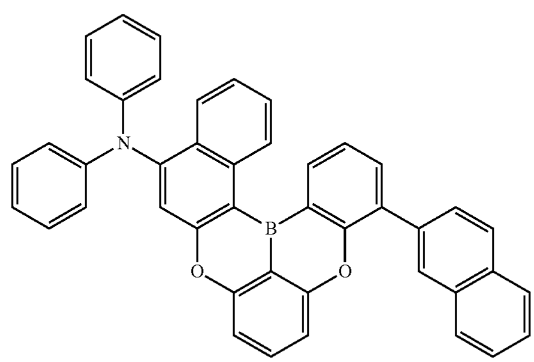
(1B-315)
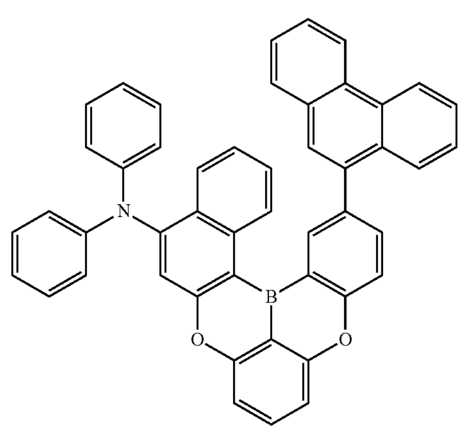

-continued
(1B-316)
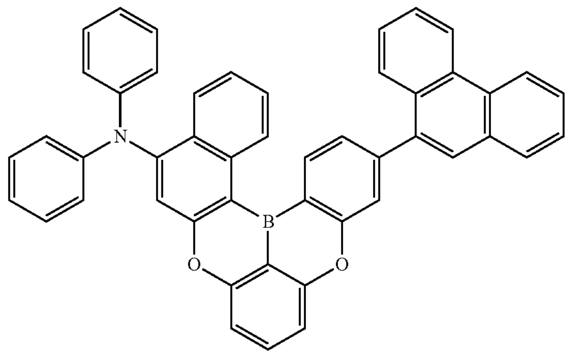
(1B-321)
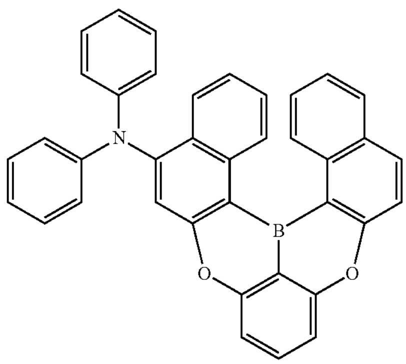
(1B-322)
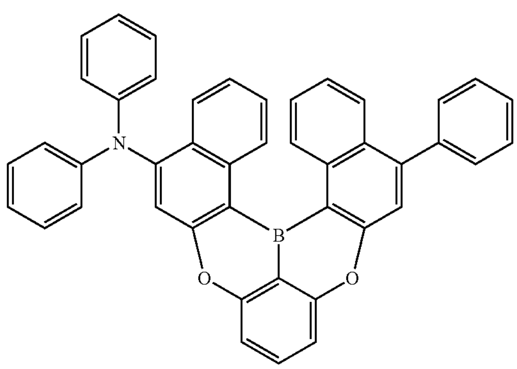
(1B-323)
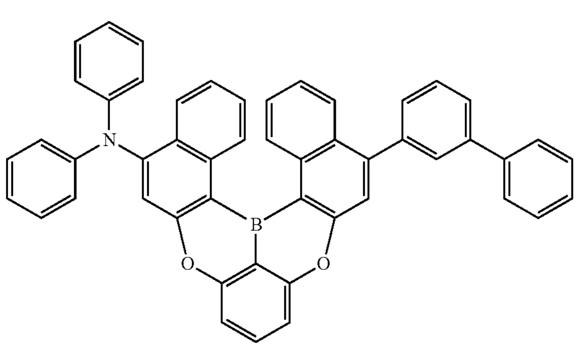
-continued
(1B-324)
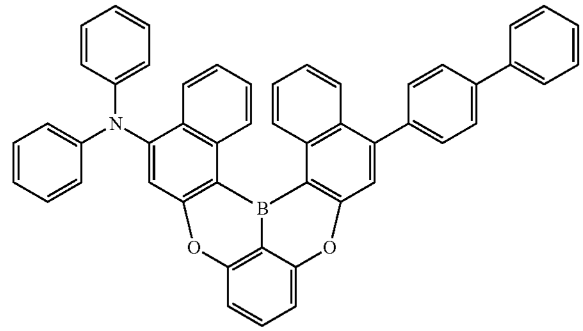
(1B-325)
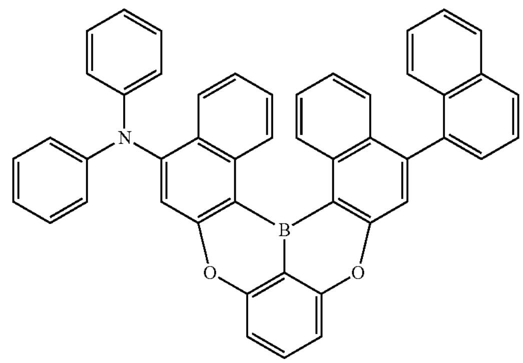
(1B-326)
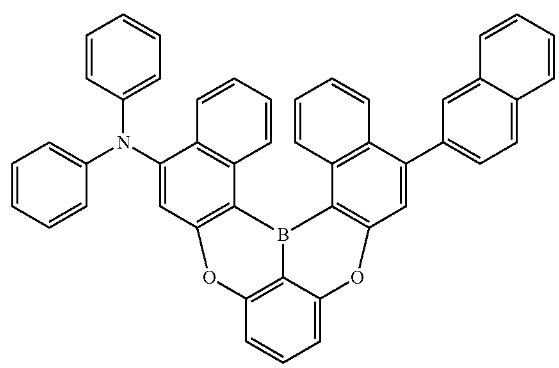
(1B-331)
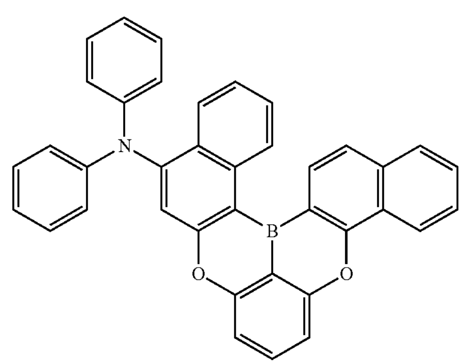

-continued
(1B-332)
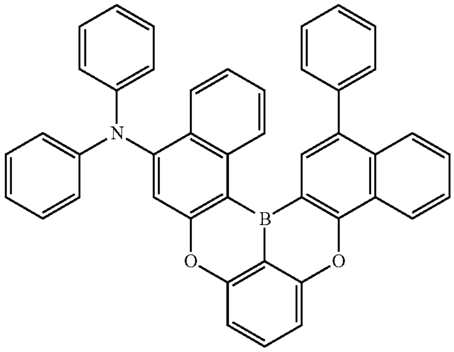
(1B-333)
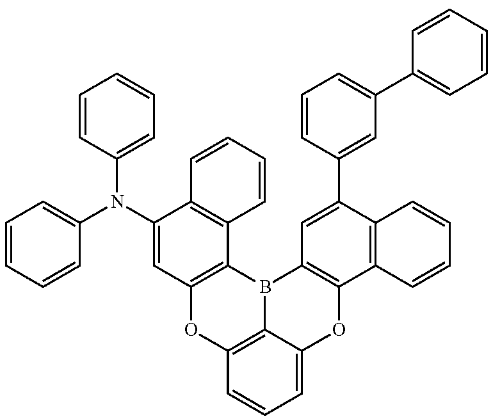
(1B-334)
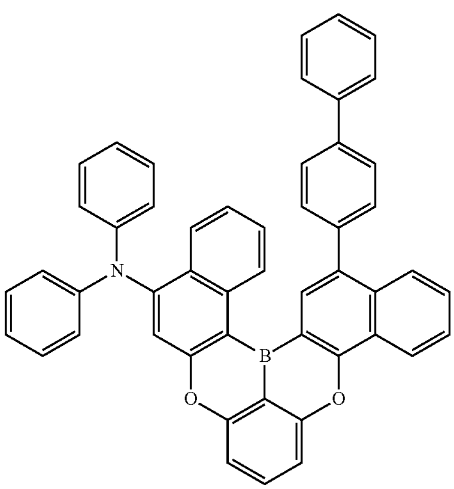
-continued
(1B-335)
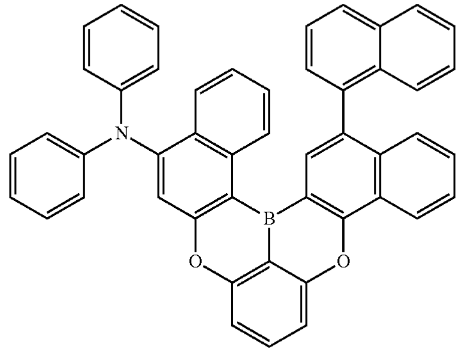
(1B-336)
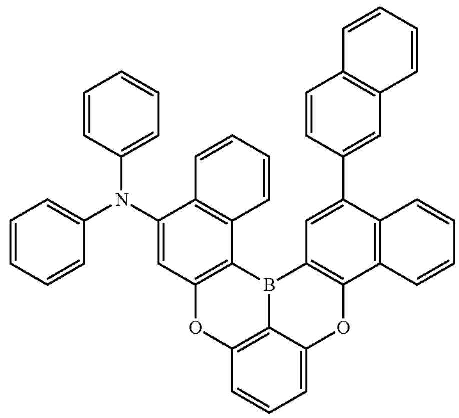
(1B-341)
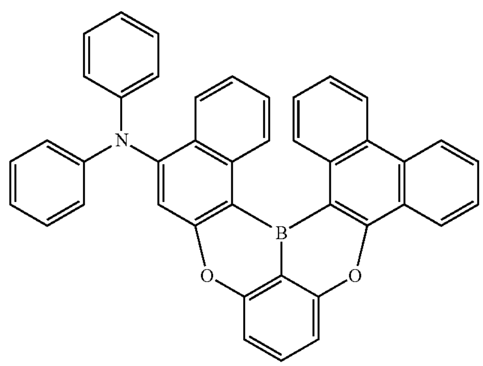
(1B-342)
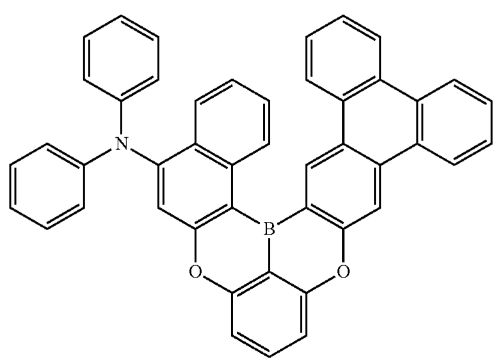

-continued
(1B-343)
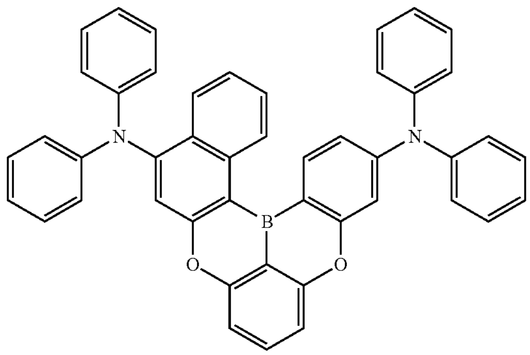
(1B-344)
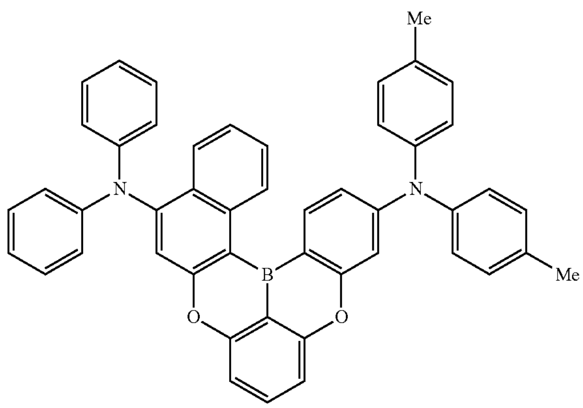
(1B-345)
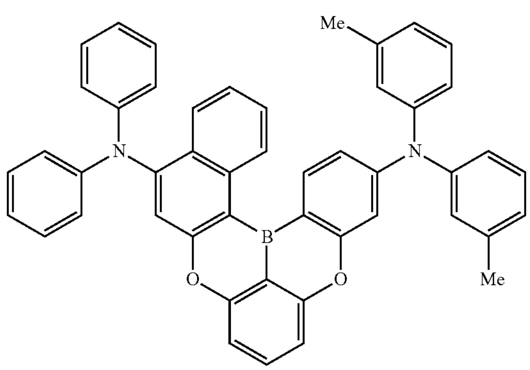
(1B-346)
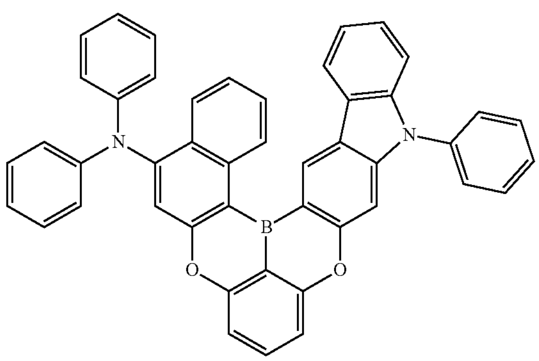
-continued
(1B-351)
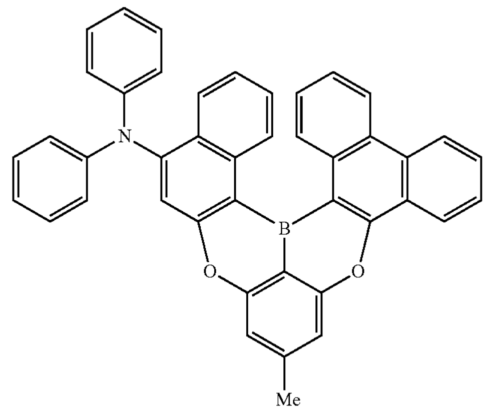
(1B-352)
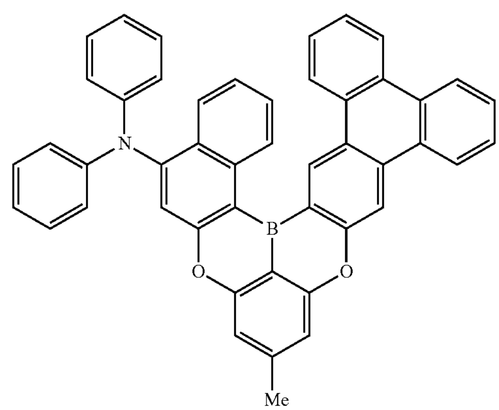
(1B-353)
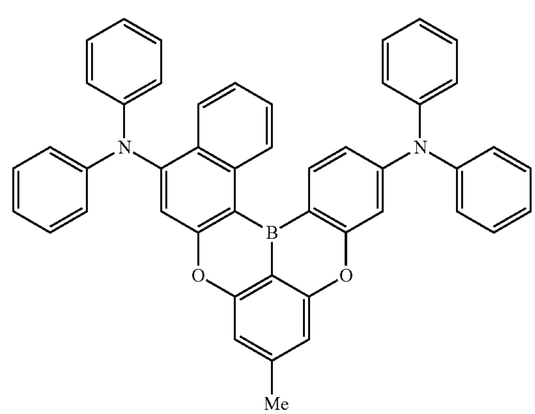

-continued
(1B-354)
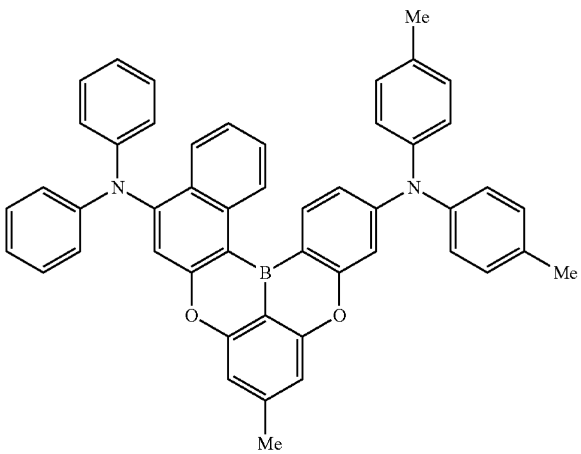
(1B-355)
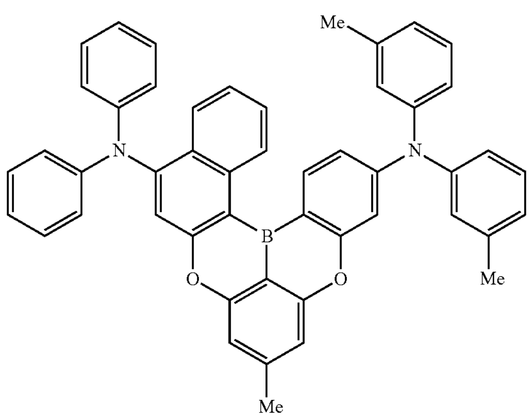
(1B-356)
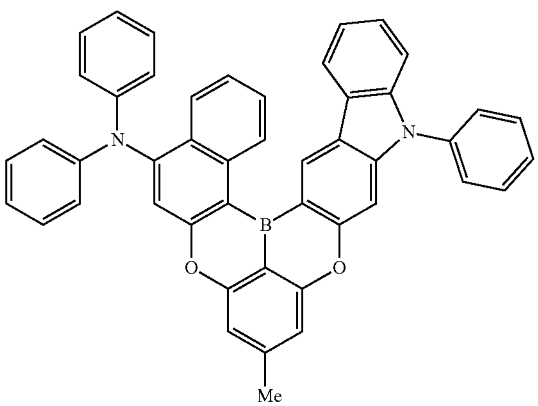
-continued
(1B-361)
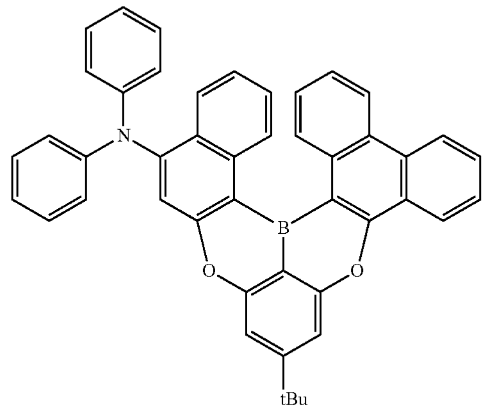
(1B-362)
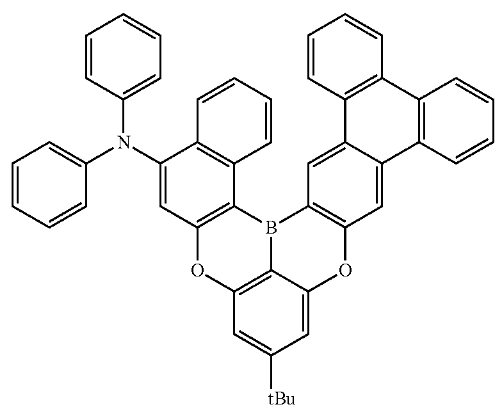
(1B-363)
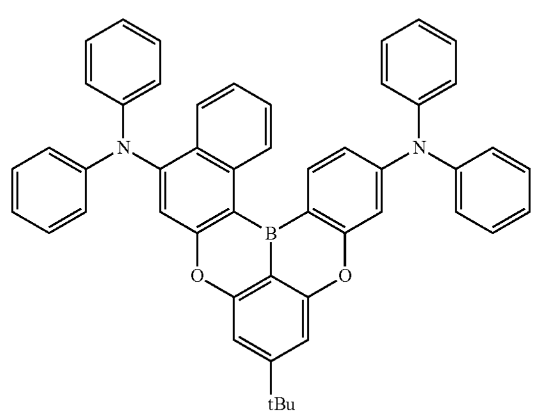

-continued
(1B-364)
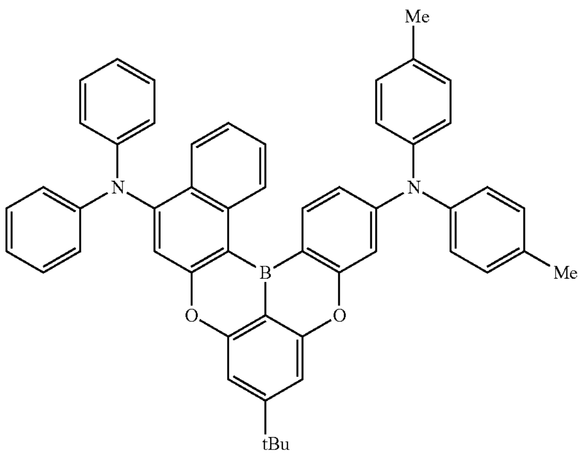
(1B-365)
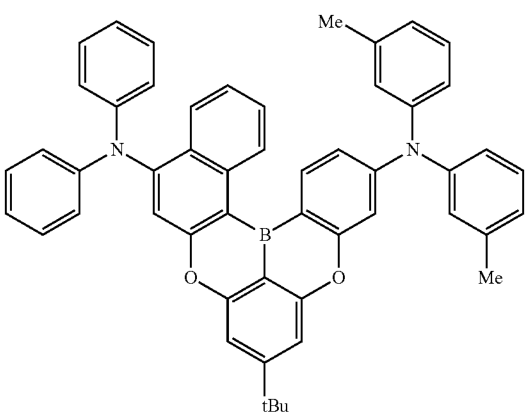
(1B-366)
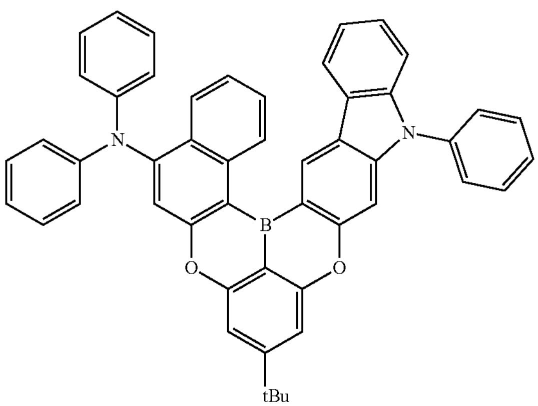
-continued
(1B-371)
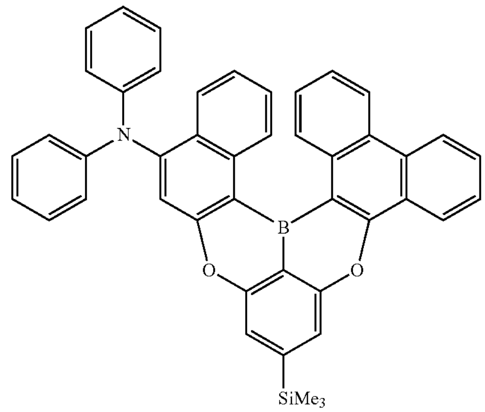
(1B-372)
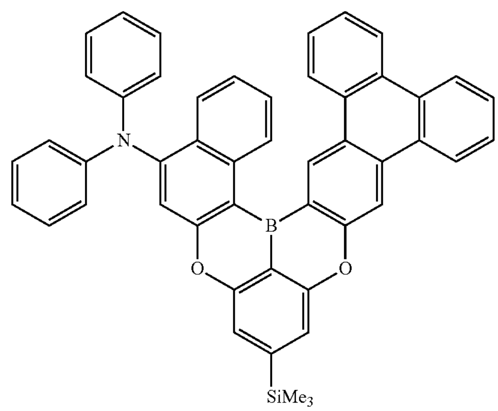
(1B-373)
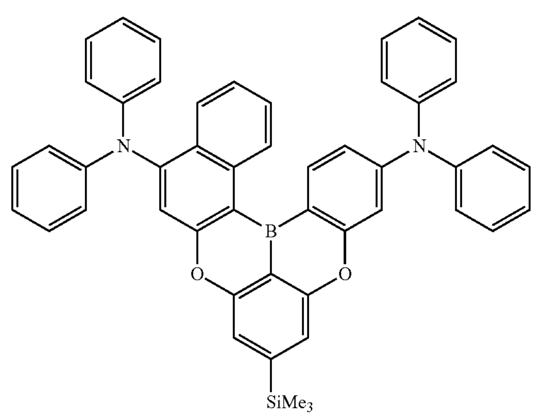

-continued
(1B-374)
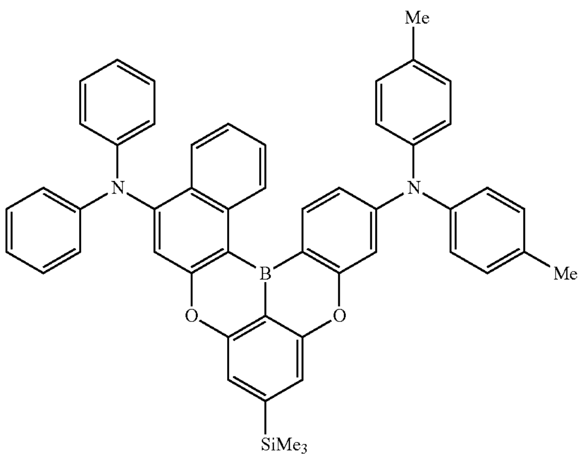
(1B-375)
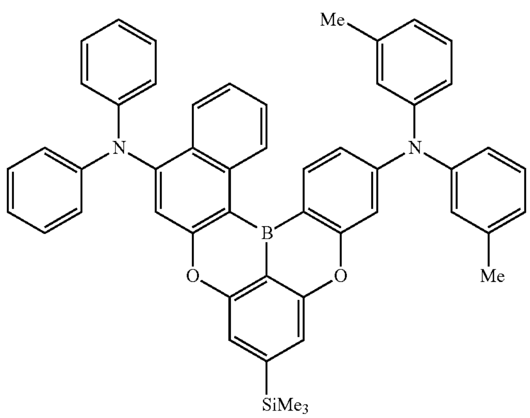
(1B-376)
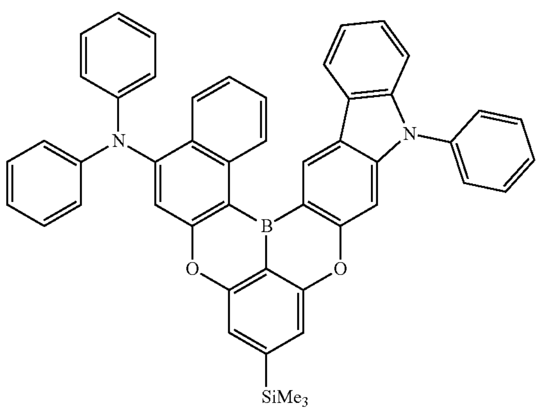
-continued
(1B-381)
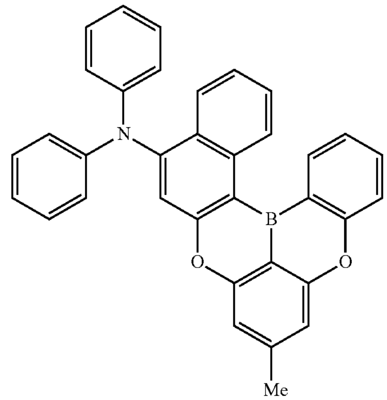
(1B-382)
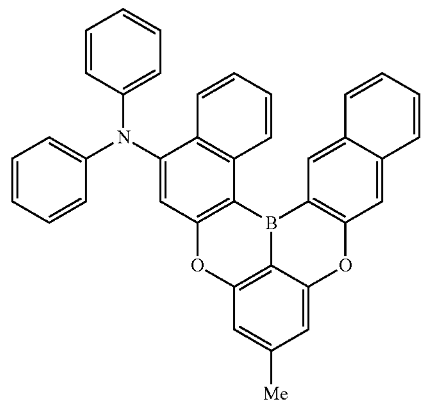
(1B-383)
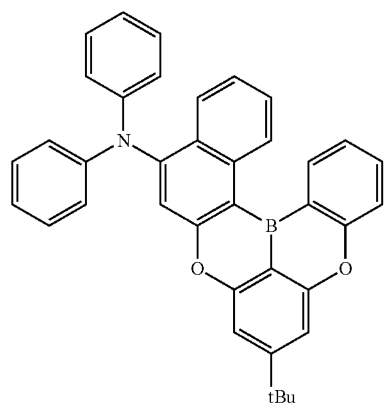
(1B-384)
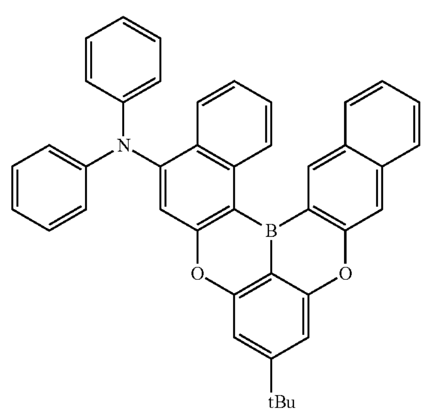

-continued
(1B-385)
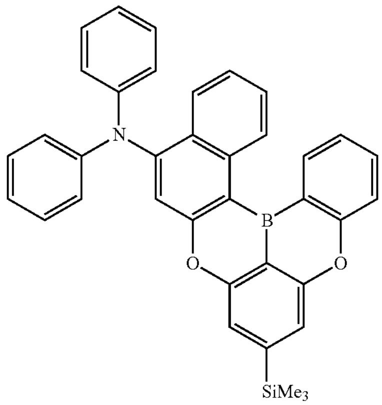
(1B-386)
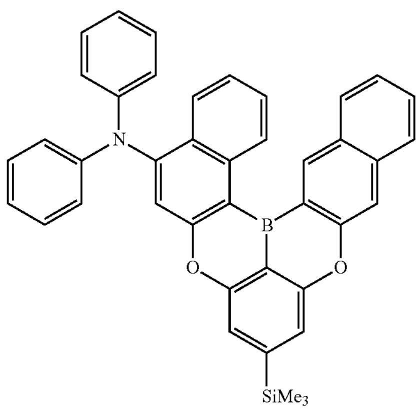
(1C-1)
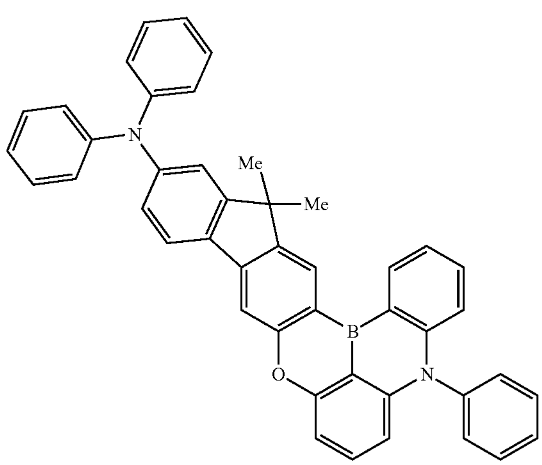
-continued
(1C-2)
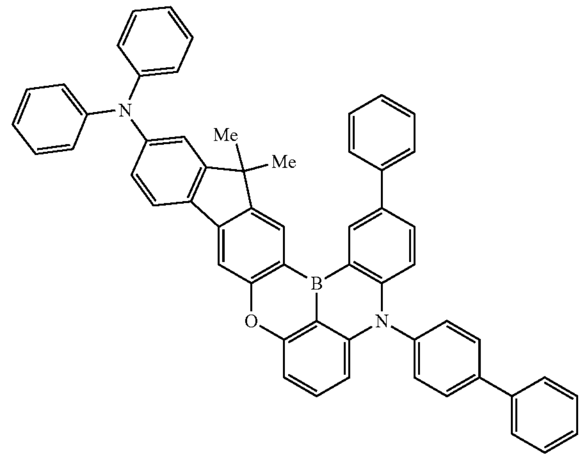
(1C-3)
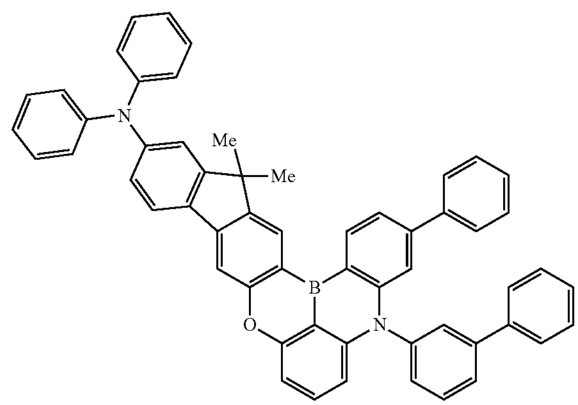
(1C-4)
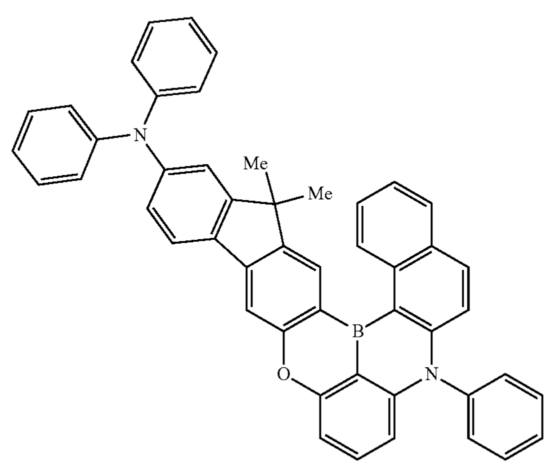

-continued
(1C-5)
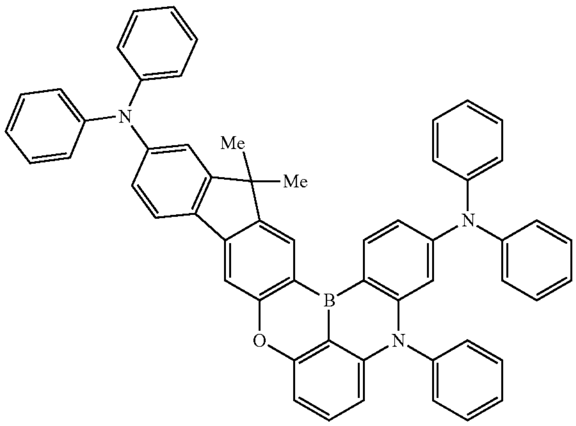
(1C-6)
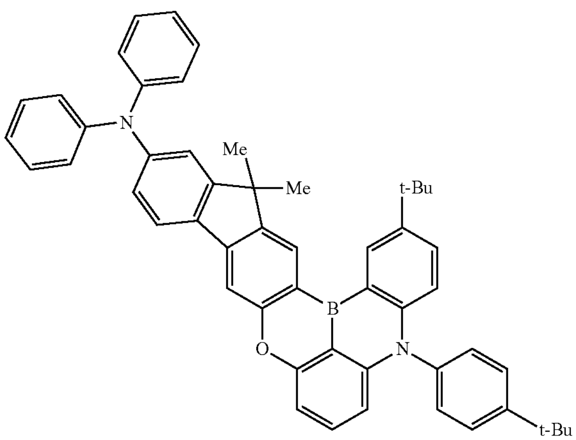
(1C-7)
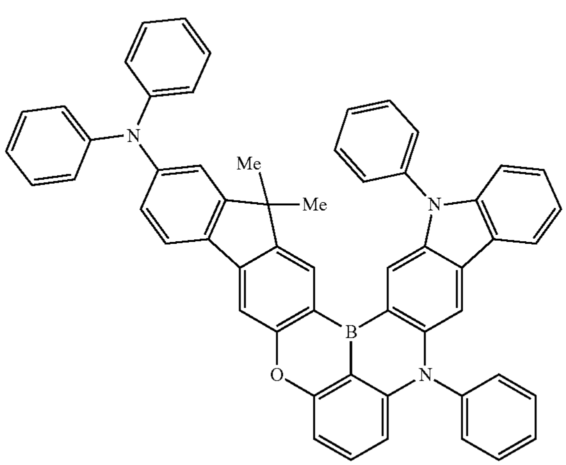
-continued
(1C-8)
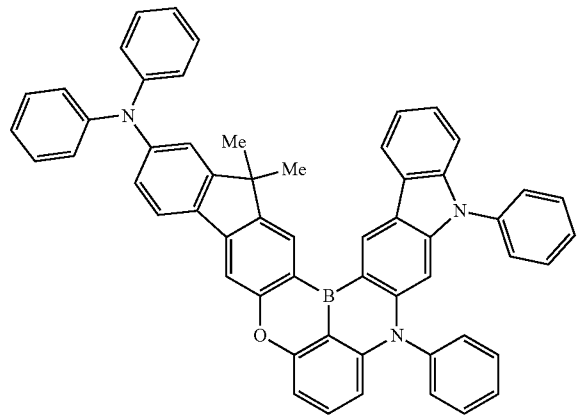
(1C-9)
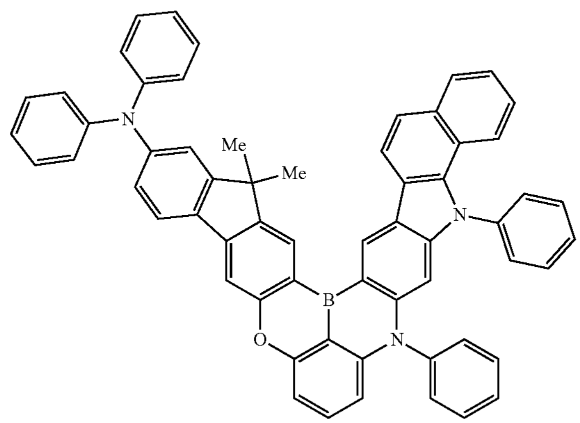
(1C-10)
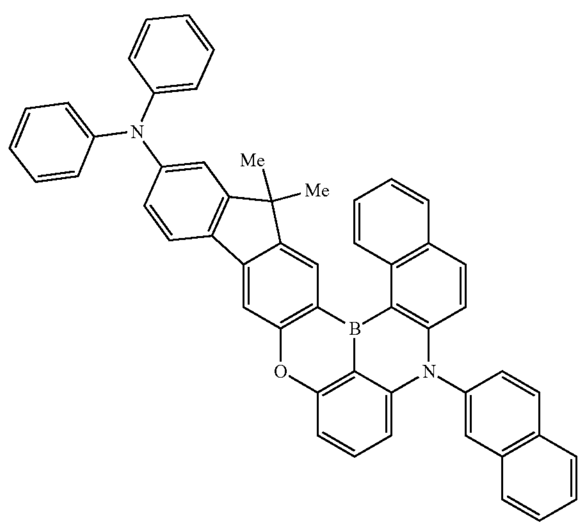

-continued
(1C-11)
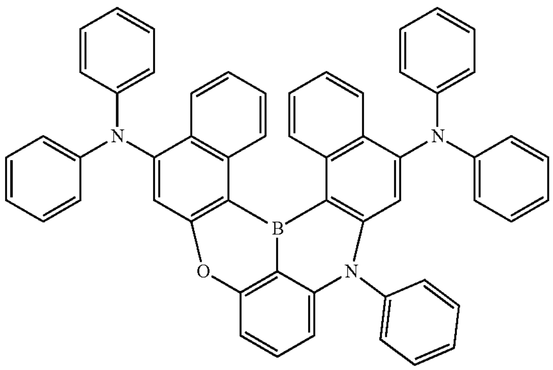
(1C-12)
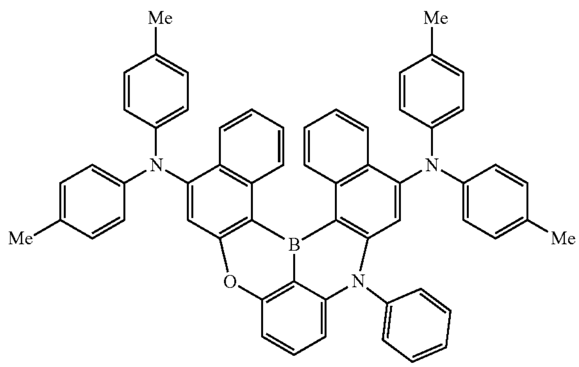
(1C-13)
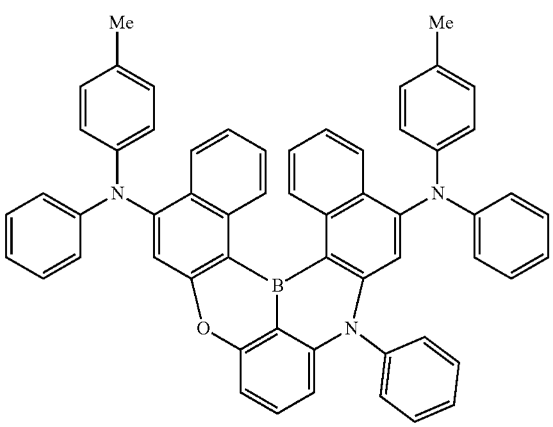
(1C-14)
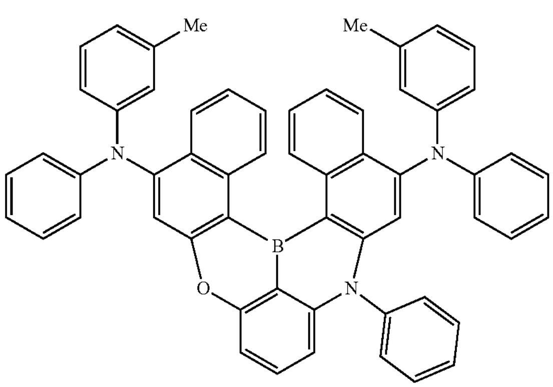
-continued
(1C-15)
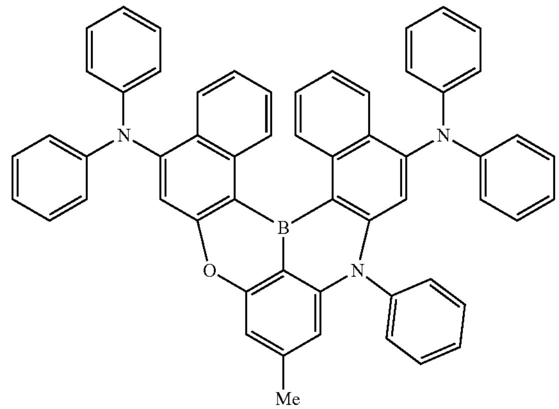
(1C-16)
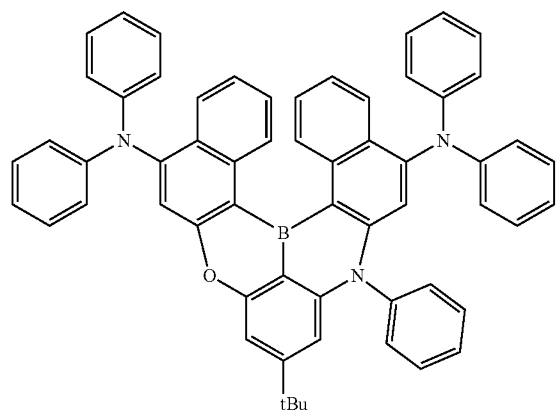
(1C-21)
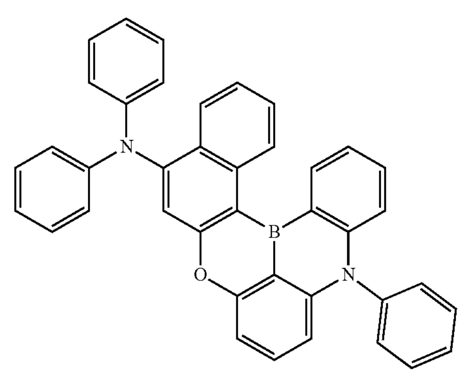

(1C-22)
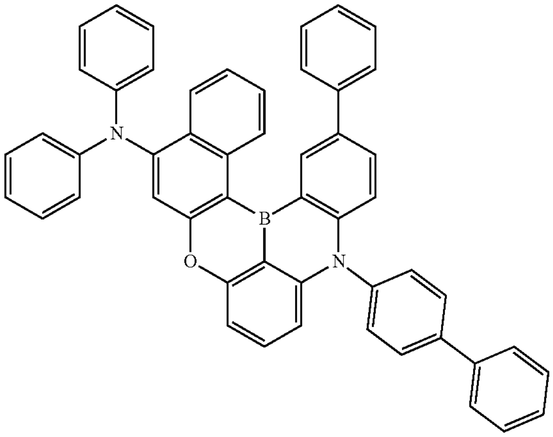
(1C-23)
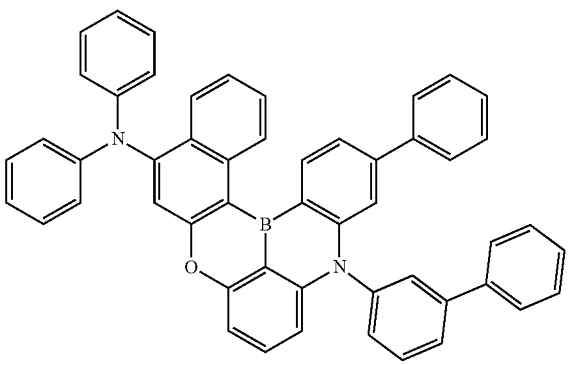
(1C-24)
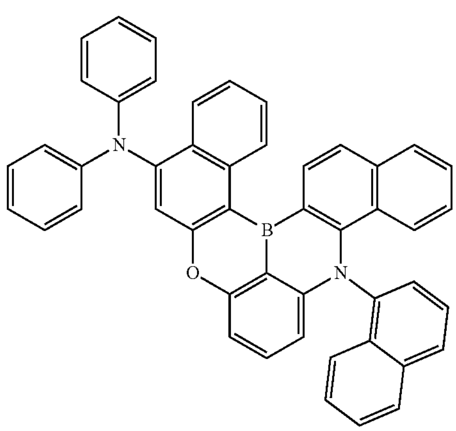
(1C-25)
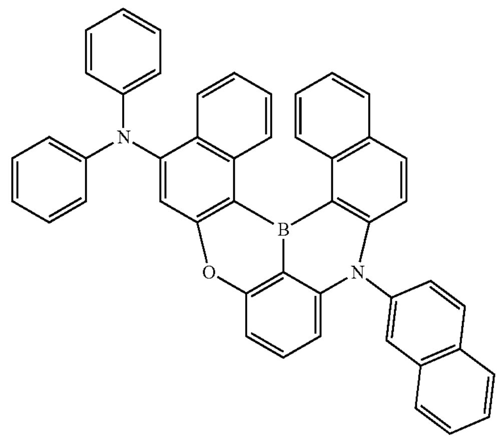
(1C-26)
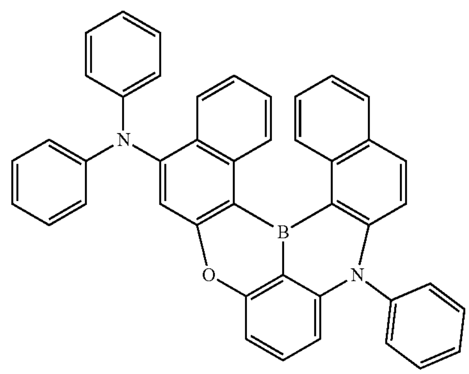
(1C-31)
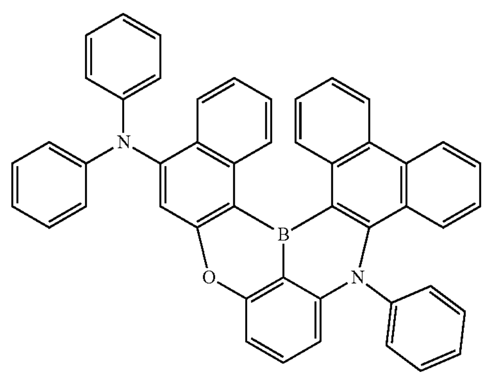
(1C-32)
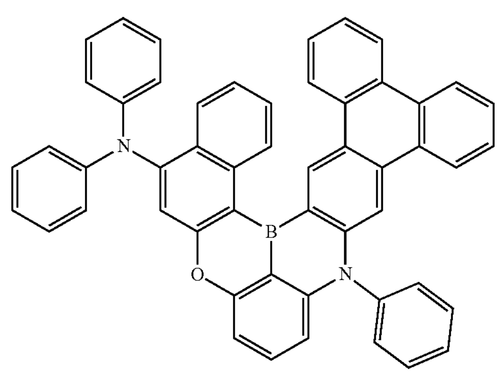

-continued
(1C-33)
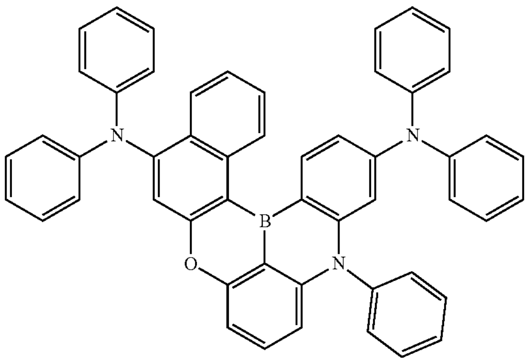
(1C-34)
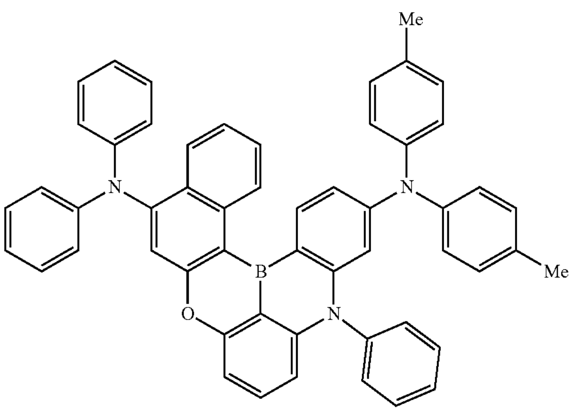
(1C-35)
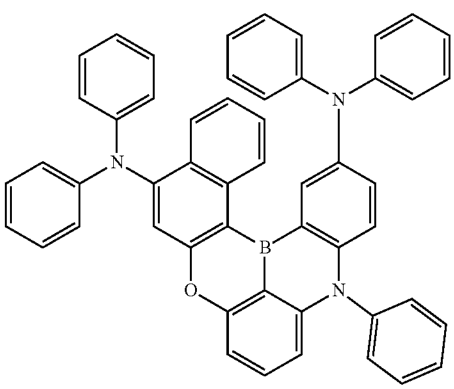
(1C-36)
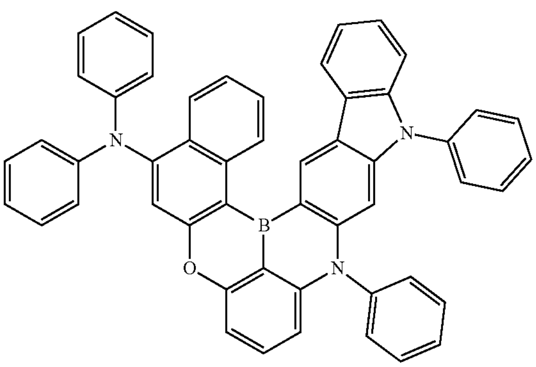
-continued
(1C-41)
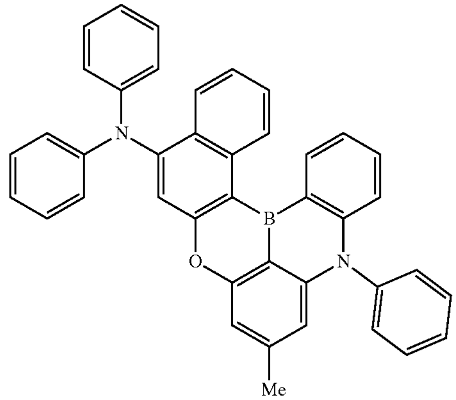
(1C-42)
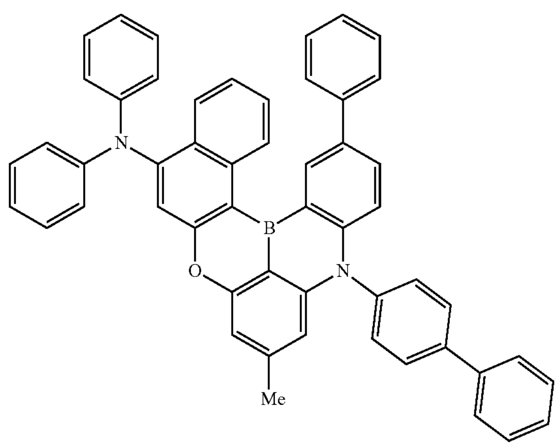
(1C-43)
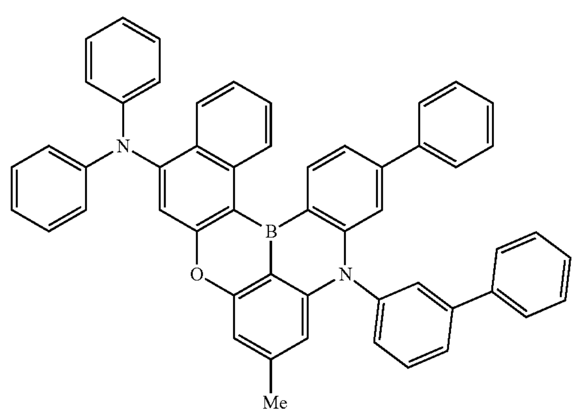

-continued
(1C-44)
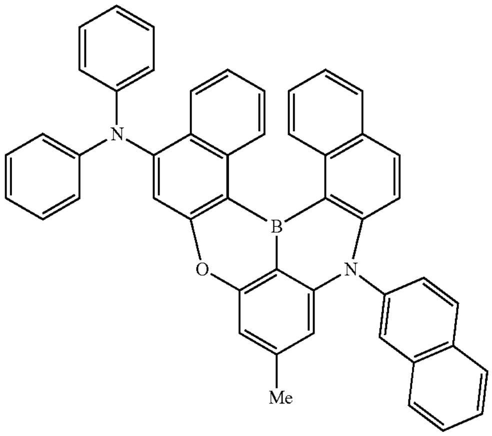
(1C-45)
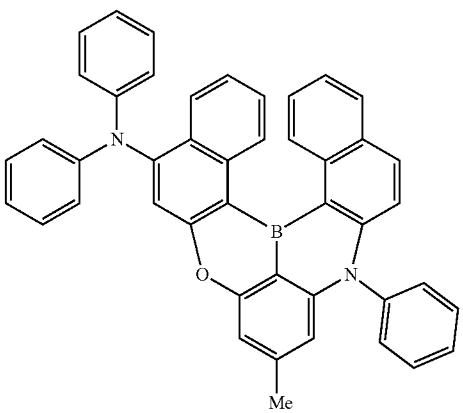
(1C-46)
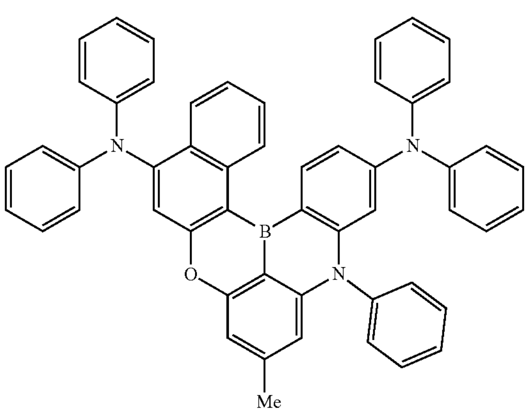
-continued
(1C-51)
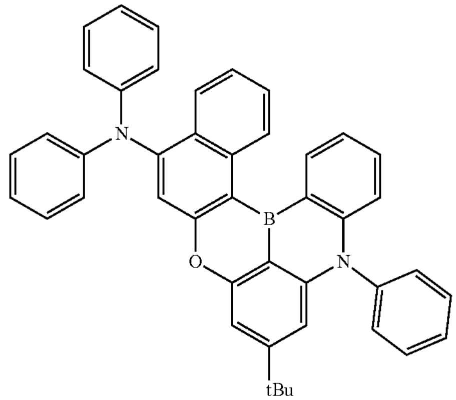
(1C-52)
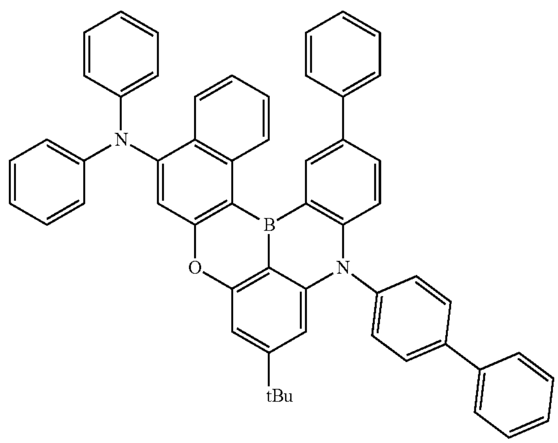
(1C-53)
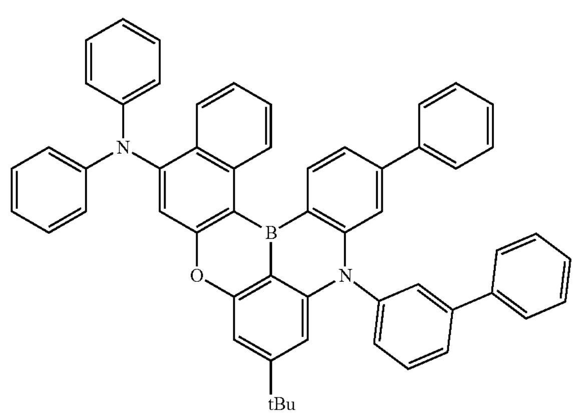

-continued
(1C-54)
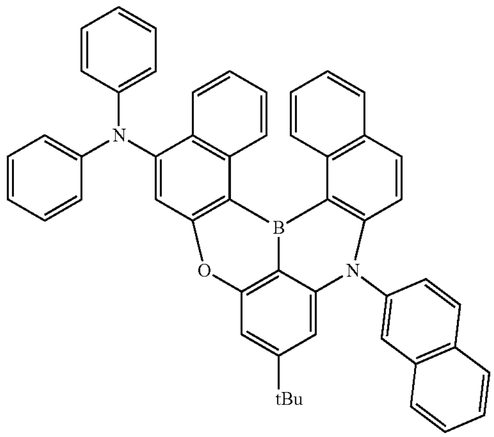
(1C-55)
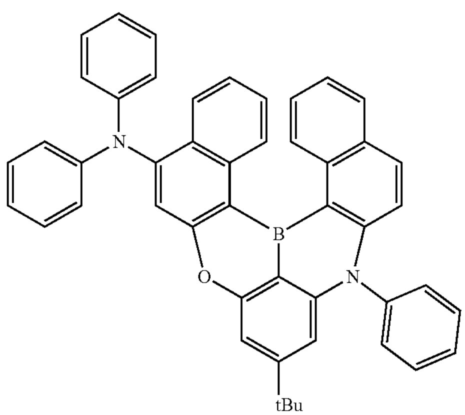
(1C-56)
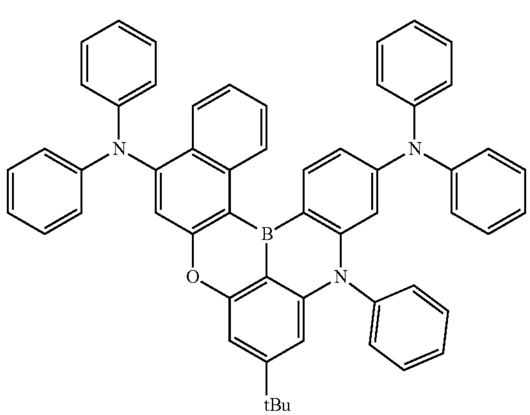
-continued
(1C-61)
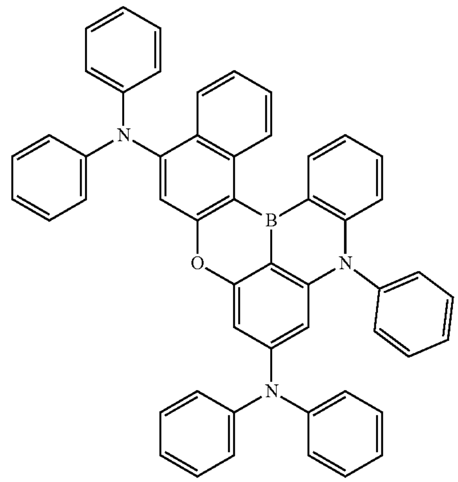
(1C-62)
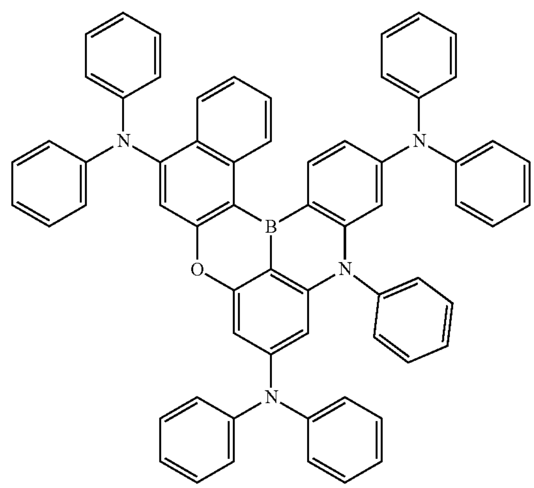
(1C-63)
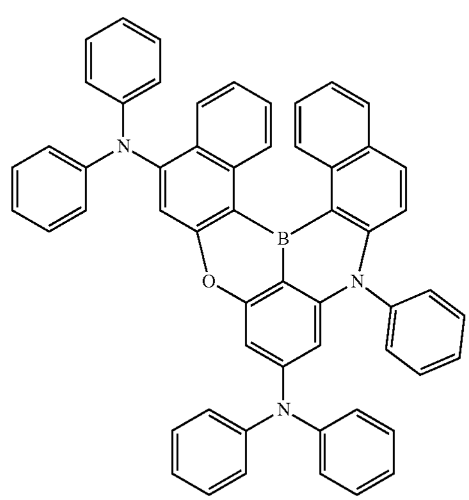

-continued
(1C-101)
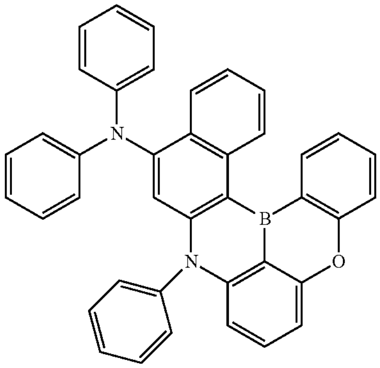
(1C-102)
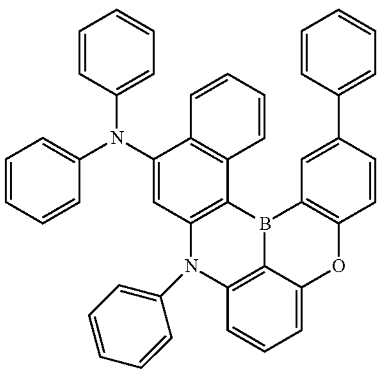
(1C-103)
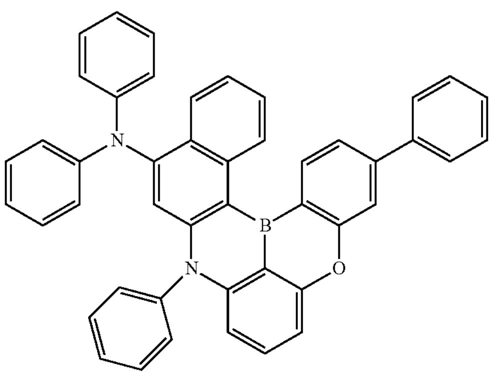
(1C-104)
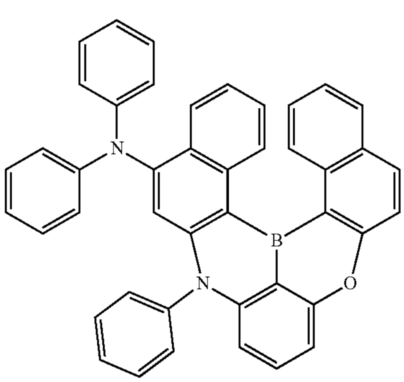
-continued
(1C-105)
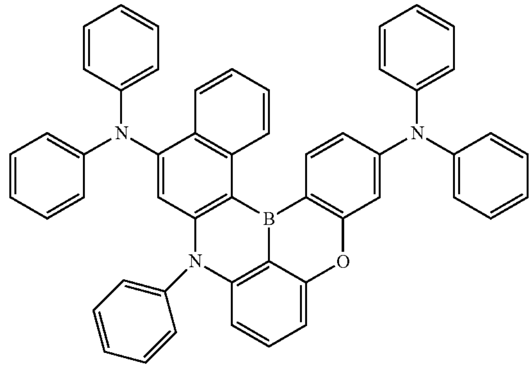
(1C-106)
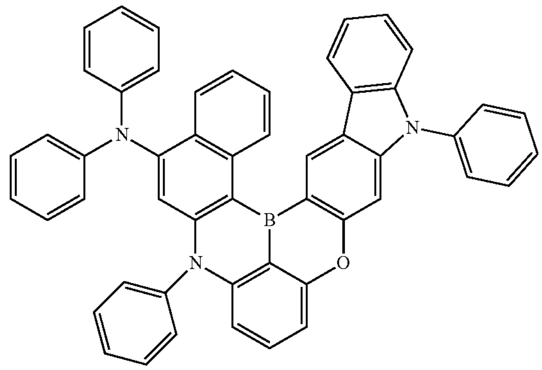
(1C-111)
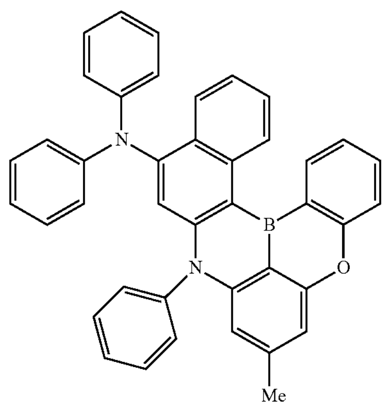
(1C-112)
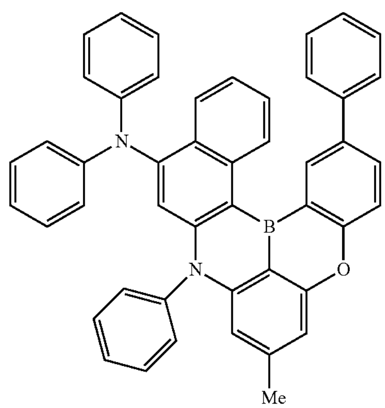

-continued
(1C-113)
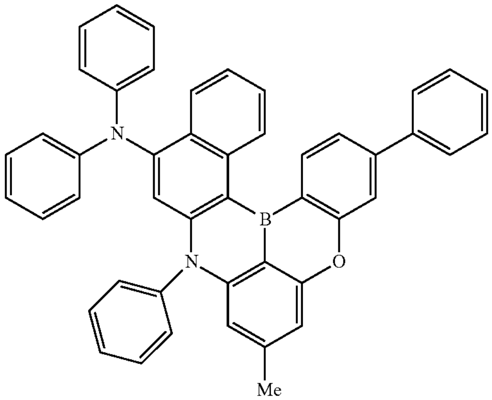
(1C-114)
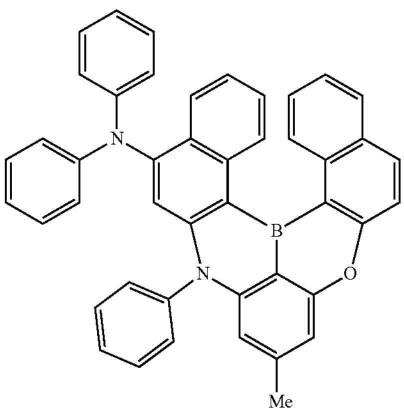
(1C-115)
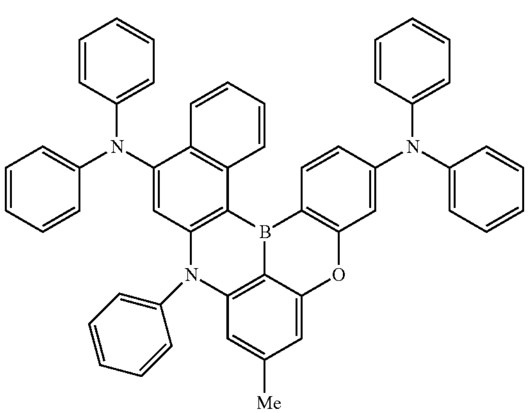
-continued
(1C-116)
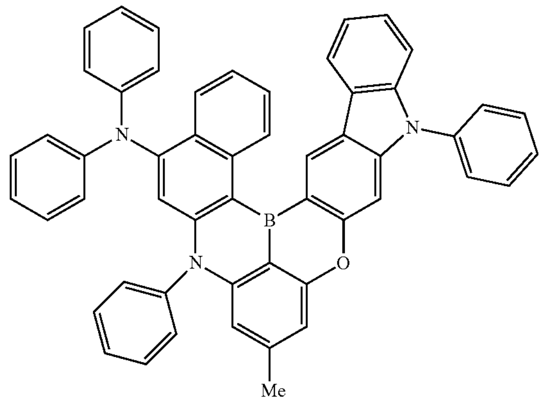
(1C-121)
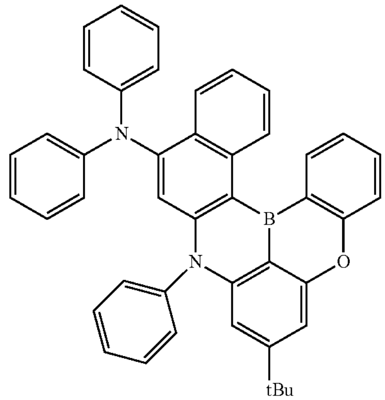
(1C-122)
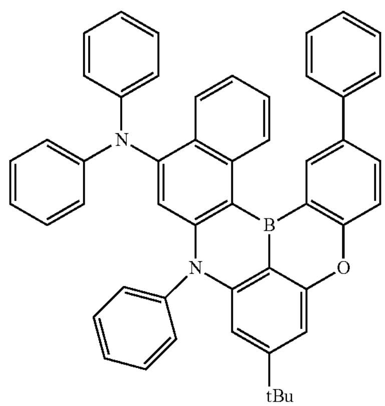
(1C-123)
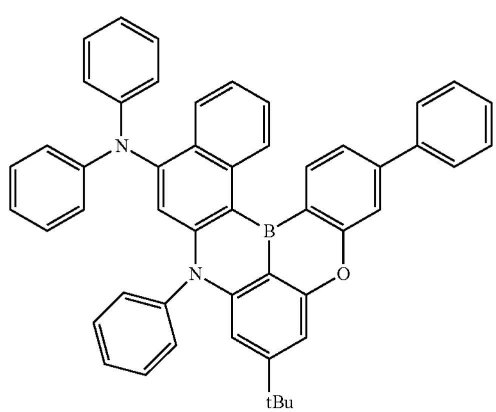

-continued
(1C-124)
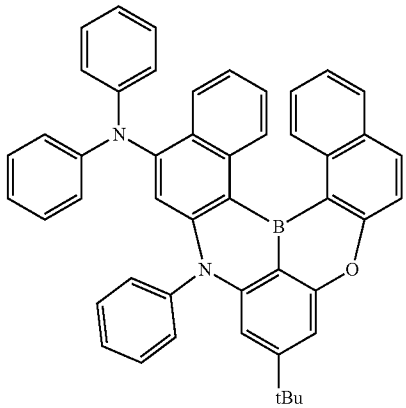
(1C-125)
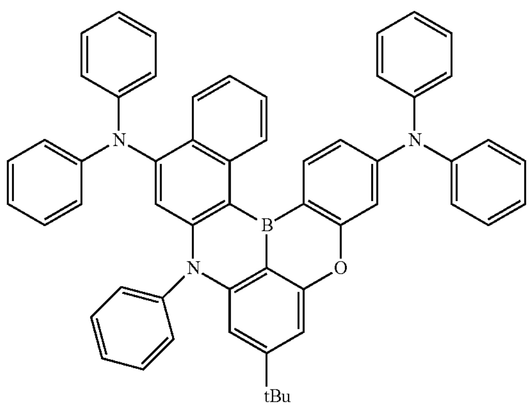
(1C-126)
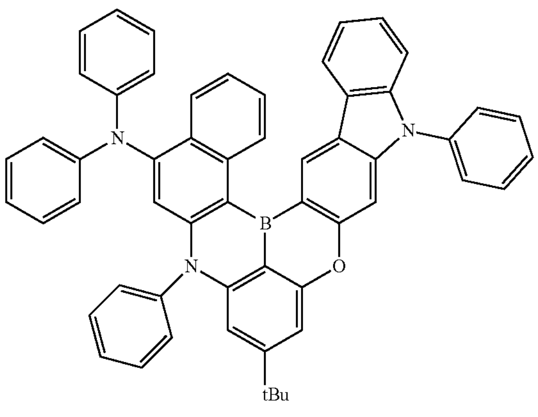
-continued
(1C-131)
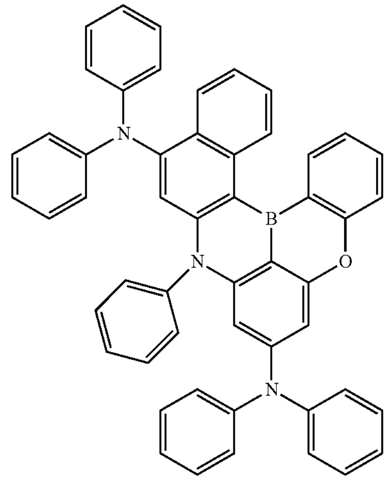
(1C-132)
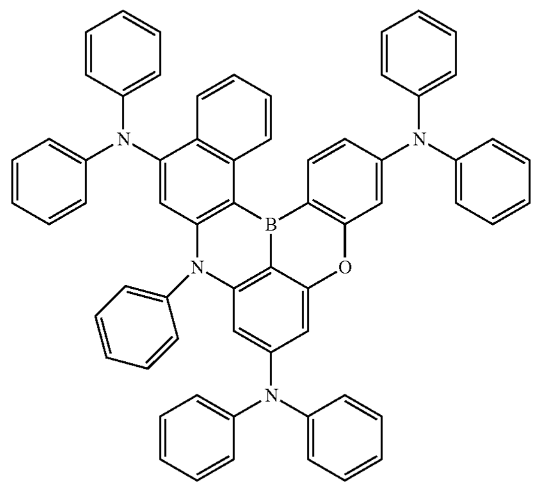
(1C-133)
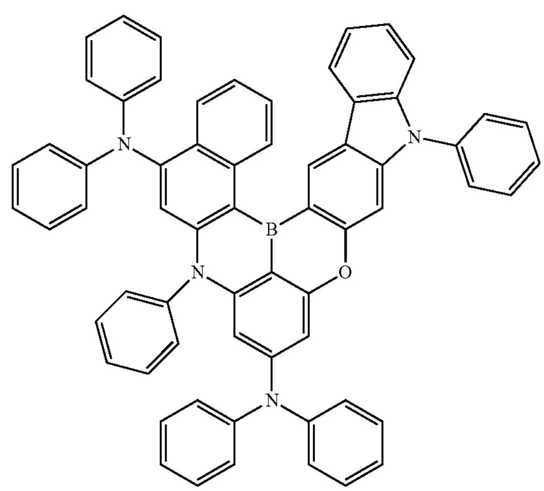
In regard to the polycyclic aromatic compound represented by general formula (1B") or general formula (1C"), an increase in the T1 energy (an increase by approximately 0.01 to 0.1 eV) can be expected by introducing a phenyloxy group, a carbazolyl group or a diphenylamino group into the para-position with respect to B (boron) in the ring c.

Particularly, when a phenyloxy group is introduced into the para-position with respect to B (boron), the HOMO on the benzene rings which are the ring c is more localized to the meta-position with respect to the boron, while the LUMO is localized to the ortho-position and the para-position with respect to the boron. Therefore, particularly, an increase in the T1 energy can be expected.

Furthermore, specific examples of the polycyclic aromatic compound represented by general formula (1B) or general formula (1C) include a compound in which at least one hydrogen atom in one or more phenyl groups or one phenylene group in the compound is substituted by one or more alkyls each having 1 to 4 carbon atoms, and preferably one or more alkyls each having 1 to 3 carbon atoms (preferably one or more methyl groups). More preferable examples thereof include a compound in which the hydrogen atoms at the ortho-positions of one phenyl group (both of the two sites, preferably any one site) or the hydrogen atoms at the ortho-positions of one phenylene group (all of the four sites at maximum, preferably any one site) are substituted by methyl groups.

By substitution of at least one hydrogen atom at the ortho-position of a phenyl group or a p-phenylene group at a terminal in the compound by a methyl group or the like, adjacent aromatic rings are likely to intersect each other perpendicularly, and conjugation is weakened. As a result, triplet excitation energy ($E_T$) can be increased.

1-2(3). Polycyclic Aromatic Compound Represented by General Formula (1D) or (1E) and Multimer Thereof A polycyclic aromatic compound represented by general formula (1D) and a multimer of a polycyclic aromatic compound having a plurality of structures each represented by general formula (1D) are as follows, and are preferably a polycyclic aromatic compound represented by the following general formula (1D') and a multimer of a polycyclic aromatic compound having a plurality of structures each represented by the following general formula (1D'). A polycyclic aromatic compound represented by general formula (1E) and a multimer of a polycyclic aromatic compound having a plurality of structures each represented by general formula (1E) are as follows, and are preferably a polycyclic aromatic compound represented by the following general formula (1E') and a multimer of a polycyclic aromatic compound having a plurality of structures each represented by the following general formula (1E').

(1D)

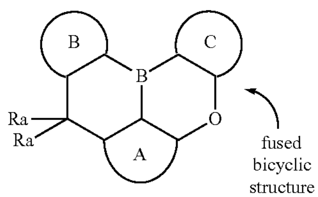

(1D')

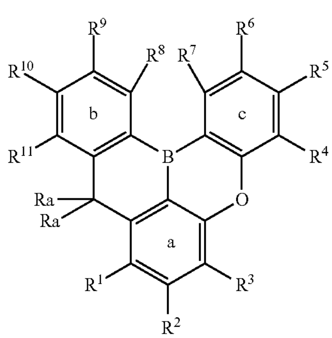

-continued (1E)

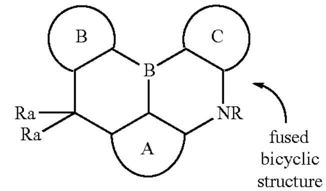

(1E')

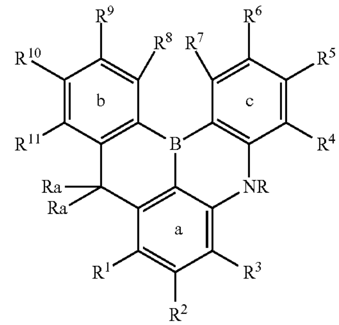

<Regarding Ring A, Ring B, and Ring C (Ring a, Ring b, Ring c, and Substituents $R^1$ to $R^{11}$)>

The ring A, ring B, and ring C in general formulas (1D) and (1E) each independently represent an aryl ring or a heteroaryl ring, and at least one hydrogen atom in these rings may be substituted by a substituent. The substituent is preferably a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino (amino group having an aryl and a heteroaryl), a substituted or unsubstituted alkyl, a substituted or unsubstituted cycloalkyl, a substituted or unsubstituted alkoxy, a substituted or unsubstituted aryloxy, a substituted or unsubstituted arylsulfonyl, a substituted or unsubstituted diarylphosphine, a substituted or unsubstituted diarylphosphine sulfide, a substituted or unsubstituted silyl, a substituted or unsubstituted germyl, a substituted or unsubstituted sulfonate, a substituted or unsubstituted boronate, boronic acid, a halogen atom, or cyano. In a case where these groups have substituents, examples of the substituents include an aryl, a heteroaryl, an alkyl, a halogen atom, and cyano.

The aryl ring or the heteroaryl ring preferably has a 5-membered ring or a 6-membered ring sharing a bond with a fused bicyclic structure constituted by the central element B (boron), >C(—Ra)$_2$, and >O or >N—R (hereinafter, this structure is also referred to as "structure D") at the center of each of general formulas (1D) and (1E).

Here, the "fused bicyclic structure (structure D)" means a structure in which two saturated hydrocarbon rings including the central element B (boron), >C(—Ra)$_2$, and >O or >N—R illustrated at the center of each of general formulas (1D) and (1E) are fused. The "6-membered ring sharing a bond with the fused bicyclic structure" means ring a (benzene ring (6-membered ring)) fused to the structure D, for example, as illustrated in the above general formulas (1D') and (1E'). The phrase "aryl ring or heteroaryl ring (which is ring A) has this 6-membered ring" means that the ring A is formed only from this 6-membered ring, or the ring A is formed such that other rings and the like are further fused to this 6-membered ring so as to include this 6-membered ring. In other words, the "aryl ring or heteroaryl ring (which is ring A) having a 6-membered ring" as used herein means that the 6-membered ring constituting the entirety or a portion of the ring A is fused to the structure D. A similar description applies to the "ring B (ring b)", "ring C (ring c)", and the "5-membered ring".

The ring A (or ring B or ring C) in general formulas (1D) and (1E) corresponds to ring a and its substituents $R^1$ to $R^3$ in general formulas (1D') and (E') (or ring b and its substituents $R^8$ to $R^{11}$, or ring c and its substituents $R^4$ to $R^7$). That is, general formulas (1D') and (E') correspond to formulas in which "rings A to C having 6-membered rings" have been selected as the rings A to C of general formulas (1D) and (1E). For this meaning, the rings of general formulas (1D') and (E') are represented by small letters a to c.

In general formulas (1D') and (E'), adjacent groups among the substituents $R^1$ to $R^{11}$ of the ring a, ring b, and ring c may be bonded to each other to form an aryl ring or a heteroaryl ring together with the ring a, ring b, or ring c, and at least one hydrogen atom in the ring thus formed may be substituted by an aryl, a heteroaryl, a diarylamino, a diheteroarylamino, an arylheteroarylamino, an alkyl, a fluoroalkyl, a cycloalkyl, an alkoxy, an aryloxy, an arylsulfonyl, a diarylphosphine, a diarylphosphine sulfide, a silyl, a germyl, a sulfonate, a boronate, boronic acid, a halogen atom, or cyano. At least one hydrogen atom in these may be substituted by an aryl, a heteroaryl, an alkyl, a halogen atom, or cyano.

R of >N—R in general formula (1E) represents an aryl, a heteroaryl, an alkyl, or a cycloalkyl, and at least one hydrogen atom in these rings may be substituted by a substituent. The substituent is preferably a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino (amino group having an aryl and a heteroaryl), a substituted or unsubstituted alkyl, a substituted or unsubstituted cycloalkyl, a substituted or unsubstituted alkoxy, a substituted or unsubstituted aryloxy, a substituted or unsubstituted arylsulfonyl, a substituted or unsubstituted diarylphosphine, a substituted or unsubstituted diarylphosphine sulfide, a substituted or unsubstituted silyl, a substituted or unsubstituted germyl, a substituted or unsubstituted sulfonate, a substituted or unsubstituted boronate, boronic acid, a halogen atom, or cyano. In a case where these groups have substituents, examples of the substituents include an aryl, a heteroaryl, an alkyl, a halogen atom, and cyano.

R of >N—R may be bonded to the ring A and/or ring C with a linking group or a single bond. The linking group is preferably —O—, —S— or —C(—R)$_2$—. Incidentally, R of the "—C(—R)$_2$—" represents a hydrogen atom or an alkyl. This description also applies to R of >N—R in general formula (1E'). Here, the provision that "R of >N—R is bonded to the ring A and/or ring C with a linking group or a single bond" in general formula (1E) corresponds to the provision that "R of >N—R is bonded to the ring a and/or ring c with —O—, —S—, —C(—R)$_2$—, or a single bond" in general formula (1E').

This provision can be expressed by a compound having a ring structure in which N is incorporated into the fused ring C', represented by the following formula (1E'-3-1). That is, for example, the compound is a compound having the ring C' formed by fusing another ring to a benzene ring which is ring c in general formula (1E') so as to incorporate N. The fused ring C' that has been formed is, for example, a carbazole ring, a phenoxazine ring, a phenothiazine ring, or an acridine ring.

The above provision can also be expressed by a compound having a ring structure in which N is incorporated into the fused ring A', represented by the following formula (1E'-3-2). That is, for example, the compound is a compound having ring A' formed by fusing another ring to a benzene ring which is ring a in general formula (1E') so as to incorporate N. The fused ring A' that has been formed is, for example, a phenoxazine ring, a phenothiazine ring, or an acridine ring. Note that the symbols in the following formulas (1E'-3-1) and (1E'-3-2) are defined in the same manner as those in formula (1E').

(IE'-3-1)

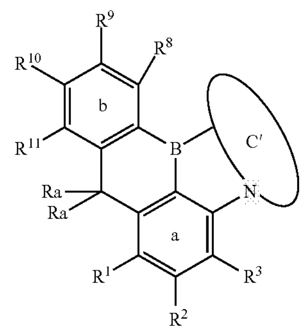

(1E'-3-2)

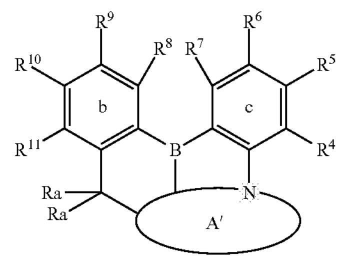

As described above, the ring A, ring B, and ring C in general formulas (1D) and (1E), and the ring a and substituents $R^1$ to $R^3$, the ring b and substituents $R^8$ to $R^{11}$, and the ring c and substituents $R^4$ to $R^7$ corresponding thereto in general formulas (1D') and (1E') can change their structures variously depending on the types of a ring and a substituent, a bonding form between substituents, and the like. However, the ring A, ring B, and ring C (or portions corresponding thereto in general formulas (1D') and (1E')) preferably have the same structure from viewpoints of easiness in manufacturing, cost, and the like. Particularly, the ring A and ring C (or portions corresponding thereto in general formulas (1D') and (1E')) preferably have the same structure.

<Regarding Ra>

Ra of >C(—Ra)$_2$ represents a linear or branched alkyl starting from a methylene group (—CH$_2$—), represented by "—CH$_2$—C$_{n-1}$H$_{2(n-1)+1}$ (n is 1 or more)". The two Ra's have the same structure, and "C (carbon atom)" in the portion of ">C(—Ra)$_2$" in general formulas (1D) and (1E) does not become an asymmetric carbon atom. n is 1 or more, preferably 1 to 6, more preferably 1 to 4, still more preferably 1 to 3, particularly preferably 1 or 2, and most preferably 1 (methyl group). Specific examples of an alkyl as Ra will be described in detail later, but the alkyl may be linear or branched, and is particularly preferably linear. Since Ra is an alkyl group starting from a methylene group (—CH$_2$—), in a case where Ra is a branched alkyl, Ra is not branched at a carbon atom bonded to "C (carbon atom)" (that is, a carbon atom at the 1-position) in the portion of ">C(—Ra)$_2$", but can be branched at a carbon atom at the 2-position or later. For example, Ra can be a branched alkyl of "—$CH_2$—C(—$CH_3)_3$", but cannot be a branched alkyl of "—CH(—$CH_3$)—$CH_3$". This description for Ra also applies to Ra in general formulas (1D') and (1E').

<Details of Ring a, Ring B, and Ring C (Ring a, Ring b, Ring c, and Substituents $R^1$ to $R^{11}$)>

The "aryl ring" as the ring A, ring B, or ring C of general formulas (1D) and (1E) is, for example, an aryl ring having 6 to 30 carbon atoms, and the aryl ring is preferably an aryl ring having 6 to 16 carbon atoms, more preferably an aryl ring having 6 to 12 carbon atoms, and particularly preferably an aryl ring having 6 to 10 carbon atoms. Incidentally, this "aryl ring" corresponds to the "aryl ring formed by bonding adjacent groups among $R^1$ to $R^{11}$ together with the ring a, ring b, or ring c" defined by general formulas (1D') and (1E'). Ring a (or ring b or ring c) is already constituted by a benzene ring having 6 carbon atoms, and therefore the carbon number of 9 in total of a fused ring obtained by fusing a 5-membered ring to this benzene ring becomes a lower limit of the carbon number.

Specific examples of the "aryl ring" include: a benzene ring which is a monocyclic system; a biphenyl ring which is a bicyclic system; a naphthalene ring which is a fused bicyclic system; a terphenyl ring (m-terphenyl, o-terphenyl, or p-terphenyl) which is a tricyclic system; an acenaphthylene ring, a fluorene ring, a phenalene ring, and a phenanthrene ring which are fused tricyclic systems; a triphenylene ring, a pyrene ring, and a naphthacene ring which are fused tetracyclic systems; and a perylene ring and a pentacene ring which are fused pentacyclic systems.

The "heteroaryl ring" as the ring A, ring B, or ring C of general formulas (1D) and (1E) is, for example, a heteroaryl ring having 2 to 30 carbon atoms, and the heteroaryl ring is preferably a heteroaryl ring having 2 to 25 carbon atoms, more preferably a heteroaryl ring having 2 to 20 carbon atoms, still more preferably a heteroaryl ring having 2 to 15 carbon atoms, and particularly preferably a heteroaryl ring having 2 to 10 carbon atoms. In addition, examples of the "heteroaryl ring" include a heterocyclic ring containing 1 to 5 heteroatoms selected from an oxygen atom, a sulfur atom, and a nitrogen atom in addition to a carbon atom as a ring-constituting atom. Incidentally, this "heteroaryl ring" corresponds to the "heteroaryl ring formed by bonding adjacent groups among the $R^1$ to $R^{11}$ together with the ring a, ring b, or ring c" defined by general formulas (1D') and (1E'). The ring a (or ring b or ring c) is already constituted by a benzene ring having 6 carbon atoms, and therefore the carbon number of 6 in total of a fused ring obtained by fusing a 5-membered ring to this benzene ring becomes a lower limit of the carbon number.

Specific examples of the "heteroaryl ring" include a pyrrole ring, an oxazole ring, an isoxazole ring, a thiazole ring, an isothiazole ring, an imidazole ring, an oxadiazole ring, a thiadiazole ring, a triazole ring, a tetrazole ring, a pyrazole ring, a pyridine ring, a pyrimidine ring, a pyridazine ring, a pyrazine ring, a triazine ring, an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, an indolizine ring, a furan ring, a benzofuran ring, an isobenzofuran ring, a dibenzofuran ring, a thiophene ring, a benzothiophene ring, a dibenzothiophene ring, a furazane ring, an oxadiazole ring, and a thianthrene ring.

At least one hydrogen atom in the above "aryl ring" or "heteroaryl ring" may be substituted by a substituted or unsubstituted "aryl", a substituted or unsubstituted "heteroaryl", a substituted or unsubstituted "diarylamino", a substituted or unsubstituted "diheteroarylamino", a substituted or unsubstituted "arylheteroarylamino", a substituted or unsubstituted "alkyl", a substituted or unsubstituted "cycloalkyl", a substituted or unsubstituted "alkoxy", a substituted or unsubstituted "aryloxy", a substituted or unsubstituted "arylsulfonyl", a substituted or unsubstituted "diarylphosphine", a substituted or unsubstituted "diarylphosphine sulfide", a substituted or unsubstituted "silyl", a substituted or unsubstituted "germyl", a substituted or unsubstituted "sulfonate", a substituted or unsubstituted "boronate", "boronic acid", a "halogen atom", or "cyano", which is a primary substituent. Examples of the "aryl", the "heteroaryl", the aryl of the "diarylamino", the heteroaryl of the "diheteroarylamino", the aryl and the heteroaryl of the "arylheteroarylamino", the aryl of the "aryloxy", the aryl of the "arylsulfonyl", the aryl of the "diarylphosphine", and the aryl of the "diarylphosphine sulfide" as these primary substituents include a monovalent group of the "aryl ring" or "heteroaryl ring" described above.

Furthermore, the "alkyl" as a primary substituent may be either linear or branched, and examples thereof include a linear alkyl having 1 to 24 carbon atoms and a branched alkyl having 3 to 24 carbon atoms. An alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 4 carbon atoms (branched alkyl having 3 or 4 carbon atoms) is particularly preferable.

Specific examples of the alkyl include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

Furthermore, examples of the "cycloalkyl" as a primary substituent include a cycloalkyl having 3 to 12 carbon atoms. A cycloalkyl having 3 to 10 carbon atoms is preferable, a cycloalkyl having 3 to 8 carbon atoms is more preferable, and a cycloalkyl having 3 to 6 carbon atoms is still more preferable.

Specific examples of the cycloalkyl include cyclopropyl, cyclobutyl, cyclopentyl, cyclohexyl, methylcyclopentyl, cycloheptyl, methylcyclohexyl, cyclooctyl, and demethylcyclohexyl.

Furthermore, the "alkoxy" as a primary substituent may be, for example, a linear alkoxy having 1 to 24 carbon atoms or a branched alkoxy having 3 to 24 carbon atoms. The alkoxy is preferably an alkoxy having 1 to 18 carbon atoms (branched alkoxy having 3 to 18 carbon atoms), more preferably an alkoxy having 1 to 12 carbon atoms (branched alkoxy having 3 to 12 carbon atoms), still more preferably an alkoxy having 1 to 6 carbon atoms (branched alkoxy having 3 to 6 carbon atoms), and particularly preferably an alkoxy having 1 to 4 carbon atoms (branched alkoxy having 3 or 4 carbon atoms).

Specific examples of the alkoxy include methoxy, ethoxy, propoxy, isopropoxy, butoxy, isobutoxy, s-butoxy, t-butoxy, pentyloxy, hexyloxy, heptyloxy, and octyloxy.

Furthermore, the "silyl" as a primary substituent is "—$SiH_3$", the "germyl" is "—$GeH_3$", R in the "sulfonate (—S(═O)$_2$—OR)" is the alkyl described above, and R in the "boronate (—B(OR)$_2$)" is the alkyl described above, in which the two R's may be bonded to each other.

Furthermore, examples of the "halogen atom" as a primary substituent include a fluorine atom, a chlorine atom, and an iodine atom.

In the substituted or unsubstituted "aryl", the substituted or unsubstituted "heteroaryl", the substituted or unsubstituted "diarylamino", the substituted or unsubstituted "diheteroarylamino", the substituted or unsubstituted "arylheteroarylamino", the substituted or unsubstituted "alkyl", the substituted or unsubstituted "cycloalkyl", the substituted or unsubstituted "alkoxy", the substituted or unsubstituted "aryloxy", the substituted or unsubstituted "arylsulfonyl", the substituted or unsubstituted "diarylphosphine", the substituted or unsubstituted "diarylphosphine sulfide", the substituted or unsubstituted "silyl", the substituted or unsubstituted "germyl", the substituted or unsubstituted "sulfonate", or the substituted or unsubstituted "boronate", which is a primary substituent, at least one hydrogen atom may be substituted by a secondary substituent, as described to be substituted or unsubstituted. Examples of this secondary substituent include an aryl, a heteroaryl, an alkyl, a halogen atom, and cyano, and for specific examples thereof, reference can be made to the above description on the monovalent group of the "aryl ring" or "heteroaryl ring" and the "alkyl" or "halogen atom" as a primary substituent. Furthermore, the aryl, heteroaryl, and alkyl as a secondary substituent also includes an aryl, a heteroaryl, and an alkyl in which at least one hydrogen atom is substituted by an aryl such as phenyl (specific examples are described above), an alkyl such as methyl (specific examples are described above), or a halogen atom such a fluorine atom (specific examples are described above). For example, when the secondary substituent is a carbazolyl group, the heteroaryl as a secondary substituent also includes a carbazolyl group in which at least one hydrogen atom at the 9-position is substituted by an aryl such as phenyl, or an alkyl such as methyl.

Examples of the aryl, the heteroaryl, the aryl of the diarylamino, the heteroaryl of the diheteroarylamino, the aryl and the heteroaryl of the arylheteroarylamino, the aryl of the aryloxy, the aryl of the arylsulfonyl, the aryl of the diarylphosphine, or the aryl of the diarylphosphine sulfide for $R^1$ to $R^{11}$ of general formulas (1D') and (1E') include the monovalent groups of the "aryl ring" or "heteroaryl ring" described in general formulas (1D) and (1E). Furthermore, regarding the alkyl, cycloalkyl, or alkoxy for $R^1$ to $R^{11}$, reference can be made to the description on the "alkyl", "cycloalkyl", or "alkoxy" as a primary substituent in the above description of general formulas (1D) and (1E). In addition, the same also applies to the aryl, heteroaryl, alkyl, halogen atom, or cyano as a substituent on these groups. Furthermore, the same also applies to the aryl, heteroaryl, diarylamino, diheteroarylamino, arylheteroarylamino, alkyl, fluoroalkyl, cycloalkyl, alkoxy, aryloxy, arylsulfonyl, diarylphosphine, diarylphosphine sulfide, silyl, germyl, sulfonate, boronate, boronic acid, halogen atom, or cyano as a substituent on these rings in a case of bonding adjacent groups among $R^1$ to $R^{11}$ to form an aryl ring or a heteroaryl ring together with the ring a, ring b, or ring c, and the aryl, heteroaryl, alkyl, halogen atom, or cyano as a further substituent.

<Regarding Details of N—R in X of General Formula (1E)>

R of >N—R in general formula (1E) represents an aryl, a heteroaryl, an alkyl, or a cycloalkyl, and at least one hydrogen atom in these may be substituted by a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino (amino group having an aryl and a heteroaryl), a substituted or unsubstituted alkyl, a substituted or unsubstituted cycloalkyl, a substituted or unsubstituted alkoxy, a substituted or unsubstituted aryloxy, a substituted or unsubstituted arylsulfonyl, a substituted or unsubstituted diarylphosphine, a substituted or unsubstituted diarylphosphine sulfide, a substituted or unsubstituted silyl, a substituted or unsubstituted germyl, a substituted or unsubstituted sulfonate, a substituted or unsubstituted boronate, boronic acid, a halogen atom, or cyano. In a case where these groups have substituents, examples of the substituents include an aryl, a heteroaryl, an alkyl, a halogen atom, and cyano. For description of all of these, the description for the ring A, ring B, and ring C in formula (1E) can be cited. The aryl, heteroaryl, and alkyl as R are particularly preferably an aryl having 6 to 10 carbon atoms (for example, a phenyl or a naphthyl), a heteroaryl having 2 to 15 carbon atoms (for example, carbazolyl), and an alkyl having 1 to 4 carbon atoms (for example, methyl or ethyl), respectively.

R of the "—C(—R)$_2$—" represents a hydrogen atom or an alkyl when R of >N—R is bonded to the ring A and/or ring C (ring a and/or ring c). Specific examples of the alkyl include the above-described groups. An alkyl having 1 to 4 carbon atoms (for example, methyl or ethyl) is particularly preferable.

The description applies to R of >N—R in general formula (1E').

<Regarding Multimer>

The multimer of a polycyclic aromatic compound represented by any one of general formulas (1D), (1E), (1D'), and (1E') is preferably a dimer to a hexamer, more preferably a dimer or a trimer, and particularly preferably a dimer. The multimer only needs to be in a form having a plurality of the unit structures each represented by any one of general formulas (1D), (1E), (1D'), and (1E') in one compound. For example, the multimer may be in a form in which the plurality of unit structures is bonded with a single bond or a linking group such as an alkylene group having 1 to 3 carbon atoms, a phenylene group, or a naphthylene group. In addition, the multimer may be in a form in which the plurality of unit structures is bonded such that any ring contained in the unit structure (ring A, ring B, or ring C, or ring a, ring b, or ring c) is shared by the plurality of unit structures, or may be in a form in which the unit structures are bonded such that any rings contained in the unit structure (ring A, ring B, or ring C, or ring a, ring b, or ring c) are fused to each other.

<Regarding Specific Examples of Polycyclic Aromatic Compound and Multimer Thereof>

More specific examples of the polycyclic aromatic compound represented by general formula (1D) or (1E) and a multimer thereof include compounds represented by the following structural formulas. In each of the structural formulas, "Me" represents methyl, "Et" represents ethyl "$^n$Pr" represents normal propyl, "$^i$Pr" represents isopropyl, "$^n$Bu" represents normal butyl, "$^t$Bu" represents tertiary butyl, "Tf" represents trifluoromethane sulfonyl, and "Nf" represents nonafluorobutane sulfonyl.

(1D-201)
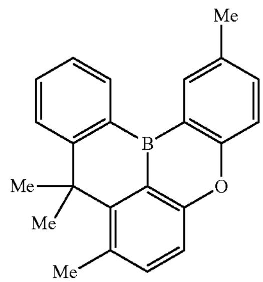
(1D-202)
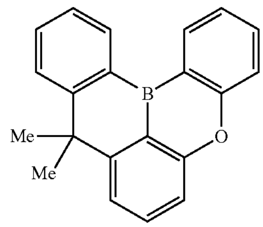
(1D-203)
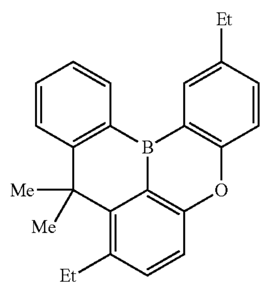
(1D-204)
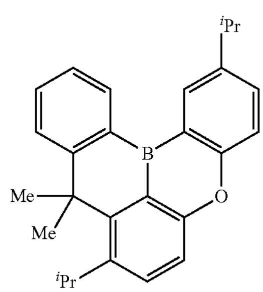
(1D-205)
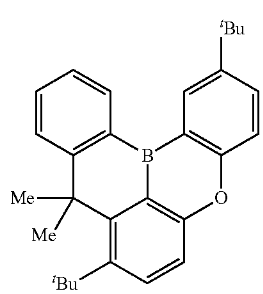
-continued
(1D-206)
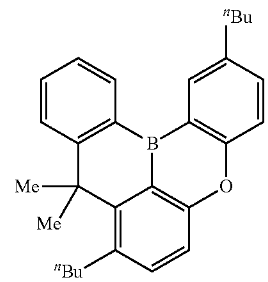
(1D-207)
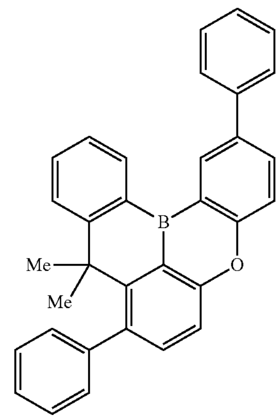
(1D-208)
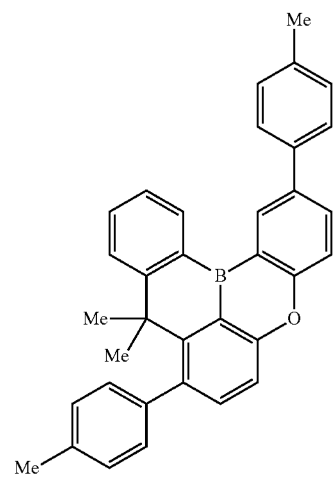
(1D-209)
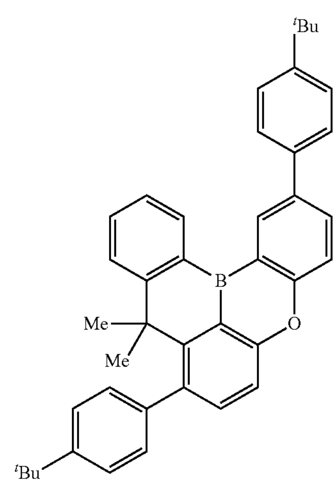

-continued
(1D-210)
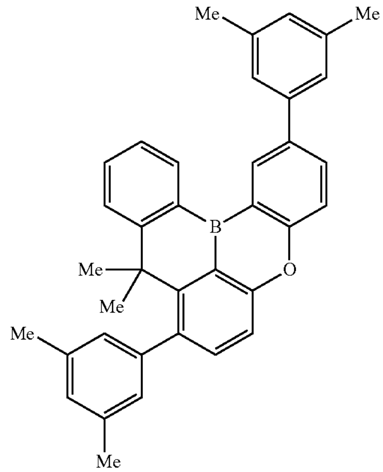
(1D-211)
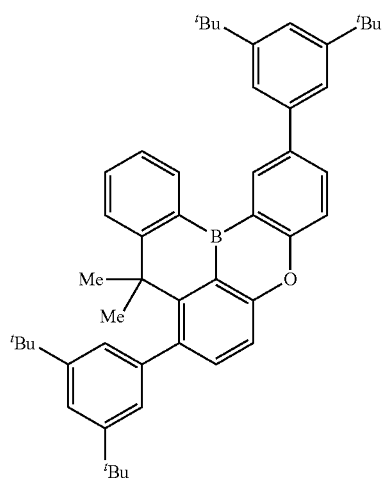
(1D-212)
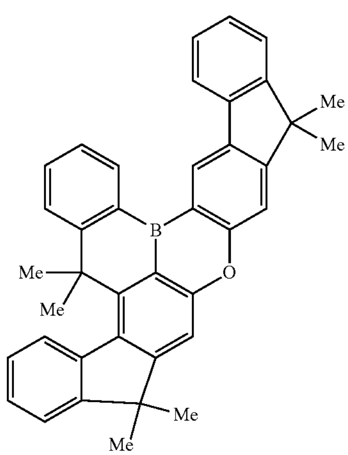
-continued
(1D-213)
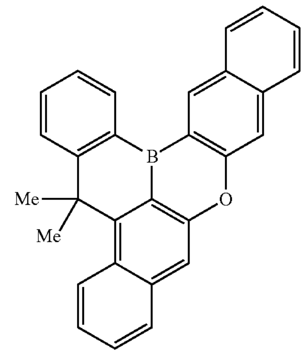
(1D-214)
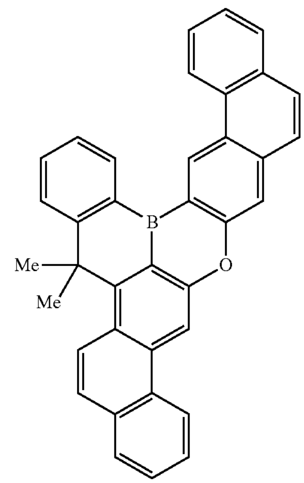
(1D-215)
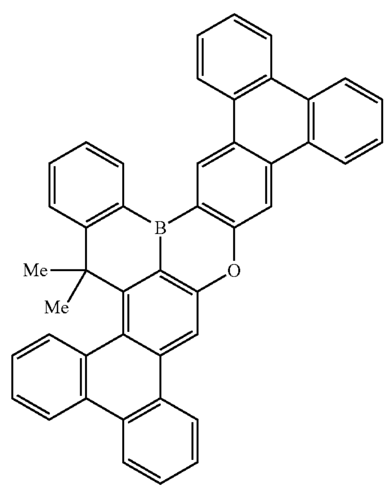
(1D-216)
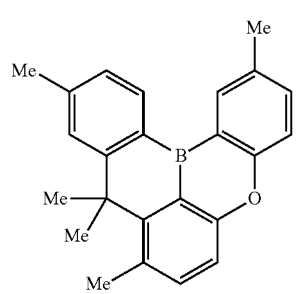

-continued
(1D-217)
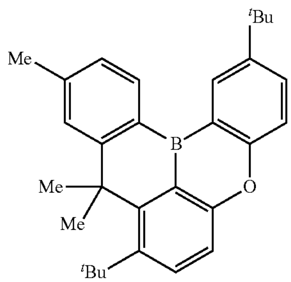
(1D-218)
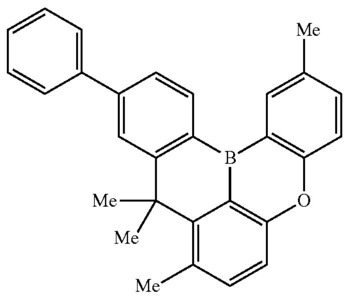
(1D-219)
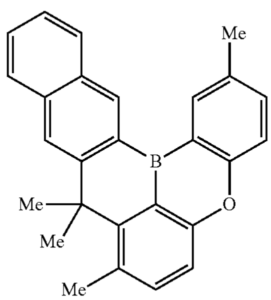
(1D-222)
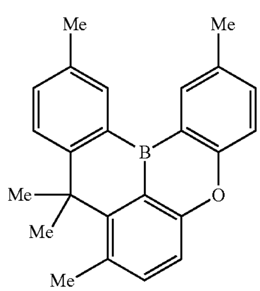
(1D-223)
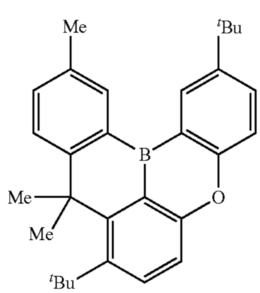
-continued
(1D-224)
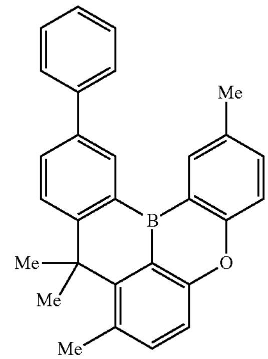
(1D-225)
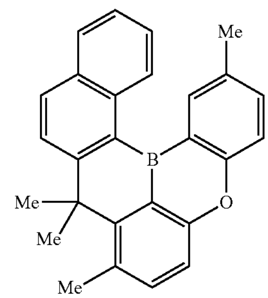
(1D-226)
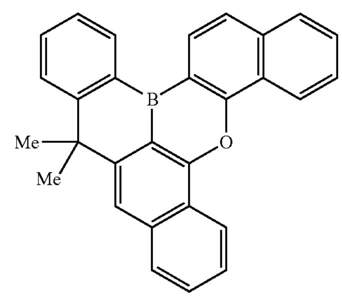
(1D-227)
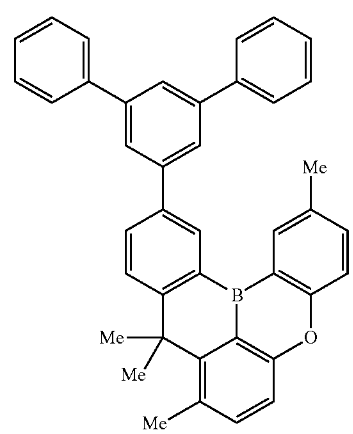

-continued
(1D-228)
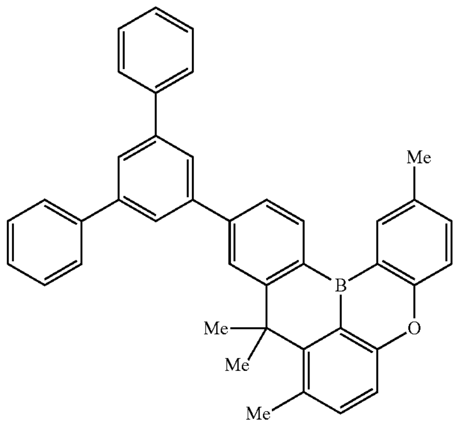
(1D-229)
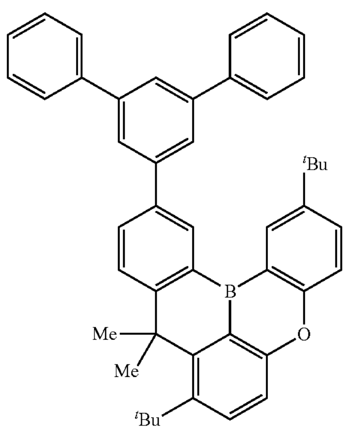
(1D-230)
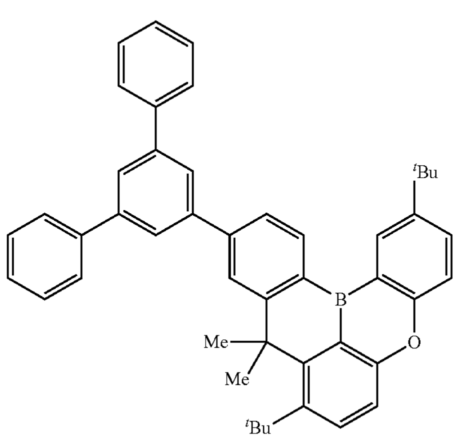
-continued
(1D-231)
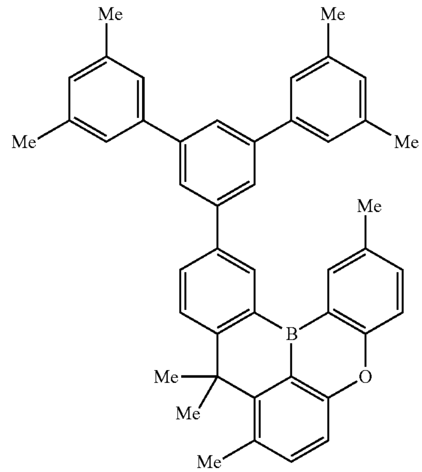
(1D-232)
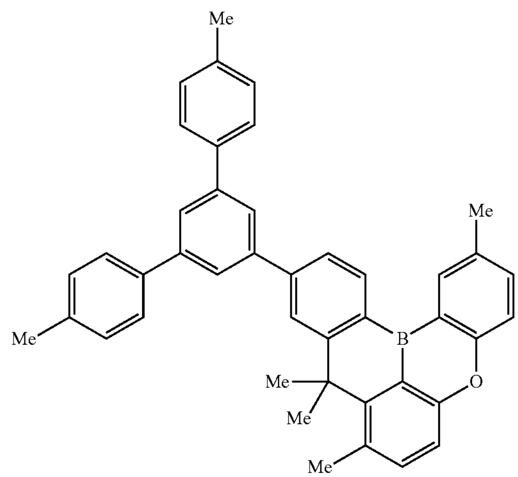
(1D-233)
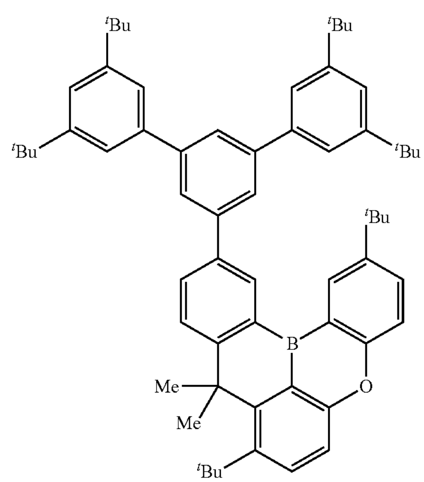

(1D-234)
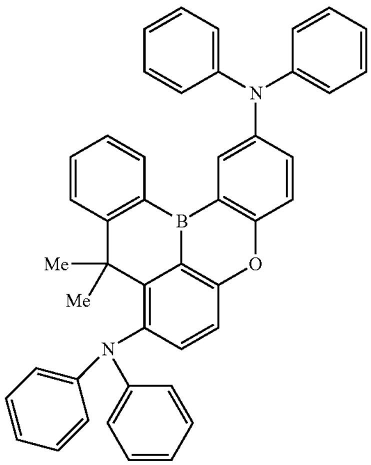
(1D-235)
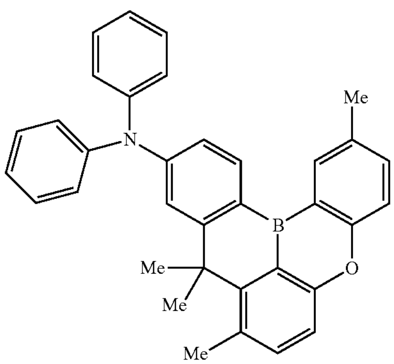
(1D-236)
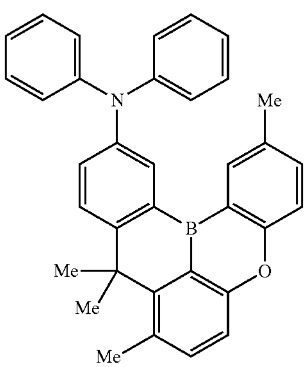
(1D-237)
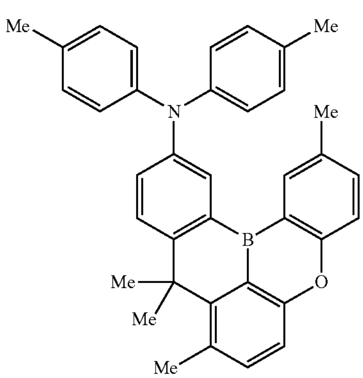
(1D-238)
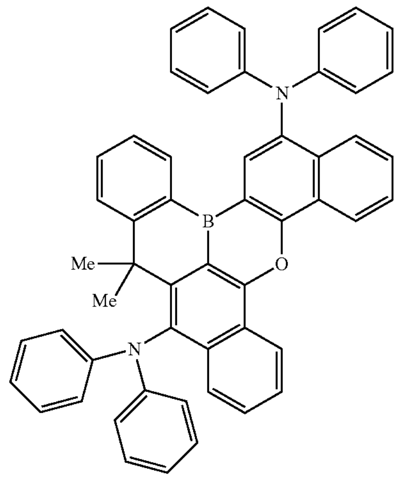
(1D-239)
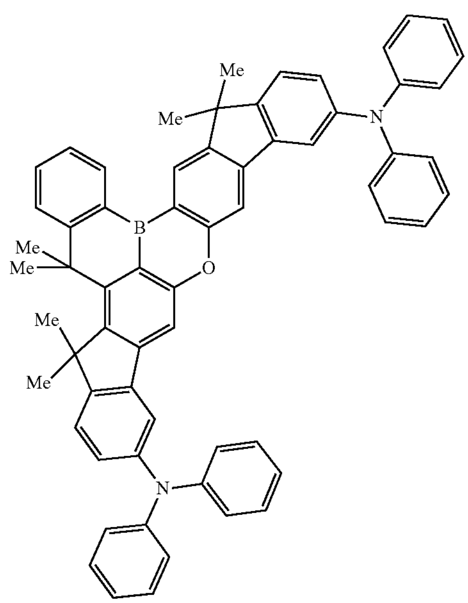

-continued
(1D-240)
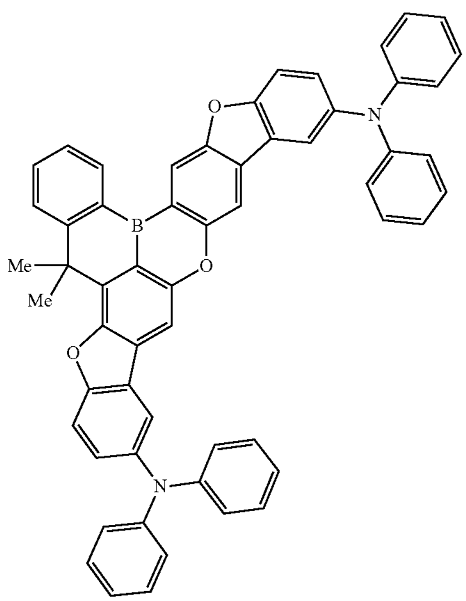
(1D-242)
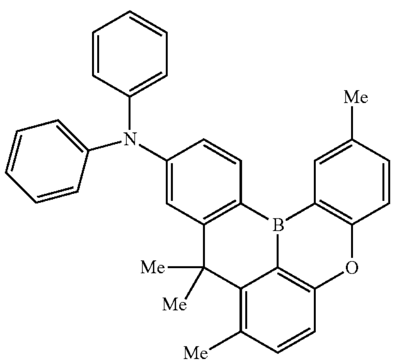
(1D-243)
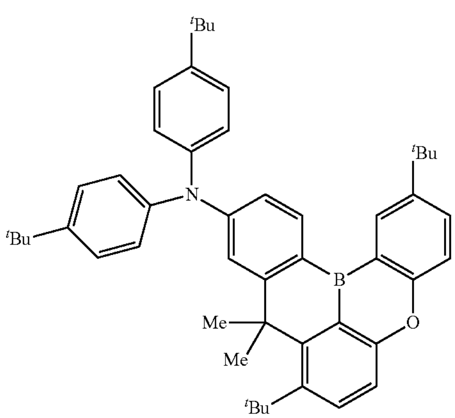
-continued
(1D-244)
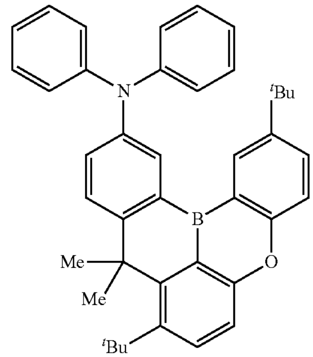
(1D-245)
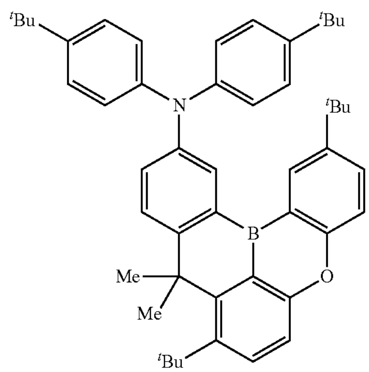
(1D-246)
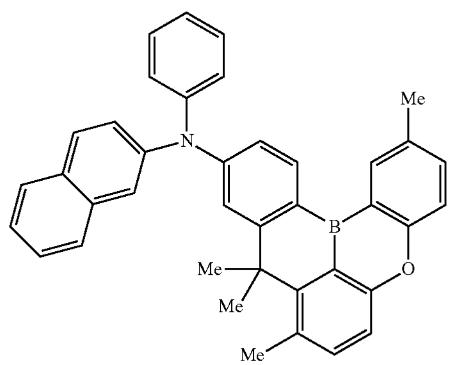
(1D-247)
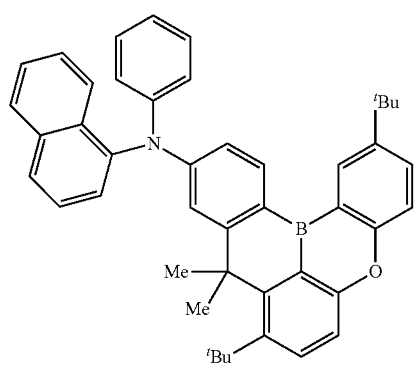

-continued
(1D-248)
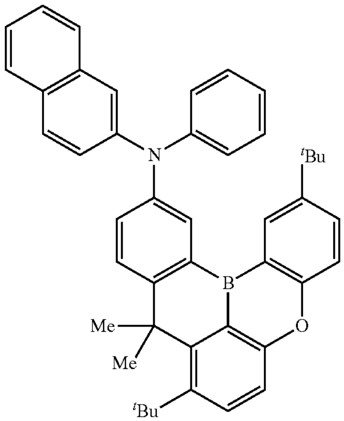
(1D-249)
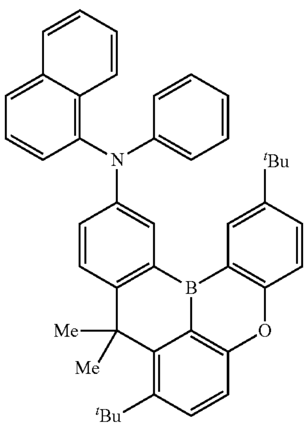
(1D-250)
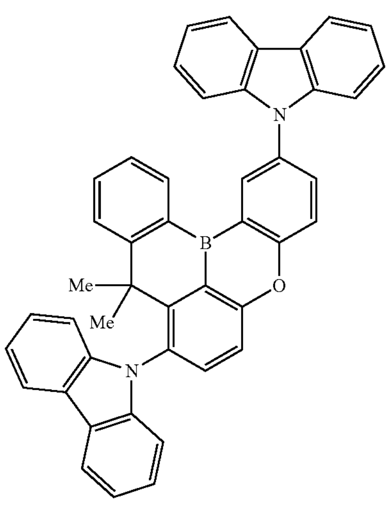
-continued
(1D-251)
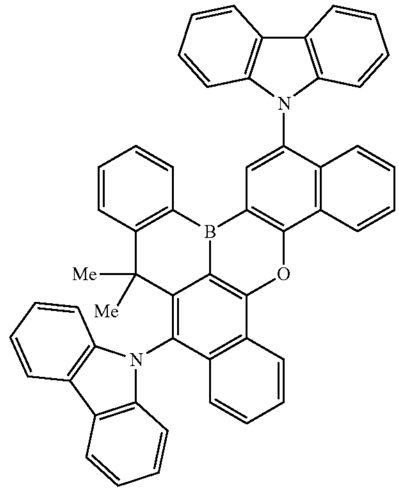
(1D-252)
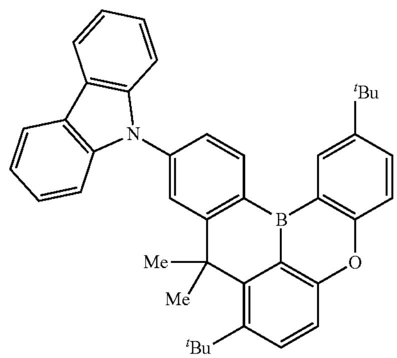
(1D-253)
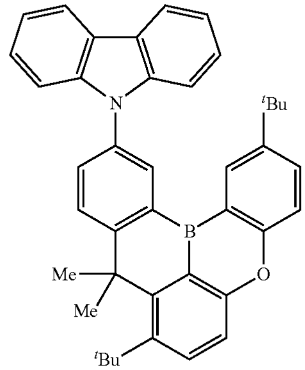

-continued
(1D-254)
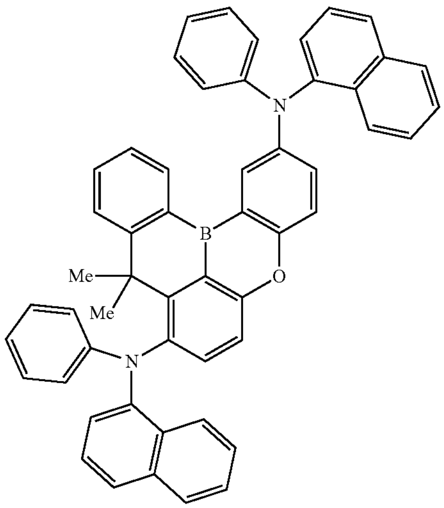
(1D-255)
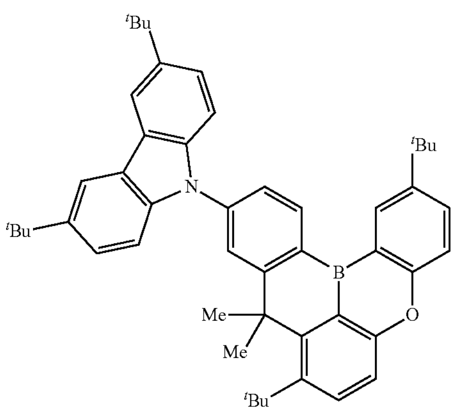
(1D-256)
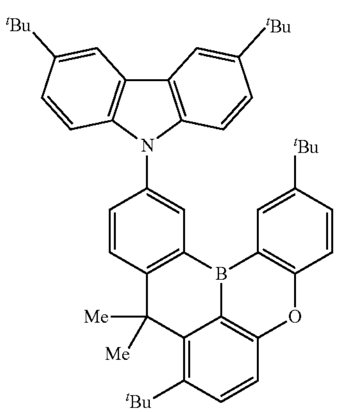
-continued
(1D-257)
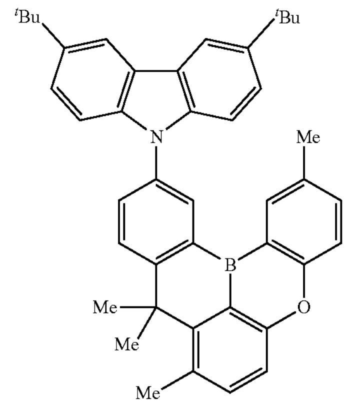
(1D-262)
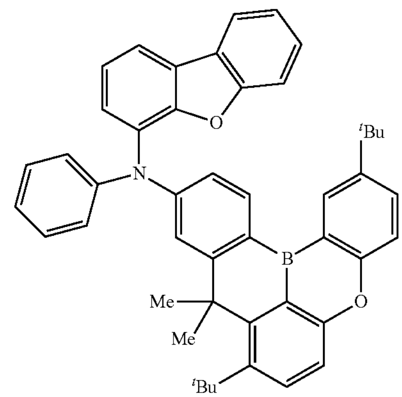
(1D-263)
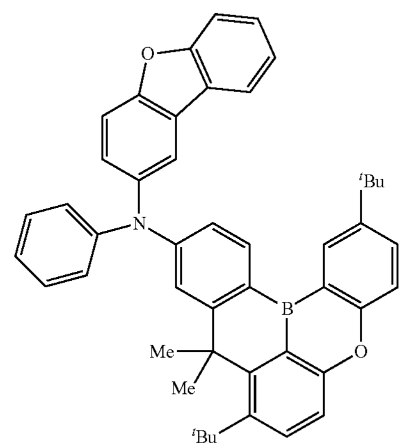
(1D-264)
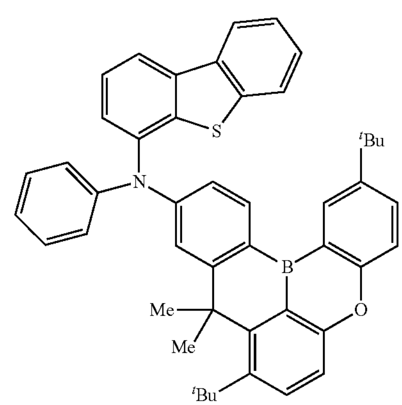

-continued
(1D-265)
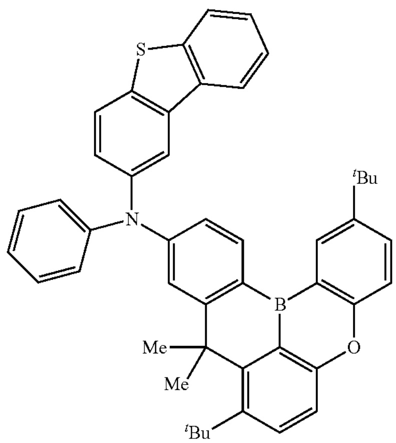
(1D-266)
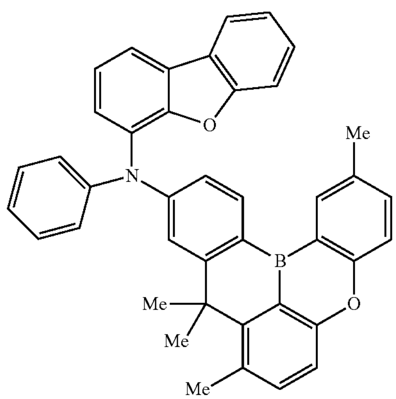
(1D-267)
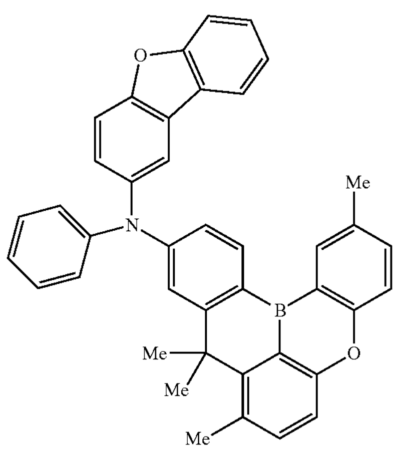
-continued
(1D-268)
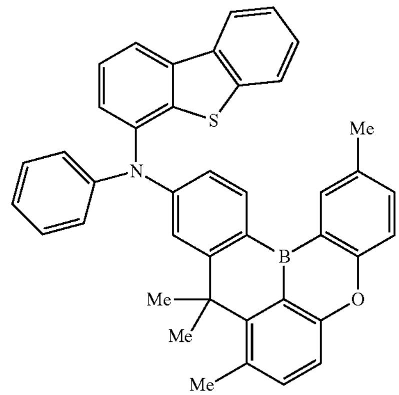
(1D-269)
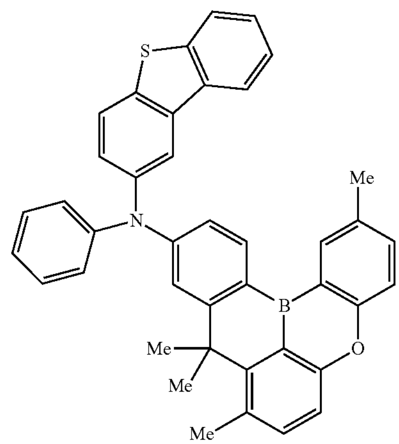
(1D-270)
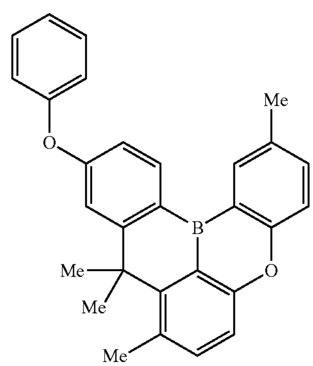
(1D-271)
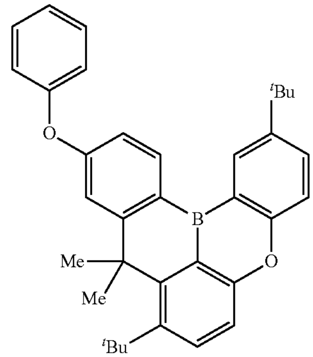

-continued
(1D-272)
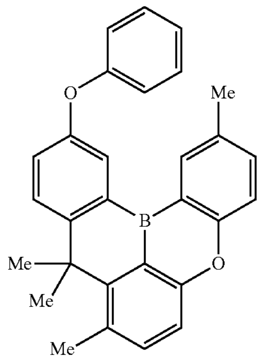
(1D-273)
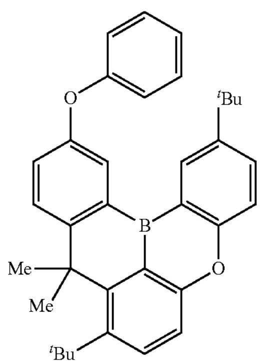
(1D-274)
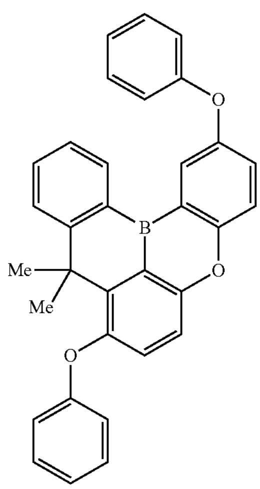
(1D-275)
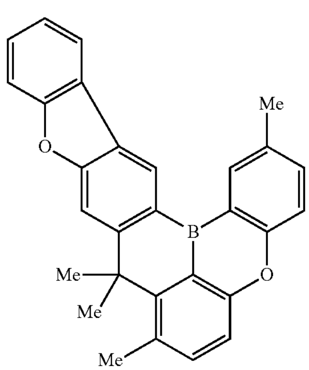
-continued
(1D-276)
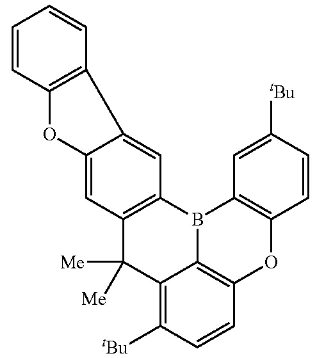
(1D-277)
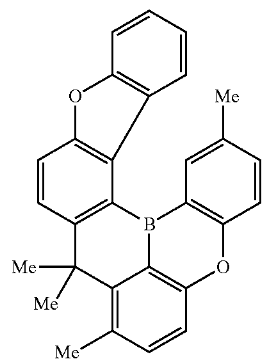
(1D-278)
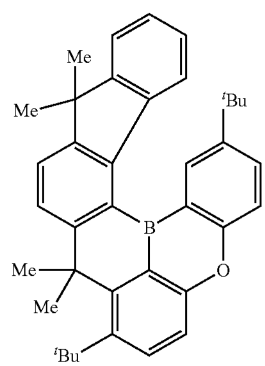
(1D-279)
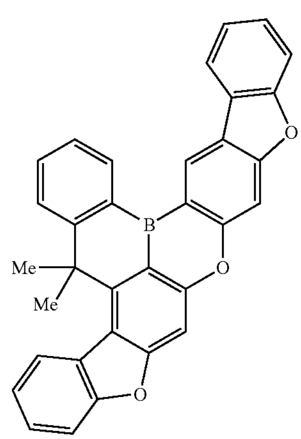

(1D-280)
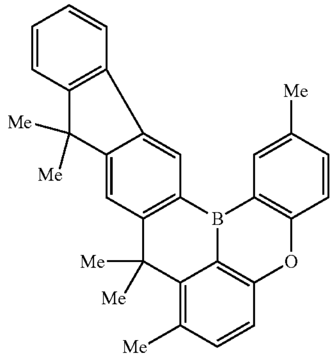
(1D-281)
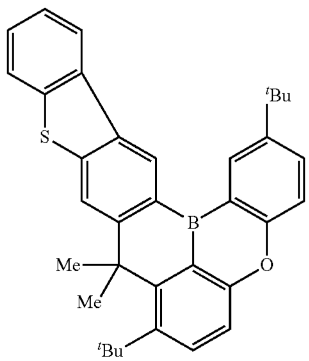
(1D-282)
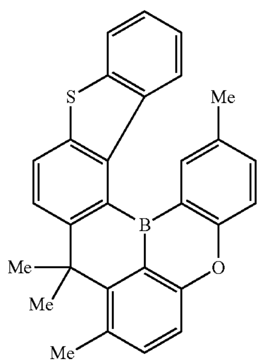
(1D-283)
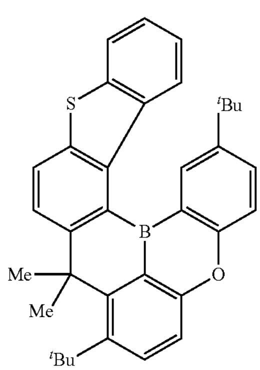
(1D-284)
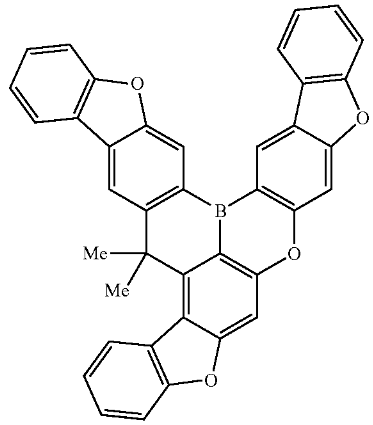
(1D-285)
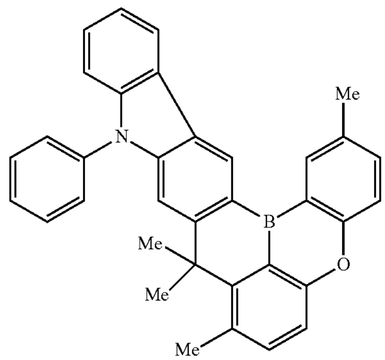
(1D-286)
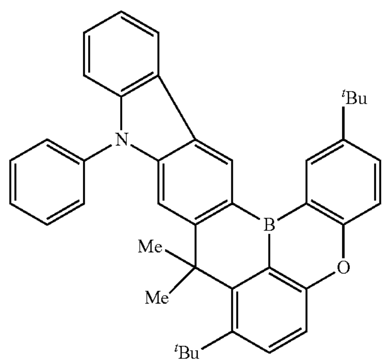
(1D-287)
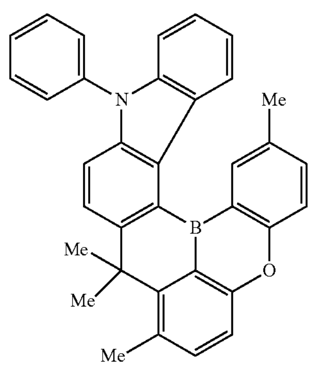

-continued
(1D-288)
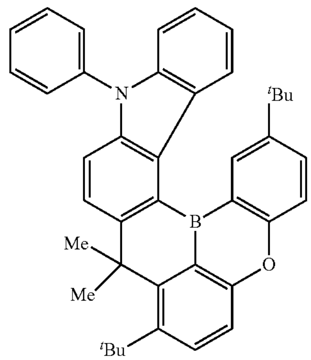
(1D-289)
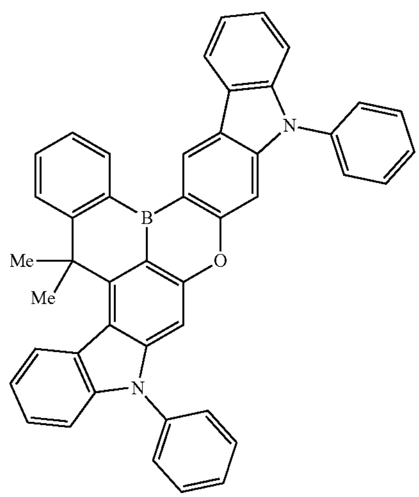
(1D-290)
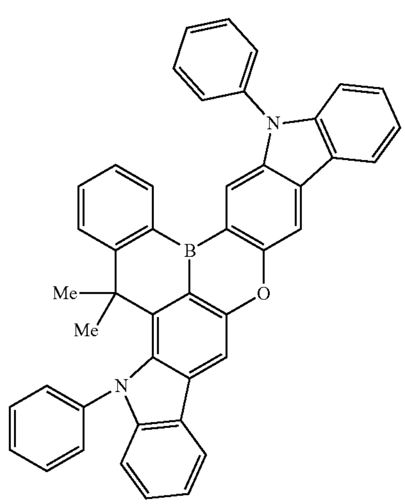
-continued
(1D-291)
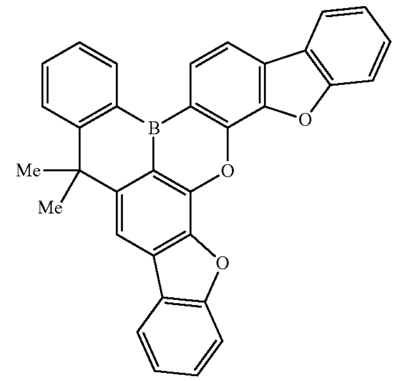
(1D-292)
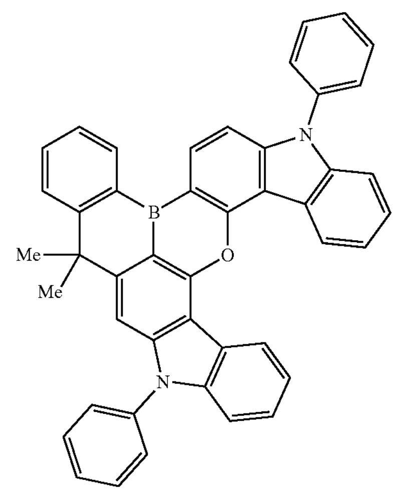
(1D-293)
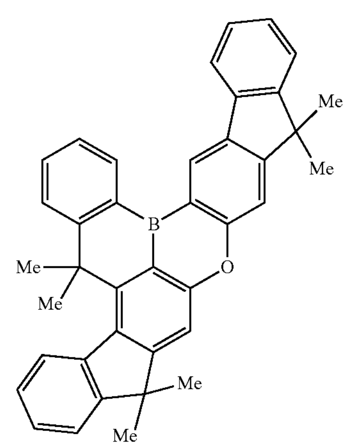

(1D-294)
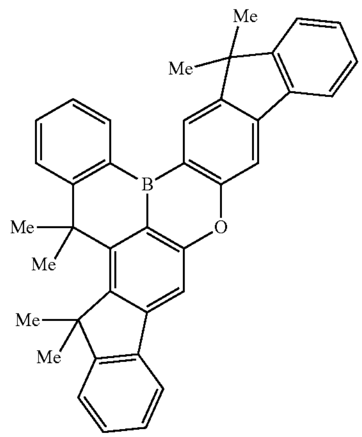
(1D-295)
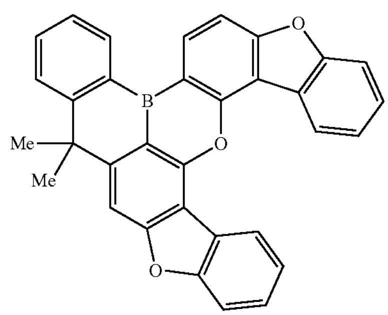
(1D-296)
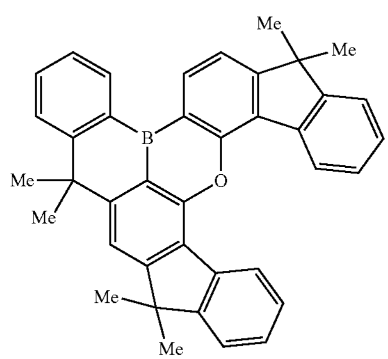
(1D-297)
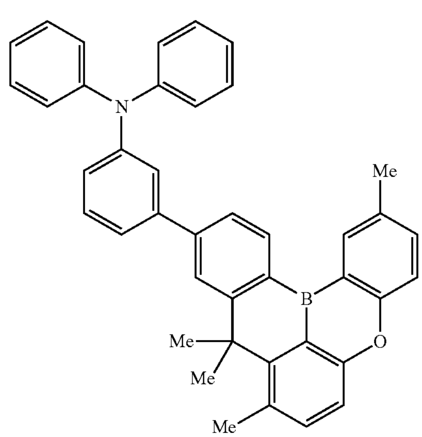
(1D-298)
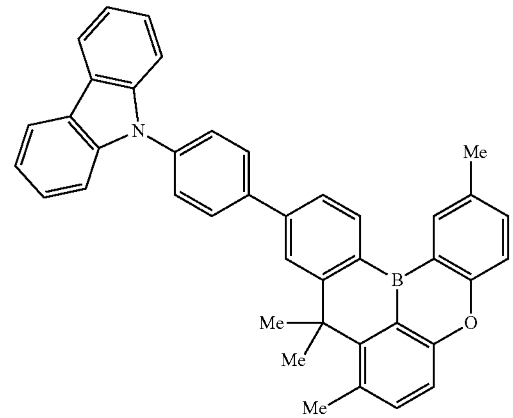
(1D-299)
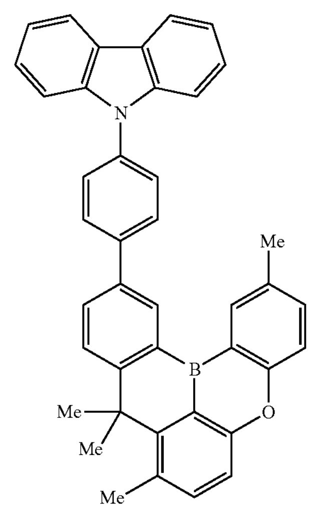
(1D-300)
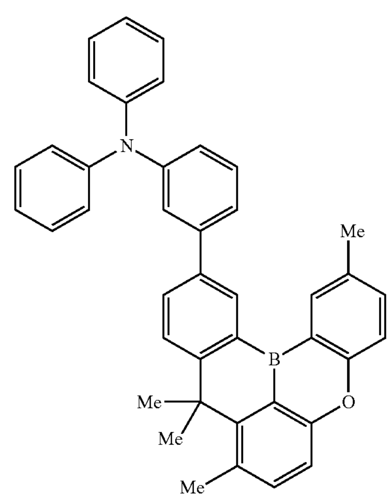

-continued
(1D-301)
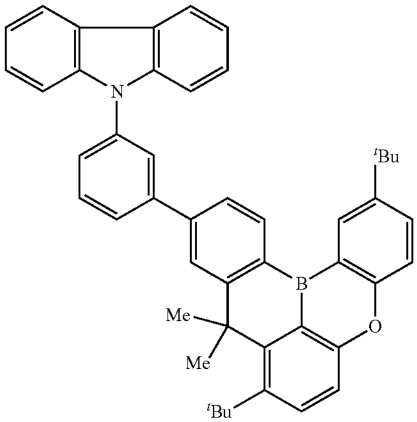
(1D-302)
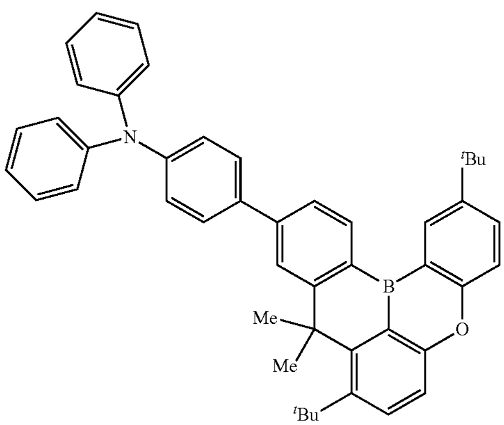
(1D-303)
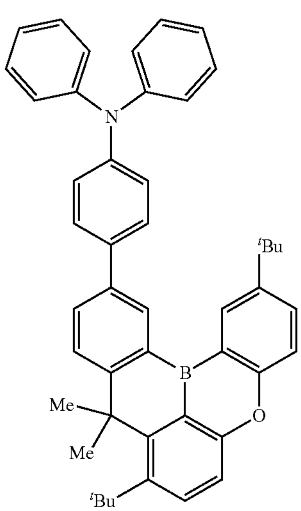
-continued
(1D-304)
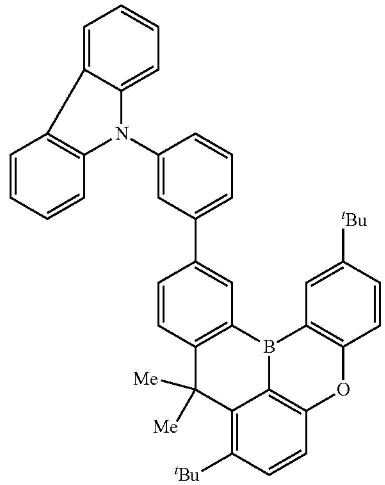
(1D-310)
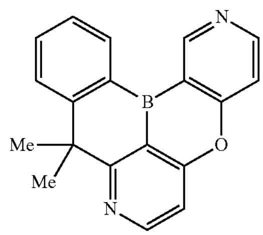
(1D-311)
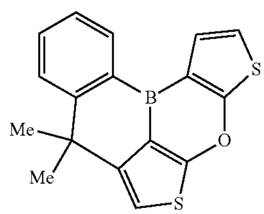
(1D-312)
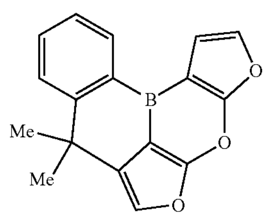
(1D-313)
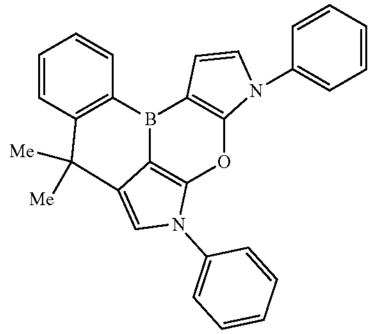

-continued
(1D-314)
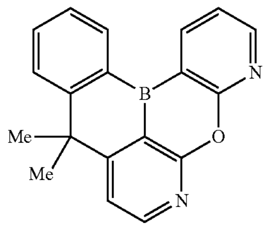
(1D-315)
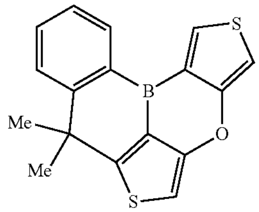
(1D-316)
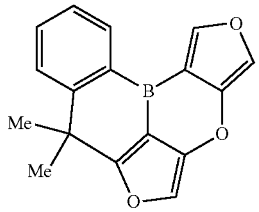
(1D-317)
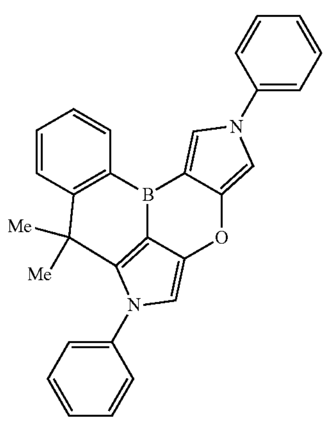
(1D-318)
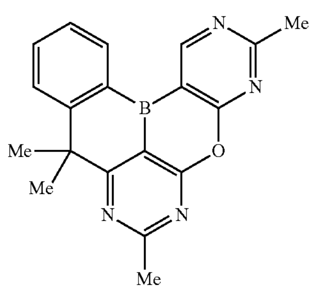
(1D-319)
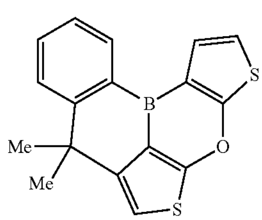
-continued
(1D-320)
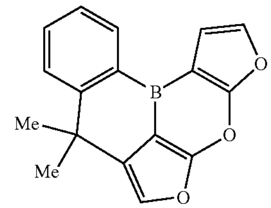
(1D-321)
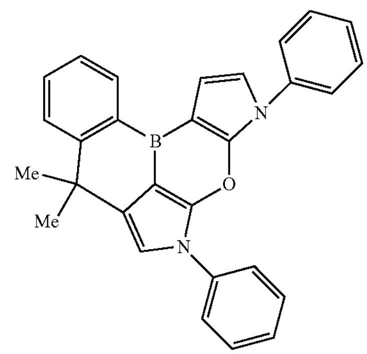
(1D-322)
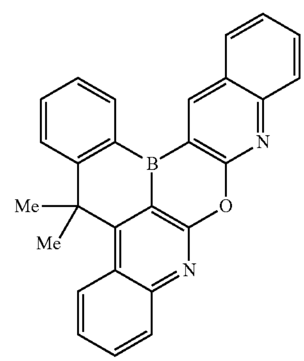
(1D-323)
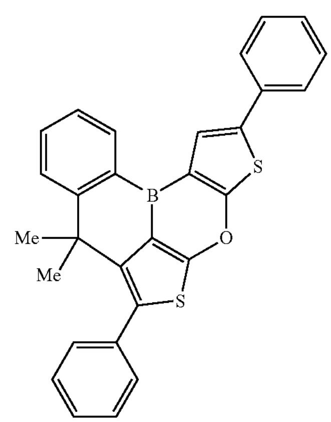

-continued
(1D-324)
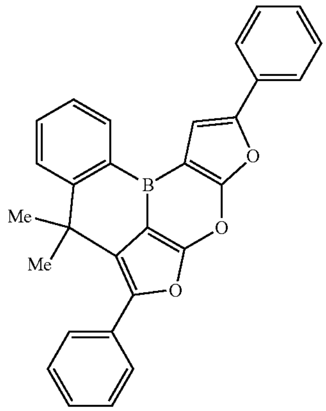
(1D-325)
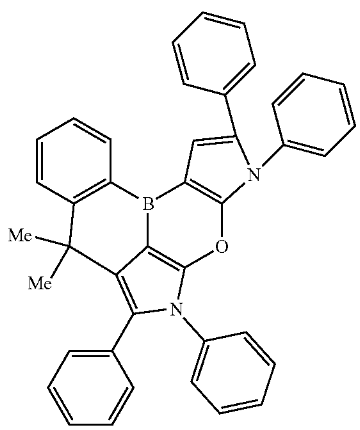
(1D-326)
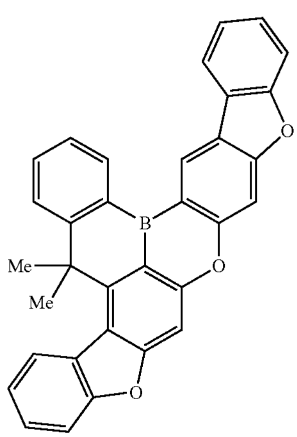
-continued
(1D-327)
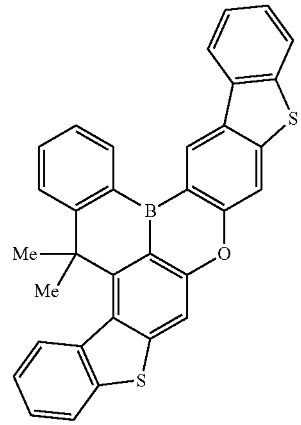
(1D-328)
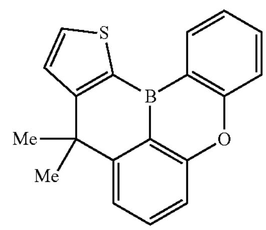
(1D-329)
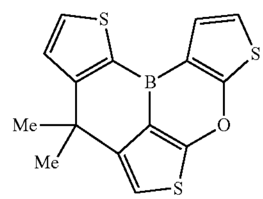
(1D-335)
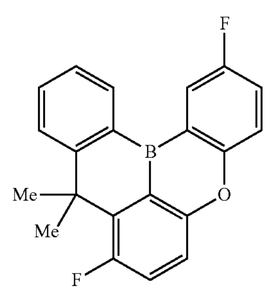
(1D-336)
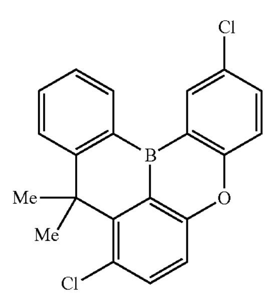

-continued
(1D-337)
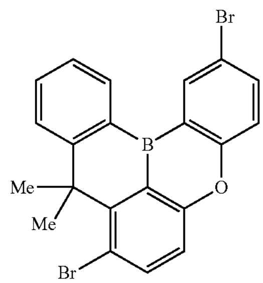
(1D-338)
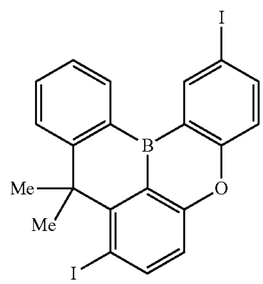
(1D-339)
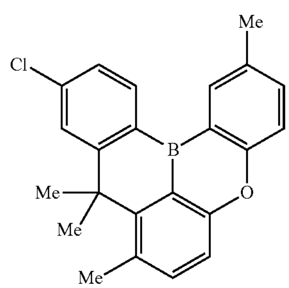
(1D-340)
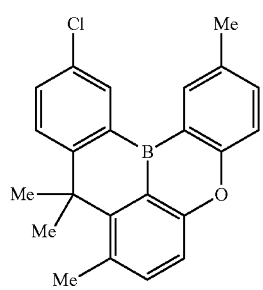
(1D-341)
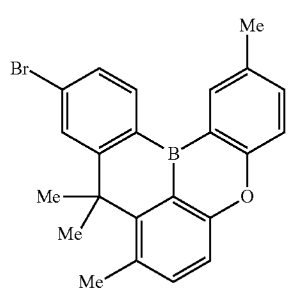
-continued
(1D-342)
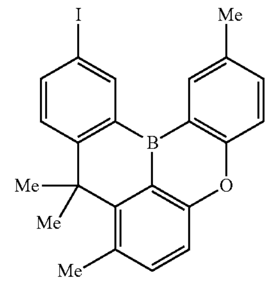
(1D-343)
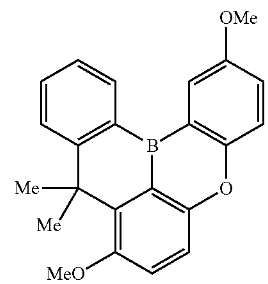
(1D-344)
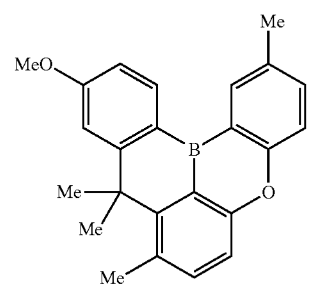
(1D-345)
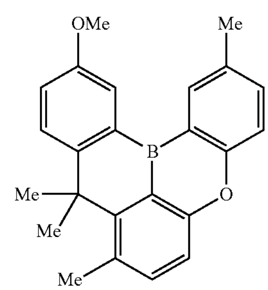
(1D-346)
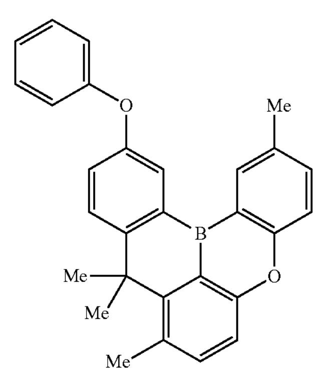

-continued
(1D-347)
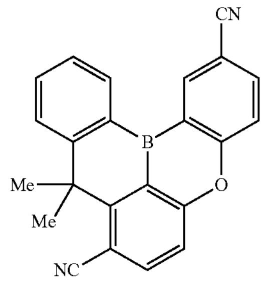
(1D-348)
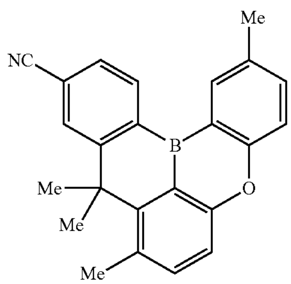
(1D-349)
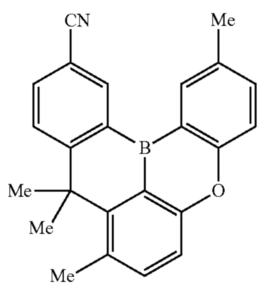
(1D-350)
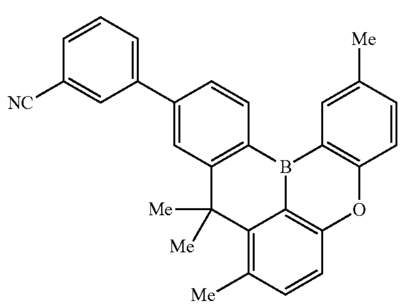
(1D-351)
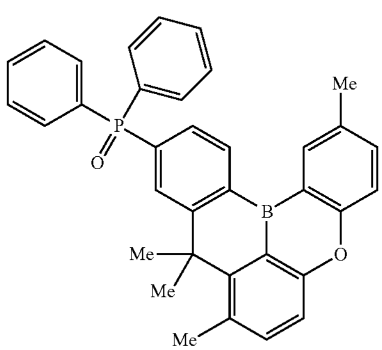
-continued
(1D-352)
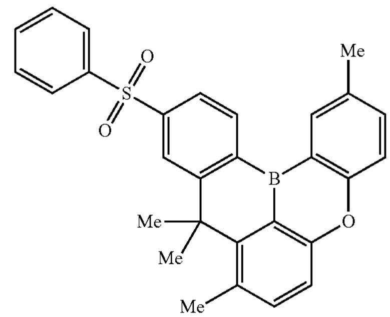
(1D-353)
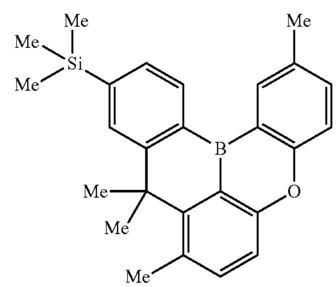
(1D-354)
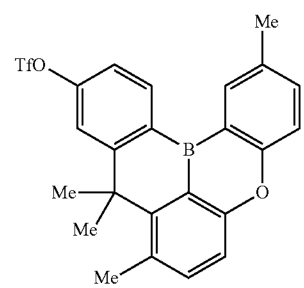
(1D-355)
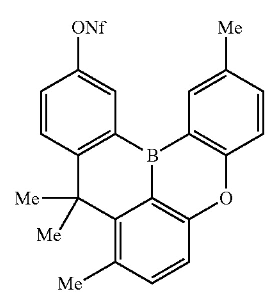
(1D-356)
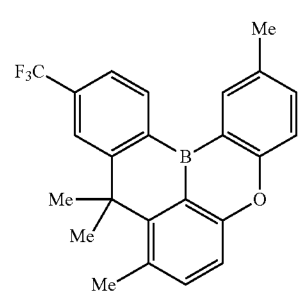

-continued
(1D-357)
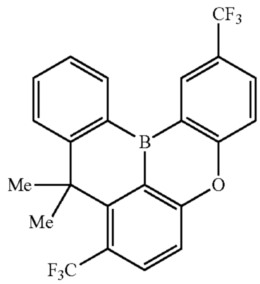
(1D-358)
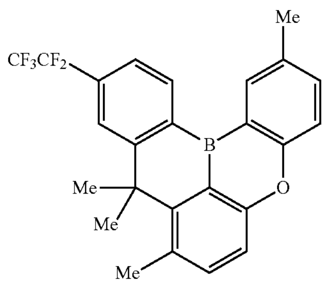
(1D-360)
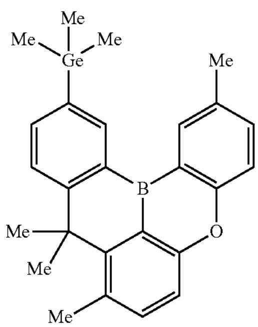
(1D-361)
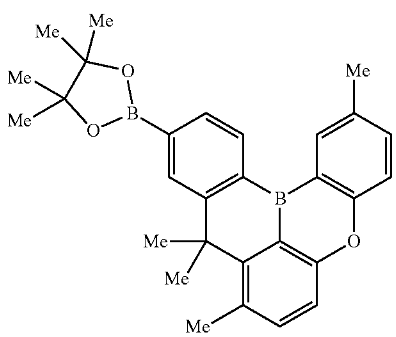
(1D-362)
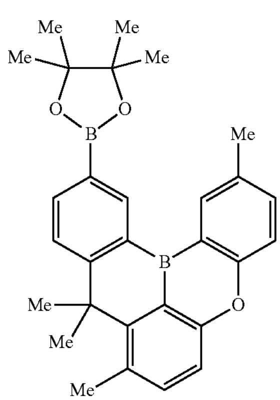
-continued
(1D-363)
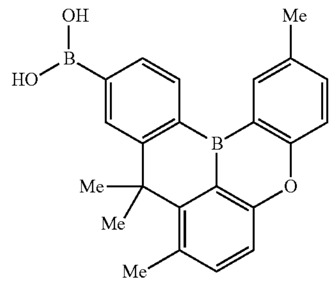
(1D-364)
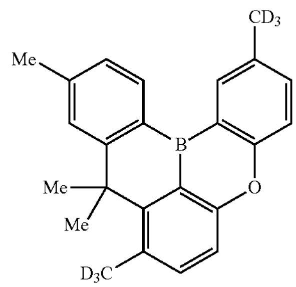
(1D-365)
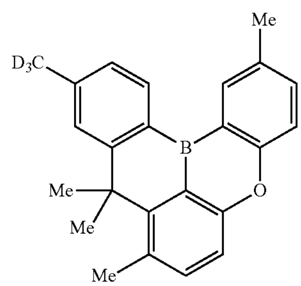
(1D-366)
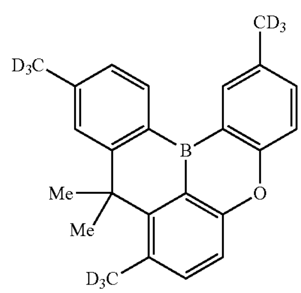
(1D-367)
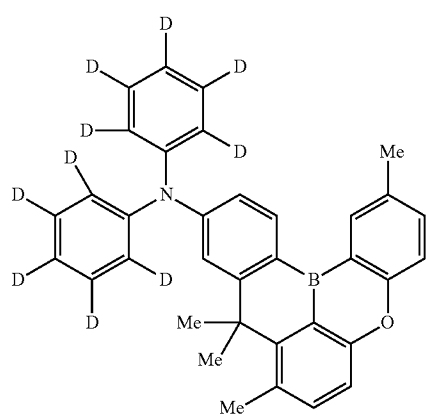

(1D-368)
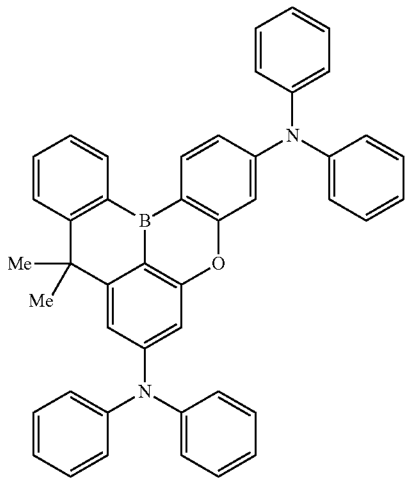
(1D-369)
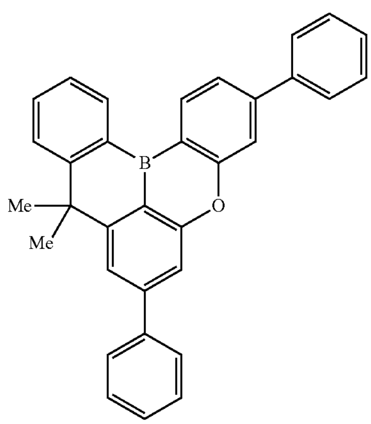
(1D-370)
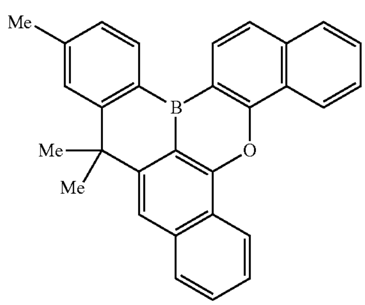
(1D-371)
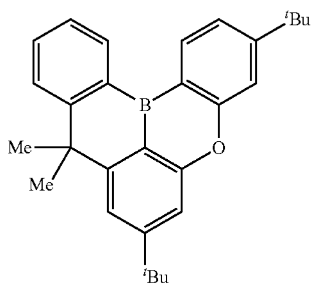
(1D-372)
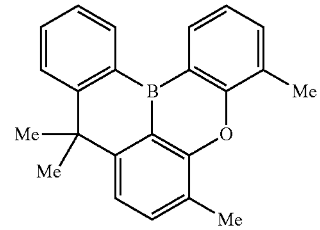
(1D-373)
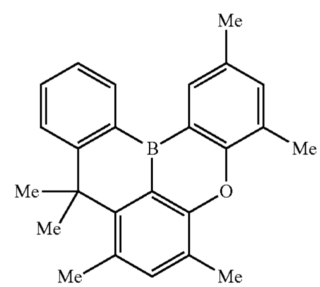
(1D-374)
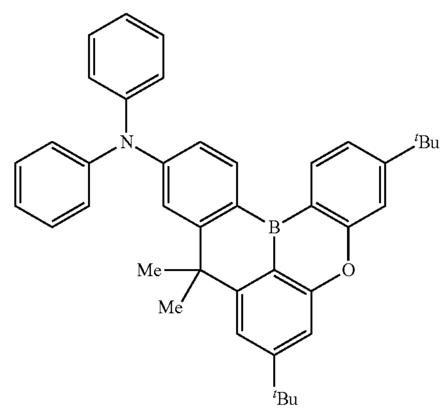
(1D-375)
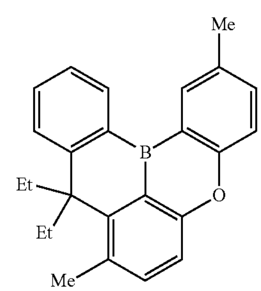
(1D-376)
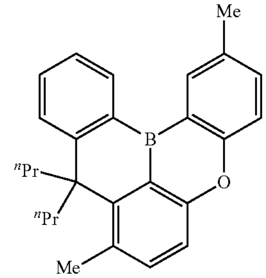

-continued
(1D-377)
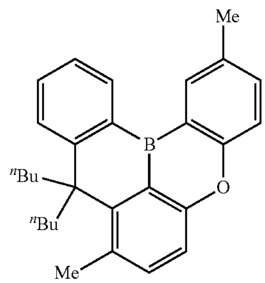
(1D-380)
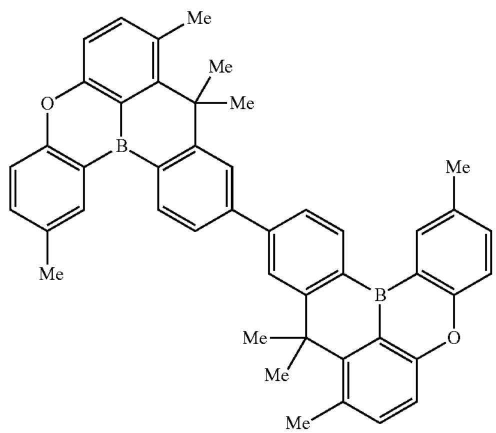
(1D-381)
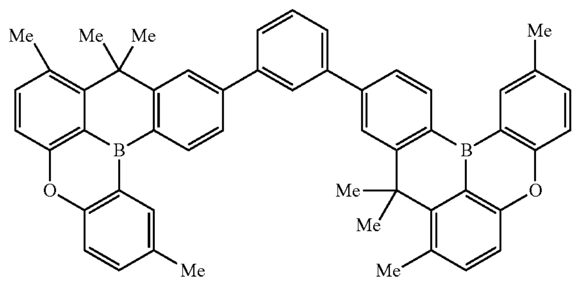
(1D-382)
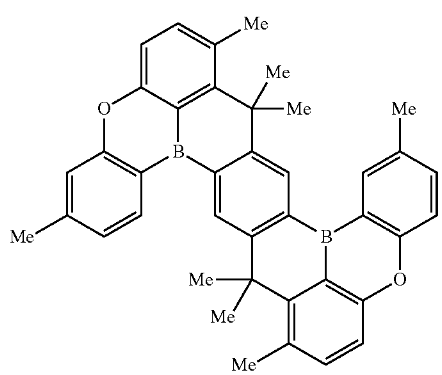
-continued
(1D-383)
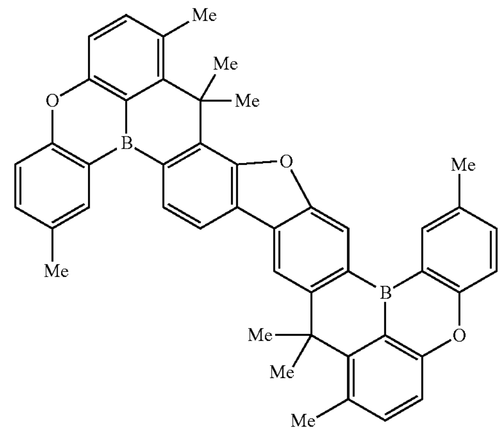
(1D-384)
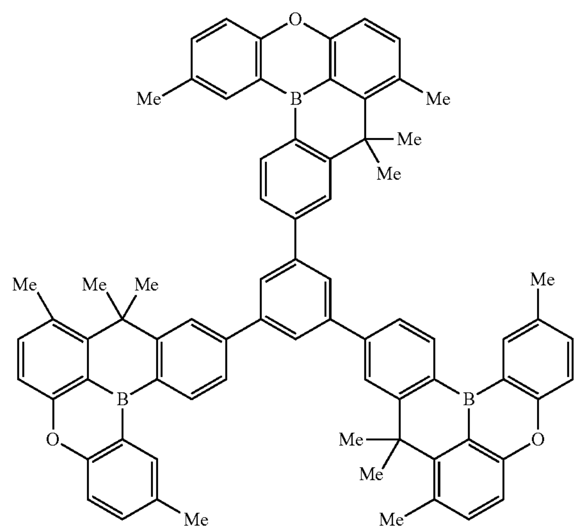
(1D-385)
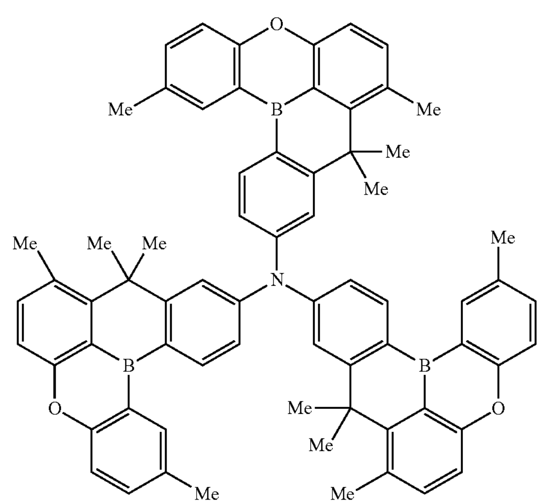

(1E-1)
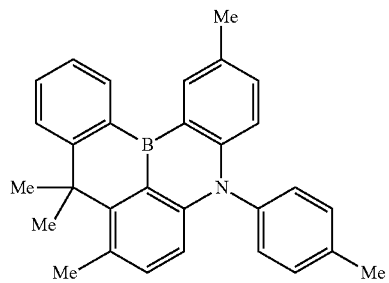
(1E-2)
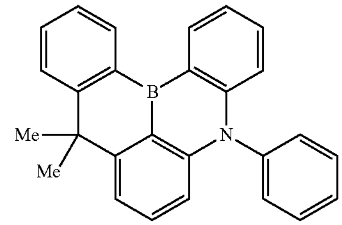
(1E-3)
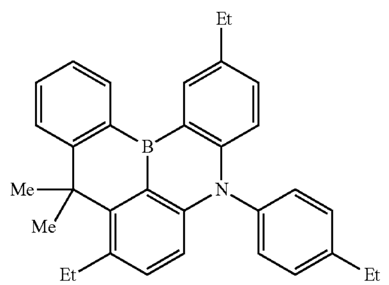
(1E-4)
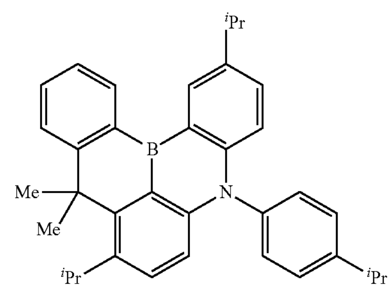
(1E-5)
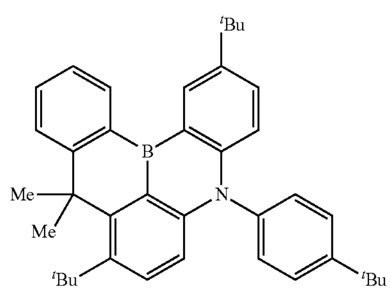
(1E-6)
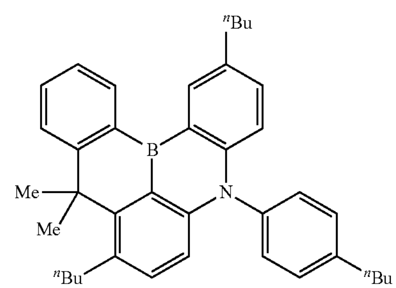
(1E-7)
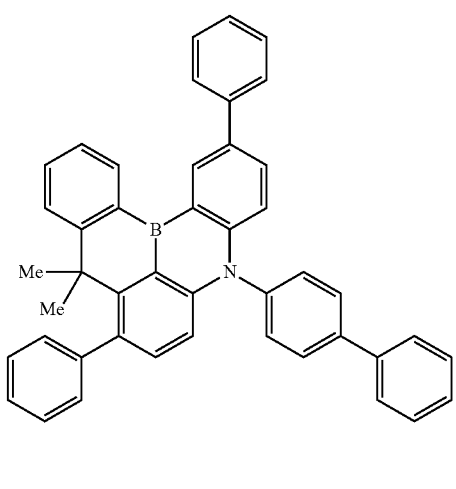
(1E-8)
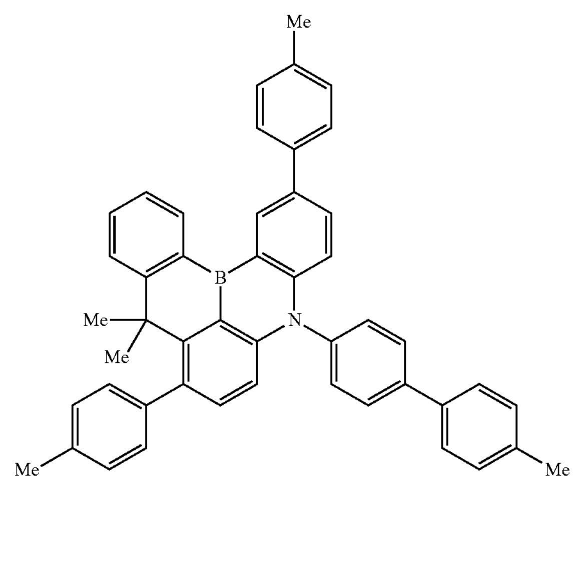

-continued
(1E-9)
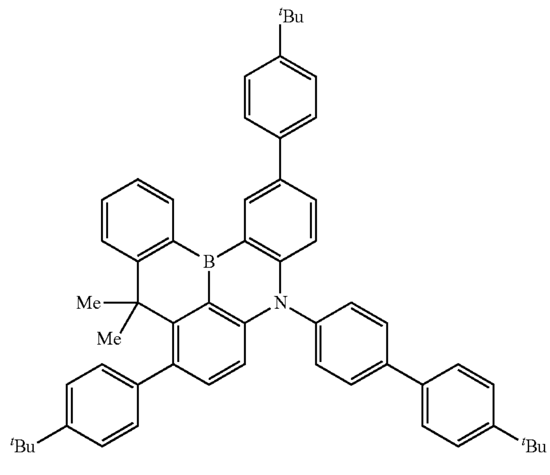
(1E-10)
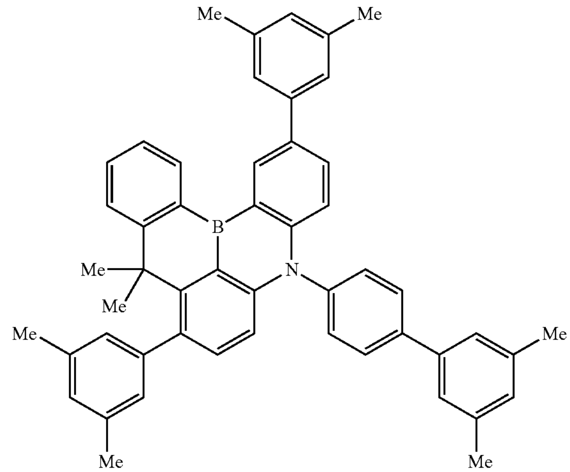
(1E-11)
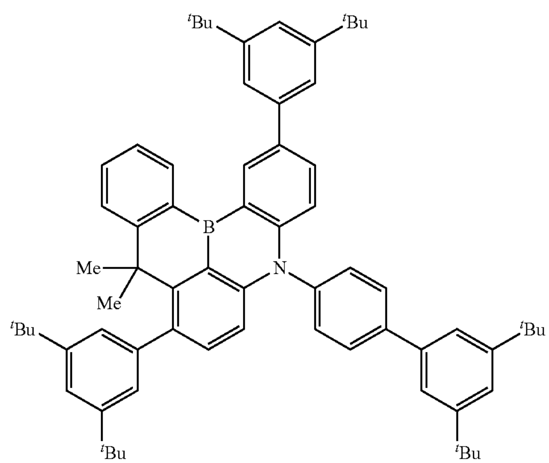
(1E-12)
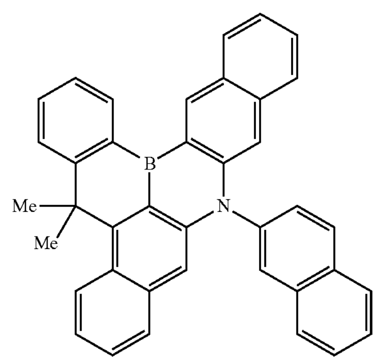
(1E-13)
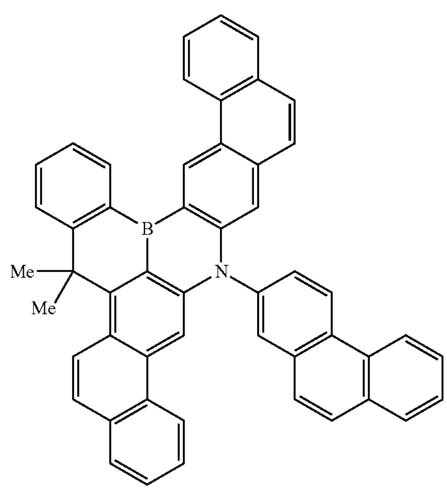
(1E-14)
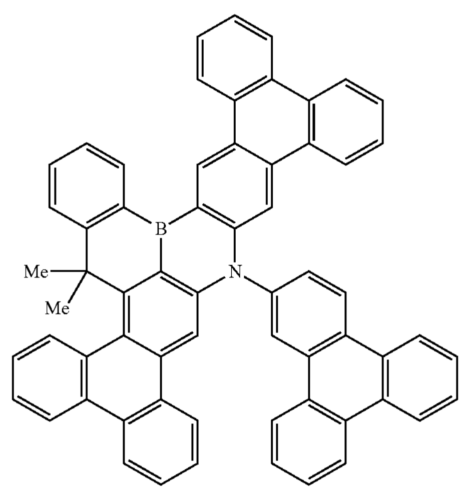

-continued
(1E-15)
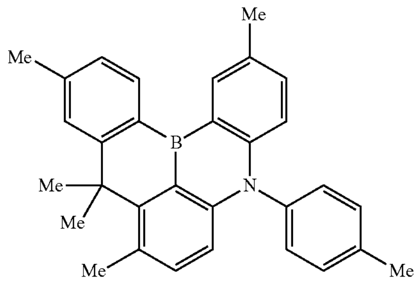
(1E-16)
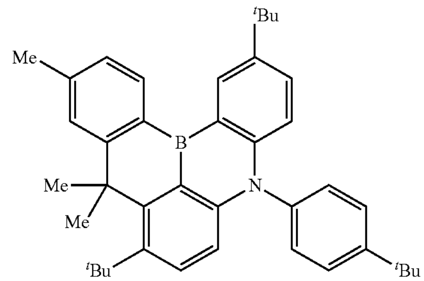
(1E-17)
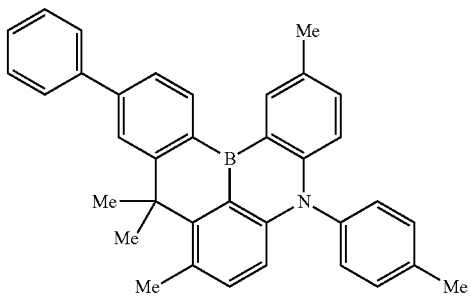
(1E-18)
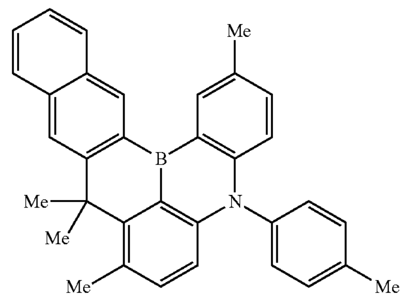
(1E-22)
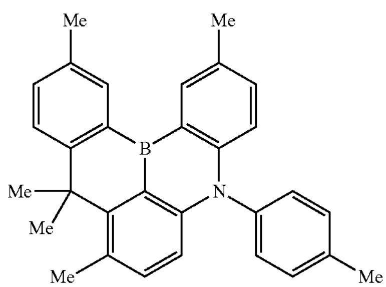
(1E-23)
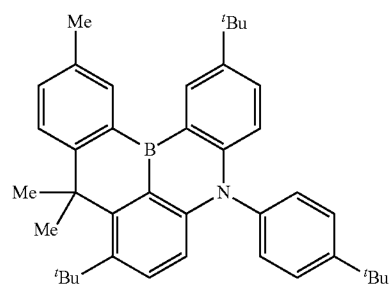
(1E-24)
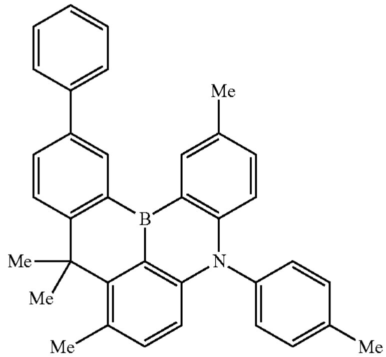
(1E-25)
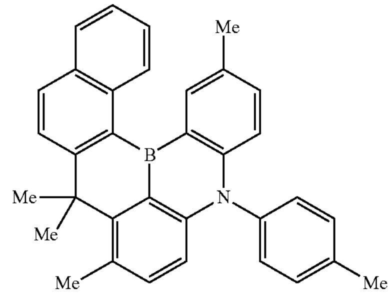

-continued
(1E-26)
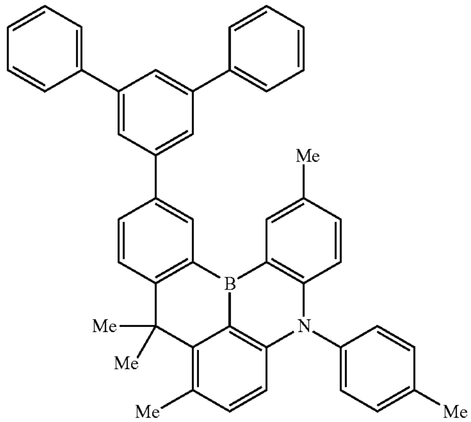
(1E-27)
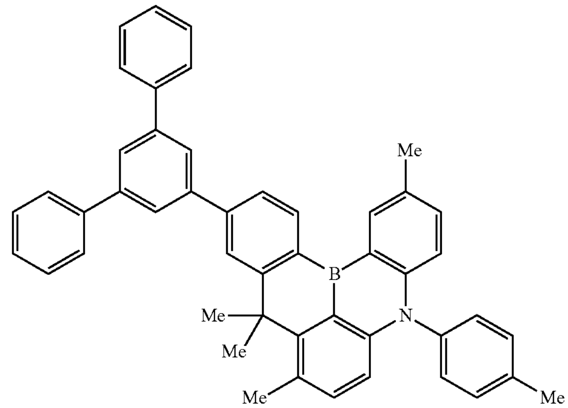
(1E-28)
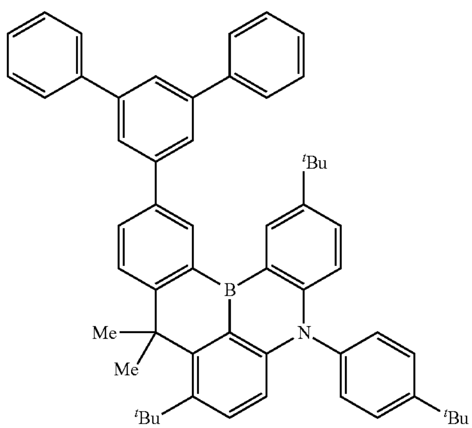
(1E-29)
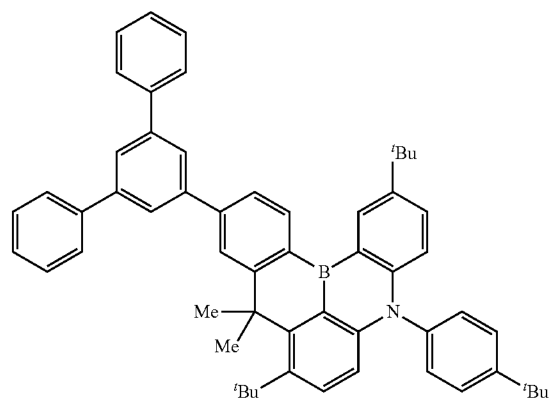
(1E-30)
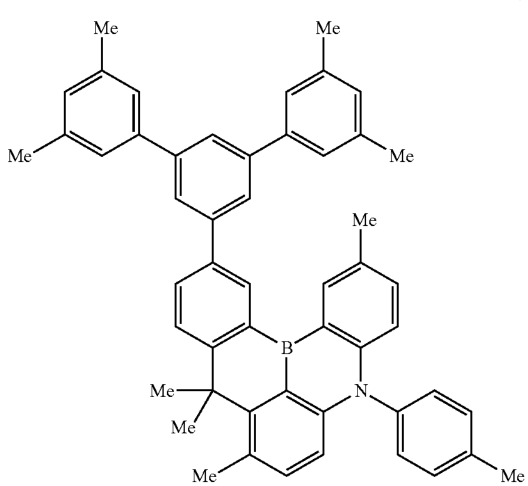
(1E-31)
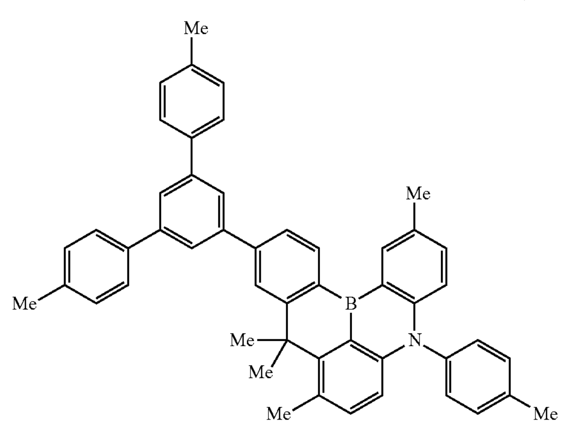

-continued
(1E-32)
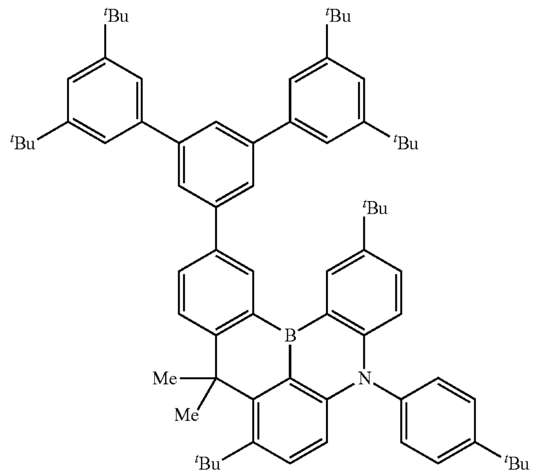
(1E-34)
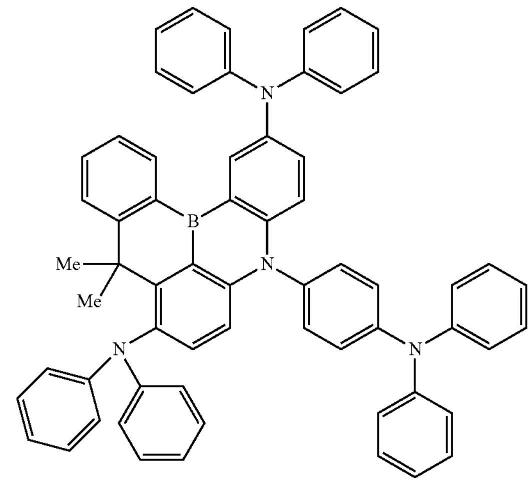
(1E-35)
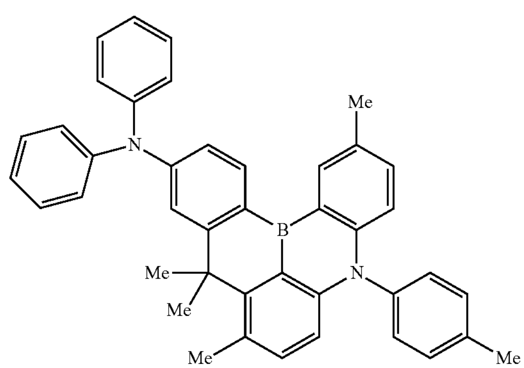
(1E-36)
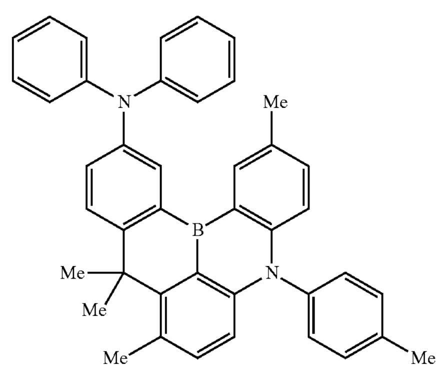
(1E-37)
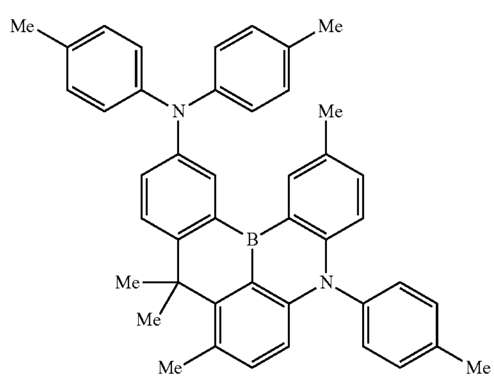
(1E-42)
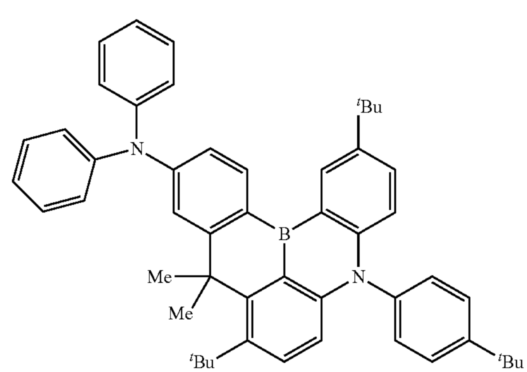

-continued
(1E-43)
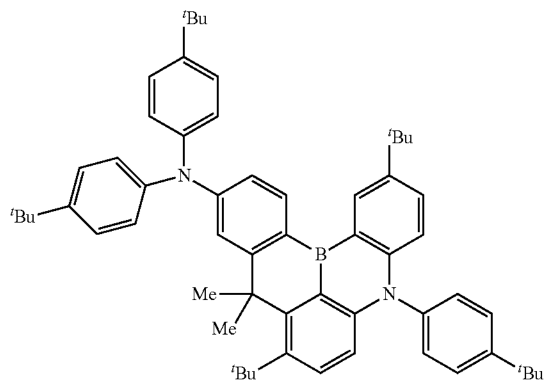
(1E-44)
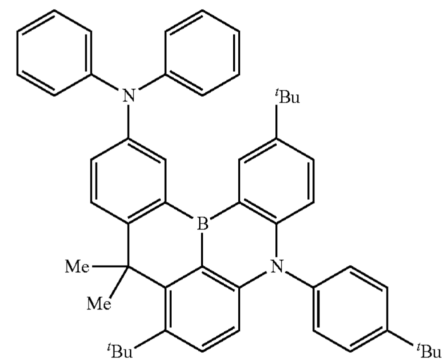
(1E-45)
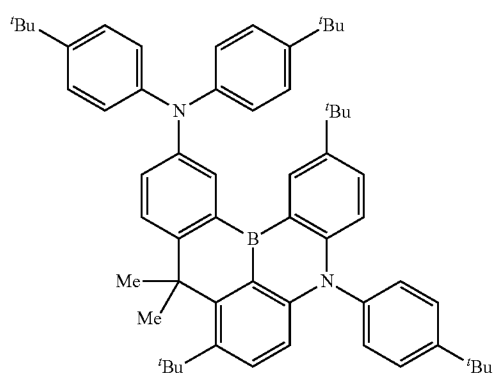
(1E-46)
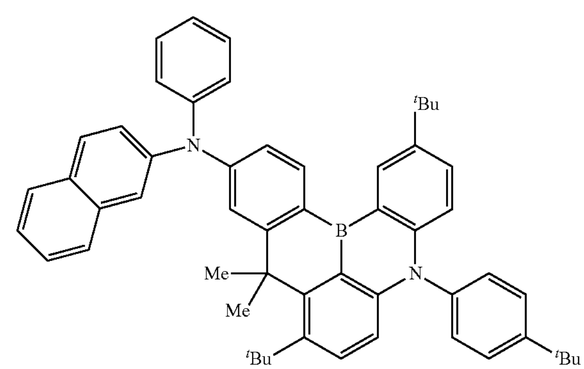
(1E-47)
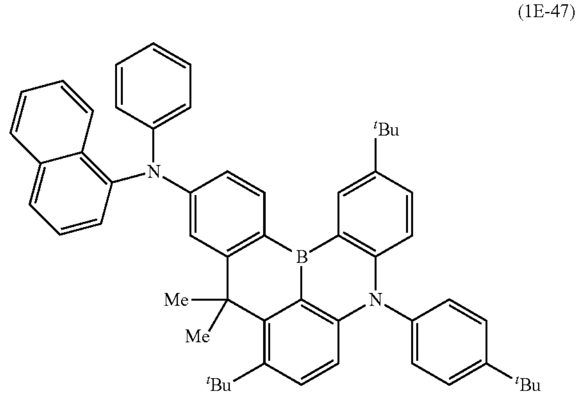
(1E-48)
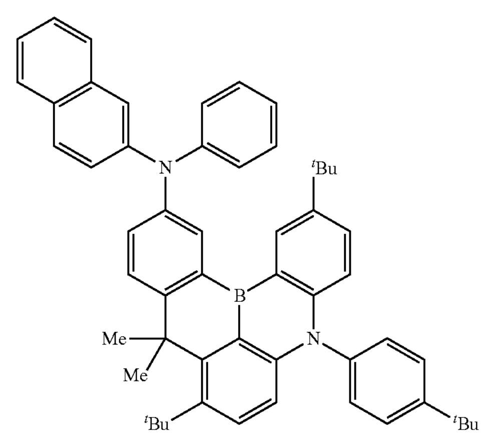

-continued
(1E-49)
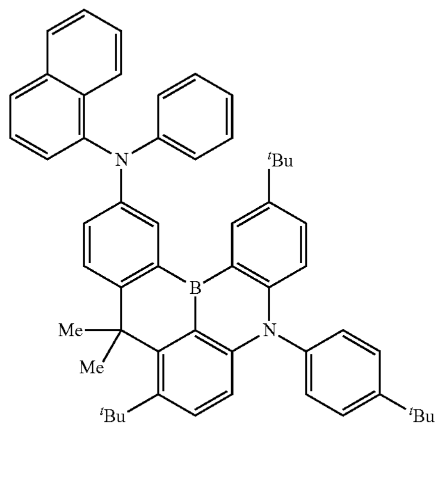
(1E-50)
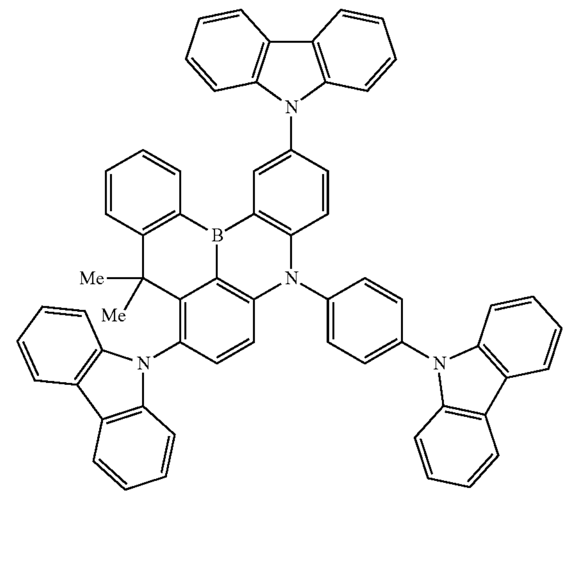
(1E-51)
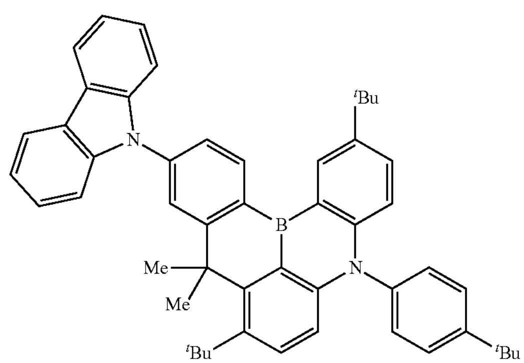
(1E-52)
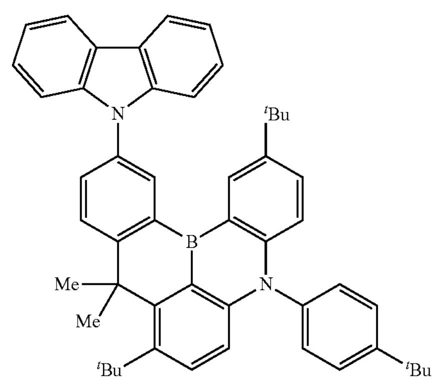
(1E-53)
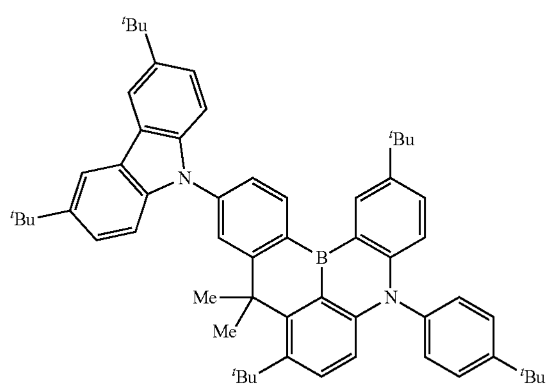
(1E-54)
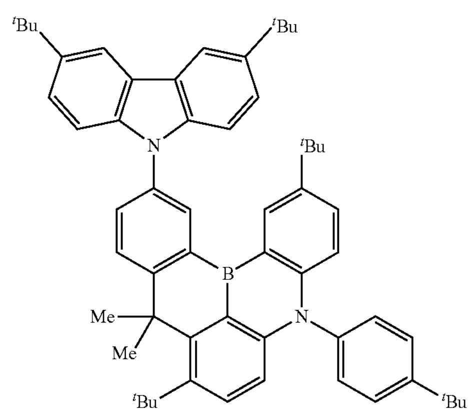

-continued
(1E-55)
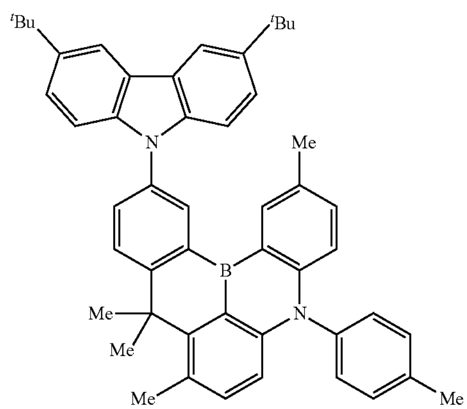
(1E-62)
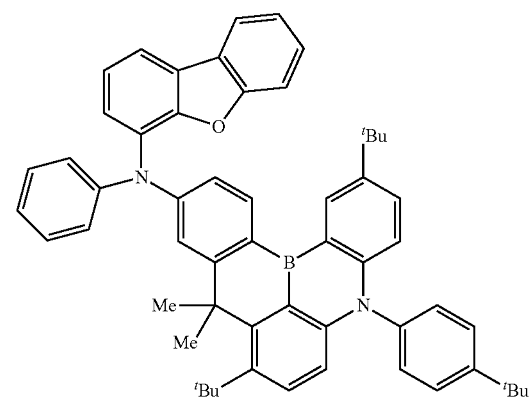
(1E-63)
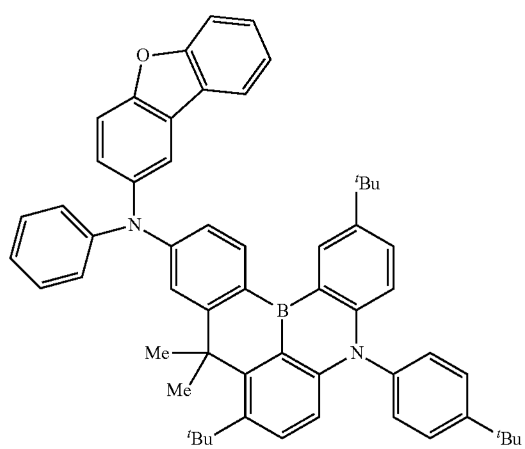
(1E-64)
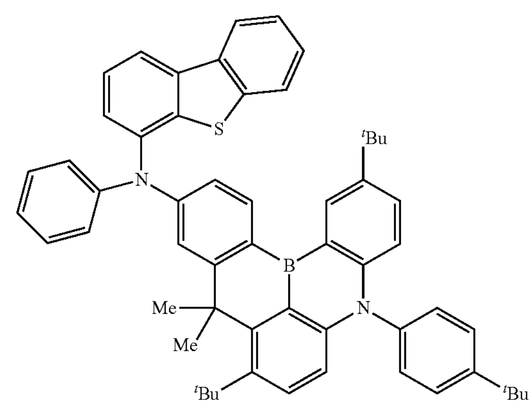
(1E-65)
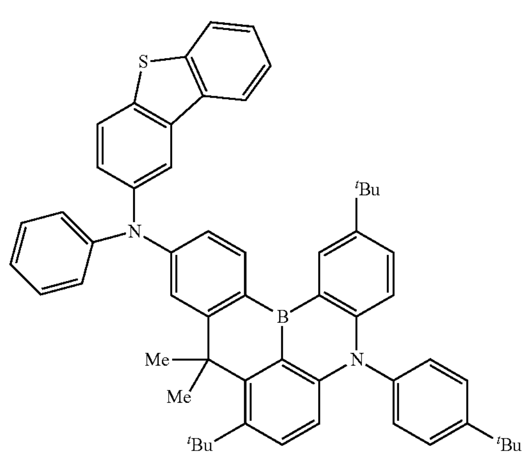
(1E-66)
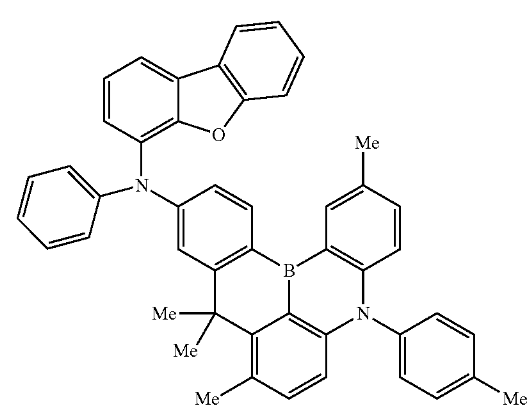

-continued
(1E-67)
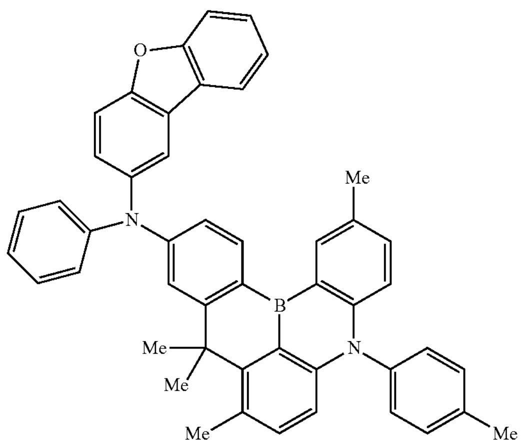
(1E-68)
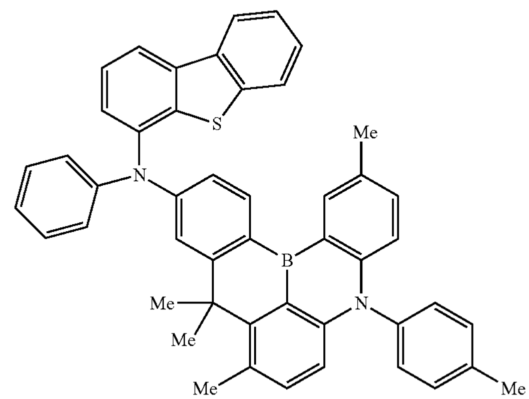
(1E-69)
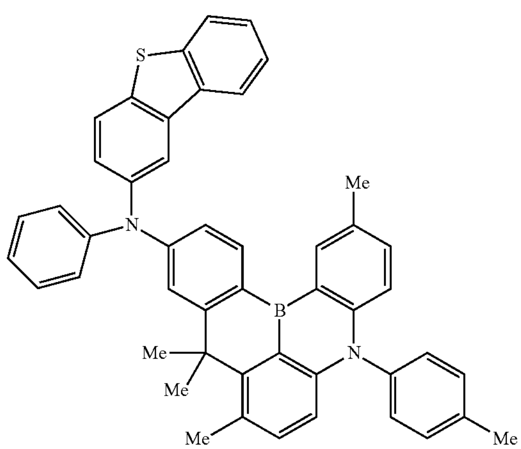
(1E-70)
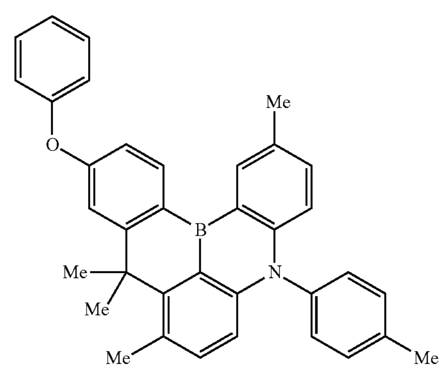
(1E-71)
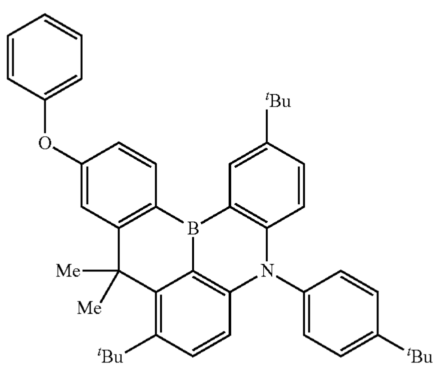
(1E-72)
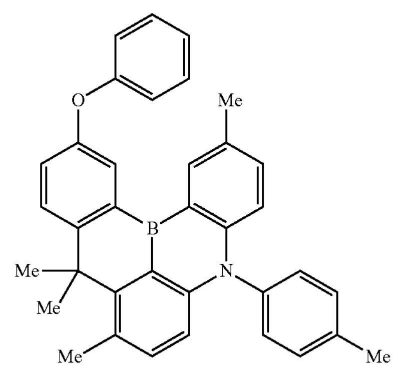
(1E-73)
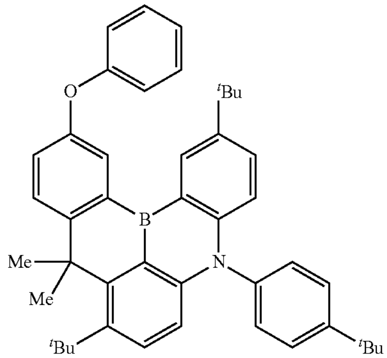
(1E-74)
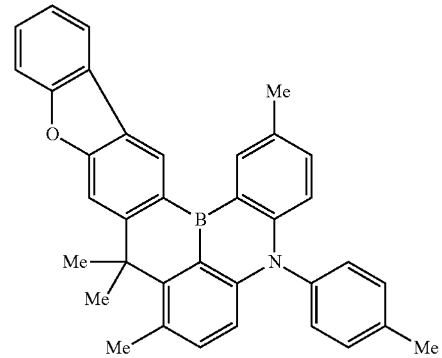

-continued
(1E-75)
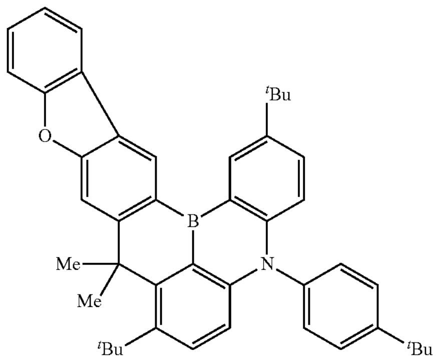
(1E-76)
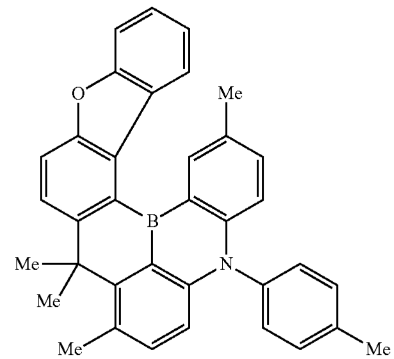
(1E-77)
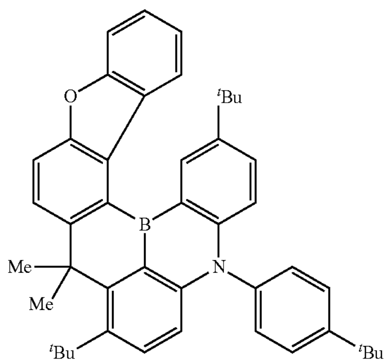
(1E-78)
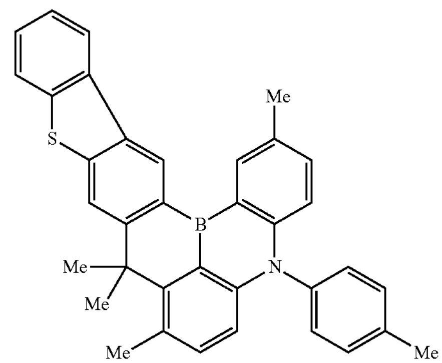
(1E-79)
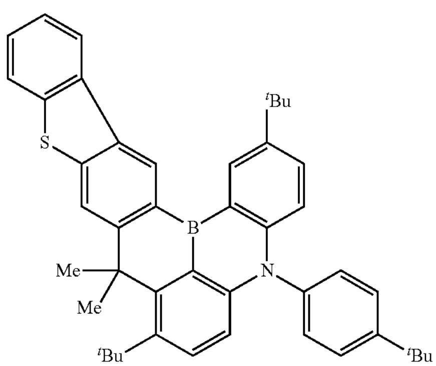
(1E-80)
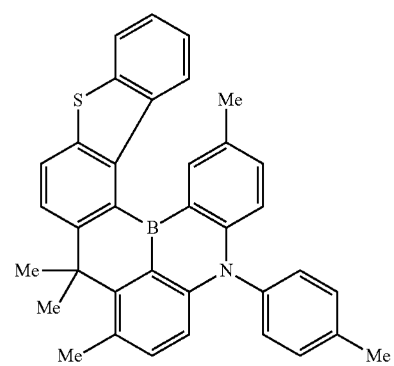
(1E-81)
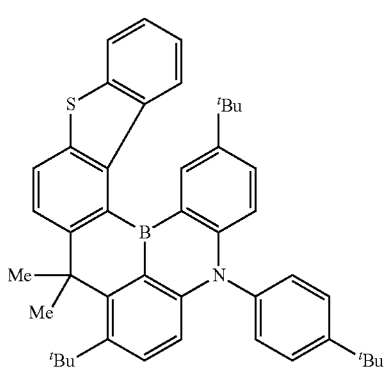
(1E-84)
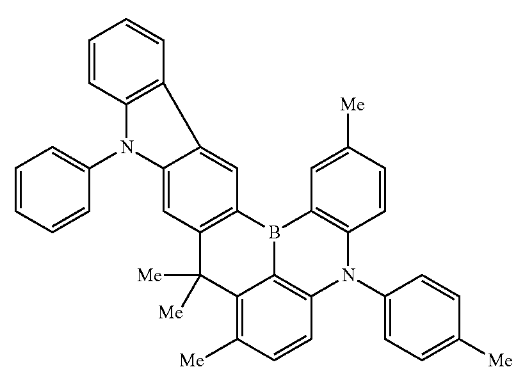

-continued
(1E-85)
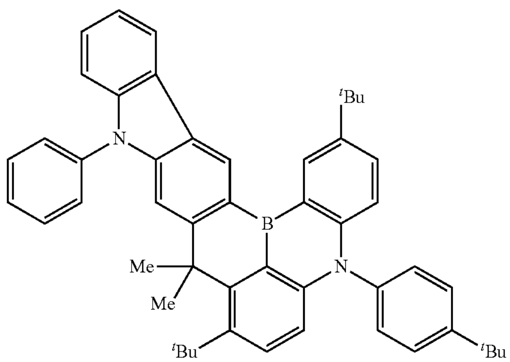
(1E-86)
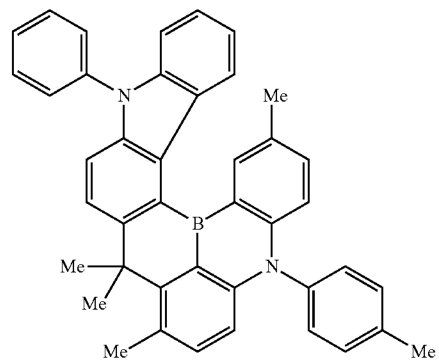
(1E-87)
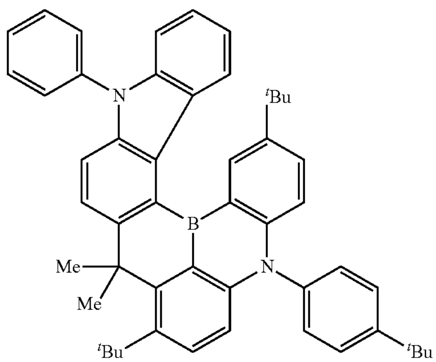
(1E-88)
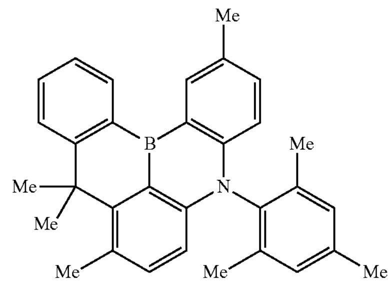
(1E-89)
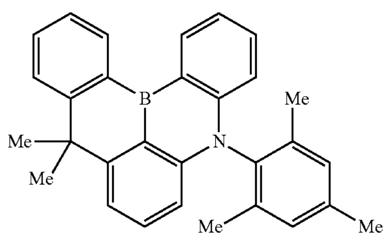
(1E-90)
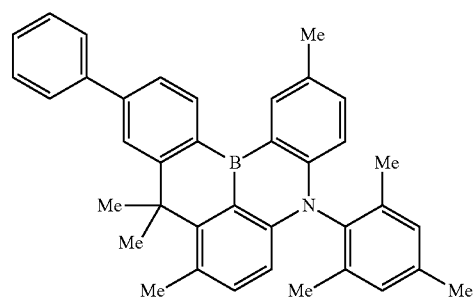
(1E-91)
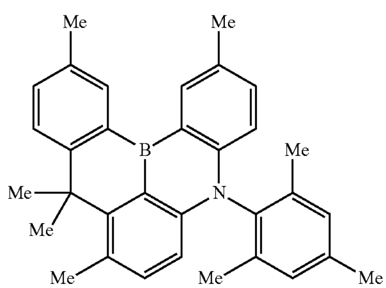
(1E-92)
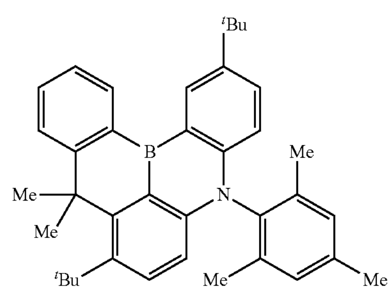
(1E-93)
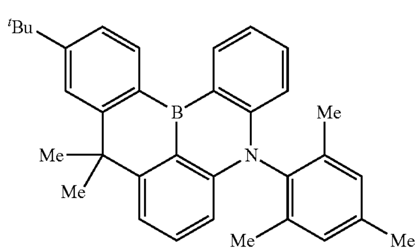
(1E-94)
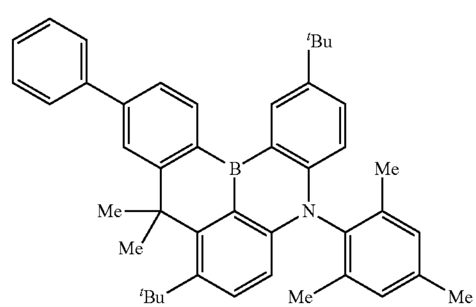

-continued
(1E-95)
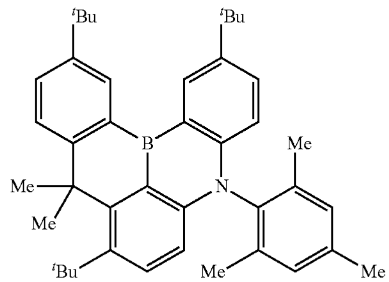
(1E-96)
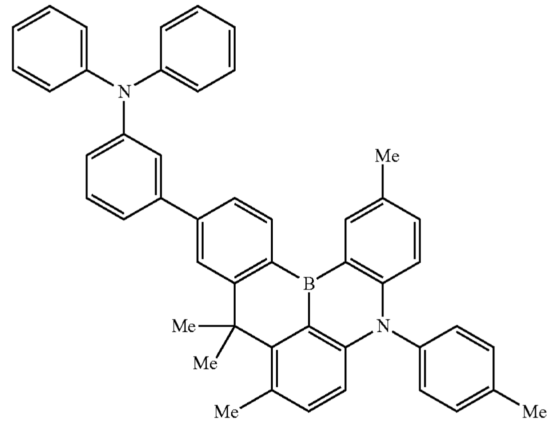
(1E-97)
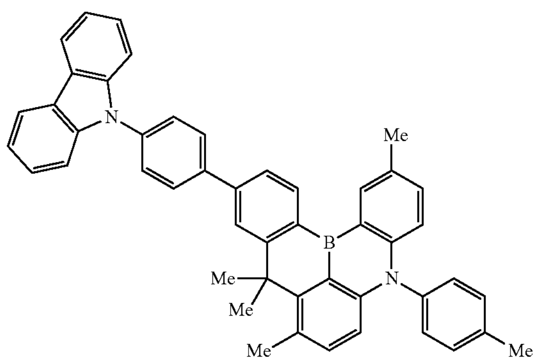
(1E-98)
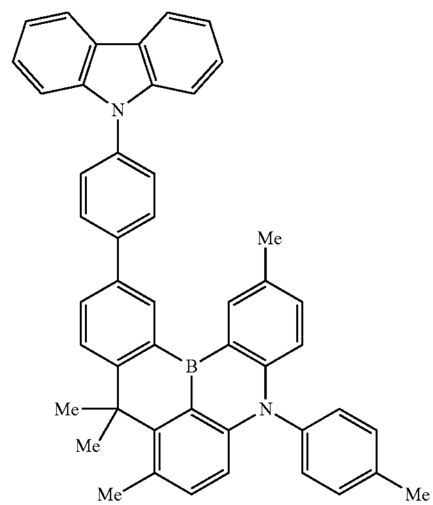
(1E-99)
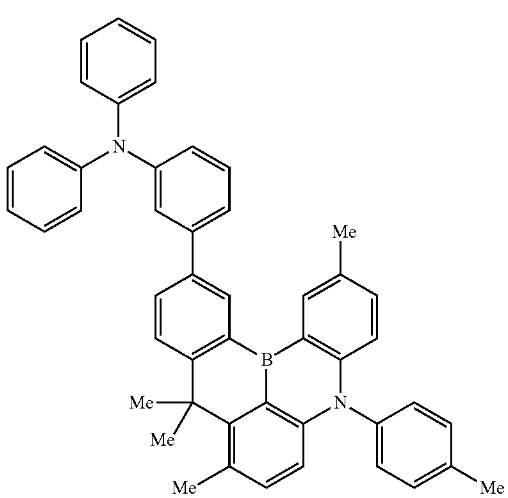
(1E-100)
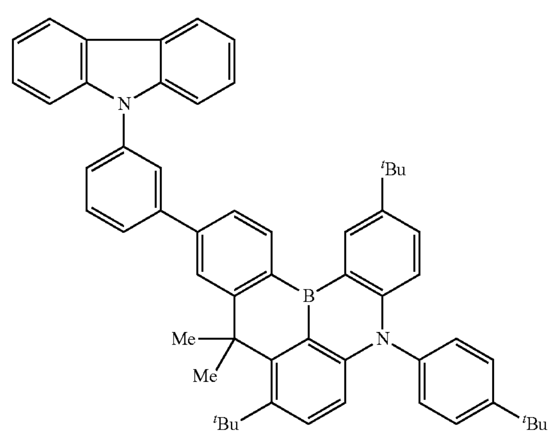

-continued
(E1-101)
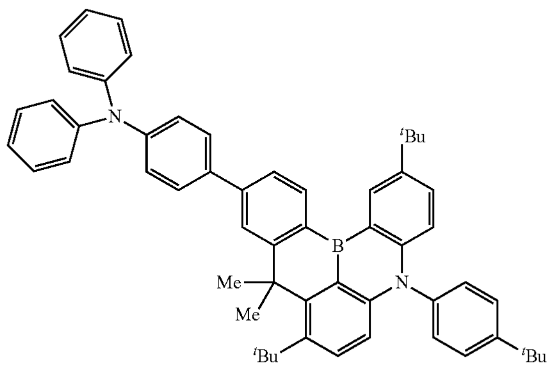
(E1-102)
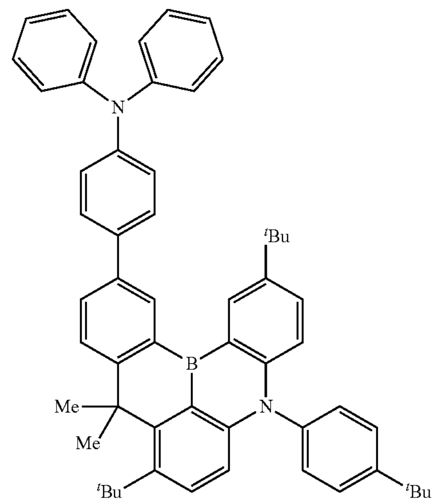
(E1-103)
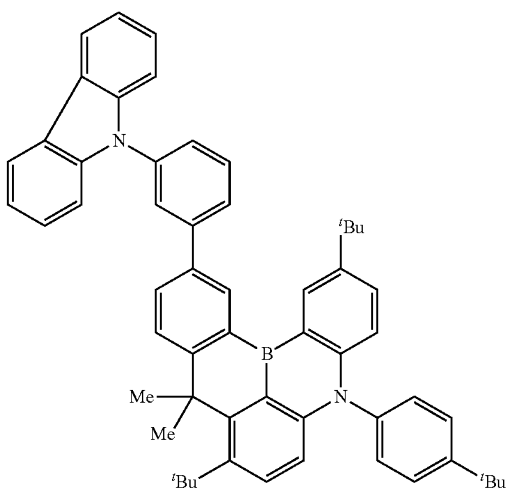
(E1-110)
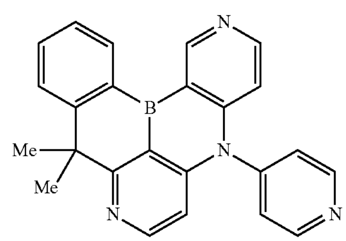
(E1-111)
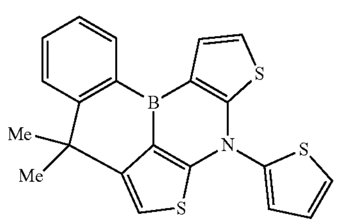
(E1-112)
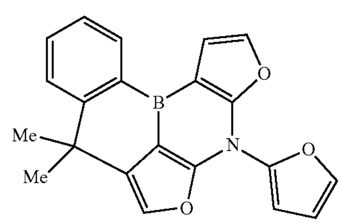
(E1-113)
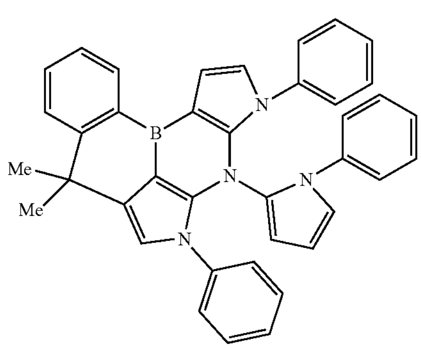
(E1-114)
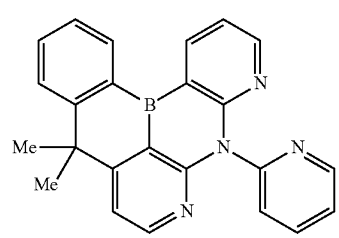

-continued
(E1-115)
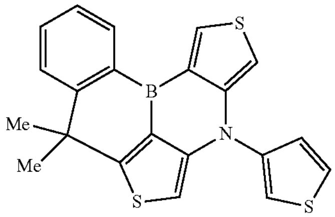
(E1-116)
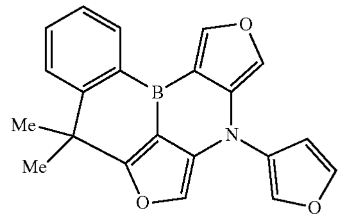
(E1-117)
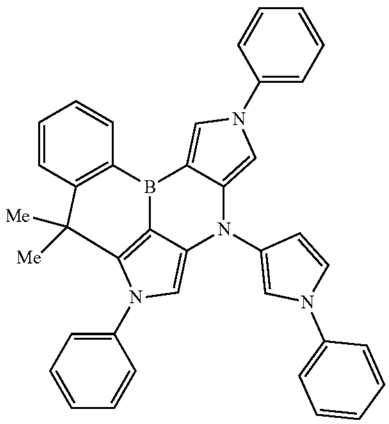
(E1-118)
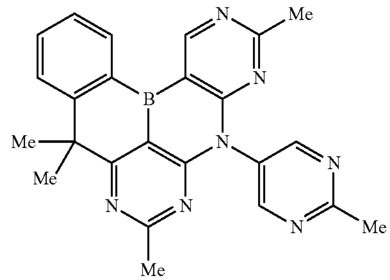
(E1-119)
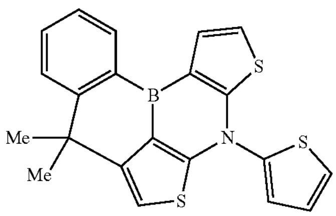
(E1-120)
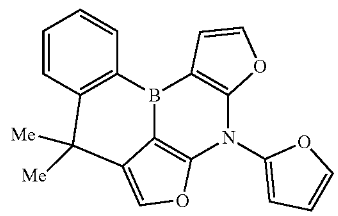
(E1-121)
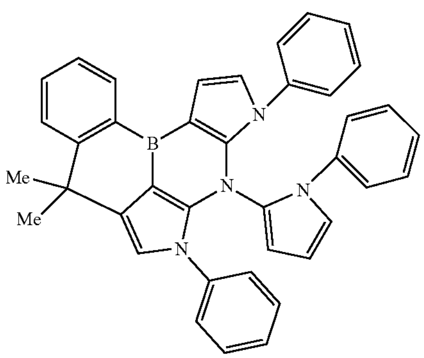
(E1-122)
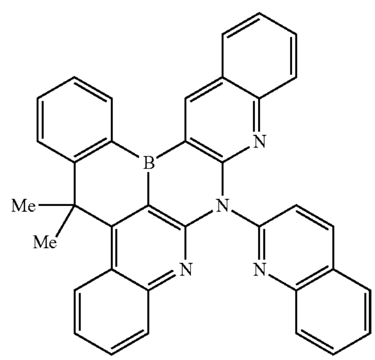
(1E-123)
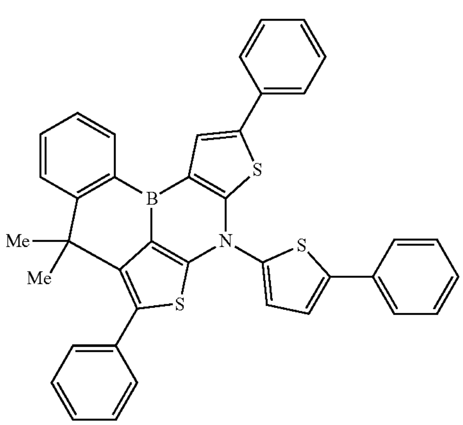
(1E-124)
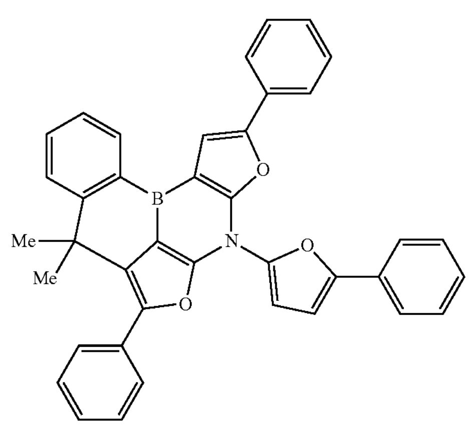

-continued
(1E-125)
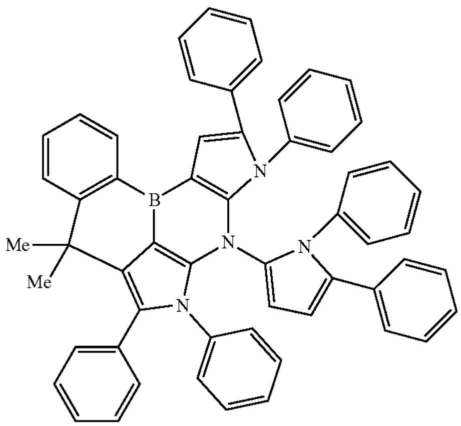
(1E-126)
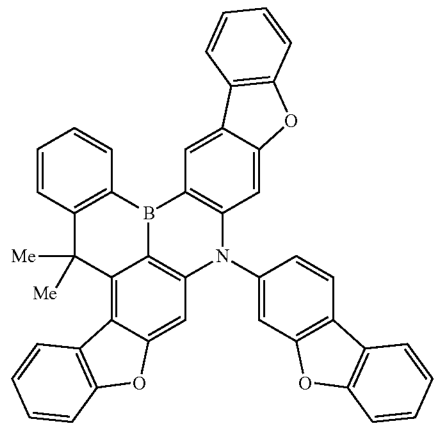
(1E-127)
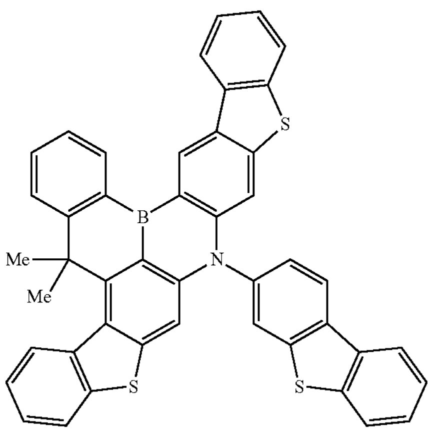
(1E-128)
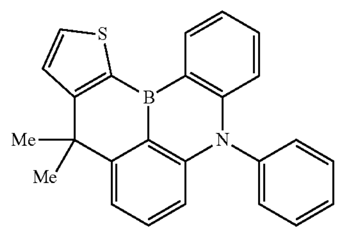
(1E-129)
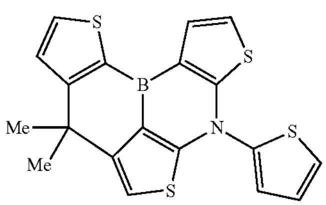
(1E-135)
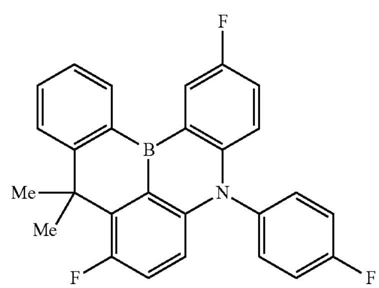
(1E-136)
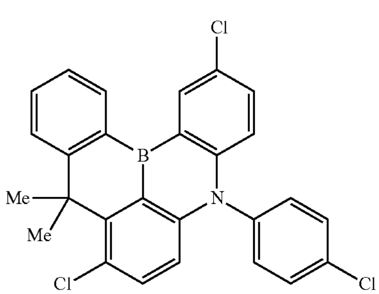
(1E-137)
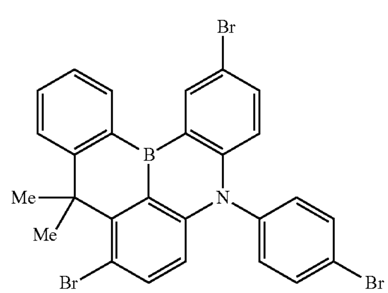

-continued
(1E-138)
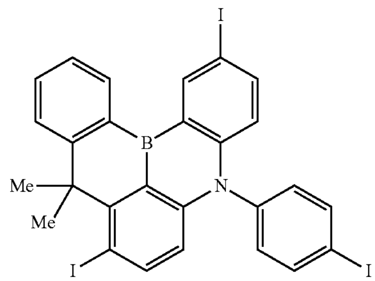
(1E-139)
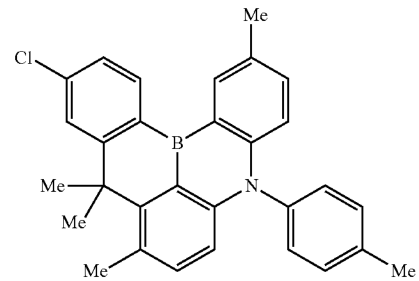
(1E-140)
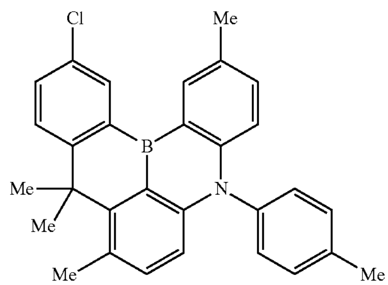
(1E-141)
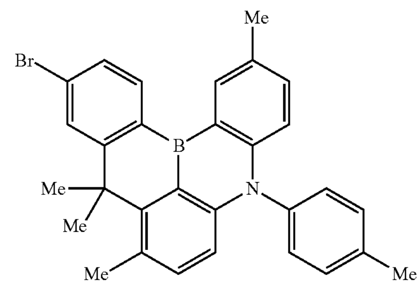
(1E-142)
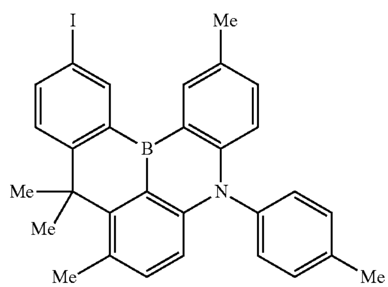
(1E-143)
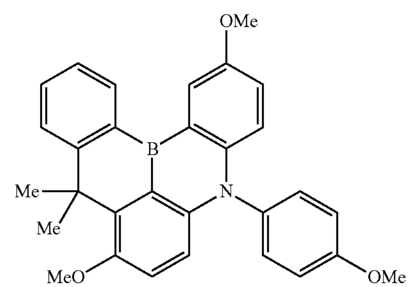
(1E-144)
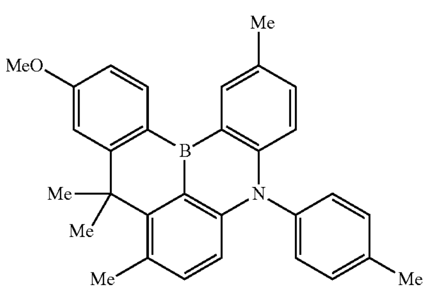
(1E-145)
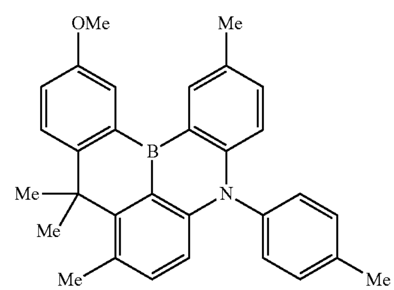
(1E-146)
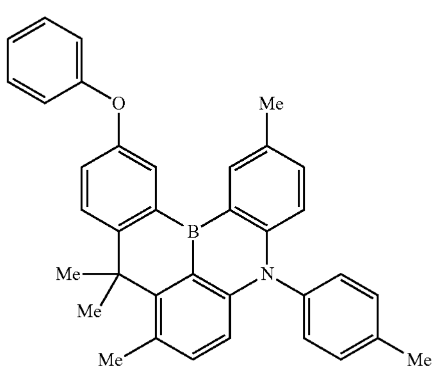
(1E-147)
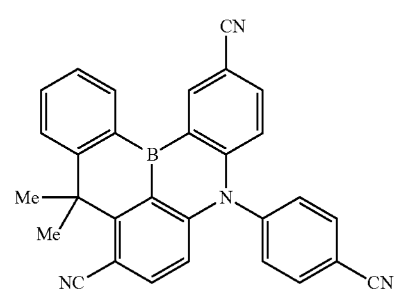

-continued
(1E-148)
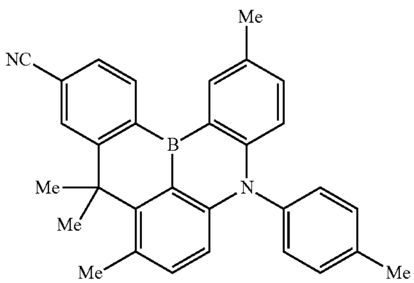
(1E-149)
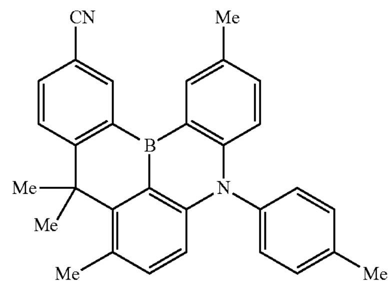
(1E-150)
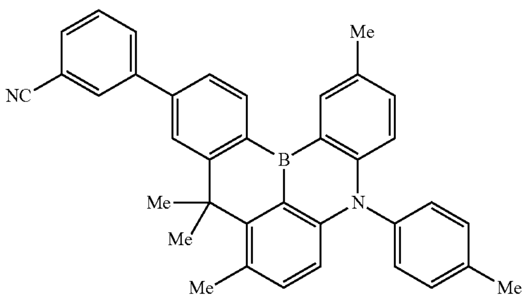
(1E-151)
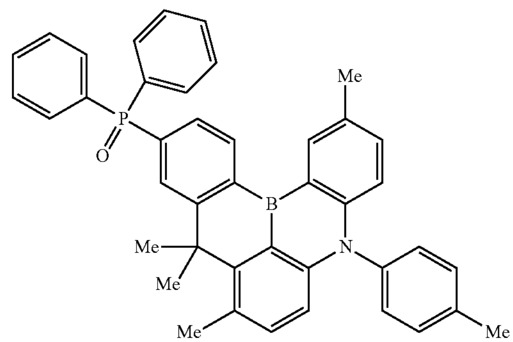
(1E-152)
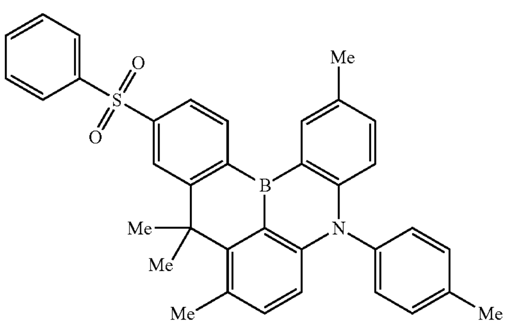
(1E-153)
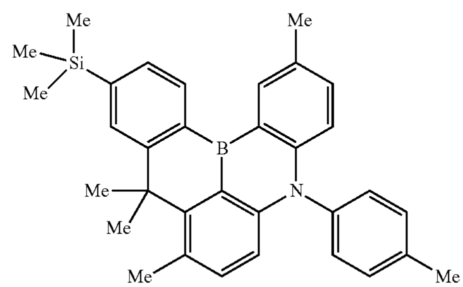
(1E-154)
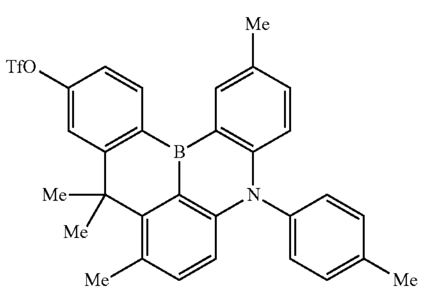
(1E-155)
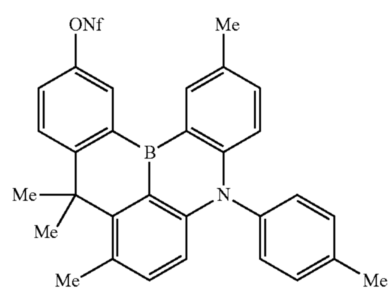
(1E-156)
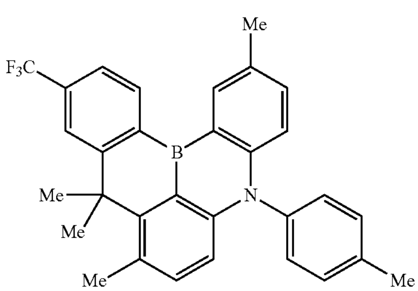
(1E-157)
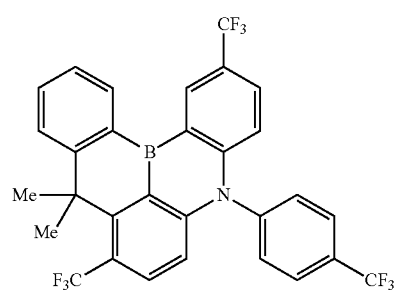

-continued
(1E-158)
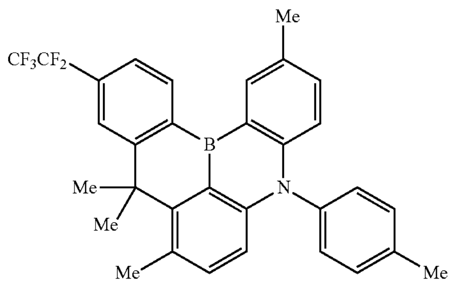
(1E-160)
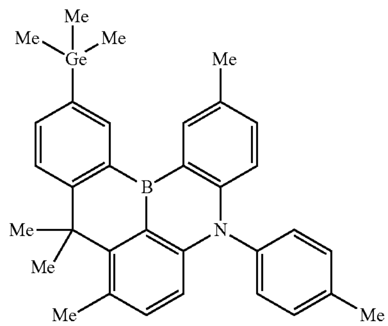
(1E-161)
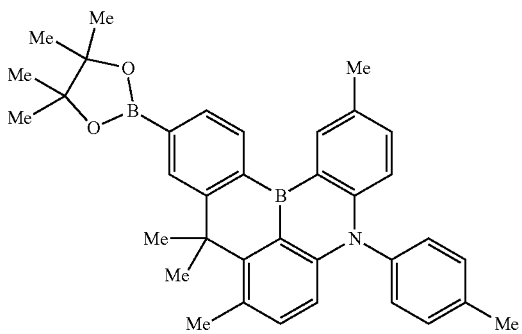
(1E-162)
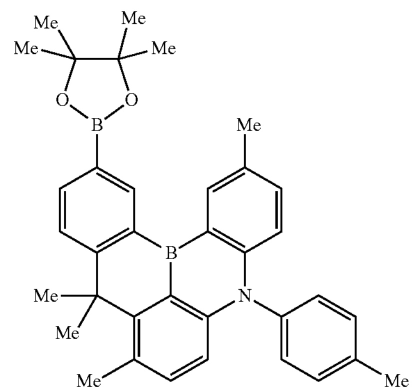
(1E-163)
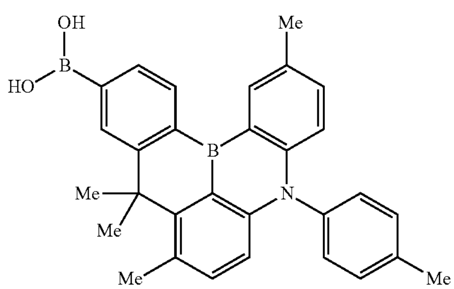
(1E-164)
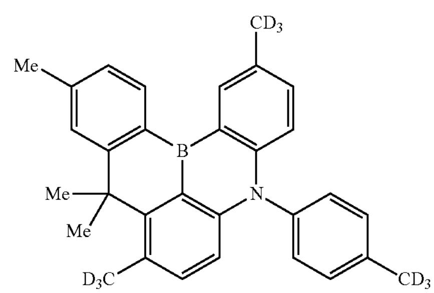
(1E-165)
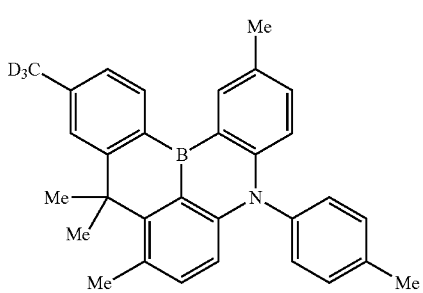
(1E-166)
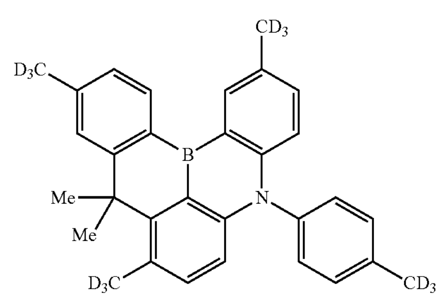

-continued
(1E-167)
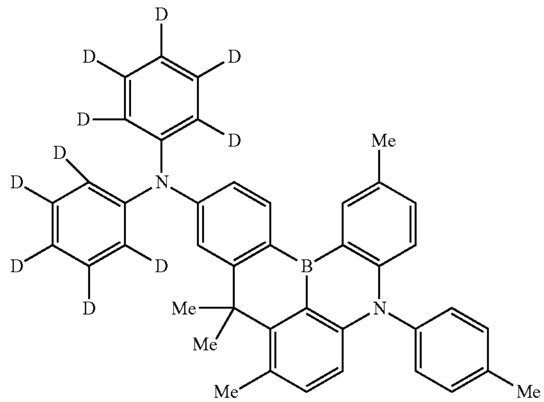
(1E-168)
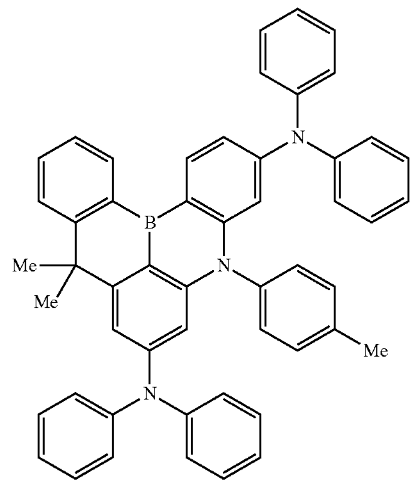
(1E-169)
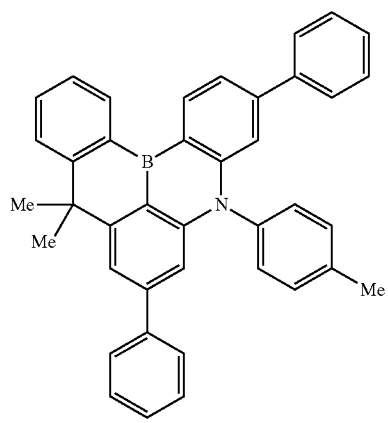
(1E-170)
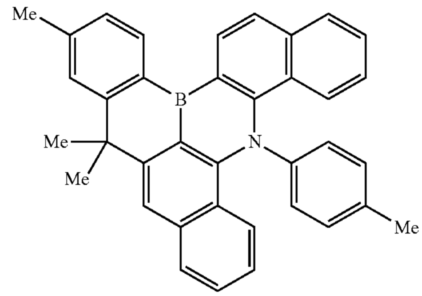
(1E-171)
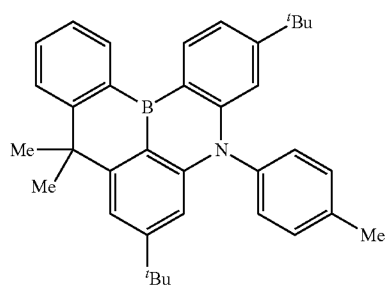
(1E-172)
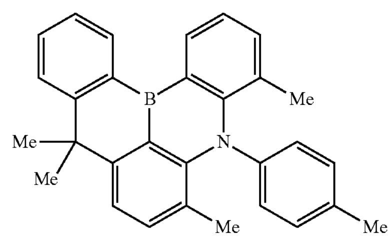
(1E-173)
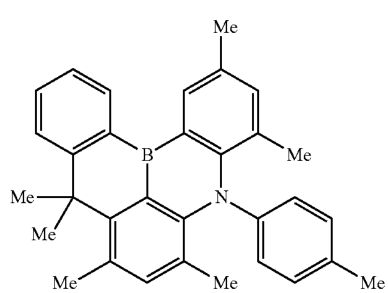
(1E-174)
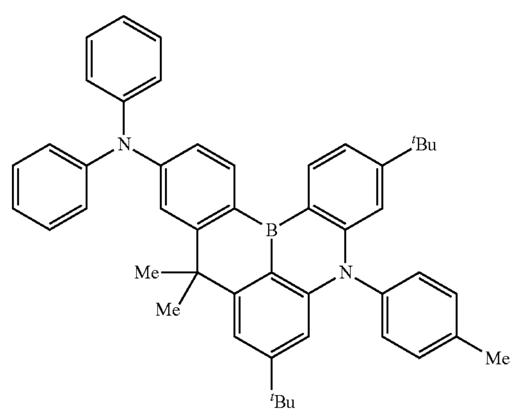

-continued
(1E-175)
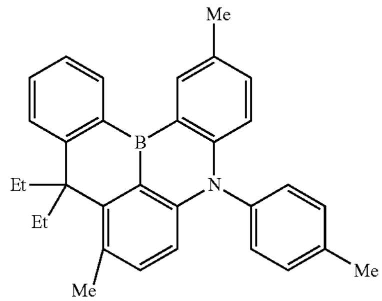
(1E-176)
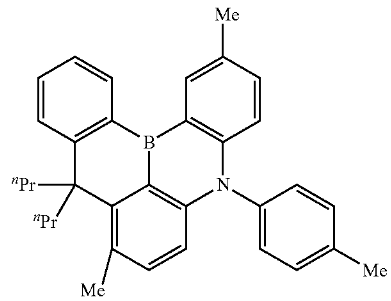
(1E-177)
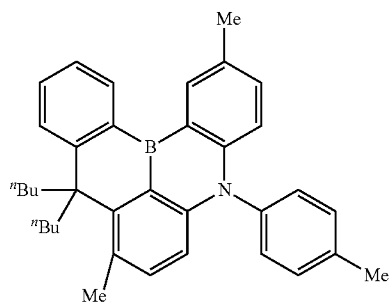
(1E-180)
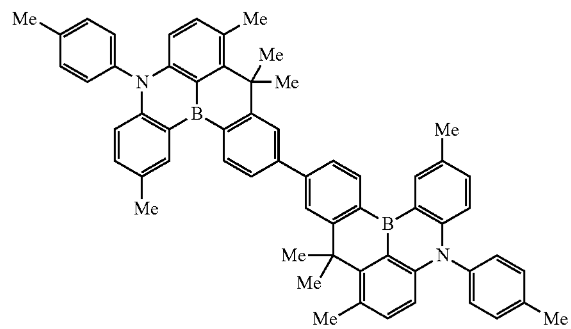
(1E-181)
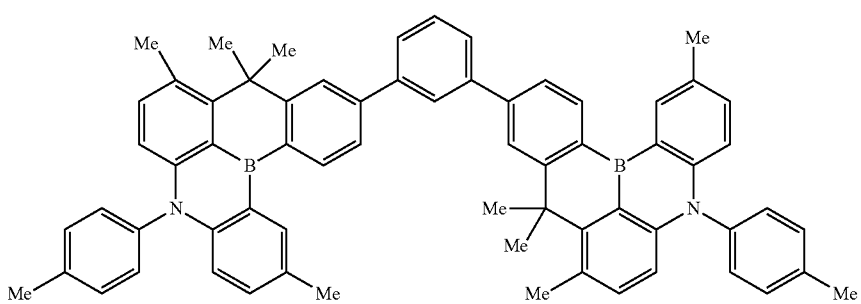
(1E-182)
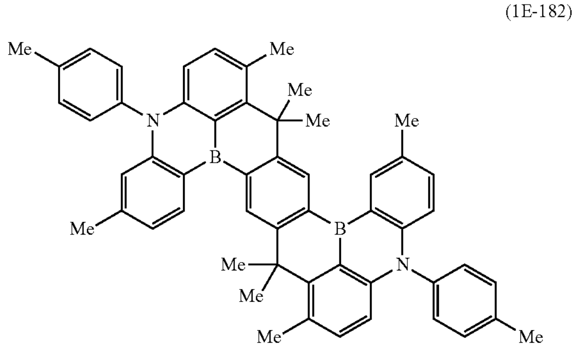
(1E-183)
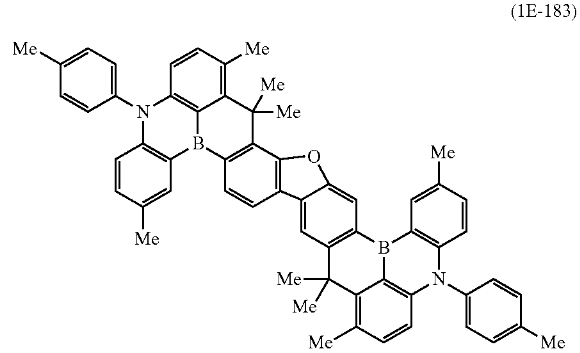

-continued (1E-184)

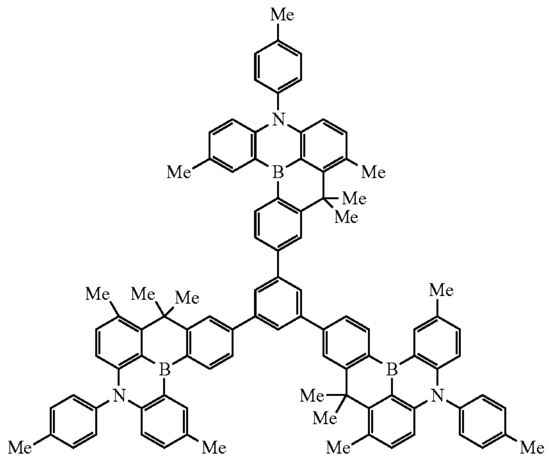

(1E-185)

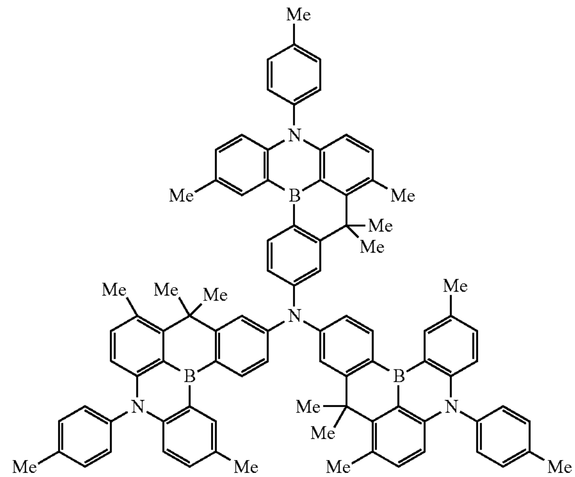

(1E-191)

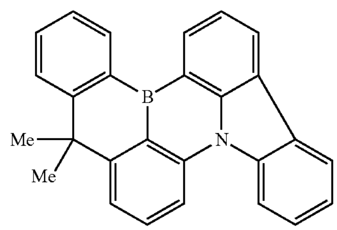

(1E-192)

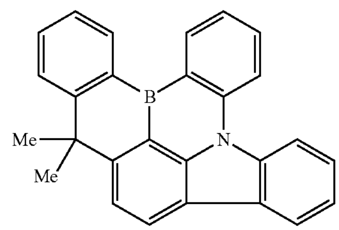

In regard to the polycyclic aromatic compound represented by general formula (1D), formula (1E), formula (1D') or formula (1E') and a multimer thereof, an increase in the T1 energy (an increase by approximately 0.01 to 0.1 eV) can be expected by introducing a phenyloxy group, a carbazolyl group or a diphenylamino group into the para-position with respect to central element B (boron) in at least one of the ring A, ring B and ring C (ring a, ring b and ring c). The HOMO on the benzene rings which are the ring A, ring B and ring C (ring a, ring b and ring c) is more localized to the meta-position with respect to the boron, while the LUMO is localized to the ortho-position and the para-position with respect to the boron. Therefore, particularly, an increase in the T1 energy can be expected.

Specific examples of the polycyclic aromatic compound represented by general formula (1D), formula (1E), formula (1D') or formula (1E') and a multimer thereof include the above compounds in which at least one hydrogen atom in one or more aromatic rings in the compound is substituted by one or more alkyls or aryls. More preferable examples thereof include a compound substituted by 1 or 2 of alkyls each having 1 to 12 carbon atoms and aryls each having 6 to 10 carbon atoms.

Furthermore, specific examples of the polycyclic aromatic compound represented by general formula (1D), formula (1E), formula (1D') or formula (1E') and a multimer thereof include a compound in which at least one hydrogen atom in one or more phenyl groups or one phenylene group in the compound is substituted by one or more alkyls each having 1 to 4 carbon atoms, and preferably one or more alkyls each having 1 to 3 carbon atoms (preferably one or more methyl groups). More preferable examples thereof include a compound in which the hydrogen atoms at the ortho-positions of one phenyl group (both of the two sites, preferably any one site) or the hydrogen atoms at the ortho-positions of one phenylene group (all of the four sites at maximum, preferably any one site) are substituted by methyl groups.

By substitution of at least one hydrogen atom at the ortho-position of a phenyl group or a p-phenylene group at a terminal in the compound by a methyl group or the like, adjacent aromatic rings are likely to intersect each other perpendicularly, and conjugation is weakened. As a result, triplet excitation energy ($E_T$) can be increased.

2. Method for Manufacturing Polycyclic Aromatic Compound and Multimer Thereof 2-1. Method for Manufacturing Polycyclic Aromatic Compound Represented by General Formula (1) and Multimer Thereof In regard to the polycyclic aromatic compound represented by general formula (1) or (1') and a multimer thereof, basically, an intermediate is manufactured by first bonding the ring A (ring a), ring B (ring b), and ring C (ring c) with bonding groups (groups containing $X^1$ or $X^2$) (first reaction), and then a final product can be manufactured by bonding the ring A (ring a), ring B (ring b), and ring C (ring c) with bonding groups (groups containing the central element B(boron)) (second reaction). In the first reaction, for example, in an etherification reaction, a general reaction such as a nucleophilic substitution reaction or an Ullmann reaction can be utilized, and in an amination reaction, a general reaction such as a Buchwald-Hartwig reaction can be utilized. Furthermore, in the second reaction, a Tandem Hetero-Friedel-Crafts reaction (continuous aromatic electrophilic substitution reaction, the same hereinafter) can be utilized.

The second reaction is a reaction for introducing the central element B(boron) that bonds the ring A (ring a), ring B (ring b), and ring C (ring c) as illustrated in the following scheme (1) or (2), and as an example, a case where $X^1$ and $X^2$ represent oxygen atoms is illustrated below. First, a hydrogen atom between $X^1$ and $X^2$ is ortho-metalated with n-butyllithium, sec-butyllithium, t-butyllithium, or the like. Subsequently, boron trichloride, boron tribromide, or the like is added thereto to perform lithium-boron metal exchange, and then a Brønsted base such as N,N-diisopropylethylamine is added thereto to induce a Tandem Bora-Friedel-Crafts reaction. Thus, a desired product can be obtained. In the second reaction, a Lewis acid such as aluminum trichloride may be added in order to accelerate the reaction.

Scheme (1)

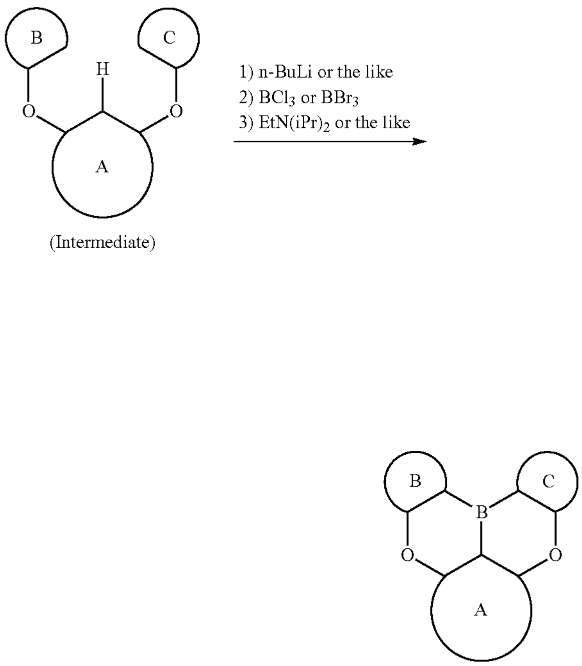

(Intermediate)

General formula (1) based compound

Scheme (2)

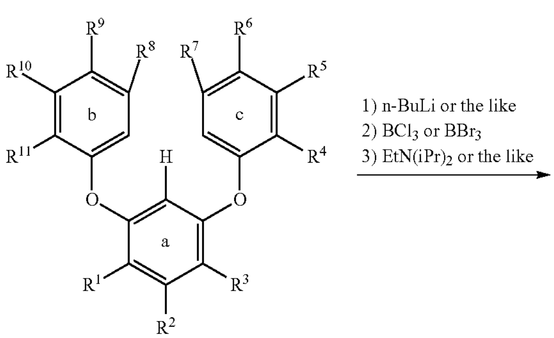

(Intermediate)

-continued

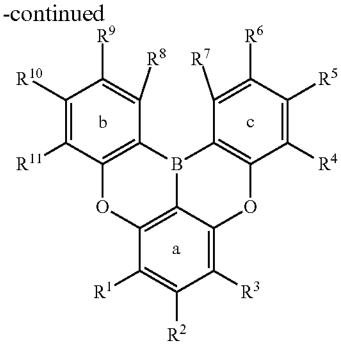

General formula (1') based compound

Incidentally, the scheme (1) or (2) mainly illustrates a method for manufacturing a polycyclic aromatic compound represented by general formula (1) or (1'). However, a multimer thereof can be manufactured using an intermediate having a plurality of ring A's (ring a's), ring B's (ring b's) and ring C's (ring c's). Specifically, the manufacturing method will be described with the following schemes (3) to (5). In this case, a desired product can be obtained by increasing the amount of a reagent to be used, such as butyllithium, to a double amount or a triple amount.

Scheme (3)

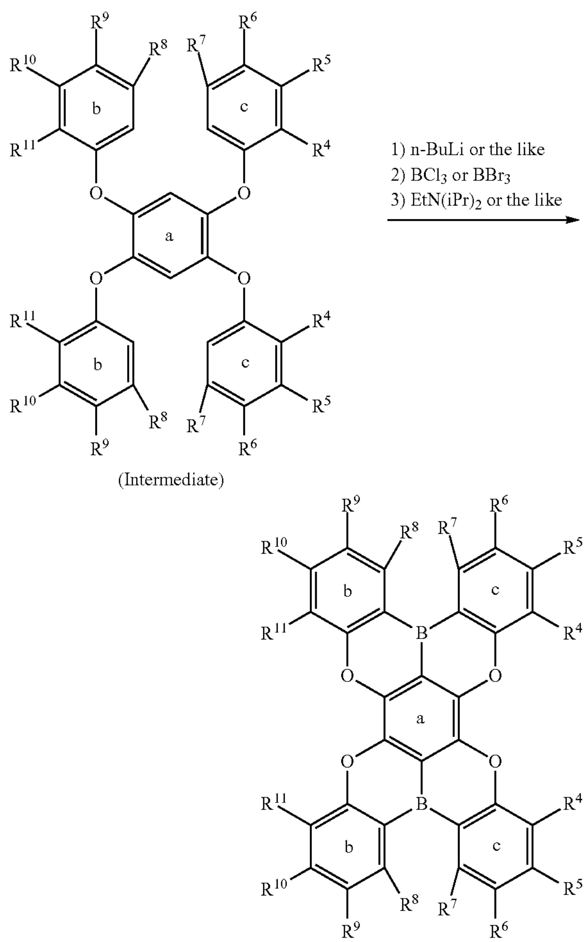

Scheme (4)

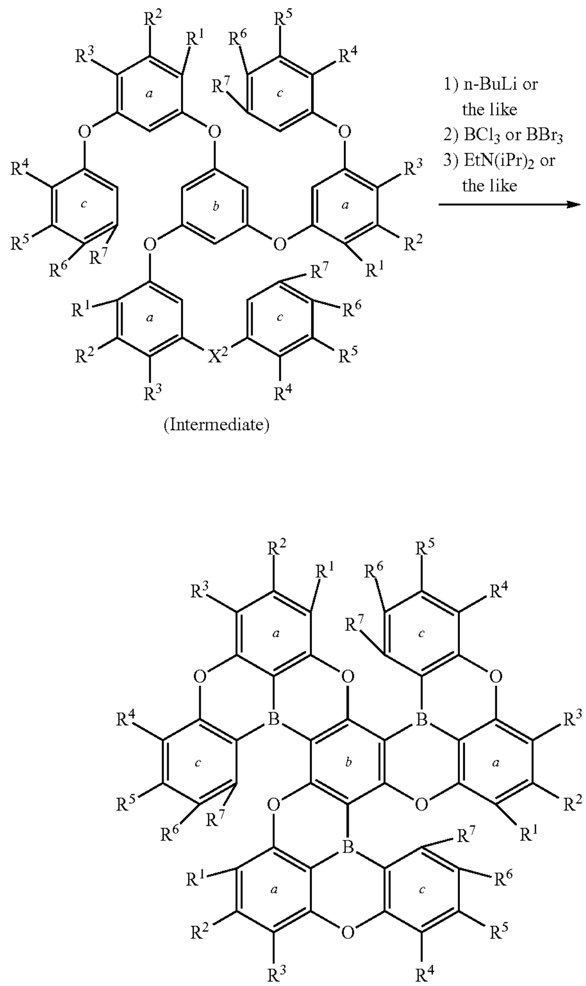

Scheme (5)

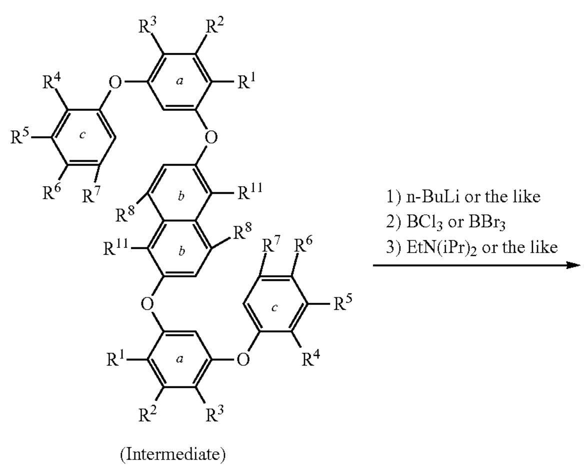

-continued

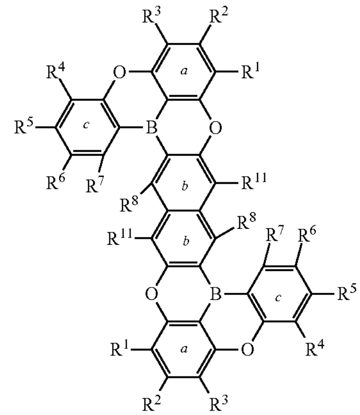

In the above schemes, a lithium atom is introduced into a desired position by ortho-metalation. However, a lithium atom can be introduced into a desired position also by introducing a bromine atom or the like into a position into which it is desired to introduce the lithium atom and performing halogen-metal exchange as in the following schemes (6) and (7).

Scheme (6)

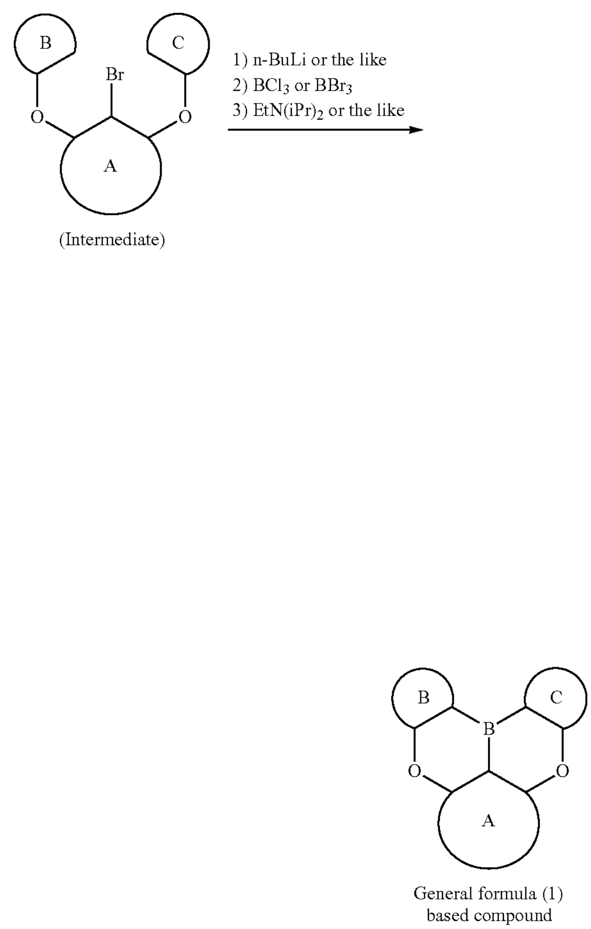

Scheme (7)

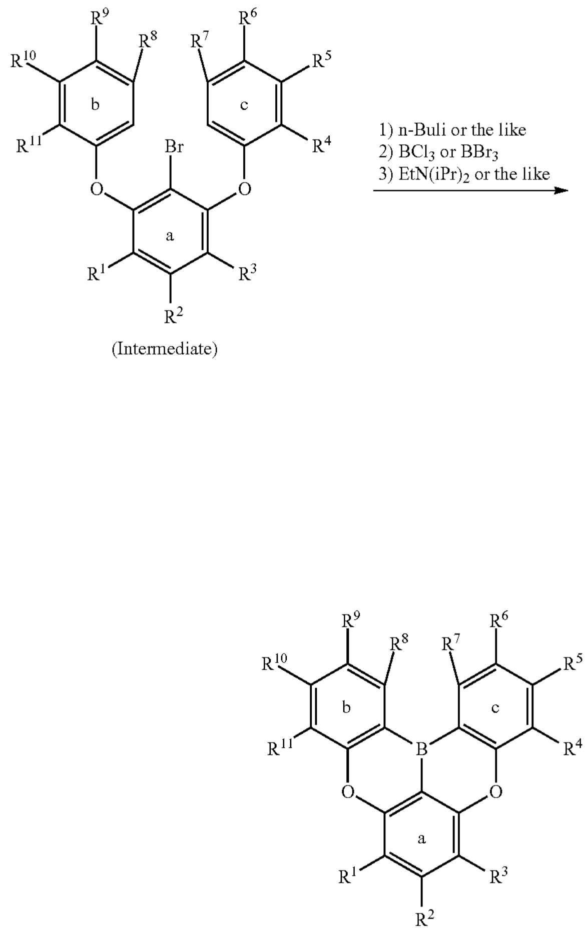

(Intermediate)

General formula (1′) based compound

Scheme (8)

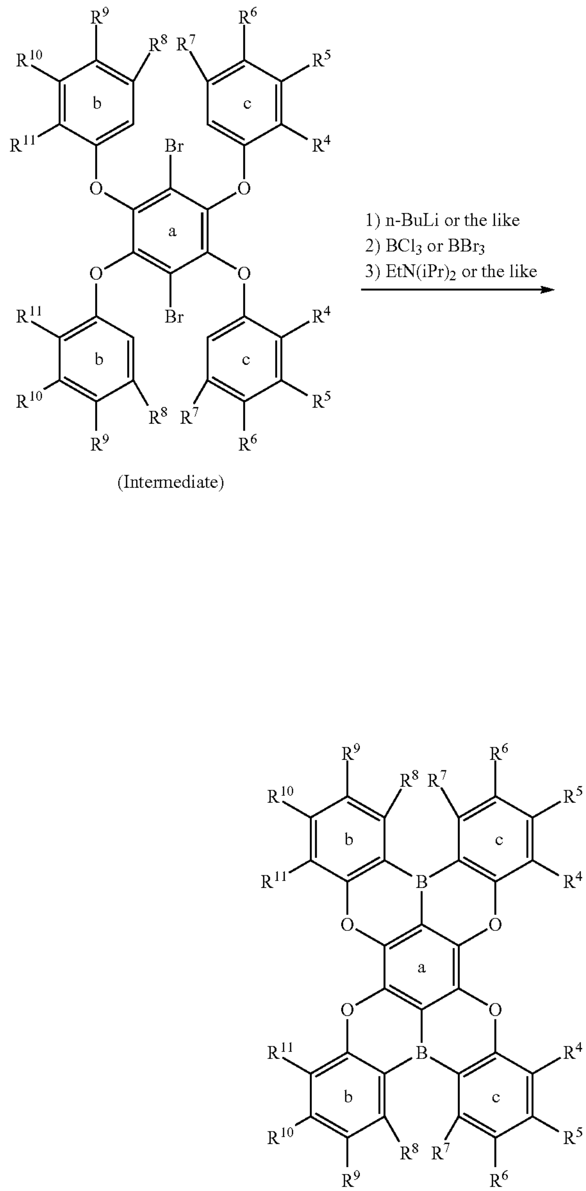

(Intermediate)

Furthermore, also in regard to the method for manufacturing a multimer described in scheme (3), a lithium atom can be introduced into a desired position also by introducing a halogen atom such as a bromine atom or a chlorine atom into a position into which it is desired to introduce the lithium atom and performing halogen-metal exchange as in the above schemes (6) and (7) (the following schemes (8), (9), and (10)).

Scheme (9)

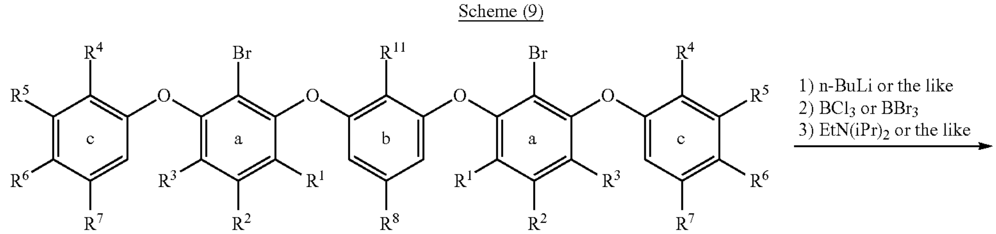

(Intermediate)

-continued

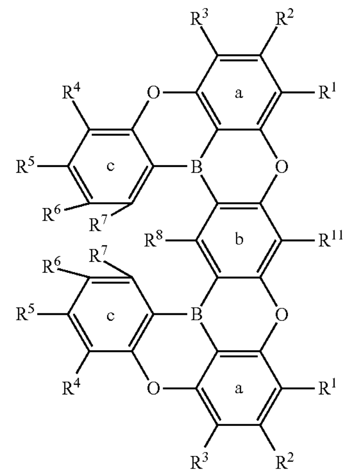

Scheme (10)

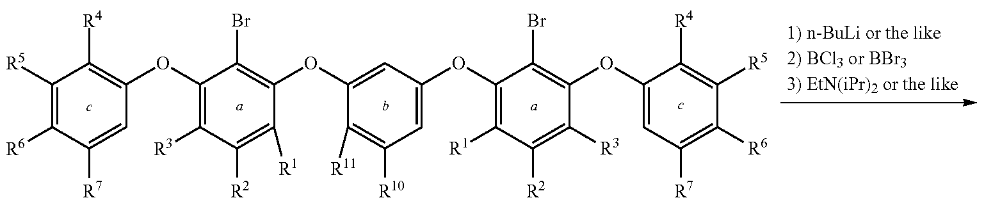

(Intermediate)

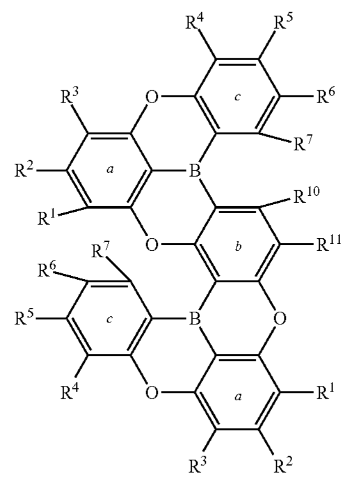

According to this method, a desired product can also be synthesized even in a case where ortho-metalation cannot be achieved due to an influence of a substituent, and therefore the method is useful.

By appropriately selecting the synthesis method described above and appropriately selecting a raw material to be used, a polycyclic aromatic compound in which a substituent is present at a desired position, and $X^1$ and $X^2$ represent oxygen atoms, and a multimer thereof can be synthesized.

Next, as an example, a case where $X^1$ and $X^2$ represent nitrogen atoms is illustrated in the following schemes (11) and (12). As in the case where $X^1$ and $X^2$ represent oxygen atoms, a hydrogen atom between $X^1$ and $X^2$ is first ortho-metalated with n-butyllithium or the like. Subsequently, boron tribromide or the like is added thereto to induce lithium-boron metal exchange, and then a Brønsted base such as N,N-diisopropylethylamine is added thereto to induce a Tandem Bora-Friedel-Crafts reaction. Thus, a desired product can be obtained. Here, a Lewis acid such as aluminum trichloride may also be added in order to accelerate the reaction.

Scheme (11)

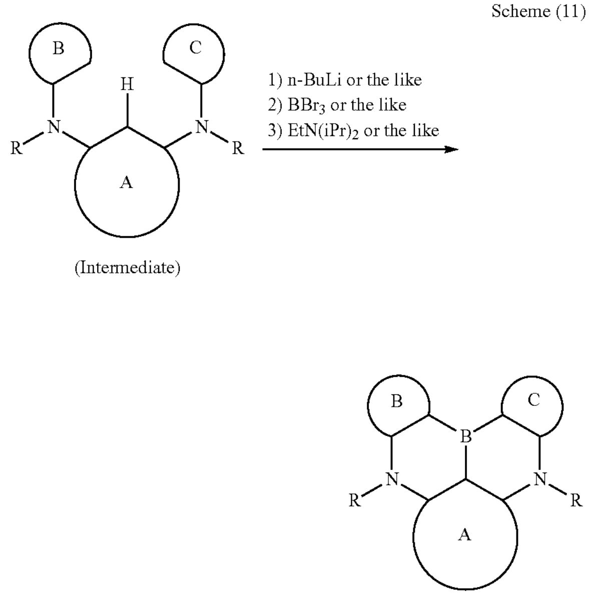

(Intermediate)

General formula (1) based compound

Scheme (12)

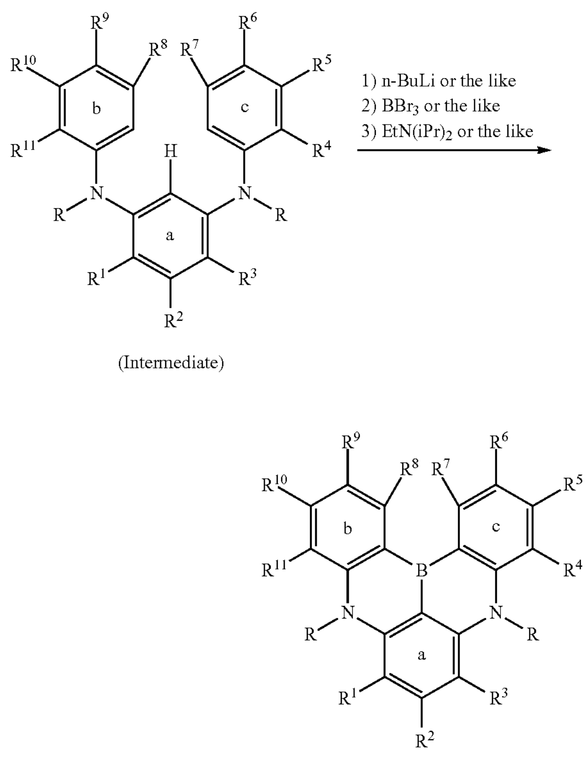

(Intermediate)

General formula (1') based compound

Furthermore, also for a multimer in which $X^1$ and $X^2$ represent nitrogen atoms, a lithium atom can be introduced into a desired position also by introducing a halogen atom such as a bromine atom or a chlorine atom into a position into which it is desired to introduce the lithium atom and performing halogen-metal exchange as in the above schemes (6) and (7) (the following schemes (13), (14), and (15)).

Scheme (13)

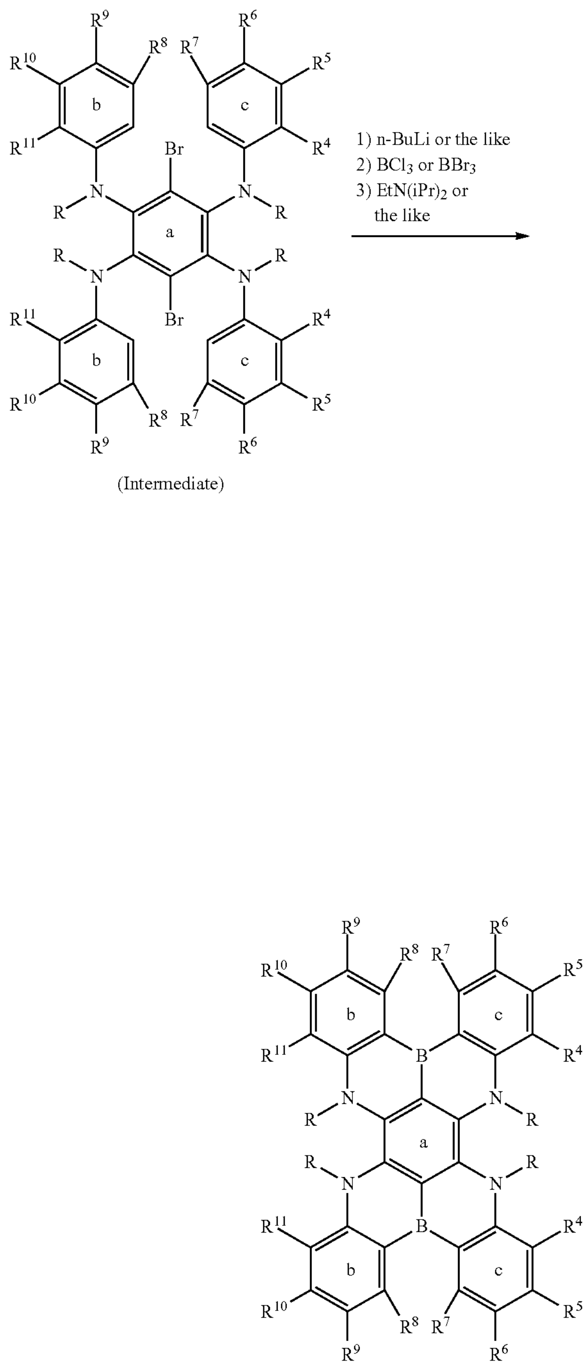

(Intermediate)

Scheme (14)
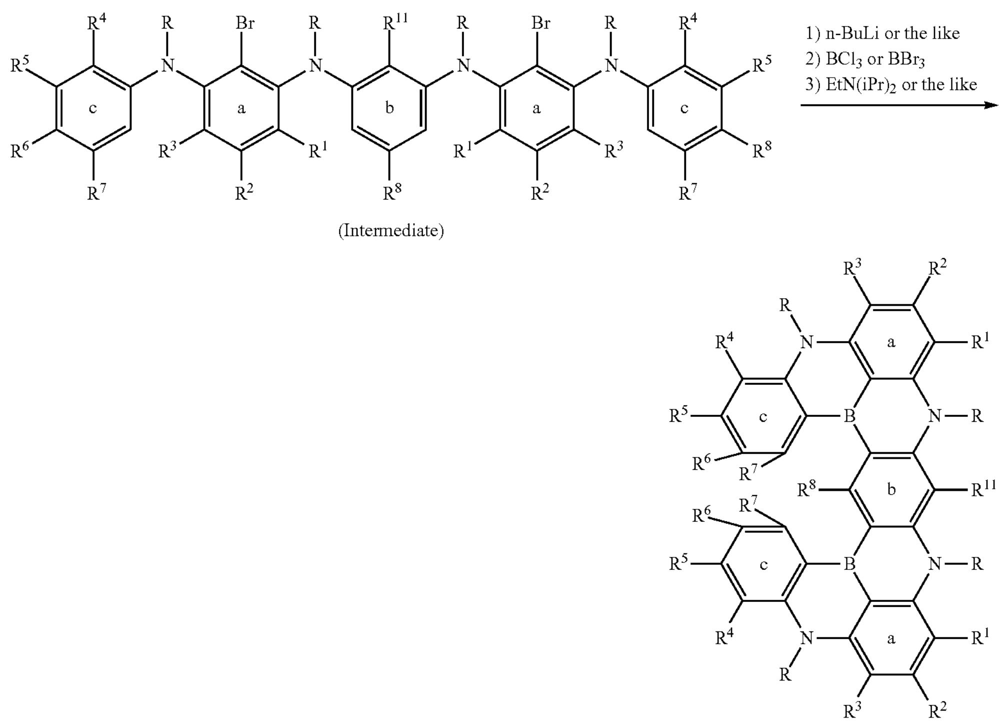
Scheme (15)
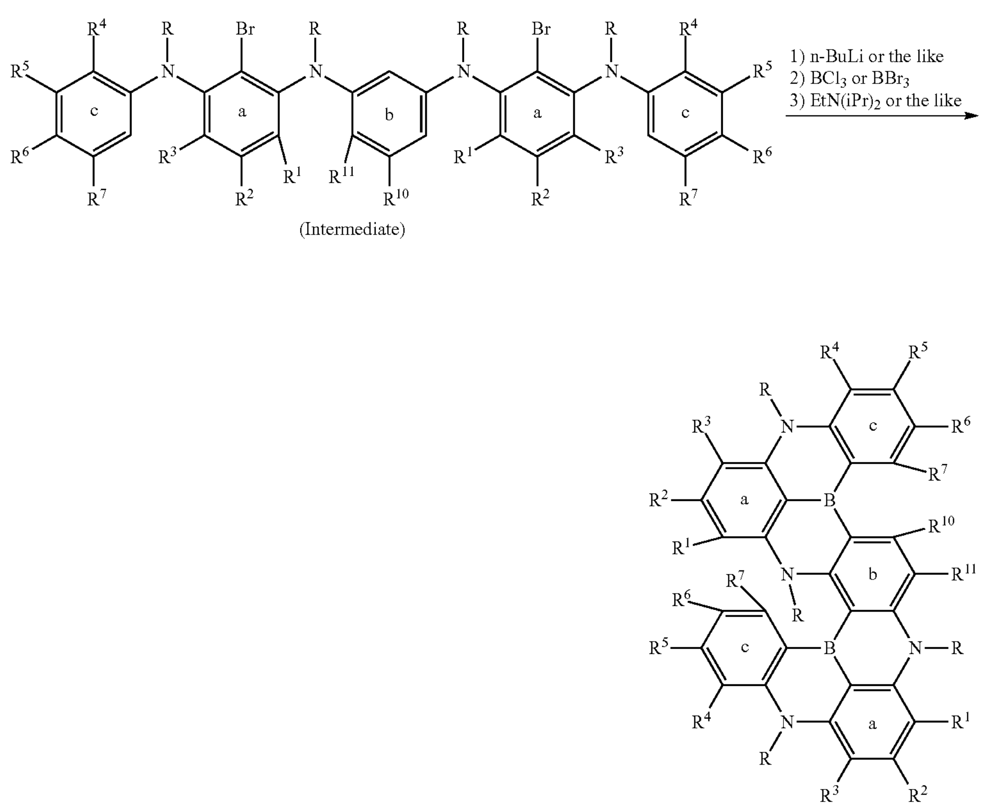

In the above schemes, manufacturing examples of compounds in which $X^1$ or $X^2$ represents >O or >N—R are shown. However, compounds in which $X^1$ or $X^2$ represents >S, >Se or >C(—Ra)$_2$, can also be manufactured as well by using an appropriate reaction in the first reaction in which ring A (ring a), ring B (ring b) and ring C (ring c) are bonded by a bonding group (a group including $X^1$ and $X^2$).

A polycyclic aromatic compound or a multimer thereof used in the present inventions also includes compounds in which at least a portion of hydrogen atoms are substituted by deuterium atoms or substituted by halogen atoms such as fluorine atoms or chlorine atoms. However, these compounds can be synthesized as described above using raw materials that are deuterated, fluorinated or chlorinated at desired sites.

Incidentally, note that examples of solvents used in the reactions of the above schemes (1) to (15) include t-butylbenzene and xylene.

Incidentally, note that examples of an ortho-metalation reagent used for the above schemes (1) to (15) include an alkyllithium such as methyllithium, n-butyllithium, sec-butyllithium, or t-butyllithium; and an organic alkali compound such as lithium diisopropylamide, lithium tetramethylpiperidide, lithium hexamethyldisilazide, or potassium hexamethyldisilazide.

Incidentally, examples of a metal exchanging reagent for metal-B(boron) used for the above schemes (1) to (15) include a halide of boron such as trifluoride of boron, trichloride of boron, tribromide of boron, or triiodide of boron; an aminated halide of boron such as $CIPN(NEt_2)_2$; an alkoxylation product of boron; and an aryloxylation product of boron.

Incidentally, examples of the Brønsted base used for the above schemes (1) to (15) include N,N-diisopropylethylamine, triethylamine, 2,2,6,6-tetramethylpiperidine, 1,2,2,6,6-pentamethylpiperidine, N,N-dimethylaniline, N,N-dimethyltoluidine, 2,6-lutidine, sodium tetraphenylborate, potassium tetraphenylborate, triphenylborane, tetraphenylsilane, $Ar_4BNa$, $Ar_4BK$, $Ar_3B$, and $Ar_4Si$ (Ar represents an aryl such as phenyl).

Examples of a Lewis acid used for the above schemes (1) to (15) include $AlCl_3$, $AlBr_3$, $AlF_3$, $BF_3.OEt_2$, $BCl_3$, $BBr_3$, $GaCl_3$, $GaBr_3$, $InCl_3$, $InBr_3$, $In(OTf)_3$, $SnCl_4$, $SnBr_4$, AgOTf, $ScCl_3$, $Sc(OTf)_3$, $ZnCl_2$, $ZnBr_2$, $Zn(OTf)_2$, $MgCl_2$, $MgBr_2$, $Mg(OTf)_2$, LiOTf, NaOTf, KOTf, $Me_3SiOTf$, $Cu(OTf)_2$, $CuCl_2$, $YCl_3$, $Y(OTf)_3$, $TiCl_4$, $TiBr_4$, $ZrCl_4$, $ZrBr_4$, $FeCl_3$, $FeBr_3$, $CoCl_3$, and $CoBr_3$.

In the above schemes (1) to (15), a Brønsted base or a Lewis acid may be used in order to accelerate the Tandem Hetero Friedel-Crafts reaction. However, in a case where a halide of boron such as trifluoride of boron, trichloride of boron, tribromide of boron, or triiodide of boron is used, an acid such as hydrogen fluoride, hydrogen chloride, hydrogen bromide, or hydrogen iodide is generated along with progress of an aromatic electrophilic substitution reaction.

Therefore, it is effective to use a Brønsted base that captures an acid. On the other hand, in a case where an aminated halide of boron or an alkoxylation product of boron is used, an amine or an alcohol is generated along with progress of the aromatic electrophilic substitution reaction. Therefore, in many cases, it is not necessary to use a Brønsted base. However, leaving ability of an amino group or an alkoxy group is low, and therefore it is effective to use a Lewis acid that promotes leaving of these groups.

2-2. Method for Manufacturing Polycyclic Aromatic Compounds Represented by General Formulas (1A) to (1E) and Multimers Thereof A polycyclic aromatic compound represented by any one of general formulas (1A) to (1E) and a multimer of a polycyclic aromatic compound having a plurality of structures each represented by any one of general formulas (1A) to (1E) can be manufactured with reference to the method for manufacturing the polycyclic aromatic compound represented by general formula (1) and a multimer thereof.

2-2(1). Method for Manufacturing Polycyclic Aromatic Compound Represented by General Formula (1A) and Multimer Thereof According to the schemes (11) to (15) described in the method for manufacturing the compound represented by general formula (1), a polycyclic aromatic compound represented by general formula (1A) or (1A') and a multimer thereof can be manufactured.

2-2(2). Method for Manufacturing Polycyclic Aromatic Compound Represented by General Formula (1B) and Multimer Thereof According to the schemes (1) to (10) described in the method for manufacturing the compound represented by general formula (1), a polycyclic aromatic compound represented by general formula (1B) or (1B') and a multimer thereof can be manufactured.

2-2(3). Method for Manufacturing Polycyclic Aromatic Compound Represented by General Formula (1C) and Multimer Thereof By combining the schemes (1) to (10) and the schemes (11) to (15) described in the method for manufacturing the compound represented by general formula (1), a polycyclic aromatic compound represented by general formula (1C) or (1C') and a multimer thereof can be manufactured.

2-2(4). Method for Manufacturing Polycyclic Aromatic Compounds Represented by General Formula (1D) and (1E) and Multimers Thereof A polycyclic aromatic compound represented by general formula (1D), (1D'), (1E), or (1E') and a multimer thereof can be manufactured basically through a first step of bonding ring A (ring a) to ring C (ring c) with a bonding group (group including >O or >N—R) to manufacture a first intermediate, a second step of introducing a central element B (boron) by a Tandem Bora Friedel-Crafts Reaction (continuous aromatic electrophilic substitution reaction, the same hereinafter) using boron triiodide or the like, a third step of causing a reaction with an aryl Grignard agent substituted by an alkenyl group such as an isopropenyl group corresponding to the portion of ring B (ring b) or an organic metal compound such as an aryl lithium to manufacture a second intermediate, and a fourth step of applying an acid to this compound and causing a cyclization reaction to manufacture a polycyclic aromatic compound represented by general formula (1D), (1D'), (1E), or (1E') and a multimer thereof. Note that the symbols in structural formulas in schemes (21) to (27) describe later are defined in the same manner as those in general formula (1D), (1D'), (1E), or (1E').

<First Step>

In order to manufacture a compound in which ring A (ring a) is bonded to ring C (ring c) with a bonding group (group including >O or >N—R), for example, a general etherification reaction such as a nucleophilic substitution reaction or an Ullmann reaction can be used in a case where the bonding group is >0, and a general amination reaction such as a Buchwald-Hartwig reaction can be used in a case where the bonding group is >N—R.

<Second Step and Third Step>

These steps will be described with the following schemes (21) and (22). As described below, after a Tandem Bora Friedel-Crafts Reaction using boron triiodide or the like, by causing a reaction with an aryl Grignard agent substituted by an alkenyl group "—C(—Ra)═CHRa'", an aryl lithium, or the like to introduce the portion of ring B (ring b) onto a boron atom, the second intermediate can be manufactured. Note that $X^2$ in each scheme represents >O or >N—R.

Scheme (21)

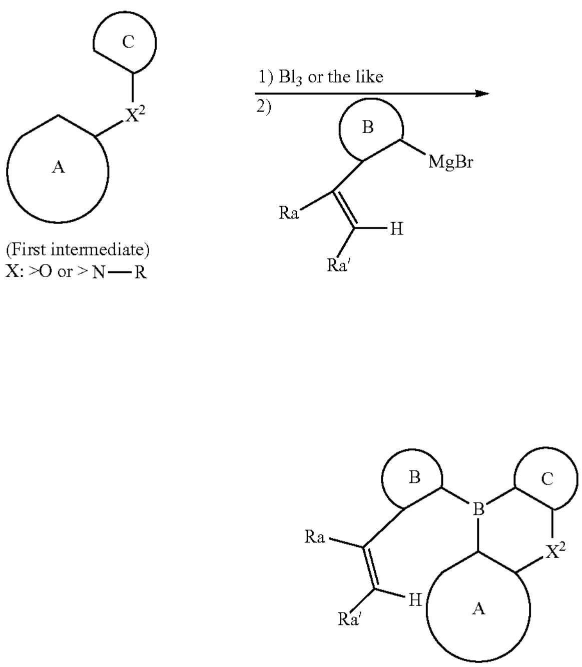

(Second intermediate)

Scheme (22)

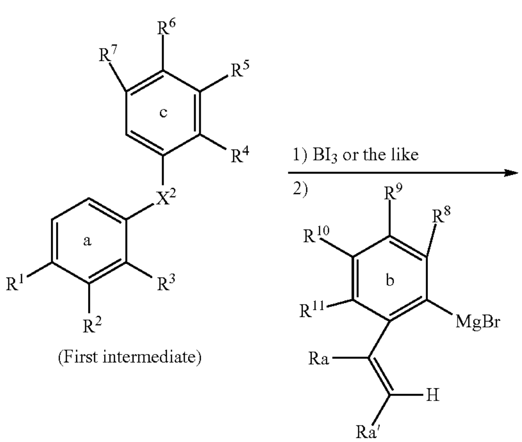

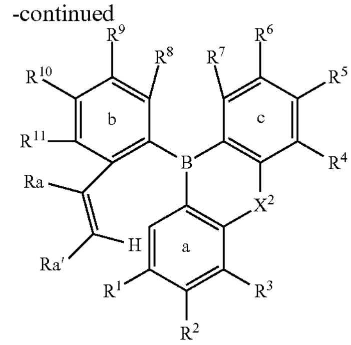

(Second intermediate)

Ra in the alkenyl group "—C(—Ra)═CHRa'" represents a linear or branched alkyl starting from a methylene group, represented by "—$CH_2$—$C_{n-1}H_{2(n-1)+1}$ (n is 1 or more)", and Ra' represents a linear or branched alkyl represented by "—$C_{n-1}H_{2(n-1)+1}$ (n is 1 or more)", and represents a hydrogen atom in a case where n is 1. The structure of the portion of "—$C_{n-1}H_{2(n-1)+1}$" excluding a methylene group in Ra is the same as that of "—$C_{n-1}H_{2(n-1)+1}$" which is Ra'. This is for preventing the "C (carbon atom)" in the portion of ">C(—$Ra)_2$" in general formulas (1D), (1E), (1D'), and (1E') from becoming an asymmetric carbon atom. n is 1 or more, preferably 1 to 6, more preferably 1 to 4, still more preferably 1 to 3, particularly preferably 1 or 2, and most preferably 1 (Ra=methyl group, Ra'=hydrogen atom).

Here, except for a case where Ra represents a methyl group and Ra' represents a hydrogen atom, an E/Z isomer can be generated in the double bond portion. However, in the reaction of manufacturing a polycyclic aromatic compound represented by general formula (1D), (1E), (1D'), or (1E') and a multimer thereof from the second intermediate and a multimer thereof, a case where the double bond portion in the second intermediate and a multimer thereof is an E-isomer and a case where the double bond portion in the second intermediate and a multimer thereof is a Z-isomer generate the same polycyclic aromatic compound and a multimer thereof. Therefore, here, as the second intermediate and a multimer thereof, only a structural formula of a single isomer is described. However, as a form of the double bond portion in the polycyclic aromatic compound and a multimer thereof, either an E-isomer or a Z-isomer may be used, and a mixture of an E-isomer and a Z-isomer at an arbitrary ratio may be used.

The multimer of the second intermediate manufactured in the schemes (21) and (22) can be manufactured using the first intermediate having a plurality of rings A (rings a) and rings C (rings c). The details thereof are described in the following schemes (23) to (25). In this case, by setting the amount of a reagent to be used, such as boron triiodide, to a double amount or a triple amount, the target multimer of the second intermediate can be manufactured. Note that $X^2$ in each scheme represents >O or >N—R.

Scheme (23)
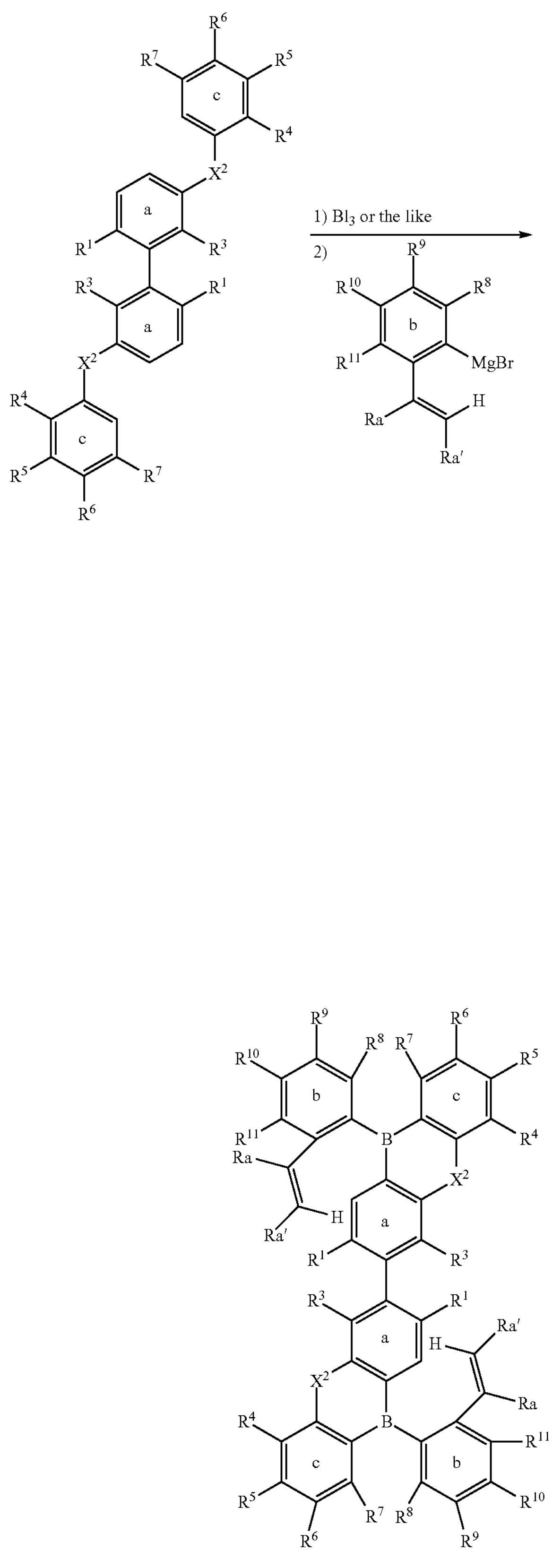
Scheme (24)

Scheme (25)

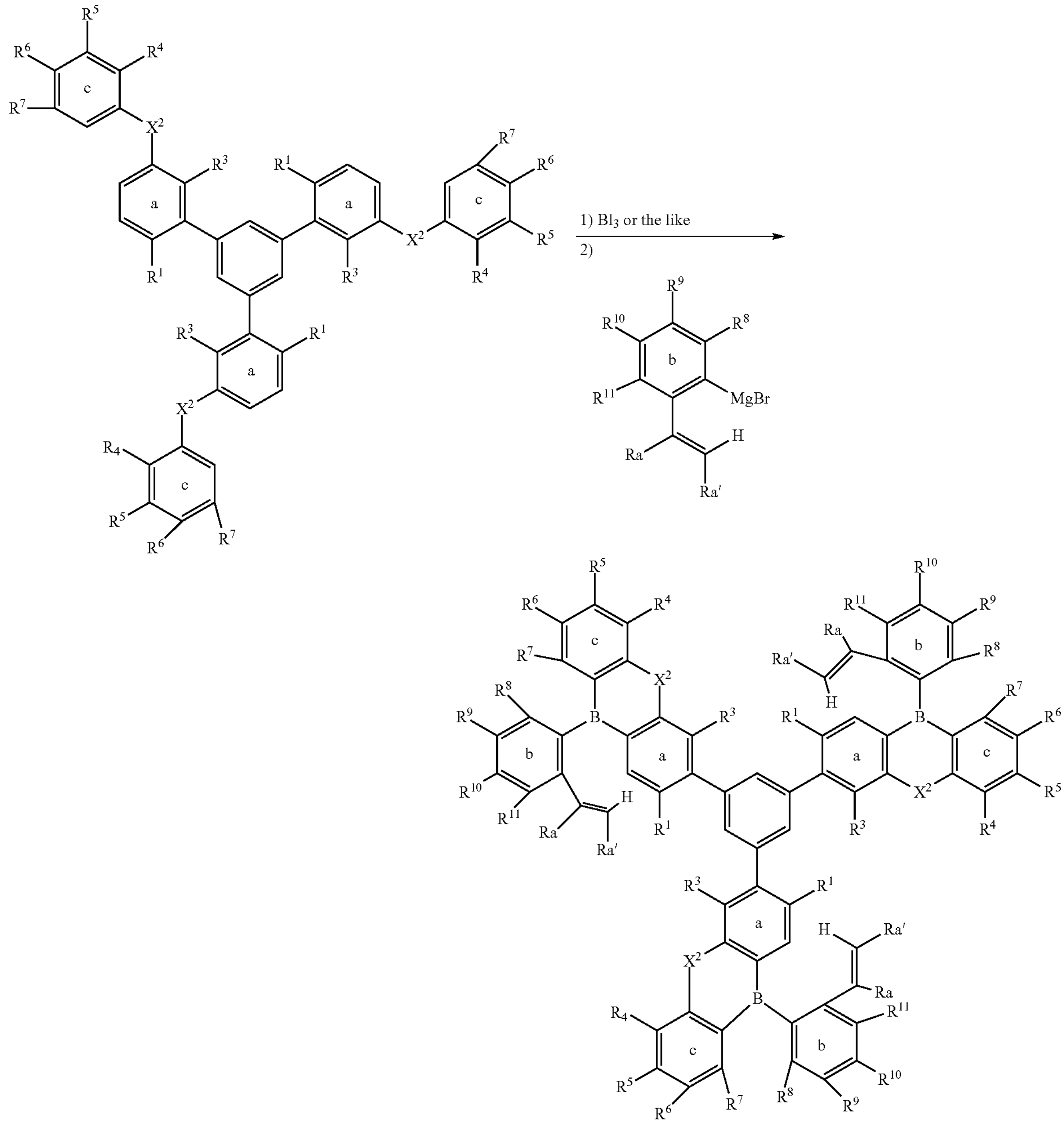

In the above schemes (21) to (25), an example in which boron triiodide is used in a Tandem Bora Friedel-Crafts Reaction as a second step has been described. However, another boron halide reagent such as a boron trichloride/diethyl ether complex, a boron tribromide/diethyl ether complex, or a boron trifluoride/diethyl ether complex can also be used. Furthermore, in order to accelerate a Tandem Bora Friedel-Crafts Reaction in these reactions, for example, a Lewis acid such as aluminum trichloride, gallium trichloride, or titanium tetrachloride may be added.

By appropriately selecting a manufacturing method from among those described above and appropriately selecting a raw material used, it is possible to manufacture a second intermediate and a multimer thereof, having a substituent at a desired position.

Furthermore, after a compound having a reactive substituent, for example, a halogen atom, a sulfonate such as trifluoromethane sulfonate, boronic acid, or a boronate is manufactured by the manufacturing method described above, by using a general reaction, for example, a cross coupling reaction such as Suzuki coupling, Negishi coupling, or Kumada coupling, a Buchwald-Hartwig reaction, an Ullmann reaction, or a reaction with a nucleophilic reaction reagent following metalation such as a halogen-metal exchange reaction using butyl lithium or the like or a Grignard reaction, it is also possible to manufacture a second intermediate and a multimer thereof, having a substituent at a desired position.

A second intermediate having a halogen atom and a multimer thereof can be manufactured using a raw material containing a halogen, and also can be manufactured by halogenating the second intermediate and a multimer thereof using a generally known reaction.

Furthermore, a second intermediate including a sulfonate such as trifluoromethane sulfonate and a multimer thereof can be manufactured using a raw material including a sulfonate, and also can be manufactured by causing a compound manufactured, for example, using a raw material having an alkoxy group such as a methoxy group to react with a generally known reagent such as boron tribromide or a pyridine hydrochloride to convert the alkoxy group into a hydroxy group, and then causing the resulting product to react with an anhydride such as trifluoromethane sulfonic acid anhydride or a halide such as nonafluoro-1-butanesulfonyl fluoride.

Furthermore, the second intermediate and a multimer thereof include a compound in which at least some of hydrogen atoms are substituted by deuterium atoms. Such a compound also can be manufactured using a raw material substituted by a deuterium atom at a desired position in a similar manner to the above.

<Fourth Step>

In the fourth step, an acid is applied to a second intermediate and a multimer thereof manufactured as described above and a cyclization reaction is caused to manufacture a polycyclic aromatic compound represented by general formula (1D), (1E), (1D'), or (1E') and a multimer thereof. In this step, as indicated in the following schemes (26) and (27), by a Friedel-Crafts Reaction using an acid, particularly a Lewis acid such as $Sc(OTf)_3$, a polycyclic aromatic compound represented by general formula (1D), (1E), (1D'), or (1E') and a multimer thereof can be manufactured.

Scheme (26)

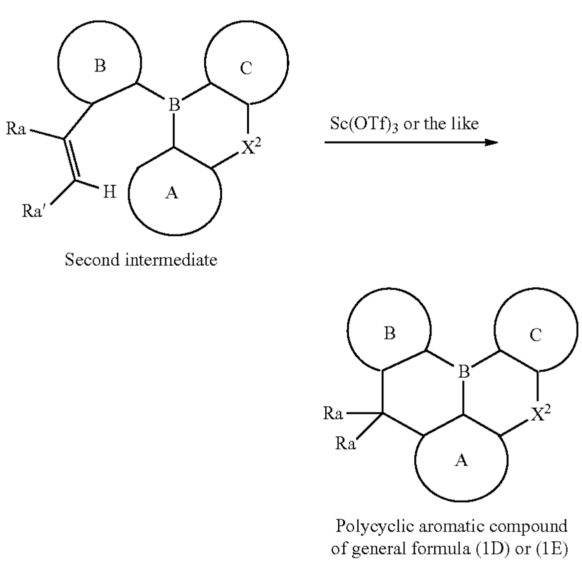

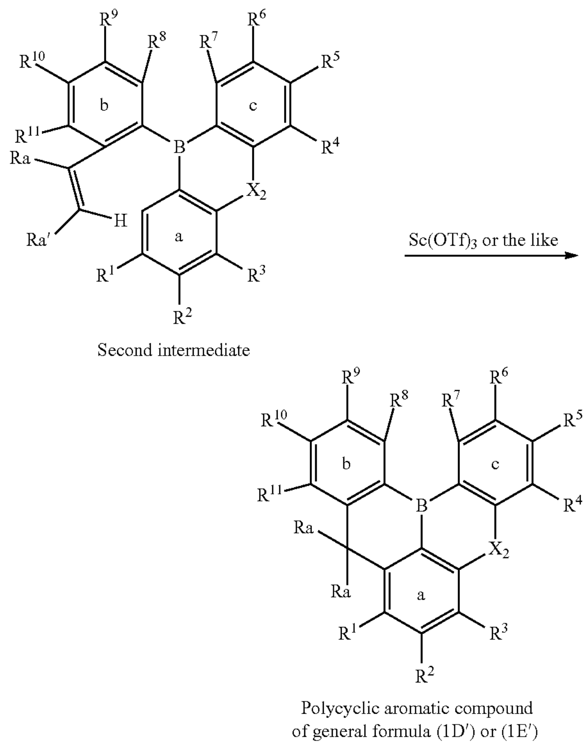

Here, except for a case where Ra represents a methyl group and Ra' represents a hydrogen atom, an E/Z isomer exists in the double bond portion. However, in the schemes (26) and (27), a case where the second intermediate is an E-isomer and a case where the second intermediate is a Z-isomer generate the same polycyclic aromatic compound represented by general formula (1D), (1E), (1D'), or (1E') and a multimer thereof. Therefore, here, in the description of the second intermediate, only a structural formula of a single isomer is described. However, as a form of the double bond portion in the second intermediate, either an E-isomer or a Z-isomer may be used, and a mixture of an E-isomer and a Z-isomer at an arbitrary ratio may be used.

Examples of a Lewis acid used for the above schemes (26) and (27) include $AlCl_3$, $AlBr_3$, $AlF_3$, $BF_3.OEt_2$, $BCl_3$, $BBr_3$, $GaCl_3$, $GaBr_3$, $InCl_3$, $InBr_3$, $In(OTf)_3$, $SnCl_4$, $SnBr_4$, AgOTf, $ScCl_3$, $Sc(OTf)_3$, $ZnCl_2$, $ZnBr_2$, $Zn(OTf)_2$, $MgCl_2$, $MgBr_2$, $Mg(OTf)_2$, LiOTf, NaOTf, KOTf, $Me_3SiOTf$, $Cu(OTf)_2$, $CuCl_2$, $YCl_3$, $Y(OTf)_3$, $TiCl_4$, $TiBr_4$, $ZrCl_4$, $ZrBr_4$, $FeCl_3$, $FeBr_3$, $CoCl_3$, and $CoBr_3$.

As a solvent used for the above schemes (26) and (27), a general organic solvent can be used. Examples thereof include dichloromethane, chloroform, carbon tetrachloride, 1,2-dichloroethylene, benzene, toluene, isomers of xylene and a mixture thereof, isomers of trimethyl benzene and a mixture thereof, chlorobenzene, o-dichlorobenzene, benzotrifluoride, diethyl ether, methyl-t-butylether, tetrahydrofuran, dioxane, cyclopentylmethyl ether, diphenylether, cyclopentane, pentane, cyclohexane, hexane, octane, dodecane, and decalin. In addition, a mixture thereof at an arbitrary ratio can also be used.

By appropriately selecting a manufacturing method from among those described above and appropriately selecting a raw material used, it is possible to manufacture a polycyclic aromatic compound represented by general formula (1D), (1E), (1D'), or (1E') and a multimer thereof, having a substituent at a desired position.

Furthermore, after a compound having a reactive substituent, for example, a halogen, a sulfonate such as trifluoromethane sulfonate, boronic acid, or a boronate is manufactured by the manufacturing method described above, by using a general reaction, for example, a cross coupling reaction such as Suzuki coupling, Negishi coupling, or Kumada coupling, a Buchwald-Hartwig reaction, an Ullmann reaction, or a reaction with a nucleophilic reaction reagent following metalation such as a halogen-metal exchange reaction using butyl lithium or the like or a Grignard reaction, it is also possible to manufacture a polycyclic aromatic compound represented by general formula (1D), (1E), (1D'), or (1E') and a multimer thereof, having a substituent at a desired position.

A polycyclic aromatic compound having a halogen atom, represented by general formula (1D), (1E), (1D'), or (1E') and a multimer thereof can be manufactured using a raw material containing a halogen, and also can be manufactured by halogenating the polycyclic aromatic compound and a multimer thereof using a generally known reaction.

Furthermore, a polycyclic aromatic compound including a sulfonate such as trifluoromethane sulfonate, represented by general formula (1D), (1E), (1D'), or (1E') can be manufactured using a raw material including a sulfonate, and also can be manufactured by causing a compound manufactured, for example, using a raw material having an alkoxy group such as a methoxy group to react with a generally known reagent such as boron tribromide or a pyridine hydrochloride to convert the alkoxy group into a hydroxy group, and then causing the resulting product to react with an anhydride such as trifluoromethane sulfonic acid anhydride or a halide such as nonafluoro-1-butanesulfonyl fluoride.

Furthermore, the polycyclic aromatic compound represented by general formula (1D), (1E), (1D'), or (1E') includes a compound in which at least some of hydrogen atoms are substituted by deuterium atoms. Such a polycyclic aromatic compound or the like also can be manufactured using a raw material substituted by a deuterium atom at a desired position in a similar manner to the above.

3. Organic Electroluminescent Element

Hereinafter, an organic EL element according to the present embodiment will be described in detail based on the drawing. The FIGURE is a schematic cross-sectional view illustrating the organic EL element according to the present embodiment.

<Structure of Organic Electroluminescent Element>

An organic EL element 100 illustrated in the FIGURE includes a substrate 101, a positive electrode 102 provided on the substrate 101, a hole injection layer 103 provided on the positive electrode 102, a hole transport layer 104 provided on the hole injection layer 103, a light emitting layer 105 provided on the hole transport layer 104, an electron transport layer 106 provided on the light emitting layer 105, an electron injection layer 107 provided on the electron transport layer 106, and a negative electrode 108 provided on the electron injection layer 107.

Incidentally, the organic EL element 100 may be configured, by reversing the manufacturing order, to include, for example, the substrate 101, the negative electrode 108 provided on the substrate 101, the electron injection layer 107 provided on the negative electrode 108, the electron transport layer 106 provided on the electron injection layer 107, the light emitting layer 105 provided on the electron transport layer 106, the hole transport layer 104 provided on the light emitting layer 105, the hole injection layer 103 provided on the hole transport layer 104, and the positive electrode 102 provided on the hole injection layer 103.

Not all of the above layers are essential. The configuration includes the positive electrode 102, the light emitting layer 105, and the negative electrode 108 as a minimum constituent unit, while the hole injection layer 103, the hole transport layer 104, the electron transport layer 106, and the electron injection layer 107 are optionally provided. Each of the above layers may be formed of a single layer or a plurality of layers.

A form of layers constituting the organic EL element may be, in addition to the above structure form of "substrate/positive electrode/hole injection layer/hole transport layer/light emitting layer/electron transport layer/electron injection layer/negative electrode", a structure form of "substrate/positive electrode/hole transport layer/light emitting layer/electron transport layer/electron injection layer/negative electrode", "substrate/positive electrode/hole injection layer/light emitting layer/electron transport layer/electron injection layer/negative electrode", "substrate/positive electrode/hole injection layer/hole transport layer/light emitting layer/electron injection layer/negative electrode", "substrate/positive electrode/hole injection layer/hole transport layer/light emitting layer/electron transport layer/negative electrode", "substrate/positive electrode/light emitting layer/electron transport layer/electron injection layer/negative electrode", "substrate/positive electrode/hole transport layer/light emitting layer/electron injection layer/negative electrode", "substrate/positive electrode/hole transport layer/light emitting layer/electron transport layer/negative electrode", "substrate/positive electrode/hole injection layer/light emitting layer/electron injection layer/negative electrode", "substrate/positive electrode/hole injection layer/light emitting layer/electron transport layer/negative electrode", "substrate/positive electrode/light emitting layer/electron transport layer/negative electrode", or "substrate/positive electrode/light emitting layer/electron injection layer/negative electrode".

<Substrate in Organic Electroluminescent Element>

The substrate 101 serves as a support of the organic EL element 100, and usually, quartz, glass, metals, plastics, and the like are used therefor. The substrate 101 is formed into a plate shape, a film shape, or a sheet shape according to a purpose, and for example, a glass plate, a metal plate, a metal foil, a plastic film, and a plastic sheet are used. Among these examples, a glass plate and a plate made of a transparent synthetic resin such as polyester, polymethacrylate, polycarbonate, or polysulfone are preferable. For a glass substrate, soda lime glass, alkali-free glass, and the like are used. The thickness is only required to be a thickness sufficient for maintaining mechanical strength. Therefore, the thickness is only required to be 0.2 mm or more, for example. The upper limit value of the thickness is, for example, 2 mm or less, and preferably 1 mm or less. Regarding a material of glass, glass having fewer ions eluted from the glass is desirable, and therefore alkali-free glass is preferable. However, soda lime glass which has been subjected to barrier coating with $SiO_2$ or the like is also commercially available, and therefore this soda lime glass can be used. Furthermore, the substrate 101 may be provided with a gas barrier film such as a dense silicon oxide film on at least one surface in order to increase a gas barrier property. Particularly in a case of using a plate, a film, or a sheet made of a synthetic resin having a low gas barrier property as the substrate 101, a gas barrier film is preferably provided.

<Positive Electrode in Organic Electroluminescent Element>

The positive electrode 102 plays a role of injecting a hole into the light emitting layer 105. Incidentally, in a case where the hole injection layer 103 and/or the hole transport layer 104 are/is provided between the positive electrode 102 and the light emitting layer 105, a hole is injected into the light emitting layer 105 through these layers.

Examples of a material to form the positive electrode 102 include an inorganic compound and an organic compound. Examples of the inorganic compound include a metal (aluminum, gold, silver, nickel, palladium, chromium, and the like), a metal oxide (indium oxide, tin oxide, indium-tin oxide (ITO), indium-zinc oxide (IZO), and the like), a metal halide (copper iodide and the like), copper sulfide, carbon black, ITO glass, and Nesa glass. Examples of the organic compound include an electrically conductive polymer such as polythiophene such as poly(3-methylthiophene), polypyrrole, or polyaniline. In addition to these compounds, a material can be appropriately selected for use from materials used as a positive electrode of an organic EL element.

A resistance of a transparent electrode is not limited as long as a sufficient current can be supplied to light emission of a luminescent element. However, low resistance is desirable from a viewpoint of consumption power of the luminescent element. For example, an ITO substrate having a resistance of 300Ω/□ or less functions as an element electrode. However, a substrate having a resistance of about 10Ω/□ can be also supplied at present, and therefore it is particularly desirable to use a low resistance product having a resistance of, for example, 100 to 5Ω/□, preferably 50 to 5Ω/□. The thickness of an ITO can be arbitrarily selected according to a resistance value, but an ITO having a thickness of 50 to 300 nm is often used.

<Hole Injection Layer and Hole Transport Layer in Organic Electroluminescent Element>

The hole injection layer 103 plays a role of efficiently injecting a hole that migrates from the positive electrode 102 into the light emitting layer 105 or the hole transport layer 104. The hole transport layer 104 plays a role of efficiently transporting a hole injected from the positive electrode 102 or a hole injected from the positive electrode 102 through the hole injection layer 103 to the light emitting layer 105. The hole injection layer 103 and the hole transport layer 104 are each formed by laminating and mixing one or more kinds of hole injection/transport materials, or by a mixture of a hole injection/transport material and a polymer binder. Furthermore, a layer may be formed by adding an inorganic salt such as iron(III) chloride to the hole injection/transport materials.

A hole injecting/transporting substance needs to efficiently inject/transport a hole from a positive electrode between electrodes to which an electric field is applied, and preferably has high hole injection efficiency and transports an injected hole efficiently. For this purpose, a substance which has low ionization potential, large hole mobility, and excellent stability, and in which impurities that serve as traps are not easily generated at the time of manufacturing and at the time of use, is preferable.

As a material to form the hole injection layer 103 and the hole transport layer 104, any material can be selected for use from among compounds that have been conventionally used as charge transporting materials for holes, p-type semiconductors, and known materials used in a hole injection layer and a hole transport layer of an organic EL element. Specific examples thereof include a heterocyclic compound including a carbazole derivative (N-phenylcarbazole, polyvinylcarbazole, and the like), a biscarbazole derivative such as bis(N-arylcarbazole) or bis(N-alkylcarbazole), a triarylamine derivative (a polymer having an aromatic tertiary amino in a main chain or a side chain, 1,1-bis(4-di-p-tolylaminophenyl)cyclohexane, N,N'-diphenyl-N,N'-di(3-methylphenyl)-4,4'-diaminobiphenyl, N,N'-diphenyl-N,N'-dinaphthyl-4,4'-diaminobiphenyl, N,N'-diphenyl-N,N'-di(3-methylphenyl)-4,4'-diphenyl-1,1'-diamine, N,N'-dinaphthyl-N,N'-diphenyl-4,4'-diphenyl-1,1'-diamine, $N^4$,$N^{4'}$-diphenyl-$N^4$,$N^{4'}$-bis(9-phenyl-9H-carbazol-3-yl)-[1,1'-biphenyl]-4,4'-diamine, $N^4$,$N^4$,$N^{4'}$,$N^{4'}$-tetra[1,1'-biphenyl]-4-yl)-[1,1'-biphenyl]-4,4'-diamine, a triphenylamine derivative such as 4,4',4"-tris(3-methylphenyl(phenyl)amino)triphenylamine, a starburst amine derivative, and the like), a stilbene derivative, a phthalocyanine derivative (non-metal, copper phthalocyanine, and the like), a pyrazoline derivative, a hydrazone-based compound, a benzofuran derivative, a thiophene derivative, an oxadiazole derivative, a quinoxaline derivative (for example, 1,4,5,8,9,12-hexaazatriphenylene-2,3,6,7,10,11-hexacarbonitrile, and the like), and a porphyrin derivative, and a polysilane. Among the polymer-based materials, a polycarbonate, a styrene derivative, a polyvinylcarbazole, a polysilane, and the like having the above monomers in side chains are preferable. However, there is no particular limitation as long as a compound can form a thin film required for manufacturing a luminescent element, can inject a hole from a positive electrode, and can further transport a hole.

Furthermore, it is also known that electroconductivity of an organic semiconductor is strongly affected by doping into the organic semiconductor. Such an organic semiconductor matrix substance is formed of a compound having a good electron-donating property, or a compound having a good electron-accepting property. For doping with an electron-donating substance, a strong electron acceptor such as tetracyanoquinonedimethane (TCNQ) or 2,3,5,6-tetrafluorotetracyano-1,4-benzoquinonedimethane (F4TCNQ) is known (see, for example, "M. Pfeiffer, A. Beyer, T. Fritz, K. Leo, Appl. Phys. Lett., 73(22), 3202-3204 (1998)" and "J. Blochwitz, M. Pheiffer, T. Fritz, K. Leo, Appl. Phys. Lett., 73(6), 729-731 (1998)"). These compounds generate a so-called hole by an electron transfer process in an electron-donating type base substance (hole transporting substance). Electroconductivity of the base substance depends on the number and mobility of the holes fairly significantly. Known examples of a matrix substance having hole transporting characteristics include benzidine derivatives (TPD and the like), starburst amine derivatives (TDATA and the like), and particular metal phthalocyanines (particularly, zinc phthalocyanine (ZnPc) and the like) (JP 2005-167175 A).

<Light Emitting Layer in Organic Electroluminescent Element>

The light emitting layer 105 emits light by recombining a hole injected from the positive electrode 102 and an electron injected from the negative electrode 108 between electrodes to which an electric field is applied. A material to form the light emitting layer 105 is only required to be a compound which is excited by recombination between a hole and an electron and emits light (luminescent compound), and is preferably a compound which can form a stable thin film shape, and exhibits strong light emission (fluorescence) efficiency in a solid state. In the present invention, as the dopant material in the light emitting layer, at least two polycyclic aromatic compounds and/or multimers selected from a compound group consisting of a polycyclic aromatic compound represented by the above general formula (1) and a multimer of a polycyclic aromatic compound having a plurality of structures each represented by the above general formula (1) are used. The at least two polycyclic aromatic compounds and/or multimers are preferably contained in the light emitting layer in an amount of 0.1 to 30% by weight, more preferably 0.5 to 20% by weight, and still more preferably 1 to 10% by weight, particularly preferably 2 to 6% by weight.

The light emitting layer may be formed of a single layer or a plurality of layers, and each layer is formed of a material for a light emitting layer (a host material and a dopant material). Each of the host material may be of one type or a combination of a plurality of types. The dopant material may be included in the host material wholly or partially. Regarding a doping method, doping can be performed by a co-deposition method with a host material, or alternatively, a dopant material may be mixed in advance with a host material, and then vapor deposition may be performed simultaneously. In the case where two or more dopant materials are used as in the present invention, a method of co-vapor-depositting a host material and two or more dopant materials (plurality of boats corresponding to individual materials or one boat containing premixed each material may be used as a vapor-deposition boat) or a method of applying in a dissolved state in which a host material and two or more dopant materials are mixed in an appropriate solvent can be used, and the method of forming the light emitting layer is not particularly limited.

The amount of use of the host material depends on the kind of the host material, and may be determined according to a characteristic of the host material. The reference of the amount of use of the host material is preferably from 70 to 99.9% by weight, more preferably from 80 to 99.5% by weight, and still more preferably from 90 to 99% by weight, particularly preferably 94 to 98% by weight with respect to the total amount of a material for a light emitting layer.

Examples of the host material include an anthracene derivative, a fluorene derivative, a dibenzochrysene derivative, and a carbazole derivative, which have been conventionally known as a luminous body.

Examples of the anthracene derivative include compounds represented by the following structural formula. At least one hydrogen atom in the compound may be substituted by an alkyl having 1 to 6 carbons, cyano, halogen atom, or deuterium atom.

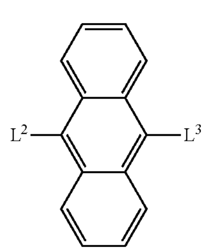

In the above formula, $L^2$ and $L^3$ represent each independently an aryl having 6 to 30 carbon atoms or a heteroaryl having 2 to 30 carbon atoms. As the aryl, an aryl having 6 to 24 carbon atoms is preferable, an aryl having 6 to 16 carbon atoms is more preferable, an aryl having 6 to 12 carbon atoms is further preferable, an aryl having 6 to 10 carbon atoms is particularly preferable. Specific examples include monovalent groups of a benzene ring, a biphenyl ring, a naphthalene ring, a terphenyl ring, an acenaphthylene ring, a fluorene ring, a phenalene ring, a phenanthrene ring, a triphenylene ring, a pyrene ring, a naphthacene ring, a perylene ring, a pentacene ring, and the like. As the heteroaryl, a heteroaryl having 2 to 25 carbon atoms is preferable, a heteroaryl having 2 to 20 carbon atoms is more preferable, a heteroaryl having 2 to 15 carbon atoms is more preferable, and a heteroaryl having 2 to 10 carbon atoms is particularly preferable. Specific examples include a pyrrole ring, an oxazole ring, an isoxazole ring, a thiazole ring, an isothiazole ring, an imidazole ring, an oxadiazole ring, a thiadiazole ring, a triazole ring, a tetrazole ring, a pyrazole ring, a pyridine ring, a pyrimidine ring, a Pyridazine ring, a pyrazine ring, a triazine ring, an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, an indolizine ring, a furan ring, a benzofuran ring, an isobenzofuran ring, a dibenzofuran ring, a thiophene ring, a benzothiophene ring, a dibenzothiophene ring, a furazane ring, an oxadiazole ring, a thianthrene ring, and the like.

Examples of the fluorene derivative include compounds represented by the following structural formula. At least one hydrogen atom in the compound may be substituted by an alkyl having 1 to 6 carbons, cyano, halogen atom, or deuterium atom.

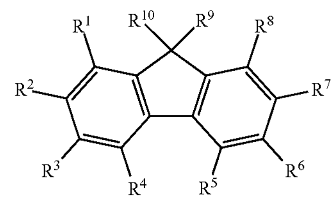

In the above formula, $R^1$ to $R^{10}$ are each independently a hydrogen atom, aryl, heteroaryl, diarylamino, diheteroarylamino, arylheteroarylamino, alkyl, alkenyl, alkoxy or aryloxy, wherein at least one hydrogen atom in these may be substituted by aryl, heteroaryl or alkyl, $R^1$ and $R^2$, $R^2$ and $R^3$, $R^3$ and $R^4$, $R^5$ and $R^6$, $R^6$ and $R^7$, $R^7$ and $R^8$ or $R^9$ and $R^{10}$ may be independently bonded to form a condensed ring or a spiro ring, at least one hydrogen atom in the ring thus formed may be substituted by aryl, heteroaryl (the heteroaryl may be bonded to the formed ring via a linking group), diarylamino, diheteroarylamino, arylheteroarylamino, alkyl, alkenyl, alkoxy or aryloxy, and at least one hydrogen atom in these may be substituted by aryl, heteroaryl or alkyl.

Examples of the dibenzochrysene derivative include compounds represented by the following structural formula. At least one hydrogen atom in the compound may be substituted by an alkyl having 1 to 6 carbons, cyano, halogen atom, or deuterium atom.

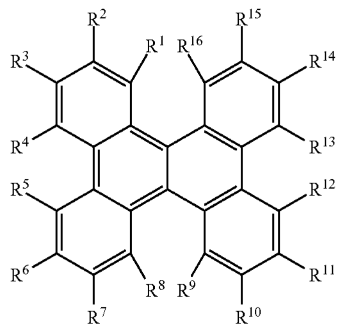

In the above formula, $R^1$ to $R^{16}$ are each independently a hydrogen atom, aryl, heteroaryl, diarylamino, diheteroarylamino, arylheteroarylamino, alkyl, alkenyl, alkoxy or aryloxy, wherein at least one hydrogen atom in these may be substituted by aryl, heteroaryl or alkyl, adjacent groups among $R^1$ to $R^{16}$ may be bonded to each other to form a condensed ring, at least one hydrogen atom in the ring thus formed may be substituted by aryl, heteroaryl (the heteroaryl may be bonded to the formed ring via a linking group), diarylamino, diheteroarylamino, arylheteroarylamino, alkyl, alkenyl, alkoxy or aryloxy, and at least one hydrogen atom in these may be substituted by aryl, heteroaryl or alkyl.

Examples of the carbazole derivative include compounds represented by the following structural formula. At least one hydrogen atom in the compound may be substituted by an alkyl having 1 to 6 carbons, cyano, halogen atom, or deuterium atom.

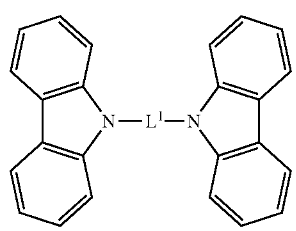

In the above formula, $L^1$ represents an arylene having 6 to 24 carbon atoms, preferably an arylene having 6 to 16 carbon atoms, more preferably an arylene having 6 to 12 carbon atoms, and particularly preferably an arylene having 6 to 10 carbon atoms. Specific examples include divalent groups of a benzene ring, a biphenyl ring, a naphthalene ring, a terphenyl ring, an acenaphthylene ring, a fluorene ring, a phenalene ring, a phenanthrene ring, a triphenylene ring, a pyrene ring, a naphthacene ring, a perylene ring, a pentacene ring, and the like.

<Electron Injection Layer and Electron Transport Layer in Organic Electroluminescent Element>

The electron injection layer 107 plays a role of efficiently injecting an electron migrating from the negative electrode 108 into the light emitting layer 105 or the electron transport layer 106. The electron transport layer 106 plays a role of efficiently transporting an electron injected from the negative electrode 108, or an electron injected from the negative electrode 108 through the electron injection layer 107 to the light emitting layer 105. The electron transport layer 106 and the electron injection layer 107 are each formed by laminating and mixing one or more kinds of electron transport/injection materials, or by a mixture of an electron transport/injection material and a polymeric binder.

An electron injection/transport layer is a layer that manages injection of an electron from a negative electrode and transport of an electron, and is preferably a layer that has high electron injection efficiency and can efficiently transport an injected electron. For this purpose, a substance which has high electron affinity, large electron mobility, and excellent stability, and in which impurities that serve as traps are not easily generated at the time of manufacturing and at the time of use, is preferable. However, when a transport balance between a hole and an electron is considered, in a case where the electron injection/transport layer mainly plays a role of efficiently preventing a hole coming from a positive electrode from flowing toward a negative electrode side without being recombined, even if electron transporting ability is not so high, an effect of enhancing luminous efficiency is equal to that of a material having high electron transporting ability. Therefore, the electron injection/transport layer according to the present embodiment may also include a function of a layer that can efficiently prevent migration of a hole.

A material (electron transport material) for forming the electron transport layer 106 or the electron injection layer 107 can be arbitrarily selected for use from compounds conventionally used as electron transfer compounds in a photoconductive material, and known compounds that are used in an electron injection layer and an electron transport layer of an organic EL element.

A material used in an electron transport layer or an electron injection layer preferably includes at least one selected from a compound formed of an aromatic ring or a heteroaromatic ring including one or more kinds of atoms selected from carbon, hydrogen, oxygen, sulfur, silicon, and phosphorus atoms, a pyrrole derivative and a fused ring derivative thereof, and a metal complex having an electron-accepting nitrogen atom. Specific examples of the material include a fused ring-based aromatic ring derivative of naphthalene, anthracene, or the like, a styryl-based aromatic ring derivative represented by 4,4'-bis(diphenylethenyl)biphenyl, a perinone derivative, a coumarin derivative, a naphthalimide derivative, a quinone derivative such as anthraquinone or diphenoquinone, a phosphorus oxide derivative, a carbazole derivative, and an indole derivative. Examples of the metal complex having an electron-accepting nitrogen atom include a hydroxyazole complex such as a hydroxyphenyloxazole complex, an azomethine complex, a tropolone metal complex, a flavonol metal complex, and a benzoquinoline metal complex. These materials are used singly, but may also be used in a mixture with other materials.

Furthermore, specific examples of other electron transfer compounds include a pyridine derivative, a naphthalene derivative, an anthracene derivative, a phenanthroline derivative, a perinone derivative, a coumarin derivative, a naphthalimide derivative, an anthraquinone derivative, a diphenoquinone derivative, a diphenylquinone derivative, a perylene derivative, an oxadiazole derivative (1,3-bis[(4-t-butylphenyl)-1,3,4-oxadiazolyl]phenylene and the like), a thiophene derivative, a triazole derivative (N-naphthyl-2,5-diphenyl-1,3,4-triazole and the like), a thiadiazole derivative, a metal complex of an oxine derivative, a quinolinol-based metal complex, a quinoxaline derivative, a polymer of a quinoxaline derivative, a benzazole compound, a gallium complex, a pyrazole derivative, a perfluorinated phenylene derivative, a triazine derivative, a pyrazine derivative, a benzoquinoline derivative (2,2'-bis(benzo[h]quinolin-2-yl)-

9,9'-spirobifluorene and the like), an imidazopyridine derivative, a borane derivative, a benzimidazole derivative (tris(N-phenylbenzimidazol-2-yl)benzene and the like), a benzoxazole derivative, a benzothiazole derivative, a quinoline derivative, an oligopyridine derivative such as terpyridine, a bipyridine derivative, a terpyridine derivative (1,3-bis(4'-(2,2':6'2"-terpyridinyl))benzene and the like), a naphthyridine derivative (bis(1-naphthyl)-4-(1,8-naphthyridin-2-yl)phenylphosphine oxide and the like), an aldazine derivative, a carbazole derivative, an indole derivative, a phosphorus oxide derivative, and a bisstyryl derivative.

Furthermore, a metal complex having an electron-accepting nitrogen atom can also be used, and examples thereof include a quinolinol-based metal complex, a hydroxyazole complex such as a hydroxyphenyloxazole complex, an azomethine complex, a tropolone-metal complex, a flavonol-metal complex, and a benzoquinoline-metal complex.

The materials described above are used singly, but may also be used in a mixture with other materials.

Among the above materials, a borane derivative, a pyridine derivative, a fluoranthene derivative, a BO-based derivative, an anthracene derivative, a benzofluorene derivative, a phosphine oxide derivative, a pyrimidine derivative, a carbazole derivative, a triazine derivative, a benzimidazole derivative, a phenanthroline derivative, and a quinolinol-based metal complex are preferable.

<Borane Derivative>

The borane derivative is, for example, a compound represented by the following general formula (ETM-1), and specifically disclosed in JP 2007-27587 A.

(ETM-1)

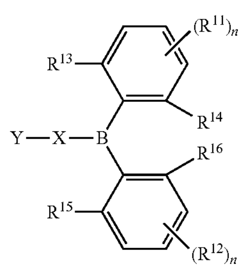

In the above formula (ETM-1), $R^{11}$ and $R^{12}$ each independently represent at least one of a hydrogen atom, an alkyl, an optionally substituted aryl, a substituted silyl, an optionally substituted nitrogen-containing heterocyclic ring, and cyano, $R^{13}$ to $R^{16}$ each independently represent an optionally substituted alkyl, or an optionally substituted aryl, X represents an optionally substituted arylene, Y represents an optionally substituted aryl having 16 or fewer carbon atoms, a substituted boryl, or an optionally substituted carbazolyl, and n's each independently represent an integer of 0 to 3. In addition, examples of the substituent when "optionally substituted" or "substituted" include aryl, heteroaryl and alkyl.

Among compounds represented by the above general formula (ETM-1), a compound represented by the following general formula (ETM-1-1) and a compound represented by the following general formula (ETM-1-2) are preferable.

(ETM-1-1)

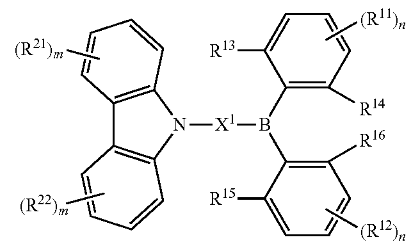

In formula (ETM-1-1), $R^{11}$ and $R^{12}$ each independently represent at least one of a hydrogen atom, an alkyl, an optionally substituted aryl, a substituted silyl, an optionally substituted nitrogen-containing heterocyclic ring, and cyano, $R^{13}$ to $R^{16}$ each independently represent an optionally substituted alkyl, or an optionally substituted aryl, $R^{21}$ and $R^{22}$ each independently represent at least one of a hydrogen atom, an alkyl, an optionally substituted aryl, a substituted silyl, an optionally substituted nitrogen-containing heterocyclic ring, and cyano, $X^1$ represents an optionally substituted arylene having 20 or fewer carbon atoms, n's each independently represent an integer of 0 to 3, and m's each independently represent an integer of 0 to 4. In addition, examples of the substituent when "optionally substituted" or "substituted" include aryl, heteroaryl and alkyl.

(ETM-1-2)

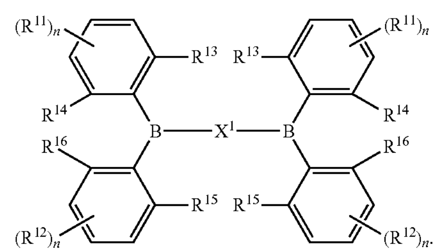

In formula (ETM-1-2), $R^{11}$ and $R^{12}$ each independently represent at least one of a hydrogen atom, an alkyl, an optionally substituted aryl, a substituted silyl, an optionally substituted nitrogen-containing heterocyclic ring, and cyano, $R^{13}$ to $R^{16}$ each independently represent an optionally substituted alkyl, or an optionally substituted aryl, $X^1$ represents an optionally substituted arylene having 20 or fewer carbon atoms, and n's each independently represent an integer of 0 to 3. In addition, examples of the substituent when "optionally substituted" or "substituted" include aryl, heteroaryl and alkyl.

Specific examples of $X^1$ include divalent groups represented by the following formulas (X-1) to (X-9).

(X-1)

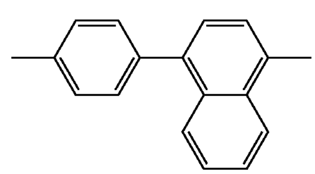

-continued (X-2)

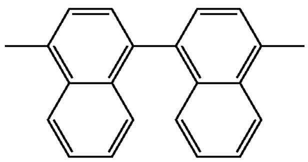

(X-3)

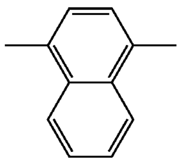

(X-4)

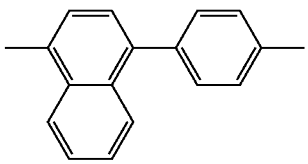

(X-5)

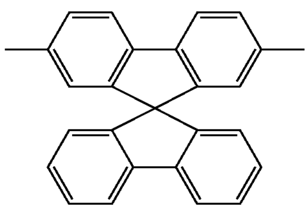

(X-6)

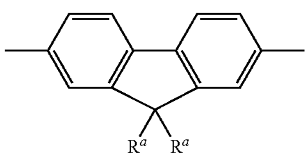

(X-7)

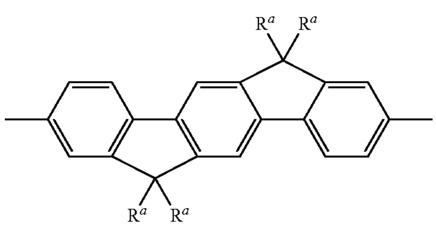

(X-8)

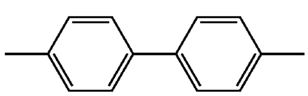

(X-9)

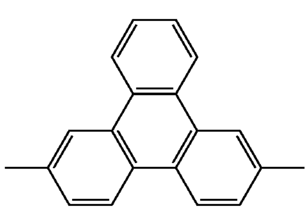

(In each formula, $R^a$'s each independently represent an alkyl group, or an optionally substituted phenyl group.)

Specific examples of this borane derivative include the following compounds.

ET-1

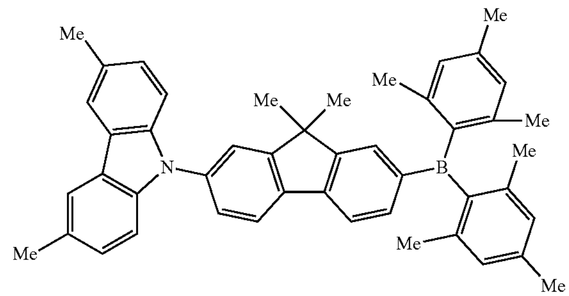

This borane derivative can be manufactured using known raw materials and known synthesis methods.

<Pyridine Derivative>

A pyridine derivative is, for example, a compound represented by the following formula (ETM-2), and preferably a compound represented by formula (ETM-2-1) or (ETM-2-2).

(ETM-2)

$$\phi\text{-(Pyridine-based substituent)}_n$$

(ETM-2-1)

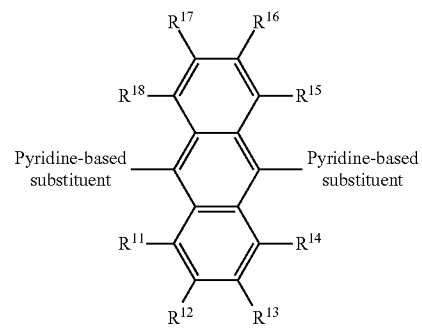

(ETM-2-2)

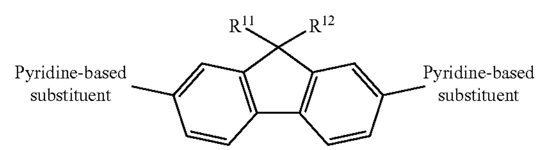

φ represents an n-valent aryl ring (preferably, an n-valent benzene ring, naphthalene ring, anthracene ring, fluorene ring, benzofluorene ring, phenalene ring, phenanthrene ring, or triphenylene ring), and n represents an integer of 1 to 4.

In the above formula (ETM-2-1), $R^{11}$ to $R^{18}$ each independently represent a hydrogen atom, an alkyl (preferably, an alkyl having 1 to 24 carbon atoms), a cycloalkyl (preferably, a cycloalkyl having 3 to 12 carbon atoms), or an aryl (preferably, an aryl having 6 to 30 carbon atoms).

In the above formula (ETM-2-2), $R^{11}$ and $R^{12}$ each independently represent a hydrogen atom, an alkyl (preferably, an alkyl having 1 to 24 carbon atoms), a cycloalkyl (preferably, a cycloalkyl having 3 to 12 carbon atoms), or an aryl (preferably, an aryl having 6 to 30 carbon atoms), and $R^{11}$ and $R^{12}$ may be bonded to each other to form a ring.

In each formula, the "pyridine-based substituent" is any one of the following formulas (Py-1) to (Py-15), and the pyridine-based substituents may be each independently substituted by an alkyl having 1 to 4 carbon atoms. Furthermore, the pyridine-based substituent may be bonded to φ, an anthracene ring, or a fluorene ring in each formula via a phenylene group or a naphthylene group.

(Py-1)

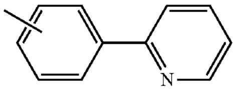

(Py-2)

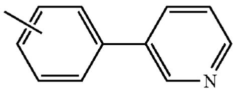

(Py-3)

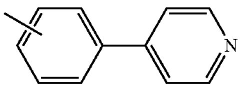

(Py-4)

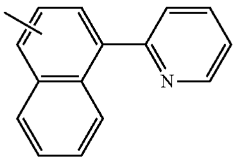

(Py-5)

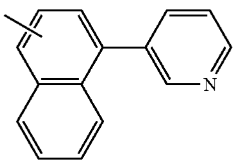

(Py-6)

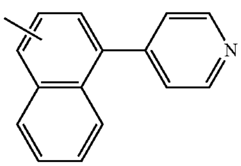

(Py-7)

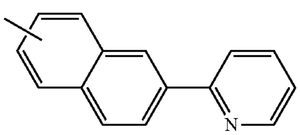

(Py-8)

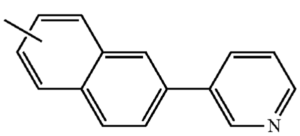

(Py-9)

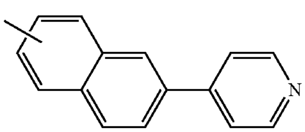

(Py-10)

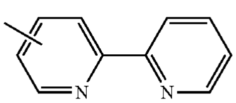

(Py-11)

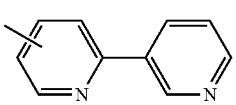

-continued (Py-12)

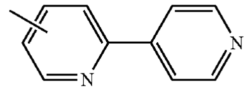

(Py-13)

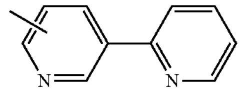

(Py-14)

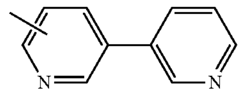

(Py-15)

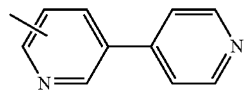

The pyridine-based substituent is any one of the above-formulas (Py-1) to (Py-15). However, among these formulas, the pyridine-based substituent is preferably any one of the following formulas (Py-21) to (Py-44).

(Py-21)

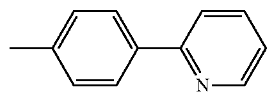

(Py-22)

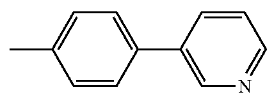

(Py-23)

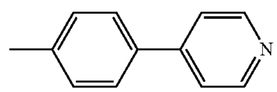

(Py-24)

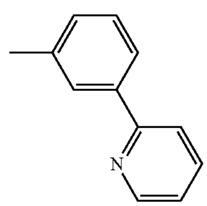

(Py-25)

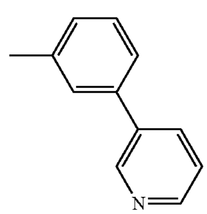

(Py-26)

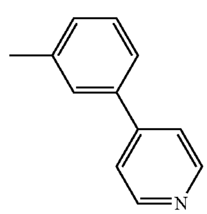

-continued (Py-27)

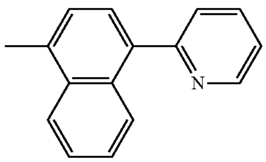

(Py-28)

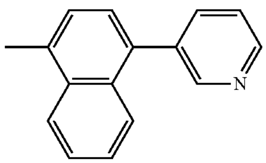

(Py-29)

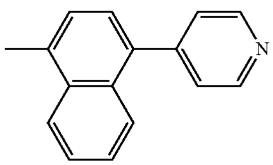

(Py-30)

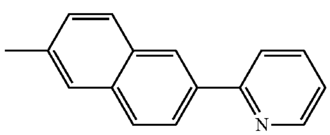

(Py-31)

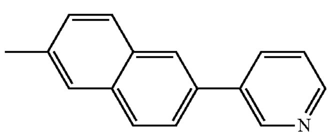

(Py-32)

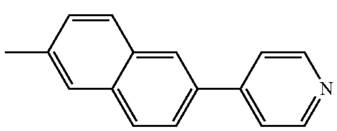

(Py-33)

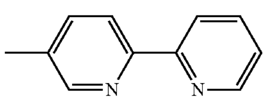

(Py-34)

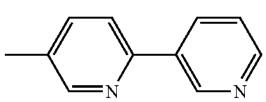

(Py-35)

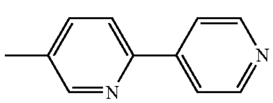

(Py-36)

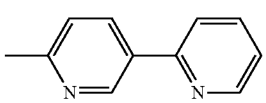

(Py-37)

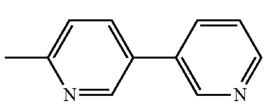

(Py-38)

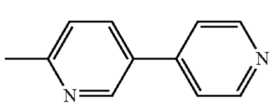

-continued (Py-39)

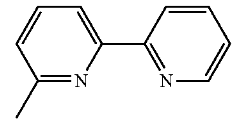

(Py-40)

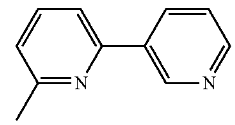

(Py-41)

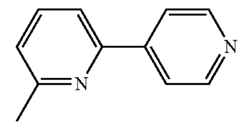

(Py-42)

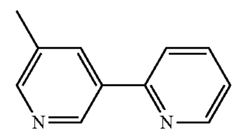

(Py-43)

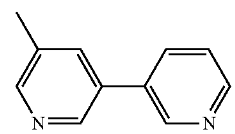

(Py-44)

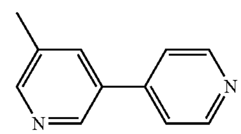

At least one hydrogen atom in each pyridine derivative may be substituted by a deuterium atom. Furthermore, one of the two "pyridine-based substituents" in the above formulas (ETM-2-1) and (ETM-2-2) may be substituted by an aryl.

The "alkyl" in $R^{11}$ to $R^{18}$ may be either linear or branched, and examples thereof include a linear alkyl having 1 to 24 carbon atoms and a branched alkyl having 3 to 24 carbon atoms. A preferable "alkyl" is an alkyl having 1 to 18 carbon atoms (branched alkyl having 3 to 18 carbon atoms). A more preferable "alkyl" is an alkyl having 1 to 12 carbons (branched alkyl having 3 to 12 carbons). A still more preferable "alkyl" is an alkyl having 1 to 6 carbon atoms (branched alkyl having 3 to 6 carbon atoms). A particularly preferable "alkyl" is an alkyl having 1 to 4 carbon atoms (branched alkyl having 3 to 4 carbon atoms).

Specific examples of the "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

As the alkyl having 1 to 4 carbon atoms by which the pyridine-based substituent is substituted, the above description of the alkyl can be cited.

Examples of the "cycloalkyl" in $R^{11}$ to $R^{18}$ include a cycloalkyl having 3 to 12 carbon atoms. A preferable "cycloalkyl" is a cycloalkyl having 3 to 10 carbons. A more preferable "cycloalkyl" is a cycloalkyl having 3 to 8 carbon atoms. A still more preferable "cycloalkyl" is a cycloalkyl having 3 to 6 carbon atoms.

Specific examples of the "cycloalkyl" include cyclopropyl, cyclobutyl, cyclopentyl, cyclohexyl, methylcyclopentyl, cycloheptyl, methylcyclohexyl, cyclooctyl, and dimethylcyclohexyl.

As the "aryl" in $R^{11}$ to $R^{18}$, a preferable aryl is an aryl having 6 to 30 carbon atoms, a more preferable aryl is an aryl having 6 to 18 carbon atoms, a still more preferable aryl is an aryl having 6 to 14 carbon atoms, and a particularly preferable aryl is an aryl having 6 to 12 carbon atoms.

Specific examples of the "aryl having 6 to 30 carbon atoms" include phenyl which is a monocyclic aryl; (1-,2-) naphthyl which is a fused bicyclic aryl; acenaphthylene-(1-, 3-,4-,5-)yl, a fluorene-(1-,2-,3-,4-,9-)yl, phenalene-(1-, 2-)yl, and (1-,2-,3-,4-,9-)phenanthryl which are fused tricyclic aryls; triphenylene-(1-, 2-)yl, pyrene-(1-,2-, 4-)yl, and naphthacene-(1-, 2-, 5-)yl which are fused tetracyclic aryls; and perylene-(1-,2-,3-)yl and pentacene-(1-, 2-, 5-, 6-)yl which are fused pentacyclic aryls.

Preferable examples of the "aryl having 6 to 30 carbon atoms" include a phenyl, a naphthyl, a phenanthryl, a chrysenyl, and a triphenylenyl. More preferable examples thereof include a phenyl, a 1-naphthyl, a 2-naphthyl, and a phenanthryl. Particularly preferable examples thereof include a phenyl, a 1-naphthyl, and a 2-naphthyl.

$R^{11}$ and $R^{12}$ in the above formula (ETM-2-2) may be bonded to each other to form a ring. As a result, cyclobutane, cyclopentane, cyclopentene, cyclopentadiene, cyclohexane, fluorene, indene, or the like may be spiro-bonded to a 5-membered ring of a fluorene skeleton.

Specific examples of this pyridine derivative include the following compounds.

ET-2

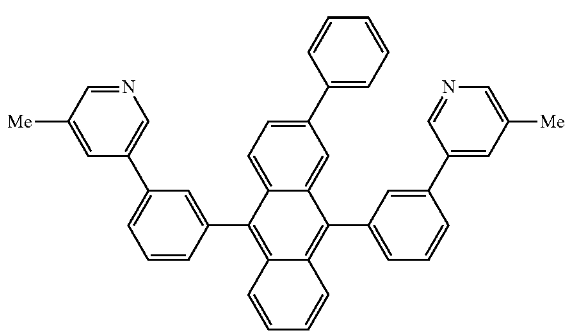

ET-3

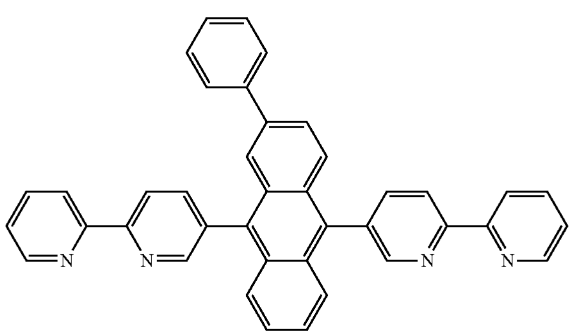

-continued

ET-6

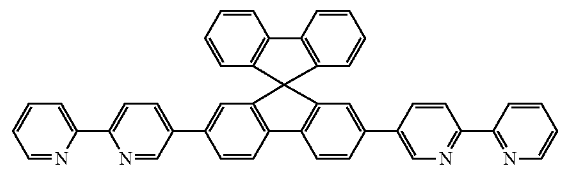

ET-7

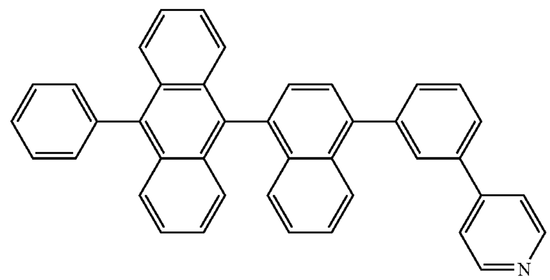

This pyridine derivative can be manufactured using known raw materials and known synthesis methods.

<Fluoranthene Derivative>

The fluoranthene derivative is, for example, a compound represented by the following general formula (ETM-3), and specifically disclosed in WO 2010/134352 A.

(ETM-3)

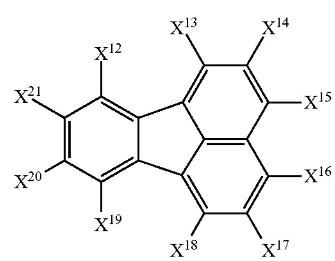

In the above formula (ETM-3), $X^{12}$ to $X^{21}$ each represent a hydrogen atom, a halogen atom, a linear, branched or cyclic alkyl, a linear, branched or cyclic alkoxy, a substituted or unsubstituted aryl, or a substituted or unsubstituted heteroaryl. Examples of the substituent when substituted include aryl, heteroaryl, and alkyl.

Specific examples of this fluoranthene derivative include the following compounds.

(ETM-3-1)

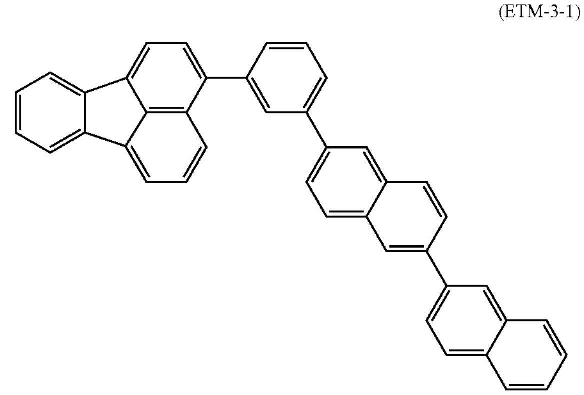

-continued (ETM-3-2)

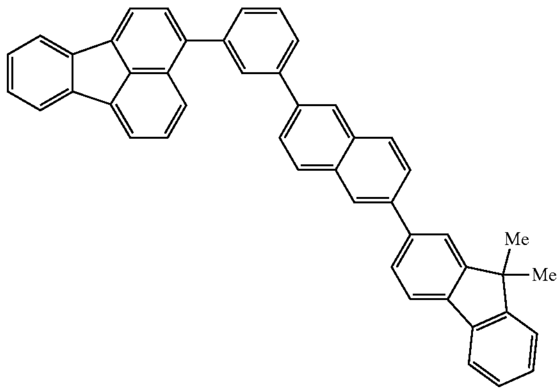

(ETM-3-3)

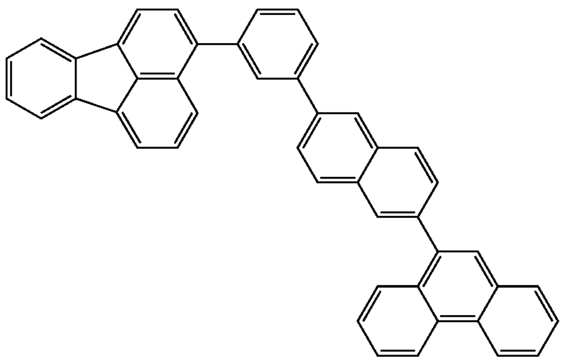

<BO-Based Derivative>

The BO-based derivative is, for example, a polycyclic aromatic compound represented by the following formula (ETM-4) or a polycyclic aromatic compound multimer having a plurality of structures represented by the following formula (ETM-4).

(ETM-4)

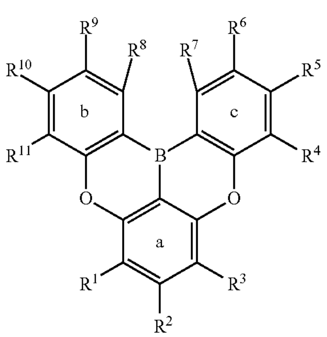

$R^1$ to $R^{11}$ each independently represent a hydrogen atom, an aryl, a heteroaryl, a diarylamino, a diheteroarylamino, an arylheteroarylamino, an alkyl, an alkoxy, or an aryloxy, while at least one hydrogen atom in these may be substituted by an aryl, a heteroaryl, or an alkyl.

Furthermore, adjacent groups among $R^1$ to $R^{11}$ may be bonded to each other to form an aryl ring or a heteroaryl ring together with the ring a, ring b, or ring c, and at least one hydrogen atom in the ring thus formed may be substituted by an aryl, a heteroaryl, a diarylamino, a diheteroarylamino, an arylheteroarylamino, an alkyl, an alkoxy, or an aryloxy, while at least one hydrogen atom in these may be substituted by an aryl, a heteroaryl, or an alkyl.

Furthermore, at least one hydrogen atom in a compound or structure represented by formula (ETM-4) may be substituted by a halogen atom or a deuterium atom.

For description of a substituent and a form of ring formation in formula (ETM-4), and a multimer formed by combining multiple structures of formula (ETM-4), the description of the polycyclic aromatic compound represented by the above general formula (1) or formula (1') and the multimer thereof can be cited.

Specific examples of this BO-based derivative include the following compounds.

ET-5

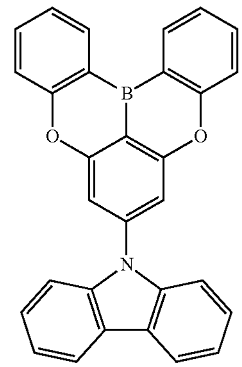

This BO-based derivative can be manufactured using known raw materials and known synthesis methods.

<Anthracene Derivative>

One of the anthracene derivatives is, for example, a compound represented by the following formula (ETM-5-1).

(ETM-5-1)

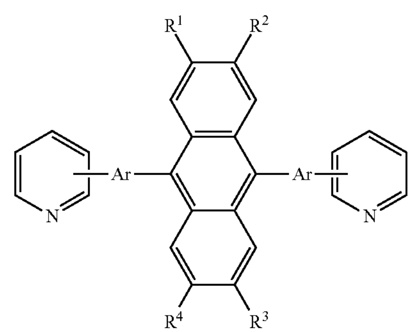

Ar's each independently represent a divalent benzene or naphthalene, $R^1$ to $R^4$ each independently represent a hydrogen atom, an alkyl having 1 to 6 carbon atoms, a cycloalkyl having 3 to 6 carbon atoms, or an aryl having 6 to 20 carbon atoms.

Ar's can be each independently selected from a divalent benzene and naphthalene appropriately. Two Ar's may be different from or the same as each other, but are preferably the same from a viewpoint of easiness of synthesis of an anthracene derivative. Ar is bonded to pyridine to form "a moiety formed of Ar and pyridine". For example, this moiety is bonded to anthracene as a group represented by any one of the following formulas (Py-1) to (Py-12).

-continued (Py-1)

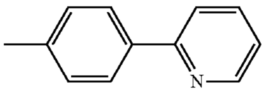

(Py-2)

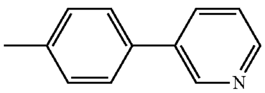

(Py-3)

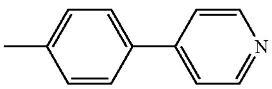

(Py-4)

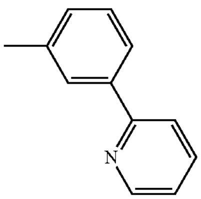

(Py-5)

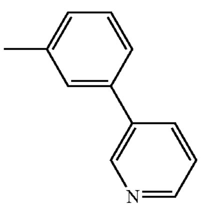

(Py-6)

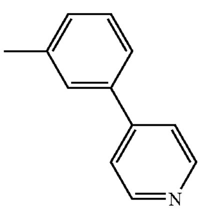

(Py-7)

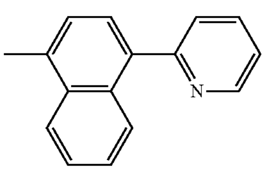

(Py-8)

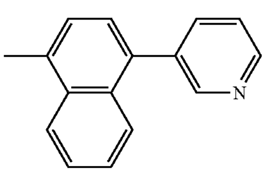

(Py-9)

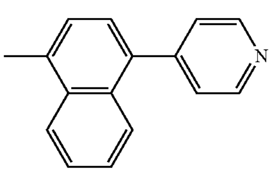

(Py-10)

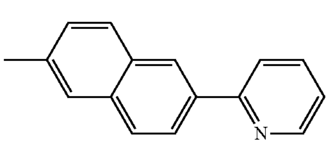

(Py-11)

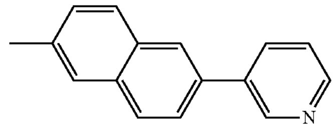

(Py-12)

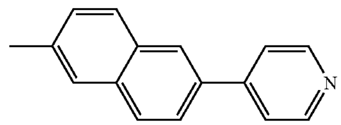

Among these groups, a group represented by any one of the above formulas (Py-1) to (Py-9) is preferable, and a group represented by any one of the above formulas (Py-1) to (Py-6) is more preferable. Two "moieties formed of Ar and pyridine" bonded to anthracene may have the same structure as or different structures from each other, but preferably have the same structure from a viewpoint of easiness of synthesis of an anthracene derivative. However, two "moieties formed of Ar and pyridine" preferably have the same structure or different structures from a viewpoint of element characteristics.

The alkyl having 1 to 6 carbon atoms in $R^1$ to $R^4$ may be either linear or branched. That is, the alkyl having 1 to 6 carbon atoms is a linear alkyl having 1 to 6 carbon atoms or a branched alkyl having 3 to 6 carbon atoms. More preferably, the alkyl having 1 to 6 carbon atoms is an alkyl having 1 to 4 carbon atoms (branched alkyl having 3 to 4 carbon atoms). Specific examples thereof include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, and 2-ethylbutyl. Methyl, ethyl, n-propyl, isopropyl, n-butyl, isobutyl, s-butyl, and t-butyl are preferable. Methyl, ethyl, and t-butyl are more preferable.

Specific examples of the cycloalkyl having 3 to 6 carbon atoms in $R^1$ to $R^4$ include cyclopropyl, cyclobutyl, cyclopentyl, cyclohexyl, methylcyclopentyl, cycloheptyl, methylcyclohexyl, cyclooctyl, and dimethylcyclohexyl.

For the aryl having 6 to 20 carbon atoms in $R^1$ to $R^4$, an aryl having 6 to 16 carbon atoms is preferable, an aryl having 6 to 12 carbon atoms is more preferable, and an aryl having 6 to 10 carbon atoms is particularly preferable.

Specific examples of the "aryl having 6 to 20 carbon atoms" include phenyl, (o-, m-, p-) tolyl, (2,3-, 2,4-, 2,5-, 2,6-, 3,4-, 3,5-) xylyl, mesityl (2,4,6-trimethylphenyl), and (o-, m-, p-)cumenyl which are monocyclic aryls; (2-, 3-, 4-)biphenylyl which is a bicyclic aryl; (1-, 2-)naphthyl which is a fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) which is a tricyclic aryl; anthracene-(1-, 2-, 9-)yl, acenaphthylene-(1-, 3-, 4-, 5-)yl, fluorene-(1-, 2-, 3-, 4-, 9-)yl, phenalene-(1-, 2-)yl, and (1-, 2-, 3-, 4-, 9-)phenanthryl which are fused tricyclic aryls; triphenylene-(1-, 2-)yl, pyrene-(1-, 2-, 4-)yl, and tetracene-(1-, 2-, 5-)yl which are fused tetracyclic aryls; and perylene-(1-, 2-, 3-)yl which is a fused pentacyclic aryl.

The "aryl having 6 to 20 carbon atoms" is preferably a phenyl, a biphenylyl, a terphenylyl, or a naphthyl, more preferably a phenyl, a biphenylyl, a 1-naphthyl, a 2-naphthyl, or an m-terphenyl-5'-yl, still more preferably a phenyl, a biphenylyl, a 1-naphthyl, or a 2-naphthyl, and most preferably a phenyl.

One of the anthracene derivatives is, for example, a compound represented by the following formula (ETM-5-2).

(ETM-5-2)

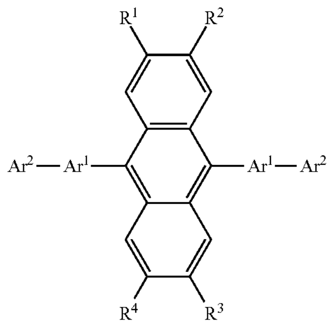

$Ar^1$'s each independently represent a single bond, a divalent benzene, naphthalene, anthracene, fluorene, or phenalene.

$Ar^2$'s each independently represent an aryl having 6 to 20 carbon atoms. The same description as the "aryl having 6 to 20 carbon atoms" in the above formula (ETM-5-1) can be cited. An aryl having 6 to 16 carbon atoms is preferable, an aryl having 6 to 12 carbon atoms is more preferable, and an aryl having 6 to 10 carbon atoms is particularly preferable. Specific examples thereof include phenyl, biphenylyl, naphthyl, terphenylyl, anthracenyl, acenaphthylenyl, fluorenyl, phenalenyl, phenanthryl, triphenylenyl, pyrenyl, tetracenyl, and perylenyl.

$R^1$ to $R^4$ each independently represent a hydrogen atom, an alkyl having 1 to 6 carbon atoms, a cycloalkyl having 3 to 6 carbon atoms, or an aryl having 6 to 20 carbon atoms. The same description as in the above formula (ETM-5-1) can be cited.

Specific examples of these anthracene derivatives include the following compounds.

ET-7

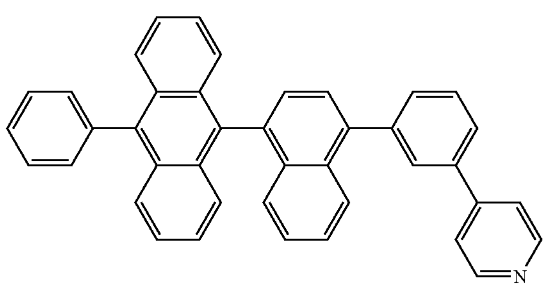

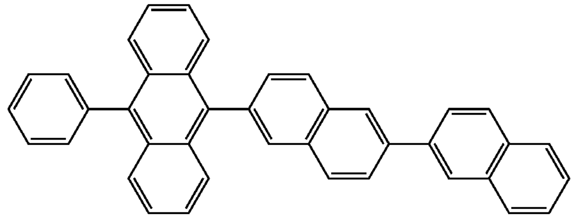

These anthracene derivatives can be manufactured using known raw materials and known synthesis methods.

<Benzofluorene Derivative>

The benzofluorene derivative is, for example, a compound represented by the following formula (ETM-6).

(ETM-6)

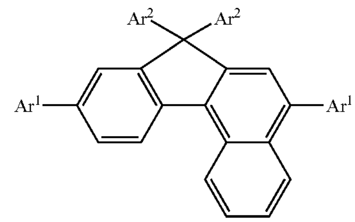

$Ar^1$'s each independently represent an aryl having 6 to 20 carbon atoms. The same description as the "aryl having 6 to 20 carbon atoms" in the above formula (ETM-5-1) can be cited. An aryl having 6 to 16 carbon atoms is preferable, an aryl having 6 to 12 carbon atoms is more preferable, and an aryl having 6 to 10 carbon atoms is particularly preferable. Specific examples thereof include phenyl, biphenylyl, naphthyl, terphenylyl, anthracenyl, acenaphthylenyl, fluorenyl, phenalenyl, phenanthryl, triphenylenyl, pyrenyl, tetracenyl, and perylenyl.

$Ar^2$'s each independently represent a hydrogen atom, an alkyl (preferably, an alkyl having 1 to 24 carbon atoms), a cycloalkyl (preferably, a cycloalkyl having 3 to 12 carbon atoms), or an aryl (preferably, an aryl having 6 to 30 carbon atoms), and two $Ar^2$'s may be bonded to each other to form a ring.

The "alkyl" in $Ar^2$ may be either linear or branched, and examples thereof include a linear alkyl having 1 to 24 carbon atoms and a branched alkyl having 3 to 24 carbon atoms. A preferable "alkyl" is an alkyl having 1 to 18 carbon atoms (branched alkyl having 3 to 18 carbon atoms). A more preferable "alkyl" is an alkyl having 1 to 12 carbons (branched alkyl having 3 to 12 carbons). A still more preferable "alkyl" is an alkyl having 1 to 6 carbon atoms (branched alkyl having 3 to 6 carbon atoms). A particularly preferable "alkyl" is an alkyl having 1 to 4 carbon atoms (branched alkyl having 3 to 4 carbon atoms). Specific examples of the "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, and 1-methylhexyl.

Examples of the "cycloalkyl" in $Ar^2$ include a cycloalkyl having 3 to 12 carbon atoms. A preferable "cycloalkyl" is a cycloalkyl having 3 to 10 carbons. A more preferable "cycloalkyl" is a cycloalkyl having 3 to 8 carbon atoms. A still more preferable "cycloalkyl" is a cycloalkyl having 3 to 6 carbon atoms. Specific examples of the "cycloalkyl" include cyclopropyl, cyclobutyl, cyclopentyl, cyclohexyl, methylcyclopentyl, cycloheptyl, methylcyclohexyl, cyclooctyl, and dimethylcyclohexyl.

As the "aryl" in $Ar^2$, a preferable aryl is an aryl having 6 to 30 carbon atoms, a more preferable aryl is an aryl having 6 to 18 carbon atoms, a still more preferable aryl is an aryl having 6 to 14 carbon atoms, and a particularly preferable aryl is an aryl having 6 to 12 carbon atoms.

Specific examples of the "aryl having 6 to 30 carbon atoms" include phenyl, naphthyl, acenaphthylenyl, fluorenyl, phenalenyl, phenanthryl, triphenylenyl, pyrenyl, naphthacenyl, perylenyl, and pentacenyl.

Two $Ar^2$'s may be bonded to each other to form a ring. As a result, cyclobutane, cyclopentane, cyclopentene, cyclopentadiene, cyclohexane, fluorene, indene, or the like may be spiro-bonded to a 5-membered ring of a fluorene skeleton.

Specific examples of this benzofluorene derivative include the following compounds.

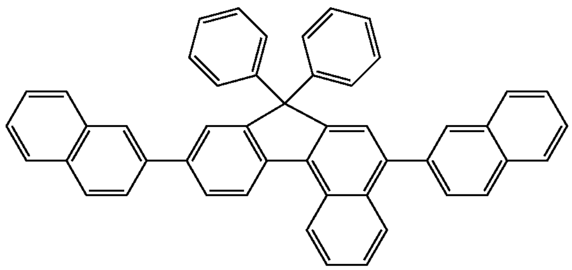

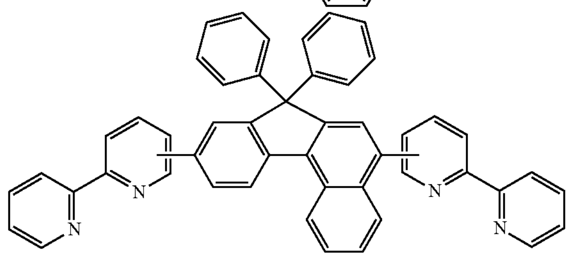

This benzofluorene derivative can be manufactured using known raw materials and known synthesis methods.

<Phosphine Oxide Derivative>

The phosphine oxide derivative is, for example, a compound represented by the following formula (ETM-7-1). Details are also described in WO 2013/079217 A.

(ETM-7-1)

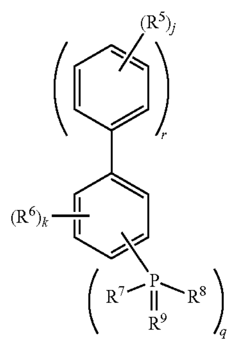

$R^5$ represents a substituted or unsubstituted alkyl having 1 to 20 carbon atoms, an aryl having 6 to 20 carbon atoms, or a heteroaryl having 5 to 20 carbon atoms, $R^6$ represents CN, a substituted or unsubstituted alkyl having 1 to 20 carbons, a heteroalkyl having 1 to 20 carbons, an aryl having 6 to 20 carbons, a heteroaryl having 5 to 20 carbons, an alkoxy having 1 to 20 carbons, or an aryloxy having 6 to 20 carbon atoms, $R^7$ and $R^8$ each independently represent a substituted or unsubstituted aryl having 6 to 20 carbon atoms or a heteroaryl having 5 to 20 carbon atoms, $R^9$ represents an oxygen atom or a sulfur atom, j represents 0 or 1, k represents 0 or 1, r represents an integer of 0 to 4, and q represents an integer of 1 to 3. Examples of the substituent when substituted include aryl, heteroaryl, and alkyl.

The phosphine oxide derivative may be, for example, a compound represented by the following formula (ETM-7-2).

(ETM-7-2)

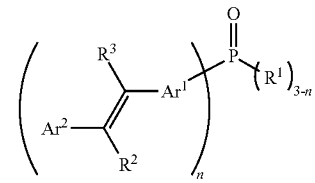

$R^1$ to $R^3$ may be the same as or different from each other and are selected from a hydrogen atom, an alkyl group, a cycloalkyl group, an aralkyl group, an alkenyl group, a cycloalkenyl group, an alkynyl group, an alkoxy group, an alkylthio group, an aryl ether group, an aryl thioether group, an aryl group, a heterocyclic group, a halogen atom, cyano group, an aldehyde group, a carbonyl group, a carboxyl group, an amino group, a nitro group, a silyl group, and a fused ring formed with an adjacent substituent.

$Ar^1$'s may be the same as or different from each other, and represents an arylene group or a heteroarylene group. $Ar^2$'s may be the same as or different from each other, and represents an aryl group or a heteroaryl group. However, at least one of $Ar^1$ and $Ar^2$ has a substituent or forms a fused ring with an adjacent substituent. n represents an integer of 0 to 3. When n is 0, no unsaturated structure portion is present. When n is 3, $R^1$ is not present.

Among these substituents, the alkyl group represents a saturated aliphatic hydrocarbon group such as a methyl group, an ethyl group, a propyl group, or a butyl group. This saturated aliphatic hydrocarbon group may be unsubstituted or substituted. The substituent in a case of being substituted is not particularly limited, and examples thereof include an alkyl group, an aryl group, and a heterocyclic group, and this point is also common to the following description. Furthermore, the number of carbon atoms in the alkyl group is not particularly limited, but is usually in a range of 1 to 20 from a viewpoint of availability and cost.

Furthermore, the cycloalkyl group represents a saturated alicyclic hydrocarbon group such as cyclopropyl, cyclohexyl, norbornyl, or adamantyl. This saturated alicyclic hydrocarbon group may be unsubstituted or substituted. The carbon number of the alkyl group moiety is not particularly limited, but is usually in a range of 3 to 20.

Furthermore, the aralkyl group represents an aromatic hydrocarbon group via an aliphatic hydrocarbon, such as a benzyl group or a phenylethyl group. Both the aliphatic hydrocarbon and the aromatic hydrocarbon may be unsubstituted or substituted. The carbon number of the aliphatic moiety is not particularly limited, but is usually in a range of 1 to 20.

Furthermore, the alkenyl group represents an unsaturated aliphatic hydrocarbon group containing a double bond, such as a vinyl group, an allyl group, or a butadienyl group. This unsaturated aliphatic hydrocarbon group may be unsubstituted or substituted. The carbon number of the alkenyl group is not particularly limited, but is usually in a range of 2 to 20.

Furthermore, the cycloalkenyl group represents an unsaturated alicyclic hydrocarbon group containing a double bond, such as a cyclopentenyl group, a cyclopentadienyl group, or a cyclohexene group. This unsaturated alicyclic hydrocarbon group may be unsubstituted or substituted.

Furthermore, the alkynyl group represents an unsaturated aliphatic hydrocarbon group containing a triple bond, such as an acetylenyl group. This unsaturated aliphatic hydrocarbon group may be unsubstituted or substituted. The carbon number of the alkynyl group is not particularly limited, but is usually in a range of 2 to 20.

Furthermore, the alkoxy group represents an aliphatic hydrocarbon group via an ether bond, such as a methoxy group. The aliphatic hydrocarbon group may be unsubstituted or substituted. The carbon number of the alkoxy group is not particularly limited, but is usually in a range of 1 to 20.

Furthermore, the alkylthio group is a group in which an oxygen atom of an ether bond of an alkoxy group is substituted by a sulfur atom.

Furthermore, the aryl ether group represents an aromatic hydrocarbon group via an ether bond, such as a phenoxy group. The aromatic hydrocarbon group may be unsubstituted or substituted. The carbon number of the aryl ether group is not particularly limited, but is usually in a range of 6 to 40.

Furthermore, the aryl thioether group is a group in which an oxygen atom of an ether bond of an aryl ether group is substituted by a sulfur atom.

Furthermore, the aryl group represents an aromatic hydrocarbon group such as a phenyl group, a naphthyl group, a biphenylyl group, a phenanthryl group, a terphenyl group, or a pyrenyl group. The aryl group may be unsubstituted or substituted. The carbon number of the aryl group is not particularly limited, but is usually in a range of 6 to 40.

Furthermore, the heterocyclic group represents a cyclic structural group having an atom other than a carbon atom, such as a furanyl group, a thiophenyl group, an oxazolyl group, a pyridyl group, a quinolinyl group, or a carbazolyl group. This cyclic structural group may be unsubstituted or substituted. The carbon number of the heterocyclic group is not particularly limited, but is usually in a range of 2 to 30.

Halogen refers to fluorine, chlorine, bromine, and iodine.

The aldehyde group, the carbonyl group, and the amino group can include a group substituted by an aliphatic hydrocarbon, an alicyclic hydrocarbon, an aromatic hydrocarbon, a heterocyclic ring, or the like.

Furthermore, the aliphatic hydrocarbon, the alicyclic hydrocarbon, the aromatic hydrocarbon, and the heterocyclic ring may be unsubstituted or substituted.

The silyl group represents, for example, a silicon compound group such as a trimethylsilyl group. This silicon compound group may be unsubstituted or substituted. The number of carbon atoms of the silyl group is not particularly limited, but is usually in a range of 3 to 20. Furthermore, the number of silicon atoms is usually 1 to 6.

The fused ring formed with an adjacent substituent is, for example, a conjugated or unconjugated fused ring formed between $Ar^1$ and $R^2$, $Ar^1$ and $R^3$, $Ar^2$ and $R^2$, $Ar^2$ and $R^3$, $R^2$ and $R^3$, or $Ar^1$ and $Ar^2$. Here, when n is 1, two $R^1$'s may form a conjugated or unconjugated fused ring. These fused rings may contain a nitrogen atom, an oxygen atom, or a sulfur atom in the ring structure, or may be fused with another ring.

Specific examples of this phosphine oxide derivative include the following compounds.

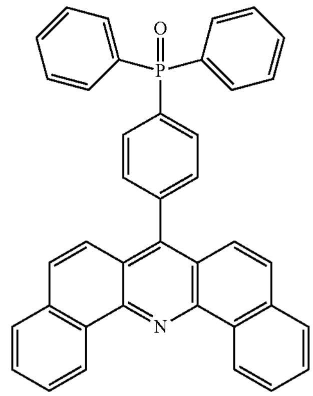

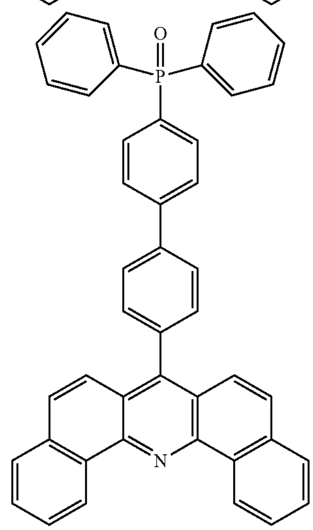

This phosphine oxide derivative can be manufactured using known raw materials and known synthesis methods.

<Pyrimidine Derivative>

The pyrimidine derivative is, for example, a compound represented by the following formula (ETM-8), and preferably a compound represented by the following formula (ETM-8-1). Details are also described in WO 2011/021689 A.

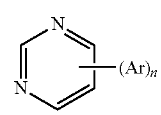

(ETM-8)

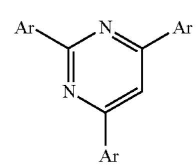

(ETM-8-1)

Ar's each independently represent an optionally substituted aryl or an optionally substituted heteroaryl. n represents an integer of 1 to 4, preferably an integer of 1 to 3, and more preferably 2 or 3.

Examples of the "aryl" as the "optionally substituted aryl" include an aryl having 6 to 30 carbon atoms. An aryl having 6 to 24 carbon atoms is preferable, an aryl having 6 to 20 carbon atoms is more preferable, and an aryl having 6 to 12 carbon atoms is still more preferable.

Specific examples of the "aryl" include phenyl which is a monocyclic aryl; (2-, 3-, 4-)biphenylyl which is a bicyclic aryl; (1-, 2-)naphthyl which is a fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) which is a tricyclic aryl; acenaphthylene-(1-, 3-, 4-, 5-)yl, fluorene-(1-, 2-, 3-, 4-, 9-)yl, phenalene-(1-, 2-)yl, and (1-, 2-, 3-, 4-, 9-)phenanthryl which are fused tricyclic aryls; quaterphenylyl-(5'-phenyl-m-terphenyl-2-yl, 5'-phenyl-m-terphenyl-3-yl, 5'-phenyl-m-terphenyl-4-yl, m-quaterphenylyl) which is a tetracyclic aryl; triphenylene-(1-, 2-)yl, pyrene-(1-, 2-, 4-)yl, and naphthacene-(1-, 2-, 5-)yl which are fused tetracyclic aryls; and perylene-(1-, 2-, 3-)yl and pentacene-(1-, 2-, 5-, 6-)yl which are fused pentacyclic aryls.

Examples of the "heteroaryl" as the "optionally substituted heteroaryl" include a heteroaryl having 2 to 30 carbon atoms. A heteroaryl having 2 to 25 carbon atoms is preferable, a heteroaryl having 2 to 20 carbon atoms is more preferable, a heteroaryl having 2 to 15 carbon atoms is still more preferable, and a heteroaryl having 2 to 10 carbon atoms is particularly preferable. Furthermore, examples of the "heteroaryl" include a heterocyclic ring containing 1 to 5 heteroatoms selected from an oxygen atom, a sulfur atom, and a nitrogen atom in addition to a carbon atom as a ring-constituting atom.

Specific examples of the "heteroaryl" include furyl, thienyl, pyrrolyl, oxazolyl, isoxazolyl, thiazolyl, isothiazolyl, imidazolyl, pyrazolyl, oxadiazolyl, furazanyl, thiadiazolyl, triazolyl, tetrazolyl, pyridyl, pyrimidinyl, pyridazinyl, pyrazinyl, triazinyl, benzofuranyl, isobenzofuranyl, benzo[b]thienyl, indolyl, isoindolyl, 1H-indazolyl, benzoimidazolyl, benzoxazolyl, benzothiazolyl, 1H-benzotriazolyl, quinolyl, isoquinolyl, cinnolyl, quinazolyl, quinoxalinyl, phthalazinyl, naphthyridinyl, purinyl, pteridinyl, carbazolyl, acridinyl, phenoxazinyl, phenothiazinyl, phenazinyl, phenoxathiinyl, thianthrenyl, and indolizinyl.

Furthermore, the above aryl and heteroaryl may be substituted, and may be each substituted by, for example, the above aryl or heteroaryl.

Specific examples of this pyrimidine derivative include the following compounds.

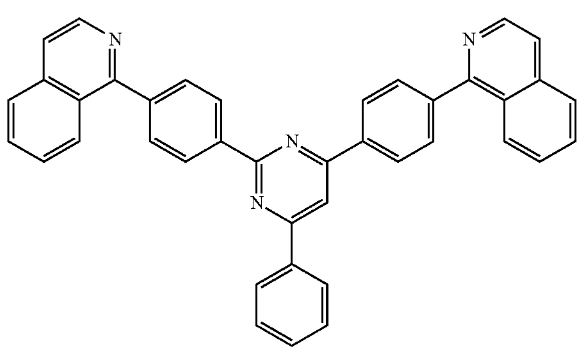 [SMILES: c1ccc(-c2cc(-c3ccc(-c4nccc5ccccc45)cc3)nc(-c3ccc(-c4nccc5ccccc45)cc3)n2)cc1]

This pyrimidine derivative can be manufactured using known raw materials and known synthesis methods.

<Carbazole Derivative>

The carbazole derivative is, for example, a compound represented by the following formula (ETM-9), or a multimer obtained by bonding a plurality of the compounds with a single bond or the like. Details are described in US 2014/0197386 A.

(ETM-9)

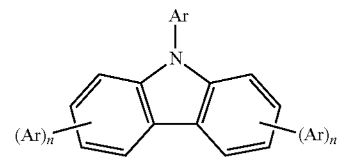

Ar's each independently represent an optionally substituted aryl or an optionally substituted heteroaryl. n represents an integer of 0 to 4, preferably an integer of 0 to 3, and more preferably 0 or 1.

Examples of the "aryl" as the "optionally substituted aryl" include an aryl having 6 to 30 carbon atoms. An aryl having 6 to 24 carbon atoms is preferable, an aryl having 6 to 20 carbon atoms is more preferable, and an aryl having 6 to 12 carbon atoms is still more preferable.

Specific examples of the "aryl" include phenyl which is a monocyclic aryl; (2-, 3-, 4-)biphenylyl which is a bicyclic aryl; (1-, 2-)naphthyl which is a fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) which is a tricyclic aryl; acenaphthylene-(1-, 3-, 4-, 5-)yl, fluorene-(1-, 2-, 3-, 4-, 9-)yl, phenalene-(1-, 2-)yl, and (1-, 2-, 3-, 4-, 9-)phenanthryl which are fused tricyclic aryls; quaterphenylyl-(5'-phenyl-m-terphenyl-2-yl, 5'-phenyl-m-terphenyl-3-yl, 5'-phenyl-m-terphenyl-4-yl, m-quaterphenylyl) which is a tetracyclic aryl; triphenylene-(1-, 2-)yl, pyrene-(1-, 2-, 4-)yl, and naphthacene-(1-, 2-, 5-)yl which are fused tetracyclic aryls; and perylene-(1-, 2-, 3-)yl and pentacene-(1-, 2-, 5-, 6-)yl which are fused pentacyclic aryls.

Examples of the "heteroaryl" as the "optionally substituted heteroaryl" include a heteroaryl having 2 to 30 carbon atoms. A heteroaryl having 2 to 25 carbon atoms is preferable, a heteroaryl having 2 to 20 carbon atoms is more preferable, a heteroaryl having 2 to 15 carbon atoms is still more preferable, and a heteroaryl having 2 to 10 carbon atoms is particularly preferable. Furthermore, examples of the "heteroaryl" include a heterocyclic ring containing 1 to 5 heteroatoms selected from an oxygen atom, a sulfur atom, and a nitrogen atom in addition to a carbon atom as a ring-constituting atom.

Specific examples of the "heteroaryl" include furyl, thienyl, pyrrolyl, oxazolyl, isoxazolyl, thiazolyl, isothiazolyl, imidazolyl, pyrazolyl, oxadiazolyl, furazanyl, thiadiazolyl, triazolyl, tetrazolyl, pyridyl, pyrimidinyl, pyridazinyl, pyrazinyl, triazinyl, benzofuranyl, isobenzofuranyl, benzo[b]thienyl, indolyl, isoindolyl, 1H-indazolyl, benzoimidazolyl, benzoxazolyl, benzothiazolyl, 1H-benzotriazolyl, quinolyl, isoquinolyl, cinnolyl, quinazolyl, quinoxalinyl, phthalazinyl, naphthyridinyl, purinyl, pteridinyl, carbazolyl, acridinyl, phenoxazinyl, phenothiazinyl, phenazinyl, phenoxathiinyl, thianthrenyl, and indolizinyl.

Furthermore, the above aryl and heteroaryl may be substituted, and may be each substituted by, for example, the above aryl or heteroaryl.

The carbazole derivative may be a multimer obtained by bonding a plurality of compounds represented by the above formula (ETM-9) with a single bond or the like. In this case, the compounds may be bonded with an aryl ring (preferably, a polyvalent benzene ring, naphthalene ring, anthracene ring, fluorene ring, benzofluorene ring, phenalene ring, phenanthrene ring or triphenylene ring) in addition to a single bond.

Specific examples of this carbazole derivative include the following compounds.

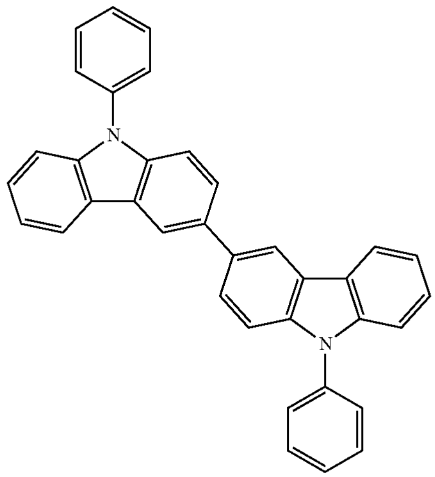

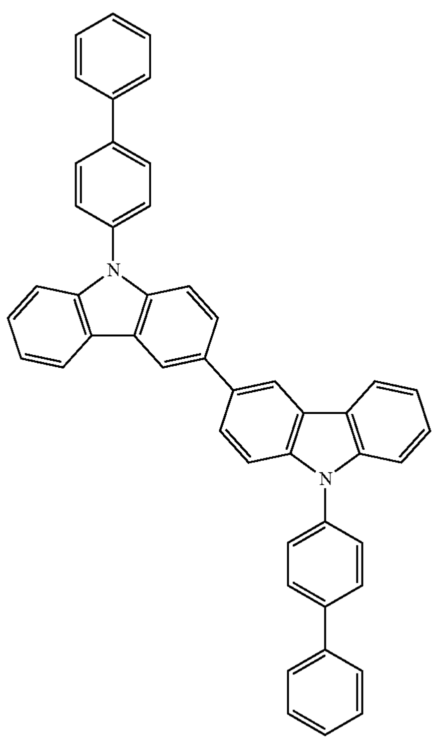

-continued

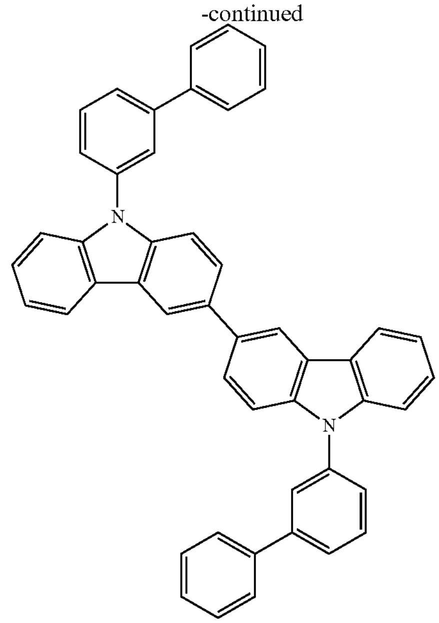

This carbazole derivative can be manufactured using known raw materials and known synthesis methods.

<Triazine Derivative>

The triazine derivative is, for example, a compound represented by the following formula (ETM-10), and preferably a compound represented by the following formula (ETM-10-1). Details are described in US 2011/0156013 A.

(ETM-10)

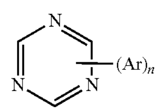

(ETM-10-1)

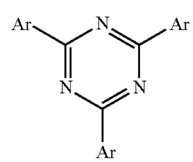

Ar's each independently represent an optionally substituted aryl or an optionally substituted heteroaryl. n represents an integer of 1 to 3, preferably 2 or 3.

Examples of the "aryl" as the "optionally substituted aryl" include an aryl having 6 to 30 carbon atoms. An aryl having 6 to 24 carbon atoms is preferable, an aryl having 6 to 20 carbon atoms is more preferable, and an aryl having 6 to 12 carbon atoms is still more preferable.

Specific examples of the "aryl" include phenyl which is a monocyclic aryl; (2-, 3-, 4-)biphenylyl which is a bicyclic aryl; (1-, 2-)naphthyl which is a fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) which is a tricyclic aryl; acenaphthylene-(1-, 3-, 4-, 5-)yl, fluorene-(1-, 2-, 3-, 4-, 9-)yl, phenalene-(1-, 2-)yl, and (1-, 2-, 3-, 4-, 9-)phenanthryl which are fused tricyclic aryls; quaterphenylyl-(5'-phenyl-m-terphenyl-2-yl, 5'-phenyl-m-terphenyl-3-yl, 5'-phenyl-m-terphenyl-4-yl, m-quaterphenylyl) which is a tetracyclic aryl; triphenylene-(1-, 2-)yl, pyrene-(1-, 2-, 4-)yl, and naphthacene-(1-, 2-, 5-)yl which are fused tetracyclic aryls; and perylene-(1-, 2-, 3-)yl and pentacene-(1-, 2-, 5-, 6-)yl which are fused pentacyclic aryls.

Examples of the "heteroaryl" as the "optionally substituted heteroaryl" include a heteroaryl having 2 to 30 carbon atoms. A heteroaryl having 2 to 25 carbon atoms is preferable, a heteroaryl having 2 to 20 carbon atoms is more preferable, a heteroaryl having 2 to 15 carbon atoms is still more preferable, and a heteroaryl having 2 to 10 carbon atoms is particularly preferable. Furthermore, examples of the "heteroaryl" include a heterocyclic ring containing 1 to 5 heteroatoms selected from an oxygen atom, a sulfur atom, and a nitrogen atom in addition to a carbon atom as a ring-constituting atom.

Specific examples of the "heteroaryl" include furyl, thienyl, pyrrolyl, oxazolyl, isoxazolyl, thiazolyl, isothiazolyl, imidazolyl, pyrazolyl, oxadiazolyl, furazanyl, thiadiazolyl, triazolyl, tetrazolyl, pyridyl, pyrimidinyl, pyridazinyl, pyrazinyl, triazinyl, benzofuranyl, isobenzofuranyl, benzo[b]thienyl, indolyl, isoindolyl, 1H-indazolyl, benzoimidazolyl, benzoxazolyl, benzothiazolyl, 1H-benzotriazolyl, quinolyl, isoquinolyl, cinnolyl, quinazolyl, quinoxalinyl, phthalazinyl, naphthyridinyl, purinyl, pteridinyl, carbazolyl, acridinyl, phenoxazinyl, phenothiazinyl, phenazinyl, phenoxathiinyl, thianthrenyl, and indolizinyl.

Furthermore, the above aryl and heteroaryl may be substituted, and may be each substituted by, for example, the above aryl or heteroaryl.

Specific examples of this triazine derivative include the following compounds.

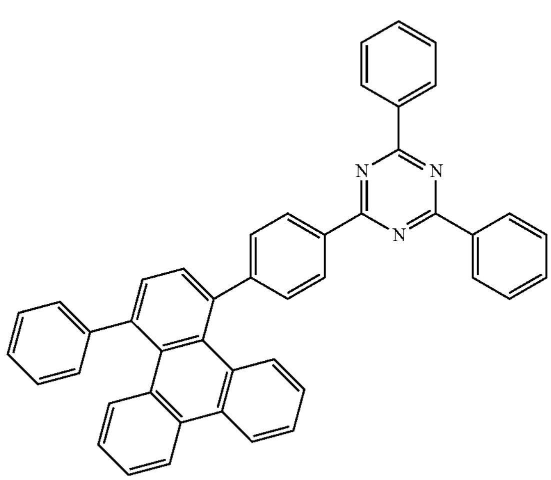

-continued

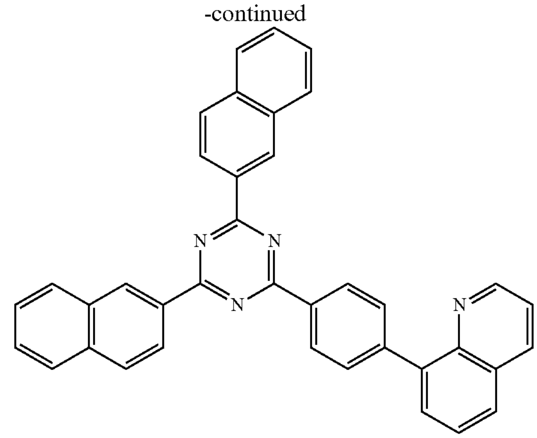

This triazine derivative can be manufactured using known raw materials and known synthesis methods.

<Benzimidazole Derivative>

The benzimidazole derivative is, for example, a compound represented by the following formula (ETM-11).

φ-(Benzimidazole-based substituent)$_n$ (ETM-11)

φ represents an n-valent aryl ring (preferably, an n-valent benzene ring, naphthalene ring, anthracene ring, fluorene ring, benzofluorene ring, phenalene ring, phenanthrene ring, or triphenylene ring), and n represents an integer of 1 to 4. A "benzimidazole-based substituent" is a substituent in which the pyridyl group in the "pyridine-based substituent" in the formulas (ETM-2), (ETM-2-1), and (ETM-2-2) is substituted by a benzimidazole group, and at least one hydrogen atom in the benzimidazole derivative may be substituted by a deuterium atom.

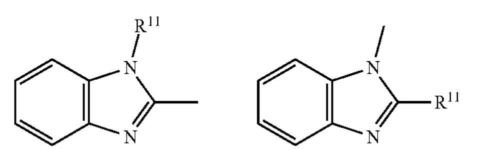

Benzimidazole group $R^{11}$ in the above benzimidazole represents a hydrogen atom, an alkyl having 1 to 24 carbon atoms, a cycloalkyl having 3 to 12 carbon atoms, or an aryl having 6 to 30 carbon atoms. The description of $R^{11}$ in the above formulas (ETM-2-1), and (ETM-2-2) can be cited.

Moreover, φ is preferably an anthracene ring or a fluorene ring. For the structure in this case, the description for the above formula (ETM-2-1) or (ETM-2-2) can be cited. For $R^{11}$ to $R^{18}$ in each formula, the description for the above formula (ETM-2-1) or (ETM-2-2) can be cited. Furthermore, in the above formula (ETM-2-1) or (ETM-2-2), a form in which two pyridine-based substituents are bonded has been described. However, when these substituents are substituted by benzimidazole-based substituents, both the pyridine-based substituents may be substituted by benzimidazole-based substituents (that is, n=2), or one of the pyridine-based substituents may be substituted by a benzimidazole-based substituent and the other pyridine-based substituent may be substituted by any one of $R^{11}$ to $R^{18}$ (that is, n=1). Moreover, for example, at least one of $R^{11}$ to $R^{18}$ in the above formula (ETM-2-1) may be substituted by a benzimidazole-based substituent and the "pyridine-based substituent" may be substituted by any one of $R^{11}$ to $R^{18}$.

Specific examples of this benzimidazole derivative include 1-phenyl-2-(4-(10-phenylanthracen-9-yl)phenyl)-1H-benzo[d]imidazole, 2-(4-(10-(naphthalen-2-yl)anthracen-9-yl)phenyl)-1-phenyl-1H-benzo[d]imidazole, 2-(3-(10-(naphthalen-2-yl)anthracen-9-yl)phenyl)-1-phenyl-1H-benzo[d]imidazole, 5-(10-(naphthlen-2-yl)anthracen-9-yl)-1,2-diphenyl-1H-benzo[d]imidazole, 1-(4-(10-(naphthalen-2-yl)anthracen-9-yl)phenyl)-2-phenyl-1H-benzo[d]imidazole, 2-(4-(9,10-di(naphthalen-2-yl)anthracen-2-yl)phenyl)-1-phenyl-1H-benzo[d]imidazole, 1-(4-(9,10-di(naphthalen-2-yl)anthracen-2-yl)phenyl)-2-phenyl-1H-benzo[d]imidazole, and 5-(9,10-di(naphthalen-2-yl)anthracen-2-yl)-1,2-diphenyl-1H-benzo[d]imidazole.

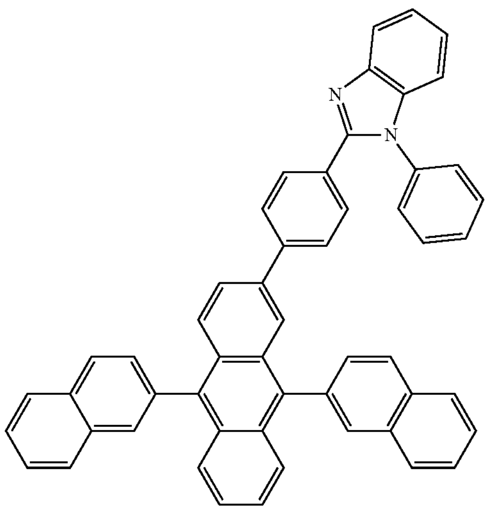

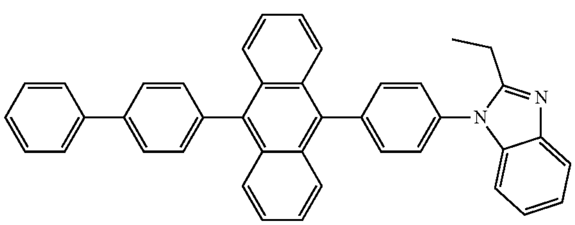

This benzimidazole derivative can be manufactured using known raw materials and known synthesis methods.

<Phenanthroline Derivative>

The phenanthroline derivative is, for example, a compound represented by the following formula (ETM-12) or (ETM-12-1). Details are described in WO 2006/021982 A.

(ETM-12)

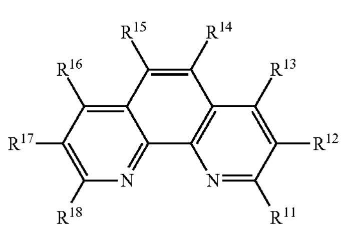

-continued (ETM-12-1)

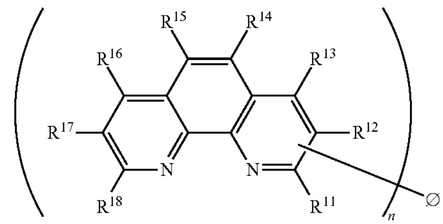

φ represents an n-valent aryl ring (preferably, an n-valent benzene ring, naphthalene ring, anthracene ring, fluorene ring, benzofluorene ring, phenalene ring, phenanthrene ring, or triphenylene ring), and n represents an integer of 1 to 4.

In each formula, $R^{11}$ to $R^{18}$ each independently represent a hydrogen atom, an alkyl (preferably, an alkyl having 1 to 24 carbon atoms), a cycloalkyl (preferably, a cycloalkyl having 3 to 12 carbon atoms), or an aryl (preferably, an aryl having 6 to 30 carbon atoms). Furthermore, in the above formula (ETM-12-1), any one of $R^{11}$ to $R^{18}$ is bonded to φ which is an aryl ring.

At least one hydrogen atom in each phenanthroline derivative may be substituted by a deuterium atom.

For the alkyl, cycloalkyl, and aryl in $R^{11}$ to $R^{18}$, the description of $R^{11}$ to $R^{18}$ in the above formula (ETM-2) can be cited. Furthermore, in addition to the above examples, examples of the c include those having the following structural formulas. Note that R's in the following structural formulas each independently represent a hydrogen atom, methyl, ethyl, isopropyl, cyclohexyl, phenyl, 1-naphthyl, 2-naphthyl, biphenylyl, or terphenylyl.

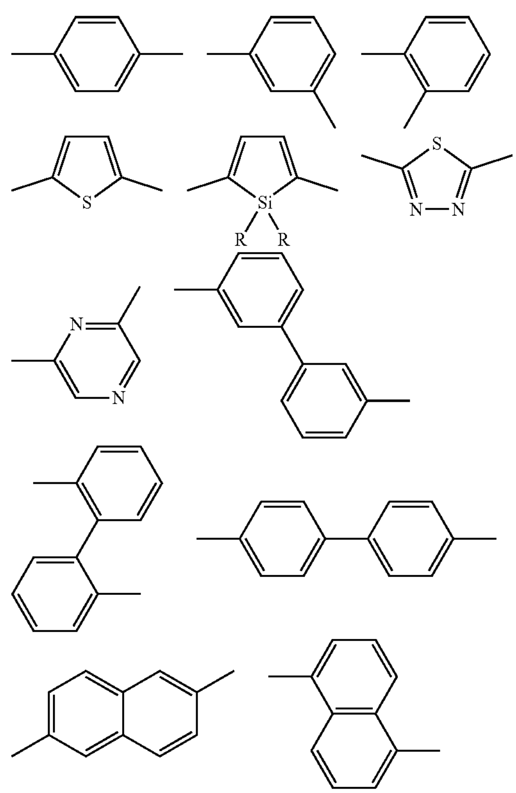

-continued

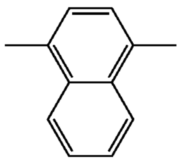
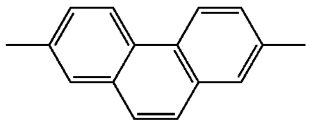
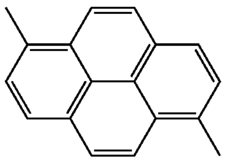
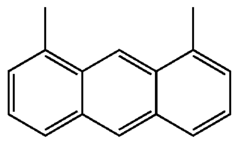
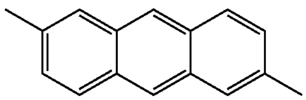
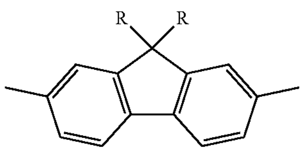
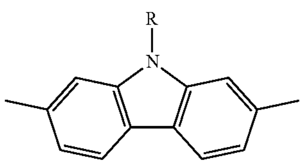
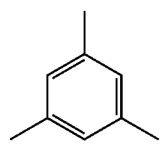
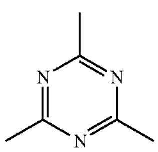
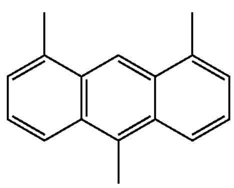
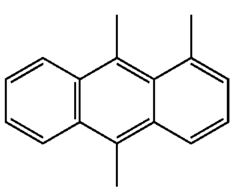
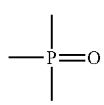
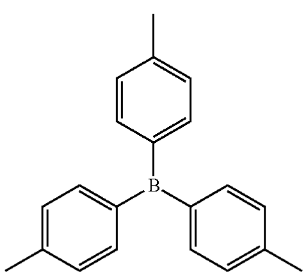
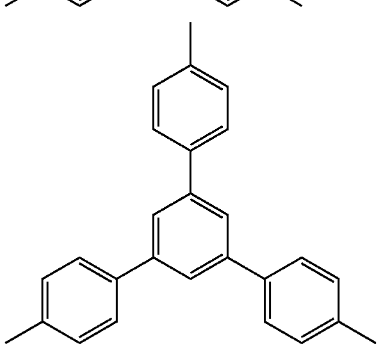

-continued

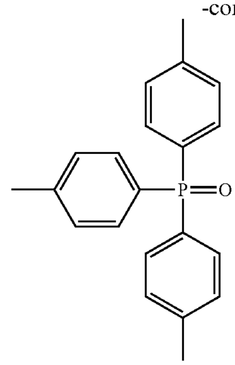
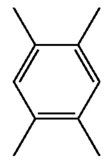
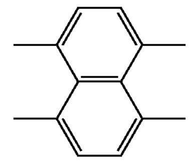
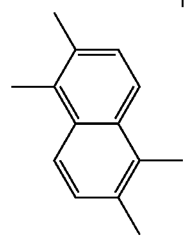
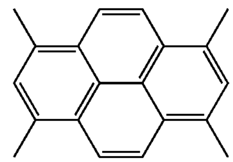

Specific examples of this phenanthroline derivative include 4,7-diphenyl-1,10-phenanthroline, 2,9-dimethyl-4,7-diphenyl-1,10-phenanthroline, 9,10-di(1,10-phenanthrolin-2-yl)anthracene, 2,6-di(1,10-phenanthrolin-5-yl)pyridine, 1,3,5-tri(1,10-phenanthrolin-5-yl)benzene, 9,9'-difluoro-bis(1,10-phenanthrolin-5-yl), bathocuproine, 1,3-bis(2-phenyl-1,10-phenanthrolin-9-yl) benzene, and the like.

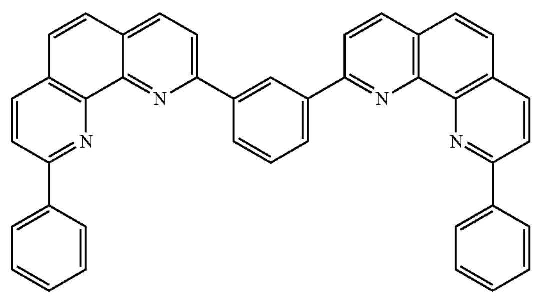 [SMILES: c1ccc(-c2ccc3ccc4ccc(-c5cccc(-c6ccc7ccc8ccc(-c9ccccc9)nc8c7n6)c5)nc4c3n2)cc1]

This phenanthroline derivative can be manufactured using known raw materials and known synthesis methods.

<Quinolinol-Based Metal Complex>

The quinolinol-based metal complex is, for example, a compound represented by the following general formula (ETM-13).

(ETM-13)

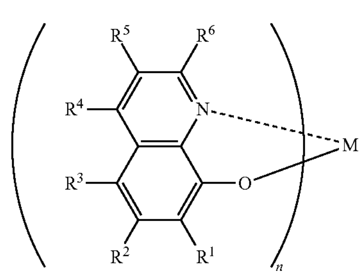

In the formula, $R^1$ to $R^6$ each independently represent a hydrogen atom, fluorine, alkyl, aralkyl, alkenyl, cyano, alkoxy or aryl, M represents Li, Al, Ga, Be, or Zn, and n represents an integer of 1 to 3.

Specific examples of the quinolinol-based metal complex include 8-quinolinol lithium, tris(8-quinolinolato) aluminum, tris(4-methyl-8-quinolinolato) aluminum, tris(5-methyl-8-quinolinolato) aluminum, tris(3,4-dimethyl-8-quinolinolato) aluminum, tris(4,5-dimethyl-8-quinolinolato) aluminum, tris(4,6-dimethyl-8-quinolinolato) aluminum, bis (2-methyl-8-quinolinolato) (phenolato) aluminum, bis(2-methyl-8-quinolinolato) (2-methylphenolato) aluminum, bis (2-methyl-8-quinolinolato) (3-methylphenolato) aluminum, bis(2-methyl-8-quinolinolato) (4-methylphenolato) aluminum, bis(2-methyl-8-quinolinolato) (2-phenylphenolato) aluminum, bis(2-methyl-8-quinolinolato) (3-phenylphenolato) aluminum, bis(2-methyl-8-quinolinolato) (4-phenylphenolato) aluminum, bis(2-methyl-8-quinolinolato) (2,3-dimethylphenolato) aluminum, bis(2-methyl-8-quinolinolato) (2,6-dimethylphenolato) aluminum, bis(2-methyl-8-quinolinolato) (3,4-dimethylphenolato) aluminum, bis(2-methyl-8-quinolinolato) (3,5-dimethylphenolato) aluminum, bis(2-methyl-8-quinolinolato) (3,5-di-t-butylphenolato) aluminum, bis(2-methyl-8-quinolinolato) (2,6-diphenylphenolato) aluminum, bis(2-methyl-8-quinolinolato) (2,4,6-triphenylphenolato) aluminum, bis(2-methyl-8-quinolinolato) (2,4,6-trimethylphenolato) aluminum, bis(2-methyl-8-quinolinolato) (2,4,5,6-tetramethylphenolato) aluminum, bis(2-methyl-8-quinolinolato) (1-naphtholato) aluminum, bis(2-methyl-8-quinolinolato) (2-naphtholato) aluminum, bis(2,4-dimethyl-8-quinolinolato) (2-phenylphenolato) aluminum, bis(2,4-dimethyl-8-quinolinolato) (3-phenylphenolato) aluminum, bis(2,4-dimethyl-8-quinolinolato) (4-phenylphenolato) aluminum, bis(2,4-dimethyl-8-quinolinolato) (3,5-dimethylphenolato) aluminum, bis(2,4-dimethyl-8-quinolinolato) (3,5-di-t-butylphenolato) aluminum, bis(2-methyl-8-quinolinolato) aluminum-p-oxo-bis(2-methyl-8-quinolinolato) aluminum, bis(2,4-dimethyl-8-quinolinolato) aluminum-μ-oxo-bis(2,4-dimethyl-8-quinolinolato) aluminum, bis(2-methyl-4-ethyl-8-quinolinolato) aluminum-μ-oxo-bis(2-methyl-4-ethyl-8-quinolinolato) aluminum, bis(2-methyl-4-methoxy-8-quinolinolato) aluminum-μ-oxo-bis(2-methyl-4-methoxy-8-quinolinolato) aluminum, bis(2-methyl-5-cyano-8-quinolinolato) aluminum-μ-oxo-bis(2-methyl-5-cyano-8-quinolinolato) aluminum, bis(2-methyl-5-trifluoromethyl-8-quinolinolato) aluminum-μ-oxo-bis(2-methyl-5-trifluoromethyl-8-quinolinolato) aluminum, and bis(10-hydroxybenzo[h]quinoline) beryllium.

This quinolinol-based metal complex can be manufactured using known raw materials and known synthesis methods.

<Thiazole Derivative and Benzothiazole Derivative>

The thiazole derivative is, for example, a compound represented by the following formula (ETM-14-1).

φ-(Thiazole-based substituent)$_n$ (ETM-14-1)

The benzothiazole derivative is, for example, a compound represented by the following formula (ETM-14-2).

φ-(Benzothiazole-based substituent)$_n$ (ETM-14-2)

φ in each formula represents an n-valent aryl ring (preferably, an n-valent benzene ring, naphthalene ring, anthracene ring, fluorene ring, benzofluorene ring, phenalene ring, phenanthrene ring, or triphenylene ring), and n represents an integer of 1 to 4. A "thiazole-based substituent" or a "benzothiazole-based substituent" is a substituent in which the pyridyl group in the "pyridine-based substituent" in the formulas (ETM-2), (ETM-2-1), and (ETM-2-2) is substituted by the following thiazole group or benzothiazole group, and at least one hydrogen atom in the thiazole derivative and the benzothiazole derivative may be substituted by a deuterium atom.

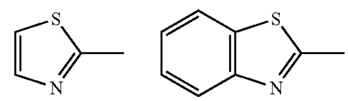

Thiazole group Benzothiazole group

Moreover, φ is preferably an anthracene ring or a fluorene ring. For the structure in this case, the description for the above formula (ETM-2-1) or (ETM-2-2) can be cited. For $R^{11}$ to $R^{18}$ in each formula, the description for the above formula (ETM-2-1) or (ETM-2-2) can be cited. Furthermore, in the above formula (ETM-2-1) or (ETM-2-2), a form in which two pyridine-based substituents are bonded has been described. However, when these substituents are substituted by thiazole-based substituents (or benzothiazole-based substituents), both the pyridine-based substituents may be substituted by thiazole-based substituents (or benzothiazole-based substituents) (that is, n=2), or one of the pyridine-based substituents may be substituted by a thiazole-based substituent (or benzothiazole-based substituent) and the other pyridine-based substituent may be substituted by any one of $R^{11}$ to $R^{18}$ (that is, n=1). Moreover, for example, at least one of $R^{11}$ to $R^{18}$ in the above formula (ETM-2-1) may be substituted by a thiazole-based substituent (or benzothiazole-based substituent) and the "pyridine-based substituent" may be substituted by any one of $R^{11}$ to $R^{18}$.

These thiazole derivatives or benzothiazole derivatives can be manufactured using known raw materials and known synthesis methods.

An electron transport layer or an electron injection layer may further contain a substance that can reduce a material to form an electron transport layer or an electron injection layer. As this reducing substance, various substances are used as long as having reducibility to a certain extent. For example, at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal, can be suitably used.

Preferable examples of the reducing substance include an alkali metal such as Na (work function 2.36 eV), K (work function 2.28 eV), Rb (work function 2.16 eV), or Cs (work function 1.95 eV); and an alkaline earth metal such as Ca (work function 2.9 eV), Sr (work function 2.0 to 2.5 eV), or Ba (work function 2.52 eV). A substance having a work function of 2.9 eV or less is particularly preferable. Among these substances, an alkali metal such as K, Rb, or Cs is a more preferable reducing substance, Rb or Cs is a still more preferable reducing substance, and Cs is the most preferable reducing substance. These alkali metals have particularly high reducing ability, and can enhance emission luminance of an organic EL element or can lengthen a lifetime thereof by adding the alkali metals in a relatively small amount to a material to form an electron transport layer or an electron injection layer. Furthermore, as the reducing substance having a work function of 2.9 eV or less, a combination of two or more kinds of these alkali metals is also preferable, and particularly, a combination including Cs, for example, a combination of Cs with Na, a combination of Cs with K, a combination of Cs with Rb, or a combination of Cs with Na and K, is preferable. By inclusion of Cs, reducing ability can be efficiently exhibited, and emission luminance of an organic EL element is enhanced, or a lifetime thereof is lengthened by adding Cs to a material to form an electron transport layer or an electron injection layer.

<Negative Electrode in Organic Electroluminescent Element>

The negative electrode 108 plays a role of injecting an electron to the light emitting layer 105 through the electron injection layer 107 and the electron transport layer 106.

A material to form the negative electrode 108 is not particularly limited as long as being a substance capable of efficiently injecting an electron to an organic layer. However, a material similar to a material to form the positive electrode 102 can be used. Among these materials, a metal such as tin, indium, calcium, aluminum, silver, copper, nickel, chromium, gold, platinum, iron, zinc, lithium, sodium, potassium, cesium, or magnesium, and an alloy thereof (a magnesium-silver alloy, a magnesium-indium alloy, an aluminum-lithium alloy such as lithium fluoride/aluminum, or the like) are preferable. In order to enhance element characteristics by increasing electron injection efficiency, lithium, sodium, potassium, cesium, calcium, magnesium, or an alloy containing these low work function-metals is effective. However, many of these low work function-metals are generally unstable in air. In order to ameliorate this problem, for example, a method for using an electrode having high stability obtained by doping an organic layer with a trace amount of lithium, cesium, or magnesium is known. Other examples of a dopant that can be used include an inorganic salt such as lithium fluoride, cesium fluoride, lithium oxide, or cesium oxide. However, the dopant is not limited thereto.

Furthermore, in order to protect an electrode, a metal such as platinum, gold, silver, copper, iron, tin, aluminum, or indium, an alloy using these metals, an inorganic substance such as silica, titania, or silicon nitride, polyvinyl alcohol, vinyl chloride, a hydrocarbon-based polymer compound, or the like may be laminated as a preferable example. These method for manufacturing an electrode are not particularly limited as long as being capable of conduction, such as resistance heating, electron beam deposition, sputtering, ion plating, or coating.

<Binder that May be Used in Each Layer>

The materials used in the above-described hole injection layer, hole transport layer, light emitting layer, electron transport layer, and electron injection layer can form each layer by being used singly. However, it is also possible to use the materials by dispersing the materials in a solvent-soluble resin such as polyvinyl chloride, polycarbonate, polystyrene, poly(N-vinylcarbazole), polymethyl methacrylate, polybutyl methacrylate, polyester, polysulfone, polyphenylene oxide, polybutadiene, a hydrocarbon resin, a ketone resin, a phenoxy resin, polyamide, ethyl cellulose, a vinyl acetate resin, an ABS resin, or a polyurethane resin; or a curable resin such as a phenolic resin, a xylene resin, a petroleum resin, a urea resin, a melamine resin, an unsaturated polyester resin, an alkyd resin, an epoxy resin, or a silicone resin.

<Method for Manufacturing Organic Electroluminescent Element>

Each layer constituting an organic EL element can be formed by forming thin films of the materials to constitute each layer by methods such as a vapor deposition method, resistance heating deposition, electron beam deposition, sputtering, a molecular lamination method, a printing method, a spin coating method, a casting method, and a coating method. The film thickness of each layer thus formed is not particularly limited, and can be appropriately set according to a property of a material, but is usually within a range of 2 nm to 5000 nm. The film thickness can be usually measured using a crystal oscillation type film thickness analyzer or the like. In a case of forming a thin film using a vapor deposition method, deposition conditions depend on the kind of a material, an intended crystal structure and association structure of the film, and the like. It is preferable to appropriately set the vapor deposition conditions generally in ranges of a boat heating temperature of +50 to +400° C., a degree of vacuum of $10^{-6}$ to $10^{-3}$ Pa, a vapor deposition rate of 0.01 to 50 nm/sec, a substrate temperature of −150 to +300° C., and a film thickness of 2 nm to 5 μm.

As an example of a method for manufacturing an organic EL element, a method for manufacturing an organic EL element formed of positive electrode/hole injection layer/hole transport layer/light emitting layer including a host material and a dopant material/electron transport layer/electron injection layer/negative electrode will be described. A thin film of a positive electrode material is formed on an appropriate substrate to manufacture a positive electrode by a vapor deposition method or the like, and then thin films of a hole injection layer and a hole transport layer are formed on this positive electrode. A thin film is formed thereon by co-depositing a host material and a dopant material to obtain a light emitting layer. An electron transport layer and an electron injection layer are formed on this light emitting layer, and a thin film formed of a substance for a negative electrode is formed by a vapor deposition method or the like to obtain a negative electrode. An intended organic EL element is thereby obtained. Incidentally, in manufacturing the above organic EL element, it is also possible to manufacture the element by reversing the manufacturing order, that is, in order of a negative electrode, an electron injection layer, an electron transport layer, a light emitting layer, a hole transport layer, a hole injection layer, and a positive electrode.

In a case where a direct current voltage is applied to the organic EL element thus obtained, it is only required to apply the voltage by assuming a positive electrode as a positive polarity and assuming a negative electrode as a negative polarity. By applying a voltage of about 2 to 40 V, light emission can be observed from a transparent or semi-transparent electrode side (the positive electrode or the negative electrode, or both the electrodes). Furthermore, this organic EL element also emits light even in a case where a pulse current or an alternating current is applied. Note that a waveform of an alternating current applied may be any waveform.

<Application Examples of Organic Electroluminescent Element>

Furthermore, the present invention can also be applied to a display apparatus including an organic EL element, a lighting apparatus including an organic EL element, or the like.

The display apparatus or lighting apparatus including an organic EL element can be manufactured by a known method such as connecting the organic EL element according to the present embodiment to a known driving apparatus, and can be driven by appropriately using a known driving method such as direct driving, pulse driving, or alternating driving.

Examples of the display apparatus include panel displays such as color flat panel displays; and flexible displays such as flexible organic electroluminescent (EL) displays (see, for example, JP 10-335066 A, JP 2003-321546 A, JP 2004-281086 A, and the like). Furthermore, examples of a display method of the display include a matrix method and/or a segment method. Note that the matrix display and the segment display may co-exist in the same panel.

In the matrix, pixels for display are arranged two-dimensionally as in a lattice form or a mosaic form, and characters or images are displayed by an assembly of pixels. The shape or size of a pixel depends on intended use. For example, for display of images and characters of a personal computer, a monitor, or a television, square pixels each having a size of 300 μm or less on each side are usually used. Furthermore, in a case of a large-sized display such as a display panel, pixels having a size in the order of millimeters on each side are used. In a case of monochromic display, it is only required to arrange pixels of the same color. However, in a case of color display, display is performed by arranging pixels of red, green and blue. In this case, typically, delta type display and stripe type display are available. For this matrix driving method, either a line sequential driving method or an active matrix method may be employed. The line sequential driving method has an advantage of having a simpler structure. However, in consideration of operation characteristics, the active matrix method may be superior. Therefore, it is necessary to use the line sequential driving method or the active matrix method properly according to intended use.

In the segment method (type), a pattern is formed so as to display predetermined information, and a determined region emits light. Examples of the segment method include display of time or temperature in a digital clock or a digital thermometer, display of a state of operation in an audio instrument or an electromagnetic cooker, and panel display in an automobile.

Examples of the lighting apparatus include a lighting apparatuses for indoor lighting or the like, and a backlight of a liquid crystal display apparatus (see, for example, JP 2003-257621 A, JP 2003-277741 A, and JP 2004-119211 A). The backlight is mainly used for enhancing visibility of a display apparatus that is not self-luminous, and is used in a liquid crystal display apparatus, a timepiece, an audio apparatus, an automotive panel, a display plate, a sign, and the like. Particularly, in a backlight for use in a liquid crystal display apparatus, among the liquid crystal display apparatuses, for use in a personal computer in which thickness reduction has been a problem to be solved, in consideration of difficulty in thickness reduction because a conventional type backlight is formed from a fluorescent lamp or a light guide plate, a backlight using the luminescent element according to the present embodiment is characterized by its thinness and lightweightness.

EXAMPLES

Hereinafter, the present invention will be described more specifically by way of Examples, but the present invention is not limited thereto. First, Synthesis Examples of polycyclic aromatic compounds will be described below.

Synthesis Example (1)

Synthesis of compound (1C-2): 5-([1,1'-biphenyl]-4-yl)-15,15-dimethyl-N,N,2-triphenyl-5H, 15H-9-oxa-5-aza-16b-boraindeno[1,2-b]naphtho[1,2,3-fg]anthracen-13-amine (1C-2)

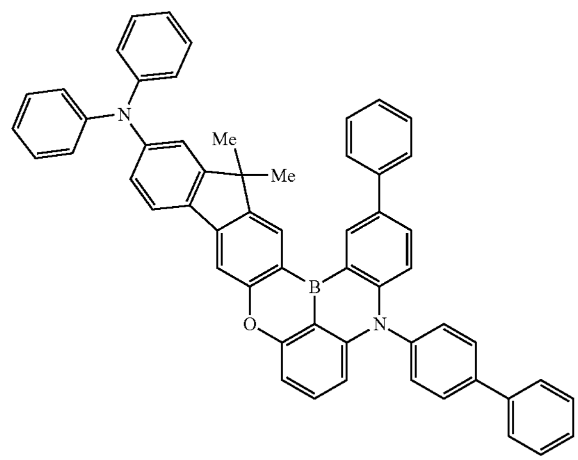

In a nitrogen atmosphere, a flask containing 7-(diphenylamino)-9,9'-dimethyl-9H-fluoren-3-ol (9.0 g), 1,2-bromo-3-fluorobenzene (7.9 g), potassium carbonate (8.2 g), and NMP (45 ml) was heated and stirred at a reflux temperature for two hours. After the reaction was stopped, the reaction liquid was cooled to room temperature, and water was added thereto. A precipitate precipitated was collected by suction filtration. The obtained precipitate was washed with water and then with Solmix and then purified by silica gel column chromatography (eluent: heptane/toluene=3/1 (volume ratio)) to obtain 12.4 g of 6-(2,3-dibromophenoxy)-9,9-dimethyl-N,N-diphenyl-9H-fluoren-2-amine (yield: 84.8%).

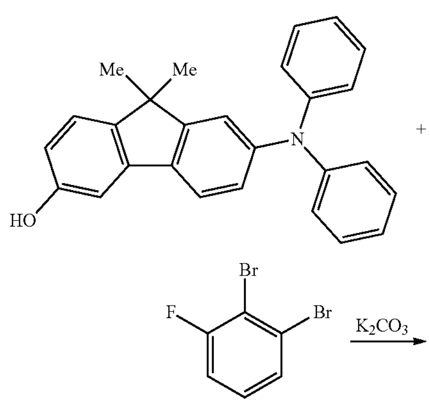

-continued

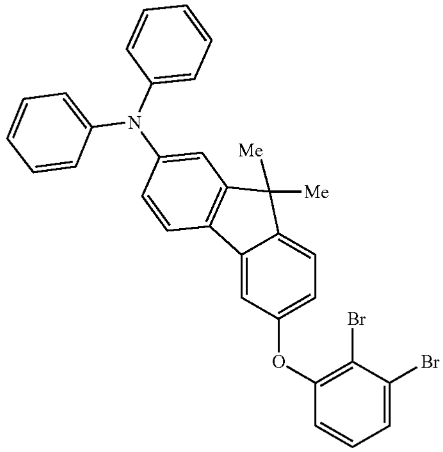

In a nitrogen atmosphere, a flask containing 6-(2,3-dibromophenoxy)-9,9-dimethyl-N,N-diphenyl-9H-fluoren-2-amine (10.0 g), di([1,1'-biphenyl]-4-yl) amine (5.3 g), palladium acetate (0.15 g), dicyclohexyl (2',6'-diisopropoxy-[1,1'-biphenyl]-2-yl) phosphane (0.61 g), NaOtBu (2.4 g), and toluene (35 ml) was heated at 80° C. for six hours. The reaction liquid was cooled to room temperature. Thereafter, water and toluene were added thereto, and the solution was partitioned. Furthermore, purification was performed by silica gel column chromatography (eluent: heptane/toluene=2/1 (volume ratio)) to obtain 7.4 g of 6-(2-bromo-3-(di([1,1'-biphenyl]-4-yl) amino) phenoxy)-9,9-dimethyl-N,N-diphenyl-9H-fluoren-2-amine (yield: 53.1%).

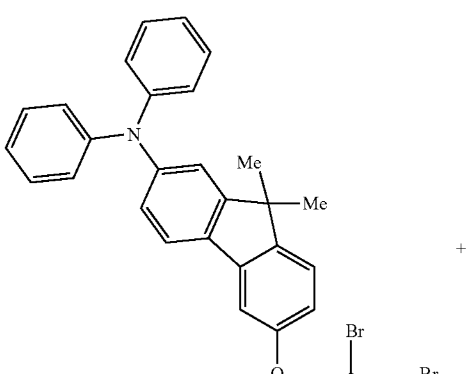

-continued

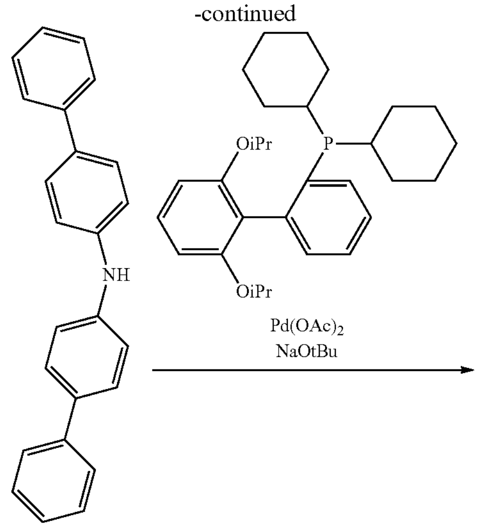

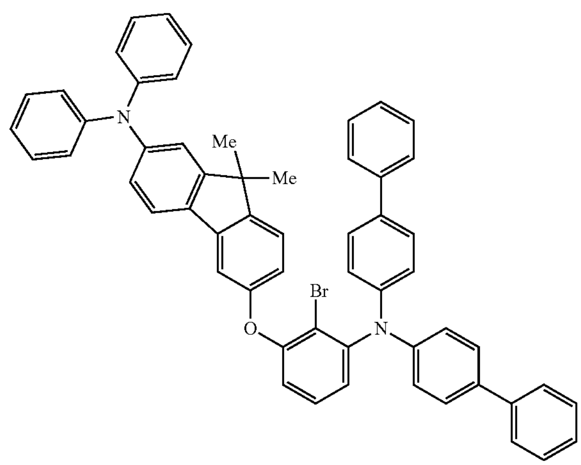

In a nitrogen atmosphere, 6-(2-bromo-3-(di([1,1'-biphenyl]-4-yl) amino) phenoxy)-9,9-dimethyl-N,N-diphenyl-9H-fluoren-2-amine (7.9 g) and tetrahydrofuran (42 ml) were put in a flask and cooled to −40° C. A 1.6 M n-butyllithium hexane solution (6 ml) was added dropwise thereto. After completion of the dropwise addition, the solution was stirred at this temperature for one hour. Thereafter, trimethylborate (1.7 g) was added thereto. The temperature of the solution was raised to room temperature, and the solution was stirred for two hours. Thereafter, water (100 ml) was slowly added dropwise thereto. Subsequently, the reaction mixture was extracted with ethyl acetate and dried with anhydrous sodium sulfate. Thereafter, the desiccant was removed to obtain 7.0 g of dimethyl (2-(di([1,1'-biphenyl]-4-yl) amino)-6-((7-(diphenylamino)-9,9-dimethyl-9H-fluoren-3-yl) oxy) phenyl) boronate (yield: 100%).

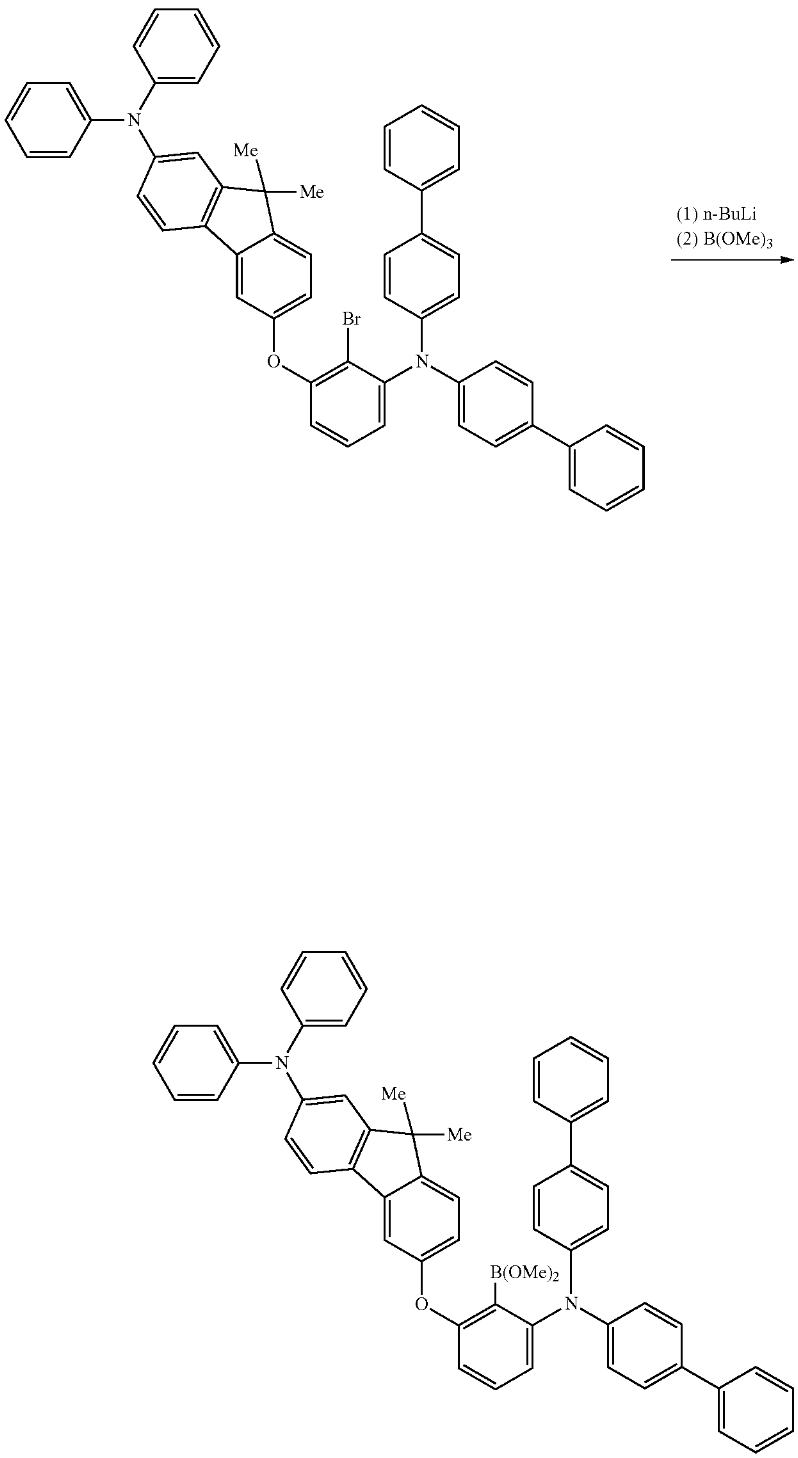

In a nitrogen atmosphere, dimethyl (2-(di([1,1'-biphenyl]-4-yl) amino)-6-((7-(diphenylamino)-9,9-dimethyl-9H-fluoren-3-yl) oxy) phenyl) boronate (6.5 g), aluminum chloride (10.3 g), and toluene (39 ml) were put in a flask and stirred for three minutes. Thereafter, N-ethyl-N-isopropylpropan-2-amine (2.5 g) was added thereto, and the resulting mixture was heated and stirred at 105° C. for one hour. After completion of heating, the reaction liquid was cooled, and ice water (20 ml) was added thereto. Thereafter, the reaction mixture was extracted with toluene. The organic layer was purified with a silica gel short pass column (eluent: toluene) and then by silica gel column chromatography (eluent: heptane/toluene=3/1 (volume ratio)). Thereafter, reprecipitation was performed with heptane, and purification was further performed with a NH2 silica gel column (solvent: heptane/toluene=1/1 (volume ratio)). Finally, sublimation purification was performed to obtain 0.74 g of the compound of formula (1B-10) (yield: 12.3%).

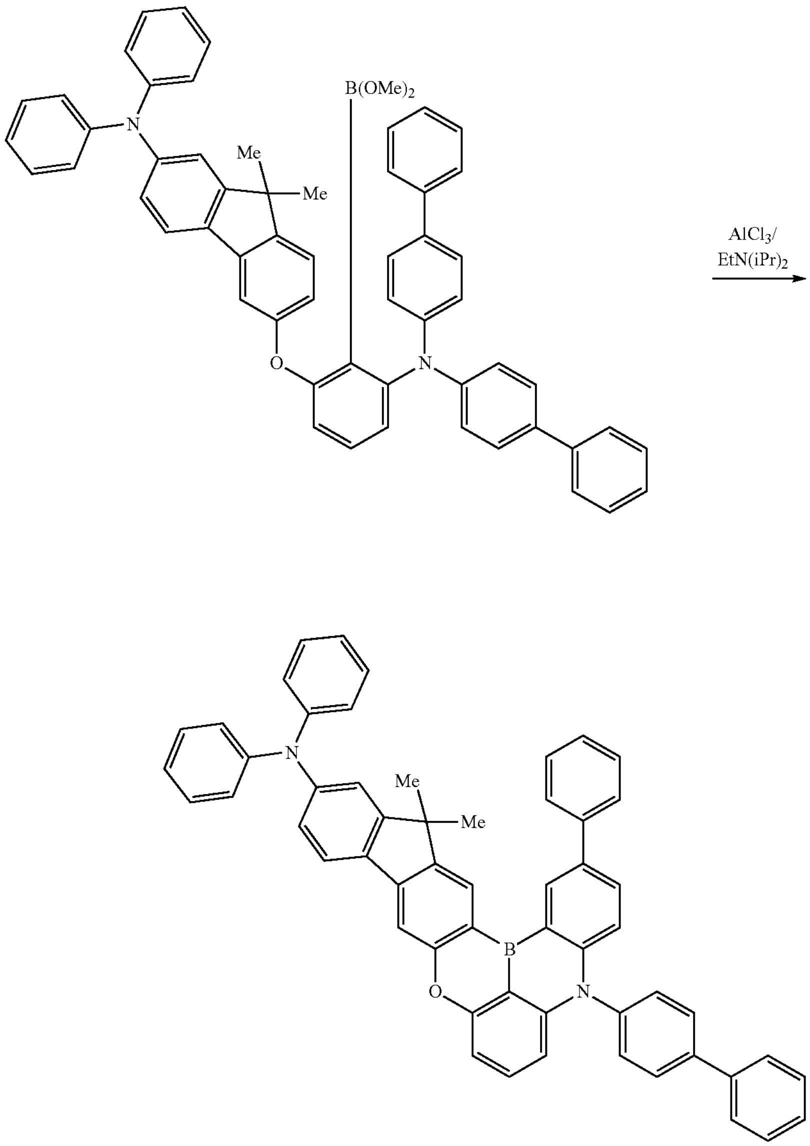

(1C-2)

The structure of the compound was identified by MS spectrum and NMR measurement.

$^{1}$H-NMR ($CDCl_3$): δ=9.22 (s, 1H), 8.78 (s, 1H), 7.96 (d, 2H), 7.80 to 7.77 (m, 6H), 7.71 (d, 1H), 7.59 to 7.44 (m, 8H), 7.39 (t, 1H), 7.32 to 7.29 (m, 4H), 7.71 (d, 1H), 7.19 (dd, 4H), 7.12 to 7.06 (m, 4H), 7.00 (d, 1H), 6.45 (d, 1H), 1.57 (s, 6H).

The compound (1C-2) had a glass transition temperature (Tg) of 165.6° C.

[Measuring instrument: Diamond DSC (manufactured by PERKIN-ELMER); measurement conditions: cooling rate 200° C./min., heating rate 10° C./min.]

Synthesis Example (2)

Synthesis of compound (1A-2619): 2,12-di-t-butyl-5,9-bis(4-(t-butyl)phenyl)-7-methyl-5,9-dihydro-5,9-diaza-13b-boranaphtho[3,2,1-de]anthracene

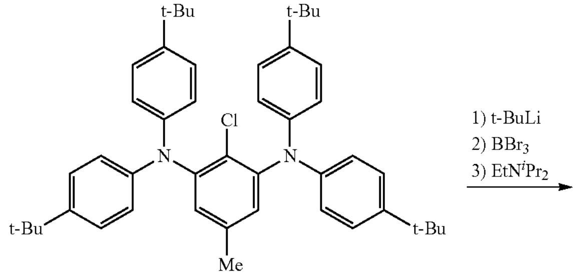

-continued

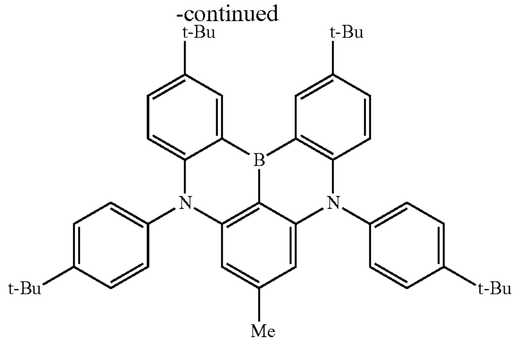

(1A-2619)

The structure of the compound thus obtained was identified by NMR measurement.

$^1$H-NMR (500 MHz, $CDCl_3$): δ=1.47 (s, 36H), 2.17 (s, 3H), 5.97 (s, 2H), 6.68 (d, 2H), 7.28 (d, 4H), 7.49 (dd, 2H), 7.67 (d, 4H), 8.97 (d, 2H).

Synthesis Example (3)

Synthesis of compound of formula (1B-101): $N^5$,$N^5$, $N^{13}$,$N^{13}$-tetraphenyl-7,11-dioxa-17c-bora-phenanthro[2,3,4-no]tetraphen-5,13-diamine (1B-101)

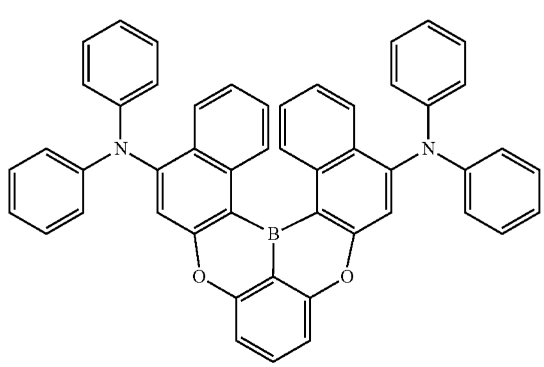

In a nitrogen atmosphere, a flask containing diphenylamine (22.3 g), 4-bromonaphthalen-2-ol (28.0 g), Pd-132 (Johnsen Massey) (0.9 g), NaOtBu (30.0 g), and toluene (252 ml) was heated and refluxed for four hours. The reaction liquid was cooled to room temperature. Thereafter, water and ethyl acetate were added thereto, and the resulting mixture was subjected to liquid separation. Furthermore, purification was performed with a silica gel column chromatography (eluent: toluene) to obtain 35 g (yield: 89.5%) of 4-(diphenylamino) naphthalen-2-ol.

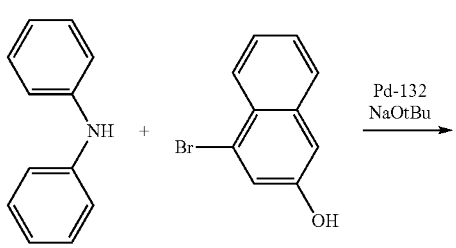

-continued

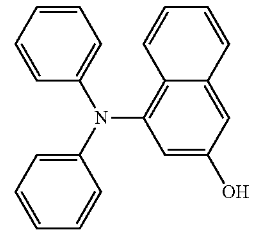

In a nitrogen atmosphere, a flask containing 4-(diphenylamino) naphthalen-2-ol (16.0 g), 2-bromo-1,3-difluorobenzene (5.0 g), potassium carbonate (17.8 g), and 1-methyl-2-pyrrolidone (30 ml) was heated and stirred at a reflux temperature for eight hours. After the reaction stopped, the reaction liquid was cooled to room temperature, and a precipitate precipitated by adding water thereto was collected by suction filtration. The obtained precipitate was washed with water and then with methanol and then purified with a silica gel column chromatography (eluent: mixed solvent of heptane/toluene=2/1 (volume ratio)) to obtain 15.2 g (yield: 76.2%) of 3,3'-((2-bromo-1,3-phenylene) bis (oxy)) bis(N,N-diphenylnaphthalen-1-amine).

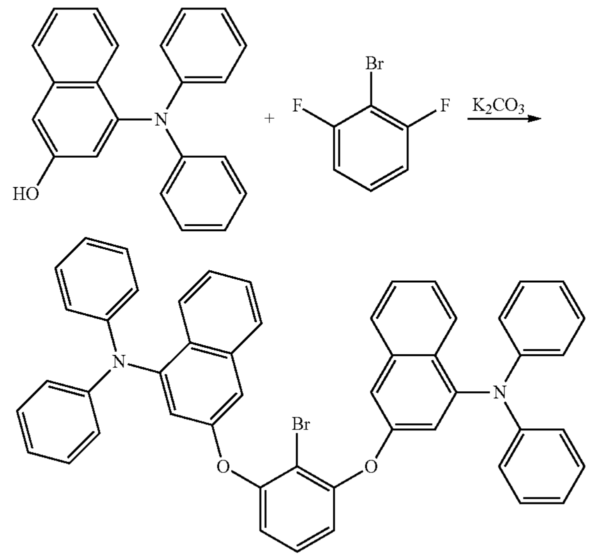

In a nitrogen atmosphere, 3,3'-((2-bromo-1,3-phenylene) bis(oxy)) bis(N,N-diphenylnaphthalen-1-amine) (8.6 g) and tetrahydrofuran (52 ml) were put in a flask, and cooled to −40° C. A 1.6 M n-butyllithium hexane solution (8 ml) was added dropwise thereto. After completion of the dropwise addition, the resulting mixture was stirred at this temperature for one hour, and then trimethylborate (1.7 g) was added thereto. The temperature of the mixture was raised to room temperature, and the mixture was stirred for two hours. Thereafter, water (100 ml) was slowly added dropwise thereto. Next, the reaction mixture was extracted with ethyl acetate and dried with anhydrous sodium sulfate. Thereafter, the desiccant was removed to obtain 8.5 g (yield: 99.4%) of dimethyl (2,6-bis((4-diphenylamino) naphthalen-2-yl) oxy) phenyl) boronate.

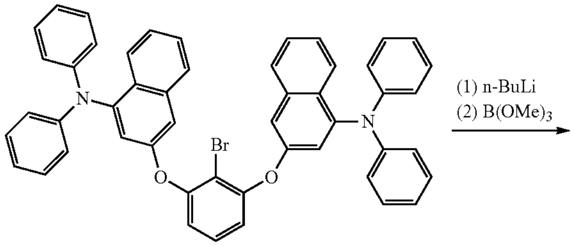

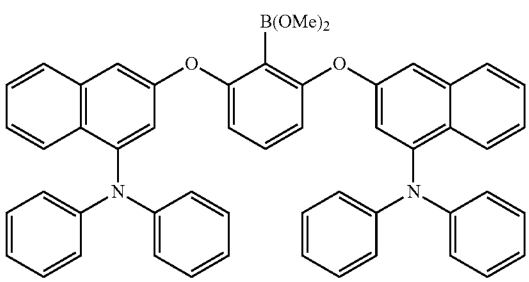

In a nitrogen atmosphere, dimethyl (2,6-bis((4-diphenylamino) naphthalen-2-yl) oxy) phenyl) boronate (7.9 g), aluminum chloride ($AlCl_3$) (13.7 g), and chlorobenzene (50 ml) were put in a flask, and the resulting mixture was stirred for five minutes. Thereafter, N-ethyldiisopropylamine (16.7 g) was added thereto, and the resulting mixture was heated and stirred at 125° C. for one hour. After completion of heating, the reaction liquid was cooled, and ice water (50 ml) was added thereto. Thereafter, the reaction mixture was extracted with toluene and dried with anhydrous sodium sulfate. Thereafter, the desiccant was removed, and the solvent was distilled off under reduced pressure to obtain a crude product. The crude product was subjected to column purification (eluent: heptane/toluene=3/1 (volume ratio)) with silica gel, and then reprecipitated with heptane. Next, the resulting product was subjected to column purification (eluent: heptane/toluene=1/1 (volume ratio)) with $NH_2$ silica gel and further subjected to sublimation purification to obtain 0.8 g (yield: 11%) of a compound (1B-101).

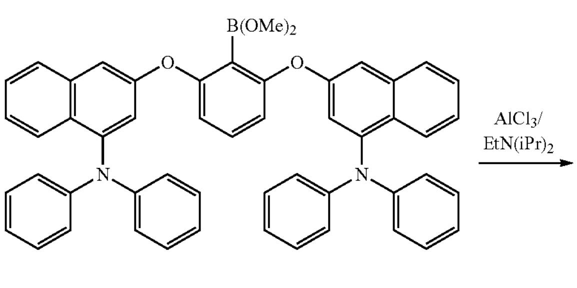

-continued

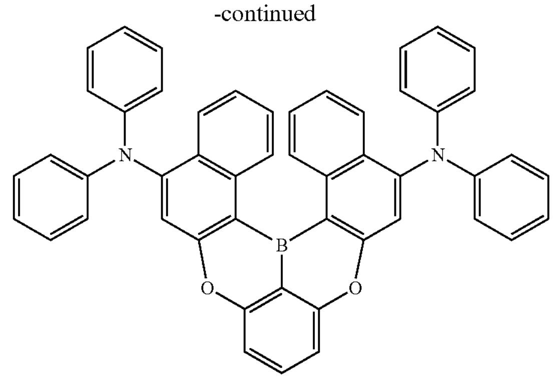

(1B-101)

The structure of the compound was confirmed by MS spectrum and NMR measurement.

$^1$H-NMR ($CDCl_3$): δ=8.00 (d, 2H), 7.88 (d, 2H), 7.70 (t, 1H), 7.47 (s, 2H), 7.31-7.22 (m, 12H), 7.18-7.16 (m, 8H), 7.09-7.04 (m, 6H).

Synthesis Example (4)

Synthesis of Compound (1A-2687): 2,12-di-t-butyl-5,9-bis(4-(t-butyl)phenyl)-N,N-dipheny-5,9-dihydro-5,9-diaza-13b-boranaphtho[3,2,1-de]anthracene-7-amine

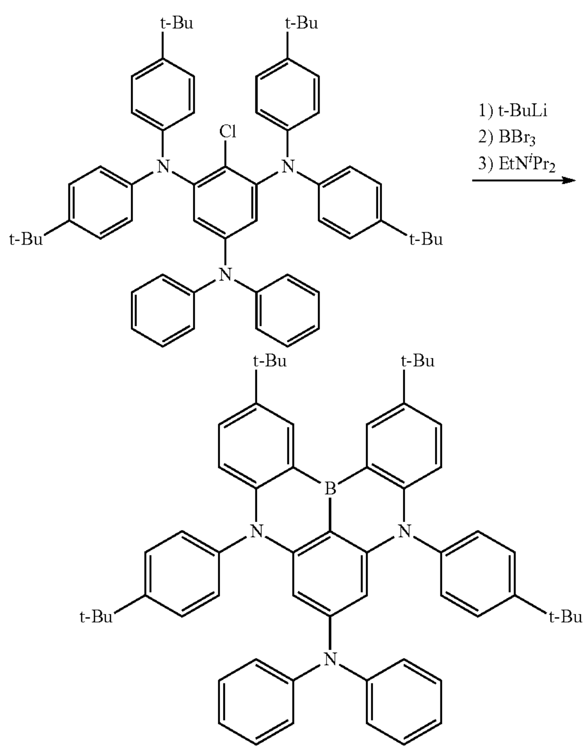

(1A-2687)

The compound (1A-2687) was synthesized using a similar method to that in the Synthesis Example described above.

The structure of the compound thus obtained was identified by NMR measurement.

$^1$H-NMR ($CDCl_3$): δ=1.33 (s, 18H), 1.46 (s, 18H), 5.55 (s, 2H), 6.75 (d, 2H), 6.89 (t, 2H), 6.94 (d, 4H), 7.06 (t, 4H), 7.13 (d, 4H), 7.43-7.46 (m, 6H), 8.95 (d, 2H).

Synthesis Example (5)

Synthesis of Compound of Formula (1B-1): 16, 16, 19, 19-tetramethyl-$N^2$,$N^2$,$N^{14}N^{14}$-tetraphenyl-16,19-dihydro-6,10-dioxa-17b-boraindeno[1,2-b]indeno[1',2':6,7]naphtho[1,2,3-fg]anthracene-2,14-diamine (1B-1)

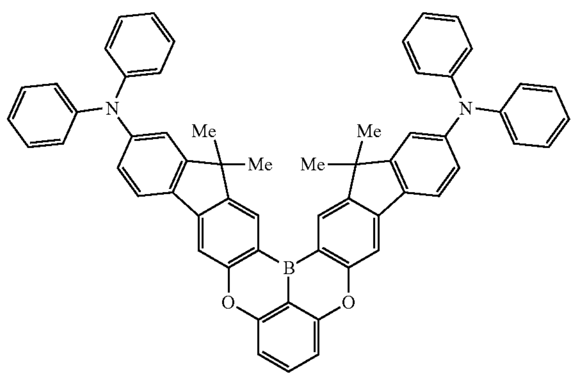

In a nitrogen atmosphere, a flask containing methyl 4-methoxysalicylate (50.0 g) and pyridine (dehydrated) (350 ml) was cooled in an ice bath. Subsequently, trifluoromethanesulfonic anhydride (154.9 g) was added dropwise to this solution. After completion of the dropwise addition, the ice bath was removed, the solution was stirred at room temperature for two hours, and water was added thereto to stop the reaction. Toluene was added thereto, and the solution was partitioned. Thereafter, purification by silica gel short pass column (eluent: toluene) was performed to obtain methyl 4-methoxy-2-(((trifluoromethyl) sulfonyl) oxy) benzoate (86.0 g).

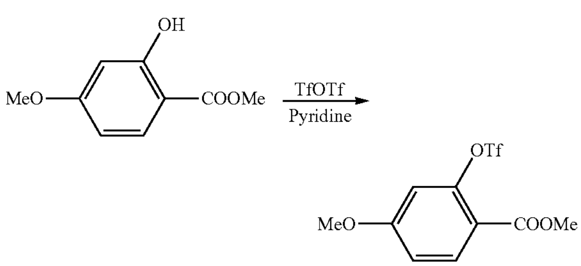

In a nitrogen atmosphere, $Pd(PPh_3)_4$ (2.5 g) was added to a suspension solution of methyl 4-methoxy-2-(((trifluoromethyl) sulfonyl) oxy) benzoate (23.0 g), (4-(diphenylamino) phenyl) boronic acid (25.4 g), tripotassium phosphate (31.1 g), toluene (184 ml), ethanol (27.6 ml), and water (27.6 ml), and the resulting mixture was stirred at a reflux temperature for three hours. The reaction liquid was cooled to room temperature, water and toluene were added thereto, and the solution was partitioned. The solvent of the organic layer was distilled off under reduced pressure. The obtained solid was purified by silica gel column (eluent: mixed solvent of heptane/toluene) to obtain methyl 4'-(diphenylamino)-5-methoxy-[1,1'-biphenyl]-2-carboxylate (29.7 g). In this case, referring to the method described on page 94 of "Guide To Organic Chemistry Experiment (1)—Substance Handling Method and Separation and Purification Method", Kagaku-Dojin Publishing Company, INC., the proportion of toluene in the eluent was gradually increased, and a desired product was thereby eluted.

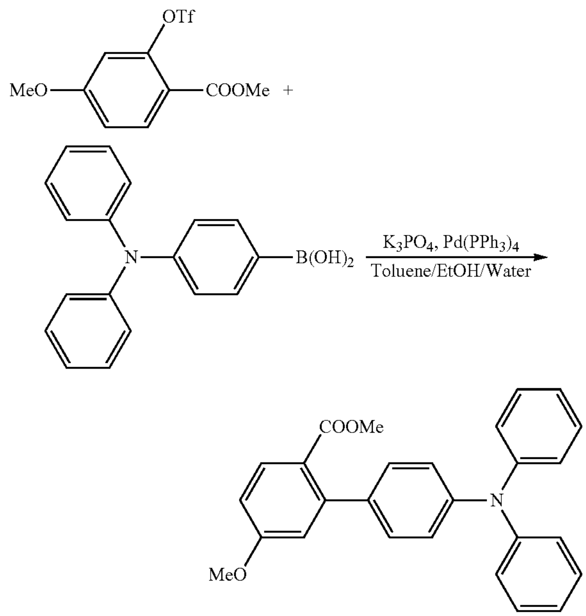

In a nitrogen atmosphere, a THF (111.4 ml) solution having methyl 4'-(diphenylamino)-5-methoxy-[1,1'-biphenyl]-2-carboxylate (11.4 g) dissolved therein was cooled in a water bath. To the solution, a methyl magnesium bromide THF solution (1.0 M, 295 ml) was added dropwise. After completion of the dropwise addition, the water bath was removed, the temperature of the solution was raised to a reflux temperature, and the solution was stirred for four hours. Thereafter, the solution was cooled in an ice bath, an ammonium chloride aqueous solution was added thereto to stop the reaction, ethyl acetate was added thereto, and the solution was partitioned. Thereafter, the solvent was distilled off under reduced pressure. The obtained solid was purified by silica gel column (eluent: toluene) to obtain 2-(5'-(diphenylamino)-5-methoxy-[1,1'-biphenyl]-2-yl) propan-2-ol (8.3 g).

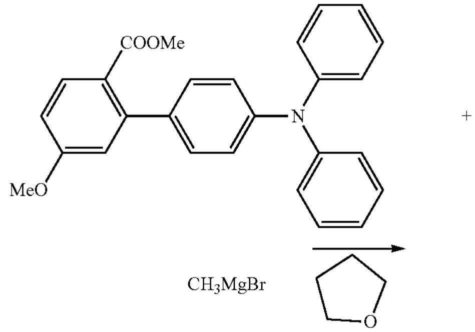

-continued

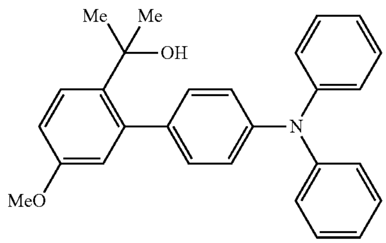

In a nitrogen atmosphere, a flask containing 2-(5'-(diphenylamino)-5-methoxy-[1,1'-biphenyl]-2-yl) propan-2-ol (27.0 g), TAYCACURE-15 (13.5 g), and toluene (162 ml) was stirred at a reflux temperature for two hours. The reaction liquid was cooled to room temperature and caused to pass through a silica gel short pass column (eluent: toluene) to remove TAYCACURE-15. Thereafter, the solvent was distilled off under reduced pressure to obtain 6-methoxy-9,9'-dimethyl-N,N-diphenyl-9H-fluorene-2-amine (25.8 g).

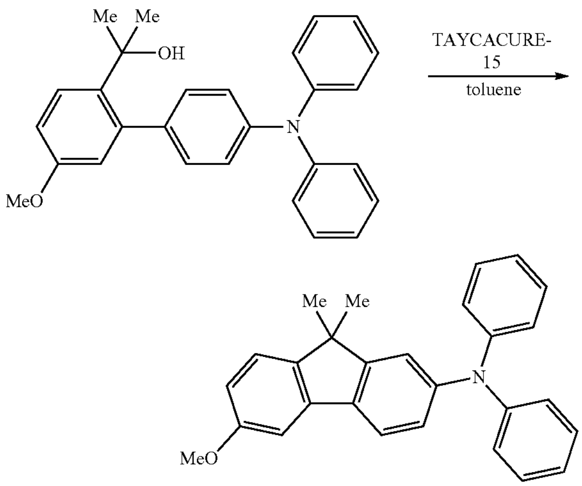

In a nitrogen atmosphere, a flask containing 6-methoxy-9,9'-dimethyl-N,N-diphenyl-9H-fluorene-2-amine (25.0 g), pyridine hydrochloride (36.9 g), and N-methyl-2-pyrrolidone (NMP) (22.5 ml) was stirred at a reflux temperature for six hours. The reaction liquid was cooled to room temperature, water and ethyl acetate were added thereto, and the solution was partitioned. The solvent was distilled off under reduced pressure. Thereafter, the residue was purified by silica gel column (eluent: toluene) to obtain 7-(diphenylamino)-9,9'-dimethyl-9H-fluorene-3-ol (22.0 g).

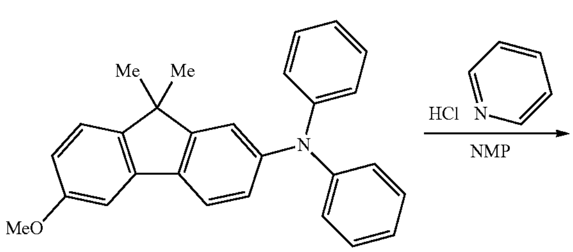

-continued

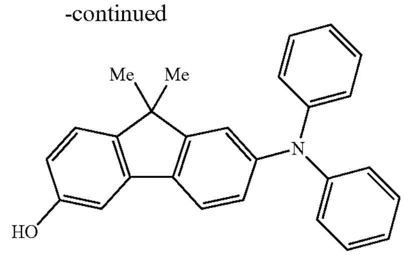

In a nitrogen atmosphere, a flask containing 7-(diphenylamino)-9,9'-dimethyl-9H-fluorene-3-ol (14.1 g), 2-bromo-1,3-difluorobenzene (3.6 g), potassium carbonate (12.9 g), and NMP (30 ml) was heated and stirred at a reflux temperature for five hours. After the reaction was stopped, the reaction liquid was cooled to room temperature, and water was added thereto. A precipitate precipitated was collected by suction filtration. The obtained precipitate was washed with water and then with methanol and then purified by silica gel column (eluent: heptane/toluene mixed solvent) to obtain 6,6'-((2-bromo-1,3-phenylene) bis(oxy)) bis(9,9-dimethyl-N,N-diphenyl-9H-fluorene-2-amine) (12.6 g). At this time, the proportion of toluene in the eluent was gradually increased, and a desired product was thereby eluted.

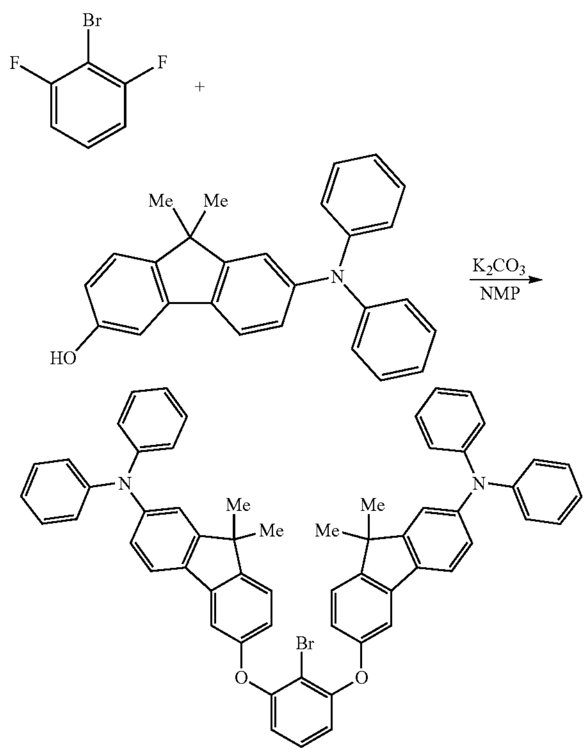

In a nitrogen atmosphere, a flask containing 6,6'-((2-bromo-1,3-phenylene) bis(oxy)) bis(9,9-dimethyl-N,N-diphenyl-9H-fluorene-2-amine) (11.0 g) and xylene (60.5 ml) was cooled to −40° C., and a 2.6 M n-butyllithium hexane solution (5.1 ml) was added dropwise thereto. After completion of the dropwise addition, the solution was stirred at this temperature for 0.5 hours. Thereafter, the temperature of the solution was raised to 60° C., and the solution was stirred for three hours. Thereafter, the reaction liquid was depressurized to distill off a component having a low boiling point. Thereafter, the residue was cooled to −40° C., and boron tribromide (4.3 g) was added thereto. The temperature of the solution was raised to room temperature, and the solution was stirred for 0.5 hours. Thereafter, the solution was cooled to 0° C., N-ethyl-N-isopropylpropan-2-amine (3.8 g) was added thereto, and the solution was heated and stirred at 125° C. for eight hours. The reaction liquid was cooled to room temperature, and a sodium acetate aqueous solution was added thereto to stop the reaction. Thereafter, toluene was added thereto, and the solution was partitioned. The organic layer was purified with a silica gel short pass column, then by silica gel column (eluent: heptane/toluene=4/1 (volume ratio)), and further by activated carbon column (eluent: toluene) to obtain a compound (1B-1) (1.2 g).

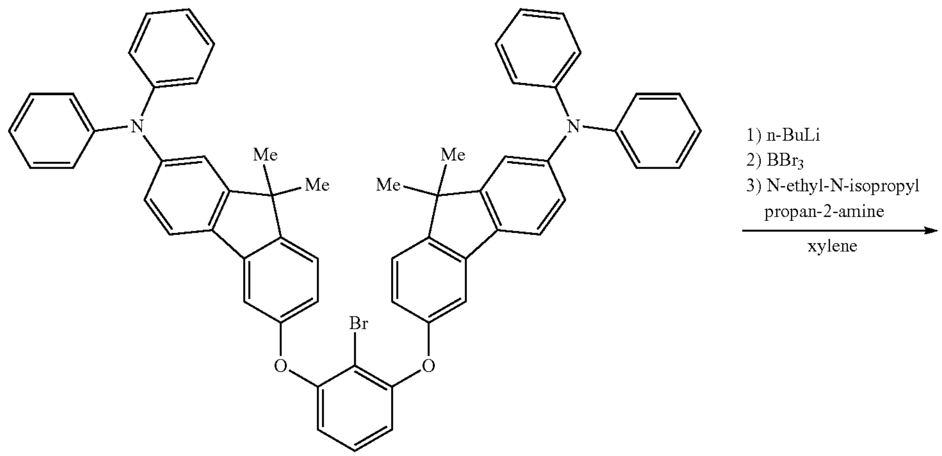

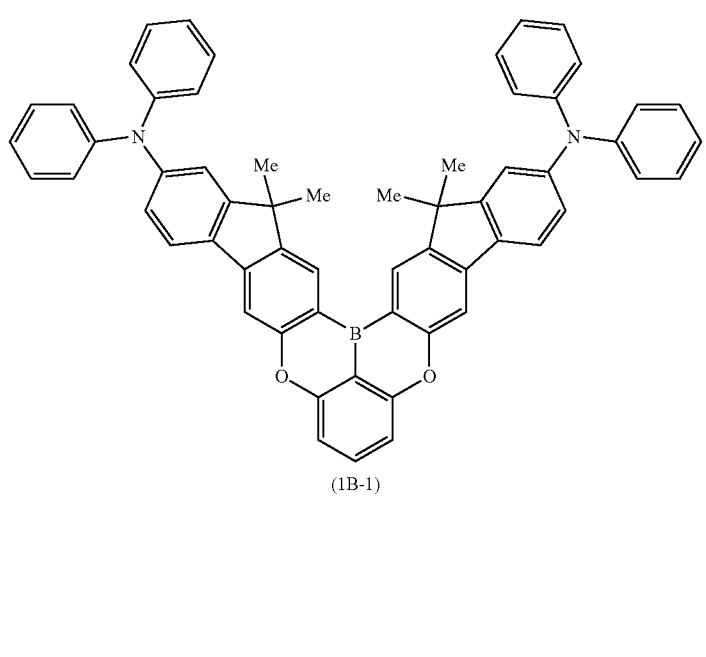

(1B-1)

The structure of the compound thus obtained was identified by NMR measurement.

$^1$H-NMR (400 MHz, $CDCl_3$): δ=8.64 (s, 2H), 7.75 (m, 3H), 7.69 (d, 2H), 7.30 (t, 8H), 7.25 (s, 2H), 7.20 (m, 10H), 7.08 (m, 6H), 1.58 (s, 12H).

Synthesis Example (6)

Synthesis of compound (1C-1)

(1C-1)

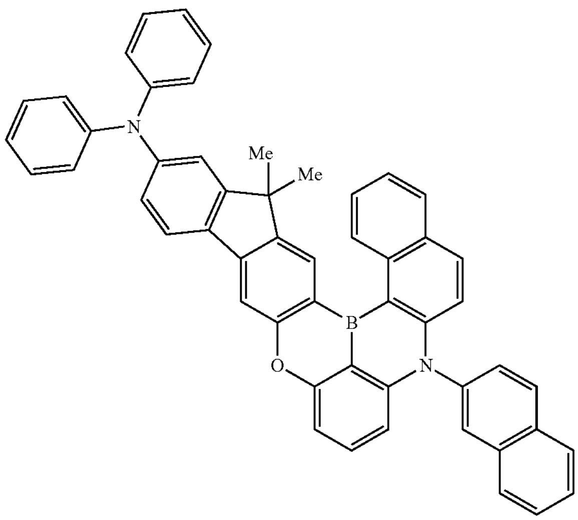

In a nitrogen atmosphere, a flask containing 6-(3-bromo-2-chlorophenoxy)-9,9-dimethyl-N,N-diphenyl-9H-fluorene-2-amine (32.7 g), di(naphthalene-2-yl)amine (15.5 g), Pd-132 (Johnson Massey) (1.2 g), NaOtBu (13.9 g) and xylene (160 ml) was heated and stirred at 85° C. for 2 hours. The reaction liquid was cooled to room temperature, water and toluene were added thereto, and the solution was partitioned. The solvent of the organic layer was purified by silica gel short pass column (eluent: toluene), and then purified by silica gel column (eluent: toluene/heptane=1/3 (volume ratio)) to obtain 6-(2-chloro-3-(di(naphthalene-2-yl)amino)phenoxy)-9,9-dimethyl-N,N-diphenyl-9H-fluorene-2-amine (34.7 g).

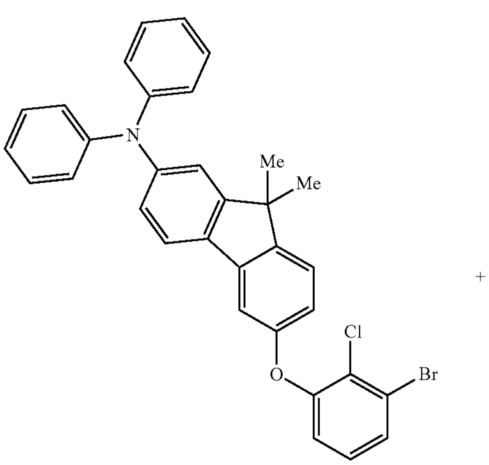

-continued

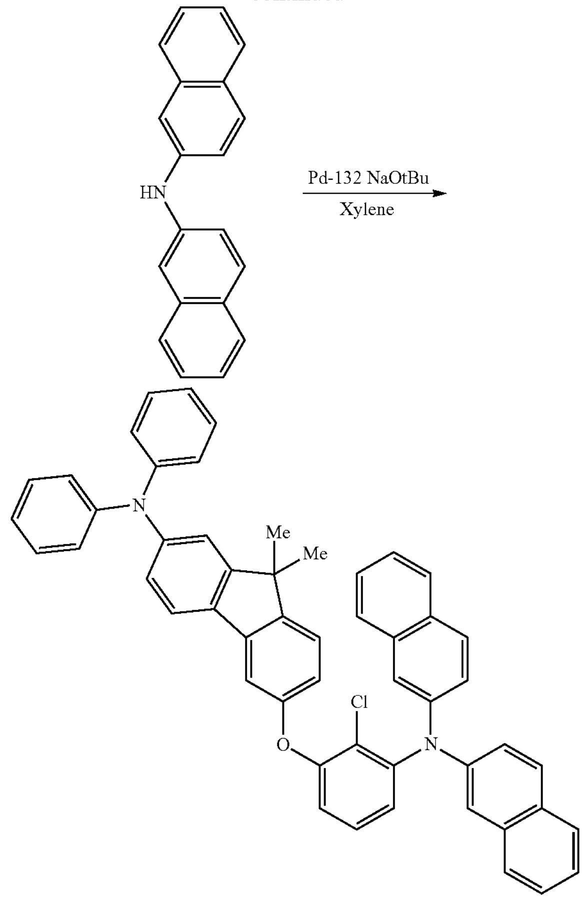

In a nitrogen atmosphere, a flask containing 6-(2-chloro-3-(di(naphthalene-2-yl)amino)phenoxy)-9,9-dimethyl-N,N-diphenyl-9H-fluorene-2-amine (27 g) and xylene (200 ml) was cooled to 0° C., and a 2.6 M n-butyllithium hexane solution (41.2 ml) was added dropwise thereto. After completion of the dropwise addition, the solution was stirred at this temperature for 0.5 hours. Thereafter, the temperature of the solution was raised to 70° C., and the solution was stirred for two hours. Thereafter, the reaction liquid was depressurized to distill off a component having a low boiling point. Thereafter, the residue was cooled to −30° C., and boron tribromide (30.0 g) was added thereto. The temperature of the solution was raised to room temperature, and the solution was stirred for 1 hour. Thereafter, the solution was cooled to 0° C., N-ethyl-N-isopropylpropan-2-amine (9.2 g) was added thereto, and the solution was heated and stirred at 120° C. for three hours. The reaction liquid was cooled to room temperature, and a sodium acetate aqueous solution was added thereto to stop the reaction. Thereafter, ethyl acetate was added thereto, and the solution was partitioned. The organic layer was purified with a silica gel short pass column (eluent: toluene), and then by silica gel column (eluent: toluene/heptane=1/3 (volume ratio)), and then by NH2 silica gel column (eluent: ethyl acetate/heptane=1/3 (volume ratio)). The obtained crude product was dissolved in toluene, and reprecipitated several times with Solmix, and further recrystallized several times with ethyl acetate, finally sublimation purification was performed to obtain a compound (1C-1) (0.7 g) as a yellow solid.

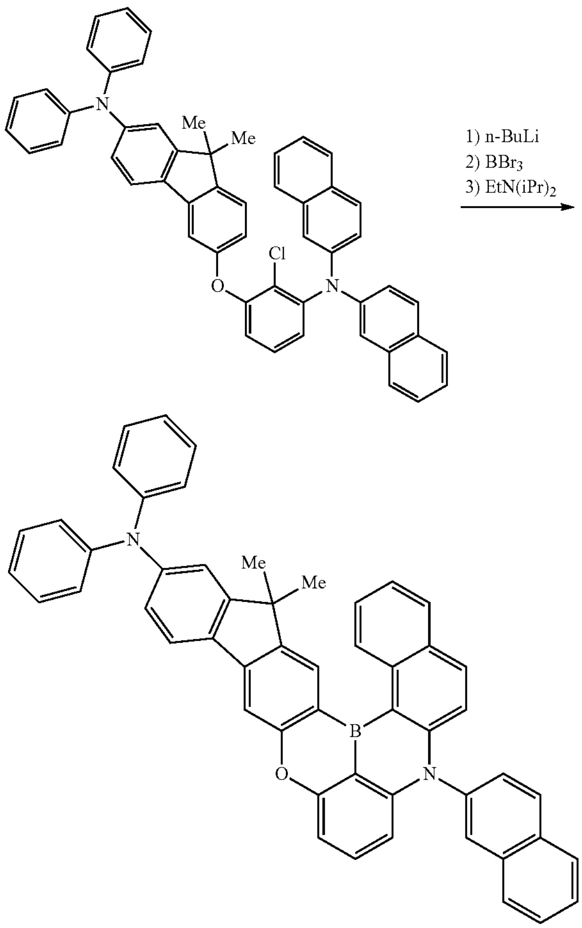

(1C-1)

The structure of the compound was identified by MS spectrum and NMR measurement.

$^1$H-NMR ($CDCl_3$): δ=9.10 (d, 1H), 8.47 (s, 1H), 8.20 (d, 1H), 8.06 (d, 1H), 7.94 (d, 1H), 7.92 (s, 1H), 7.83-7.63 (m, 6H), 7.49-7.44 (m, 4H), 7.31-7.00 (m, 14H), 6.38 (d, 1H), 1.54 (s, 6H).

Synthesis Example (7)

Synthesis of compound (1E-1)

(1E-1)

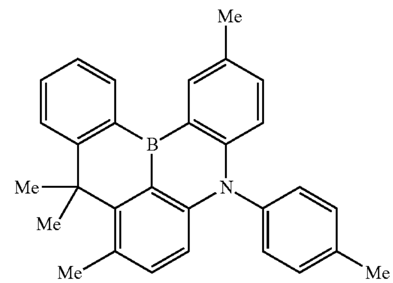

Tri-p-tolylamine (0.287 g, 1.00 mmol), boron triiodide (0.783 g, 2.00 mmol), and o-dichlorobenzene (10.0 mL) were heated and stirred in a nitrogen atmosphere at 150° C. for two hours. The reaction liquid was cooled to room temperature, and 2-isopropenyl phenylmagnesium bromide (5.25 mL, 1.2 M, 6.30 mmol) was added thereto. Thereafter, the resulting mixture was filtered using a florisil short pass column (eluent: toluene), and the solvent was distilled off under reduced pressure. The resulting crude product was washed with hexane to perform isolated purification, thus obtaining 0.309 g of compound (1E-1') at a yield of 75%.

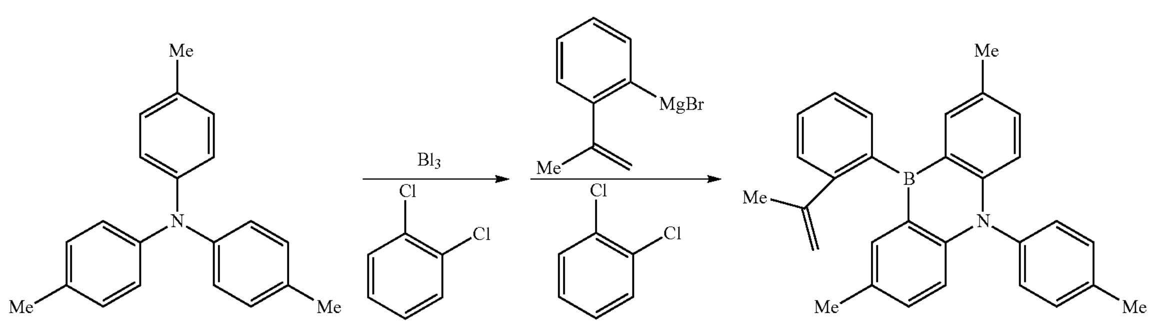

The compound had a glass transition temperature (Tg) of 194.7° C.

[Measuring instrument: Diamond DSC (manufactured by PERKIN-ELMER); measurement conditions: cooling rate 200° C./min., heating rate 10° C./min.]

The structure of the compound thus obtained was confirmed by NMR measurement.

$^1$H-NMR ($CDCl_3$): δ=2.05 (s, 3H), 2.31 (s, 6H), 2.54 (s, 3H), 4.78 (s, 2H), 6.74 (d, 2H) 7.20-7.28 (m, 4H), 7.37-7.48 (m, 5H), 7.56 (d, 1H), 7.68 (s, 2H).

$^{13}$C-NMR ($CDCl_3$): δ=20.6 (s, 2C), 21.3 (s, 1C), 23.8 (s, 1C), 116.7 (s, 2C), 116.9 (s, 1C), 126.0 (d, 2C), 126.8 (s, 1C), 128.2 (s, 2C), 130.0 (d, 4C), 131.4 (d, 4C), 133.0 (s, 1C), 133.7 (s, 2C), 136.4 (s, 2C), 138.6 (s, 1C), 139.3 (s, 1C), 145.1 (s, 1C), 147.0 (d, 2C).

Compound (1E-1') (82.2 mg, 0.20 mmol), scandium trifluoromethanesulfonate (0.100 g, 0.20 mmol), and 1,2-dichloroethane (55.0 mL) were heated and stirred in a nitrogen atmosphere at 95° C. for 24 hours. The reaction liquid was cooled to room temperature and then filtered using a florisil short pass column (eluent: toluene), and the solvent was distilled off under reduced pressure. The resulting crude product was subjected to isolated purification with a silica gel column (eluent: hexane/toluene=6/1 (volume ratio)), thus obtaining 32.0 mg of compound (1E-1) at a yield of 39%.

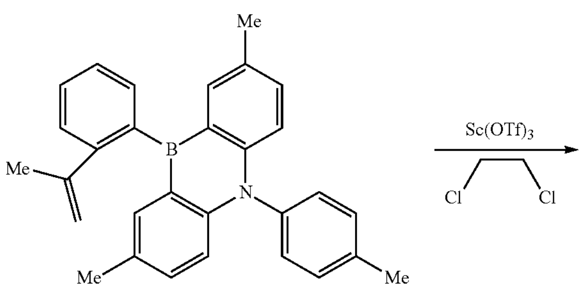

(1E-1')

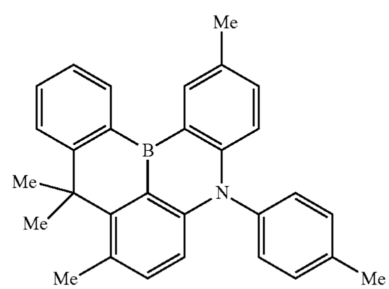

(1E-1)

The structure of the compound thus obtained was confirmed by NMR measurement.

$^{1}$H-NMR ($CDCl_3$): δ=1.98 (s, 6H), 2.48 (s, 3H), 2.53 (s, 3H), 2.76 (s, 3H), 6.61 (d, 1H), 6.75 (d, 1H), 7.14-7.31 (m, 4H), 7.40-7.47 (m, 3H), 7.57 (dt, 1H), 7.81 (d, 1H), 8.44 (d, 1H), 8.50 (s, 1H).

$^{13}$C-NMR ($CDCl_3$): δ=20.9 (s, 1C), 21.4 (s, 1C), 24.3 (s, 1C), 32.6 (s, 2C), 43.5 (s, 1C), 114.0 (s, 1C), 116.6 (s, 1C), 124.7 (s, 1C), 125.8 (s, 1C), 127.0 (s, 1C), 128.4 (s, 2C), 130.1 (s, 2C), 130.5 (s, 1C), 131.4 (s, 2C), 133.0 (s, 1C), 135.2 (s, 1C), 135.5 (s, 1C), 137.7 (s, 1C), 138.4 (s, 1C), 139.5 (s, 1C), 144.3 (s, 1C), 145.4 (s, 1C), 151.4 (s, 1C), 159.5 (s, 1C).

Synthesis Example (8)

Synthesis of Compound (H-2): 2-(10-phenylanthracen-9-yl) naphtho[2,3-b]benzofuran (H-2)

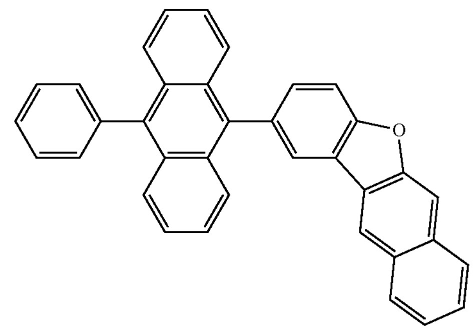

Compound (H-2) was synthesized according to the method described in paragraph [0106] of WO 2014/141725 A.

By appropriately changing compounds as raw materials, other polycyclic aromatic compounds and multimers thereof can be synthesized by a method in accordance with the methods in Synthesis Examples described above.

Evaluation of Organic EL Element

Organic EL elements according to Examples 1 to 27 and Comparative Examples 1 to 18 were manufactured. For each of the elements, a voltage (V), an emission wavelength (nm), CIE chromaticity (x, y), and an external quantum efficiency (%), which are characteristics at the time of light emission at 1000 cd/m$^2$, were measured. Subsequently, time during which 90% or more of initial luminance was held at the time of driving at a current density of 10 mA/cm$^2$ was measured as a lifetime of the element.

A quantum efficiency of a luminescent element includes an internal quantum efficiency and an external quantum efficiency. The internal quantum efficiency indicates a ratio at which external energy injected as electrons (or holes) into a light emitting layer of the luminescent element is purely converted into photons. Meanwhile, the external quantum efficiency is calculated based on the amount of these photons emitted to an outside of the luminescent element. A part of the photons generated in the light emitting layer is absorbed or reflected continuously inside the luminescent element, and is not emitted to the outside of the luminescent element. Therefore, the external quantum efficiency is lower than the internal quantum efficiency.

A method for measuring the external quantum efficiency is as follows. Using a voltage/current generator R6144 manufactured by Advantest Corporation, a voltage at which luminance of an element was 1000 cd/m$^2$ was applied to cause the element to emit light. Using a spectral radiance meter SR-3AR manufactured by TOPCON Co., spectral radiance in a visible light region was measured from a direction perpendicular to a light emitting surface. Assuming that the light emitting surface is a perfectly diffusing surface, a numerical value obtained by dividing a spectral radiance value of each measured wavelength component by wavelength energy and multiplying the obtained value by n is the number of photons at each wavelength. Subsequently, the number of photons was integrated in the observed entire wavelength region, and this number was taken as the total number of photons emitted from the element. A numerical value obtained by dividing an applied current value by an elementary charge is taken as the number of carriers injected into the element. The external quantum efficiency is a numerical value obtained by dividing the total number of photons emitted from the element by the number of carriers injected into the element.

The following Table 1A indicates a material composition of each layer in the organic EL elements manufactured according to Examples 1 to 3 and Comparative Examples 1 and 2.

TABLE 1A

| | Hole injection layer 1 (40 nm) | Hole injection layer 2 (5 nm) | Hole transport layer 1 (15 nm) | Hole transport layer 2 (10 nm) | Light emitting layer (20 nm) Host | Dopant Compound (conc.) | Electron transport layer 1 (5 nm) | Electron transport layer 2 (25 nm) | Negative electrode (1 nm/ 100 nm) |
|---|---|---|---|---|---|---|---|---|---|
| Ex. 1 | HI | HAT-CN | HT-1 | HT-2 | H-1 | 1A-2619 (1 wt. %) 1C-2 (3 wt. %) | ET-1 | ET-2 + Liq | LiF/Al |
| Ex. 2 | HI | HAT-CN | HT-1 | HT-2 | H-1 | 1A-2619 (2 wt. %) 1C-2 (2 wt. %) | ET-1 | ET-2 + Liq | LiF/Al |
| Ex. 3 | HI | HAT-CN | HT-1 | HT-2 | H-1 | 1A-2619 (3 wt. %) 1C-2 (1 wt. %) | ET-1 | ET-2 + Liq | LiF/Al |
| Com. Ex. 1 | HI | HAT-CN | HT-1 | HT-2 | H-1 | 1A-2619 (4 wt. %) | ET-1 | ET-2 + Liq | LiF/Al |
| Com. Ex. 2 | HI | HAT-CN | HT-1 | HT-2 | H-1 | 1C-2 (4 wt. %) | ET-1 | ET-2 + Liq | LiF/Al |

In Table 1A, "HI" represents $N^4$,$N^{4'}$-diphenyl-$N^4$,$N^{4'}$-bis (9-phenyl-9H-carbazol-3-yl)-[1,1'-biphenyl]-4,4'-diamine, "HAT-CN" represents 1,4,5,8,9,12-hexaazatriphenylene hexacarbonitrile, "HT-1" represents N-([1,1'-biphenyl]-4-yl)-9,9-dimethyl-N-(4-(9-phenyl-9H-carbazol-3-yl) phenyl)-9H-fluorene-2-amine[1,1'-biphenyl]-4-amine, "HT-2" represents N,N-bis(4-(dibenzo[b,d]furan-4-yl) phenyl)-[1, 1':4',1"-terphenyl]-4-amine, "ET-1" represents 4,6,8,10-tetraphenyl[1,4]benzoxaborinino[2,3,4-kl]phenoxaborinine, and "ET-2" represents 3,3'-((2-phenylanthracene-9,10-diyl) bis(4,1-phenylene)) bis(4-methylpyridine). Chemical structures thereof are indicated below together with "Liq".

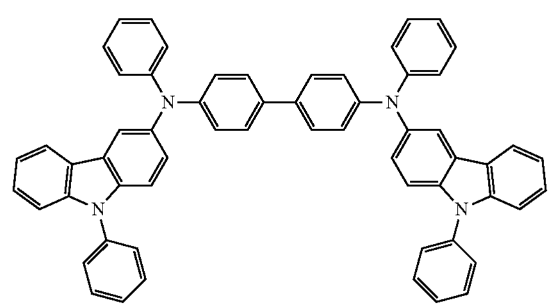

(HI)

-continued

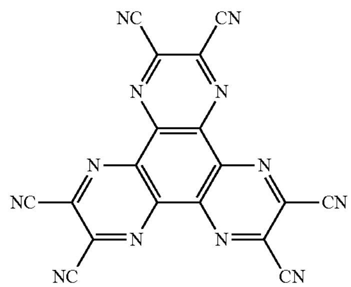

(HAT-CN)

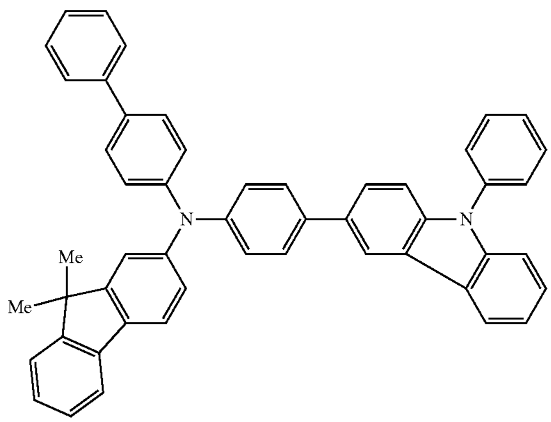

(HT-1)

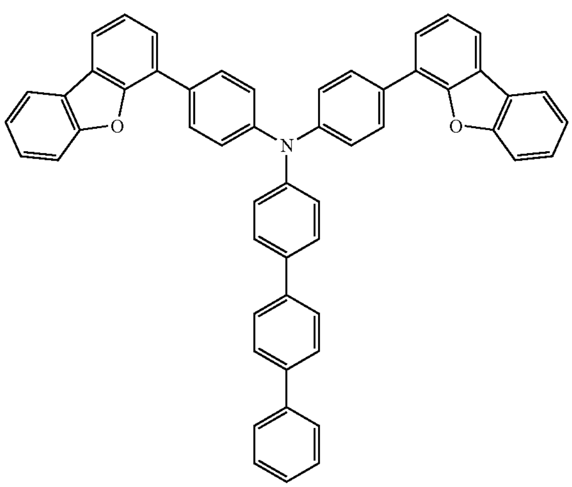

(HT-2)

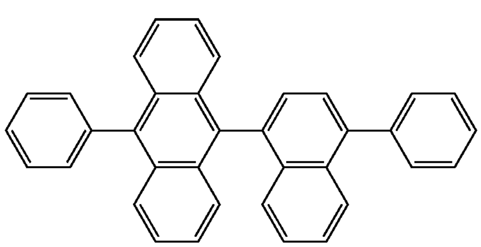

(H-1)

-continued

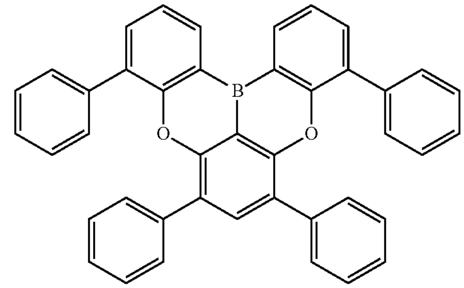

(ET-1)

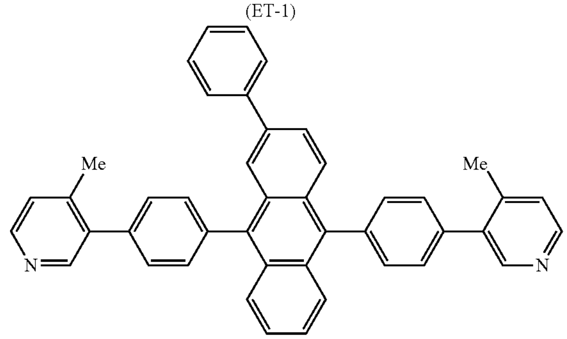

(ET-2)

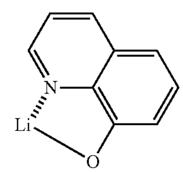

(Liq)

Example 1

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent support substrate was fixed to a substrate holder of a commercially available vapor deposition apparatus (manufactured by Sowa Shinku Co., Ltd.). Molybdenum vapor deposition boats containing HI, HAT-CN, HT-1, HT-2, H-1, compound (1A-2619), compound (1C-2), ET-1, and ET-2, respectively, and aluminum nitride vapor deposition boats containing Liq, LiF, and aluminum, respectively, were attached thereto.

Layers as described below were formed sequentially on the ITO film of the transparent supporting substrate. A vacuum chamber was depressurized to $5\times10^{-4}$ Pa. First, HI was heated and vapor-deposited so as to have a film thickness of 40 nm. Subsequently, HAT-CN was heated and vapor-deposited so as to have a film thickness of 5 nm. Subsequently, HT-1 was heated and vapor-deposited so as to have a film thickness of 15 nm. Subsequently, HT-2 was heated and vapor-deposited so as to have a film thickness of 10 nm. Thus, a hole layer formed of four layers was formed. Subsequently, H-1 as a host, and compound (1A-2619) and compound (1C-2) as a dopant were simultaneously heated and vapor-deposited so as to have a film thickness of 20 nm. Thus, a light emitting layer was formed. The vapor deposition rate was regulated such that a weight ratio between compound (1A-2619) and compound (1C-2) was approximately 25:75, a weight ratio between H-1 as a host, and compound (1A-2619) and compound (1C-2) as a dopant was approximately 96:4. Moreover, ET-1 was heated and vapor-deposited so as to have a film thickness of 5 nm. Subsequently, ET-2 and Liq were simultaneously heated and vapor-deposited so as to have a film thickness of 25 nm to form an electron layer formed of two layers. The vapor deposition rate was regulated such that the weight ratio between ET-2 and Liq was approximately 50:50. The vapor deposition rate for each layer was 0.01 to 1 nm/sec. Thereafter, LiF was heated and vapor-deposited at a vapor deposition rate of 0.01 to 0.1 nm/sec so as to have a film thickness of 1 nm. Subsequently, aluminum was heated and vapor-deposited so as to have a film thickness of 100 nm. Thus, a negative electrode was formed to obtain an organic EL element.

A direct current voltage was applied using an ITO electrode as a positive electrode and a LiF/aluminum electrode as a negative electrode, and the characteristics at the time of light emission at 1000 cd/$m^2$ and the lifetime of the element were measured (Table 1B).

Example 2

An organic EL element was obtained by a method in accordance with that of Example 1 except that the weight ratio of the dopant between compound (1A-2619) and compound (1C-2) was changed to approximately 50:50 when forming the light emitting layer. A direct current voltage was applied using an ITO electrode as a positive electrode and a LiF/aluminum electrode as a negative electrode, and the characteristics at the time of light emission at 1000 cd/$m^2$ and the lifetime of the element were measured (Table 1B).

Example 3

An organic EL element was obtained by a method in accordance with that of Example 1 except that the weight ratio of the dopant between compound (1A-2619) and compound (1C-2) was changed to approximately 75:25 when forming the light emitting layer. A direct current voltage was applied using an ITO electrode as a positive electrode and a LiF/aluminum electrode as a negative electrode, and the characteristics at the time of light emission at 1000 cd/$m^2$ and the lifetime of the element were measured (Table 1B).

Comparative Example 1

An organic EL element was obtained by a method in accordance with that of Example 1 except that the compound (1A-2619) was used alone as a dopant when forming the light emitting layer. A direct current voltage was applied using an ITO electrode as a positive electrode and a LiF/aluminum electrode as a negative electrode, and the characteristics at the time of light emission at 1000 cd/$m^2$ and the lifetime of the element were measured (Table 1B).

Comparative Example 2

An organic EL element was obtained by a method in accordance with that of Example 1 except that the compound (1C-2) was used alone as a dopant when forming the light emitting layer. A direct current voltage was applied using an ITO electrode as a positive electrode and a LiF/aluminum electrode as a negative electrode, and the characteristics at the time of light emission at 1000 cd/$m^2$ and the lifetime of the element were measured (Table 1B).

The organic EL evaluation results of Examples 1 to 3 and Comparative Examples 1 and 2 are shown in Table 1B below.

TABLE 1B

| | Wavelength (nm) | Chromaticity (x, y) | Voltage (V) | External quantum efficiency | Element lifetime (hr) |
|---|---|---|---|---|---|
| Ex. 1 | 461 | (0.133, 0.086) | 4.5 | 9.3 | 109 |
| Ex. 2 | 460 | (0.133, 0.083) | 4.3 | 9.3 | 180 |
| Ex. 3 | 460 | (0.133, 0.079) | 4.3 | 9.4 | 250 |
| Com. Ex. 1 | 461 | (0.133, 0.076) | 4.5 | 8.8 | 172 |
| Com. Ex. 2 | 461 | (0.132, 0.090) | 4.3 | 8.2 | 35 |

The following Table 2A indicates a material composition of each layer in the organic EL elements manufactured according to Examples 4 to 6 and Comparative Examples 3 and 4.

TABLE 2A

| | Hole injection layer 1 (40 nm) | Hole injection layer 2 (5 nm) | Hole transport layer 1 (15 nm) | Hole transport layer 2 (10 nm) | Light emitting layer (20 nm) Host | | Electron transport layer 1 (5 nm) | Electron transport layer 2 (25 nm) | Negative electrode (1 nm/100 nm) |
|---|---|---|---|---|---|---|---|---|---|
| | | | | | Host | Dopant Compound (conc.) | | | |
| Ex. 4 | HI | HAT-CN | HT-1 | HT-2 | H-1 | 1A-2619 (1 wt. %) 1B-101 (3 wt. %) | ET-1 | ET-2 + Liq | LiF/Al |
| Ex. 5 | HI | HAT-CN | HT-1 | HT-2 | H-1 | 1A-2619 (2 wt. %) 1B-101 (2 wt. %) | ET-1 | ET-2 + Liq | LiF/Al |
| Ex. 6 | HI | HAT-CN | HT-1 | HT-2 | H-1 | 1A-2619 (3 wt. %) 1B-101 (1 wt. %) | ET-1 | ET-2 + Liq | LiF/Al |
| Com. Ex. 3 | HI | HAT-CN | HT-1 | HT-2 | H-1 | 1A-2619 (4 wt. %) | ET-1 | ET-2 + Liq | LiF/Al |
| Com. Ex. 4 | HI | HAT-CN | HT-1 | HT-2 | H-1 | 1B-101 (4 wt. %) | ET-1 | ET-2 + Liq | LiF/Al |

Example 4

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent support substrate was fixed to a substrate holder of a commercially available vapor deposition apparatus (manufactured by Chosyu Industry Co., Ltd.). Tantalum vapor deposition boats containing HI, HAT-CN, HT-1, HT-2, H-1, compound (1A-2619), compound (1B-101), ET-1, and ET-2, respectively, and aluminum nitride vapor deposition boats containing Liq, LiF, and aluminum, respectively, were attached thereto.

Layers as described below were formed sequentially on the ITO film of the transparent supporting substrate. A vacuum chamber was depressurized to $5\times10^{-4}$ Pa. First, HI was heated and vapor-deposited so as to have a film thickness of 40 nm. Subsequently, HAT-CN was heated and vapor-deposited so as to have a film thickness of 5 nm. Subsequently, HT-1 was heated and vapor-deposited so as to have a film thickness of 15 nm. Subsequently, HT-2 was heated and vapor-deposited so as to have a film thickness of 10 nm. Thus, a hole layer formed of four layers was formed. Subsequently, H-1 as a host, and compound (1A-2619) and compound (1B-101) as a dopant were simultaneously heated and vapor-deposited so as to have a film thickness of 20 nm. Thus, a light emitting layer was formed. The vapor deposition rate was regulated such that a weight ratio between compound (1A-2619) and compound (1B-101) was approximately 25:75, a weight ratio between H-1 as a host, and compound (1A-2619) and compound (1B-101) as a dopant was approximately 96:4. Moreover, ET-1 was heated and vapor-deposited so as to have a film thickness of 5 nm. Subsequently, ET-2 and Liq were simultaneously heated and vapor-deposited so as to have a film thickness of 25 nm to form an electron layer formed of two layers. The vapor deposition rate was regulated such that the weight ratio between ET-2 and Liq was approximately 50:50. The vapor deposition rate for each layer was 0.01 to 1 nm/sec. Thereafter, LiF was heated and vapor-deposited at a vapor deposition rate of 0.01 to 0.1 nm/sec so as to have a film thickness of 1 nm. Subsequently, aluminum was heated and vapor-deposited so as to have a film thickness of 100 nm. Thus, a negative electrode was formed to obtain an organic EL element.

A direct current voltage was applied using an ITO electrode as a positive electrode and a LiF/aluminum electrode as a negative electrode, and the characteristics at the time of light emission at 1000 cd/m$^2$ and the lifetime of the element were measured (Table 2B).

Example 5

An organic EL element was obtained by a method in accordance with that of Example 4 except that the weight ratio of the dopant between compound (1A-2619) and compound (1B-101) was changed to approximately 50:50 when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 2B).

Example 6

An organic EL element was obtained by a method in accordance with that of Example 4 except that the weight ratio of the dopant between compound (1A-2619) and compound (1B-101) was changed to approximately 75:25 when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 2B).

Comparative Example 3

An organic EL element was obtained by a method in accordance with that of Example 4 except that the compound (1A-2619) was used alone as a dopant when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 2B).

Comparative Example 4

An organic EL element was obtained by a method in accordance with that of Example 4 except that the compound (1B-101) was used alone as a dopant when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 2B).

The organic EL evaluation results of Examples 4 to 6 and Comparative Examples 3 and 4 are shown in Table 2B below.

TABLE 2B

| | Wavelength (nm) | Chromaticity (x, y) | Voltage (V) | External quantum efficiency | Element lifetime (hr) |
|---|---|---|---|---|---|
| Ex. 4 | 462 | (0.131, 0.113) | 4.1 | 8.8 | 190 |
| Ex. 5 | 461 | (0.131, 0.102) | 4.1 | 8.8 | 233 |
| Ex. 6 | 461 | (0.132, 0.091) | 4.2 | 8.7 | 253 |
| Com. Ex. 3 | 461 | (0.132, 0.077) | 4.4 | 8.4 | 172 |
| Com. Ex. 4 | 463 | (0.131, 0.126) | 4.1 | 6.8 | 72 |

The following Table 3A indicates a material composition of each layer in the organic EL elements manufactured according to Examples 7 to 9 and Comparative Examples 5 and 6.

TABLE 3A

| | Hole injection layer 1 (40 nm) | Hole injection layer 2 (5 nm) | Hole transport layer 1 (15 nm) | Hole transport layer 2 (10 nm) | Light emitting layer (20 nm) Host | Dopant Compound (conc.) | Electron transport layer 1 (5 nm) | Electron transport layer 2 (25 nm) | Negative electrode (1 nm/ 100 nm) |
|---|---|---|---|---|---|---|---|---|---|
| Ex. 7 | HI | HAT-CN | HT-1 | HT-2 | H-1 | 1A-2619 (1 wt. %) 1A-2687 (3 wt. %) | ET-1 | ET-2 + Liq | LiF/Al |
| Ex. 8 | HI | HAT-CN | HT-1 | HT-2 | H-1 | 1A-2619 (2 wt. %) 1A-2687 (2 wt. %) | ET-1 | ET-2 + Liq | LiF/Al |
| Ex. 9 | HI | HAT-CN | HT-1 | HT-2 | H-1 | 1A-2619 (3 wt. %) 1A-2687 (1 wt. %) | ET-1 | ET-2 + Liq | LiF/Al |
| Com. Ex. 5 | HI | HAT-CN | HT-1 | HT-2 | H-1 | 1A-2619 (4 wt. %) | ET-1 | ET-2 + Liq | LiF/Al |
| Com. Ex. 6 | HI | HAT-CN | HT-1 | HT-2 | H-1 | 1A-2687 (4 wt. %) | ET-1 | ET-2 + Liq | LiF/Al |

Example 7

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent support substrate was fixed to a substrate holder of a commercially available vapor deposition apparatus (manufactured by Chosyu Industry Co., Ltd.). Tantalum vapor deposition boats containing HI, HAT-CN, HT-1, HT-2, H-1, compound (1A-2619), compound (1A-2687), ET-1, and ET-2, respectively, and aluminum nitride vapor deposition boats containing Liq, LiF, and aluminum, respectively, were attached thereto.

Layers as described below were formed sequentially on the ITO film of the transparent supporting substrate. A vacuum chamber was depressurized to $5\times10^{-4}$ Pa. First, HI was heated and vapor-deposited so as to have a film thickness of 40 nm. Subsequently, HAT-CN was heated and vapor-deposited so as to have a film thickness of 5 nm. Subsequently, HT-1 was heated and vapor-deposited so as to have a film thickness of 15 nm. Subsequently, HT-2 was heated and vapor-deposited so as to have a film thickness of 10 nm. Thus, a hole layer formed of four layers was formed. Subsequently, H-1 as a host, and compound (1A-2619) and compound (1A-2687) as a dopant were simultaneously heated and vapor-deposited so as to have a film thickness of 20 nm. Thus, a light emitting layer was formed. The vapor deposition rate was regulated such that a weight ratio between compound (1A-2619) and compound (1A-2687) was approximately 25:75, a weight ratio between H-1 as a host, and compound (1A-2619) and compound (1A-2687) as a dopant was approximately 96:4. Moreover, ET-1 was heated and vapor-deposited so as to have a film thickness of 5 nm. Subsequently, ET-2 and Liq were simultaneously heated and vapor-deposited so as to have a film thickness of 25 nm to form an electron layer formed of two layers. The vapor deposition rate was regulated such that the weight ratio between ET-2 and Liq was approximately 50:50. The vapor deposition rate for each layer was 0.01 to 1 nm/sec. Thereafter, LiF was heated and vapor-deposited at a vapor deposition rate of 0.01 to 0.1 nm/sec so as to have a film thickness of 1 nm. Subsequently, aluminum was heated and vapor-deposited so as to have a film thickness of 100 nm. Thus, a negative electrode was formed to obtain an organic EL element.

A direct current voltage was applied using an ITO electrode as a positive electrode and a LiF/aluminum electrode as a negative electrode, and the characteristics at the time of light emission at 1000 cd/m$^2$ and the lifetime of the element were measured (Table 3B).

Example 8

An organic EL element was obtained by a method in accordance with that of Example 7 except that the weight ratio of the dopant between compound (1A-2619) and compound (1A-2687) was changed to approximately 50:50 when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 3B).

Example 9

An organic EL element was obtained by a method in accordance with that of Example 7 except that the weight ratio of the dopant between compound (1A-2619) and compound (1A-2687) was changed to approximately 75:25 when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 3B).

Comparative Example 5

An organic EL element was obtained by a method in accordance with that of Example 7 except that the compound (1A-2619) was used alone as a dopant when forming the light emitting layer. A direct current voltage was applied using an ITO electrode as a positive electrode and a LiF/aluminum electrode as a negative electrode, and the characteristics at the time of light emission at 1000 cd/$m^2$ and the lifetime of the element were measured (Table 3B).

Comparative Example 6

An organic EL element was obtained by a method in accordance with that of Example 7 except that the compound (1A-2687) was used alone as a dopant when forming the light emitting layer. A direct current voltage was applied using an ITO electrode as a positive electrode and a LiF/aluminum electrode as a negative electrode, and the characteristics at the time of light emission at 1000 cd/$m^2$ and the lifetime of the element were measured (Table 3B).

The organic EL evaluation results of Examples 7 to 9 and Comparative Examples 5 and 6 are shown in Table 3B below.

TABLE 3B

| | Wavelength (nm) | Chromaticity (x, y) | Voltage (V) | External quantum efficiency | Element lifetime (hr) |
|---|---|---|---|---|---|
| Ex. 7 | 458 | (0.136, 0.066) | 4.4 | 7.9 | 400 |
| Ex. 8 | 460 | (0.134, 0.072) | 4.4 | 8.0 | 321 |
| Ex. 9 | 461 | (0.133, 0.077) | 4.4 | 8.0 | 302 |
| Com. Ex. 5 | 461 | (0.132, 0.078) | 4.6 | 7.7 | 279 |
| Com. Ex. 6 | 454 | (0.141, 0.054) | 4.8 | 7.6 | 215 |

The following Table 4A indicates a material composition of each layer in the organic EL elements manufactured according to Examples 10 to 12 and Comparative Examples 7 and 8.

TABLE 4A

| | Hole injection layer 1 (40 nm) | Hole injection layer 2 (5 nm) | Hole transport layer 1 (15 nm) | Hole transport layer 2 (10 nm) | Light emitting layer (20 nm) Host | Light emitting layer (20 nm) Dopant Compound (conc.) | Electron transport layer 1 (5 nm) | Electron transport layer 2 (25 nm) | Negative electrode (1 nm/ 100 nm) |
|---|---|---|---|---|---|---|---|---|---|
| Ex. 10 | HI | HAT-CN | HT-1 | HT-2 | H-1 | 1C-2 (1 wt. %) 1B-101 (3 wt. %) | ET-1 | ET-2 + Liq | LiF/Al |
| Ex. 11 | HI | HAT-CN | HT-1 | HT-2 | H-1 | 1C-2 (2 wt. %) 1B-101 (2 wt. %) | ET-1 | ET-2 + Liq | LiF/Al |
| Ex. 12 | HI | HAT-CN | HT-1 | HT-2 | H-1 | 1C-2 (3 wt. %) 1B-101 (1 wt. %) | ET-1 | ET-2 + Liq | LiF/Al |
| Com. Ex. 7 | HI | HAT-CN | HT-1 | HT-2 | H-1 | 1C-2 (4 wt. %) | ET-1 | ET-2 + Liq | LiF/Al |
| Com. Ex. 8 | HI | HAT-CN | HT-1 | HT-2 | H-1 | 1B-101 (4 wt. %) | ET-1 | ET-2 + Liq | LiF/Al |

Example 10

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent support substrate was fixed to a substrate holder of a commercially available vapor deposition apparatus (manufactured by Chosyu Industry Co., Ltd.). Tantalum vapor deposition boats containing HI, HAT-CN, HT-1, HT-2, H-1, compound (1C-2), compound (1B-101), ET-1, and ET-2, respectively, and aluminum nitride vapor deposition boats containing Liq, LiF, and aluminum, respectively, were attached thereto.

Layers as described below were formed sequentially on the ITO film of the transparent supporting substrate. A vacuum chamber was depressurized to $5\times10^{-4}$ Pa. First, HI was heated and vapor-deposited so as to have a film thickness of 40 nm. Subsequently, HAT-CN was heated and vapor-deposited so as to have a film thickness of 5 nm. Subsequently, HT-1 was heated and vapor-deposited so as to have a film thickness of 15 nm. Subsequently, HT-2 was heated and vapor-deposited so as to have a film thickness of 10 nm. Thus, a hole layer formed of four layers was formed. Subsequently, H-1 as a host, and compound (1C-2) and compound (1B-101) as a dopant were simultaneously heated and vapor-deposited so as to have a film thickness of 20 nm. Thus, a light emitting layer was formed. The vapor deposition rate was regulated such that a weight ratio between compound (1C-2) and compound (1B-101) was approximately 25:75, a weight ratio between H-1 as a host, and compound (1C-2) and compound (1B-101) as a dopant was approximately 96:4. Moreover, ET-1 was heated and vapor-deposited so as to have a film thickness of 5 nm. Subsequently, ET-2 and Liq were simultaneously heated and vapor-deposited so as to have a film thickness of 25 nm to form an electron layer formed of two layers. The vapor deposition rate was regulated such that the weight ratio between ET-2 and Liq was approximately 50:50. The vapor deposition rate for each layer was 0.01 to 1 nm/sec. Thereafter, LiF was heated and vapor-deposited at a vapor deposition rate of 0.01 to 0.1 nm/sec so as to have a film thickness of 1 nm. Subsequently, aluminum was heated and vapor-deposited so as to have a film thickness of 100 nm. Thus, a negative electrode was formed to obtain an organic EL element.

A direct current voltage was applied using an ITO electrode as a positive electrode and a LiF/aluminum electrode as a negative electrode, and the characteristics at the time of light emission at 1000 cd/$m^2$ and the lifetime of the element were measured (Table 4B).

Example 11

An organic EL element was obtained by a method in accordance with that of Example 10 except that the weight ratio of the dopant between compound (1C-2) and compound (1B-101) was changed to approximately 50:50 when forming the light emitting layer. A direct current voltage was applied using an ITO electrode as a positive electrode and a LiF/aluminum electrode as a negative electrode, and the characteristics at the time of light emission at 1000 cd/$m^2$ and the lifetime of the element were measured (Table 4B).

Example 12

An organic EL element was obtained by a method in accordance with that of Example 10 except that the weight ratio of the dopant between compound (1C-2) and compound (1B-101) was changed to approximately 75:25 when forming the light emitting layer. A direct current voltage was applied using an ITO electrode as a positive electrode and a LiF/aluminum electrode as a negative electrode, and the characteristics at the time of light emission at 1000 cd/$m^2$ and the lifetime of the element were measured (Table 4B).

The organic EL evaluation results of Examples 10 to 12 and Comparative Examples 7 and 8 are shown in Table 4B below.

TABLE 4B

| | Wavelength (nm) | Chromaticity (x, y) | Voltage (V) | External quantum efficiency | Element lifetime (hr) |
|---|---|---|---|---|---|
| Ex. 10 | 462 | (0.132, 0.119) | 4.1 | 8.3 | 130 |
| Ex. 11 | 462 | (0.132, 0.106) | 4.2 | 8.4 | 152 |
| Ex. 12 | 462 | (0.132, 0.098) | 4.2 | 8.6 | 113 |
| Com. Ex. 7 | 461 | (0.132, 0.090) | 4.3 | 8.2 | 35 |
| Com. Ex. 8 | 463 | (0.131, 0.126) | 4.1 | 6.8 | 72 |

The following Table 5A indicates a material composition of each layer in the organic EL elements manufactured according to Examples 13 to 15 and Comparative Examples 9 and 10.

TABLE 5A

| | Hole injection layer 1 (40 nm) | Hole injection layer 2 (5 nm) | Hole transport layer 1 (15 nm) | Hole transport layer 2 (10 nm) | Light emitting layer (20 nm) Host | Dopant Compound (conc.) | Electron transport layer 1 (5 nm) | Electron transport layer 2 (25 nm) | Negative electrode (1 nm/ 100 nm) |
|---|---|---|---|---|---|---|---|---|---|
| Ex. 13 | HI | HAT-CN | HT-1 | HT-2 | H-2 | 1A-2619 (1 wt. %) 1C-2 (3 wt. %) | ET-1 | ET-2 + Liq | LiF/Al |
| Ex. 14 | HI | HAT-CN | HT-1 | HT-2 | H-2 | 1A-2619 (2 wt. %) 1C-2 (2 wt. %) | ET-1 | ET-2 + Liq | LiF/Al |
| Ex. 15 | HI | HAT-CN | HT-1 | HT-2 | H-2 | 1A-2619 (3wt. %) 1C-2 (1 wt. %) | ET-1 | ET-2 + Liq | LiF/Al |
| Com. Ex. 9 | HI | HAT-CN | HT-1 | HT-2 | H-2 | 1A-2619 (4 wt. %) | ET-1 | ET-2 + Liq | LiF/Al |
| Com. Ex. 10 | HI | HAT-CN | HT-1 | HT-2 | H-2 | 1C-2 (4 wt. %) | ET-1 | ET-2 + Liq | LiF/Al |

Comparative Example 7

An organic EL element was obtained by a method in accordance with that of Example 10 except that the compound (1C-2) was used alone as a dopant when forming the light emitting layer. A direct current voltage was applied using an ITO electrode as a positive electrode and a LiF/aluminum electrode as a negative electrode, and the characteristics at the time of light emission at 1000 cd/$m^2$ and the lifetime of the element were measured (Table 4B).

Comparative Example 8

An organic EL element was obtained by a method in accordance with that of Example 10 except that the compound (1B-101) was used alone as a dopant when forming the light emitting layer. A direct current voltage was applied using an ITO electrode as a positive electrode and a LiF/aluminum electrode as a negative electrode, and the characteristics at the time of light emission at 1000 cd/$m^2$ and the lifetime of the element were measured (Table 4B).

In Table 5A, "H-2" represents 2-(10-phenylanthracen-9-yl) naphtho [2,3-b] benzofuran, a chemical structure thereof is indicated below.

(3-68-O)

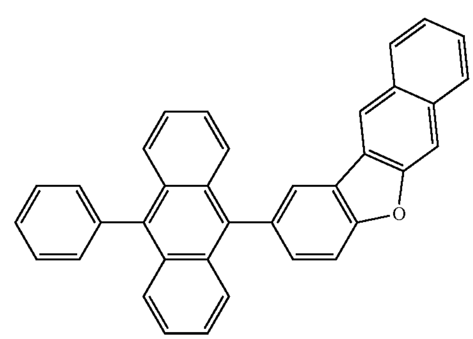

Example 13

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent support substrate was fixed to a substrate holder of a commercially available vapor deposition apparatus (manufactured by Chosyu Industry Co., Ltd.). Tantalum vapor deposition boats containing HI, HAT-CN, HT-1, HT-2, H-2, compound (1A-2619), compound (1C-2), ET-1, and ET-2, respectively, and aluminum nitride vapor deposition boats containing Liq, LiF, and aluminum, respectively, were attached thereto.

Layers as described below were formed sequentially on the ITO film of the transparent supporting substrate. A vacuum chamber was depressurized to $5\times10^{-4}$ Pa. First, HI was heated and vapor-deposited so as to have a film thickness of 40 nm. Subsequently, HAT-CN was heated and vapor-deposited so as to have a film thickness of 5 nm. Subsequently, HT-1 was heated and vapor-deposited so as to have a film thickness of 15 nm. Subsequently, HT-2 was heated and vapor-deposited so as to have a film thickness of 10 nm. Thus, a hole layer formed of four layers was formed. Subsequently, H-2 as a host, and compound (1A-2619) and compound (1C-2) as a dopant were simultaneously heated and vapor-deposited so as to have a film thickness of 20 nm. Thus, a light emitting layer was formed. The vapor deposition rate was regulated such that a weight ratio between compound (1A-2619) and compound (1C-2) was approximately 25:75, a weight ratio between H-2 as a host, and compound (1A-2619) and compound (1C-2) as a dopant was approximately 96:4. Moreover, ET-1 was heated and vapor-deposited so as to have a film thickness of 5 nm. Subsequently, ET-2 and Liq were simultaneously heated and vapor-deposited so as to have a film thickness of 25 nm to form an electron layer formed of two layers. The vapor deposition rate was regulated such that the weight ratio between ET-2 and Liq was approximately 50:50. The vapor deposition rate for each layer was 0.01 to 1 nm/sec. Thereafter, LiF was heated and vapor-deposited at a vapor deposition rate of 0.01 to 0.1 nm/sec so as to have a film thickness of 1 nm. Subsequently, aluminum was heated and vapor-deposited so as to have a film thickness of 100 nm. Thus, a negative electrode was formed to obtain an organic EL element.

A direct current voltage was applied using an ITO electrode as a positive electrode and a LiF/aluminum electrode as a negative electrode, and the characteristics at the time of light emission at 1000 cd/m$^2$ and the lifetime of the element were measured (Table 5B).

Example 14

An organic EL element was obtained by a method in accordance with that of Example 13 except that the weight ratio of the dopant between compound (1A-2619) and compound (1C-2) was changed to approximately 50:50 when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 5B).

Example 15

An organic EL element was obtained by a method in accordance with that of Example 13 except that the weight ratio of the dopant between compound (1A-2619) and compound (1C-2) was changed to approximately 75:25 when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 5B).

Comparative Example 9

An organic EL element was obtained by a method in accordance with that of Example 13 except that the compound (1A-2619) was used alone as a dopant when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 5B).

Comparative Example 10

An organic EL element was obtained by a method in accordance with that of Example 13 except that the compound (1C-2) was used alone as a dopant when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 5B).

The organic EL evaluation results of Examples 13 to 15 and Comparative Examples 9 and 10 are shown in Table 5B below.

TABLE 5B

| | Wavelength (nm) | Chromaticity (x, y) | Voltage (V) | External quantum efficiency | Element lifetime (hr) |
|---|---|---|---|---|---|
| Ex. 13 | 461 | (0.133, 0.085) | 3.6 | 9.2 | 120 |
| Ex. 14 | 461 | (0.132, 0.081) | 3.7 | 9.2 | 239 |
| Ex. 15 | 460 | (0.133, 0.077) | 3.7 | 9.4 | 241 |
| Com. Ex. 9 | 460 | (0.133, 0.075) | 3.6 | 8.4 | 179 |
| Com. Ex. 10 | 460 | (0.132, 0.089) | 3.6 | 8.1 | 80 |

The following Table 6A indicates a material composition of each layer in the organic EL elements manufactured according to Examples 16 to 18 and Comparative Examples 11 and 12.

TABLE 6A

| | Hole injection layer 1 (40 nm) | Hole injection layer 2 (5 nm) | Hole transport layer 1 (15 nm) | Hole transport layer 2 (10 nm) | Light emitting layer (20 nm) Host | Light emitting layer (20 nm) Dopant Compound (conc.) | Electron transport layer 1 (5 nm) | Electron transport layer 2 (25 nm) | Negative electrode (1 nm/ 100 nm) |
|---|---|---|---|---|---|---|---|---|---|
| Ex. 16 | HI | HAT-CN | HT-1 | HT-2 | H-2 | 1A-2619 (1 wt. %) 1C-2 (3 wt. %) | ET-3 | ET-4 + Liq | LiF/Al |
| Ex. 17 | HI | HAT-CN | HT-1 | HT-2 | H-2 | 1A-2619 (2 wt. %) 1C-2 (2 wt. %) | ET-3 | ET-4 + Liq | LiF/Al |
| Ex. 18 | HI | HAT-CN | HT-1 | HT-2 | H-2 | 1A-2619 (3 wt. %) 1C-2 (1 wt. %) | ET-3 | ET-4 + Liq | LiF/Al |
| Com. Ex. 11 | HI | HAT-CN | HT-1 | HT-2 | H-2 | 1A-2619 (4 wt. %) | ET-3 | ET-4 + Liq | LiF/Al |
| Com. Ex. 12 | HI | HAT-CN | HT-1 | HT-2 | H-2 | 1C-2 (4 wt. %) | ET-3 | ET-4 + Liq | LiF/Al |

The chemical structures of "ET-3" and "ET-4" in Table 6A are shown below.

(ET-3)

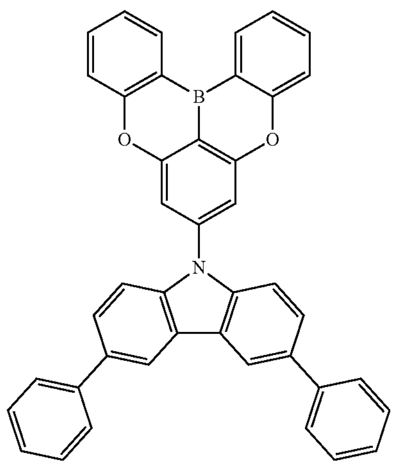

(ET-4)

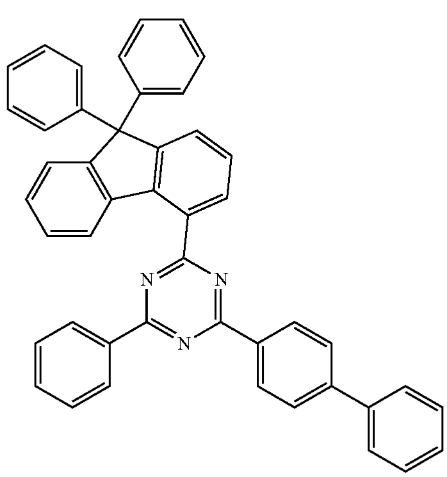

Example 16

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent support substrate was fixed to a substrate holder of a commercially available vapor deposition apparatus (manufactured by Chosyu Industry Co., Ltd.). Tantalum vapor deposition boats containing HI, HAT-CN, HT-1, HT-2, H-2, compound (1A-2619), compound (1C-2), ET-3, and ET-4, respectively, and aluminum nitride vapor deposition boats containing Liq, LiF, and aluminum, respectively, were attached thereto.

Layers as described below were formed sequentially on the ITO film of the transparent supporting substrate. A vacuum chamber was depressurized to $5\times10^{-4}$ Pa. First, HI was heated and vapor-deposited so as to have a film thickness of 40 nm. Subsequently, HAT-CN was heated and vapor-deposited so as to have a film thickness of 5 nm. Subsequently, HT-1 was heated and vapor-deposited so as to have a film thickness of 15 nm. Subsequently, HT-2 was heated and vapor-deposited so as to have a film thickness of 10 nm. Thus, a hole layer formed of four layers was formed. Subsequently, H-2 as a host, and compound (1A-2619) and compound (1C-2) as a dopant were simultaneously heated and vapor-deposited so as to have a film thickness of 20 nm. Thus, a light emitting layer was formed. The vapor deposition rate was regulated such that a weight ratio between compound (1A-2619) and compound (1C-2) was approximately 25:75, a weight ratio between H-2 as a host, and compound (1A-2619) and compound (1C-2) as a dopant was approximately 96:4. Moreover, ET-3 was heated and vapor-deposited so as to have a film thickness of 5 nm. Subsequently, ET-4 and Liq were simultaneously heated and vapor-deposited so as to have a film thickness of 25 nm to form an electron layer formed of two layers. The vapor deposition rate was regulated such that the weight ratio between ET-4 and Liq was approximately 50:50. The vapor deposition rate for each layer was 0.01 to 1 nm/sec. Thereafter, LiF was heated and vapor-deposited at a vapor deposition rate of 0.01 to 0.1 nm/sec so as to have a film thickness of 1 nm. Subsequently, aluminum was heated and vapor-deposited so as to have a film thickness of 100 nm. Thus, a negative electrode was formed to obtain an organic EL element.

A direct current voltage was applied using an ITO electrode as a positive electrode and a LiF/aluminum electrode as a negative electrode, and the characteristics at the time of light emission at 1000 cd/m$^2$ and the lifetime of the element were measured (Table 6B).

Example 17

An organic EL element was obtained by a method in accordance with that of Example 16 except that the weight ratio of the dopant between compound (1A-2619) and compound (1C-2) was changed to approximately 50:50 when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 6B).

Example 18

An organic EL element was obtained by a method in accordance with that of Example 16 except that the weight ratio of the dopant between compound (1A-2619) and compound (1C-2) was changed to approximately 75:25 when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 6B).

Comparative Example 11

An organic EL element was obtained by a method in accordance with that of Example 16 except that the compound (1A-2619) was used alone as a dopant when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 6B).

Comparative Example 12

An organic EL element was obtained by a method in accordance with that of Example 16 except that the compound (1C-2) was used alone as a dopant when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 6B).

The organic EL evaluation results of Examples 16 to 18 and Comparative Examples 11 and 12 are shown in Table 6B below.

TABLE 6B

| | Wavelength (nm) | Chromaticity (x, y) | Voltage (V) | External quantum efficiency | Element lifetime (hr) |
|---|---|---|---|---|---|
| Ex. 16 | 462 | (0.133, 0.088) | 3.8 | 8.9 | 97 |
| Ex. 17 | 461 | (0.133, 0.080) | 3.8 | 9.0 | 101 |
| Ex. 18 | 461 | (0.133, 0.079) | 3.7 | 8.9 | 111 |
| Com. Ex. 11 | 462 | (0.133, 0.074) | 3.8 | 8.2 | 79 |
| Com. Ex. 12 | 461 | (0.133, 0.092) | 3.7 | 8.0 | 22 |

The following Table 7A indicates a material composition of each layer in the organic EL elements manufactured according to Examples 19 to 21 and Comparative Examples 13 and 14.

TABLE 7A

| | Hole injection layer 1 (40 nm) | Hole injection layer 2 (5 nm) | Hole transport layer 1 (15 nm) | Hole transport layer 2 (10 nm) | Light emitting layer (20 nm) Host | Dopant Compound (conc.) | Electron transport layer 1 (5 nm) | Electron transport layer 2 (25 nm) | Negative electrode (1 nm/100 nm) |
|---|---|---|---|---|---|---|---|---|---|
| Ex. 19 | HI | HAT-CN | HT-1 | HT-2 | H-2 | 1B-1 (1 wt. %) 1B-101 (3 wt. %) | ET-1 | ET-2 + Liq | LiF/Al |
| Ex. 20 | HI | HAT-CN | HT-1 | HT-2 | H-2 | 1B-1 (2 wt. %) 1B-101 (2 wt. %) | ET-1 | ET-2 + Liq | LiF/Al |
| Ex. 21 | HI | HAT-CN | HT-1 | HT-2 | H-2 | 1B-1 (3 wt. %) 1B-101 (1 wt. %) | ET-1 | ET-2 + Liq | LiF/Al |
| Com. Ex. 13 | HI | HAT-CN | HT-1 | HT-2 | H-2 | 1B-1 (4 wt. %) | ET-1 | ET-2 + Liq | LiF/Al |
| Com. Ex. 14 | HI | HAT-CN | HT-1 | HT-2 | H-2 | IB-101 (4 wt. %) | ET-1 | ET-2 + Liq | LiF/Al |

Example 19

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent support substrate was fixed to a substrate holder of a commercially available vapor deposition apparatus (manufactured by Chosyu Industry Co., Ltd.). Tantalum vapor deposition boats containing HI, HAT-CN, HT-1, HT-2, H-2, compound (1B-1), compound (1B-101), ET-1, and ET-2, respectively, and aluminum nitride vapor deposition boats containing Liq, LiF, and aluminum, respectively, were attached thereto.

Layers as described below were formed sequentially on the ITO film of the transparent supporting substrate. A vacuum chamber was depressurized to $5\times10^{-4}$ Pa. First, HI was heated and vapor-deposited so as to have a film thickness of 40 nm. Subsequently, HAT-CN was heated and vapor-deposited so as to have a film thickness of 5 nm. Subsequently, HT-1 was heated and vapor-deposited so as to have a film thickness of 15 nm. Subsequently, HT-2 was heated and vapor-deposited so as to have a film thickness of 10 nm. Thus, a hole layer formed of four layers was formed. Subsequently, H-2 as a host, and compound (1B-1) and compound (1B-101) as a dopant were simultaneously heated and vapor-deposited so as to have a film thickness of 20 nm. Thus, a light emitting layer was formed. The vapor deposition rate was regulated such that a weight ratio between compound (1B-1) and compound (1B-101) was approximately 25:75, a weight ratio between H-2 as a host, and compound (1B-1) and compound (1B-101) as a dopant was approximately 96:4. Moreover, ET-1 was heated and vapor-deposited so as to have a film thickness of 5 nm. Subsequently, ET-2 and Liq were simultaneously heated and vapor-deposited so as to have a film thickness of 25 nm to form an electron layer formed of two layers. The vapor deposition rate was regulated such that the weight ratio between ET-2 and Liq was approximately 50:50. The vapor deposition rate for each layer was 0.01 to 1 nm/sec. Thereafter, LiF was heated and vapor-deposited at a vapor deposition rate of 0.01 to 0.1 nm/sec so as to have a film thickness of 1 nm. Subsequently, aluminum was heated and vapor-deposited so as to have a film thickness of 100 nm. Thus, a negative electrode was formed to obtain an organic EL element.

A direct current voltage was applied using an ITO electrode as a positive electrode and a LiF/aluminum electrode as a negative electrode, and the characteristics at the time of light emission at 1000 cd/m$^2$ and the lifetime of the element were measured (Table 7B).

Example 20

An organic EL element was obtained by a method in accordance with that of Example 19 except that the weight ratio of the dopant between compound (1B-1) and compound (1B-101) was changed to approximately 50:50 when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 7B).

Example 21

An organic EL element was obtained by a method in accordance with that of Example 19 except that the weight ratio of the dopant between compound (1B-1) and compound (1B-101) was changed to approximately 75:25 when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 7B).

Comparative Example 13

An organic EL element was obtained by a method in accordance with that of Example 19 except that the compound (1B-1) was used alone as a dopant when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 7B).

Comparative Example 14

An organic EL element was obtained by a method in accordance with that of Example 19 except that the compound (1B-101) was used alone as a dopant when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 7B).

The organic EL evaluation results of Examples 19 to 21 and Comparative Examples 13 and 14 are shown in Table 7B below.

TABLE 7B

| | Wavelength (nm) | Chromaticity (x, y) | Voltage (V) | External quantum efficiency | Element lifetime (hr) |
|---|---|---|---|---|---|
| Ex. 19 | 461 | (0.132, 0.113) | 3.6 | 8.2 | 190 |
| Ex. 20 | 460 | (0.134, 0.104) | 3.6 | 8.1 | 233 |
| Ex. 21 | 458 | (0.135, 0.086) | 3.5 | 7.7 | 253 |
| Com. Ex. 13 | 455 | (0.140, 0.068) | 3.6 | 6.9 | 89 |
| Com. Ex. 14 | 463 | (0.131, 0.121) | 3.5 | 6.7 | 70 |

The following Table 8A indicates a material composition of each layer in the organic EL elements manufactured according to Examples 22 to 24 and Comparative Examples 15 and 16.

TABLE 8A

| | Hole injection layer 1 (40 nm) | Hole injection layer 2 (5 nm) | Hole transport layer 1 (15 nm) | Hole transport layer 2 (10 nm) | Light emitting layer (20 nm) Host | Dopant Compound (conc.) | Electron transport layer 1 (5 nm) | Electron transport layer 2 (25 nm) | Negative electrode (1 nm/ 100 nm) |
|---|---|---|---|---|---|---|---|---|---|
| Ex. 22 | HI | HAT-CN | HT-1 | HT-2 | H-2 | 1C-2 (1 wt. %) 1C-10 (3 wt. %) | ET-1 | ET-2 + Liq | LiF/Al |
| Ex. 23 | HI | HAT-CN | HT-1 | HT-2 | H-2 | 1C-2 (2 wt. %) 1C-10 (2 wt. %) | ET-1 | ET-2 + Liq | LiF/Al |
| Ex. 24 | HI | HAT-CN | HT-1 | HT-2 | H-2 | 1C-2 (3 wt. %) 1C-10 (1 wt. %) | ET-1 | ET-2 + Liq | LiF/Al |
| Com. Ex. 15 | HI | HAT-CN | HT-1 | HT-2 | H-2 | 1C-2 (4 wt. %) | ET-1 | ET-2 + Liq | LiF/Al |
| Com. Ex. 16 | HI | HAT-CN | HT-1 | HT-2 | H-2 | 1C-10 (4 wt. %) | ET-1 | ET-2 + Liq | LiF/Al |

Example 22

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent support substrate was fixed to a substrate holder of a commercially available vapor deposition apparatus (manufactured by Chosyu Industry Co., Ltd.). Tantalum vapor deposition boats containing HI, HAT-CN, HT-1, HT-2, H-2, compound (1C-2), compound (1C-10), ET-1, and ET-2, respectively, and aluminum nitride vapor deposition boats containing Liq, LiF, and aluminum, respectively, were attached thereto.

Layers as described below were formed sequentially on the ITO film of the transparent supporting substrate. A vacuum chamber was depressurized to $5\times10^{-4}$ Pa. First, HI was heated and vapor-deposited so as to have a film thickness of 40 nm. Subsequently, HAT-CN was heated and vapor-deposited so as to have a film thickness of 5 nm. Subsequently, HT-1 was heated and vapor-deposited so as to have a film thickness of 15 nm. Subsequently, HT-2 was heated and vapor-deposited so as to have a film thickness of 10 nm. Thus, a hole layer formed of four layers was formed. Subsequently, H-2 as a host, and compound (1C-2) and compound (1C-10) as a dopant were simultaneously heated and vapor-deposited so as to have a film thickness of 20 nm. Thus, a light emitting layer was formed. The vapor deposition rate was regulated such that a weight ratio between compound (1C-2) and compound (1C-10) was approximately 25:75, a weight ratio between H-1 as a host, and compound (1C-2) and compound (1C-10) as a dopant was approximately 96:4. Moreover, ET-1 was heated and vapor-deposited so as to have a film thickness of 5 nm. Subsequently, ET-2 and Liq were simultaneously heated and vapor-deposited so as to have a film thickness of 25 nm to form an electron layer formed of two layers. The vapor deposition rate was regulated such that the weight ratio between ET-2 and Liq was approximately 50:50. The vapor deposition rate for each layer was 0.01 to 1 nm/sec. Thereafter, LiF was heated and vapor-deposited at a vapor deposition rate of 0.01 to 0.1 nm/sec so as to have a film thickness of 1 nm. Subsequently, aluminum was heated and vapor-deposited so as to have a film thickness of 100 nm. Thus, a negative electrode was formed to obtain an organic EL element.

A direct current voltage was applied using an ITO electrode as a positive electrode and a LiF/aluminum electrode as a negative electrode, and the characteristics at the time of light emission at 1000 cd/m$^2$ and the lifetime of the element were measured (Table 8B).

Example 23

An organic EL element was obtained by a method in accordance with that of Example 22 except that the weight ratio of the dopant between compound (1C-2) and compound (1C-10) was changed to approximately 50:50 when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 8B).

Example 24

An organic EL element was obtained by a method in accordance with that of Example 22 except that the weight ratio of the dopant between compound (1C-2) and compound (1C-10) was changed to approximately 75:25 when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 8B).

Comparative Example 15

An organic EL element was obtained by a method in accordance with that of Example 22 except that the compound (1C-2) was used alone as a dopant when forming the light emitting layer. A direct current voltage was applied using an ITO electrode as a positive electrode and a LiF/aluminum electrode as a negative electrode, and the characteristics at the time of light emission at 1000 cd/m$^2$ and the lifetime of the element were measured (Table 8B).

Comparative Example 16

An organic EL element was obtained by a method in accordance with that of Example 22 except that the compound (1C-10) was used alone as a dopant when forming the light emitting layer. A direct current voltage was applied using an ITO electrode as a positive electrode and a LiF/aluminum electrode as a negative electrode, and the characteristics at the time of light emission at 1000 cd/$m^2$ and the lifetime of the element were measured (Table 8B).

The organic EL evaluation results of Examples 22 to 24 and Comparative Examples 15 and 16 are shown in Table 8B below.

TABLE 8B

| | Wavelength (nm) | Chromaticity (x, y) | Voltage (V) | External quantum efficiency | Element lifetime (hr) |
|---|---|---|---|---|---|
| Ex. 22 | 460 | (0.132, 0.101) | 3.6 | 8.9 | 121 |
| Ex. 23 | 461 | (0.132, 0.099) | 3.6 | 9.1 | 109 |
| Ex. 24 | 461 | (0.132, 0.093) | 3.6 | 8.8 | 99 |
| Com. Ex. 15 | 461 | (0.132, 0.090) | 3.6 | 8.1 | 35 |
| Com. Ex. 16 | 460 | (0.132, 0.107) | 3.6 | 8.0 | 70 |

The following Table 9A indicates a material composition of each layer in the organic EL elements manufactured according to Examples 25 to 27 and Comparative Examples 17 and 18.

TABLE 9A

| | Hole injection layer 1 (40 nm) | Hole injection layer 2 (5 nm) | Hole transport layer 1 (15 nm) | Hole transport layer 2 (10 nm) | Light emitting layer (20 nm) Host | Light emitting layer (20 nm) Dopant Compound (conc.) | Electron transport layer 1 (5 nm) | Electron transport layer 2 (25 nm) | Negative electrode (1 nm/100 nm) |
|---|---|---|---|---|---|---|---|---|---|
| Ex.25 | HI | HAT-CN | HT-1 | HT-2 | H-2 | 1A-2619 (1 wt. %) 1E-1 (3 wt. %) | ET-1 | ET-2 + Liq | LiF/Al |
| Ex.26 | HI | HAT-CN | HT-1 | HT-2 | H-2 | 1A-2619 (2 wt. %) 1E-1 (2 wt. %) | ET-1 | ET-2 + Liq | LiF/Al |
| Ex.27 | HI | HAT-CN | HT-1 | HT-2 | H-2 | 1A-2619 (3 wt. %) 1E-1 (1 wt. %) | ET-1 | ET-2 + Liq | LiF/Al |
| Com. Ex.17 | HI | HAT-CN | HT-1 | HT-2 | H-2 | 1A-2619 (4 wt. %) | ET-1 | ET-2 + Liq | LiF/Al |
| Com. Ex.18 | HI | HAT-CN | HT-1 | HT-2 | H-2 | 1E-1 (4 wt. %) | ET-1 | ET-2 + Liq | LiF/Al |

Example 25

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent support substrate was fixed to a substrate holder of a commercially available vapor deposition apparatus (manufactured by Chosyu Industry Co., Ltd.). Tantalum vapor deposition boats containing HI, HAT-CN, HT-1, HT-2, H-2, compound (1A-2619), compound (1E-1), ET-1, and ET-2, respectively, and aluminum nitride vapor deposition boats containing Liq, LiF, and aluminum, respectively, were attached thereto.

Layers as described below were formed sequentially on the ITO film of the transparent supporting substrate. A vacuum chamber was depressurized to $5\times10^{-4}$ Pa. First, HI was heated and vapor-deposited so as to have a film thickness of 40 nm. Subsequently, HAT-CN was heated and vapor-deposited so as to have a film thickness of 5 nm. Subsequently, HT-1 was heated and vapor-deposited so as to have a film thickness of 15 nm. Subsequently, HT-2 was heated and vapor-deposited so as to have a film thickness of 10 nm. Thus, a hole layer formed of four layers was formed. Subsequently, H-2 as a host, and compound (1A-2619) and compound (1E-1) as a dopant were simultaneously heated and vapor-deposited so as to have a film thickness of 20 nm. Thus, a light emitting layer was formed. The vapor deposition rate was regulated such that a weight ratio between compound (1A-2619) and compound (1E-1) was approximately 25:75, a weight ratio between H-2 as a host, and compound (1A-2619) and compound (1E-1) as a dopant was approximately 96:4. Moreover, ET-1 was heated and vapor-deposited so as to have a film thickness of 5 nm. Subsequently, ET-2 and Liq were simultaneously heated and vapor-deposited so as to have a film thickness of 25 nm to form an electron layer formed of two layers. The vapor deposition rate was regulated such that the weight ratio between ET-2 and Liq was approximately 50:50. The vapor deposition rate for each layer was 0.01 to 1 nm/sec. Thereafter, LiF was heated and vapor-deposited at a vapor deposition rate of 0.01 to 0.1 nm/sec so as to have a film thickness of 1 nm. Subsequently, aluminum was heated and vapor-deposited so as to have a film thickness of 100 nm. Thus, a negative electrode was formed to obtain an organic EL element.

A direct current voltage was applied using an ITO electrode as a positive electrode and a LiF/aluminum electrode as a negative electrode, and the characteristics at the time of light emission at 1000 cd/$m^2$ and the lifetime of the element were measured (Table 9B).

Example 26

An organic EL element was obtained by a method in accordance with that of Example 25 except that the weight ratio of the dopant between compound (1A-2619) and compound (1E-1) was changed to approximately 50:50 when forming the light emitting layer. A direct current voltage was applied using an ITO electrode as a positive electrode and a LiF/aluminum electrode as a negative electrode, and the characteristics at the time of light emission at 1000 cd/$m^2$ and the lifetime of the element were measured (Table 9B).

Example 27

An organic EL element was obtained by a method in accordance with that of Example 25 except that the weight ratio of the dopant between compound (1A-2619) and compound (1E-1) was changed to approximately 75:25 when forming the light emitting layer. A direct current voltage was applied using an ITO electrode as a positive electrode and a LiF/aluminum electrode as a negative electrode, and the characteristics at the time of light emission at 1000 cd/$m^2$ and the lifetime of the element were measured (Table 9B).

Comparative Example 17

An organic EL element was obtained by a method in accordance with that of Example 25 except that the compound (1A-2619) was used alone as a dopant when forming the light emitting layer. A direct current voltage was applied using an ITO electrode as a positive electrode and a LiF/aluminum electrode as a negative electrode, and the characteristics at the time of light emission at 1000 cd/$m^2$ and the lifetime of the element were measured (Table 9B).

Comparative Example 18

An organic EL element was obtained by a method in accordance with that of Example 25 except that the compound (1E-1) was used alone as a dopant when forming the light emitting layer. A direct current voltage was applied using an ITO electrode as a positive electrode and a LiF/aluminum electrode as a negative electrode, and the characteristics at the time of light emission at 1000 cd/$m^2$ and the lifetime of the element were measured (Table 9B).

The organic EL evaluation results of Examples 25 to 27 and Comparative Examples 17 and 18 are shown in Table 9B below.

TABLE 9B

| | Wavelength (nm) | Chromaticity (x, y) | Voltage (V) | External quantum efficiency | Element lifetime (hr) |
|---|---|---|---|---|---|
| Ex. 25 | 453 | (0.138, 0.069) | 3.8 | 9.0 | 199 |
| Ex. 26 | 455 | (0.136, 0.071) | 3.7 | 8.9 | 231 |
| Ex. 27 | 459 | (0.134, 0.076) | 3.7 | 8.8 | 240 |
| Com. Ex. 17 | 461 | (0.132, 0.077) | 3.6 | 8.2 | 172 |
| Com. Ex. 18 | 449 | (0.140, 0.066) | 3.8 | 8.1 | 58 |

According to a preferred embodiment of the present invention, an organic EL device having excellent quantum efficiency and lifetime characteristics can be provided by inclusion of two or more compounds in which a plurality of aromatic rings is linked to each other with a boron atom, a nitrogen atom, an oxygen atom, or the like in a light emitting layer.

REFERENCE NUMERALS OF FIGURES

100 Organic electroluminescent element
101 Substrate
102 Positive electrode
103 Hole injection layer
104 Hole transport layer
105 Light emitting layer
106 Electron transport layer
107 Electron injection layer
108 Negative electrode

The invention claimed is:

1. An organic electroluminescent element comprising: a pair of electrodes comprising a positive electrode and a negative electrode; and a light emitting layer disposed between the pair of electrodes, wherein the light emitting layer comprises, as a dopant, at least two polycyclic aromatic compounds and/or multimers selected from the group consisting of a polycyclic aromatic compound represented by the following formula (1) and a multimer of a polycyclic aromatic compound having a plurality of structures each represented by the following formula (1), (1)

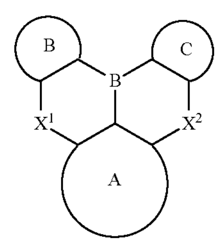

wherein:

ring A, ring B, and ring C each independently represent an aryl ring or a heteroaryl ring, and at least one hydrogen atom in these rings may be substituted, $X^1$ and $X^2$ each independently represent >O, >N—R, >S, >Se, or >C(—Ra)$_2$, R of the >N—R represents an optionally substituted aryl, an optionally substituted heteroaryl or an optionally substituted alkyl, R of the >N—R may be bonded to the ring A, ring B, and/or ring C with a linking group or a single bond, and Ra of the >C(—Ra)$_2$ represents a linear or branched alkyl starting from a methylene group, represented by formula $—CH_2—C_{n-1}H_{2(n-1)+1}$ wherein n is 1 or more, and at least one hydrogen atom in the compound represented by formula (1) or the multimer of the compound having the plurality of structures each represented by formula (1) may be substituted by a deuterium atom.

2. The organic electroluminescent element according to claim 1, wherein the polycyclic aromatic compound and the multimer thereof are selected from the group consisting of a polycyclic aromatic compound represented by the following formula (1A), a polycyclic aromatic represented by the following formula (1B), a polycyclic aromatic represented by the following formula (1C), a polycyclic aromatic represented by the following formula (1D), a polycyclic aromatic represented by the following formula (1E), and a multimer of a polycyclic aromatic compound having a plurality of structures each represented by any one of the following formulas (1A), (1B), (1C), (1D) and (1E), (1A)

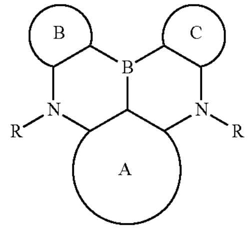

(1B)

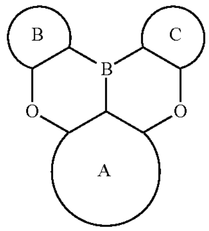

(1C)

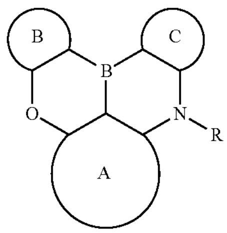

(1D)

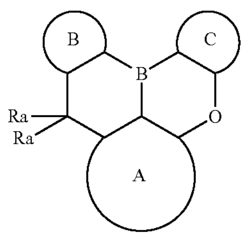

(1E)

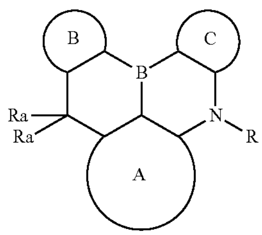

wherein:

ring A, ring B, and ring C each independently represent an aryl ring or a heteroaryl ring, and at least one hydrogen atom in these rings may be substituted, R of >N—R independently represents an optionally substituted aryl, an optionally substituted heteroaryl or an optionally substituted alkyl, and the R may be bonded to the ring A, ring B, and/or ring C with a linking group or a single bond, Ra of $>C(—Ra)_2$ represents a linear or branched alkyl starting from a methylene group, represented by formula $—CH_2—C_{n-1}H_{2(n-1)+1}$ wherein n is 1 or more, and at least one hydrogen atom in the compound represented by any one of formulas (1A), (1B), (1C), (1D) and (1E), or the multimer of the compound having the plurality of structures each represented by any one of formulas (1A), (1B), (1C), (1D) and (1E) may be substituted by a deuterium atom.

3. The organic electroluminescent element according to claim 2, wherein the ring A, ring B, and ring C each independently represent an aryl ring or a heteroaryl ring, and at least one hydrogen atom in these rings may be substituted by a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino, a substituted or unsubstituted alkyl, a substituted or unsubstituted alkoxy, a trialkylsilyl, a substituted or unsubstituted aryloxy, cyano, or a halogen atom, R of the >N—R represents an aryl optionally substituted by an alkyl or a heteroaryl or an alkyl optionally substituted by an alkyl, the R may be bonded to the ring A, ring B, and/or ring C with —O—, —S—, $—C(—R)_2—$, or a single bond, and R of the $—C(—R)_2—$ represents a hydrogen atom or an alkyl, Ra of the $>C(—Ra)_2$ represents a linear or branched alkyl starting from a methylene group, represented by formula $—CH_2—C_{n-1}H_{2(n-1)+1}$ wherein n is 1 to 6, at least one hydrogen atom in a compound or a structure represented by any one of formulas (1A), (1B), (1C), (1D) and (1E) may be substituted by a deuterium atom, and in a case of a multimer, the multimer is a dimer or a trimer having two or three structures each represented by any one of formulas (1A), (1B), (1C), (1D) and (1E).

4. The organic electroluminescent element according to claim 2, wherein the polycyclic aromatic compound represented by the formula (1A) or a multimer thereof is a polycyclic aromatic compound represented by the following formula (1A') or a multimer thereof, (1A')

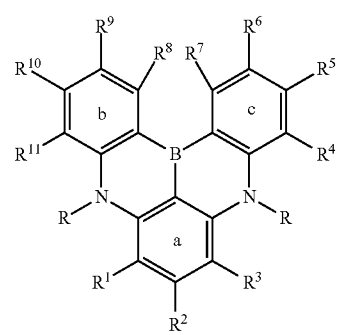

wherein:

$R^1$, $R^2$, $R^3$, $R^4$, $R^5$, $R^6$, $R^7$, $R^8$, $R^9$, $R^{10}$ and $R^{11}$ each independently represent a hydrogen atom, an aryl, a heteroaryl, a diarylamino, a diheteroarylamino, an arylheteroarylamino, an alkyl, an alkoxy, an aryloxy, cyano, or a halogen atom, at least one hydrogen atom in these may be substituted by an aryl, a heteroaryl, or an alkyl, adjacent groups of $R^1$, $R^2$, $R^3$, $R^4$, $R^5$, $R^6$, $R^7$, $R^8$, $R^9$, $R^{10}$ and $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, an aryloxy, cyano, or a halogen atom, and at least one hydrogen atom in these may be substituted by an aryl, a heteroaryl, or an alkyl, R of >N—R independently represents an aryl having 6 to 12 carbon atoms, a heteroaryl having 2 to 15 carbon atoms, or an alkyl having 1 to 6 carbon atoms, the R may be bonded to the ring a, ring b, and/or ring c with —O—, —S—, —C(—R)$_2$—, or a single bond, and R of the —C(—R)$_2$— represents an alkyl having 1 to 6 carbon atoms, and at least one hydrogen atom in the compound represented by formula (1A') or the multimer thereof may be substituted by a deuterium atom.

5. The organic electroluminescent element according to claim 4, wherein:

$R^1$, $R^2$, $R^3$, $R^4$, $R^5$, $R^6$, $R^7$, $R^8$, $R^9$, $R^{10}$ and $R^{11}$ each independently represent a hydrogen atom, an aryl having 6 to 30 carbon atoms, or a heteroaryl or diarylamino having 2 to 30 carbon atoms, wherein the aryl is an aryl having 6 to 12 carbon atoms, adjacent groups of $R^1$, $R^2$, $R^3$, $R^4$, $R^5$, $R^6$, $R^7$, $R^8$, $R^9$, $R^{10}$ and $R^{11}$ may be bonded to each other to form an aryl ring having 9 to 16 carbon atoms or a heteroaryl ring having 6 to 15 carbon atoms together with ring a, ring b, or ring c, and at least one hydrogen atom in the ring thus formed may be substituted by an aryl having 6 to 10 carbon atoms, R of >N—R independently represents an aryl having 6 to 10 carbon atoms, and at least one hydrogen atom in the compound represented by formula (1A') or the multimer thereof may be substituted by a deuterium atom.

6. The organic electroluminescent element according to claim 4, wherein the compound represented by the above-formula (1A') is represented by at least one structural formula selected from the group consisting of:

(1A-2619)

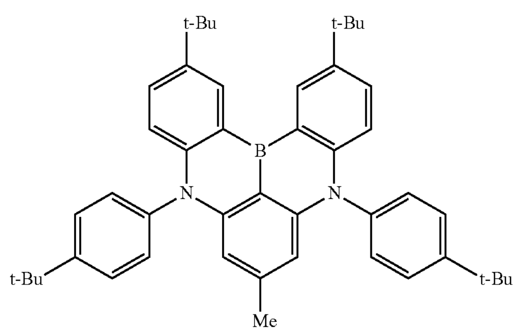

(1A-2621)

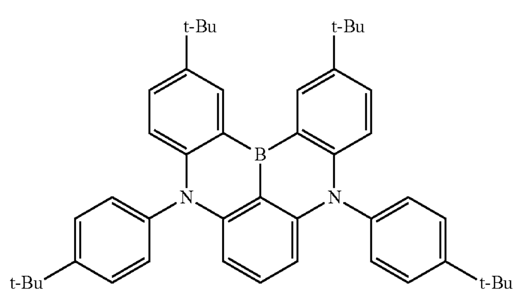

-continued (1A-2687)

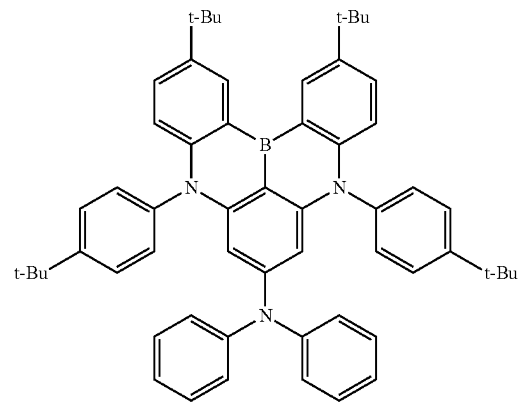

(1A-2688)

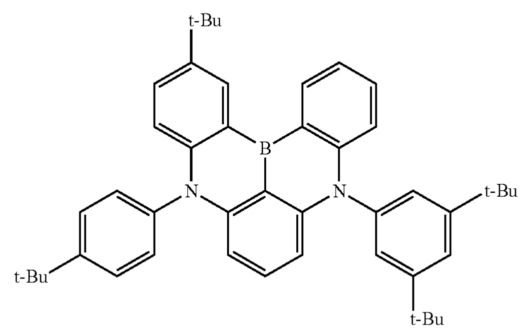

(1A-2689)

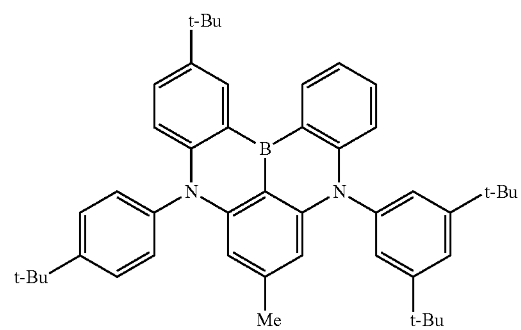

(1A-2679)

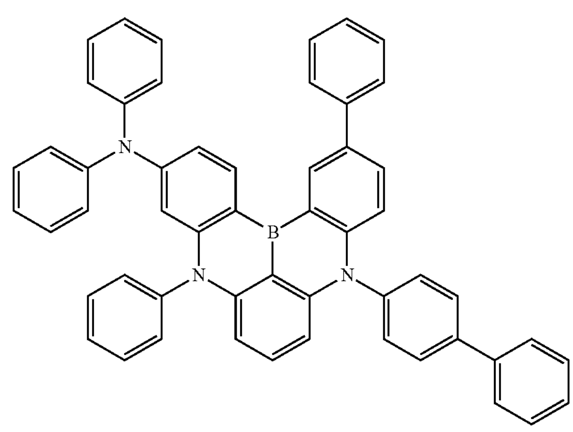

-continued (1A-1152)

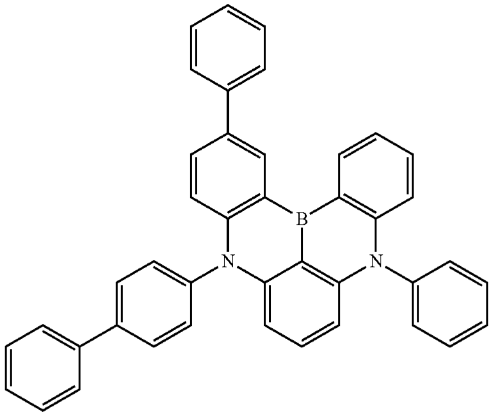

(1A-2680)

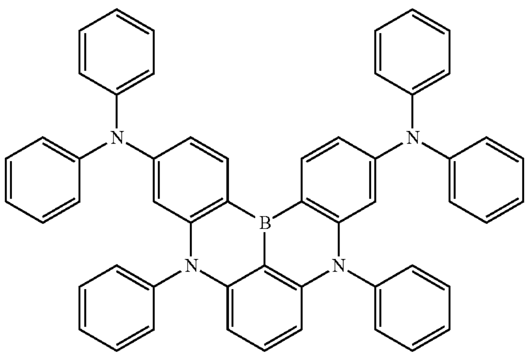

and (1A-2676)

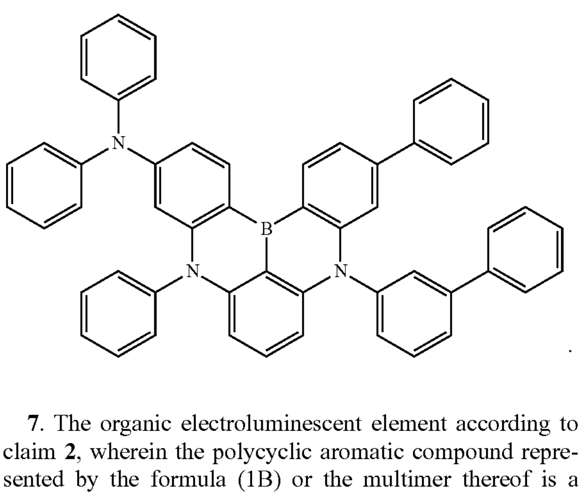

7. The organic electroluminescent element according to claim 2, wherein the polycyclic aromatic compound represented by the formula (1B) or the multimer thereof is a polycyclic aromatic compound represented by the following formula (1B') or formula (1B") or a multimer thereof, (1B′)

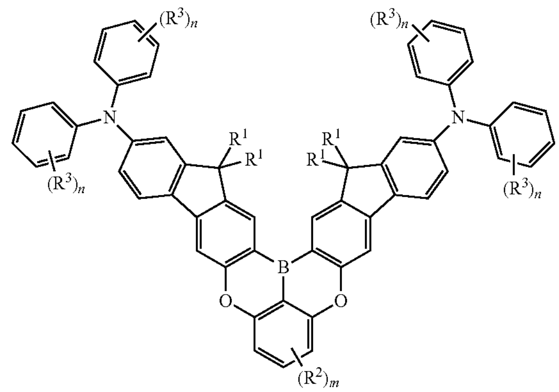

(1B″)

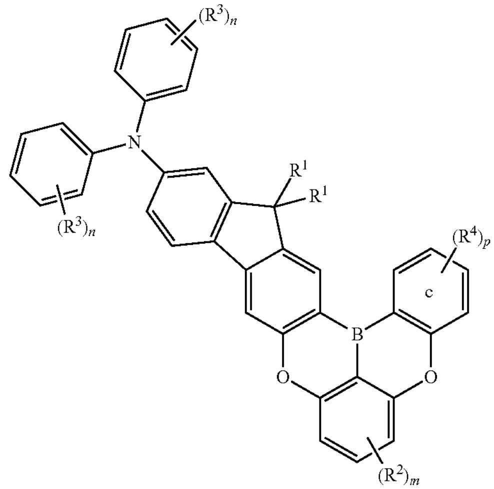

wherein:

$R^1$, $R^2$, $R^3$ and $R^4$ each independently represent a hydrogen atom, an aryl, a heteroaryl, an alkyl, an alkoxy, a trialkylsilyl, an aryloxy, cyano, or a halogen atom, and at least one hydrogen atom in these may be substituted by an aryl, a heteroaryl, an alkyl, cyano, or a halogen atom, in a case where there is a plurality of $R^4$'s, adjacent $R^4$'s may be bonded to each other to form an aryl ring or a heteroaryl ring together with ring c, at least one hydrogen atom in the ring thus formed may be substituted by an aryl, a heteroaryl, an alkyl, an alkoxy, a trialkylsilyl, an aryloxy, cyano, or a halogen atom, and at least one hydrogen atom in these may be substituted by an aryl, a heteroaryl, an alkyl, cyano, or a halogen atom, and m represents an integer of 0 to 3, n's each independently represent an integer of 0 to 5, and p represents an integer of 0 to 4.

8. The organic electroluminescent element according to claim 7, wherein:

$R^1$'s each independently represent a hydrogen atom, an aryl having 6 to 30 carbon atoms, or an alkyl having 1 to 24 carbon atoms, $R^2$, $R^3$ and $R^4$ each independently represent a hydrogen atom, an aryl having 6 to 30 carbon atoms, a heteroaryl having 2 to 30 carbon atoms, an alkyl having 1 to 24 carbon atoms, an alkoxy having 1 to 24 carbon atoms, a trialkylsilyl having an alkyl having 1 to 4 carbon atoms, or an aryloxy having 6 to 30 carbon atoms, and at least one hydrogen atom in these may be substituted by an aryl having 6 to 16 carbon atoms, a heteroaryl having 2 to 25 carbon atoms, or an alkyl having 1 to 18 carbon atoms, and m represents an integer of 0 to 3, n's each independently represent an integer of 0 to 5, and p represents an integer of 0 to 2.

9. The organic electroluminescent element according to claim 7, wherein the compound represented by formula (1B') is represented by the following formula (1B-1):

(1B-1)

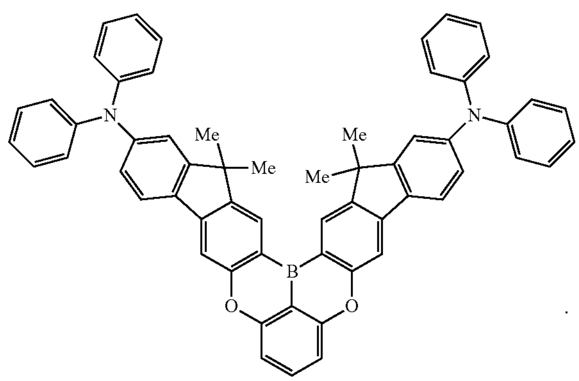

10. The organic electroluminescent element according to claim 2, wherein the polycyclic aromatic compound represented by the formula (1B) or the multimer thereof is a polycyclic aromatic compound represented by the following formula ($1B^{3\prime}$) or formula ($1B^{4\prime}$), or a multimer thereof, ($1B^{3\prime}$)

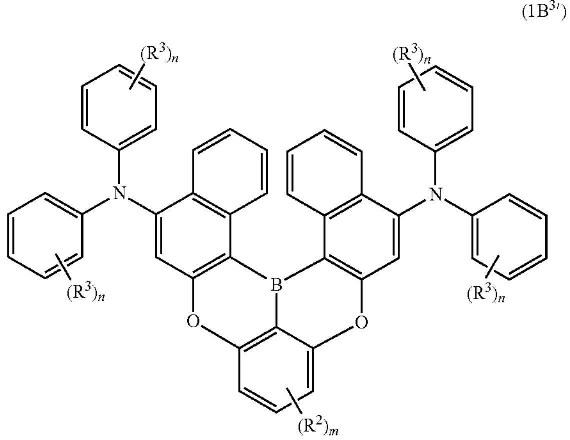

-continued ($1B^{4\prime}$)

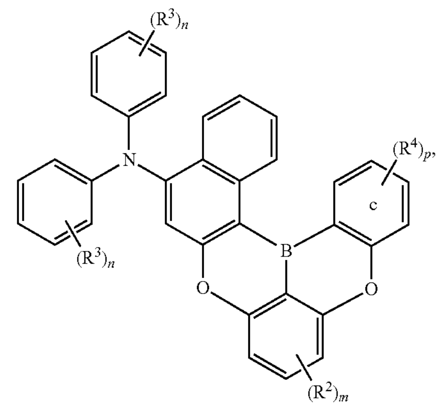

$R^2$, $R^3$ and $R^4$ each independently represent a hydrogen atom, an aryl, a heteroaryl, an alkyl, an alkoxy, a trialkylsilyl, an aryloxy, cyano, or a halogen atom, and at least one hydrogen atom in these may be substituted by an aryl, a heteroaryl, an alkyl, cyano, or a halogen atom, in a case where there is a plurality of $R^4$'s, adjacent $R^4$'s may be bonded to each other to form an aryl ring or a heteroaryl ring together with ring c, at least one hydrogen atom in the ring thus formed may be substituted by an aryl, a heteroaryl, an alkyl, an alkoxy, a trialkylsilyl, an aryloxy, cyano, or a halogen atom, and at least one hydrogen atom in these may be substituted by an aryl, a heteroaryl, an alkyl, cyano, or a halogen atom, and m represents an integer of 0 to 3, n's each independently represent an integer of 0 to 5, and p represents an integer of 0 to 4.

11. The organic electroluminescent element according to claim 10, wherein:

$R^2$, $R^3$ and $R^4$ each independently represent a hydrogen atom, an aryl having 6 to 30 carbon atoms, a heteroaryl having 2 to 30 carbon atoms, an alkyl having 1 to 24 carbon atoms, an alkoxy having 1 to 24 carbon atoms, a trialkylsilyl having an alkyl having 1 to 4 carbon atoms, or an aryloxy having 6 to 30 carbon atoms, and at least one hydrogen atom in these may be substituted by an aryl having 6 to 16 carbon atoms, a heteroaryl having 2 to 25 carbon atoms, or an alkyl having 1 to 18 carbon atoms, and m represents an integer of 0 to 3, n's each independently represent an integer of 0 to 5, and p represents an integer of 0 to 2.

12. The organic electroluminescent element according to claim 10, wherein the compound represented by formula ($1B^{3\prime}$) is represented by the following formula (1B-101):

(1B-101)

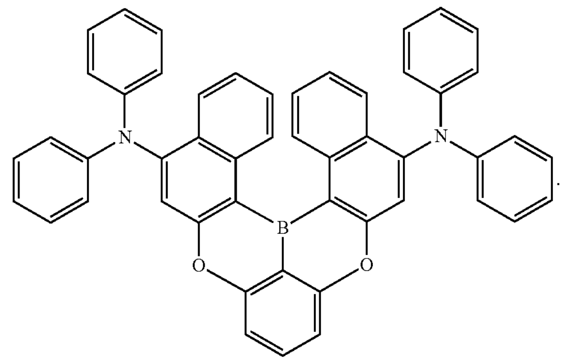

13. The organic electroluminescent element according to claim 2, wherein the polycyclic aromatic compound represented by the formula (1C) or the multimer thereof is a polycyclic aromatic compound represented by the following formula (1C') or formula (1C") or a multimer thereof, (IC')

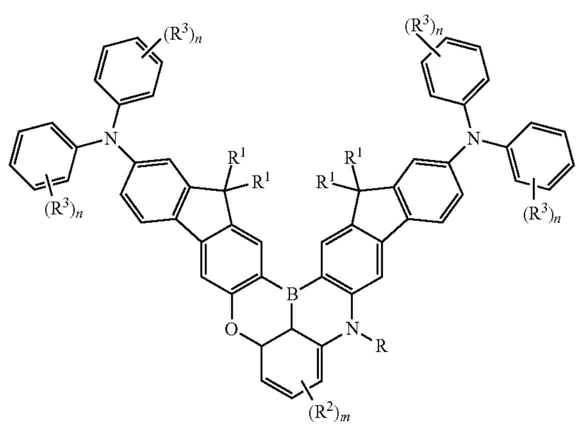

(IC")

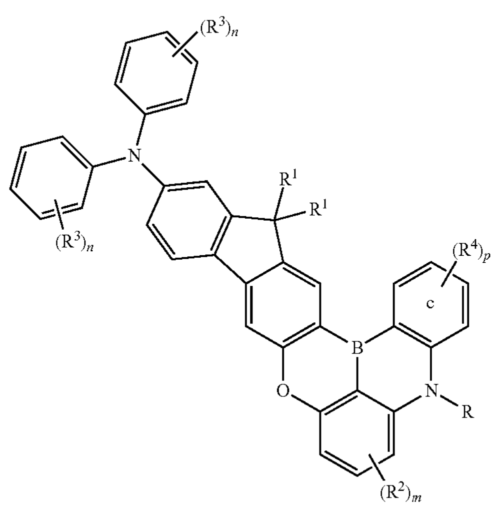

wherein:

$R^1$, $R^2$, $R^3$ and $R^4$ each independently represent a hydrogen atom, an aryl, a heteroaryl, an alkyl, an alkoxy, a trialkylsilyl, an aryloxy, cyano, or a halogen atom, and at least one hydrogen atom in these may be substituted by an aryl, a heteroaryl, an alkyl, cyano, or a halogen atom, in a case where there is a plurality of $R^4$'s, adjacent $R^4$'s may be bonded to each other to form an aryl ring or a heteroaryl ring together with ring c, at least one hydrogen atom in the ring thus formed may be substituted by an aryl, a heteroaryl, an alkyl, an alkoxy, a trialkylsilyl, an aryloxy, cyano, or a halogen atom, and at least one hydrogen atom in these may be substituted by an aryl, a heteroaryl, an alkyl, cyano, or a halogen atom, m represents an integer of 0 to 3, n's each independently represent an integer of 0 to 6, and p represents an integer of 0 to 4, and R of >N—R represents an aryl having 6 to 12 carbon atoms, a heteroaryl having 2 to 15 carbon atoms, or an alkyl having 1 to 6 carbon atoms.

14. The organic electroluminescent element according to claim 13, wherein:

$R^1$'s each independently represent a hydrogen atom, an aryl having 6 to 30 carbon atoms, or an alkyl having 1 to 24 carbon atoms, $R^2$ to $R^4$ each independently represent a hydrogen atom, an aryl having 6 to 30 carbon atoms, a heteroaryl having 2 to 30 carbon atoms, an alkyl having 1 to 24 carbon atoms, an alkoxy having 1 to 24 carbon atoms, a trialkylsilyl having an alkyl having 1 to 4 carbon atoms, or an aryloxy having 6 to 30 carbon atoms, and at least one hydrogen atom in these may be substituted by an aryl having 6 to 16 carbon atoms, a heteroaryl having 2 to 25 carbon atoms, or an alkyl having 1 to 18 carbon atoms, m represents an integer of 0 to 3, n's each independently represent an integer of 0 to 6, and p represents an integer of 0 to 2, and R of N—R represents an aryl having 6 to 10 carbon atoms, a heteroaryl having 2 to 10 carbon atoms, or an alkyl having 1 to 4 carbon atoms.

15. The organic electroluminescent element according to claim 13, wherein the compound represented by formula (1C") is represented by the following formula (1C-2) or formula (1C-10):

(1C-2)

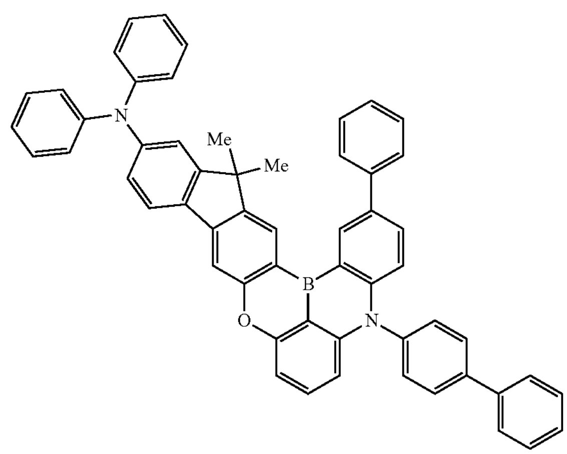

-continued (1C-10)

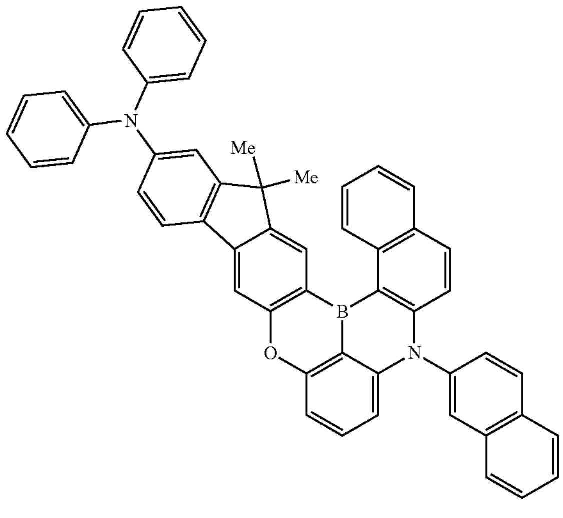

16. The organic electroluminescent element according to claim 2, wherein the polycyclic aromatic compound represented by formula (1D) or the multimer thereof is a polycyclic aromatic compound represented by the following formula (1D') or a multimer thereof, (1D')

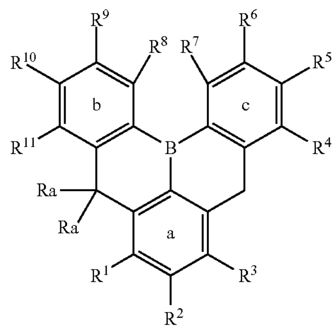

wherein:

$R^1$, $R^2$, $R^3$, $R^4$, $R^5$, $R^6$, $R^7$, $R^8$, $R^9$, $R^{10}$ and $R^{11}$ each independently represent a hydrogen atom, an aryl, a heteroaryl, a diarylamino, a diheteroarylamino, an arylheteroarylamino, an alkyl, an alkoxy, an aryloxy, cyano, or a halogen atom, at least one hydrogen atom in these may be substituted by an aryl, a heteroaryl, an alkyl, cyano, or a halogen atom, adjacent groups of $R^1$, $R^2$, $R^3$, $R^4$, $R^5$, $R^6$, $R^7$, $R^8$, $R^9$, $R^{10}$ and $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, an aryloxy, cyano, or a halogen atom, and at least one hydrogen atom in these may be substituted by an aryl, a heteroaryl, an alkyl, cyano, or a halogen atom, Ra represents a linear or branched alkyl starting from a methylene group, represented by formula $—CH_2—C_{n-1}H_{2(n-1)+1}$ wherein n is 1 to 6, and in a case of a multimer of a polycyclic aromatic compound, the multimer is a dimer or a trimer having two or three structures each represented by the formula (1D').

17. The organic electroluminescent element according to claim 16, wherein:

$R^1$, $R^2$, $R^3$, $R^4$, $R^5$, $R^6$, $R^7$, $R^8$, $R^9$, $R^{10}$ and $R^{11}$ each independently represent a hydrogen atom, an aryl having 6 to 30 carbon atoms, a heteroaryl or diarylamino having 2 to 30 carbon atoms, wherein the aryl is an aryl having 6 to 12 carbon atoms, an alkyl having 1 to 24 carbon atoms, cyano, or a halogen atom, adjacent groups of $R^1$, $R^2$, $R^3$, $R^4$, $R^5$, $R^6$, $R^7$, $R^8$, $R^9$, $R^{10}$ and $R^{11}$ may be bonded to each other to form an aryl ring having 9 to 16 carbon atoms or a heteroaryl ring having 6 to 15 carbon atoms together with ring a, ring b, or ring c, and at least one hydrogen atom in the ring thus formed may be substituted by an aryl having 6 to 30 carbon atoms, a heteroaryl or diarylamino having 2 to 30 carbon atoms, wherein the aryl is an aryl having 6 to 12 carbon atoms, an alkyl having 1 to 24 carbon atoms, cyano, or a halogen atom, and Ra represents a linear alkyl starting from a methylene group, represented by formula $—CH_2—C_{n-1}H_{2(n-1)+1}$ wherein n is 1 to 4.

18. The organic electroluminescent element according to claim 2, wherein the polycyclic aromatic compound represented by the formula (1E) or the multimer thereof is a polycyclic aromatic compound represented by the following formula (1E') or a multimer thereof, (1E')

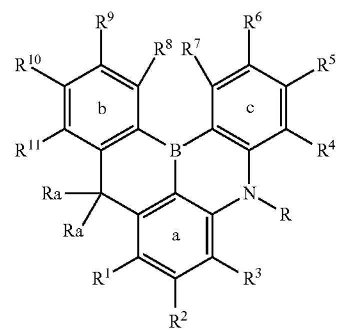

wherein:

$R^1$, $R^2$, $R^3$, $R^4$, $R^5$, $R^6$, $R^7$, $R^8$, $R^9$, $R^{10}$ and $R^{11}$ each independently represent a hydrogen atom, an aryl, a heteroaryl, a diarylamino, a diheteroarylamino, an arylheteroarylamino, an alkyl, an alkoxy, an aryloxy, cyano, or a halogen atom, at least one hydrogen atom in these may be substituted by an aryl, a heteroaryl, an alkyl, cyano, or a halogen atom, adjacent groups of $R^1$, $R^2$, $R^3$, $R^4$, $R^5$, $R^6$, $R^7$, $R^8$, $R^9$, $R^{10}$ and $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, an aryloxy, cyano, or a halogen atom, and at least one hydrogen atom in these may be substituted by an aryl, a heteroaryl, an alkyl, cyano, or a halogen atom, R of >N—R represents an aryl, a heteroaryl, or an alkyl, at least one hydrogen atom in the R may be substituted by an aryl, a heteroaryl, a diarylamino, a diheteroarylamino, an arylheteroarylamino, an alkyl, an alkoxy, an aryloxy, cyano, or a halogen atom, and at least one hydrogen atom in these may be substituted by an aryl, a heteroaryl, an alkyl, cyano, or a halogen atom, Ra represents a linear or branched alkyl starting from a methylene group, represented by formula —$CH_2$—$C_{n-1}H_{2(n-1)+1}$ wherein n is 1 to 6, and in a case of a multimer of a polycyclic aromatic compound, the multimer is a dimer or a trimer having two or three structures each represented by the formula (1E').

19. The organic electroluminescent element according to claim 18, wherein:

$R^1$, $R^2$, $R^3$, $R^4$, $R^5$, $R^6$, $R^7$, $R^8$, $R^9$, $R^{10}$ and $R^{11}$ each independently represent a hydrogen atom, an aryl having 6 to 30 carbon atoms, a heteroaryl or diarylamino having 2 to 30 carbon atoms, wherein the aryl is an aryl having 6 to 12 carbon atoms, an alkyl having 1 to 24 carbon atoms, cyano, or a halogen atom, adjacent groups of $R^1$, $R^2$, $R^3$, $R^4$, $R^5$, $R^6$, $R^7$, $R^8$, $R^9$, $R^{10}$ and $R^{11}$ may be bonded to each other to form an aryl ring having 9 to 16 carbon atoms or a heteroaryl ring having 6 to 15 carbon atoms together with ring a, ring b, or ring c, and at least one hydrogen atom in the ring thus formed may be substituted by an aryl having 6 to 30 carbon atoms, a heteroaryl or diarylamino having 2 to 30 carbon atoms, wherein the aryl is an aryl having 6 to 12 carbon atoms, an alkyl having 1 to 24 carbon atoms, cyano, or a halogen atom, R of >N—R represents an aryl having 6 to 30 carbon atoms, a heteroaryl having 2 to 30 carbon atoms, or an alkyl having 1 to 24 carbon atoms, and at least one hydrogen atom in these may be substituted by cyano or a halogen atom, and Ra represents a linear alkyl starting from a methylene group, represented by formula —$CH_2$—$C_{n-1}H_{2(n-1)+1}$ wherein n is 1 to 4.

20. The organic electroluminescent element according to claim 18, wherein the compound represented by formula (1E') is represented by the following formula (1E-1):

(1E-1)

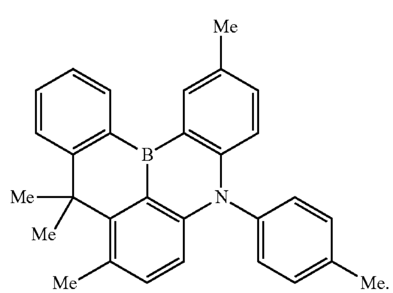

21. The organic electroluminescent element according to claim 1, wherein the light emitting layer comprises at least the two polycyclic aromatic compounds and/or multimers in an amount of 0.1 to 30% by weight.

22. The organic electroluminescent element according to claim 1, wherein the light emitting layer comprises at least one compound selected from the group consisting of an anthracene derivative, a fluorene derivative, and a dibenzochrysene derivative.

23. The organic electroluminescent element according to claim 1, further comprising an electron transport layer and/or an electron injection layer disposed between the negative electrode and the light emitting layer, wherein at least one of the electron transport layer and the electron injection layer comprises at least one derivative, compound or complex selected from the group consisting of a borane derivative, a pyridine derivative, a fluoranthene derivative, a polycyclic aromatic compound represented by the following formula (ETM-4), a polycyclic aromatic compound multimer having a plurality of structures represented by the following formula (ETM-4), an anthracene derivative, a benzofluorene derivative, a phosphine oxide derivative, a pyrimidine derivative, a carbazole derivative, a triazine derivative, a benzimidazole derivative, a phenanthroline derivative, and a quinolinol-based metal complex, (ETM-4)

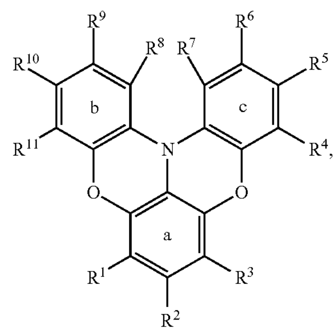

wherein:

$R^1$, $R^2$, $R^3$, $R^4$, $R^5$, $R^6$, $R^7$, $R^8$, $R^9$, $R^{10}$ and $R^{11}$ each independently represent a hydrogen atom, an aryl, a heteroaryl, a diarylamino, a diheteroarylamino, an arylheteroarylamino, an alkyl, an alkoxy, or an aryloxy, while at least one hydrogen atom in these may be substituted by an aryl, a heteroaryl, or an alkyl, adjacent groups among $R^1$, $R^2$, $R^3$, $R^4$, $R^5$, $R^6$, $R^7$, $R^8$, $R^9$, $R^{10}$ and $R^{11}$ may be bonded to each other to form an aryl ring or a heteroaryl ring together with the ring a, ring b, or ring c, and at least one hydrogen atom in the ring thus formed may be substituted by an aryl, a heteroaryl, a diarylamino, a diheteroarylamino, an arylheteroarylamino, an alkyl, an alkoxy, or an aryloxy, while at least one hydrogen atom in these may be substituted by an aryl, a heteroaryl, or an alkyl, and at least one hydrogen atom in the compound represented by formula (ETM-4) or the multimer having the plurality of structures represented by formula (ETM-4) may be substituted by a halogen atom or a deuterium atom.

24. The organic electroluminescent element according to claim 23, wherein at least one of the electron transport layer and the electron injection layer further comprises at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

25. A display apparatus comprising the organic electroluminescent element according to claim 1.

26. A lighting apparatus comprising the organic electroluminescent element according to claim 1.

* * * * *